US009184701B2

(12) United States Patent
Berchtold et al.

(10) Patent No.: US 9,184,701 B2
(45) Date of Patent: Nov. 10, 2015

(54) SNUBBER FOR A DIRECT CURRENT (DC)-DC CONVERTER

(71) Applicant: RF Micro Devices, Inc., Greeensboro, NC (US)

(72) Inventors: Jean-Christophe Berchtold, Carlsbad, CA (US); Chris Levesque, Fountain Valley, CA (US); William David Southcombe, San Diego, CA (US); David E. Jones, Cedar Rapids, IA (US); Scott Yoder, Fuquay Varina, NC (US); Terry J. Stockert, Cedar Rapids, IA (US)

(73) Assignee: RF Micro Devices, Inc., Greensboro, NC (US)

( * ) Notice: Subject to any disclaimer, the term of this patent is extended or adjusted under 35 U.S.C. 154(b) by 159 days.

(21) Appl. No.: 13/937,810

(22) Filed: Jul. 9, 2013

(65) Prior Publication Data

US 2013/0307616 A1 Nov. 21, 2013

Related U.S. Application Data

(63) Continuation-in-part of application No. 13/090,663, filed on Apr. 20, 2011, now Pat. No. 8,538,355, and a continuation-in-part of application No. 13/172,371, filed on Jun. 29, 2011, now Pat. No. 8,983,409, which (Continued)

(51) Int. Cl.

| | |
|---|---|
| ***H02M 3/156*** | (2006.01) |
| ***H03F 1/02*** | (2006.01) |
| ***H02M 3/00*** | (2006.01) |
| ***H02M 3/158*** | (2006.01) |
| ***H03F 3/195*** | (2006.01) |
| ***H03F 3/21*** | (2006.01) |
| ***H03F 3/24*** | (2006.01) |
| *H02M 3/07* | (2006.01) |
| *H04B 1/04* | (2006.01) |
| *H02M 1/34* | (2007.01) |

(52) U.S. Cl.

CPC .............. *H03F 1/0211* (2013.01); *H02M 3/00* (2013.01); *H02M 3/1584* (2013.01); *H03F 1/0227* (2013.01); *H03F 1/0277* (2013.01);

(Continued)

(58) Field of Classification Search

CPC ... H02M 3/156; H02M 3/157; H02M 3/1588; G05F 3/24; G05F 3/30; G05F 3/262; G05F 3/265

USPC ................. 323/265, 282, 288, 312, 317, 351

See application file for complete search history.

(56) References Cited

U.S. PATENT DOCUMENTS 3,735,289 A 5/1973 Bruene
4,523,155 A 6/1985 Walczak et al.

(Continued)

FOREIGN PATENT DOCUMENTS

GB 2444984 A 6/2008

OTHER PUBLICATIONS

Non-Final Office Action for U.S. Appl. No. 12/774,155, mailed Dec. 4, 2013, 18 pages.

(Continued)

*Primary Examiner* — Adolf Berhane
(74) *Attorney, Agent, or Firm* — Withrow & Terranova, P.L.L.C.

(57) ABSTRACT

Circuitry, which includes a direct current (DC)-DC converter having a first switching power supply is disclosed. The first switching power supply includes a first switching converter, an energy storage element, a first inductive element, which is coupled between the first switching converter and the energy storage element, and a first snubber circuit, which is coupled across the first inductive element. The first switching power supply receives and converts a DC power supply signal to provide a first switching power supply output signal based on a setpoint.

24 Claims, 178 Drawing Sheets

Related U.S. Application Data is a continuation-in-part of application No. 13/090,663, filed on Apr. 20, 2011, now Pat. No. 8,538,355, application No. 13/937,810, which is a continuation-in-part of application No. 13/198,074, filed on Aug. 4, 2011, now Pat. No. 8,515,361, which is a continuation-in-part of application No. 13/090,663, and a continuation-in-part of application No. 13/172,371, application No. 13/937,810, which is a continuation-in-part of application No. 13/226,831, filed on Sep. 7, 2011, which is a continuation-in-part of application No. 13/090,663, and a continuation-in-part of application No. 13/172,371, and a continuation-in-part of application No. 13/198,074.

(60) Provisional application No. 61/325,859, filed on Apr. 20, 2010, provisional application No. 61/359,487, filed on Jun. 29, 2010, provisional application No. 61/370,554, filed on Aug. 4, 2010, provisional application No. 61/380,522, filed on Sep. 7, 2010, provisional application No. 61/410,071, filed on Nov. 4, 2010, provisional application No. 61/417,633, filed on Nov. 29, 2010.

(52) U.S. Cl.
CPC ............... *H03F 3/195* (2013.01); *H03F 3/211* (2013.01); *H03F 3/245* (2013.01); *H02M 1/34* (2013.01); *H02M 3/07* (2013.01); *H03F 2200/18* (2013.01); *H03F 2200/336* (2013.01); *H04B 2001/0416* (2013.01)

(56) References Cited

U.S. PATENT DOCUMENTS 4,638,255 A 1/1987 Penney
4,819,081 A 4/1989 Volk et al.
5,212,459 A 5/1993 Ueda et al.
5,278,994 A 1/1994 Black et al.
5,307,512 A 4/1994 Mitzlaff
5,343,307 A 8/1994 Mizuno et al.
5,404,547 A 4/1995 Diamantstein et al.
5,432,473 A 7/1995 Mattila et al.
5,603,106 A 2/1997 Toda
5,636,114 A * 6/1997 Bhagwat et al. ........... 363/56.12
5,640,686 A 6/1997 Norimatsu
5,642,075 A 6/1997 Bell
5,652,547 A 7/1997 Mokhtar et al.
5,724,004 A 3/1998 Reif et al.
5,832,373 A 11/1998 Nakanishi et al.
5,841,319 A 11/1998 Sato
5,852,632 A 12/1998 Capici et al.
5,860,080 A 1/1999 James et al.
5,872,481 A 2/1999 Sevic et al.
5,874,841 A 2/1999 Majid et al.
5,920,808 A 7/1999 Jones et al.
5,923,153 A * 7/1999 Liu .............................. 323/222
5,923,761 A 7/1999 Lodenius
5,945,870 A 8/1999 Chu et al.
5,956,246 A 9/1999 Sequeira et al.
6,051,963 A * 4/2000 Eagar ........................... 323/282
6,064,272 A 5/2000 Rhee
6,151,509 A 11/2000 Chorey
6,192,225 B1 2/2001 Arpaia et al.
6,194,968 B1 2/2001 Winslow
6,229,366 B1 5/2001 Balakirshnan et al.
6,259,901 B1 7/2001 Shinomiya et al.
6,304,748 B1 10/2001 Li et al.
6,425,107 B1 7/2002 Caldara et al.
6,559,492 B1 5/2003 Hazucha et al.
6,606,483 B1 8/2003 Baker et al.
6,670,849 B1 12/2003 Damgaard et al.
6,674,789 B1 1/2004 Fardoun et al.
6,724,252 B2 4/2004 Ngo et al.
6,774,508 B2 8/2004 Ballantyne et al.
6,794,923 B2 9/2004 Burt et al.
6,806,768 B2 10/2004 Klaren et al.
6,853,244 B2 2/2005 Robinson et al.
6,888,482 B1 5/2005 Hertle
6,900,697 B1 5/2005 Doyle et al.
6,906,590 B2 6/2005 Amano
6,917,188 B2 7/2005 Kernahan
6,937,487 B1 8/2005 Bron
6,954,623 B2 10/2005 Chang et al.
6,969,978 B2 11/2005 Dening
6,998,914 B2 2/2006 Robinson
7,035,069 B2 4/2006 Takikawa et al.
7,043,213 B2 5/2006 Robinson et al.
7,058,374 B2 6/2006 Levesque et al.
7,072,626 B2 7/2006 Hadjichristos
7,075,346 B1 7/2006 Hariman et al.
7,098,728 B1 8/2006 Mei et al.
7,116,949 B2 10/2006 Irie et al.
7,145,385 B2 12/2006 Brandt et al.
7,148,749 B2 12/2006 Rahman et al.
7,154,336 B2 12/2006 Maeda
7,155,251 B2 12/2006 Saruwatari et al.
7,177,607 B2 2/2007 Weiss
7,180,373 B2 2/2007 Imai et al.
7,184,731 B2 2/2007 Kim
7,184,749 B2 2/2007 Marsh et al.
7,187,910 B2 3/2007 Kim et al.
7,202,734 B1 4/2007 Raab
7,248,111 B1 7/2007 Xu et al.
7,263,337 B2 8/2007 Struble
7,276,960 B2 10/2007 Peschke
7,295,814 B2 11/2007 Yamashita et al.
7,298,600 B2 11/2007 Takikawa et al.
7,299,015 B2 11/2007 Iwamiya et al.
7,324,787 B2 1/2008 Kurakami et al.
7,333,564 B2 2/2008 Sugiyama et al.
7,333,778 B2 2/2008 Pehlke et al.
7,342,455 B2 3/2008 Behzad et al.
7,358,807 B2 4/2008 Scuderi et al.
7,368,985 B2 5/2008 Kusunoki
7,372,333 B2 5/2008 Abedinpour et al.
7,408,330 B2 8/2008 Zhao
7,477,106 B2 1/2009 Van Bezooijen et al.
7,483,678 B2 1/2009 Rozenblit et al.
7,518,448 B1 4/2009 Blair et al.
7,529,523 B1 5/2009 Young et al.
7,539,462 B2 5/2009 Peckham et al.
7,551,688 B2 6/2009 Matero et al.
7,554,407 B2 6/2009 Hau et al.
7,558,539 B2 7/2009 Huynh et al.
7,580,443 B2 8/2009 Uemura et al.
7,622,900 B2 11/2009 Komiya
7,664,520 B2 2/2010 Gu
7,667,987 B2 2/2010 Huynh et al.
7,684,220 B2 3/2010 Fang et al.
7,689,182 B1 3/2010 Bosley et al.
7,701,290 B2 4/2010 Liu
7,702,300 B1 4/2010 McCune
7,706,756 B2 4/2010 Sato et al.
7,714,546 B2 5/2010 Kimura et al.
7,724,097 B2 5/2010 Carley et al.
7,768,354 B2 8/2010 Matsuda et al.
7,782,141 B2 8/2010 Witmer et al.
7,783,272 B2 8/2010 Magnusen
7,787,570 B2 8/2010 Rozenblit et al.
7,796,410 B2 9/2010 Takayanagi et al.
7,859,511 B2 12/2010 Shen et al.
7,860,466 B2 12/2010 Woo et al.
7,876,159 B2 1/2011 Wang et al.
7,907,430 B2 3/2011 Kularatna et al.
7,941,110 B2 5/2011 Gonzalez
7,995,984 B2 8/2011 Kudaishi et al.
7,999,484 B2 8/2011 Jurngwirth et al.
8,000,117 B2 8/2011 Petricek
8,008,970 B1 8/2011 Homol et al.
8,023,995 B2 9/2011 Kuriyama et al.
8,031,003 B2 10/2011 Dishop
8,085,106 B2 12/2011 Huda et al.

(56) References Cited

U.S. PATENT DOCUMENTS

| | | | |
|---|---|---|---|
| 8,089,323 | B2 | 1/2012 | Tarng et al. |
| 8,098,093 | B1 | 1/2012 | Li |
| 8,131,234 | B2 | 3/2012 | Liang et al. |
| 8,134,410 | B1 | 3/2012 | Zortea |
| 8,149,050 | B2 | 4/2012 | Cabanillas |
| 8,149,061 | B2 | 4/2012 | Schuurmans |
| 8,213,888 | B2 | 7/2012 | Kuriyama et al. |
| 8,228,122 | B1 | 7/2012 | Yuen et al. |
| 8,258,875 | B1 | 9/2012 | Smith et al. |
| 8,271,028 | B2 | 9/2012 | Rabjohn |
| 8,427,120 | B1 | 4/2013 | Cilio |
| 8,461,921 | B2 | 6/2013 | Pletcher et al. |
| 8,508,299 | B2 | 8/2013 | Kawano et al. |
| 8,514,025 | B2 | 8/2013 | Lesso |
| 8,546,980 | B2 | 10/2013 | Shimamoto et al. |
| 8,564,366 | B2 | 10/2013 | Namie et al. |
| 8,618,868 | B2 | 12/2013 | Khlat et al. |
| 8,624,576 | B2 | 1/2014 | Khlat et al. |
| 8,649,741 | B2 | 2/2014 | Iijima et al. |
| 2002/0055376 | A1 | 5/2002 | Norimatsu |
| 2002/0055378 | A1 | 5/2002 | Imel et al. |
| 2003/0006845 | A1 | 1/2003 | Lopez et al. |
| 2003/0042885 | A1 | 3/2003 | Zhou et al. |
| 2003/0073418 | A1 | 4/2003 | Dening et al. |
| 2003/0087626 | A1 | 5/2003 | Prikhodko et al. |
| 2003/0201674 | A1 | 10/2003 | Droppo et al. |
| 2003/0201834 | A1 | 10/2003 | Pehlke |
| 2003/0227280 | A1 | 12/2003 | Vinciarelli |
| 2004/0068673 | A1 | 4/2004 | Espinoza-Ibarra et al. |
| 2004/0090802 | A1 | 5/2004 | Pourseyed et al. |
| 2004/0095118 | A1 | 5/2004 | Kernahan |
| 2004/0127173 | A1 | 7/2004 | Leizerovich |
| 2004/0183507 | A1 | 9/2004 | Amei |
| 2004/0185805 | A1 | 9/2004 | Kim et al. |
| 2004/0192369 | A1 | 9/2004 | Nilsson |
| 2004/0222848 | A1 | 11/2004 | Shih et al. |
| 2004/0235438 | A1 | 11/2004 | Quilisch et al. |
| 2005/0003855 | A1 | 1/2005 | Wada et al. |
| 2005/0017787 | A1 | 1/2005 | Kojima |
| 2005/0046507 | A1 | 3/2005 | Dent |
| 2005/0064830 | A1 | 3/2005 | Grigore |
| 2005/0083715 | A1 | 4/2005 | Guillarme et al. |
| 2005/0088237 | A1 | 4/2005 | Gamero et al. |
| 2005/0110559 | A1 | 5/2005 | Farkas et al. |
| 2005/0134388 | A1 | 6/2005 | Jenkins |
| 2005/0136854 | A1 | 6/2005 | Akizuki et al. |
| 2005/0136866 | A1 | 6/2005 | Dupuis |
| 2005/0168281 | A1 | 8/2005 | Nagamori et al. |
| 2005/0200407 | A1 | 9/2005 | Arai et al. |
| 2005/0227644 | A1 | 10/2005 | Maslennikov et al. |
| 2005/0245214 | A1 | 11/2005 | Nakamura et al. |
| 2005/0280471 | A1 | 12/2005 | Matsushita et al. |
| 2005/0288052 | A1 | 12/2005 | Carter et al. |
| 2005/0289375 | A1 | 12/2005 | Ranganathan et al. |
| 2006/0006943 | A1 | 1/2006 | Clifton et al. |
| 2006/0017426 | A1 | 1/2006 | Yang et al. |
| 2006/0038710 | A1 | 2/2006 | Staszewski et al. |
| 2006/0046666 | A1 | 3/2006 | Hara et al. |
| 2006/0046668 | A1 | 3/2006 | Uratani et al. |
| 2006/0052065 | A1 | 3/2006 | Argaman et al. |
| 2006/0067425 | A1 | 3/2006 | Windisch |
| 2006/0067426 | A1 | 3/2006 | Maltsev et al. |
| 2006/0084398 | A1 | 4/2006 | Chmiel et al. |
| 2006/0114075 | A1 | 6/2006 | Janosevic et al. |
| 2006/0119331 | A1 | 6/2006 | Jacobs et al. |
| 2006/0128325 | A1 | 6/2006 | Levesque et al. |
| 2006/0146956 | A1 | 7/2006 | Kim et al. |
| 2006/0199553 | A1 | 9/2006 | Kenington |
| 2006/0221646 | A1 | 10/2006 | Ye et al. |
| 2006/0226909 | A1 | 10/2006 | Abedinpour et al. |
| 2006/0290444 | A1 | 12/2006 | Chen |
| 2006/0293005 | A1 | 12/2006 | Hara et al. |
| 2007/0024360 | A1 | 2/2007 | Markowski |
| 2007/0026824 | A1 | 2/2007 | Ono et al. |
| 2007/0032201 | A1 | 2/2007 | Behzad et al. |
| 2007/0069820 | A1 | 3/2007 | Hayata et al. |
| 2007/0096806 | A1 | 5/2007 | Sorrells et al. |
| 2007/0096810 | A1 | 5/2007 | Hageman et al. |
| 2007/0129025 | A1 | 6/2007 | Vasa et al. |
| 2007/0146090 | A1 | 6/2007 | Carey et al. |
| 2007/0182490 | A1 | 8/2007 | Hau et al. |
| 2007/0210776 | A1 | 9/2007 | Oka |
| 2007/0222520 | A1 | 9/2007 | Inamori et al. |
| 2007/0249300 | A1 | 10/2007 | Sorrells et al. |
| 2007/0249304 | A1 | 10/2007 | Snelgrove et al. |
| 2007/0279021 | A1 | 12/2007 | Yanagida et al. |
| 2007/0281635 | A1 | 12/2007 | McCallister et al. |
| 2007/0291873 | A1 | 12/2007 | Saito et al. |
| 2008/0003950 | A1 | 1/2008 | Haapoja et al. |
| 2008/0008273 | A1 | 1/2008 | Kim et al. |
| 2008/0009248 | A1 | 1/2008 | Rozenblit et al. |
| 2008/0023825 | A1 | 1/2008 | Hebert et al. |
| 2008/0036532 | A1 | 2/2008 | Pan |
| 2008/0051044 | A1 | 2/2008 | Takehara |
| 2008/0057883 | A1 | 3/2008 | Pan |
| 2008/0081572 | A1 | 4/2008 | Rofougaran |
| 2008/0136559 | A1 | 6/2008 | Takahashi et al. |
| 2008/0157732 | A1 | 7/2008 | Williams |
| 2008/0169792 | A1* | 7/2008 | Orr .............................. 323/222 |
| 2008/0205547 | A1 | 8/2008 | Rofougaran |
| 2008/0233913 | A1 | 9/2008 | Sivasubramaniam |
| 2008/0278136 | A1 | 11/2008 | Murtojarvi |
| 2008/0278236 | A1 | 11/2008 | Seymour |
| 2009/0004981 | A1 | 1/2009 | Eliezer et al. |
| 2009/0011787 | A1 | 1/2009 | Kikuma |
| 2009/0021302 | A1 | 1/2009 | Elia |
| 2009/0059630 | A1 | 3/2009 | Williams |
| 2009/0068966 | A1 | 3/2009 | Drogi et al. |
| 2009/0104900 | A1 | 4/2009 | Lee |
| 2009/0115520 | A1 | 5/2009 | Ripley et al. |
| 2009/0153250 | A1 | 6/2009 | Rofougaran |
| 2009/0163153 | A1 | 6/2009 | Senda et al. |
| 2009/0163157 | A1 | 6/2009 | Zolfaghari |
| 2009/0176464 | A1 | 7/2009 | Liang et al. |
| 2009/0191826 | A1 | 7/2009 | Takinami et al. |
| 2009/0258611 | A1 | 10/2009 | Nakamura et al. |
| 2009/0264091 | A1 | 10/2009 | Jensen et al. |
| 2009/0274207 | A1 | 11/2009 | O'Keeffe et al. |
| 2009/0285331 | A1 | 11/2009 | Sugar et al. |
| 2009/0289719 | A1 | 11/2009 | Van Bezooijen et al. |
| 2009/0311980 | A1 | 12/2009 | Sjoland |
| 2009/0322304 | A1 | 12/2009 | Oraw et al. |
| 2010/0007412 | A1 | 1/2010 | Wang et al. |
| 2010/0007414 | A1 | 1/2010 | Searle et al. |
| 2010/0007433 | A1 | 1/2010 | Jensen |
| 2010/0013548 | A1 | 1/2010 | Barrow |
| 2010/0020899 | A1 | 1/2010 | Szopko et al. |
| 2010/0027596 | A1 | 2/2010 | Bellaouar et al. |
| 2010/0029224 | A1 | 2/2010 | Urushihara et al. |
| 2010/0052794 | A1 | 3/2010 | Rofougaran |
| 2010/0097104 | A1 | 4/2010 | Yang et al. |
| 2010/0102789 | A1 | 4/2010 | Randall |
| 2010/0109561 | A1 | 5/2010 | Chen et al. |
| 2010/0120384 | A1 | 5/2010 | Pennec |
| 2010/0120475 | A1 | 5/2010 | Taniuchi et al. |
| 2010/0123447 | A1 | 5/2010 | Vecera et al. |
| 2010/0127781 | A1 | 5/2010 | Inamori et al. |
| 2010/0128689 | A1 | 5/2010 | Yoon et al. |
| 2010/0164579 | A1 | 7/2010 | Acatrinei |
| 2010/0176869 | A1 | 7/2010 | Horie et al. |
| 2010/0181980 | A1 | 7/2010 | Richardson |
| 2010/0189042 | A1 | 7/2010 | Pan |
| 2010/0222015 | A1 | 9/2010 | Shimizu et al. |
| 2010/0233977 | A1 | 9/2010 | Minnis et al. |
| 2010/0237944 | A1 | 9/2010 | Pierdomenico et al. |
| 2010/0244788 | A1 | 9/2010 | Chen |
| 2010/0273535 | A1 | 10/2010 | Inamori et al. |
| 2010/0291888 | A1 | 11/2010 | Hadjichristos et al. |
| 2010/0295599 | A1 | 11/2010 | Uehara et al. |
| 2010/0311362 | A1 | 12/2010 | Lee et al. |
| 2011/0018516 | A1 | 1/2011 | Notman et al. |
| 2011/0018632 | A1 | 1/2011 | Pletcher et al. |
| 2011/0018640 | A1 | 1/2011 | Liang et al. |
| 2011/0032030 | A1 | 2/2011 | Ripley et al. |

(56) References Cited

U.S. PATENT DOCUMENTS

| | | | |
|---|---|---|---|
| 2011/0051842 A1 | 3/2011 | van der Heijden et al. | |
| 2011/0068768 A1 | 3/2011 | Chen et al. | |
| 2011/0068873 A1 | 3/2011 | Alidio et al. | |
| 2011/0075772 A1 | 3/2011 | Sethi et al. | |
| 2011/0080205 A1 | 4/2011 | Lee | |
| 2011/0095735 A1 | 4/2011 | Lin | |
| 2011/0123048 A1 | 5/2011 | Wang et al. | |
| 2011/0136452 A1 | 6/2011 | Pratt et al. | |
| 2011/0181115 A1 | 7/2011 | Ivanov | |
| 2011/0234187 A1 | 9/2011 | Brown et al. | |
| 2011/0273152 A1 | 11/2011 | Weir | |
| 2011/0294445 A1 | 12/2011 | Goto et al. | |
| 2011/0298538 A1 | 12/2011 | Andrys et al. | |
| 2011/0309884 A1 | 12/2011 | Dishop | |
| 2011/0312287 A1 | 12/2011 | Ramachandran et al. | |
| 2012/0044022 A1 | 2/2012 | Walker et al. | |
| 2012/0064953 A1 | 3/2012 | Dagher et al. | |
| 2012/0117284 A1 | 5/2012 | Southcombe et al. | |
| 2012/0170690 A1 | 7/2012 | Ngo et al. | |
| 2012/0182086 A1 | 7/2012 | Hase et al. | |
| 2012/0223773 A1 | 9/2012 | Jones et al. | |
| 2012/0229210 A1 | 9/2012 | Jones et al. | |
| 2012/0235736 A1 | 9/2012 | Levesque et al. | |
| 2012/0236958 A1 | 9/2012 | Deng et al. | |
| 2012/0242413 A1 | 9/2012 | Lesso | |
| 2012/0252382 A1 | 10/2012 | Bashir et al. | |
| 2013/0005286 A1 | 1/2013 | Chan et al. | |
| 2013/0194979 A1 | 8/2013 | Levesque | |
| 2013/0342270 A1 | 12/2013 | Baxter et al. | |
| 2013/0344828 A1 | 12/2013 | Baxter et al. | |
| 2013/0344833 A1 | 12/2013 | Baxter et al. | |
| 2014/0119070 A1* | 5/2014 | Jeong et al. | 363/45 |

OTHER PUBLICATIONS

Final Office Action for U.S. Appl. No. 13/287,713, mailed Dec. 6, 2013, 9 pages.
Notice of Allowance for U.S. Appl. No. 13/288,478, mailed Nov. 18, 2013, 9 pages.
Non-Final Office Action for U.S. Appl. No. 13/288,517, mailed Oct. 31, 2013, 10 pages.
Non-Final Office Action for U.S. Appl. No. 13/288,373, mailed Nov. 19, 2013, 5 pages.
Non-Final Office Action for U.S. Appl. No. 13/288,590, mailed Dec. 5, 2013, 8 pages.
Notice of Allowance for U.S. Appl. No. 13/304,735, mailed Jan. 2, 2014, 8 pages.
Notice of Allowance for U.S. Appl. No. 13/304,796, mailed Dec. 5, 2013, 9 pages.
Notice of Allowance for U.S. Appl. No. 13/304,943, mailed Dec. 5, 2013, 9 pages.
Advisory Action for U.S. Appl. No. 13/226,814, mailed Dec. 31, 2013, 3 pages.
Final Office Action for U.S. Appl. No. 13/479,816, mailed Nov. 1, 2013, 15 pages.
Advisory Action for U.S. Appl. No. 13/479,816, mailed Jan. 7, 2014, 3 pages.
Non-Final Office Action for U.S. Appl. No. 13/656,997, mailed Jan. 13, 2014, 6 pages.
Notice of Allowance for U.S. Appl. No. 12/567,318, mailed Feb. 18, 2014, 8 pages.
Non-Final Office Action for U.S. Appl. No. 12/723,738, mailed Apr. 28, 2014, 14 pages.
Advisory Action for U.S. Appl. No. 13/287,713, mailed Feb. 20, 2014, 4 pages.
Non-Final Office Action for U.S. Appl. No. 13/288,517, mailed Apr. 28, 2014, 10 pages.
Non-Final Office Action for U.S. Appl. No. 13/226,843, mailed Mar. 31, 2014, 7 pages.
Notice of Allowance for U.S. Appl. No. 13/288,273, mailed Apr. 25, 2014, 7 pages.
Notice of Allowance for U.S. Appl. No. 13/288,373, mailed May 7, 2014, 7 pages.
Non-Final Office Action for U.S. Appl. No. 13/288,590, mailed May 8, 2014, 11 pages.
Notice of Allowance for U.S. Appl. No. 13/304,762, mailed Apr. 16, 2014, 7 pages.
Final Office Action for U.S. Appl. No. 13/226,777, mailed Mar. 21, 2014, 13 pages.
Non-Final Office Action for U.S. Appl. No. 13/656,997, mailed Apr. 30, 2014, 8 pages.
Notice of Allowance for U.S. Appl. No. 12/774,155, mailed Jun. 20, 2014, 8 pages.
Non-Final Office Action for U.S. Appl. No. 14/010,617, mailed Jul. 16, 2014, 6 pages.
Non-Final Office Action for U.S. Appl. No. 14/010,643, mailed Jul. 18, 2014, 6 pages.
Non-Final Office Action for U.S. Appl. No. 13/172,371, mailed Jun. 16, 2014, 7 pages.
Notice of Allowance for U.S. Appl. No. 13/287,726, mailed Aug. 4, 2014, 7 pages.
Non-Final Office Action for U.S. Appl. No. 13/287,672, mailed Jul. 28, 2014, 12 pages.
Non-Final Office Action for U.S. Appl. No. 13/289,302, mailed Jun. 16, 2014, 7 pages.
Notice of Allowance for U.S. Appl. No. 13/304,762, mailed May 29, 2014, 7 pages.
Non-Final Office Action for U.S. Appl. No. 13/773,888, mailed Jun. 10, 2014, 15 pages.
Final Office Action for U.S. Appl. No. 12/723,738, mailed Aug. 11, 2014, 10 pages.
Non-Final Office Action for U.S. Appl. No. 14/010,630, mailed Aug. 6, 2014, 7 pages.
Notice of Allowance for U.S. Appl. No. 13/288,517, mailed Aug. 15, 2014, 7 pages.
Notice of Allowance for U.S. Appl. No. 13/656,997, mailed Sep. 2, 2014, 7 pages.
Notice of Allowance for U.S. Appl. No. 13/761,500, mailed Sep. 19, 2014, 7 pages.
Author Unknown, "3rd Generation Partnership Project; Technical Specification Group Radio Access Network; Evolved Universal Terrestrial Radio Access (E-UTRA); User Equipment (UE) radio transmission and reception (Release 10)," 3GPP TS 36.101, V10.2.1, Apr. 2011, 225 pages.
Li, C.H., "Quadrature Power Amplifier for RF Applications," Master's Thesis for the University of Twente, Nov. 2009, 102 pages.
Non-Final Office Action for U.S. Appl. No. 13/226,831, mailed Nov. 3, 2014, 12 pages.
Non-Final Office Action for U.S. Appl. No. 13/479,816, mailed Nov. 4, 2014, 11 pages.
Non-Final Office Action for U.S. Appl. No. 13/754,303, mailed Oct. 14, 2014, 14 pages.
Non-Final Office Action for U.S. Appl. No. 13/845,410, mailed Oct. 2, 2014, 5 pages.
Non-Final Office Action for U.S. Appl. No. 13/287,726, mailed Jan. 25, 2013, 11 pages.
Non-Final Office Action for U.S. Appl. No. 13/287,726, mailed May 16, 2013, 9 pages.
Notice of Allowance for U.S. Appl. No. 13/287,726, mailed Oct. 7, 2013, 9 pages.
Non-Final Office Action for U.S. Appl. No. 13/287,713, mailed Aug. 5, 2013, 7 pages.
Non-Final Office Action for U.S. Appl. No. 13/287,735, mailed Jan. 25, 2013, 11 pages.
Notice of Allowance for U.S. Appl. No. 13/287,735, mailed May 28, 2013, 8 pages.
Non-Final Office Action for U.S. Appl. No. 13/288,318, mailed Feb. 5, 2013, 12 pages.
Non-Final Office Action for U.S. Appl. No. 13/288,318, mailed Jun. 3, 2013, 14 pages.
Notice of Allowance for U.S. Appl. No. 13/288,318, mailed Oct. 24, 2013, 9 pages.
Non-Final Office Action for U.S. Appl. No. 13/288,478, mailed Dec. 26, 2012, 8 pages.

(56) References Cited

OTHER PUBLICATIONS

Non-Final Office Action for U.S. Appl. No. 13/288,478, mailed Jun. 3, 2013, 9 pages.
Non-Final Office Action for U.S. Appl. No. 13/288,517, mailed Dec. 11, 2012, 9 pages.
Non-Final Office Action for U.S. Appl. No. 13/288,517, mailed May 16, 2013, 9 pages.
Non-Final Office Action for U.S. Appl. No. 13/226,843, mailed Mar. 4, 2013, 6 pages.
Final Office Action for U.S. Appl. No. 13/226,843, mailed Jul. 10, 2013, 7 pages.
Advisory Action for U.S. Appl. No. 13/226,843, mailed Sep. 17, 2013, 3 pages.
Non-Final Office Action for U.S. Appl. No. 13/226,843, mailed Oct. 29, 2013, 7 pages.
Non-Final Office Action for U.S. Appl. No. 13/288,273, mailed Feb. 5, 2013, 8 pages.
Non-Final Office Action for U.S. Appl. No. 13/288,273, mailed May 30, 2013, 11 pages.
Notice of Allowance for U.S. Appl. No. 13/288,273 mailed Oct. 24, 2013 9 pages.
Non-Final Office Action for U.S. Appl. No. 13/288,373, mailed Feb. 25, 2013, 6 pages.
Final Office Action for U.S. Appl. No. 13/288,373, mailed Aug. 2, 2013, 7 pages.
Advisory Action for U.S. Appl. No. 13/288,373, mailed Oct. 15, 2013, 3 pages.
Non-Final Office Action for U.S. Appl. No. 13/289,379, mailed Feb. 25, 2013, 9 pages.
Notice of Allowance for U.S. Appl. No. 13/289,379, mailed Jun. 6, 2013, 9 pages.
Non-Final Office Action for U.S. Appl. No. 13/304,735, mailed Jul. 11, 2013, 8 pages.
Non-Final Office Action for U.S. Appl. No. 13/304,796, mailed Jul. 17, 2013, 8 pages.
Non-Final Office Action for U.S. Appl. No. 13/304,744, mailed Jan. 24, 2013, 10 pages.
Final Office Action for U.S. Appl. No. 13/304,744, mailed May 30, 2013, 12 pages.
Advisory Action for U.S. Appl. No. 13/304,744, mailed Aug. 2, 2013, 3 pages.
Advisory Action for U.S. Appl. No. 13/304,744, mailed Sep. 13, 2013, 3 pages.
Non-Final Office Action for U.S. Appl. No. 13/304,744, mailed Oct. 21, 2013, 12 pages.
Non-Final Office Action for U.S. Appl. No. 13/305,763, mailed Mar. 8, 2013, 10 pages.
Final Office Action for U.S. Appl. No. 13/305,763, mailed Jun. 24, 2013, 13 pages.
Notice of Allowance for U.S. Appl. No. 13/305,763, mailed Sep. 16, 2013, 6 pages.
Notice of Allowance for U.S. Appl. No. 13/304,762, mailed Nov. 27, 2012, 7 pages.
Notice of Allowance for U.S. Appl. No. 13/304,762, mailed Mar. 5, 2013, 7 pages.
Non-Final Office Action for U.S. Appl. No. 13/304,943, mailed Jul. 23, 2013, 8 pages.
Notice of Allowance for U.S. Appl. No. 13/226,777, mailed May 28, 2013, 8 pages.
Non-Final Office Action for U.S. Appl. No. 13/226,777, mailed Oct. 18, 2013, 10 pages.
Notice of Allowance for U.S. Appl. No. 13/226,797, mailed Apr. 26, 2013, 8 pages.
Non-Final Office Action for U.S. Appl. No. 13/226,814, mailed Jun. 13, 2013, 13 pages.
Final Office Action for U.S. Appl. No. 13/226,814, mailed Oct. 23, 2013, 21 pages.
Non-Final Office Action for U.S. Appl. No. 13/479,816, mailed Jul. 5, 2013, 13 pages.
Author Unknown , "SKY77344-21 Power Amplifier Module—Evaluation Information," Skyworks, Version 21, Feb. 16, 2010, 21 pages.
Author Unknown, "60mA, 5.0V, Buck/Boost Charge Pump in ThinSOT-23 and ThinQFN", Texas Instruments Incorporated, REG710, SBAS221 F, Dec. 2001, revised Mar. 2008, 23 pages.
Author Unknown, "DC-to-DC Converter Combats EMI," Maxim Integrated Products, Application Note 1077, May 28, 2002, 4 pages, http://www.maxim-ic.com/an1077/.
Author Unknown, "MIPI Alliance Specification for RF Front-End Control Interface", Mobile Industry Processor Interface (MIPI) Alliance, Version 1.00.00, May 3, 2010, approved Jul. 16, 2010, 88 pages.
Bastida, E.M. et al., "Cascadable Monolithic Balanced Amplifiers at Microwave Frequencies," 10th European Microwave Conference, Sep. 8-12, 1980, pp. 603-607.
Berretta, G. et al., "A balanced CDMA2000 SiGe HBT load insensitive power amplifier," 2006 IEEE Radio and Wireless Symposium, Jan. 17-19, 2006, pp. 523-526.
Grebennikov, A. et al., "High-Efficiency Balanced Switched-Path Monolithic SiGe HBT Power Amplifiers for Wireless Applications," Proceedings of the 2nd European Microwave Integrated Circuits Conference, Oct. 8-10, 2007, pp. 391-394.
Grebennikov, A., "Circuit Design Technique for High Efficiency Class F Amplifiers," 2000 IEEE International Microwave Symposium Digest, vol. 2, Jun. 11-16, 2000, pp. 771-774.
Kurokawa, K., "Design Theory of Balanced Transistor Amplifiers," Bell System Technical Journal, vol. 44, Oct. 1965, pp. 1675-1698, Bell Labs.
Li, Y. et al., "LTE power amplifier module design: challenges and trends," IEEE International Conference on Solid-State and Integrated Circuit Technology, Nov. 2010, pp. 192-195.
Mandeep, J.S. et al., "A Compact, Balanced Low Noise Amplifier for WiMAX Base Station Applications", Microwave Journal, vol. 53, No. 11, Nov. 2010, p. 84-92.
Noriega, Fernando et al., "Designing LC Wilkinson power splitters," RF interconnects/interfaces, Aug. 2002, pp. 18-24, www.rfdesign.com.
Pampichai, Samphan et al., "A 3-dB Lumped-Distributed Miniaturized Wilkinson Divider," Electrical Engineering Conference (EECON-23), Nov. 2000, pp. 329-332.
Podcameni, A.B. et al., "An Amplifier Linearization Method Based on a Quadrature Balanced Structure," IEEE Transactions on Broadcasting, vol. 48, No. 2, Jun. 2002, p. 158-162.
Scuderi, A. et al., "Balanced SiGe PA Module for Multi-Band and Multi-Mode Cellular-Phone Applications," Digest of Technical Papers, 2008 IEEE International Solid-State Circuits Conference, Feb. 3-7, 2008, pp. 572-573, 637.
Wang, P. et al., "A 2.4-GHz +25dBm P-1dB Linear Power Amplifier with Dynamic Bias Control in a 65-nm CMOS Process," 2008 European Solid-State Circuits Conference, Sep. 15-19, 2008, pp. 490-493.
Zhang, G. et al., "A High Performance Balanced Power Amplifier and Its Integration into a Front-end Module at PCS Band," 2007 IEEE Radio Frequency Integrated Circuits Symposium, Jun. 3-5, 2007, p. 251-254.
Zhang, G. et al., "Dual Mode Efficiency Enhanced Linear Power Amplifiers Using a New Balanced Structure," 2009 IEEE Radio Frequency Integrated Circuits Symposium, Jun. 7-9, 2009, pp. 245-248.
Non-Final Office Action for U.S. Appl. No. 11/756,909, mailed May 15, 2009, 11 pages.
Final Office Action for U.S. Appl. No. 11/756,909, mailed Nov. 18, 2009, 14 pages.
Notice of Allowance for U.S. Appl. No. 11/756,909, mailed Dec. 23, 2010, 7 pages.
Non-Final Office Action for U.S. Appl. No. 12/433,377, mailed Jun. 16, 2011, 7 pages.
Notice of Allowance for U.S. Appl. No. 12/433,377, mailed Oct. 31, 2011, 8 pages.
Non-Final Office Action for U.S. Appl. No. 12/567,318, mailed May 29, 2012, 7 pages.
Final Office Action for U.S. Appl. No. 12/567,318, mailed Oct. 22, 2012, 7 pages.

(56) References Cited

OTHER PUBLICATIONS

Non-Final Office Action for U.S. Appl. No. 12/567,318, mailed Apr. 2, 2013, 5 pages.
Final Office Action for U.S. Appl. No. 12/567,318, mailed Jul. 19, 2013, 7 pages.
Advisory Action for U.S. Appl. No. 12/567,318, mailed Aug. 27, 2013, 3 pages.
Non-Final Office Action for U.S. Appl. No. 12/567,318, mailed Oct. 24, 2013, 6 pages.
Non-Final Office Action for U.S. Appl. No. 12/723,738, mailed Dec. 20, 2012, 7 pages.
Non-Final Office Action for U.S. Appl. No. 12/774,155, mailed Jun. 21, 2012, 13 pages.
Final Office Action for U.S. Appl. No. 12/774,155, mailed Jan. 31, 2013, 15 pages.
Final Office Action for U.S. Appl. No. 12/774,155, mailed Apr. 18, 2013, 15 pages.
Advisory Action for U.S. Appl. No. 12/774,155, mailed Jun. 4, 2013, 3 pages.
Non-Final Office Action for U.S. Appl. No. 12/774,155, mailed Aug. 15, 2013, 15 pages.
Non-Final Office Action for U.S. Appl. No. 12/749,091, mailed Mar. 25, 2013, 9 pages.
Notice of Allowance for U.S. Appl. No. 12/749,091, mailed May 20, 2013, 9 pages.
Notice of Allowance for U.S. Appl. No. 12/773,292, mailed Feb. 22, 2012, 11 pages.
Notice of Allowance for U.S. Appl. No. 12/773,292, mailed Jul. 16, 2012, 12 pages.
Quayle Action for U.S. Appl. No. 13/198,074, mailed Jan. 22, 2013, 5 pages.
Notice of Allowance for U.S. Appl. No. 13/198,074, mailed Apr. 12, 2013, 8 pages.
Notice of Allowance for U.S. Appl. No. 13/090,663, mailed Nov. 28, 2012, 8 pages.
Non-Final Office Action for U.S. Appl. No. 13/019,777, mailed Feb. 19, 2013, 9 pages.
Notice of Allowance for U.S. Appl. No. 13/019,077, mailed May 24, 2013, 9 pages.
Invitation to Pay Additional Fees and, Where Applicable, Protest Fee for PCT/US2011/050633, mailed Aug. 22, 2012, 5 pages.
International Search Report and Written Opinion for PCT/US2011/050633, mailed Mar. 8, 2013, 23 pages.
International Preliminary Report on Patentability for PCT/US2011/050633, mailed Mar. 28, 2013, 17 pages.
Non-Final Office Action for U.S. Appl. No. 13/289,134, mailed Feb. 6, 2013, 13 pages.
Notice of Allowance for U.S. Appl. No. 13/289,134, mailed Jun. 6, 2013, 8 pages.
Final Office Action for U.S. Appl. No. 12/723,738, mailed Mar. 20, 2015, 11 pages.
Final Office Action for U.S. Appl. No. 13/226,831, mailed Mar. 6, 2015, 6 pages.
Non-Final Office Action for U.S. Appl. No. 13/287,672, mailed Mar. 23, 2015, 7 pages.
Notice of Allowance for U.S. Appl. No. 13/754,303, mailed Feb. 17, 2015, 8 pages.
Non-Final Office Action for U.S. Appl. No. 12/723,738, mailed Dec. 10, 2014, 11 pages.
Notice of Allowance for U.S. Appl. No. 14/010,617, mailed Dec. 16, 2014, 7 pages.
Notice of Allowance for U.S. Appl. No. 14/010,630, mailed Dec. 31, 2014, 9 pages.
Non-Final Office Action for U.S. Appl. No. 14/010,643, mailed Dec. 9, 2014, 7 pages.
Notice of Allowance for U.S. Appl. No. 13/911,526, mailed Dec. 12, 2014, 9 pages.
Final Office Action for U.S. Appl. No. 13/287,672, mailed Dec. 8, 2014, 14 pages.
Final Office Action for U.S. Appl. No. 13/773,888, mailed Dec. 26, 2014, 18 pages.
Notice of Allowance for U.S. Appl. No. 12/723,738, mailed Jun. 5, 2015, 5 pages.
Final Office Action for U.S. Appl. No. 14/010,643, mailed May 5, 2015, 8 pages.
Advisory Action for U.S. Appl. No. 13/226,831 mailed May 13, 2015, 3 pages.
Notice of Allowance for U.S. Appl. No. 14/010,643, mailed Jul. 10, 2015, 7 pages.
Non-Final Office Action for U.S. Appl. No. 13/911,428, mailed Jul. 22, 2015, 10 pages.
Notice of Allowance for U.S. Appl. No. 13/226,831, mailed Aug. 3, 2015, 9 pages.
Final Office Action for U.S. Appl. No. 13/287,672, mailed Jul. 17, 2015, 8 pages.
Non-Final Office Action for U.S. Appl. No. 13/773,888, mailed Aug. 27, 2015, 17 pages.

* cited by examiner

SNUBBER FOR A DIRECT CURRENT (DC)-DC CONVERTER

PRIORITY CLAIMS

The present application claims priority to and is a continuation-in-part of U.S. patent application Ser. No. 13/090,663, filed Apr. 20, 2011, entitled "QUADRATURE POWER AMPLIFIER ARCHITECTURE," now U.S. Pat. No. 8,538,355, which claims priority to U.S. Provisional Patent Applications No. 61/325,859, filed Apr. 20, 2010; No. 61/359,487, filed Jun. 29, 2010; No. 61/370,554, filed Aug. 4, 2010; No. 61/380,522, filed Sep. 7, 2010; No. 61/410,071, filed Nov. 4, 2010; and No. 61/417,633, filed Nov. 29, 2010.

The present application claims priority to and is a continuation-in-part of U.S. patent application Ser. No. 13/172,371, filed Jun. 29, 2011, entitled "AUTOMATICALLY CONFIGURABLE 2-WIRE/3-WIRE SERIAL COMMUNICATIONS INTERFACE," now U.S. Pat. No. 8,983,409, which claims priority to U.S. Provisional Patent Applications No. 61/359,487, filed Jun. 29, 2010; No. 61/370,554, filed Aug. 4, 2010; No. 61/380,522, filed Sep. 7, 2010; No. 61/410,071, filed Nov. 4, 2010; and No. 61/417,633, filed Nov. 29, 2010. U.S. patent application Ser. No. 13/172,371 is a continuation-in-part of U.S. patent application Ser. No. 13/090,663, filed Apr. 20, 2011, which claims priority to U.S. Provisional Patent Applications No. 61/325,859, filed Apr. 20, 2010; No. 61/359,487, filed Jun. 29, 2010; No. 61/370,554, filed Aug. 4, 2010; No. 61/380,522, filed Sep. 7, 2010; No. 61/410,071, filed Nov. 4, 2010; and No. 61/417,633, filed Nov. 29, 2010.

The present application claims priority to and is a continuation-in-part of U.S. patent application Ser. No. 13/198,074, filed Aug. 4, 2011, entitled "FREQUENCY CORRECTION OF A PROGRAMMABLE FREQUENCY OSCILLATOR BY PROPAGATION DELAY COMPENSATION," now U.S. Pat. No. 8,515,361, which claims priority to U.S. Provisional Patent Applications No. 61/370,554 filed Aug. 4, 2010; No. 61/380,522, filed Sep. 7, 2010; No. 61/410,071, filed Nov. 4, 2010; and No. 61/417,633, filed Nov. 29, 2010. U.S. patent application Ser. No. 13/198,074 is a continuation-in-part of U.S. patent application Ser. No. 13/090,663, filed Apr. 20, 2011, which claims priority to U.S. Provisional Patent Applications No. 61/325,859, filed Apr. 20, 2010; No. 61/359,487, filed Jun. 29, 2010; No. 61/370,554, filed Aug. 4, 2010; No. 61/380,522, filed Sep. 7, 2010; No. 61/410,071, filed Nov. 4, 2010; and No. 61/417,633, filed Nov. 29, 2010. U.S. patent application Ser. No. 13/198,074 is also a continuation-in-part of U.S. patent application Ser. No. 13/172,371, filed Jun. 29, 2011, which claims priority to U.S. Provisional Patent Applications No. 61/359,487, filed Jun. 29, 2010; No. 61/370,554, filed Aug. 4, 2010; No. 61/380,522, filed Sep. 7, 2010; No. 61/410,071, filed Nov. 4, 2010; and No. 61/417,633, filed Nov. 29, 2010.

The present application claims priority to and is a continuation-in-part of U.S. patent application Ser. No. 13/226,831, filed Sep. 7, 2011, entitled "VOLTAGE COMPATIBLE CHARGE PUMP BUCK AND BUCK POWER SUPPLIES," which claims priority to U.S. Provisional Patent Applications No. 61/380,522, filed Sep. 7, 2010; No. 61/410,071, filed Nov. 4, 2010; and No. 61/417,633, filed Nov. 29, 2010. U.S. patent application Ser. No. 13/226,831 is a continuation-in-part of U.S. patent application Ser. No. 13/090,663, filed Apr. 20, 2011, which claims priority to U.S. Provisional Patent Applications No. 61/325,859, filed Apr. 20, 2010; No. 61/359,487, filed Jun. 29, 2010; No. 61/370,554, filed Aug. 4, 2010; No. 61/380,522, filed Sep. 7, 2010; No. 61/410,071, filed Nov. 4, 2010; and No. 61/417,633, filed Nov. 29, 2010.

U.S. patent application Ser. No. 13/226,831 is also a continuation-in-part of U.S. patent application Ser. No. 13/172,371, filed Jun. 29, 2011, which claims priority to U.S. Provisional Patent Applications No. 61/359,487, filed Jun. 29, 2010; No. 61/370,554, filed Aug. 4, 2010; No. 61/380,522, filed Sep. 7, 2010; No. 61/410,071, filed Nov. 4, 2010; and No. 61/417,633, filed Nov. 29, 2010. In addition, U.S. patent application Ser. No. 13/226,831 is a continuation-in-part of U.S. patent application Ser. No. 13/198,074, filed Aug. 4, 2011, which claims priority to U.S. Provisional Patent Applications No. 61/370,554, filed Aug. 4, 2010; No. 61/380,522, filed Sep. 7, 2010; No. 61/410,071, filed Nov. 4, 2010; and No. 61/417,633, filed Nov. 29, 2010.

All of the applications listed above are hereby incorporated herein by reference in their entireties.

FIELD OF THE DISCLOSURE

Embodiments of the present disclosure relate to radio frequency (RF) power amplifier (PA) circuitry, which may be used in RF communications systems.

BACKGROUND OF THE DISCLOSURE

As wireless communications technologies evolve, wireless communications systems become increasingly sophisticated. As such, wireless communications protocols continue to expand and change to take advantage of the technological evolution. As a result, to maximize flexibility, many wireless communications devices must be capable of supporting any number of wireless communications protocols, including protocols that operate using different communications modes, such as a half-duplex mode or a full-duplex mode, and including protocols that operate using different frequency bands. Further, the different communications modes may include different types of RF modulation modes, each of which may have certain performance requirements, such as specific out-of-band emissions requirements or symbol differentiation requirements. In this regard, certain requirements may mandate operation in a linear mode. Other requirements may be less stringent that may allow operation in a non-linear mode to increase efficiency. Wireless communications devices that support such wireless communications protocols may be referred to as multi-mode multi-band communications devices. The linear mode relates to RF signals that include amplitude modulation (AM). The non-linear mode relates to RF signals that do not include AM. Since non-linear mode RF signals do not include AM, devices that amplify such signals may be allowed to operate in saturation. Devices that amplify linear mode RF signals may operate with some level of saturation, but must be able to retain AM characteristics sufficient for proper operation.

A half-duplex mode is a two-way mode of operation, in which a first transceiver communicates with a second transceiver; however, only one transceiver transmits at a time. Therefore, the transmitter and receiver in such a transceiver do not operate simultaneously. For example, certain telemetry systems operate in a send-then-wait-for-reply manner. Many time division duplex (TDD) systems, such as certain Global System for Mobile communications (GSM) systems, operate using the half-duplex mode. A full-duplex mode is a simultaneous two-way mode of operation, in which a first transceiver communicates with a second transceiver, and both transceivers may transmit simultaneously. Therefore, the transmitter and receiver in such a transceiver must be capable of operating simultaneously. In a full-duplex transceiver, signals from the transmitter should not overly interfere with signals received by the receiver; therefore, transmitted signals are at transmit frequencies that are different from received signals, which are at receive frequencies. Many frequency division duplex (FDD) systems, such as certain wideband code division multiple access (WCDMA) systems or certain long term evolution (LTE) systems, operate using a full-duplex mode.

As a result of the differences between full duplex operation and half duplex operation, RF front-end circuitry may need specific circuitry for each mode. Additionally, support of multiple frequency bands may require specific circuitry for each frequency band or for certain groupings of frequency bands. FIG. 1 shows a traditional multi-mode multi-band communications device 10 according to the prior art. The traditional multi-mode multi-band communications device 10 includes a traditional multi-mode multi-band transceiver 12, traditional multi-mode multi-band PA circuitry 14, traditional multi-mode multi-band front-end aggregation circuitry 16, and an antenna 18. The traditional multi-mode multi-band PA circuitry 14 includes a first traditional PA 20, a second traditional PA 22, and up to and including an $N^{TH}$ traditional PA 24.

The traditional multi-mode multi-band transceiver 12 may select one of multiple communications modes, which may include a half-duplex transmit mode, a half-duplex receive mode, a full-duplex mode, a linear mode, a non-linear mode, multiple RF modulation modes, or any combination thereof. Further, the traditional multi-mode multi-band transceiver 12 may select one of multiple frequency bands. The traditional multi-mode multi-band transceiver 12 provides an aggregation control signal ACS to the traditional multi-mode multi-band front-end aggregation circuitry 16 based on the selected mode and the selected frequency band. The traditional multi-mode multi-band front-end aggregation circuitry 16 may include various RF components, including RF switches; RF filters, such as bandpass filters, harmonic filters, and duplexers; RF amplifiers, such as low noise amplifiers (LNAs); impedance matching circuitry; the like; or any combination thereof. In this regard, routing of RF receive signals and RF transmit signals through the RF components may be based on the selected mode and the selected frequency band as directed by the aggregation control signal ACS.

The first traditional PA 20 may receive and amplify a first traditional RF transmit signal FTTX from the traditional multi-mode multi-band transceiver 12 to provide a first traditional amplified RF transmit signal FTATX to the antenna 18 via the traditional multi-mode multi-band front-end aggregation circuitry 16. The second traditional PA 22 may receive and amplify a second traditional RF transmit signal STTX from the traditional multi-mode multi-band transceiver 12 to provide a second traditional RF amplified transmit signal STATX to the antenna 18 via the traditional multi-mode multi-band front-end aggregation circuitry 16. The $N^{TH}$ traditional PA 24 may receive an amplify an $N^{TH}$ traditional RF transmit signal NTTX from the traditional multi-mode multi-band transceiver 12 to provide an $N^{TH}$ traditional RF amplified transmit signal NTATX to the antenna 18 via the traditional multi-mode multi-band front-end aggregation circuitry 16.

The traditional multi-mode multi-band transceiver 12 may receive a first RF receive signal FRX, a second RF receive signal SRX, and up to and including an $M^{TH}$ RF receive signal MRX from the antenna 18 via the traditional multi-mode multi-band front-end aggregation circuitry 16. Each of the RF receive signals FRX, SRX, MRX may be associated with at least one selected mode, at least one selected frequency band, or both. Similarly, each of the traditional RF transmit signals FTTX, STTX, NTTX and corresponding traditional amplified RF transmit signals FTATX, STATX, NTATX may be associated with at least one selected mode, at least one selected frequency band, or both.

Portable wireless communications devices are typically battery powered, need to be relatively small, and have low cost. As such, to minimize size, cost, and power consumption, multi-mode multi-band RF circuitry in such a device needs to be as simple, small, and efficient as is practical. Thus, there is a need for multi-mode multi-band RF circuitry in a multi-mode multi-band communications device that is low cost, small, simple, efficient, and meets performance requirements.

SUMMARY OF THE EMBODIMENTS

The present disclosure relates to circuitry, which may include a DC-DC converter having a first switching power supply. The first switching power supply includes a first switching converter, an energy storage element, a first inductive element, which is coupled between the first switching converter and the energy storage element, and a first snubber circuit, which is coupled across the first inductive element. The first switching power supply receives and converts a DC power supply signal to provide a first switching power supply output signal based on a setpoint.

In one embodiment of the DC-DC converter, the DC-DC converter further includes DC-DC control circuitry and the first switching power supply further includes switching control circuitry. The DC-DC control circuitry provides indication of a selection of either a continuous conduction mode (CCM) or a discontinuous conduction mode (DCM) to the first switching power supply. During the CCM, the switching control circuitry allows energy to flow from the energy storage element to the first inductive element. During the DCM, the switching control circuitry does not allow energy to flow from the energy storage element to the first inductive element.

Selection of either the CCM or the DCM may be based on a rate of change of the setpoint. If an output voltage of the first switching power supply output signal is above the setpoint, then the energy storage element needs to be depleted of some energy to drive the first switching power supply output signal toward the setpoint. During the CCM, two mechanisms operate to deplete the energy storage element. The first mechanism is provided by a load presented to the first switching power supply. The second mechanism is provided by the first switching converter, which allows energy to flow from the energy storage element to the first inductive element. During the DCM, only the first mechanism is allowed to deplete the energy storage element, which may slow depletion of the energy storage element. As such, efficiency of the first switching power supply may be higher during the DCM than during the CCM. However, during the DCM, if the setpoint drops quickly, particularly during light loading conditions of the first switching power supply, there may be significant lag between the setpoint and the output voltage, thereby causing an output voltage error. Thus, there is a trade-off between minimizing output voltage error, by operating in the CCM, and maximizing efficiency, by operating in the DCM. To balance the trade-off, selection between the CCM and the DCM is based on the rate of change of the setpoint.

In one embodiment of the circuitry, during the CCM, the first snubber circuit is in an OPEN state, and during the DCM, when a first inductive element current of the first inductive element reaches about zero from previously being positive, the first snubber circuit transitions from the OPEN state to a CLOSED state. As such, the first snubber circuit essentially shorts out the first inductive element, such that ringing at a first output inductance node of the first switching converter is substantially reduced or eliminated, thereby reducing noise in the circuitry.

In one embodiment of the circuitry, selection between the CCM and the DCM is based only on the rate of change of the setpoint. In an alternate embodiment of the circuitry, selection between the CCM and the DCM is based on the rate of change of the setpoint and loading of the first switching power supply. In a first exemplary embodiment of the circuitry, when a negative rate of change of the setpoint is greater than a first threshold, the CCM is selected and when the negative rate of change of the setpoint is less than a second threshold, the DCM is selected, such that the second threshold is less than the first threshold and a difference between the first threshold and the second threshold provides hysteresis. In a second exemplary embodiment of the circuitry, the first threshold and the second threshold are based on loading of the first switching power supply.

In one embodiment of the first inductive element, the first inductive element has the first inductive element current, which is positive when energy flows from the first inductive element to the energy storage element and is negative when energy flows from the energy storage element to the first inductive element. In one embodiment of the energy storage element, the energy storage element is a first capacitive element. In one embodiment of the circuitry, the circuitry includes control circuitry, which provides the setpoint to the DC-DC control circuitry. In one embodiment of the circuitry, the circuitry includes transceiver circuitry, which includes the control circuitry. In one embodiment of the control circuitry, the control circuitry makes the selection between the CCM and the DCM, and provides a DC configuration control signal to the DC-DC control circuitry, such that the DC configuration control signal is based on the selection between the CCM and the DCM. In one embodiment of the DC-DC control circuitry, the DC-DC control circuitry makes the selection between the CCM and the DCM.

In one embodiment of the first switching power supply, the first switching power supply further includes a second switching converter, which receives the DC power supply signal. The first switching power supply may use the first switching converter for heavy loading conditions and the second switching converter for light loading conditions. In one embodiment of the first switching power supply, the first switching converter is a charge pump buck converter and the second switching converter is a buck converter.

In one embodiment of the first switching power supply, the second switching converter is coupled across the first switching converter. As such, the second switching converter shares the first inductive element with the first switching converter. In an alternate embodiment of the first switching power supply, the first switching power supply further includes the second switching converter and a second inductive element, which is coupled between the second switching converter and the energy storage element. During the CCM, the switching control circuitry allows energy to flow from the energy storage element to the second inductive element. During the DCM, the switching control circuitry does not allow energy to flow from the energy storage element to the second inductive element.

In one embodiment of the circuitry, during the CCM, the second snubber circuit is in an OPEN state, and during the DCM, when a second inductive element current of the second inductive element reaches about zero from previously being positive, the second snubber circuit transitions from the OPEN state to a CLOSED state. As such, the second snubber circuit essentially shorts out the second inductive element, such that ringing at a second output inductance node of the second switching converter is substantially reduced or eliminated, thereby reducing noise in the circuitry.

In one embodiment of the DC-DC converter, the DC-DC converter further includes a second switching power supply, which receives and converts the DC power supply signal to provide a second switching power supply output signal. In one embodiment of the DC-DC converter, the first switching power supply output signal is an envelope power supply signal for an RF PA and the second switching power supply output signal is a bias power supply signal, which is used for biasing the RF PA. In one embodiment of the second switching power supply, the second switching power supply is a charge pump.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

Figure 15:
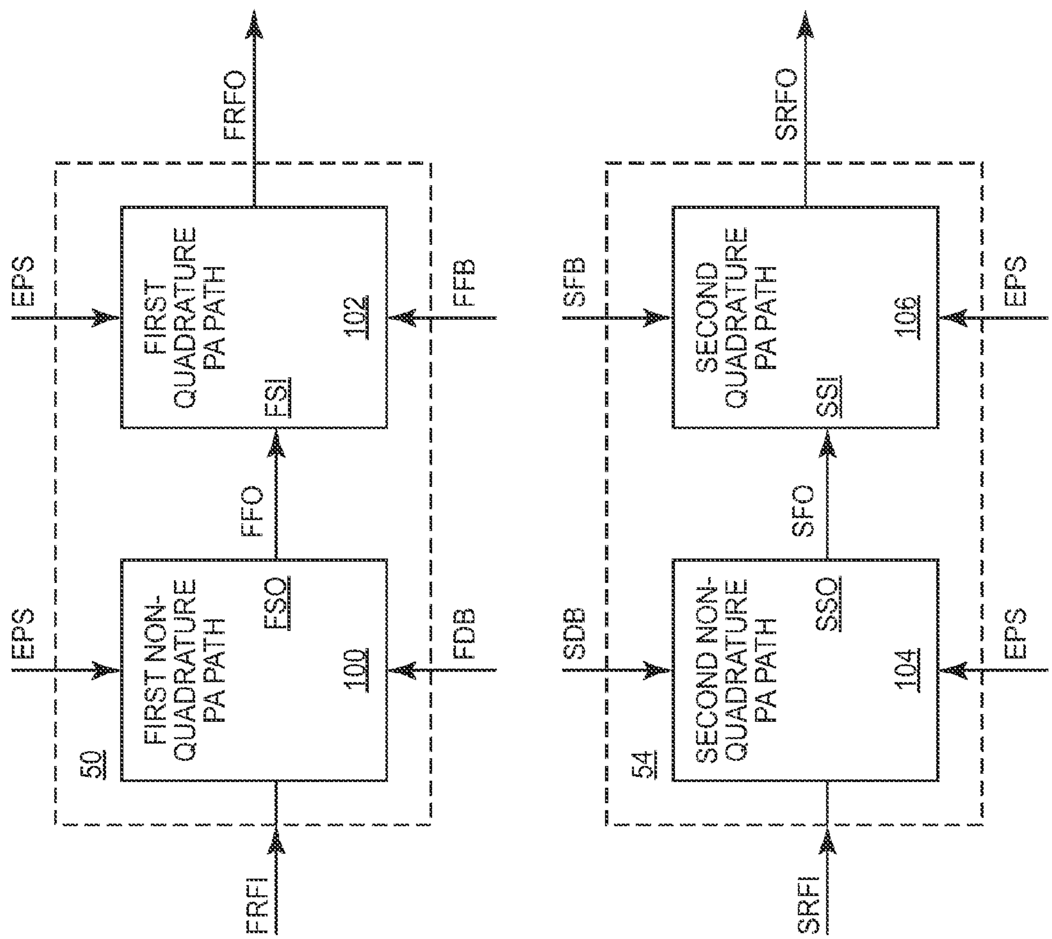
FIG. 15 shows details of a first RF PA and a second RF PA illustrated in FIG. 14 according to one embodiment of the first RF PA and the second RF PA.
Figure 17:
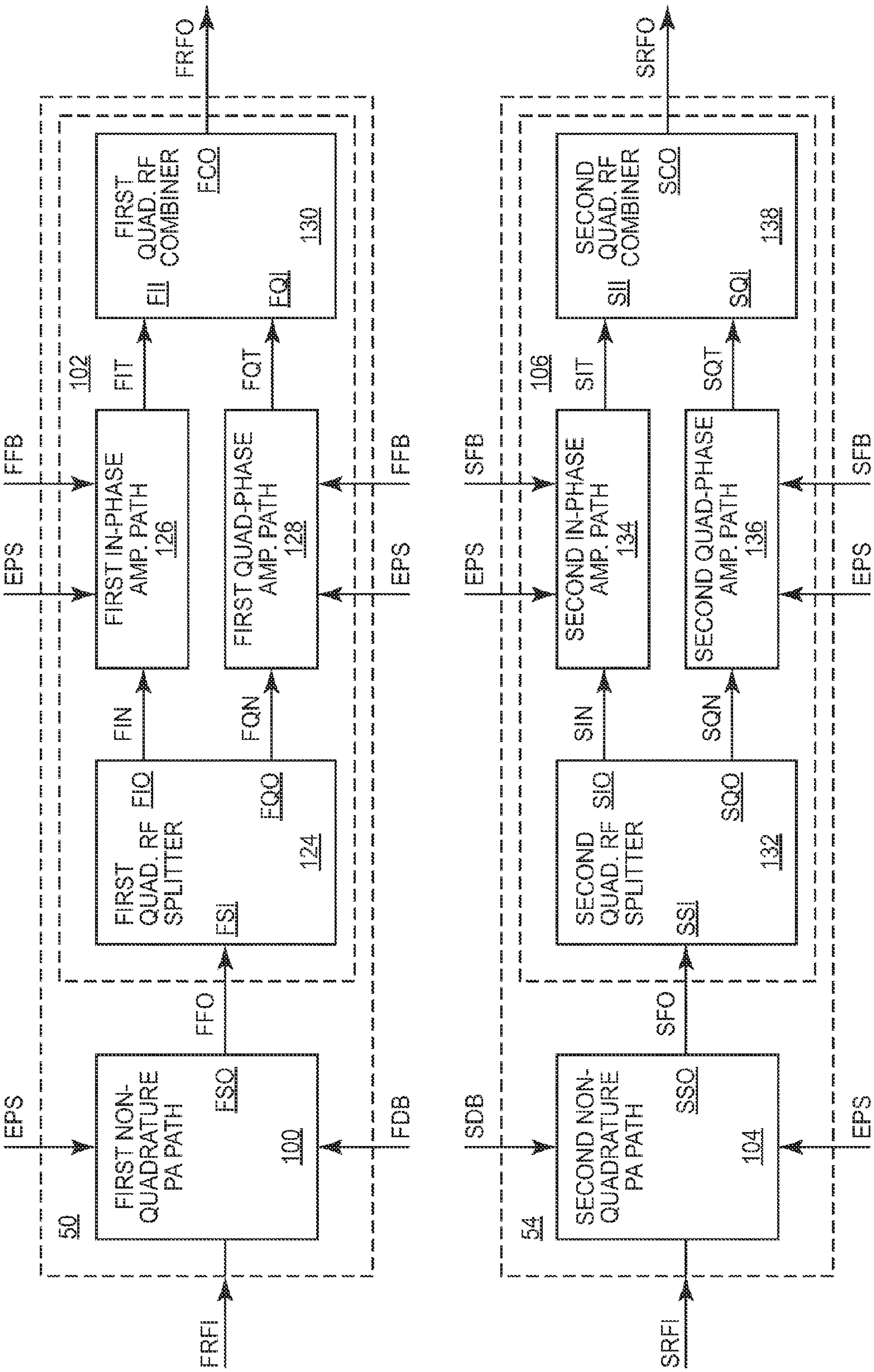

FIG. 17 shows details of a first quadrature PA path and a second quadrature PA path illustrated in FIG. 15 according to one embodiment of the first quadrature PA path and the second quadrature PA path.

Figure 18:
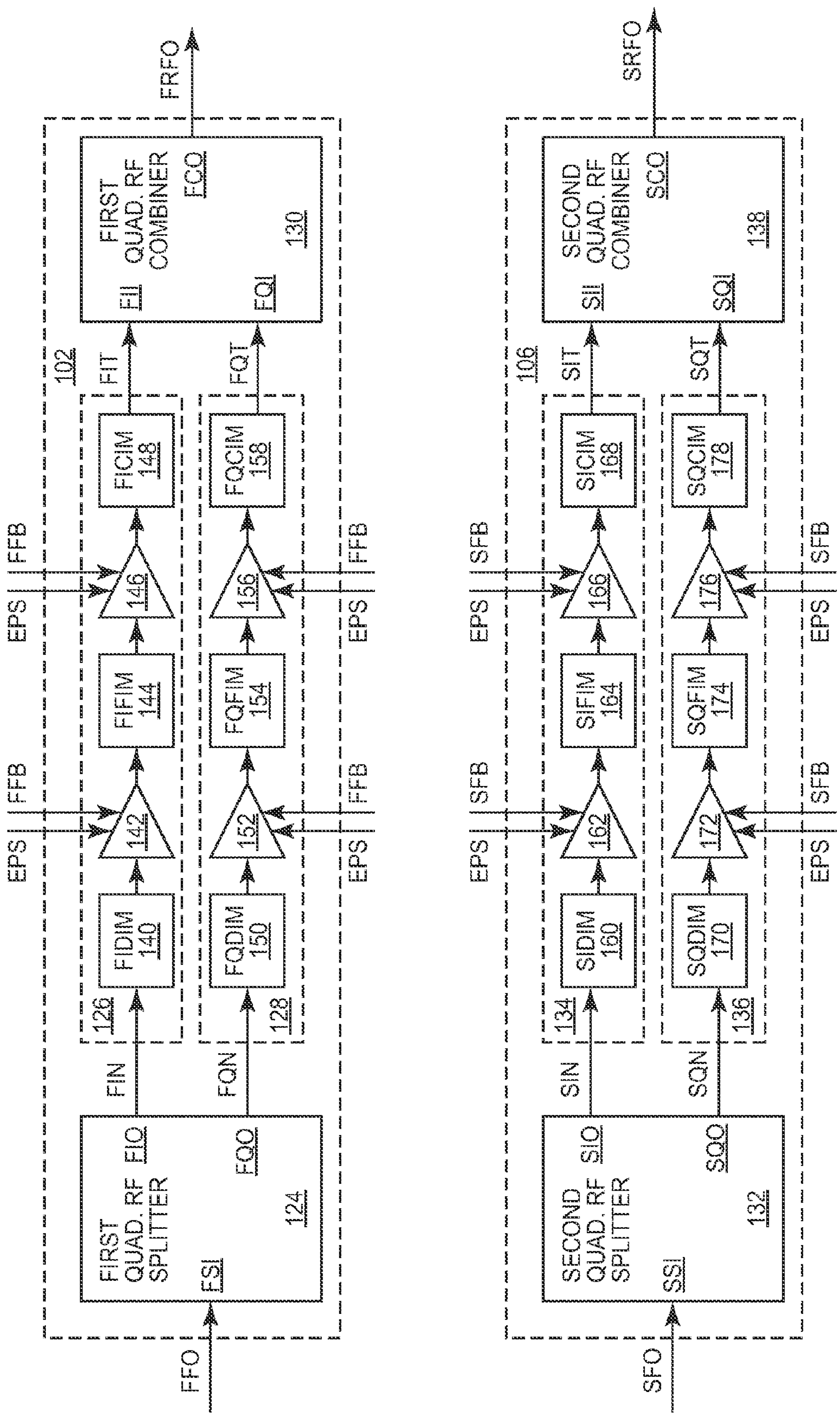

FIG. 18 shows details of a first in-phase amplification path, a first quadrature-phase amplification path, a second in-phase amplification path, and a second quadrature-phase amplification path illustrated in FIG. 17 according to one embodiment of the first in-phase amplification path, the first quadrature-phase amplification path, the second in-phase amplification path, and the second quadrature-phase amplification path.

Figure 19:
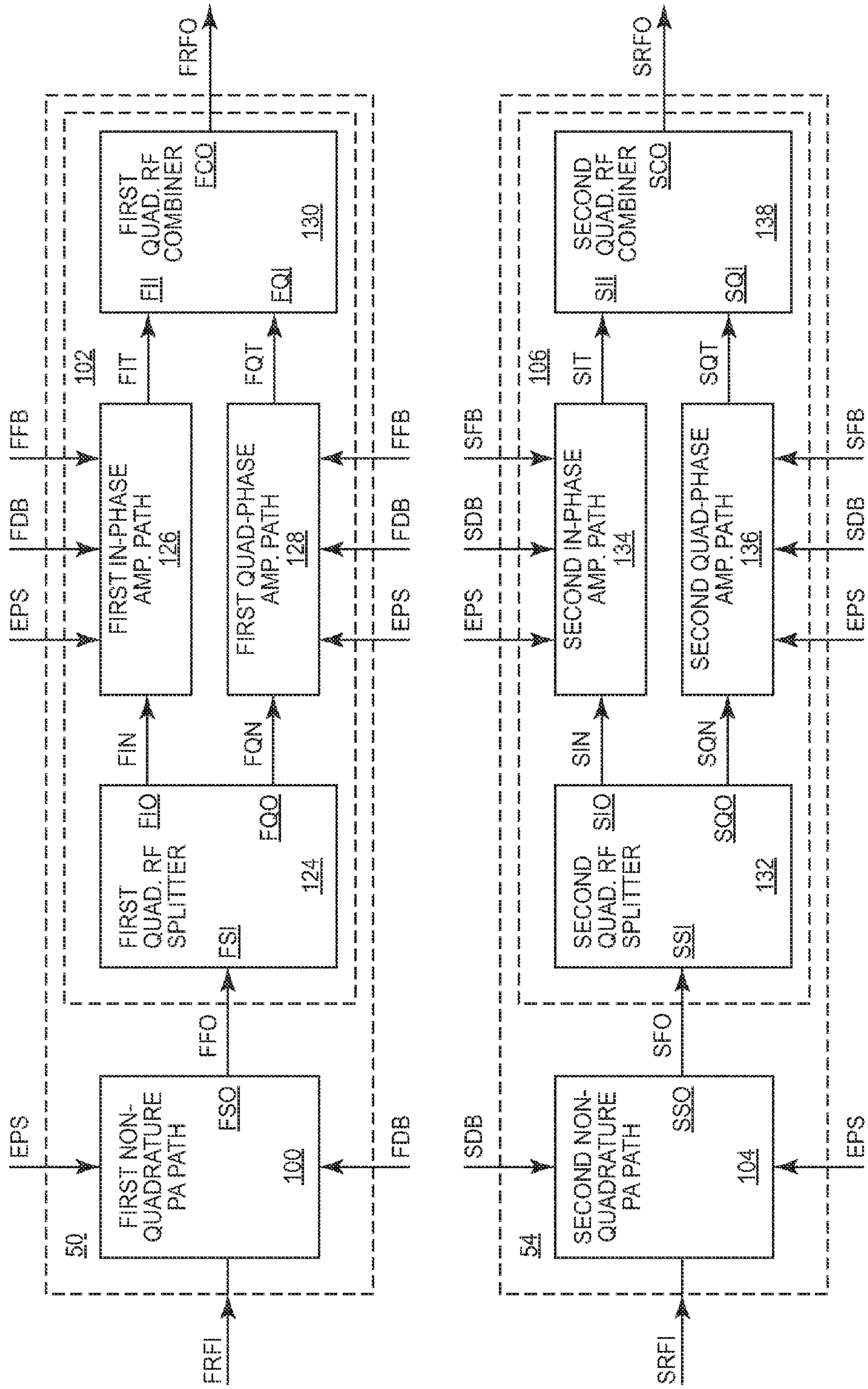

FIG. 19 shows details of the first quadrature PA path and the second quadrature PA path illustrated in FIG. 15 according to an alternate embodiment of the first quadrature PA path and the second quadrature PA path.

Figure 20:
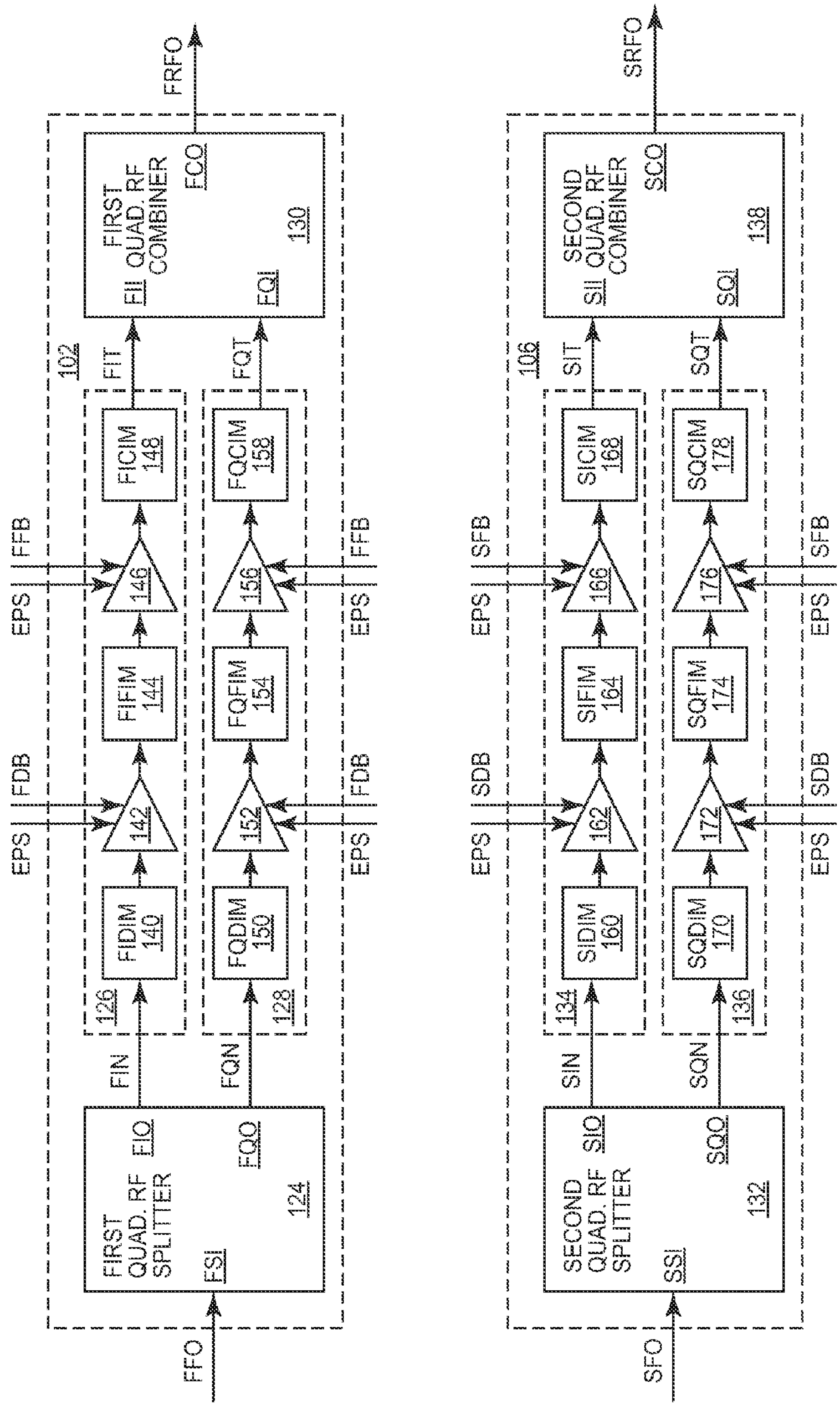

FIG. 20 shows details of the first in-phase amplification path, the first quadrature-phase amplification path, the second in-phase amplification path, and the second quadrature-phase amplification path illustrated in FIG. 19 according to an alternate embodiment of the first in-phase amplification path, the first quadrature-phase amplification path, the second in-phase amplification path, and the second quadrature-phase amplification path.

Figure 14:
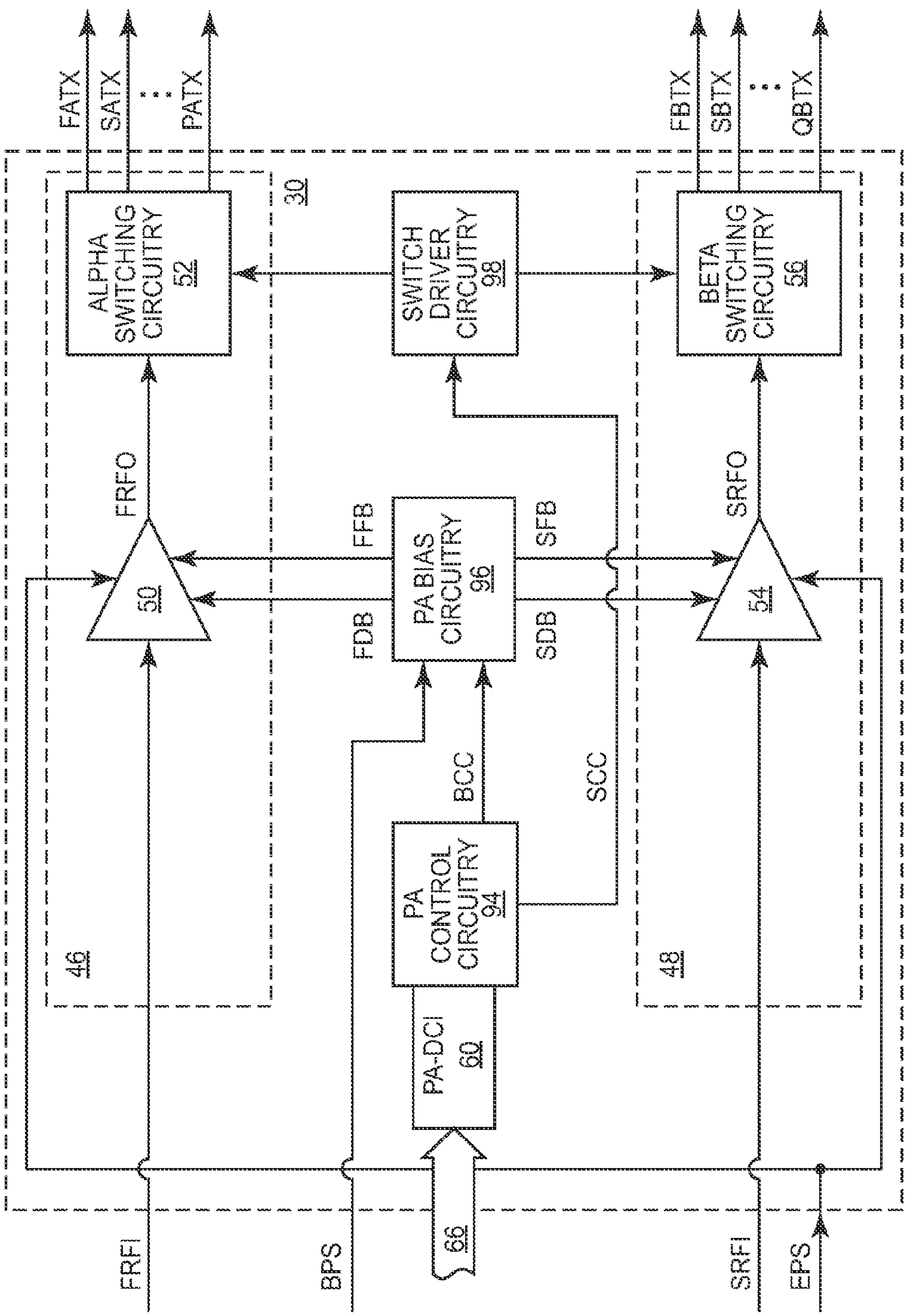
FIG. 14 shows details of the RF PA circuitry illustrated in FIG. 6 according to an alternate embodiment of the RF PA circuitry.
Figure 21:
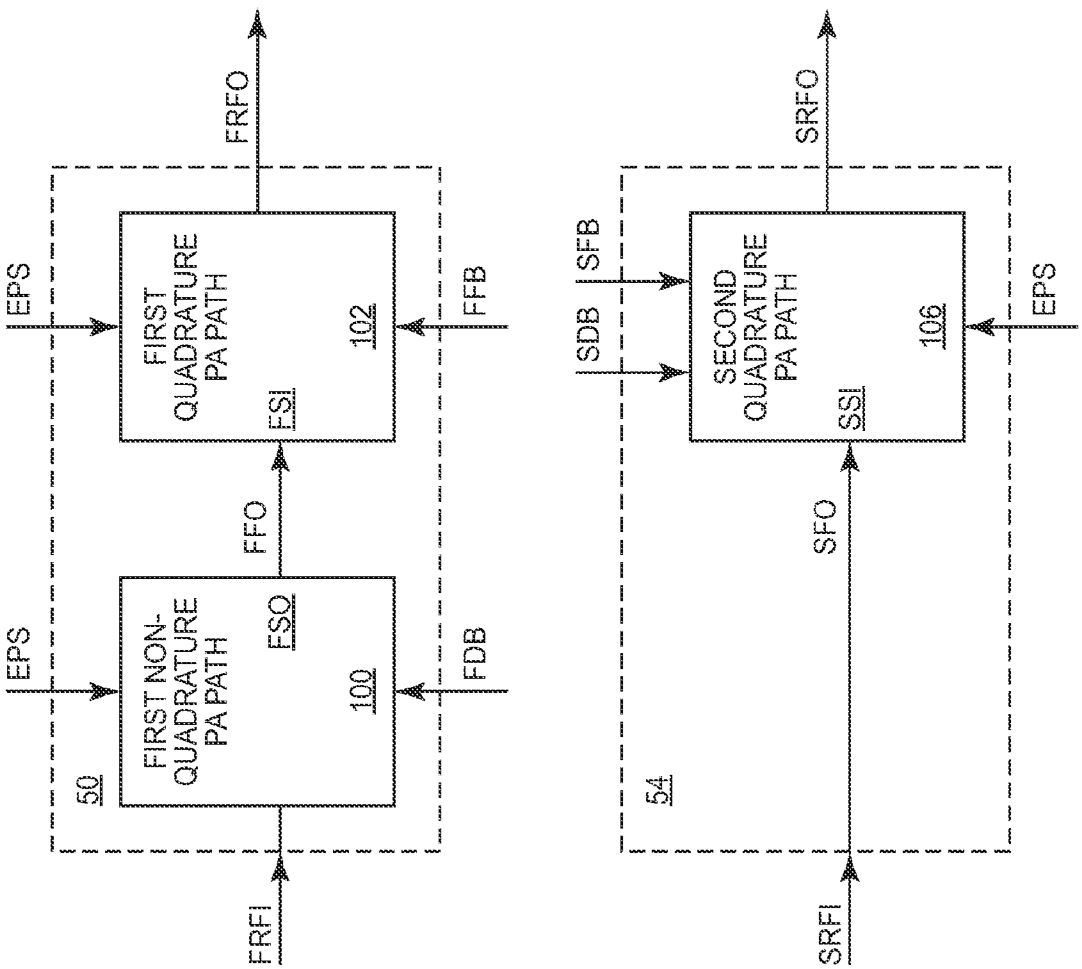

FIG. 21 shows details of the first RF PA and the second RF PA illustrated in FIG. 14 according an alternate embodiment of the first RF PA and the second RF PA.

Figure 22:
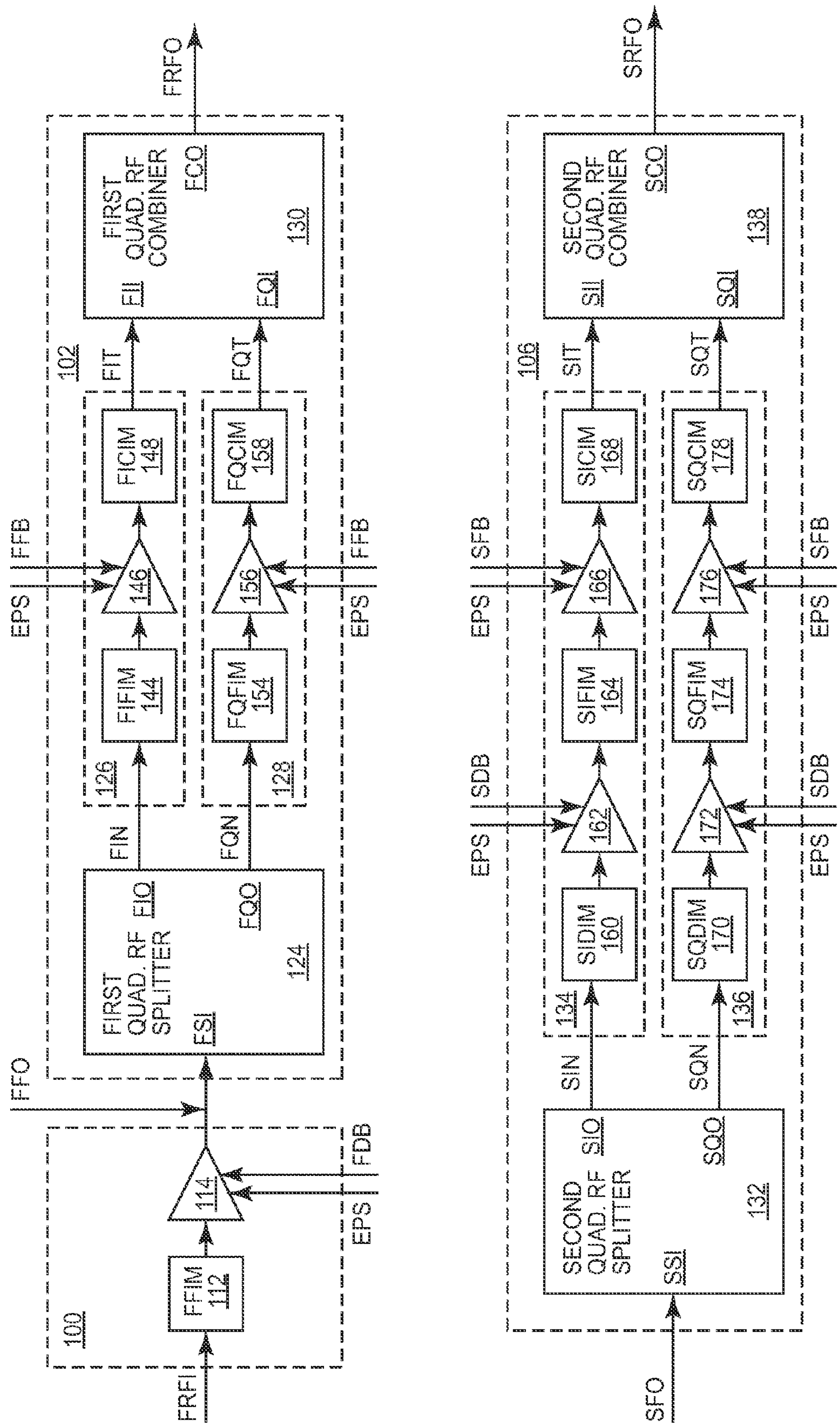

FIG. 22 shows details of the first non-quadrature PA path, the first quadrature PA path, and the second quadrature PA path illustrated in FIG. 21 according to an additional embodiment of the first non-quadrature PA path, the first quadrature PA path, and the second quadrature PA path.

Figure 16:
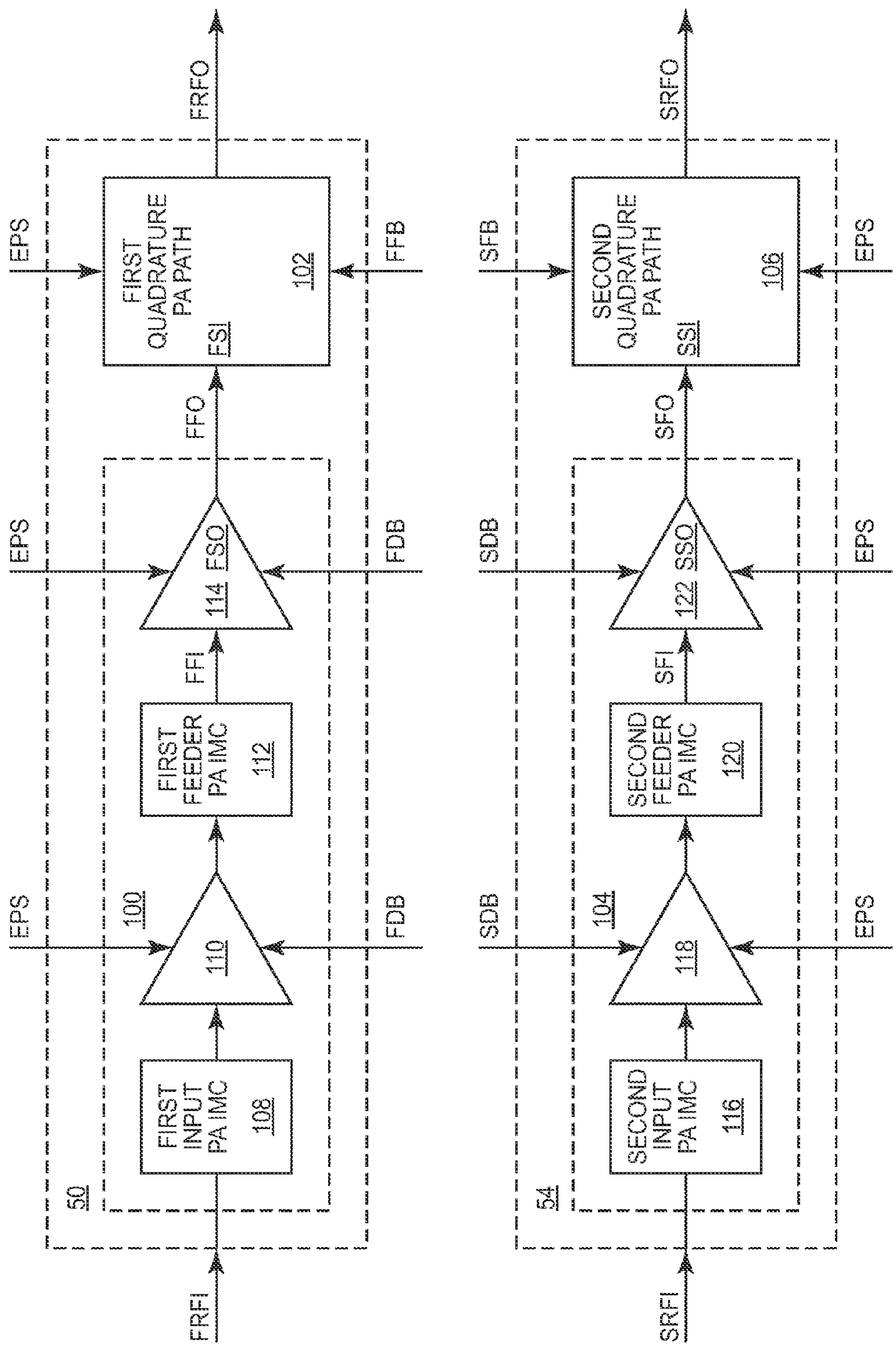
FIG. 16 shows details of a first non-quadrature PA path and a second non-quadrature PA path illustrated in FIG. 15 according to one embodiment of the first non-quadrature PA path and the second non-quadrature PA path.
Figure 23:
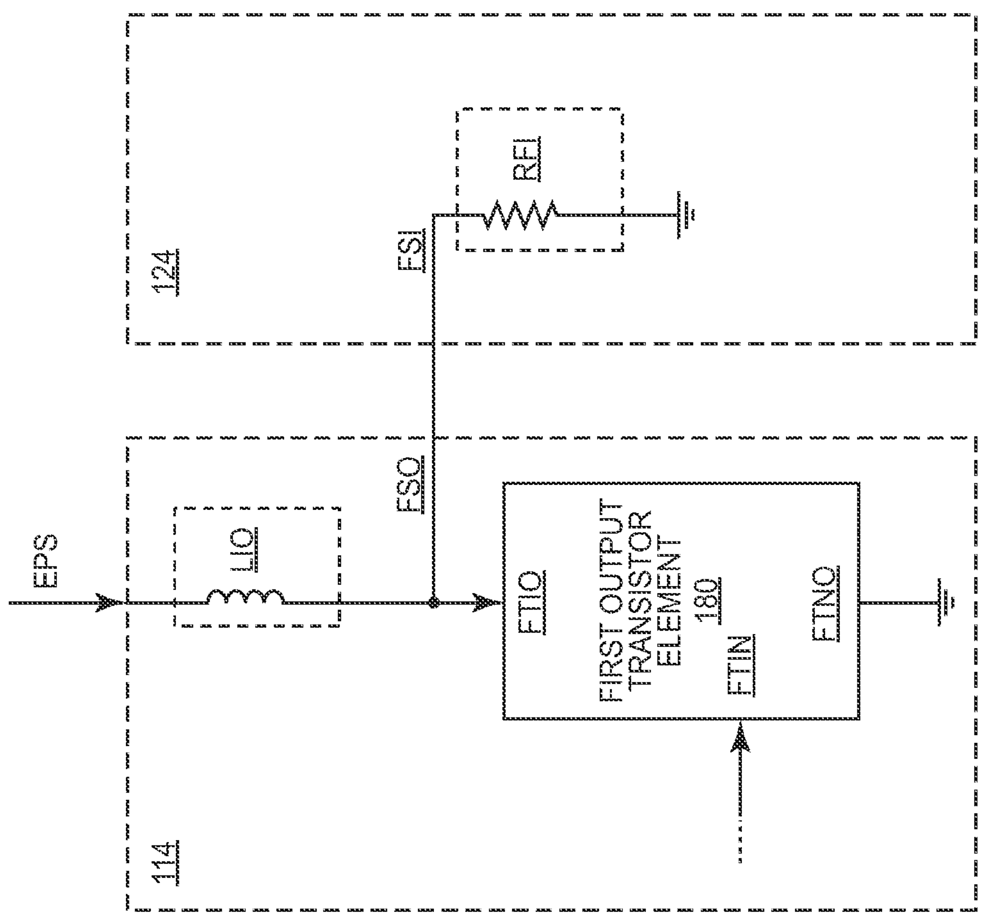

FIG. 23 shows details of a first feeder PA stage and a first quadrature RF splitter illustrated in FIG. 16 and FIG. 17, respectively, according to one embodiment of the first feeder PA stage and the first quadrature RF splitter.

Figure 24:
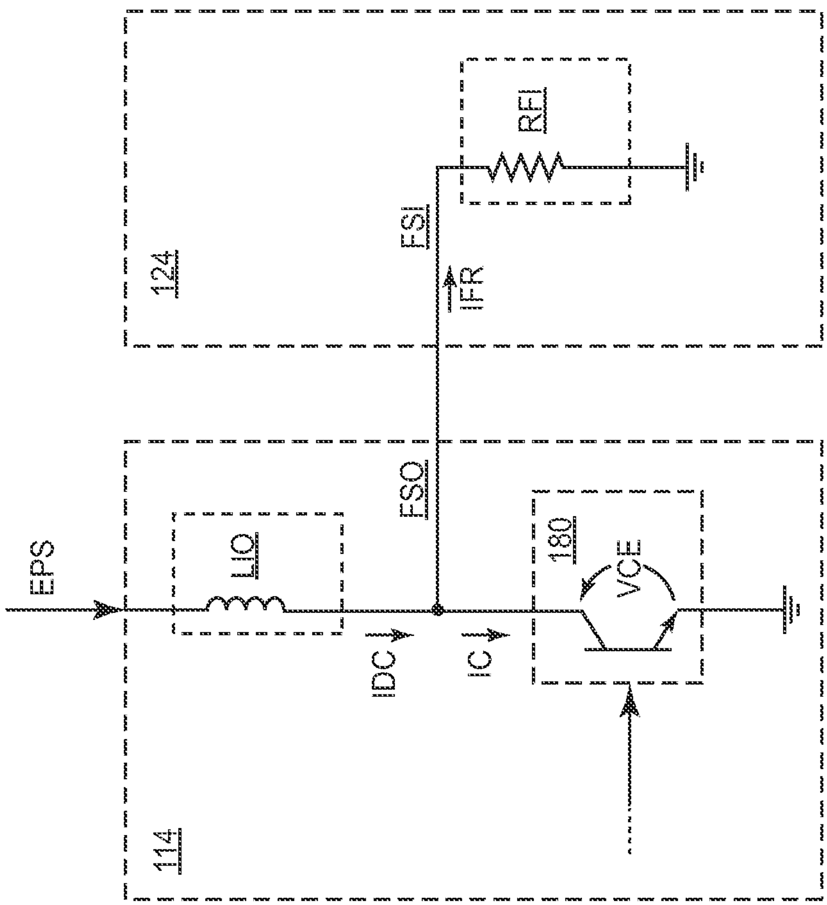

FIG. 24 shows details of the first feeder PA stage and the first quadrature RF splitter illustrated in FIG. 16 and FIG. 17, respectively, according to an alternate embodiment of the first feeder PA stage and the first quadrature RF splitter.

Figure 25:
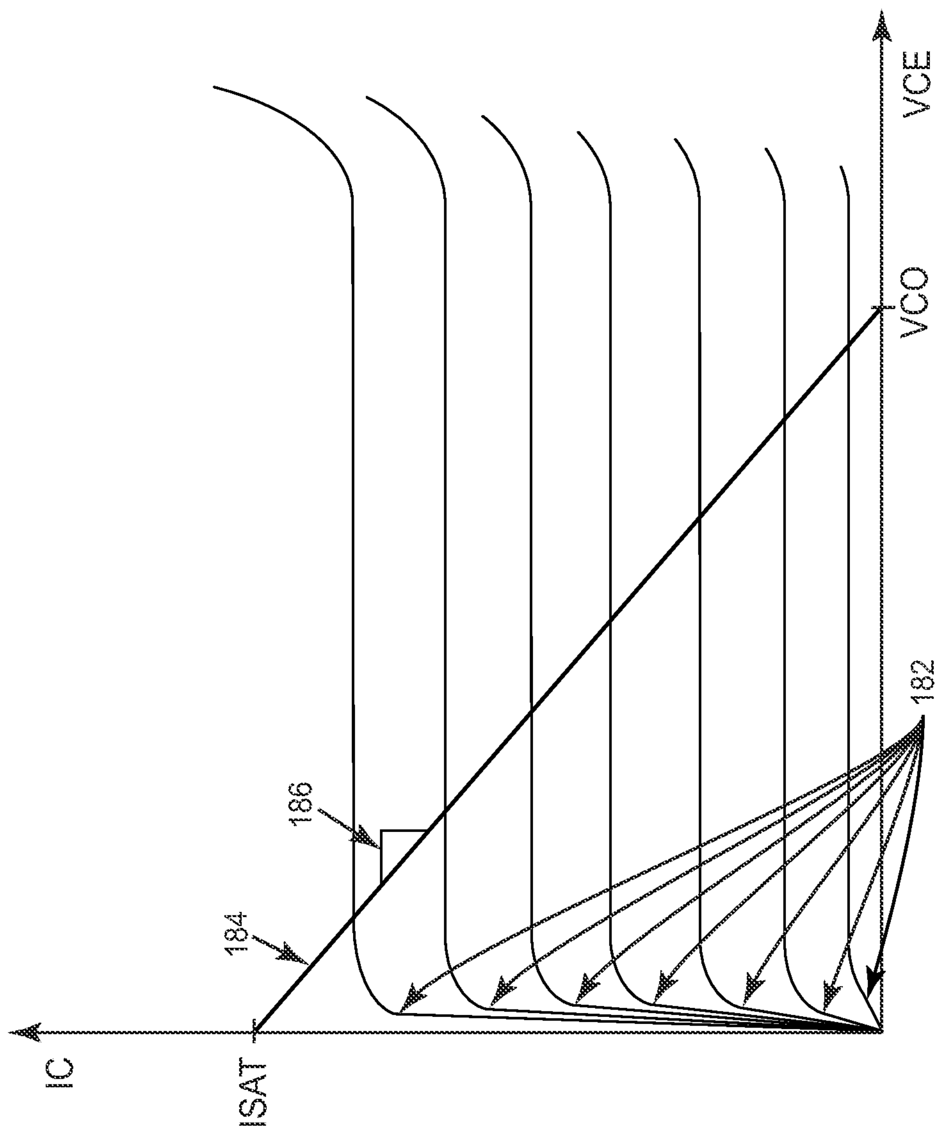

FIG. 25 is a graph illustrating output characteristics of a first output transistor element illustrated in FIG. 24 according to one embodiment of the first output transistor element.

Figure 26:
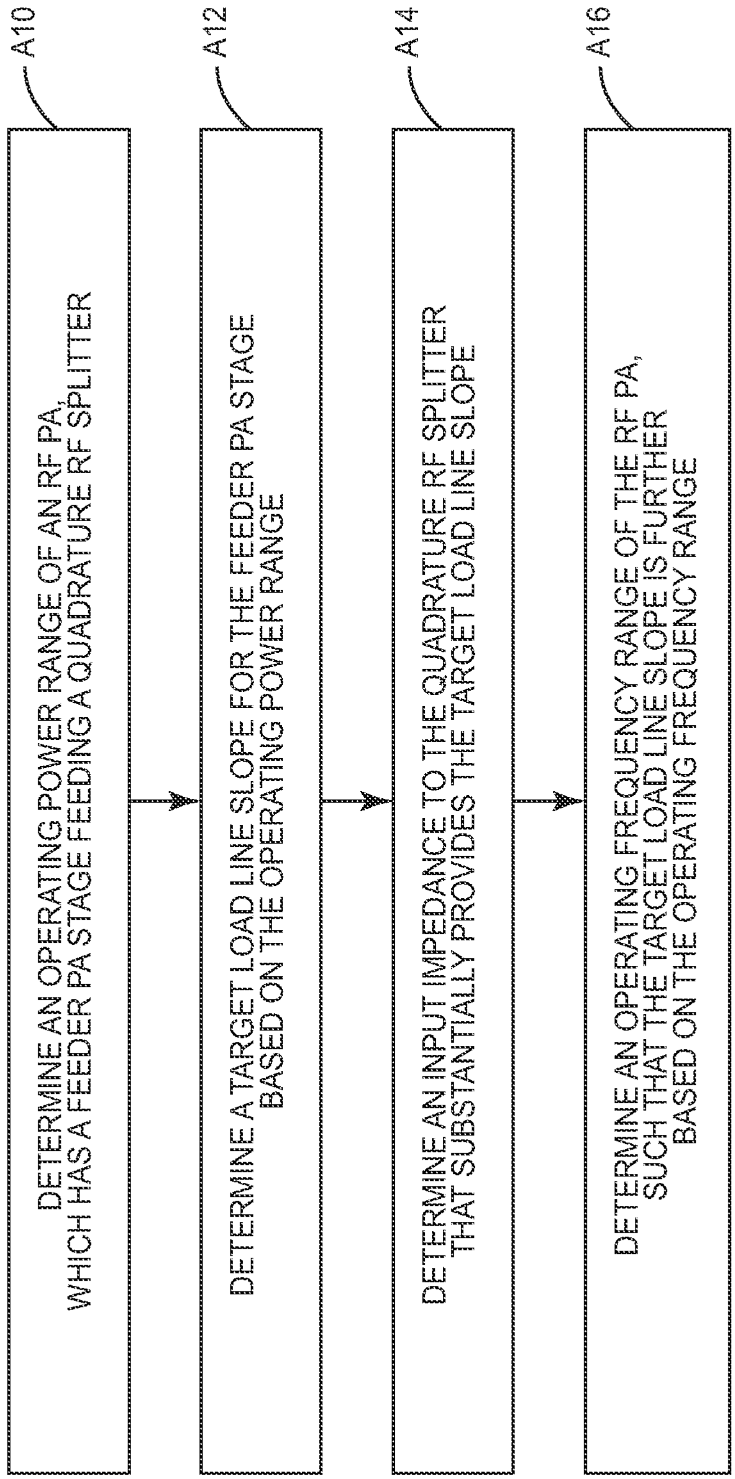

FIG. 26 illustrates a process for matching an input impedance to a quadrature RF splitter to a target load line of a feeder PA stage.

Figure 27:
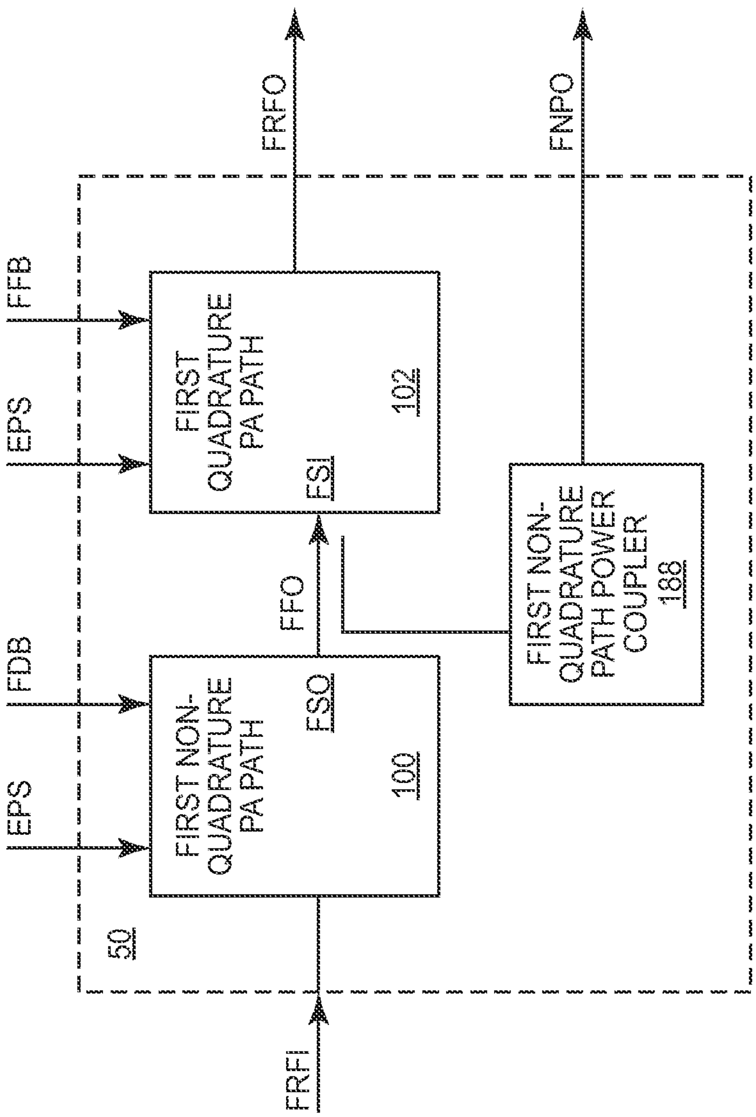

FIG. 27 shows details of the first RF PA illustrated in FIG. 14 according an alternate embodiment of the first RF PA.

Figure 28:
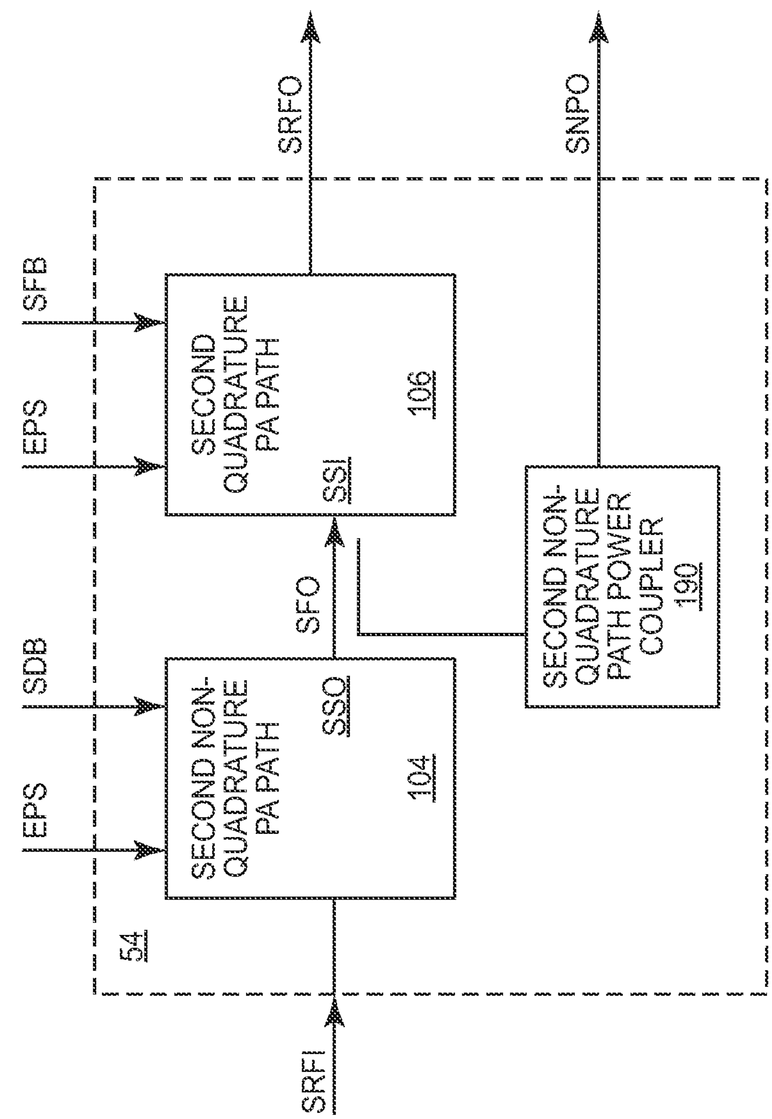

FIG. 28 shows details of the second RF PA illustrated in FIG. 14 according an alternate embodiment of the second RF PA.

Figure 29:
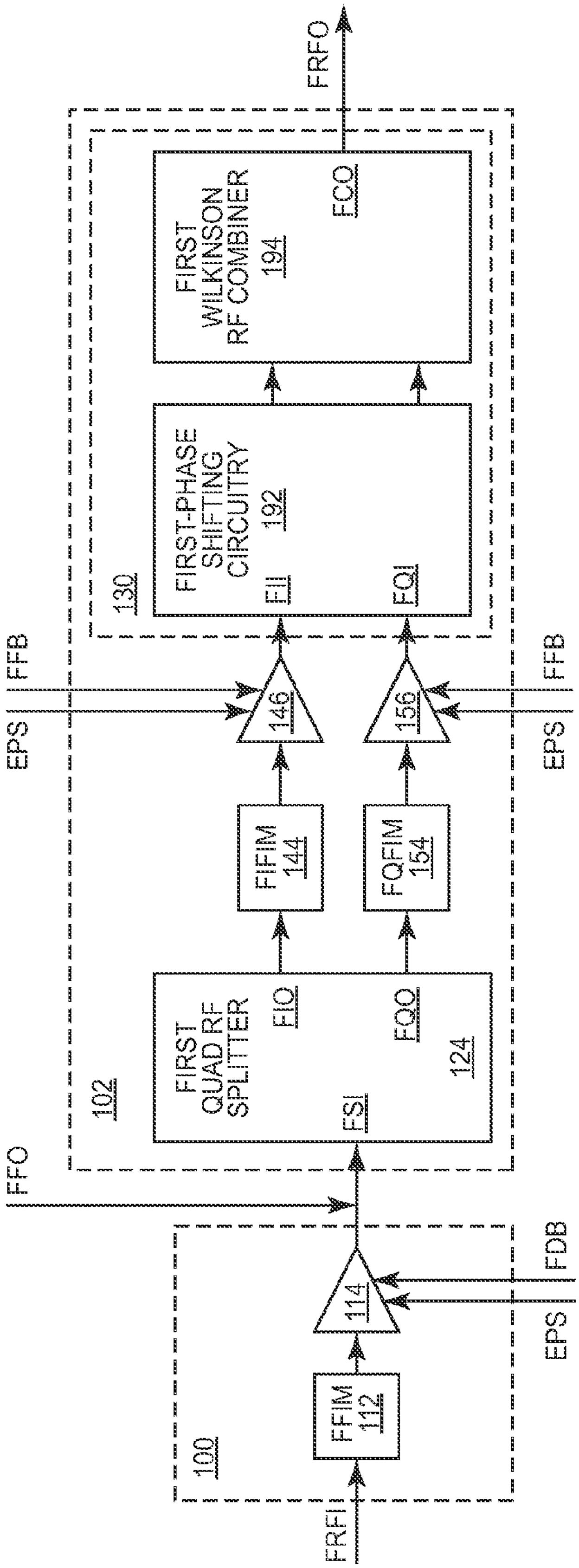

FIG. 29 shows details of a first in-phase amplification path, a first quadrature-phase amplification path, and a first quadrature RF combiner illustrated in FIG. 22 according to one embodiment of the first in-phase amplification path, the first quadrature-phase amplification path, and the first quadrature RF combiner.

Figure 30:
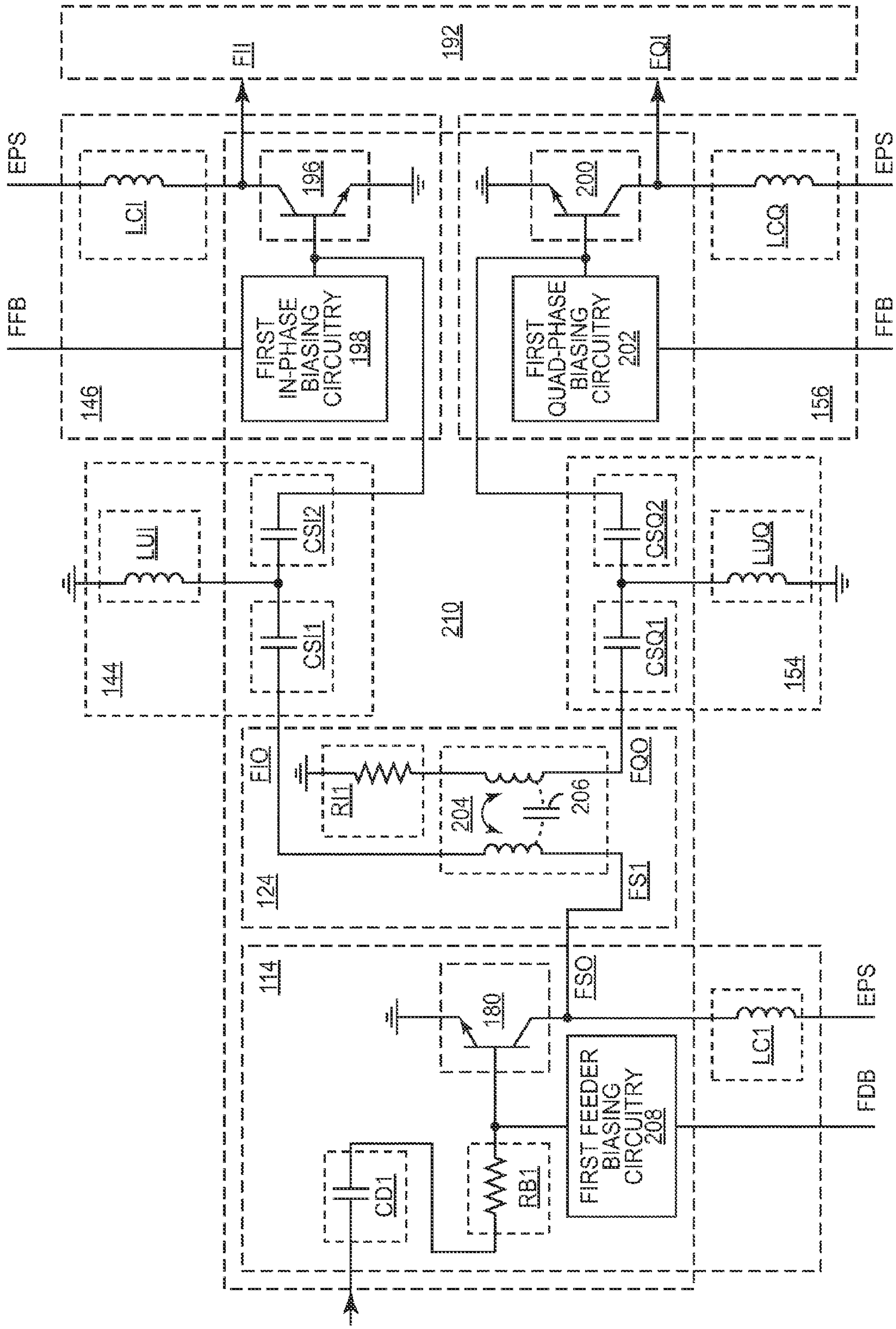

FIG. 30 shows details of a first feeder PA stage, a first quadrature RF splitter, a first in-phase final PA impedance matching circuit, a first in-phase final PA stage, a first quadrature-phase final PA impedance matching circuit, and a first quadrature-phase final PA stage illustrated in FIG. 29 according to one embodiment of the first feeder PA stage, the first quadrature RF splitter, the first in-phase final PA impedance matching circuit, the first in-phase final PA stage, the first quadrature-phase final PA impedance matching circuit, and the first quadrature-phase final PA stage.

Figure 31:
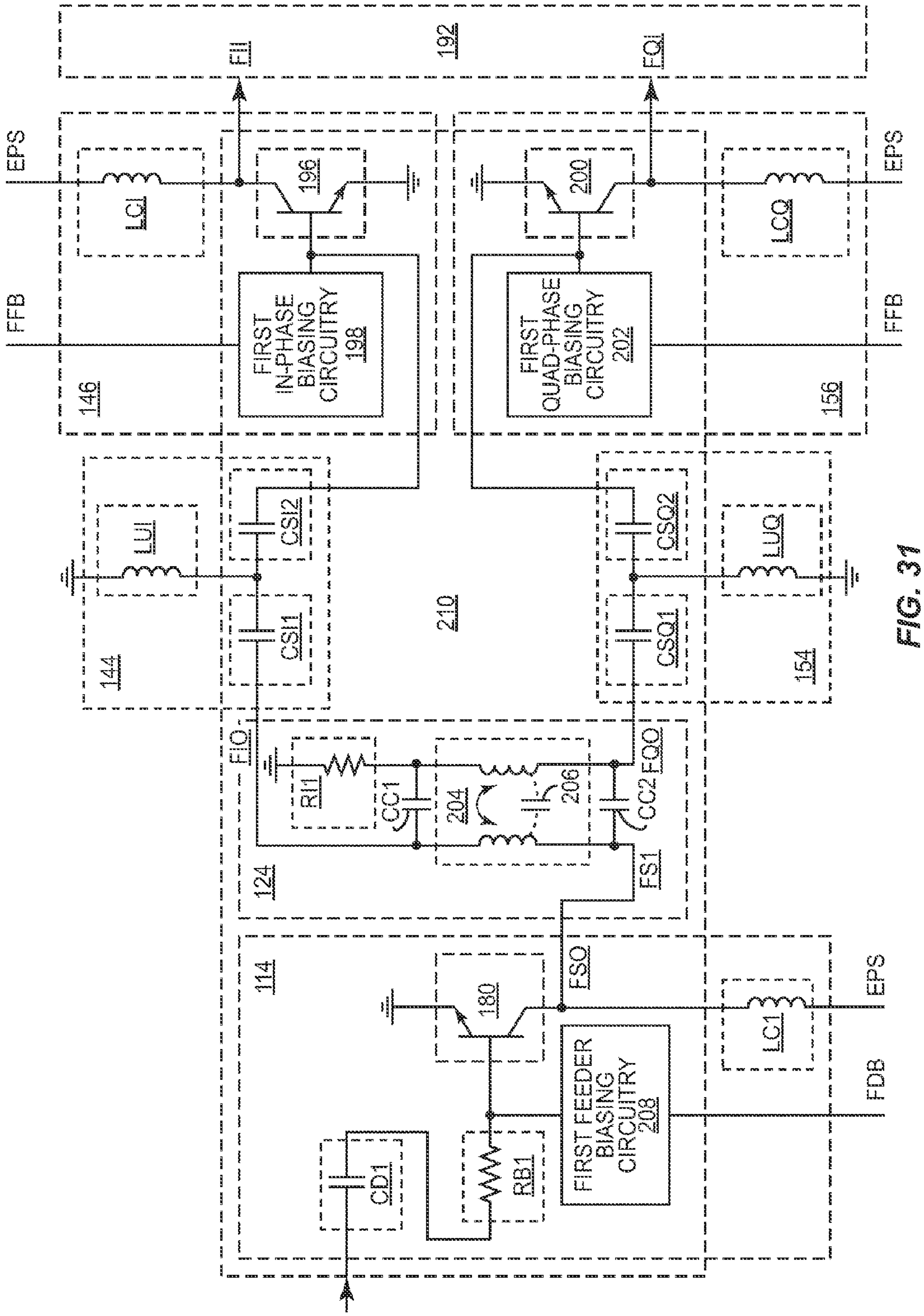

FIG. 31 shows details of the first feeder PA stage, the first quadrature RF splitter, the first in-phase final PA impedance matching circuit, the first in-phase final PA stage, the first quadrature-phase final PA impedance matching circuit, and the first quadrature-phase final PA stage illustrated in FIG. 29 according to an alternate embodiment of the first feeder PA stage, the first quadrature RF splitter, the first in-phase final PA impedance matching circuit, the first in-phase final PA stage, the first quadrature-phase final PA impedance matching circuit, and the first quadrature-phase final PA stage.

Figure 32:
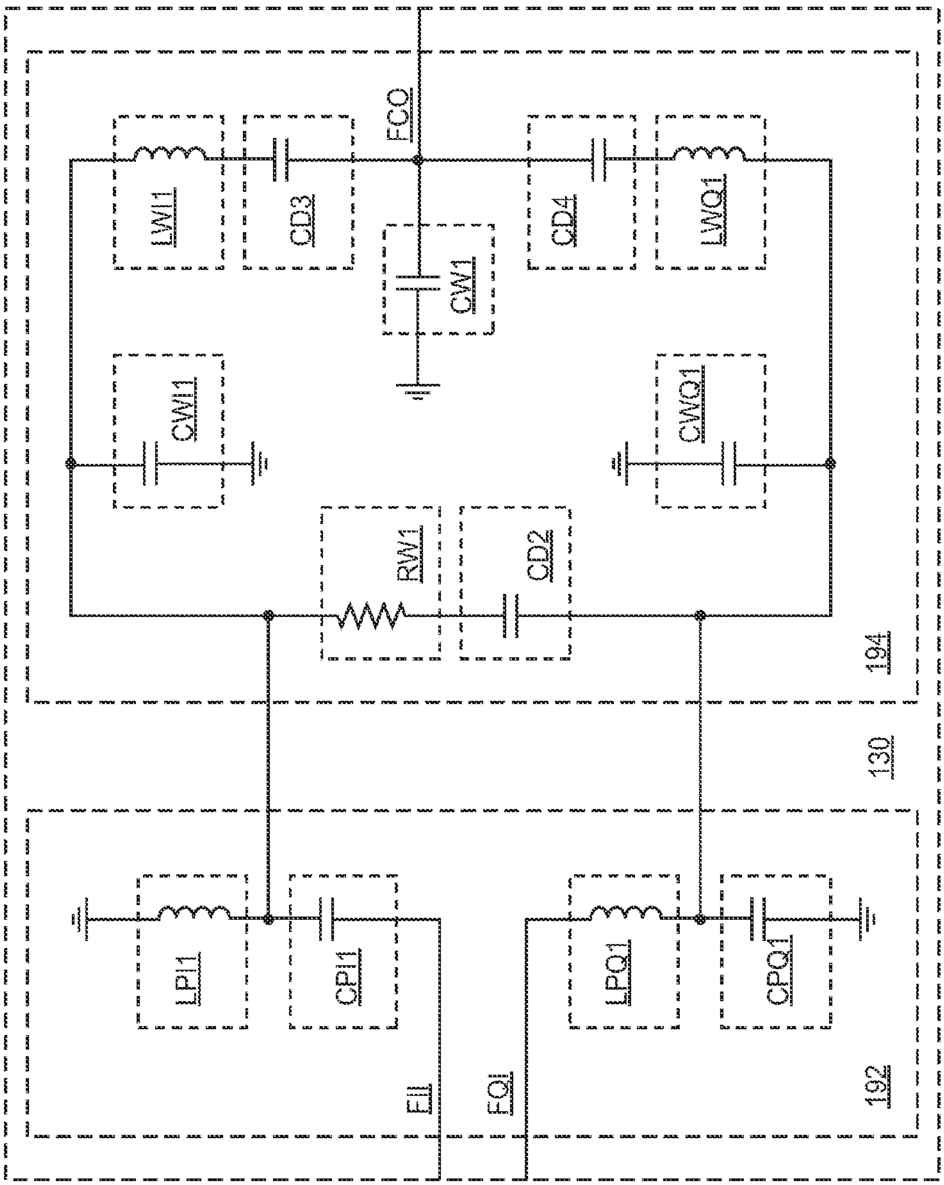

FIG. 32 shows details of first phase-shifting circuitry and a first Wilkinson RF combiner illustrated in FIG. 29 according to one embodiment of the first phase-shifting circuitry and the first Wilkinson RF combiner.

Figure 33:
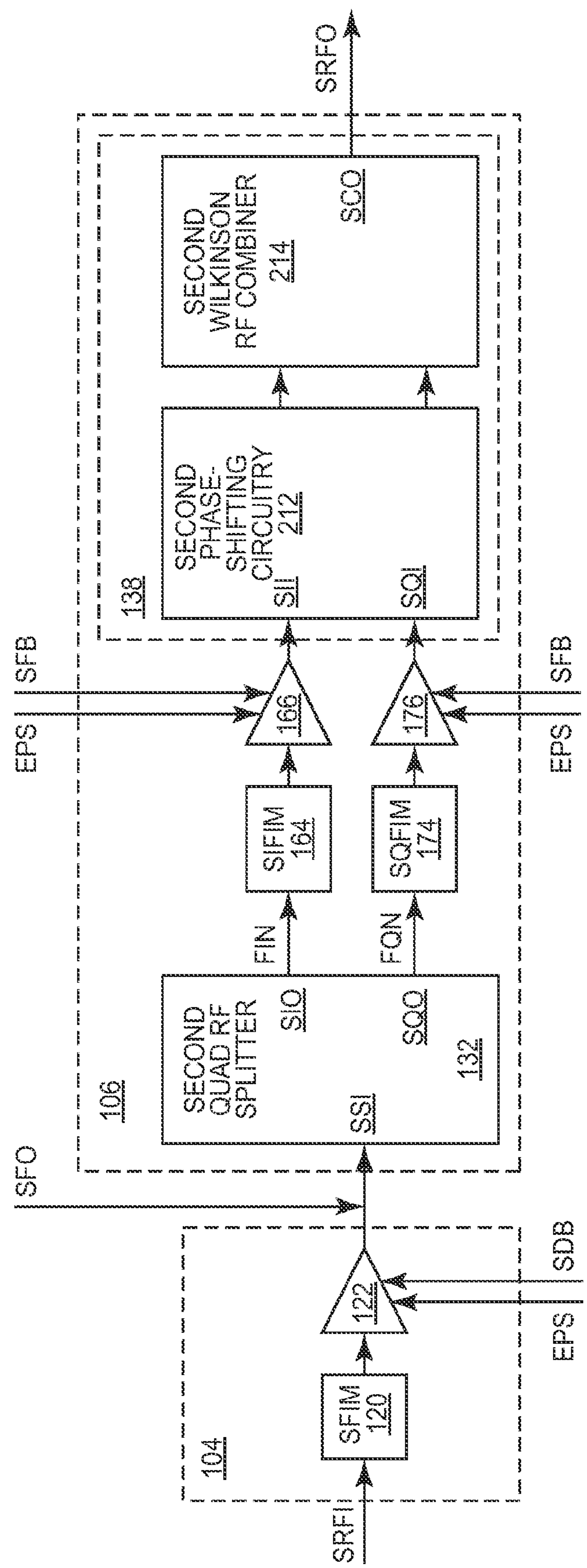

FIG. 33 shows details of the second non-quadrature PA path illustrated in FIG. 16 and details of the second quadrature PA path illustrated in FIG. 18 according to one embodiment of the second non-quadrature PA path and the second quadrature PA path.

Figure 34:
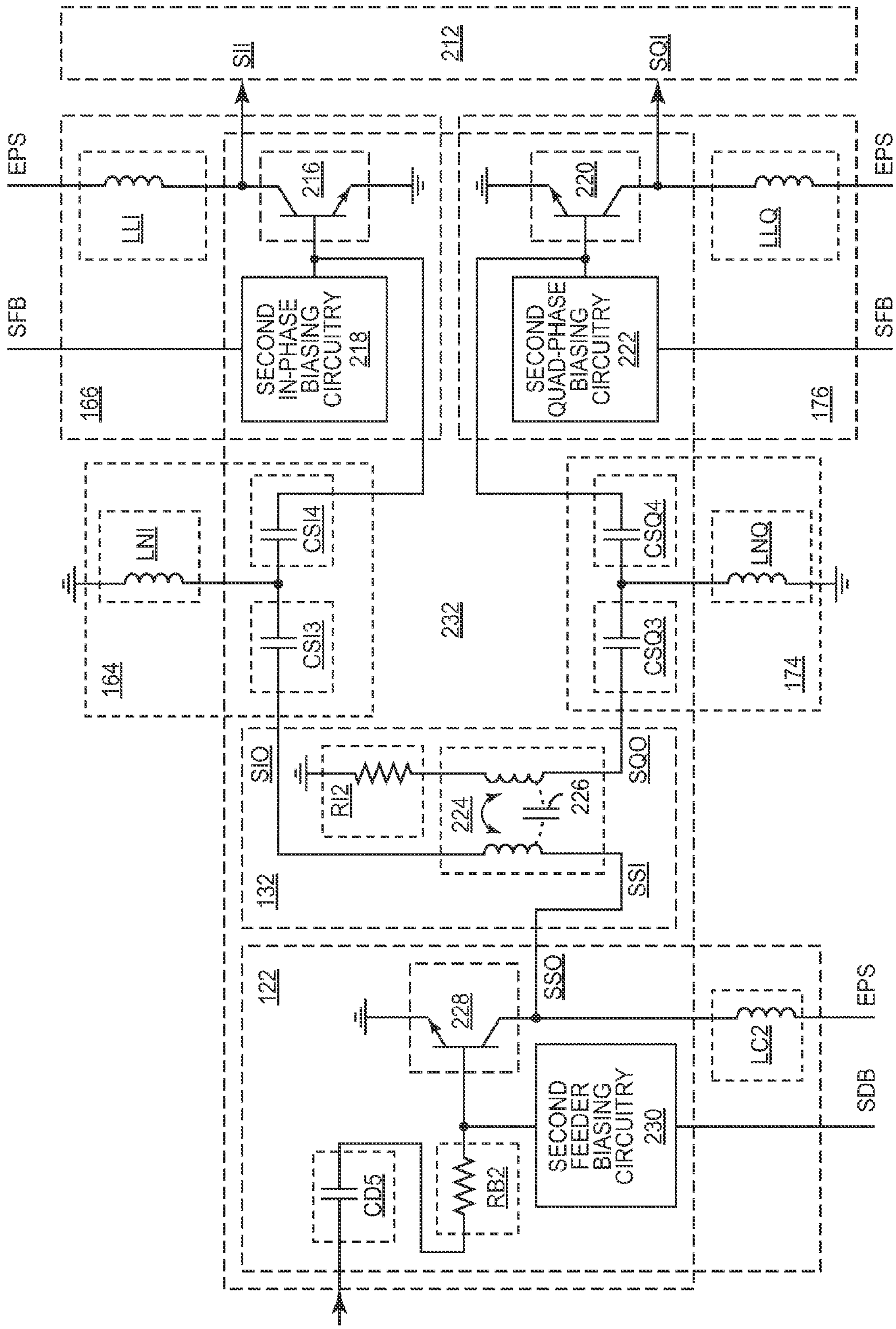

FIG. 34 shows details of a second feeder PA stage, a second quadrature RF splitter, a second in-phase final PA impedance matching circuit, a second in-phase final PA stage, a second quadrature-phase final PA impedance matching circuit, and a second quadrature-phase final PA stage illustrated in FIG. 33 according to one embodiment of the second feeder PA stage, the second quadrature RF splitter, the second in-phase final PA impedance matching circuit, the second in-phase final PA stage, the second quadrature-phase final PA impedance matching circuit, and the second quadrature-phase final PA stage.

Figure 35:
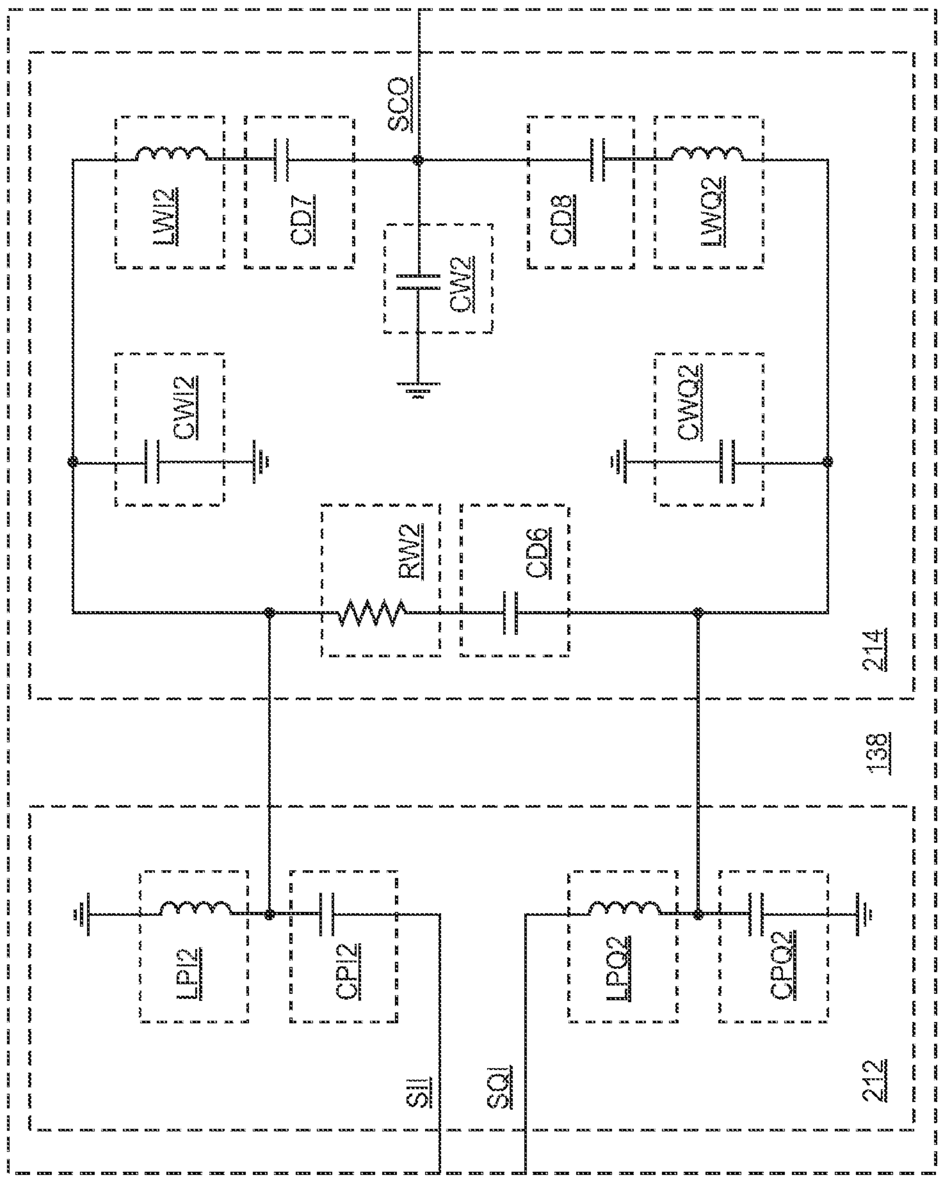

FIG. 35 shows details of second phase-shifting circuitry and a second Wilkinson RF combiner illustrated in FIG. 33 according to one embodiment of the second phase-shifting circuitry and the second Wilkinson RF combiner.

Figure 36:
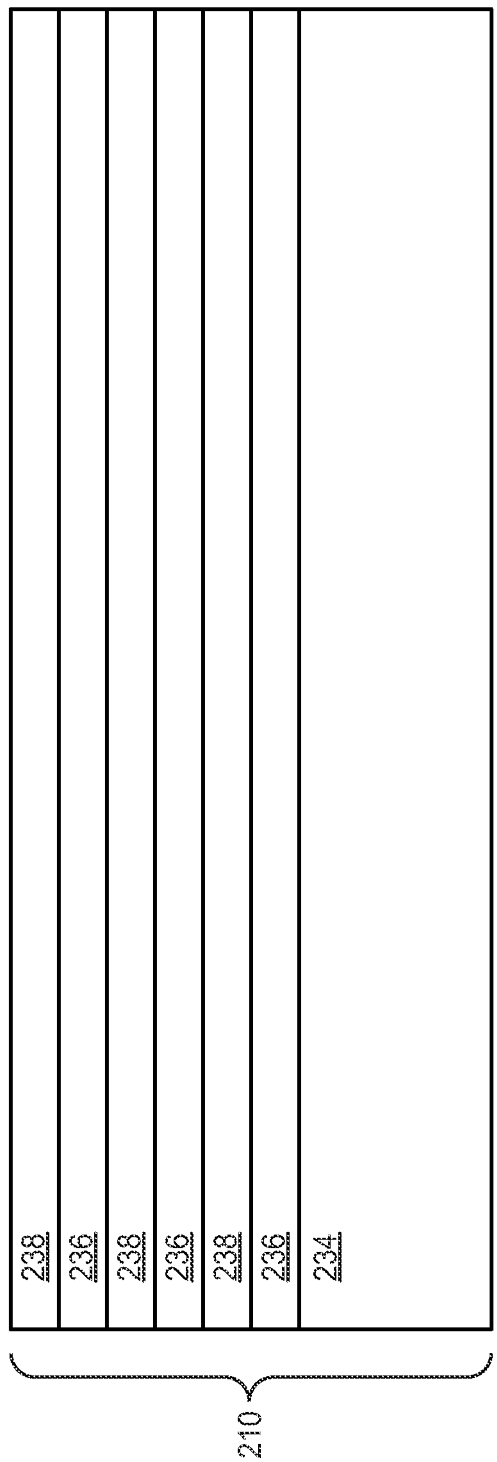

FIG. 36 shows details of a first PA semiconductor die illustrated in FIG. 30 according to one embodiment of the first PA semiconductor die.

Figure 5:
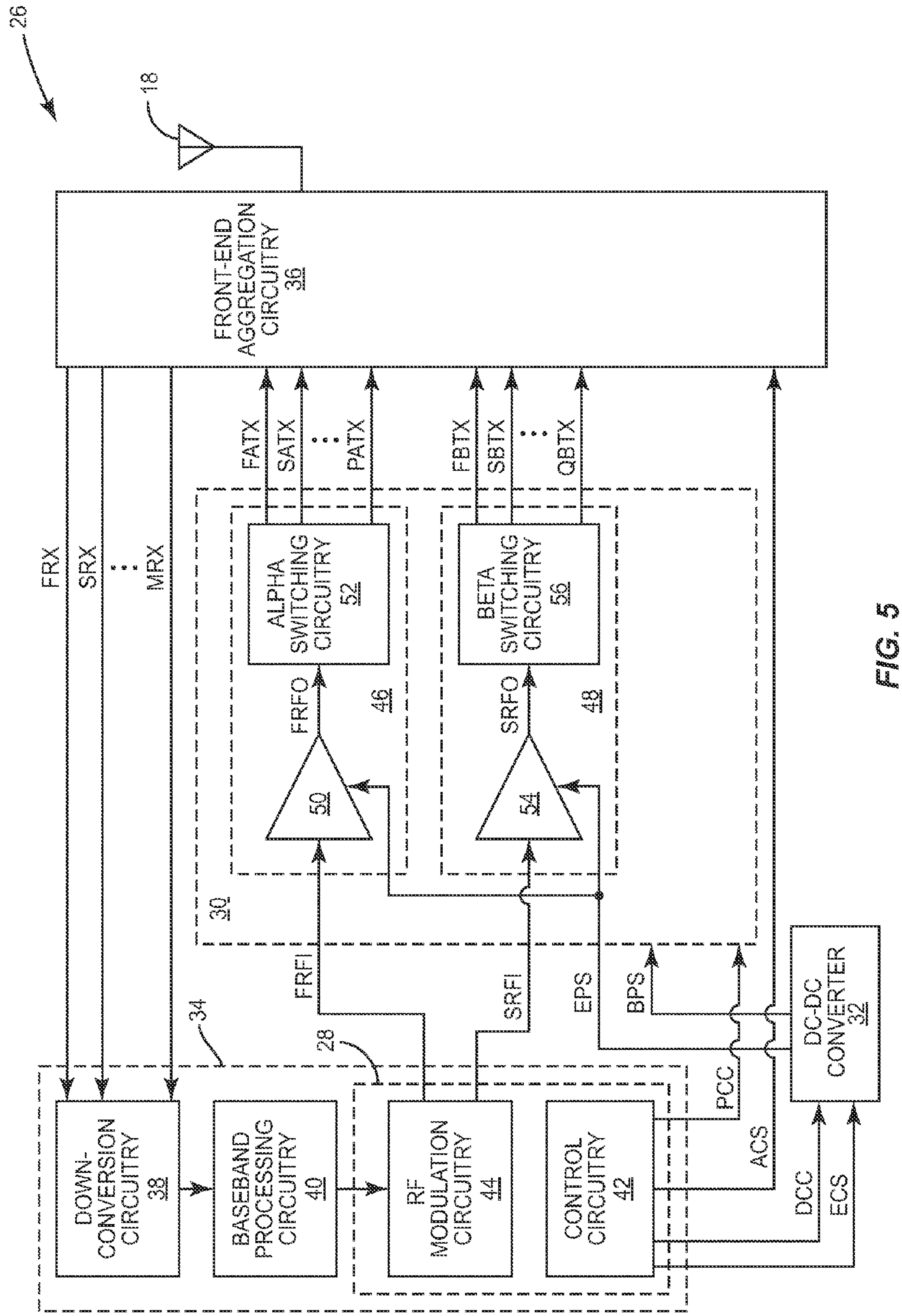
FIG. 5 shows the RF communications system according to another embodiment of the RF communications system.
Figure 37:
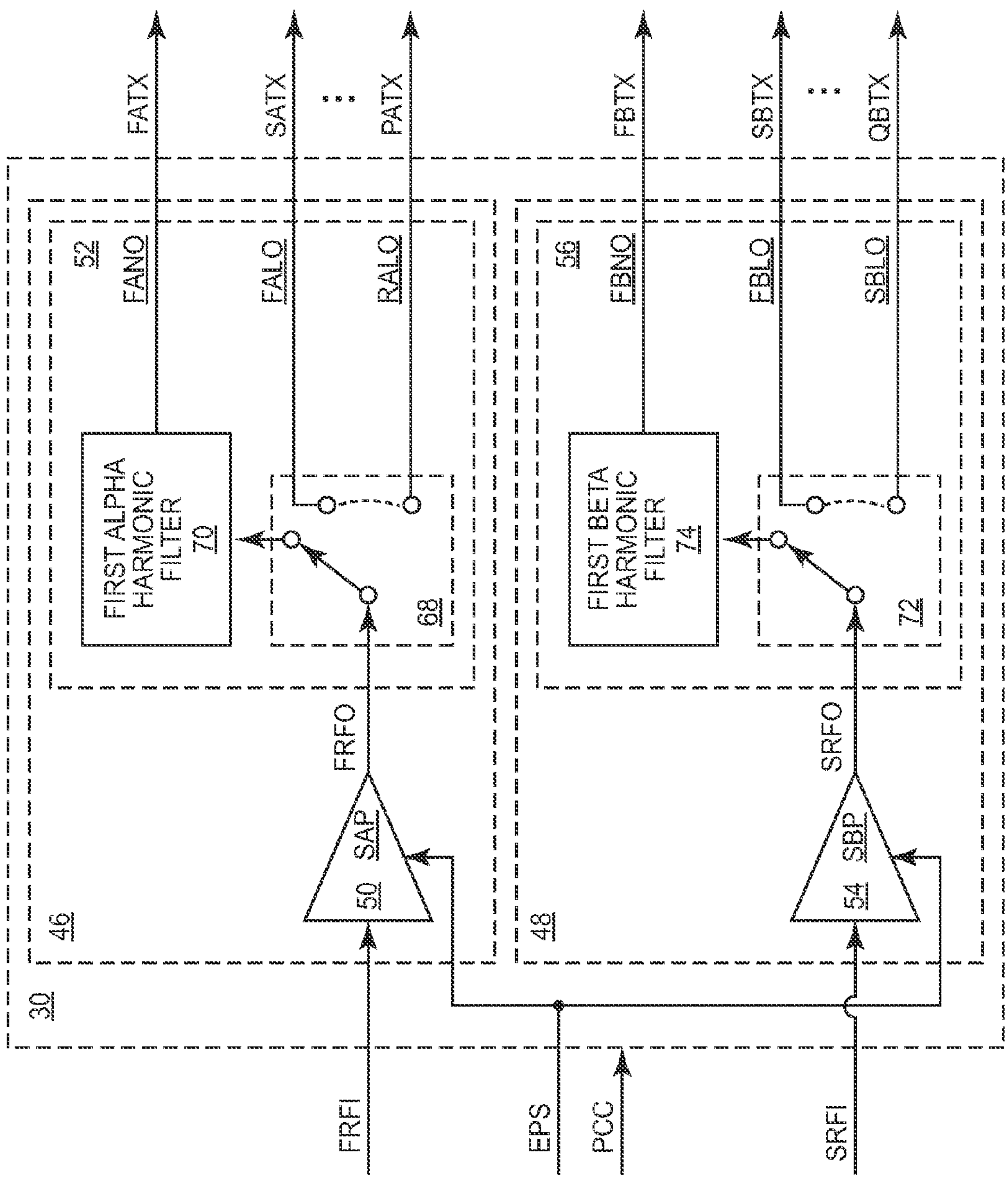

FIG. 37 shows details of the RF PA circuitry illustrated in FIG. 5 according to one embodiment of the RF PA circuitry.

Figure 38:
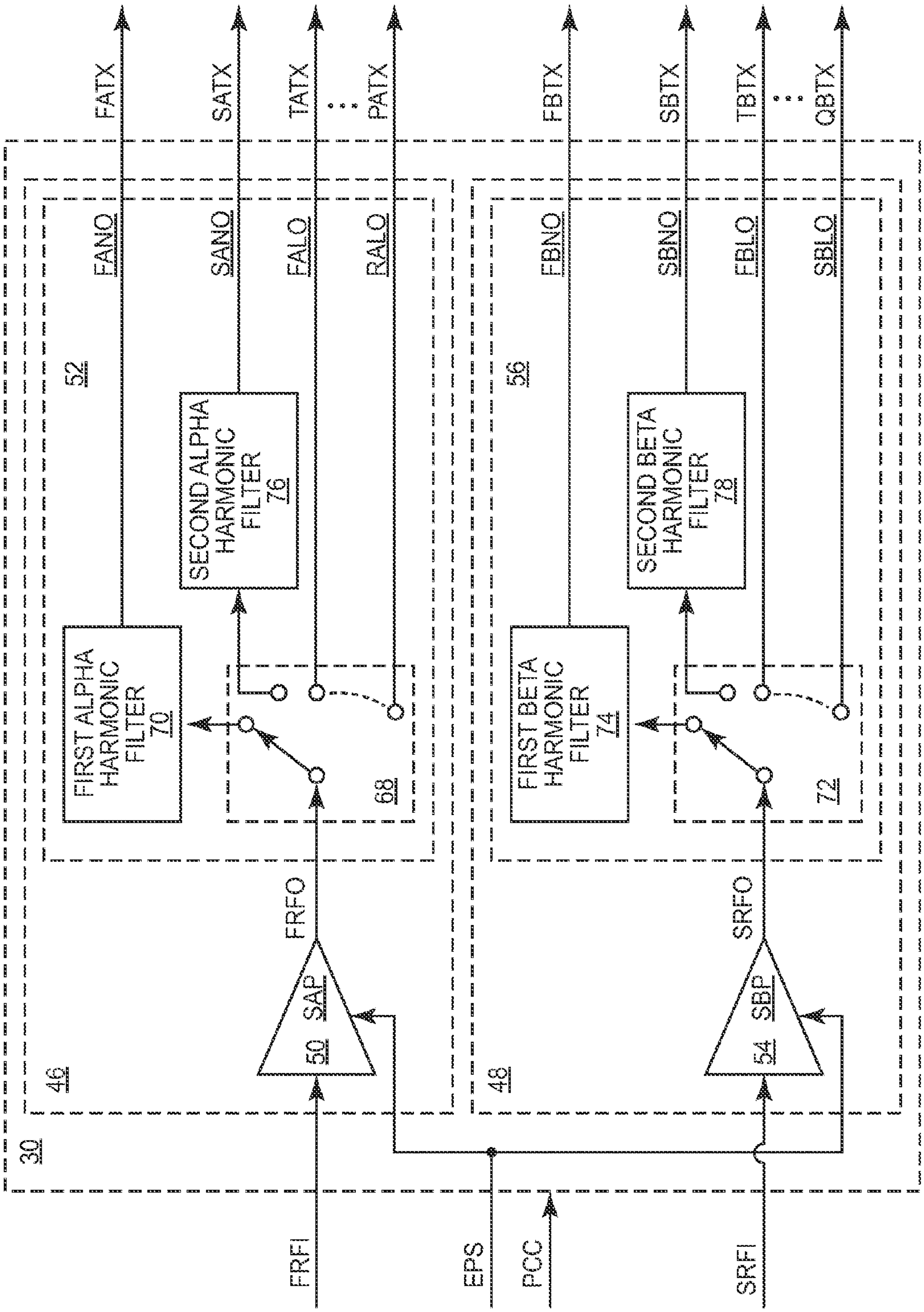

FIG. 38 shows details of the RF PA circuitry illustrated in FIG. 5 according to an alternate embodiment of the RF PA circuitry.

Figure 39:
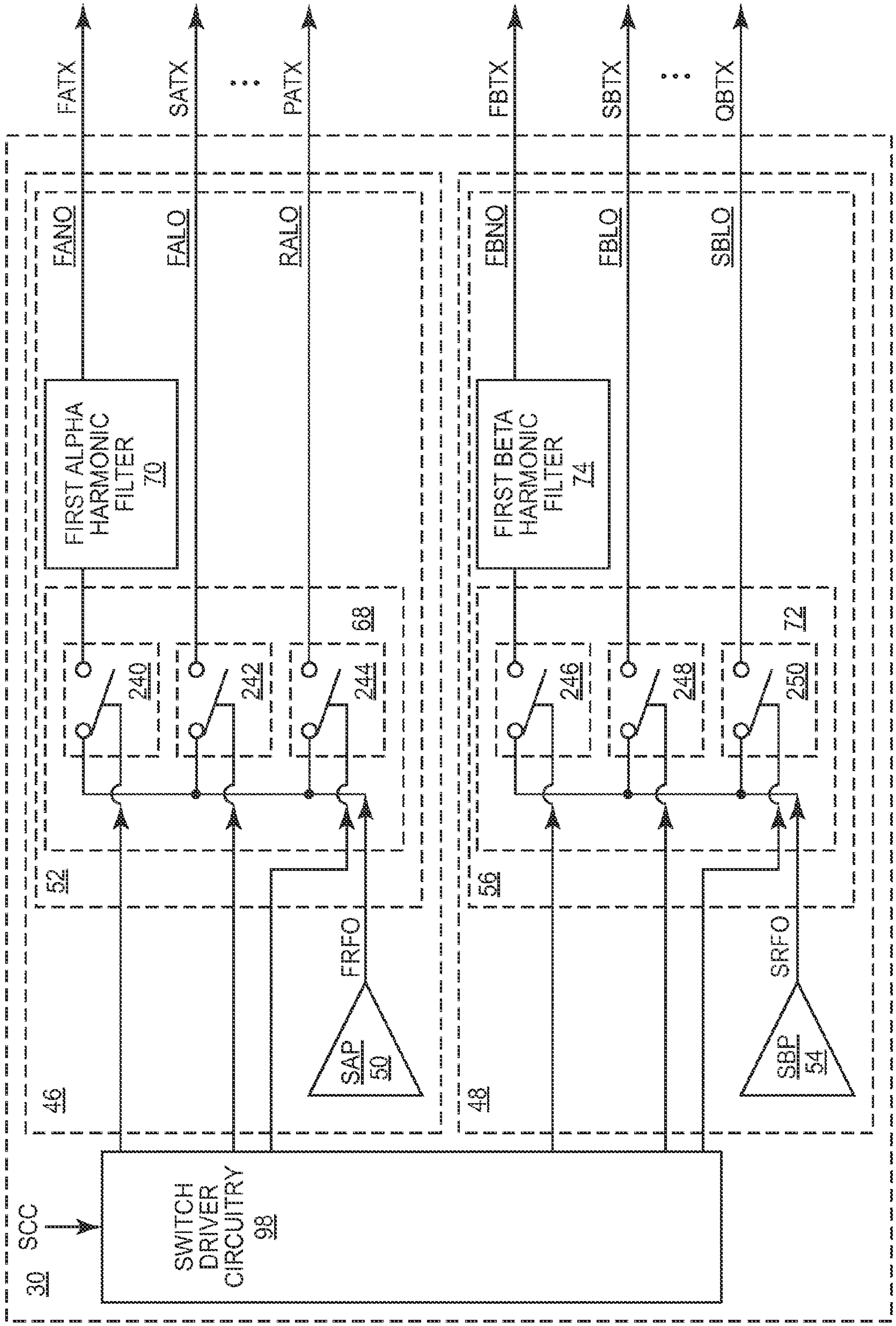

FIG. 39 shows details of the RF PA circuitry illustrated in FIG. 5 according to an additional embodiment of the RF PA circuitry.

Figure 13:
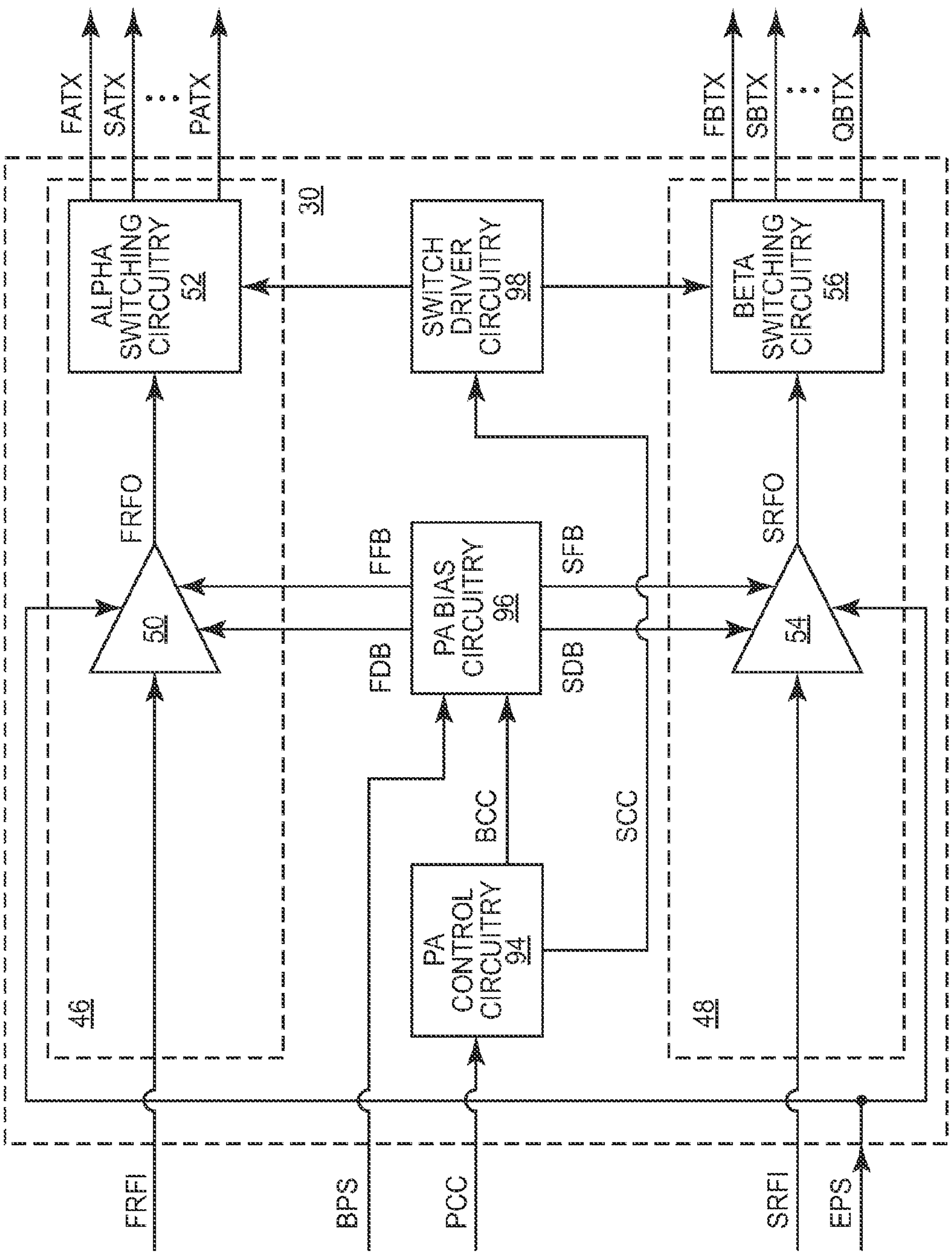
FIG. 13 shows details of the RF PA circuitry illustrated in FIG. 5 according to one embodiment of the RF PA circuitry.
Figure 40:
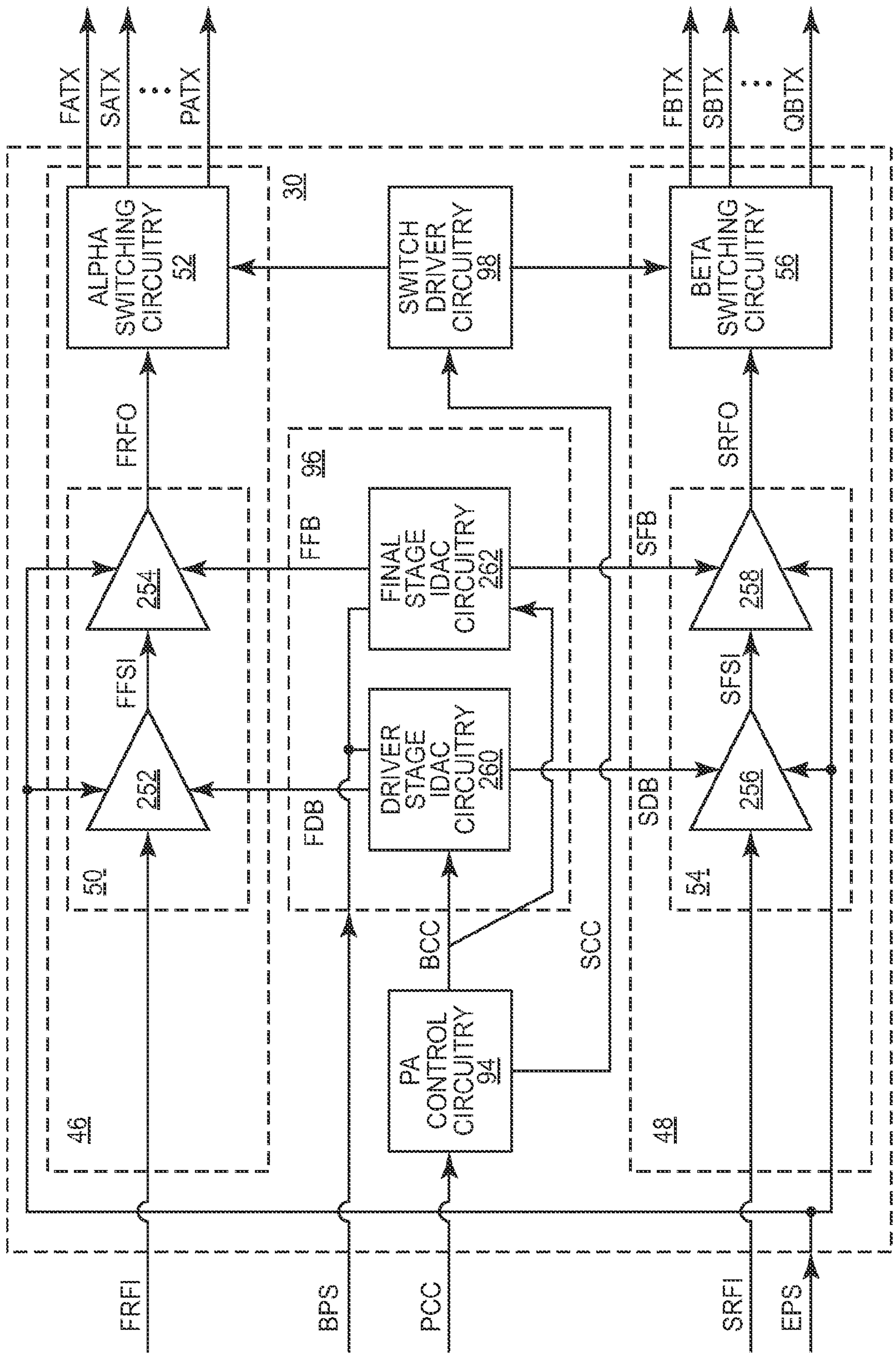

FIG. 40 shows details of the first RF PA, the second RF PA, and PA bias circuitry illustrated in FIG. 13 according to one embodiment of the first RF PA, the second RF PA, and the PA bias circuitry.

Figure 41:
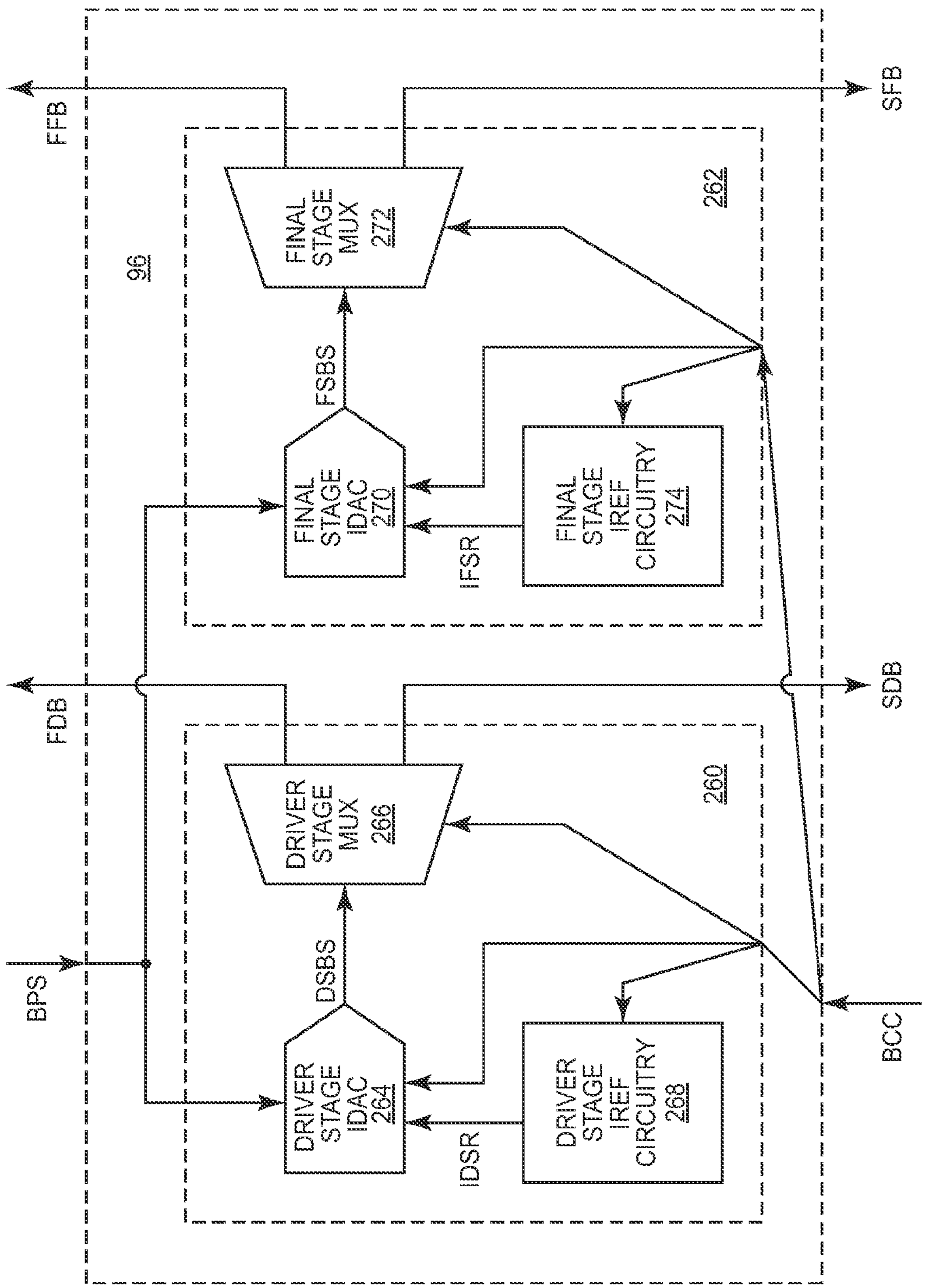

FIG. 41 shows details of driver stage current digital-to-analog converter (IDAC) circuitry and final stage IDAC circuitry illustrated in FIG. 40 according to one embodiment of the driver stage IDAC circuitry and the final stage IDAC circuitry.

Figure 42:
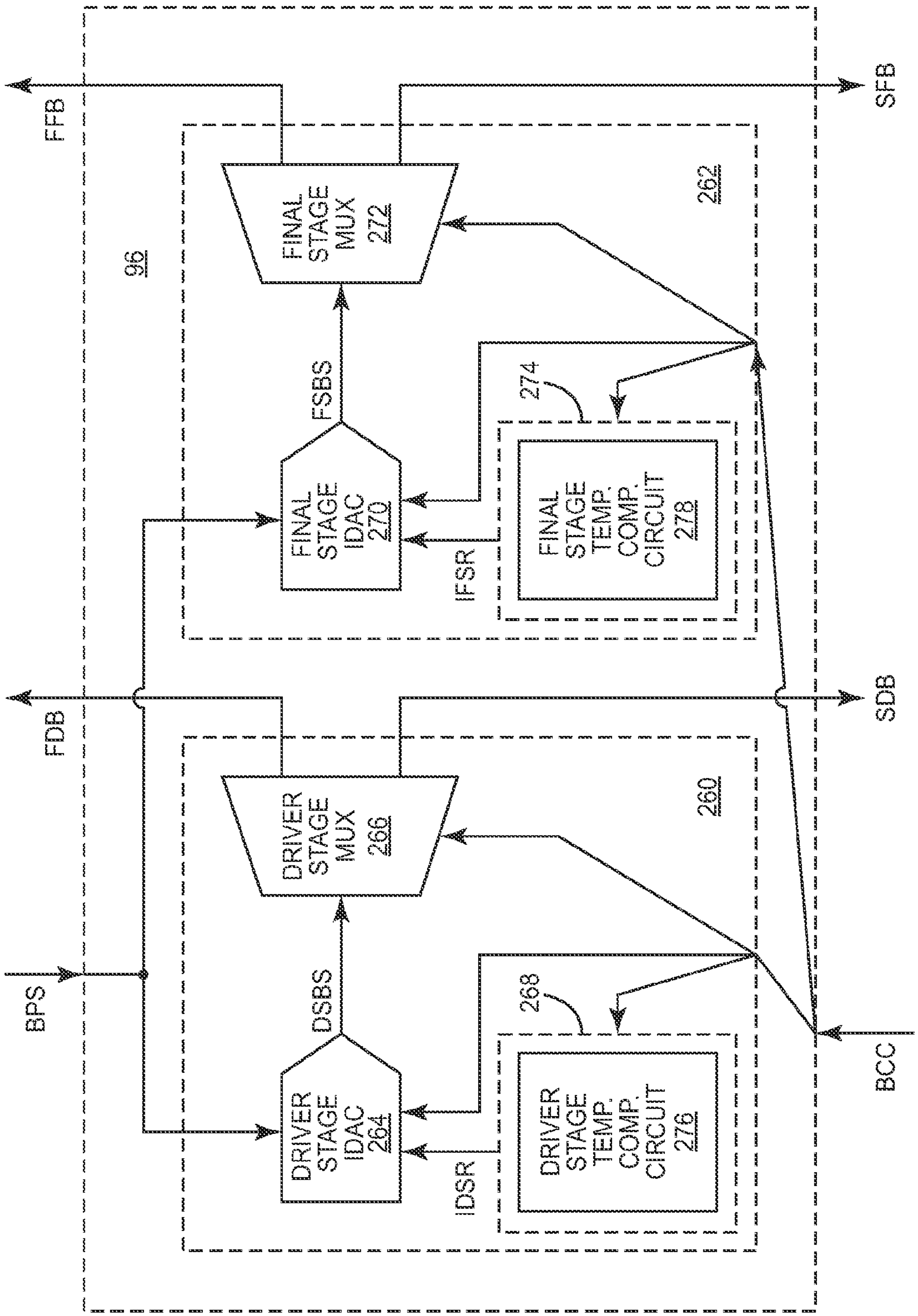

FIG. 42 shows details of driver stage current reference circuitry and final stage current reference circuitry illustrated in FIG. 41 according to one embodiment of the driver stage current reference circuitry and the final stage current reference circuitry.

Figure 43:
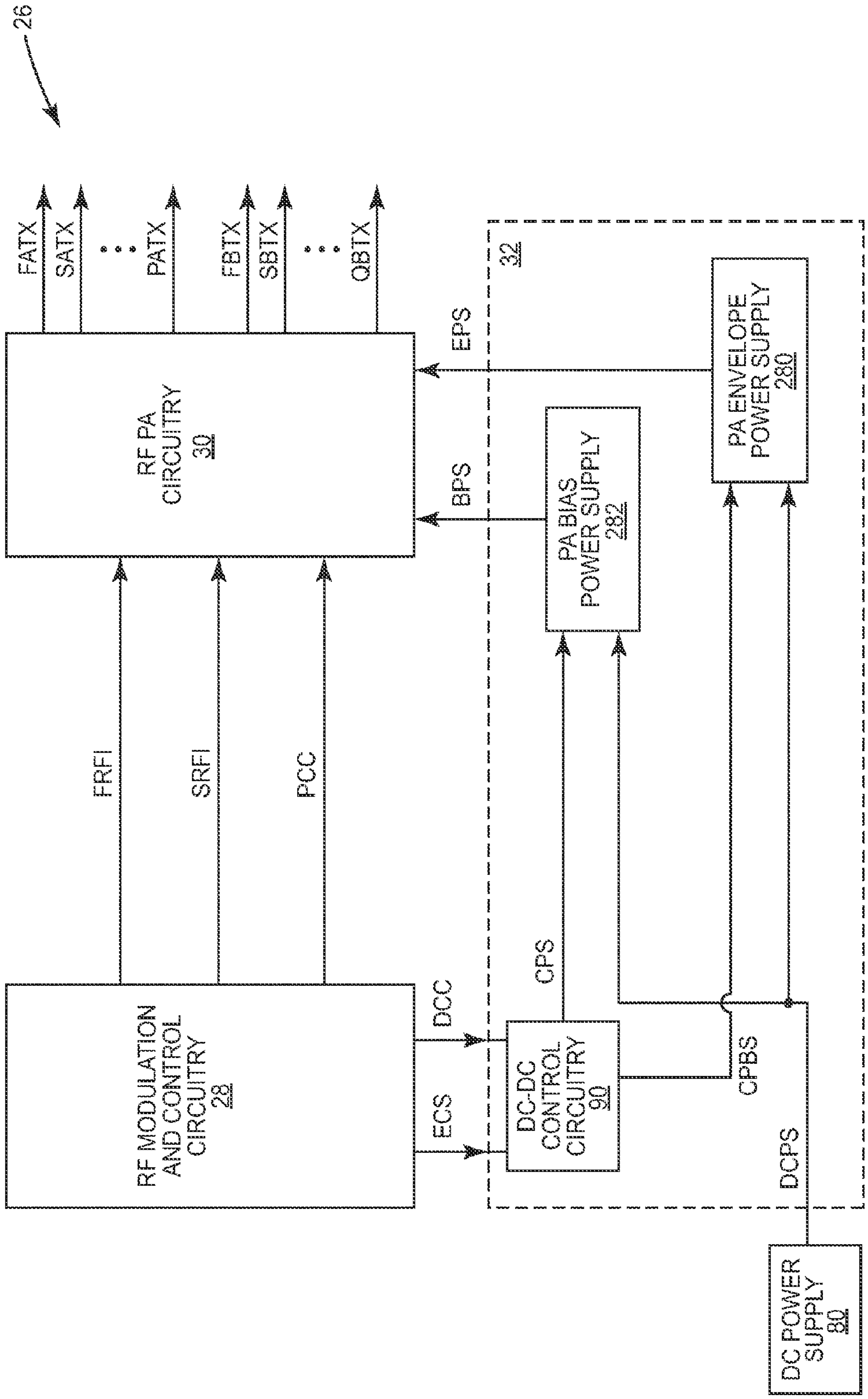

FIG. 43 shows the RF communications system according to one embodiment of the RF communications system.

Figure 44:
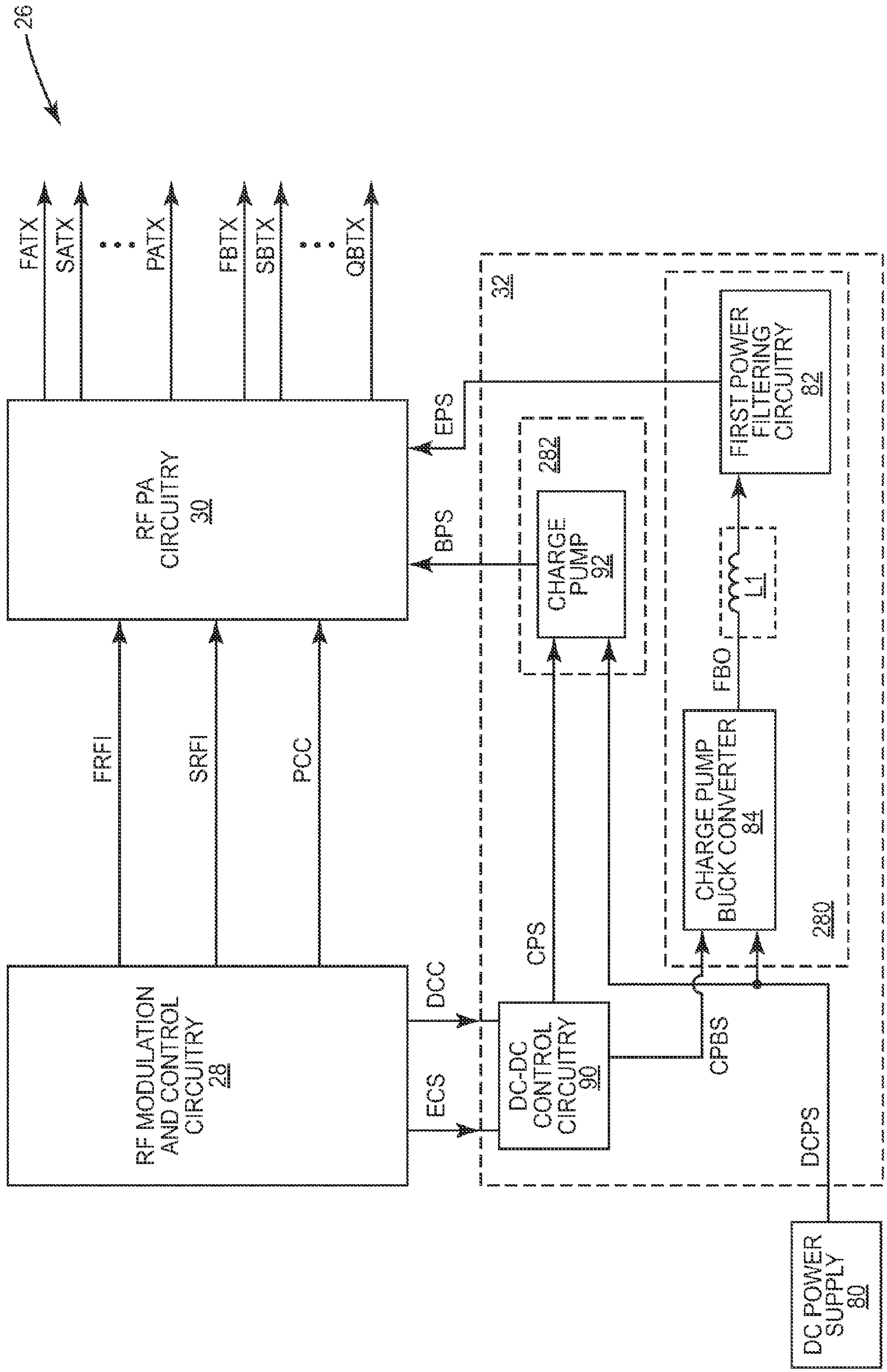

FIG. 44 shows details of a PA envelope power supply and a PA bias power supply illustrated in FIG. 43 according to one embodiment of the PA envelope power supply and the PA bias power supply.

Figure 45:
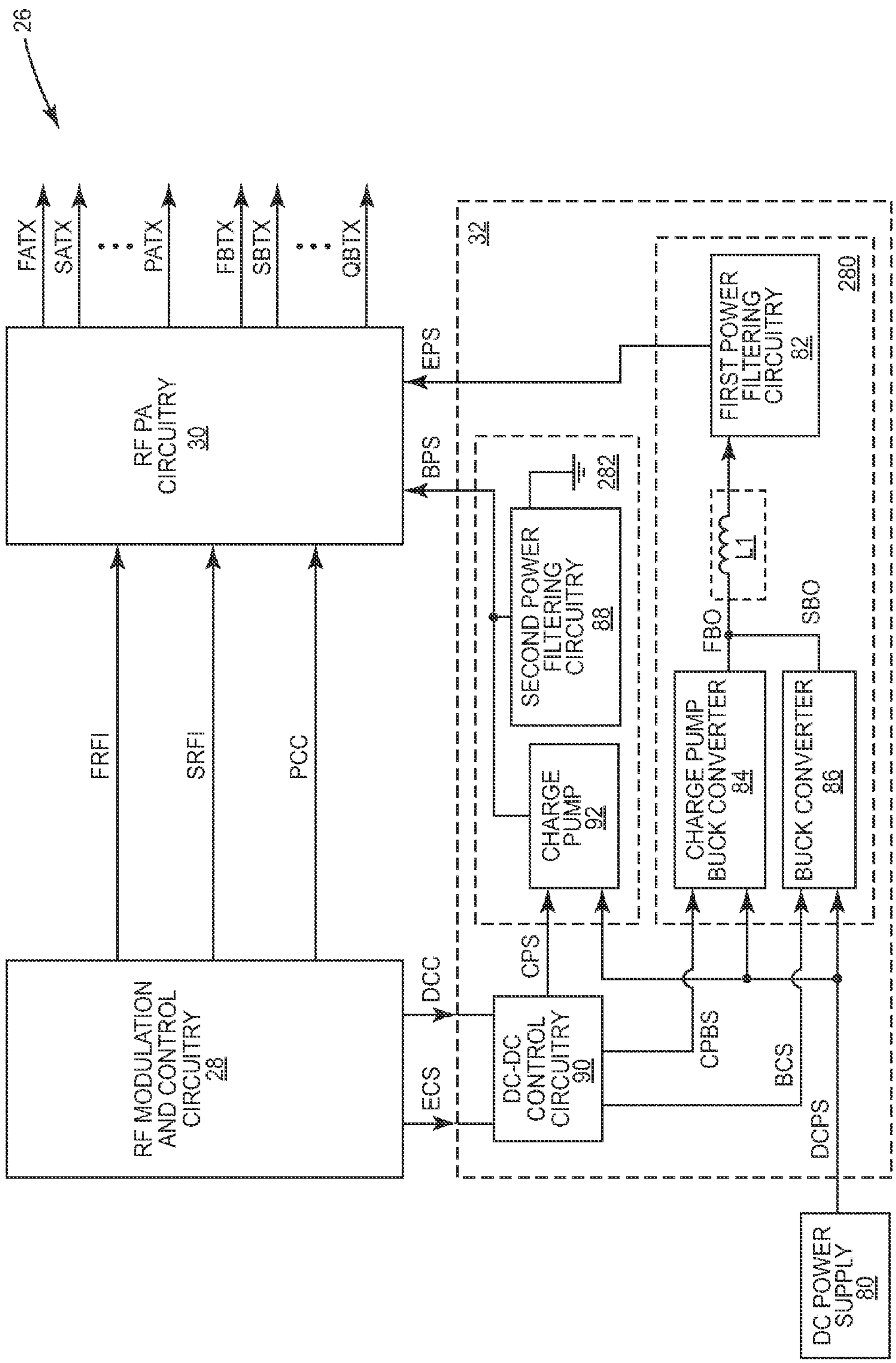

FIG. 45 shows details of the PA envelope power supply and the PA bias power supply illustrated in FIG. 43 according to an alternate embodiment of the PA envelope power supply and the PA bias power supply.

Figure 46:
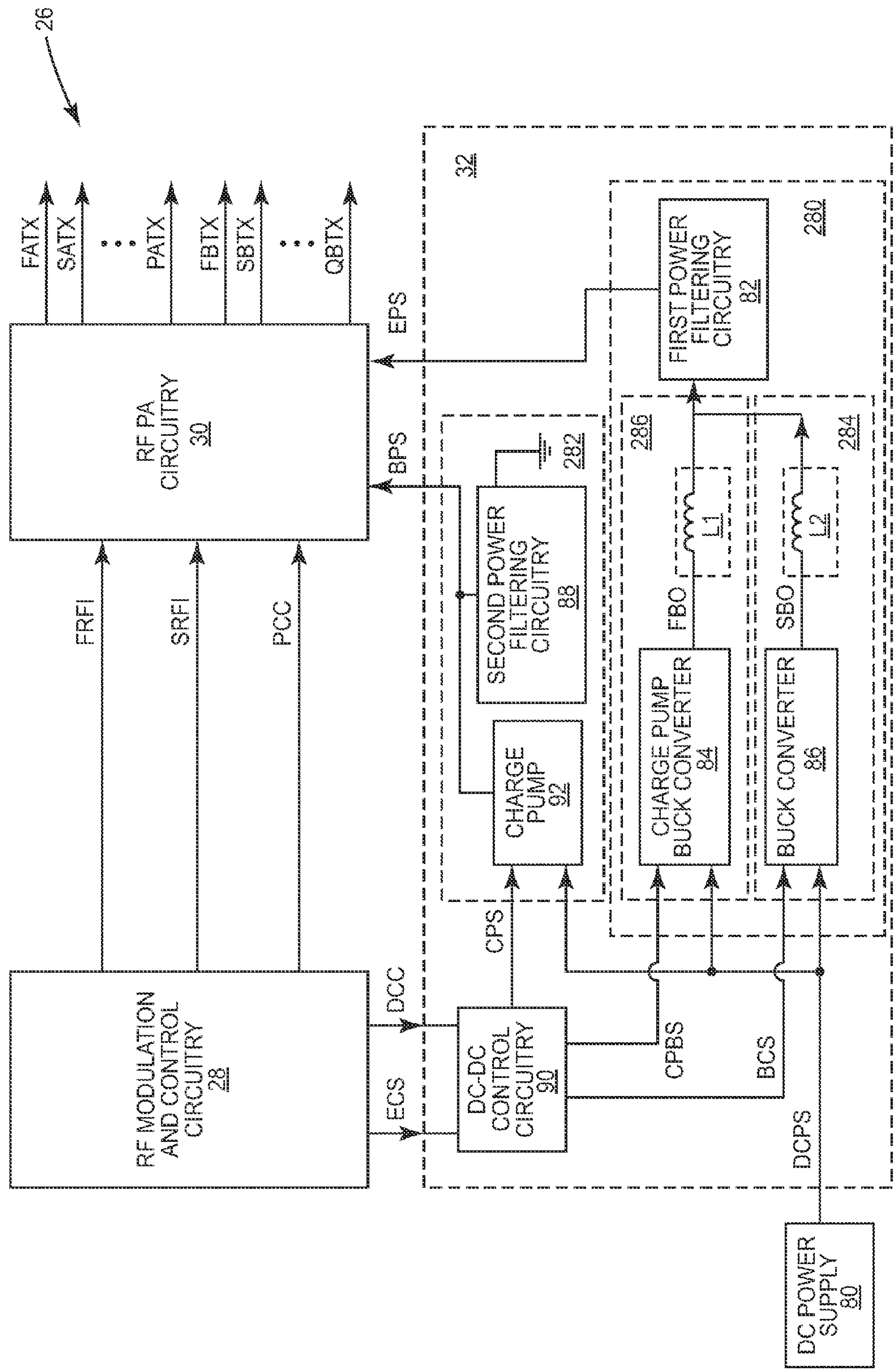

FIG. 46 shows details of the PA envelope power supply and the PA bias power supply illustrated in FIG. 43 according to an additional embodiment of the PA envelope power supply and the PA bias power supply.

Figure 47:
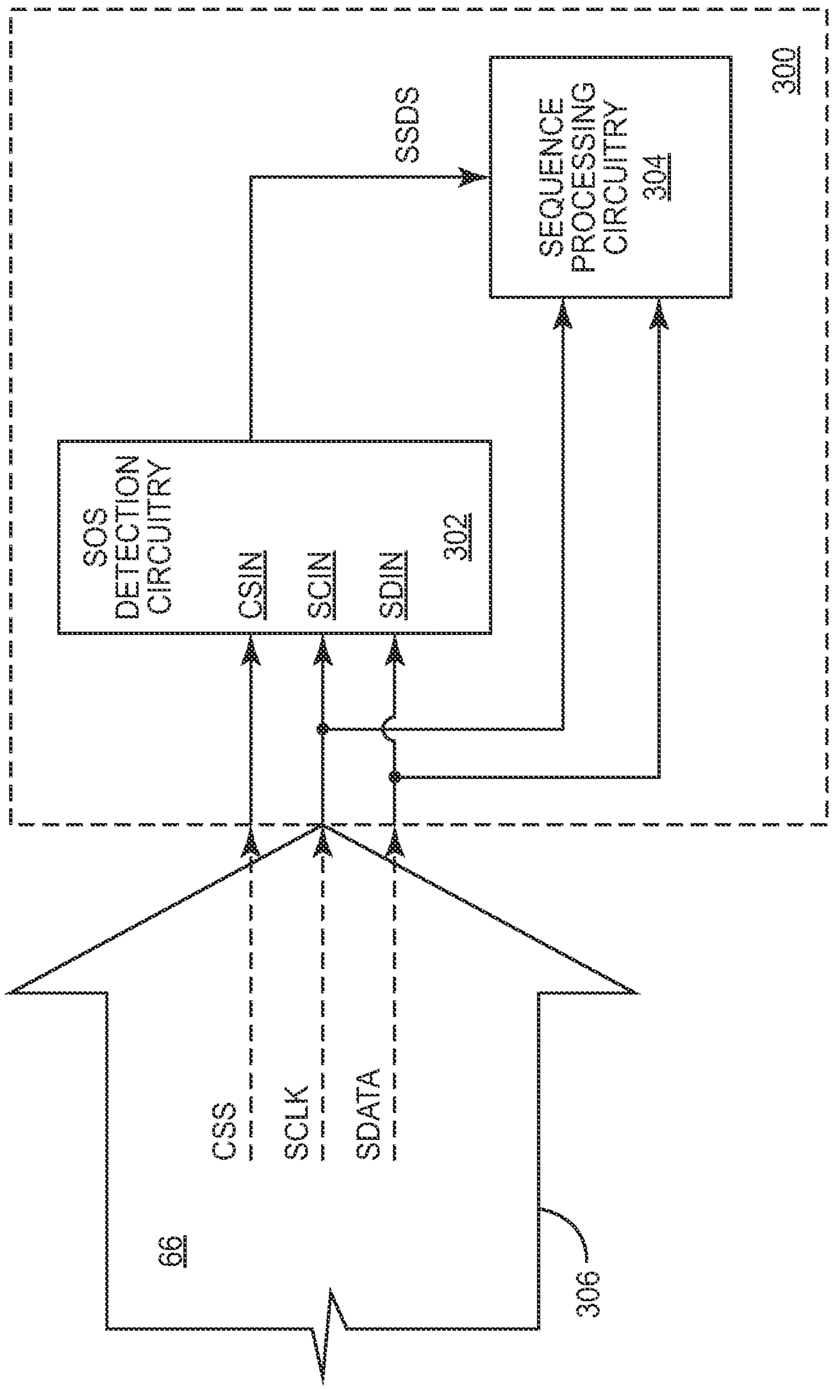

FIG. 47 shows a first automatically configurable 2-wire/3-wire serial communications interface (AC23SCI) according to one embodiment of the first AC23SCI.

Figure 48:
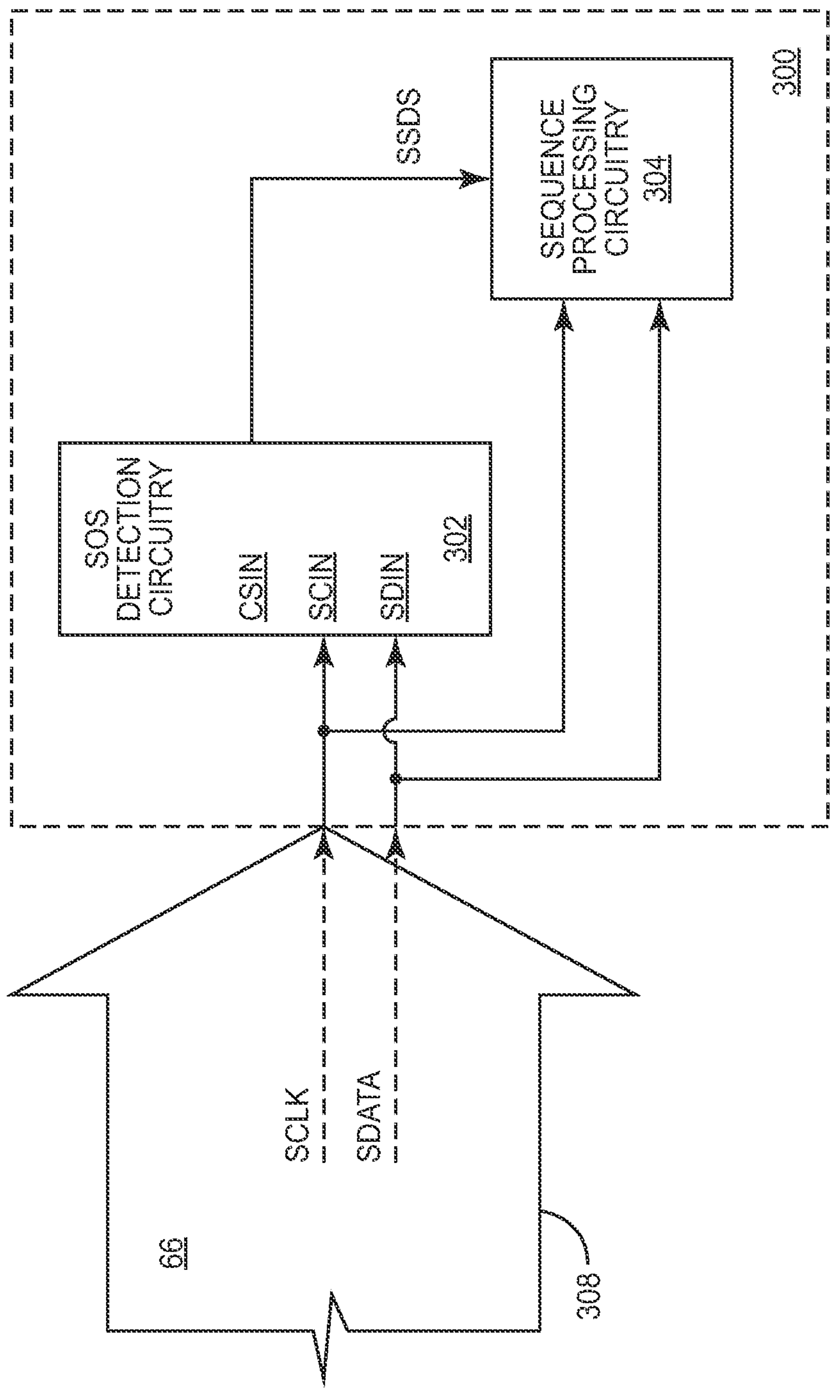

FIG. 48 shows the first AC23SCI according an alternate embodiment of the first AC23SCI.

Figure 49:
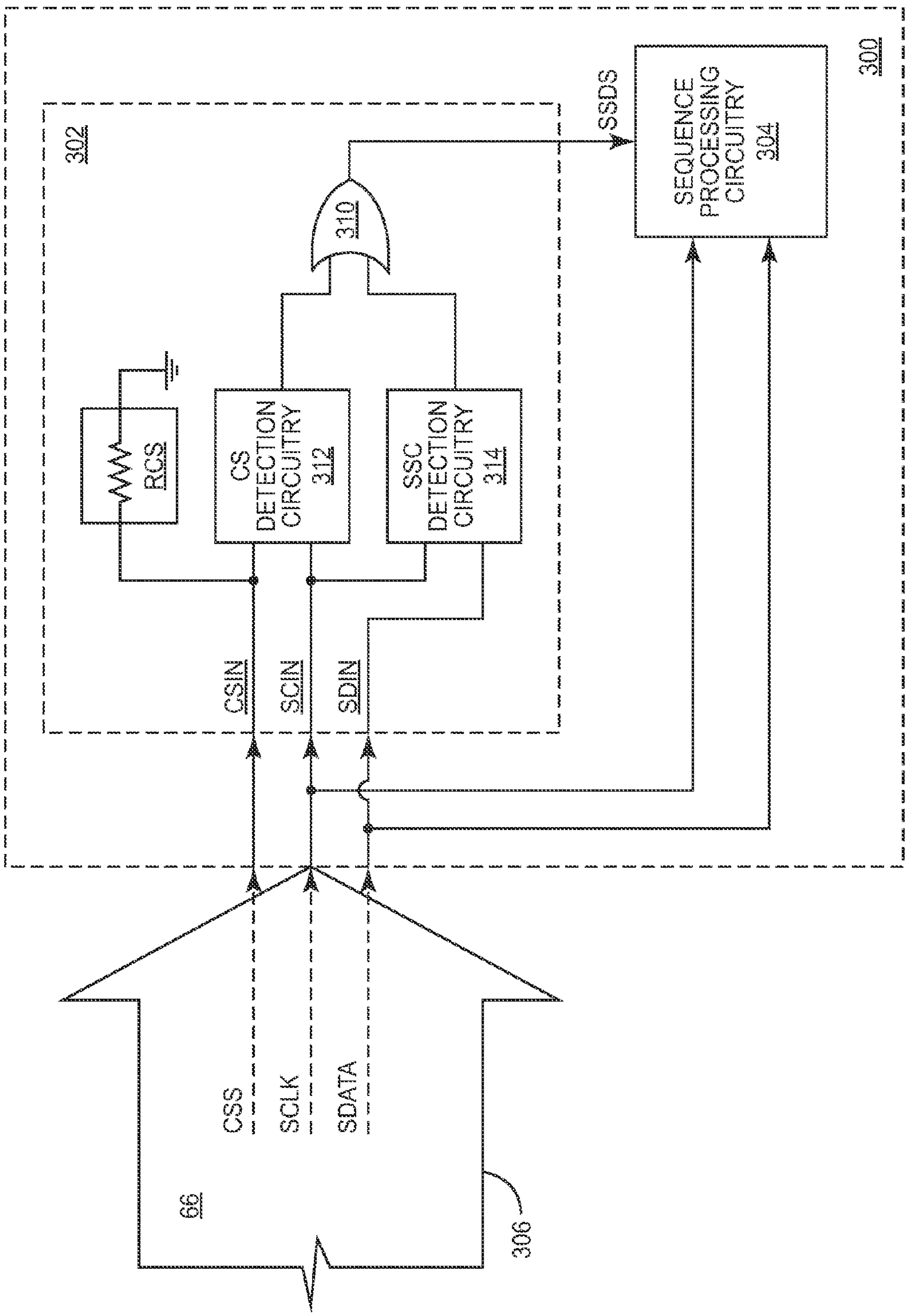

FIG. 49 shows details of SOS detection circuitry illustrated in FIG. 47 according to one embodiment of the SOS detection circuitry.

FIGS. 50A, 50B, 50C, and 50D are graphs illustrating the chip select signal, the SOS detection signal, the serial clock signal, and the serial data signal, respectively, of the first AC23SCI illustrated in FIG. 49 according to one embodiment of the first AC23SCI.

FIGS. 51A, 51B, 51C, and 51D are graphs illustrating the chip select signal, the SOS detection signal, the serial clock signal, and the serial data signal, respectively, of the first AC23SCI illustrated in FIG. 49 according to an alternate embodiment of the first AC23SCI.

FIGS. 52A, 52B, 52C, and 52D are graphs illustrating the chip select signal, the SOS detection signal, the serial clock signal, and the serial data signal, respectively, of the first AC23SCI illustrated in FIG. 49 according to an additional embodiment of the first AC23SCI.

Figure 53:
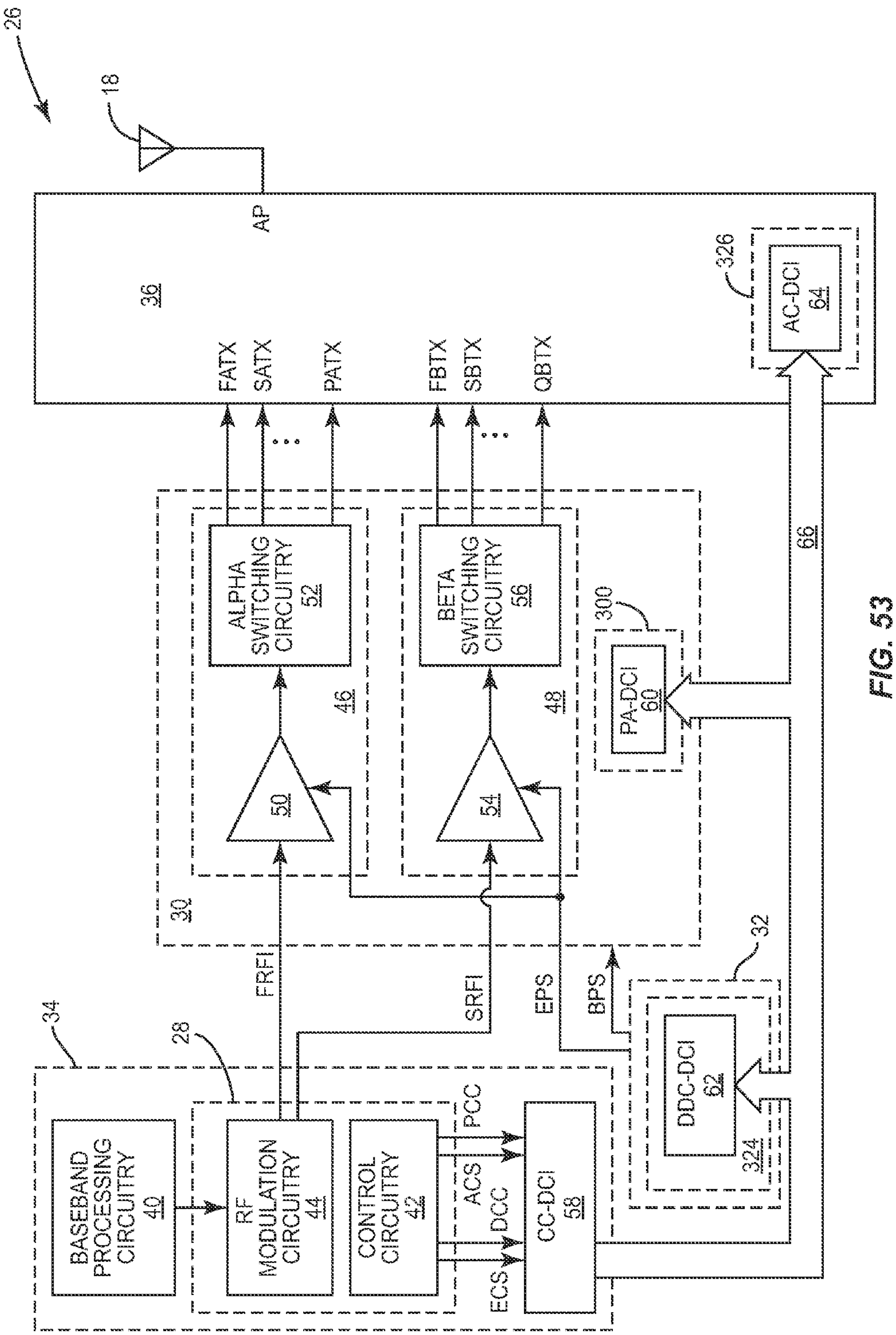

FIG. 53 shows the RF communications system according to one embodiment of the RF communications system.

Figure 6:
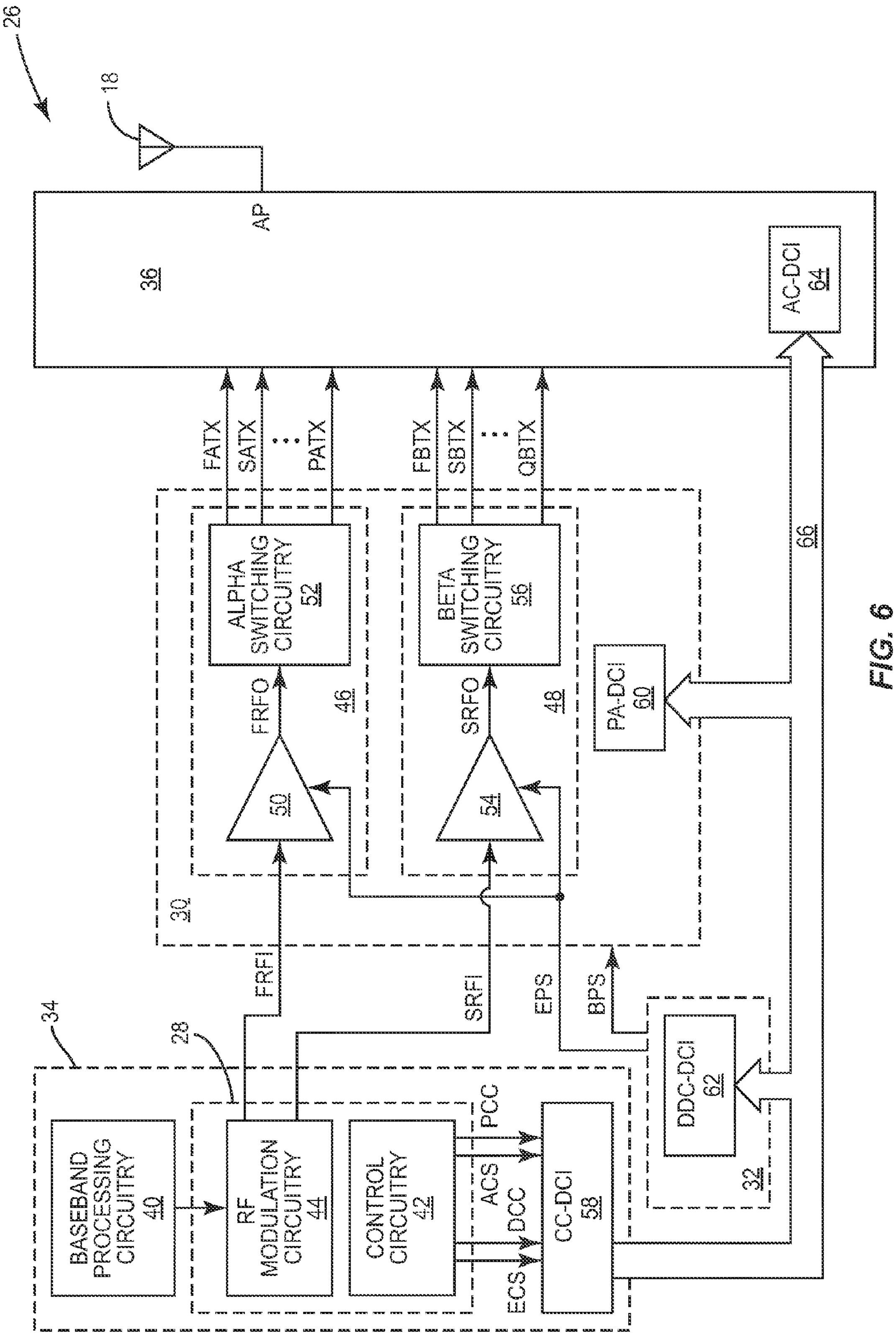
FIG. 6 shows the RF communications system according to a further embodiment of the RF communications system.
Figure 54:
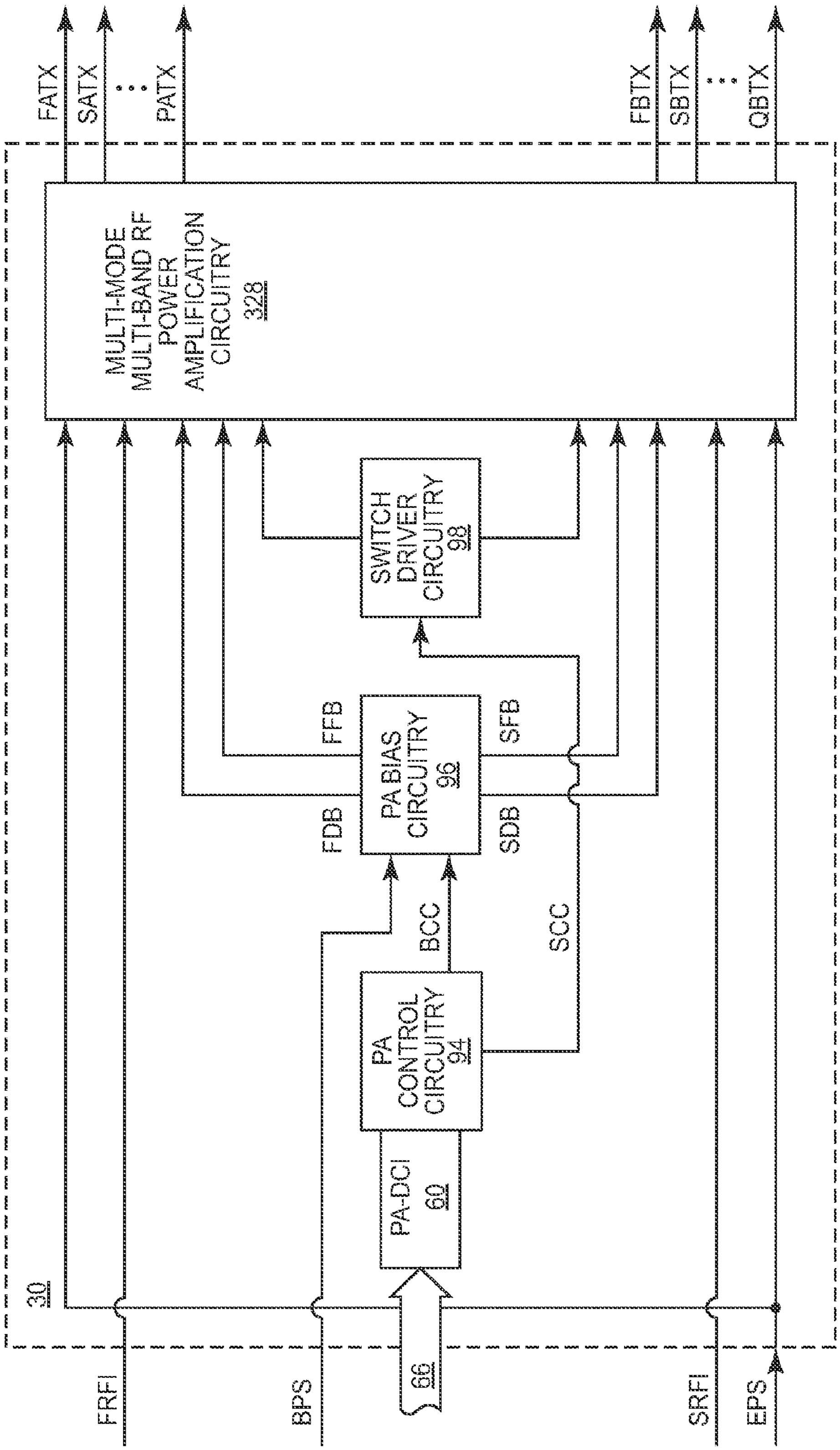

FIG. 54 shows details of the RF PA circuitry illustrated in FIG. 6 according to an additional embodiment of the RF PA circuitry.

Figure 55:
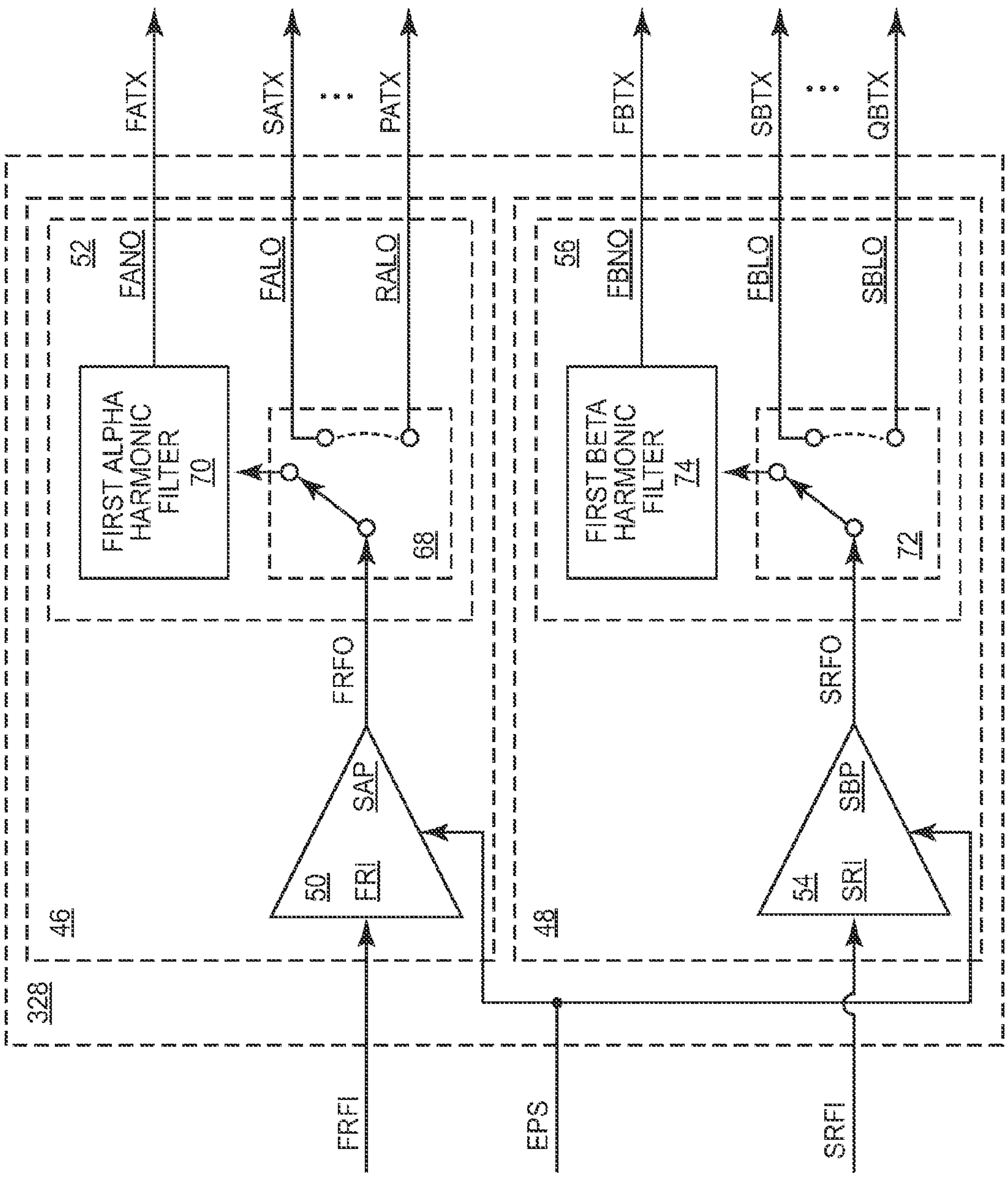

FIG. 55 shows details of multi-mode multi-band RF power amplification circuitry illustrated in FIG. 54 according to one embodiment of the multi-mode multi-band RF power amplification circuitry.

Figure 56A:
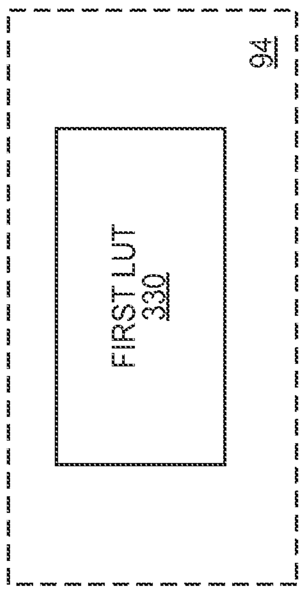
Figure 56B:
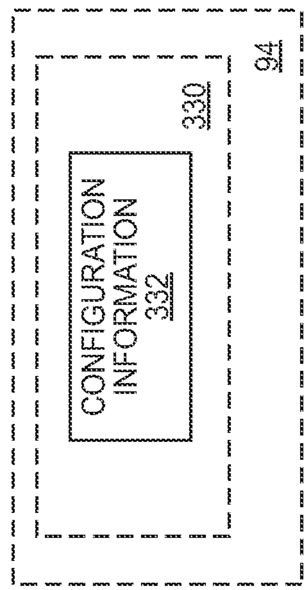

FIGS. 56A and 56B show details of the PA control circuitry illustrated in FIG. 55 according to one embodiment of the PA control circuitry.

Figure 57:
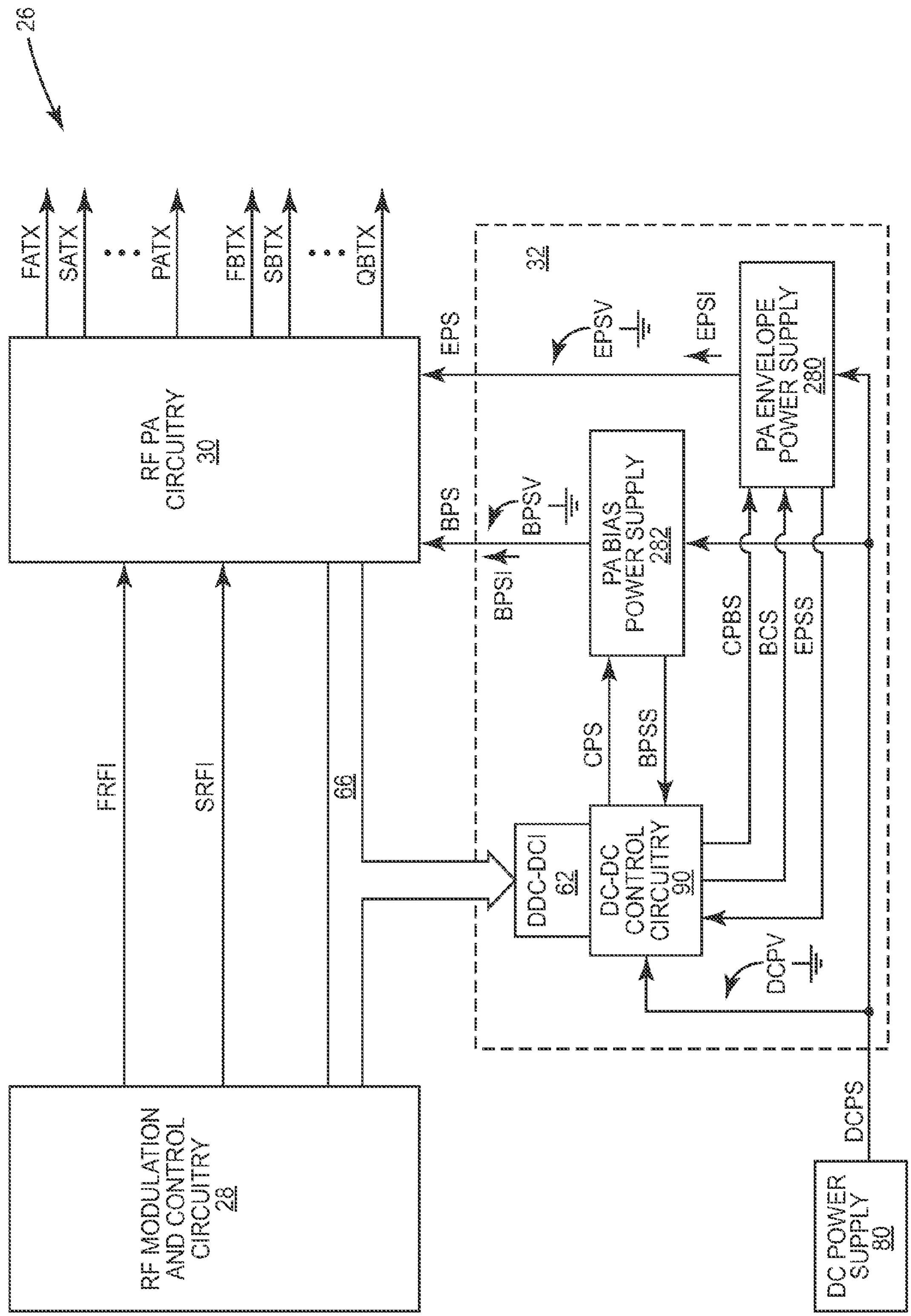

FIG. 57 shows the RF communications system according to one embodiment of the RF communications system.

Figure 58A:
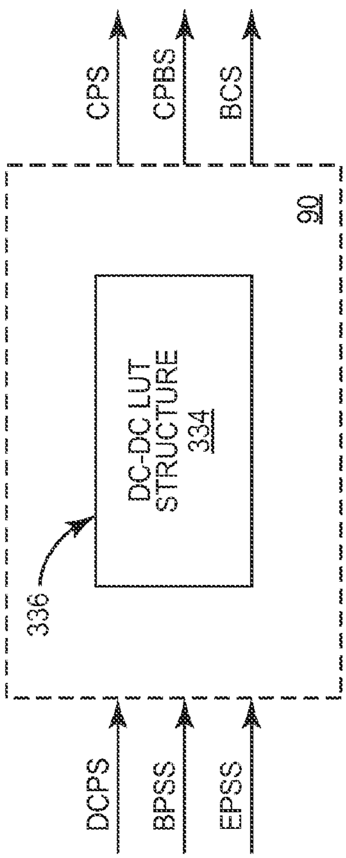
Figure 58B:
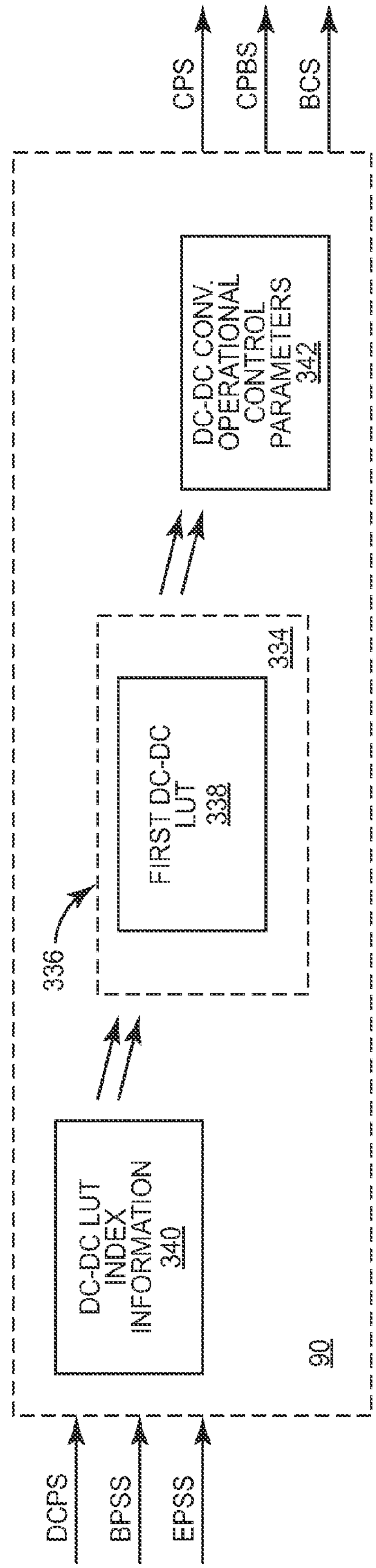

FIGS. 58A and 58B show details of DC-DC control circuitry illustrated in FIG. 57 according to one embodiment of the DC-DC control circuitry.

Figure 59:
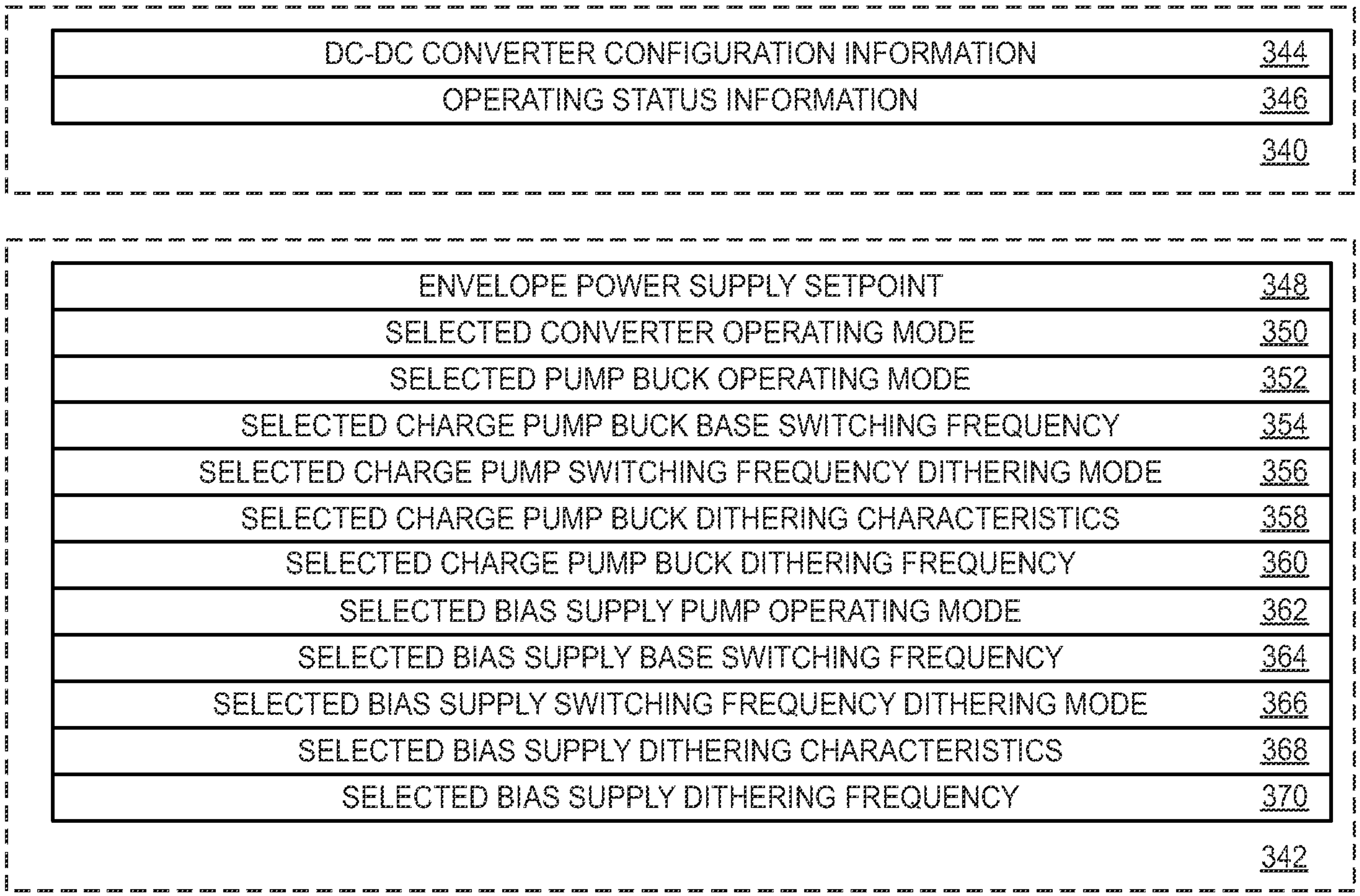

FIG. 59 shows details of DC-DC LUT index information and DC-DC converter operational control parameters illustrated in FIG. 58B according to one embodiment of the DC-DC LUT index information and the DC-DC converter operational control parameters.

Figure 60:
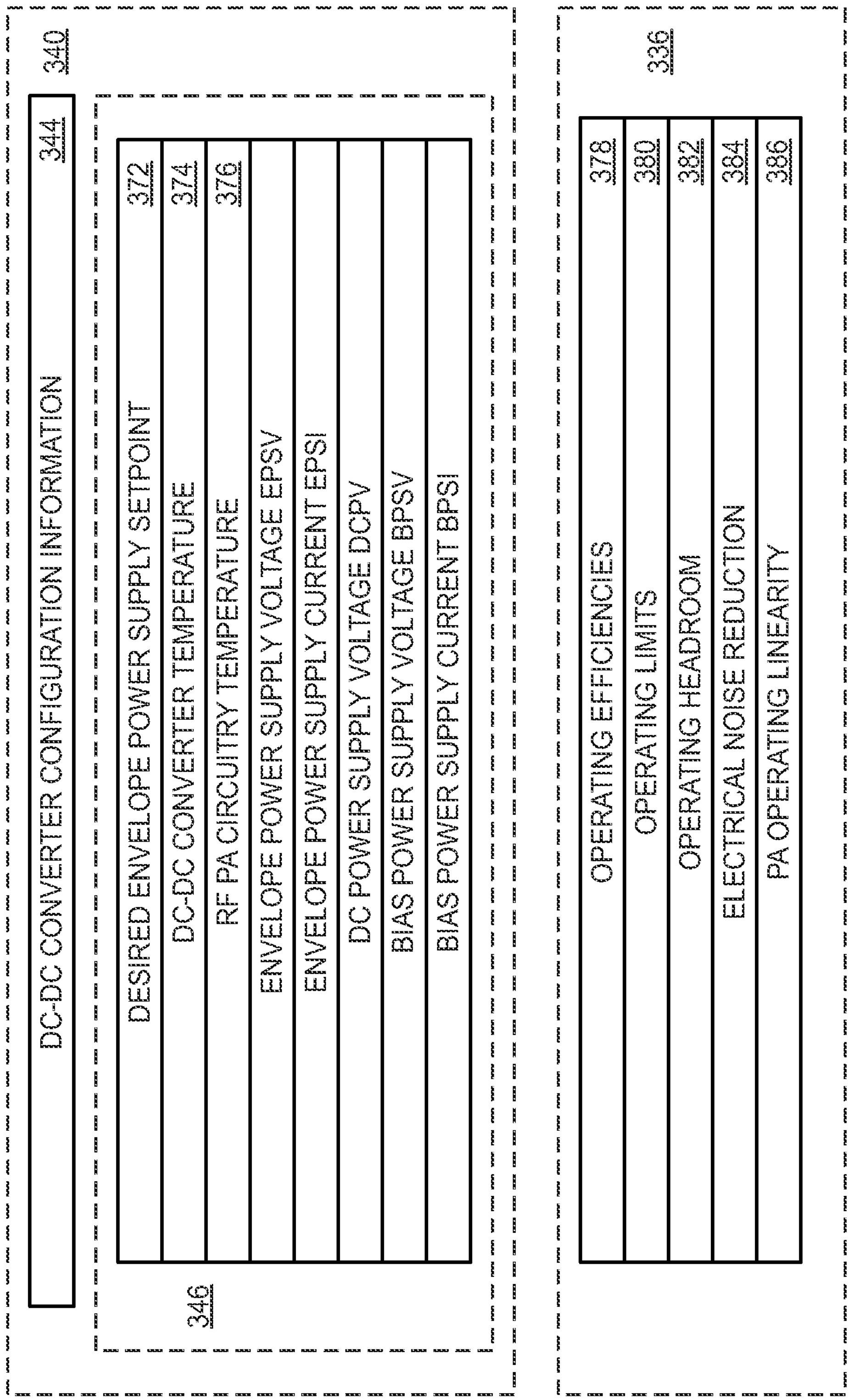

FIG. 60 shows details of the DC-DC LUT index information illustrated in FIG. 59 and details of DC-DC converter operating criteria illustrated in FIG. 58A according to one embodiment of the DC-DC LUT index information and the DC-DC converter operating criteria.

Figure 61:
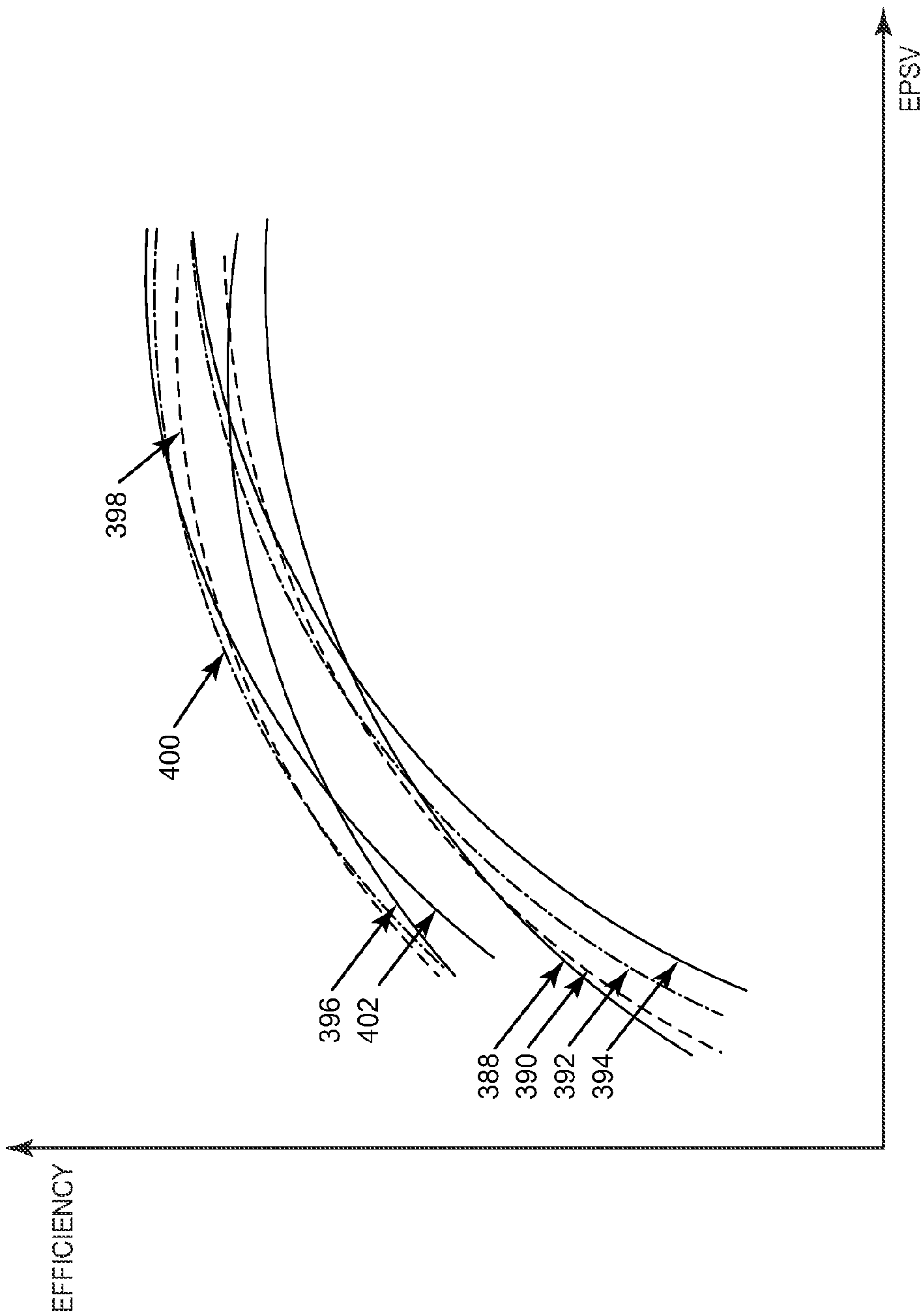

FIG. 61 is a graph showing eight efficiency curves of the PA envelope power supply illustrated in FIG. 57 according to one embodiment of the PA envelope power supply.

Figure 62:
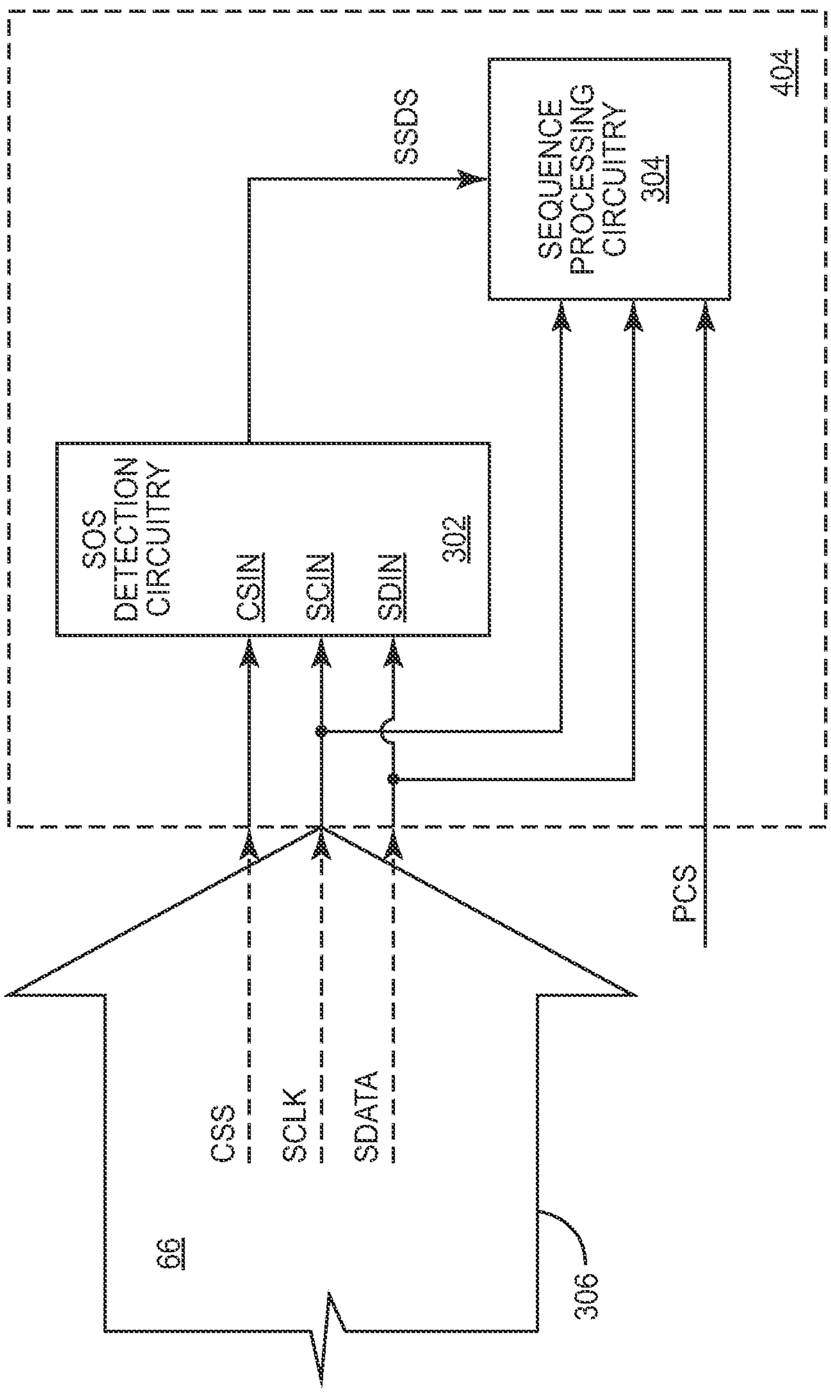

FIG. 62 shows a first configurable 2-wire/3-wire serial communications interface (C23SCI) according to one embodiment of the first C23SCI.

Figure 63:
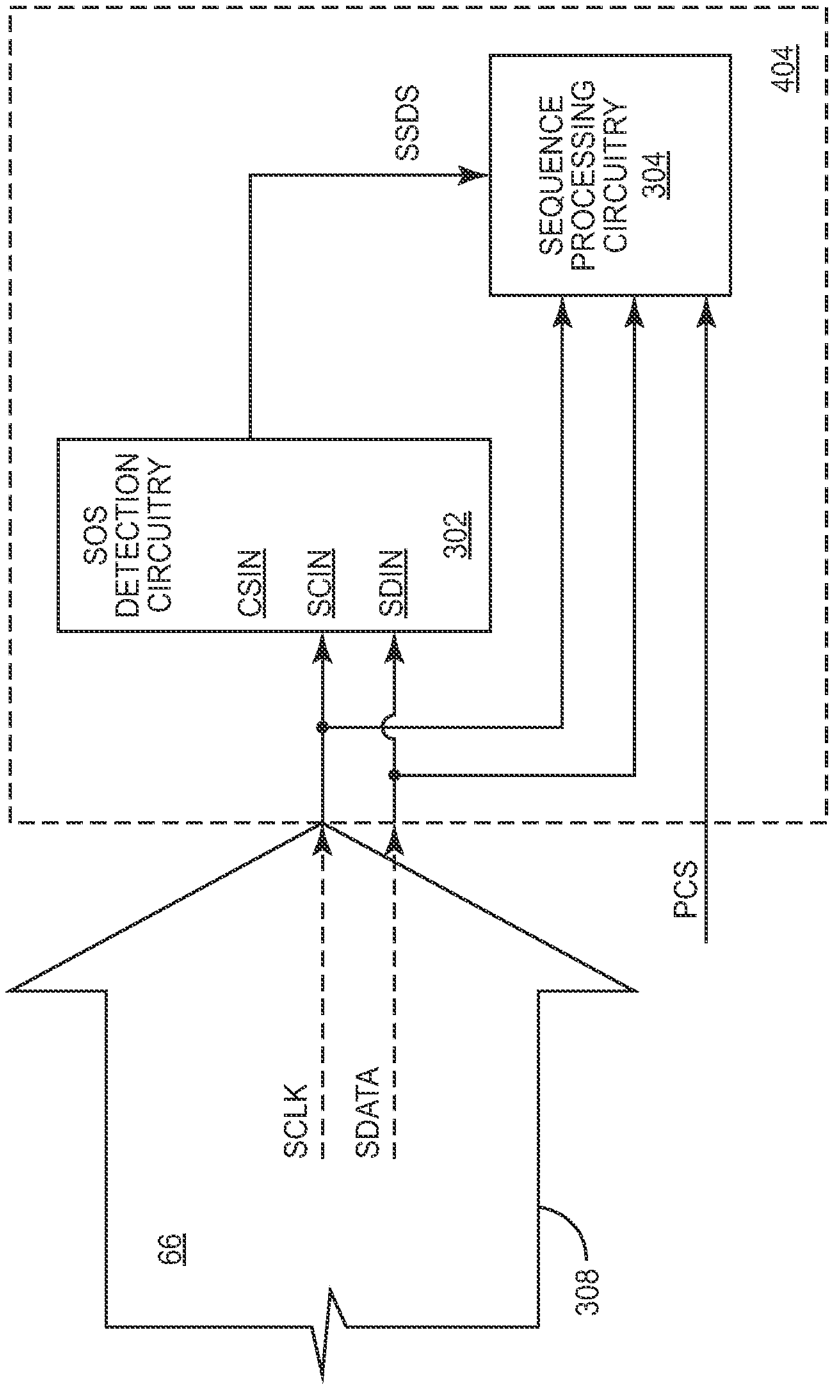

FIG. 63 shows the first C23SCI according an alternate embodiment of the first C23SCI.

Figure 64:
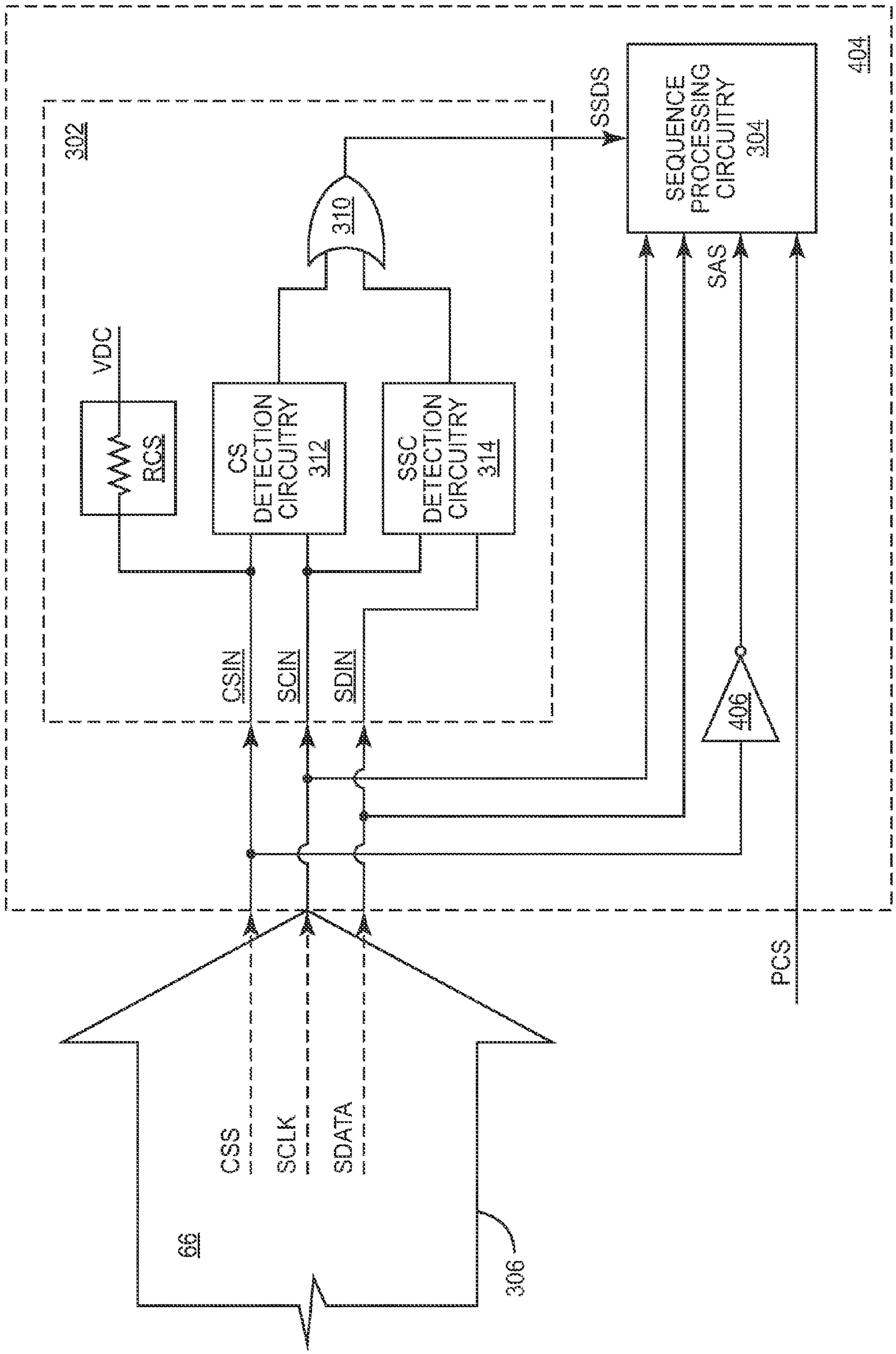

FIG. 64 shows the first C23SCI according an additional embodiment of the first C23SCI.

Figure 65:
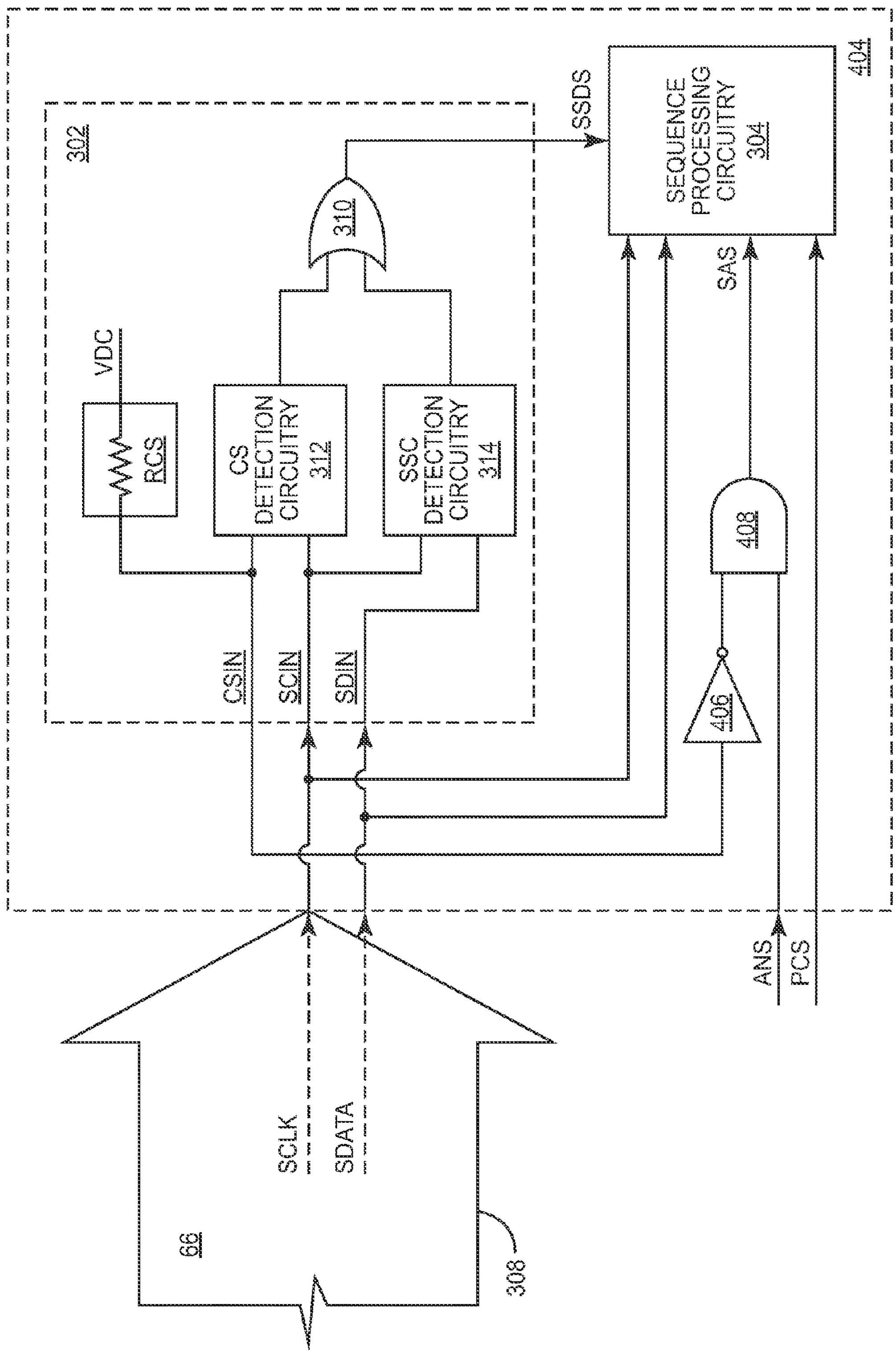

FIG. 65 shows the first C23SCI according another embodiment of the first C23SCI.

Figure 66:
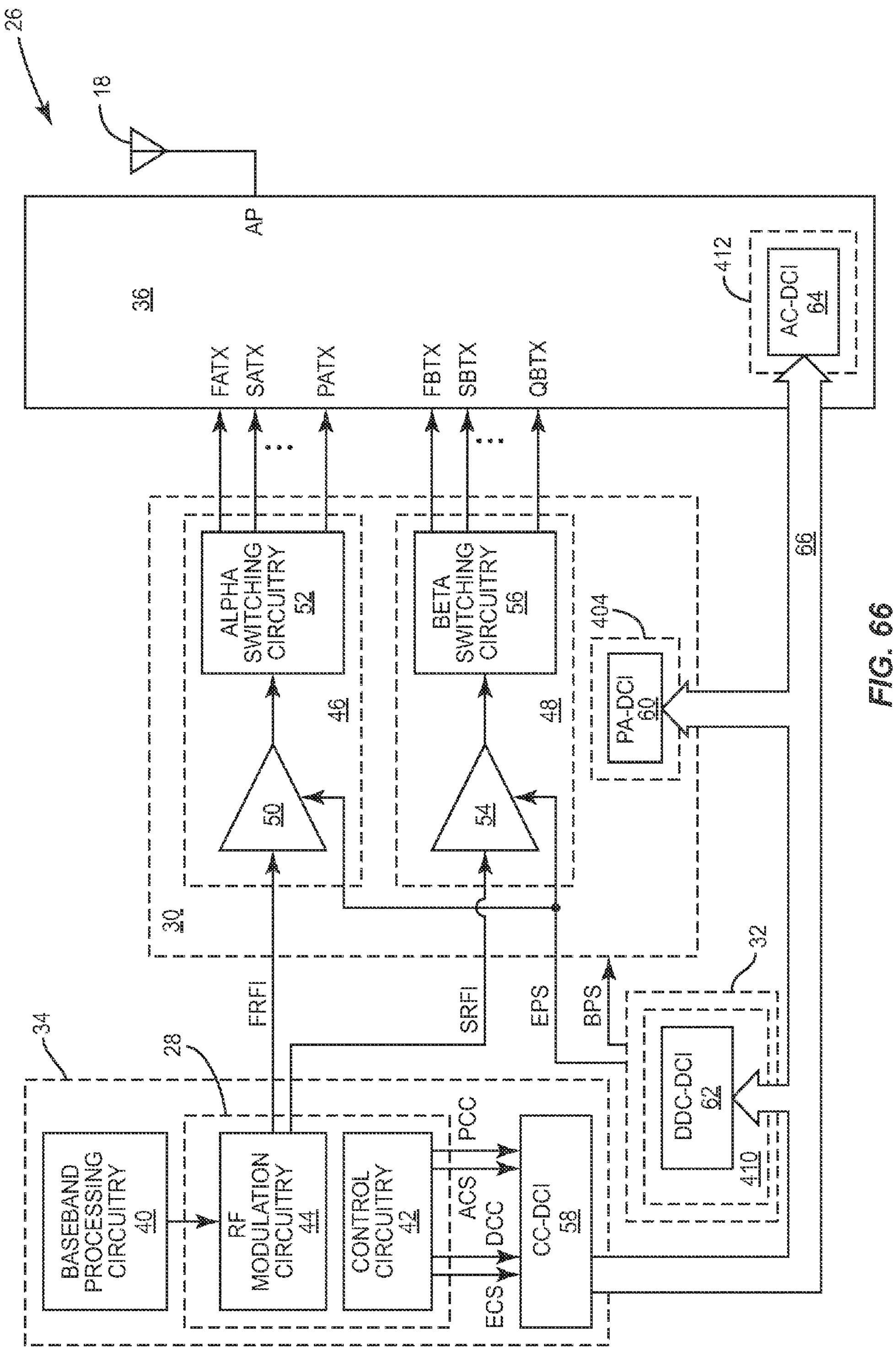

FIG. 66 shows the RF communications system according to one embodiment of the RF communications system.

Figure 67:
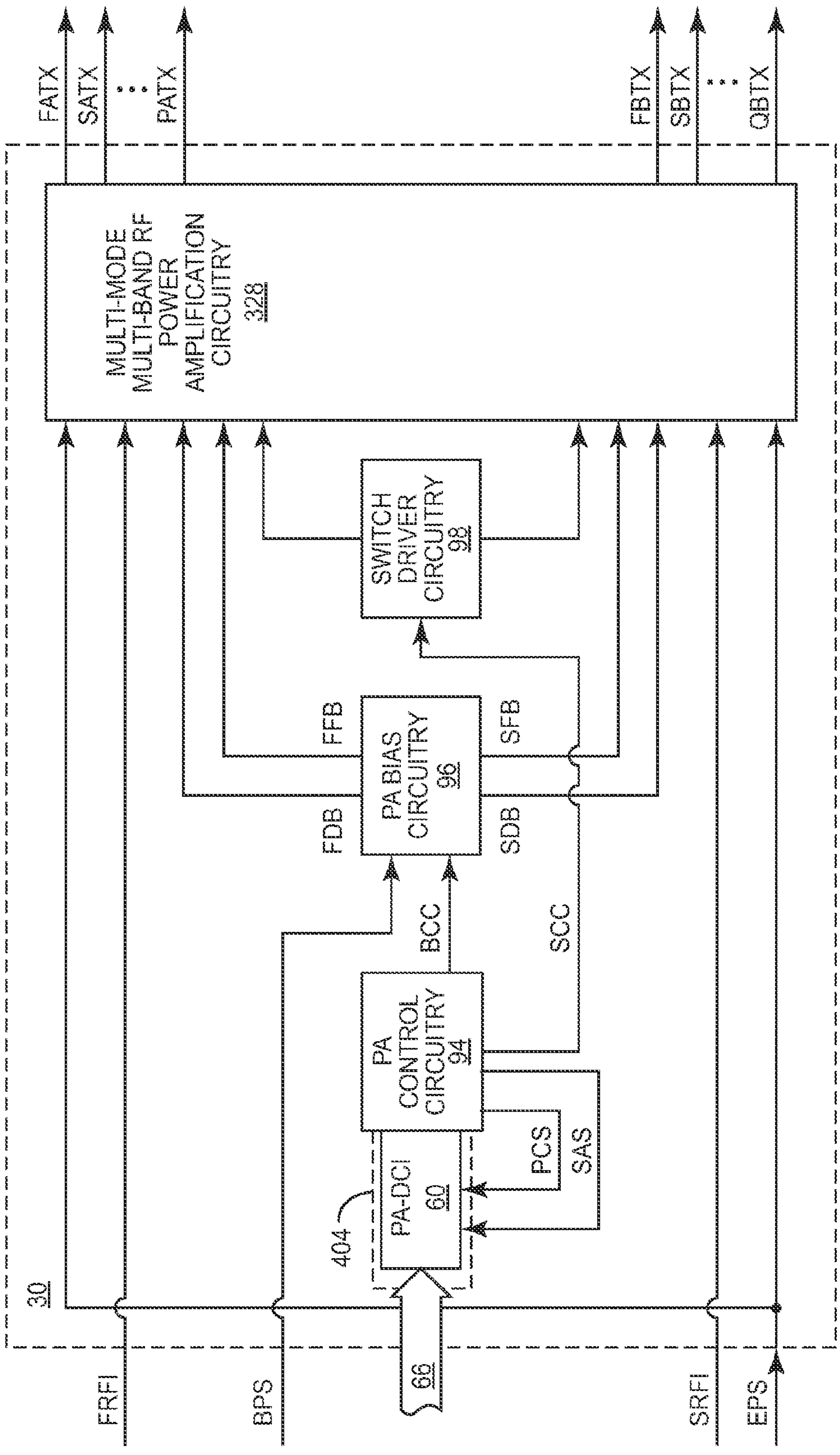

FIG. 67 shows details of the RF PA circuitry illustrated in FIG. 6 according to one embodiment of the RF PA circuitry.

Figure 68:
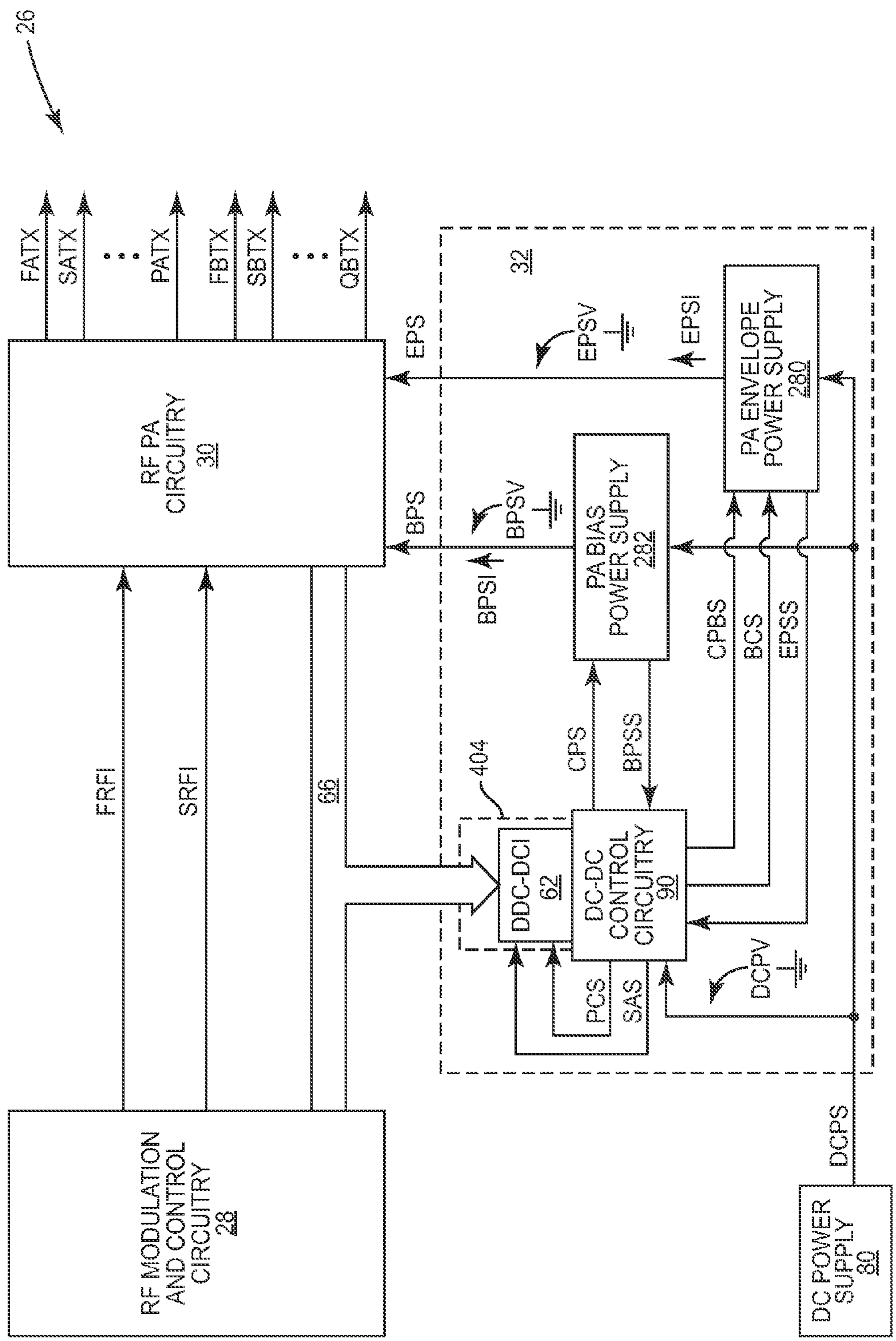

FIG. 68 shows the RF communications system according to an alternate embodiment of the RF communications system.

Figure 69:
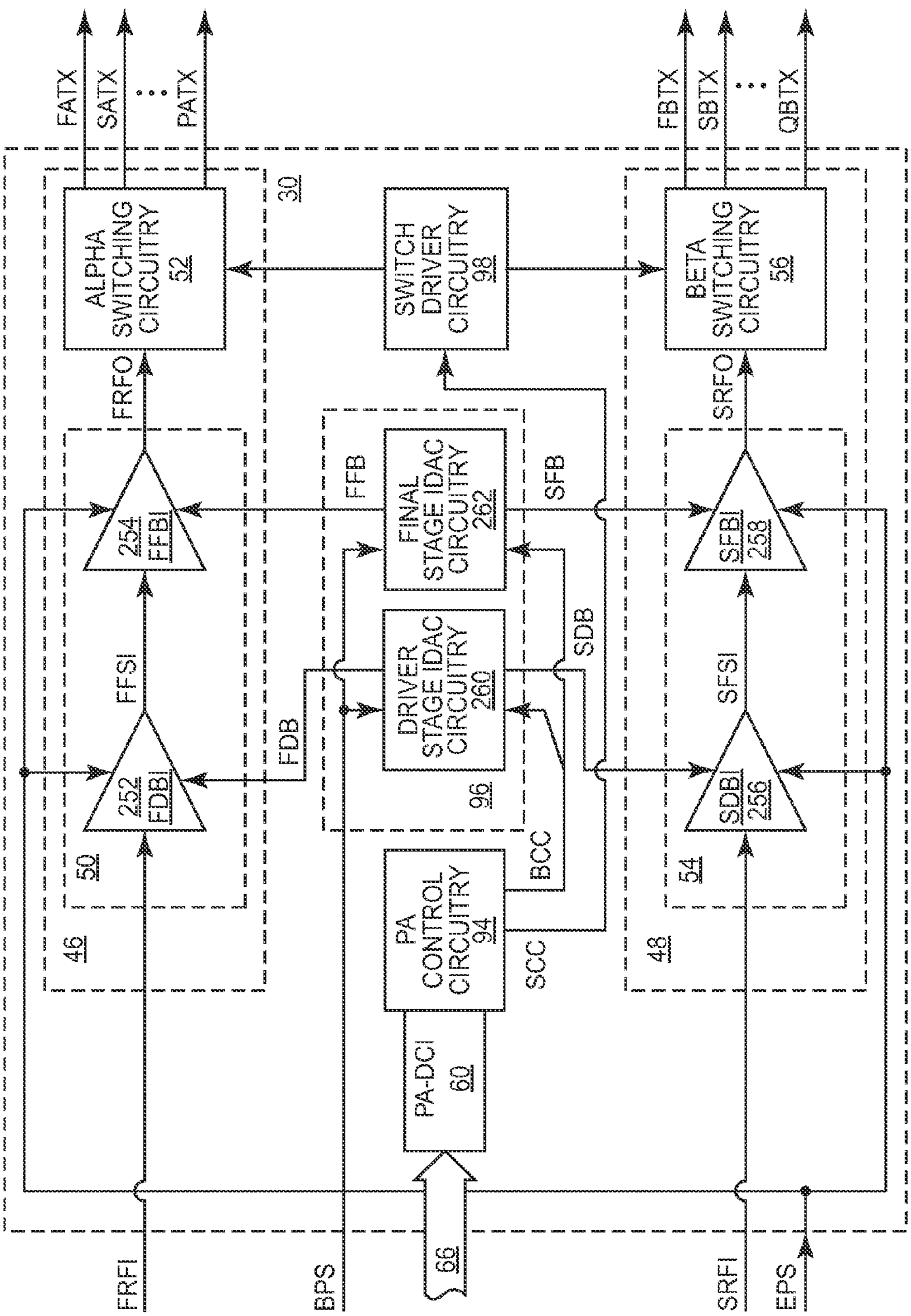

FIG. 69 shows details of the RF PA circuitry illustrated in FIG. 6 according to another embodiment of the RF PA circuitry.

Figure 70:
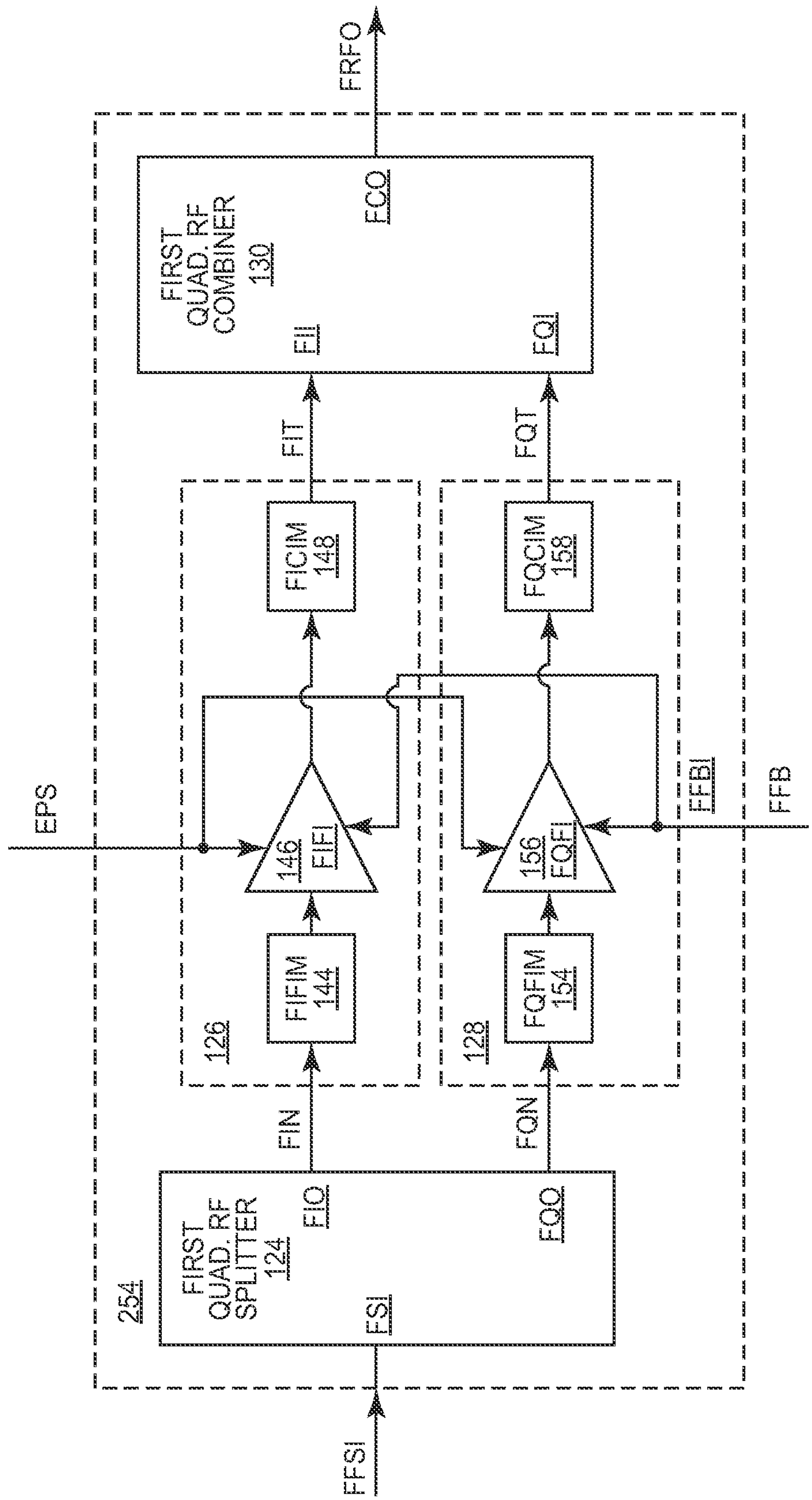

FIG. 70 shows details of a first final stage illustrated in FIG. 69 according to one embodiment of the first final stage.

Figure 71:
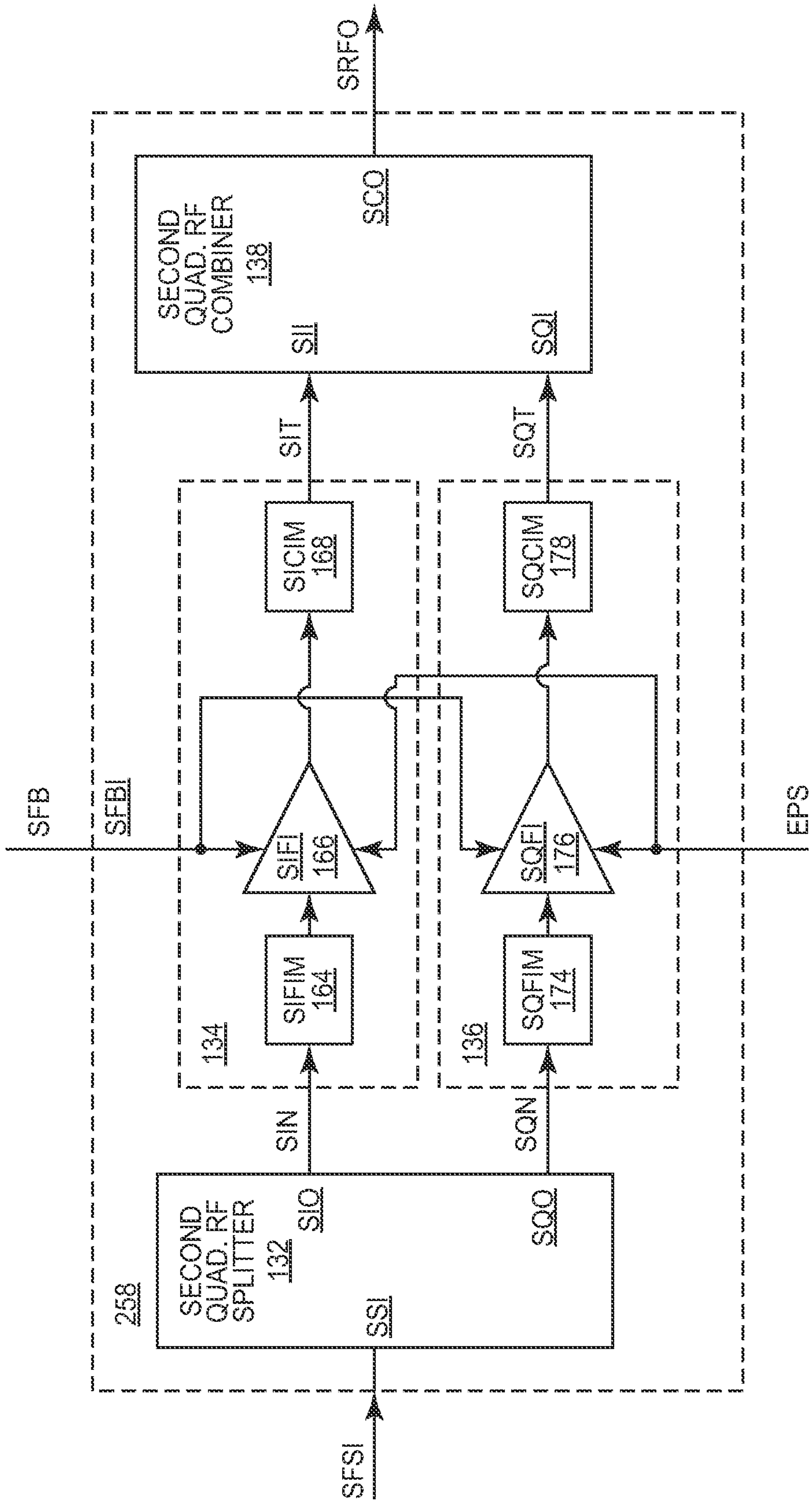

FIG. 71 shows details of a second final stage illustrated in FIG. 69 according to one embodiment of the second final stage.

Figure 72:
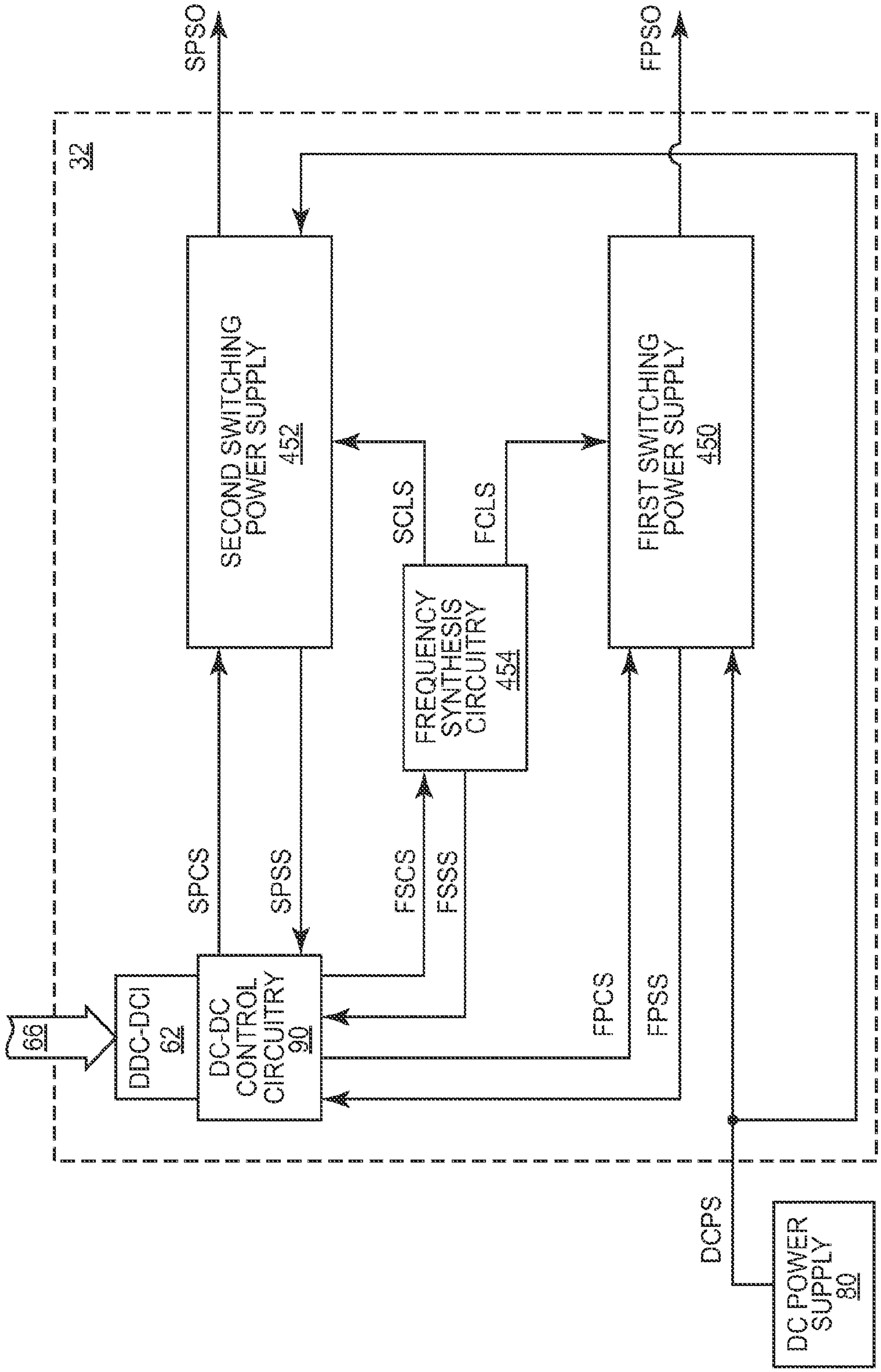

FIG. 72 shows the DC-DC converter according to one embodiment of the DC-DC converter.

Figure 73:
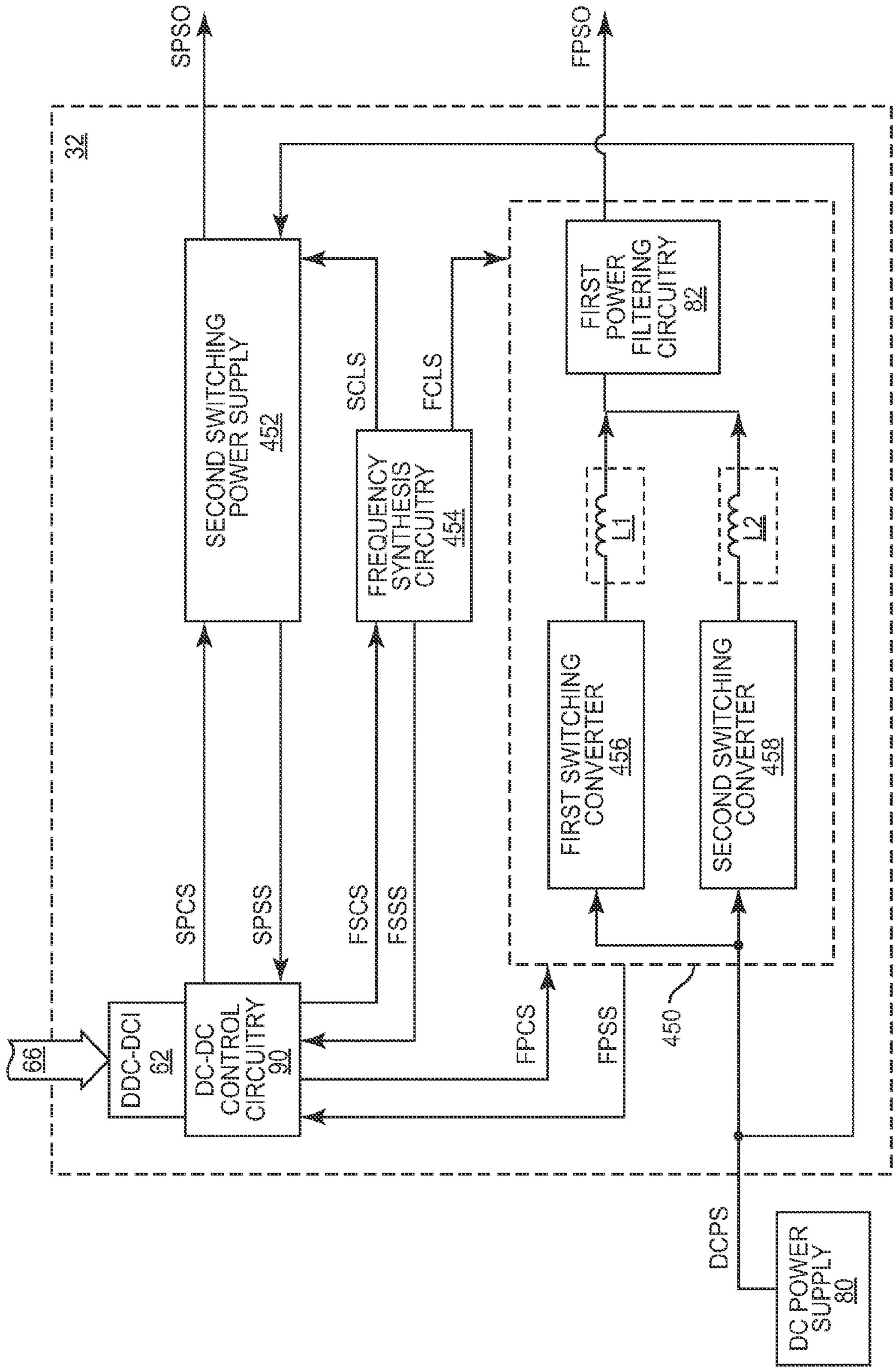

FIG. 73 shows details of a first switching power supply illustrated in FIG. 72 according to one embodiment of the first switching power supply.

Figure 74:
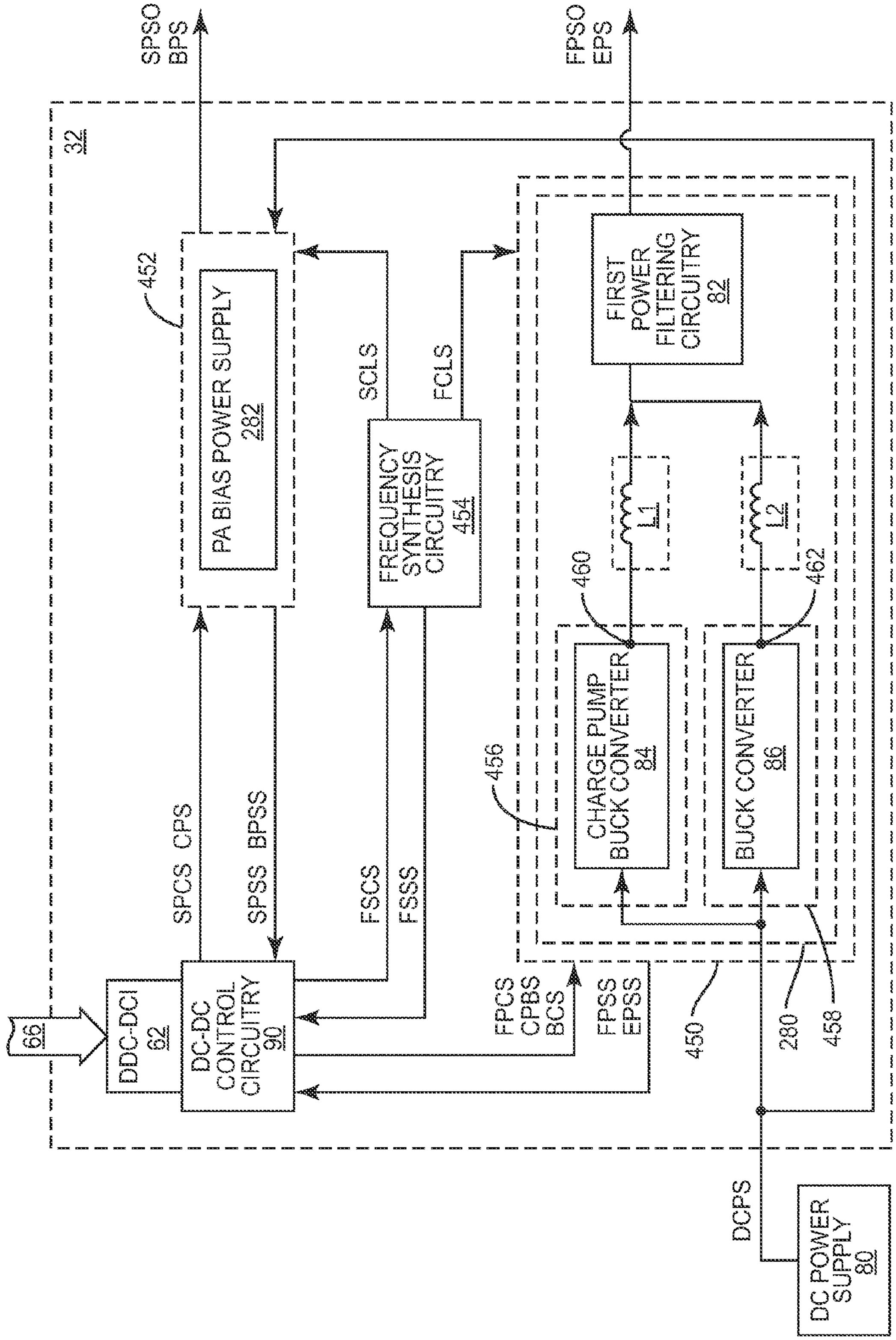

FIG. 74 shows details of the first switching power supply and a second switching power supply illustrated in FIG. 73 according to an alternate embodiment of the first switching power supply and one embodiment of the second switching power supply.

Figure 75:
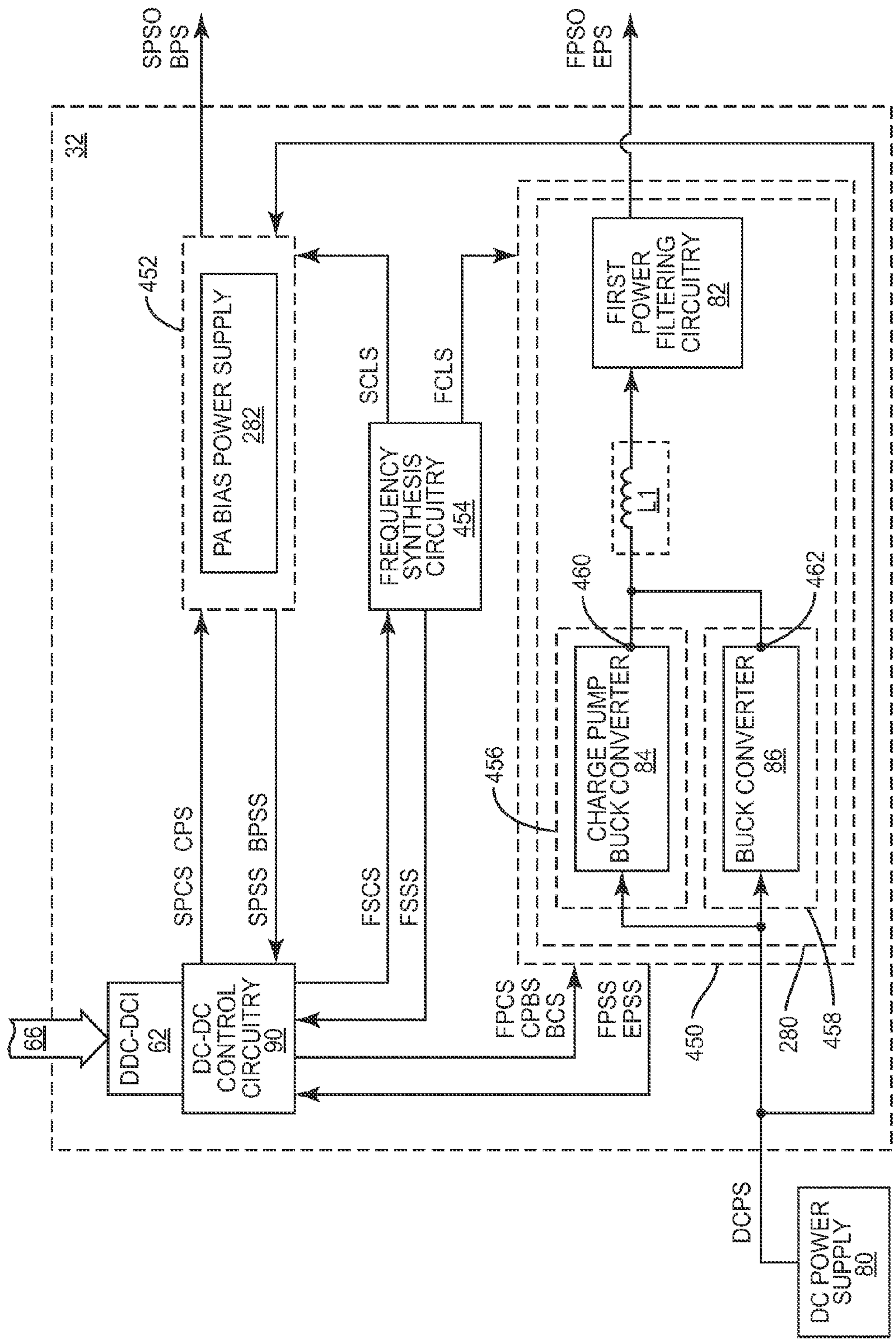

FIG. 75 shows details of the first switching power supply and the second switching power supply illustrated in FIG. 73 according to an additional embodiment of the first switching power supply and one embodiment of the second switching power supply.

Figure 76A:
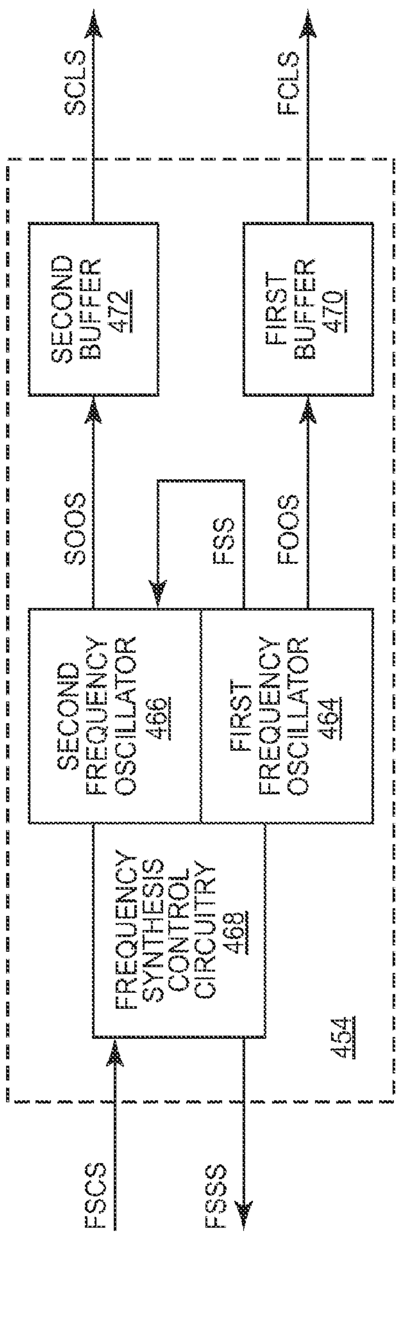

FIG. 76A shows details of frequency synthesis circuitry illustrated in FIG. 72 according to one embodiment of the frequency synthesis circuitry.

Figure 76B:
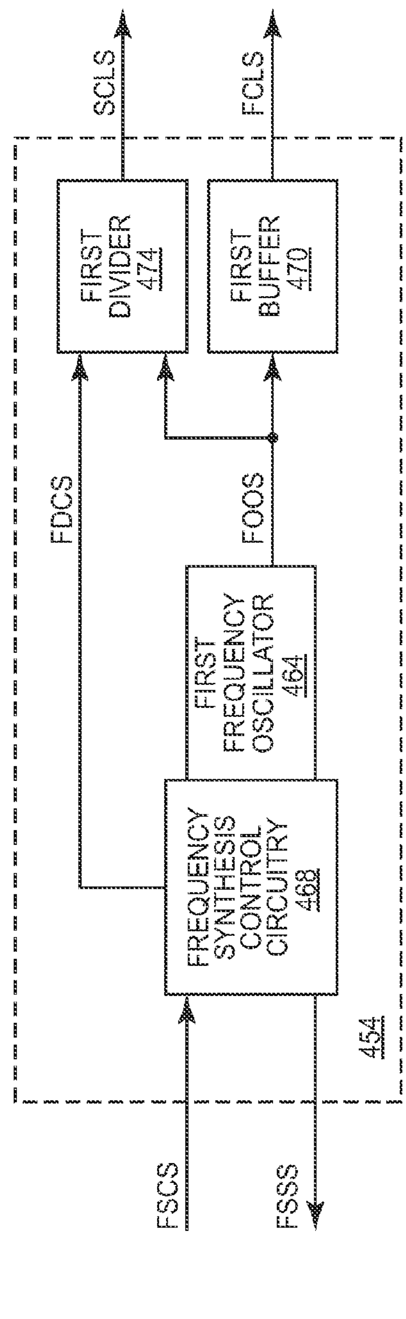

FIG. 76B shows details of the frequency synthesis circuitry illustrated in FIG. 72 according to an alternate embodiment of the frequency synthesis circuitry.

Figure 77A:
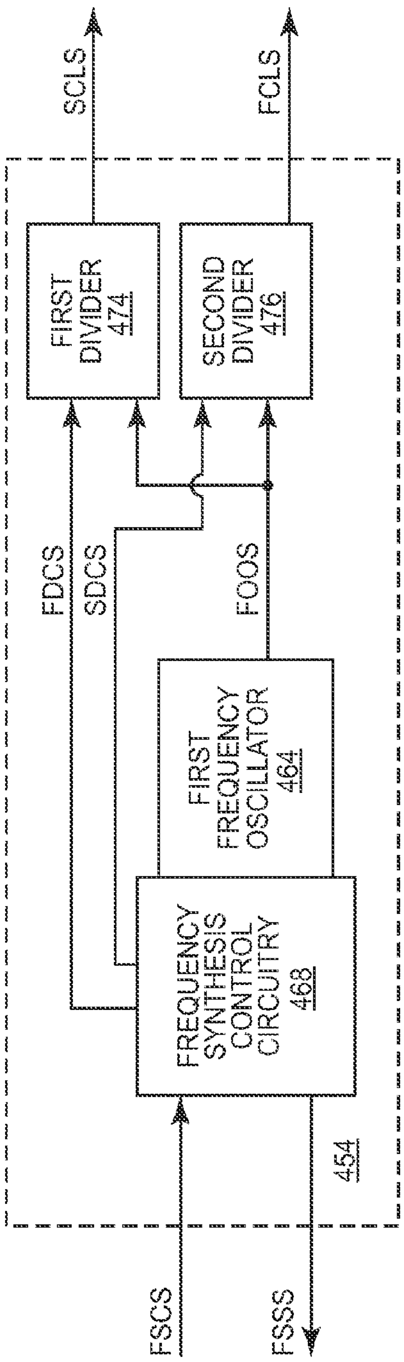

FIG. 77A shows details of the frequency synthesis circuitry illustrated in FIG. 72 according to an additional embodiment of the frequency synthesis circuitry.

Figure 77B:
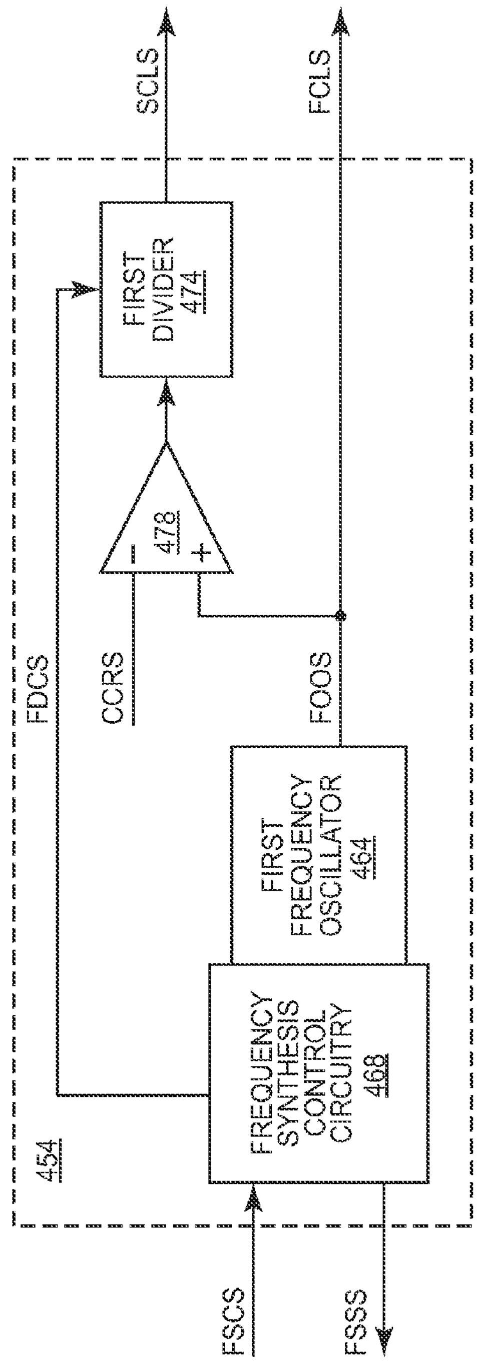

FIG. 77B shows details of the frequency synthesis circuitry illustrated in FIG. 72 according to another embodiment of the frequency synthesis circuitry.

Figure 78:
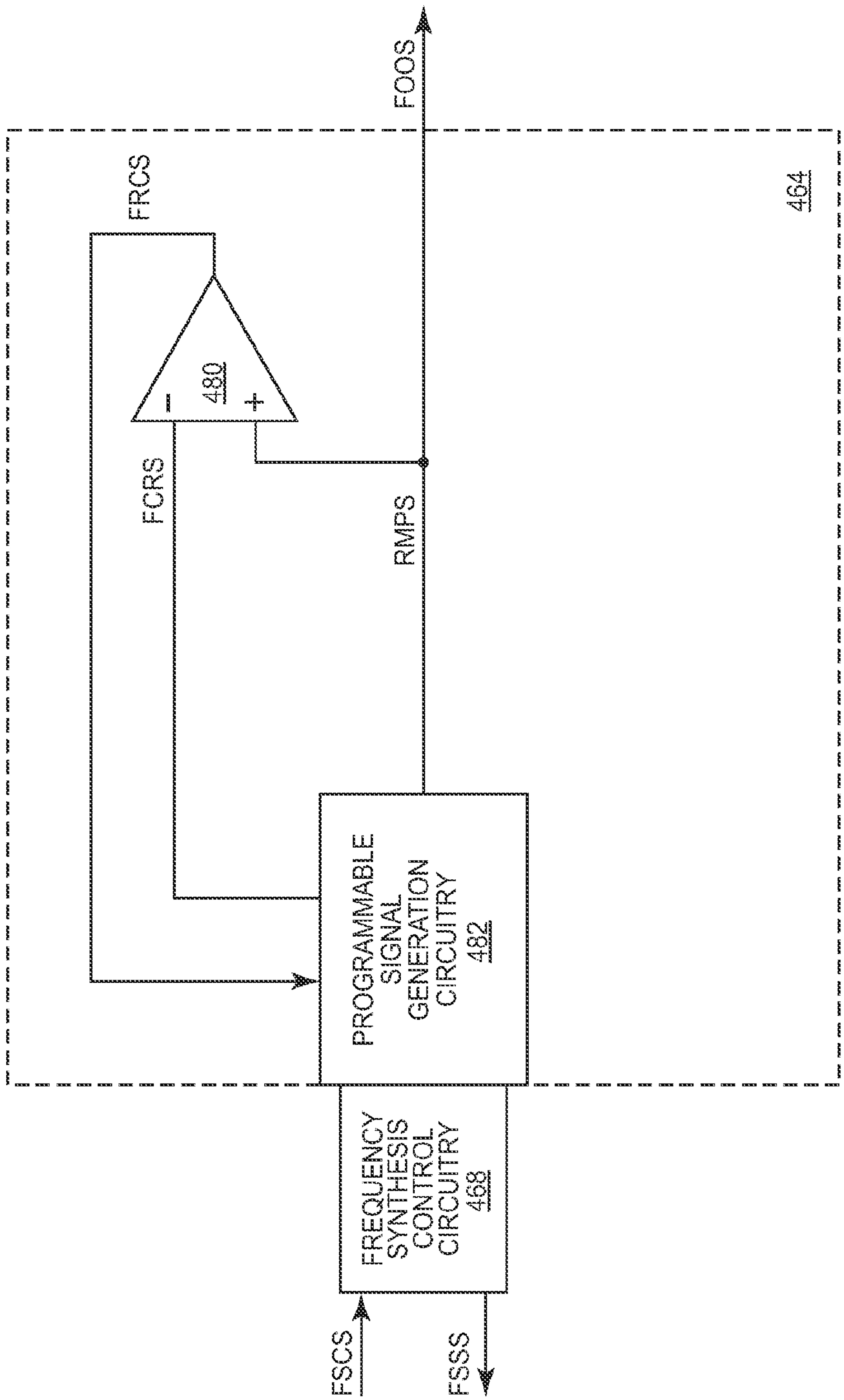

FIG. 78 shows frequency synthesis control circuitry and details of a first frequency oscillator illustrated in FIG. 77B according to one embodiment of the first frequency oscillator.

Figure 79:
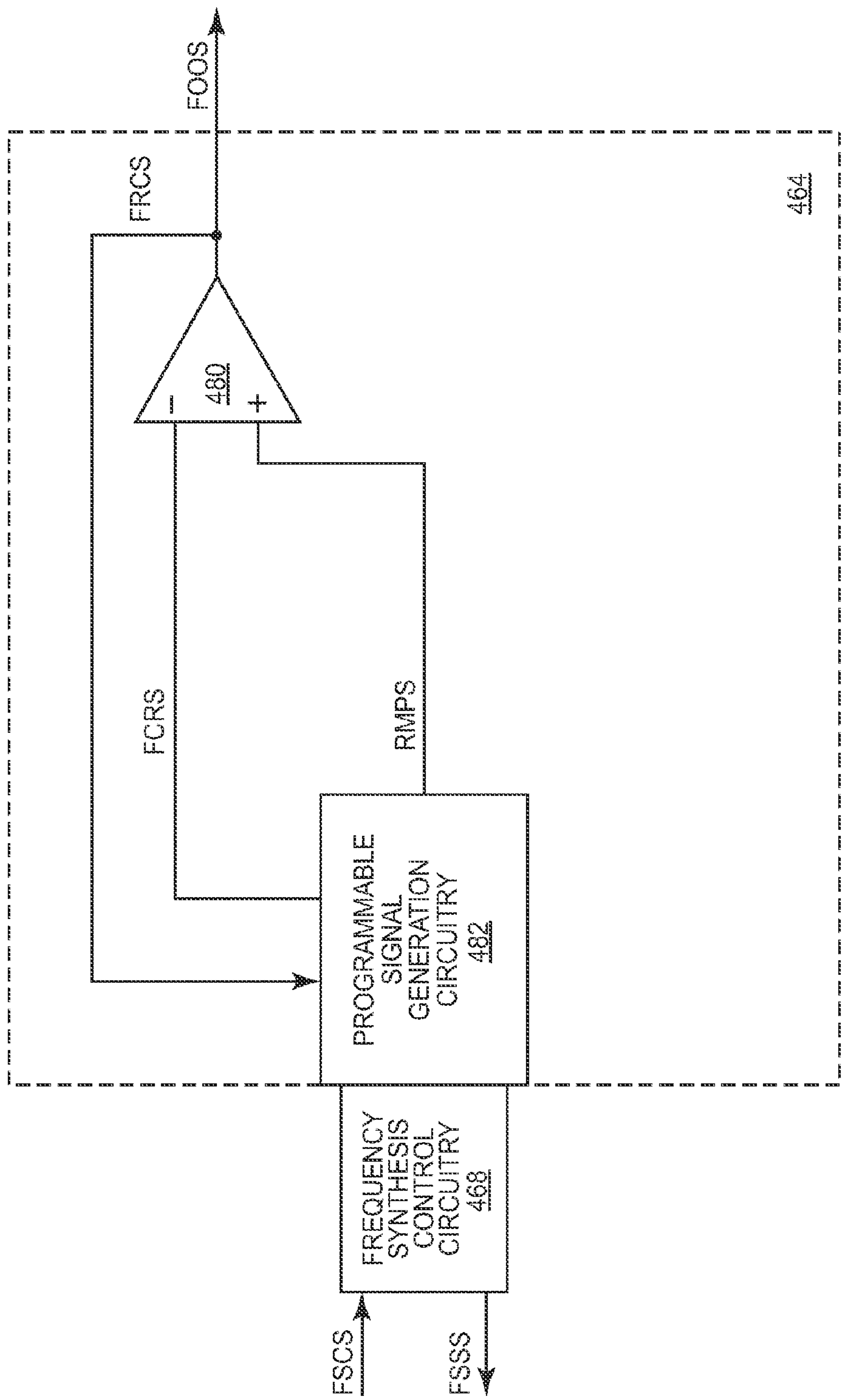

FIG. 79 shows the frequency synthesis control circuitry and details of the first frequency oscillator illustrated in FIG. 77B according to an alternate embodiment of the first frequency oscillator.

Figure 80:
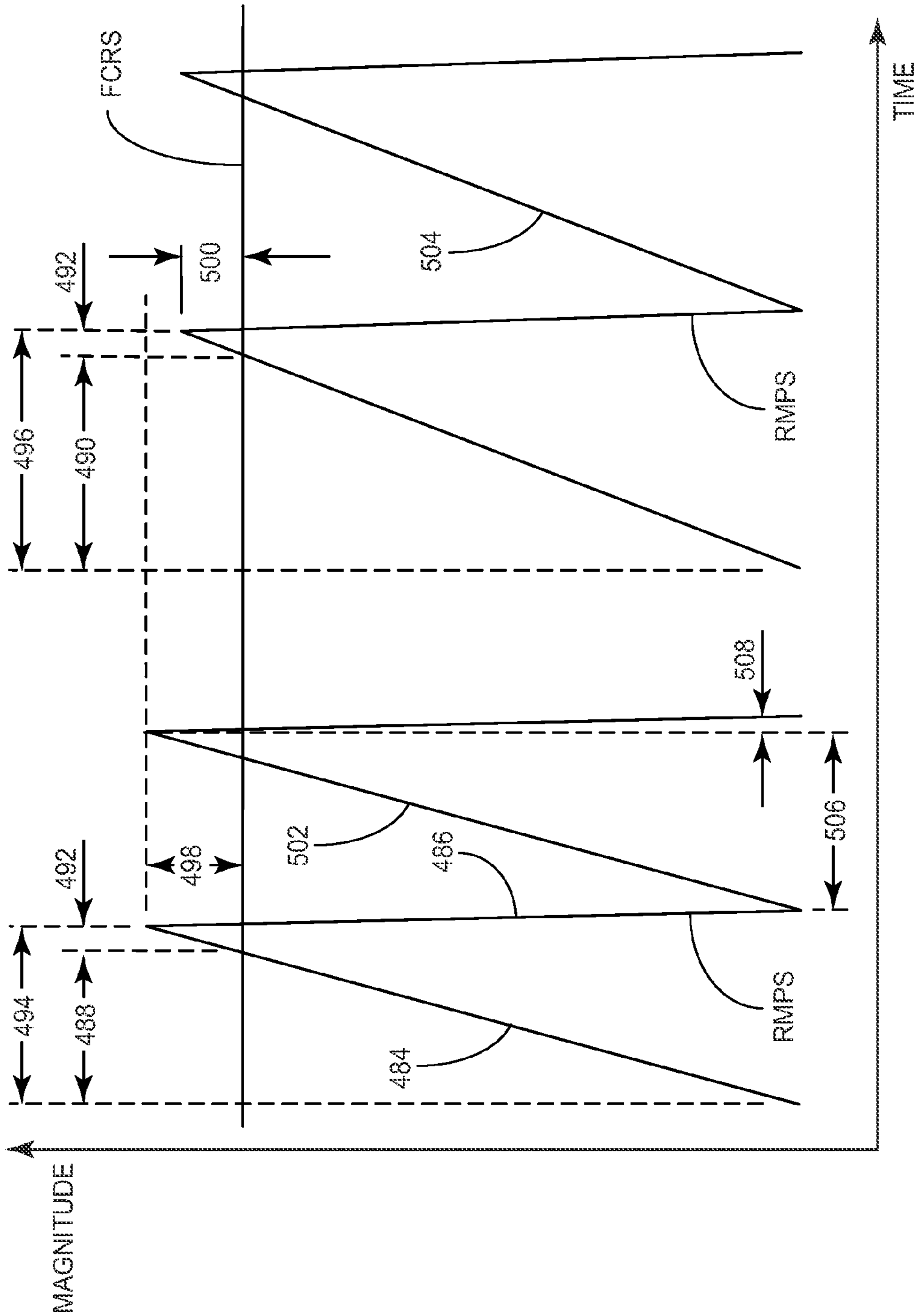

FIG. 80 is a graph showing a first comparator reference signal and a ramping signal illustrated in FIG. 78 according to one embodiment of the first comparator reference signal and the ramping signal.

Figure 81:
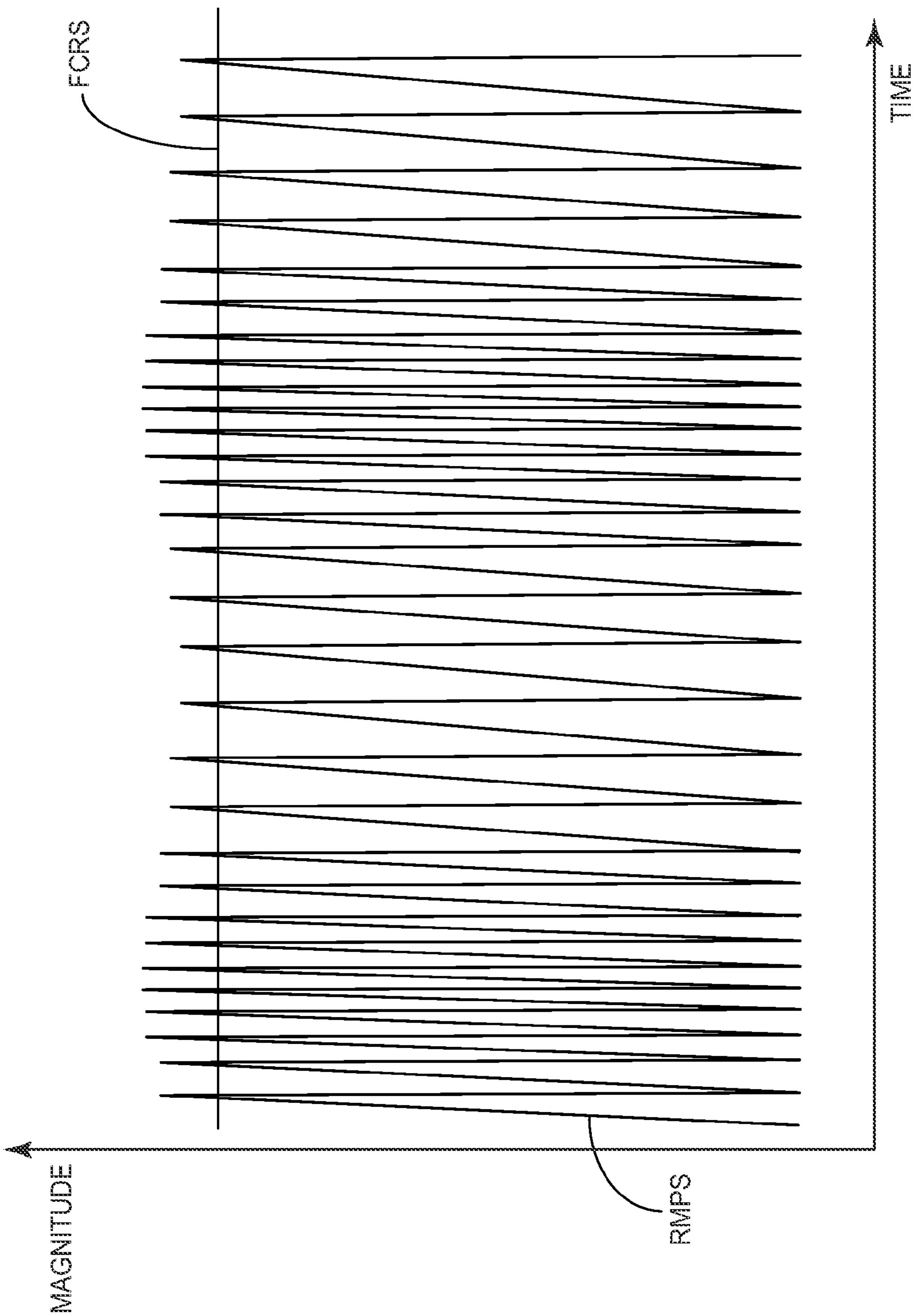

FIG. 81 is a graph showing the first comparator reference signal and the ramping signal illustrated in FIG. 78 according to an alternate embodiment of the first comparator reference signal and the ramping signal.

Figure 82:
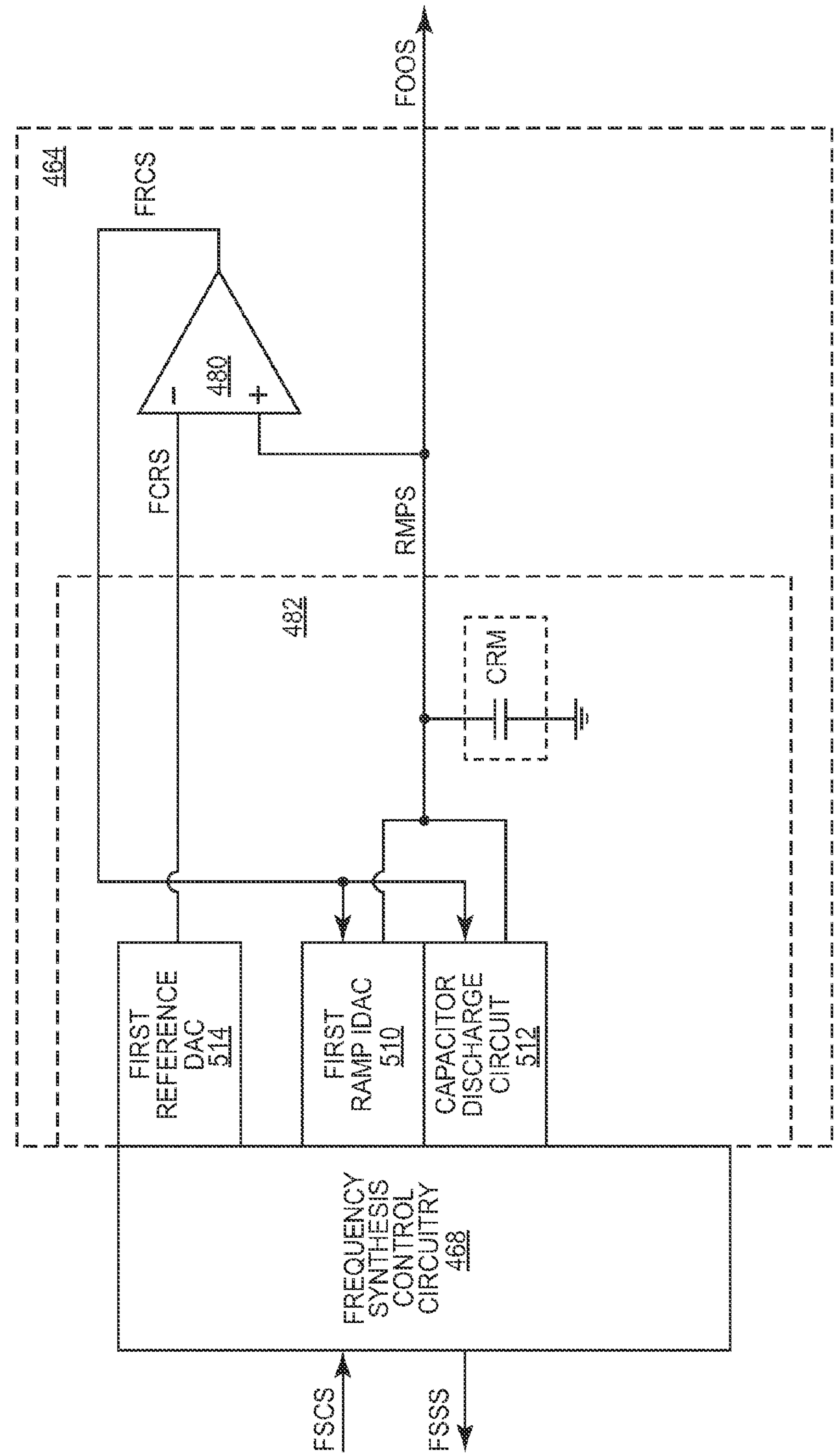

FIG. 82 shows details of programmable signal generation circuitry illustrated in FIG. 78 according to one embodiment of the programmable signal generation circuitry.

Figure 83:
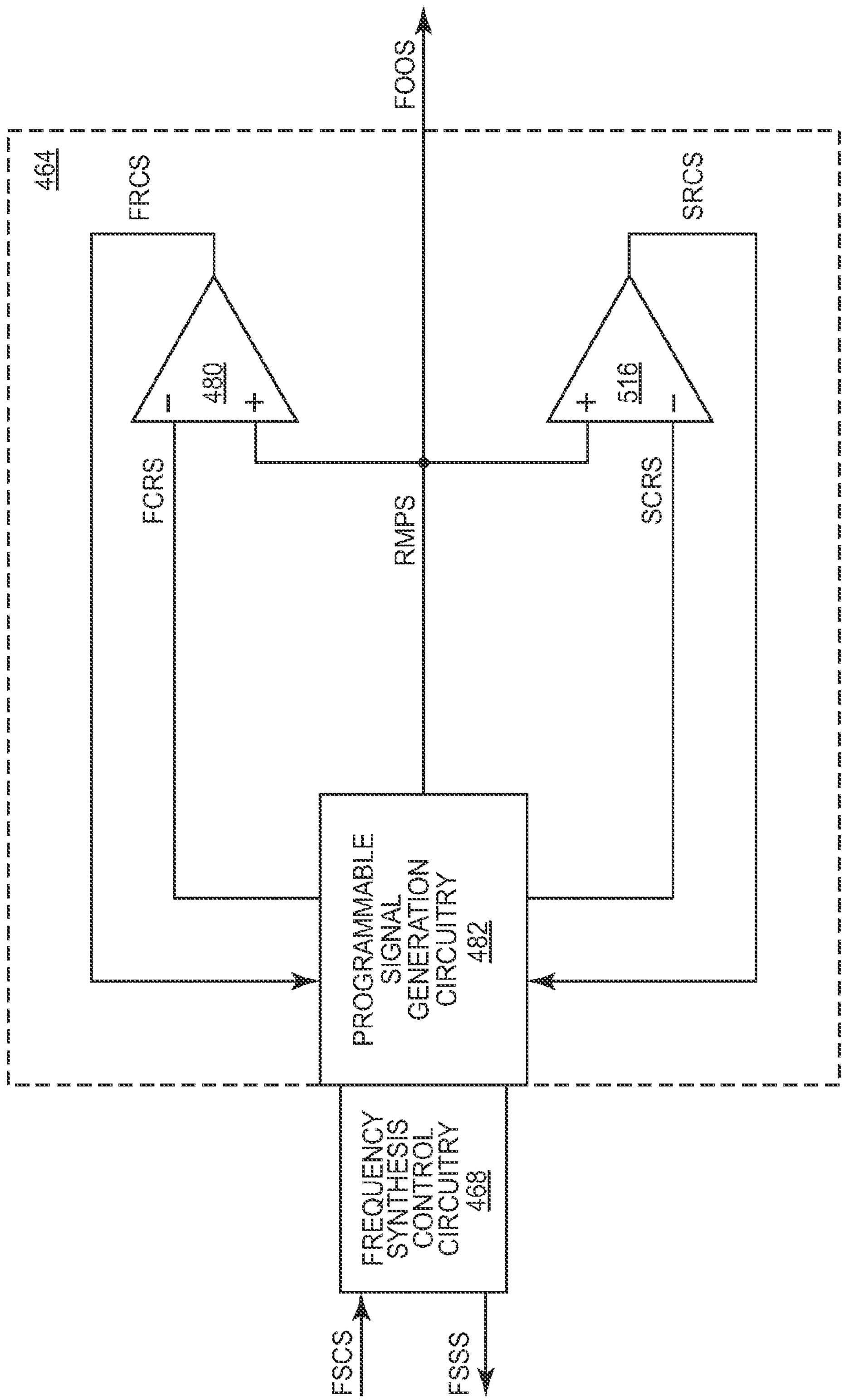

FIG. 83 shows the frequency synthesis control circuitry and details of the first frequency oscillator illustrated in FIG. 77B according to an additional embodiment of the first frequency oscillator.

Figure 84:
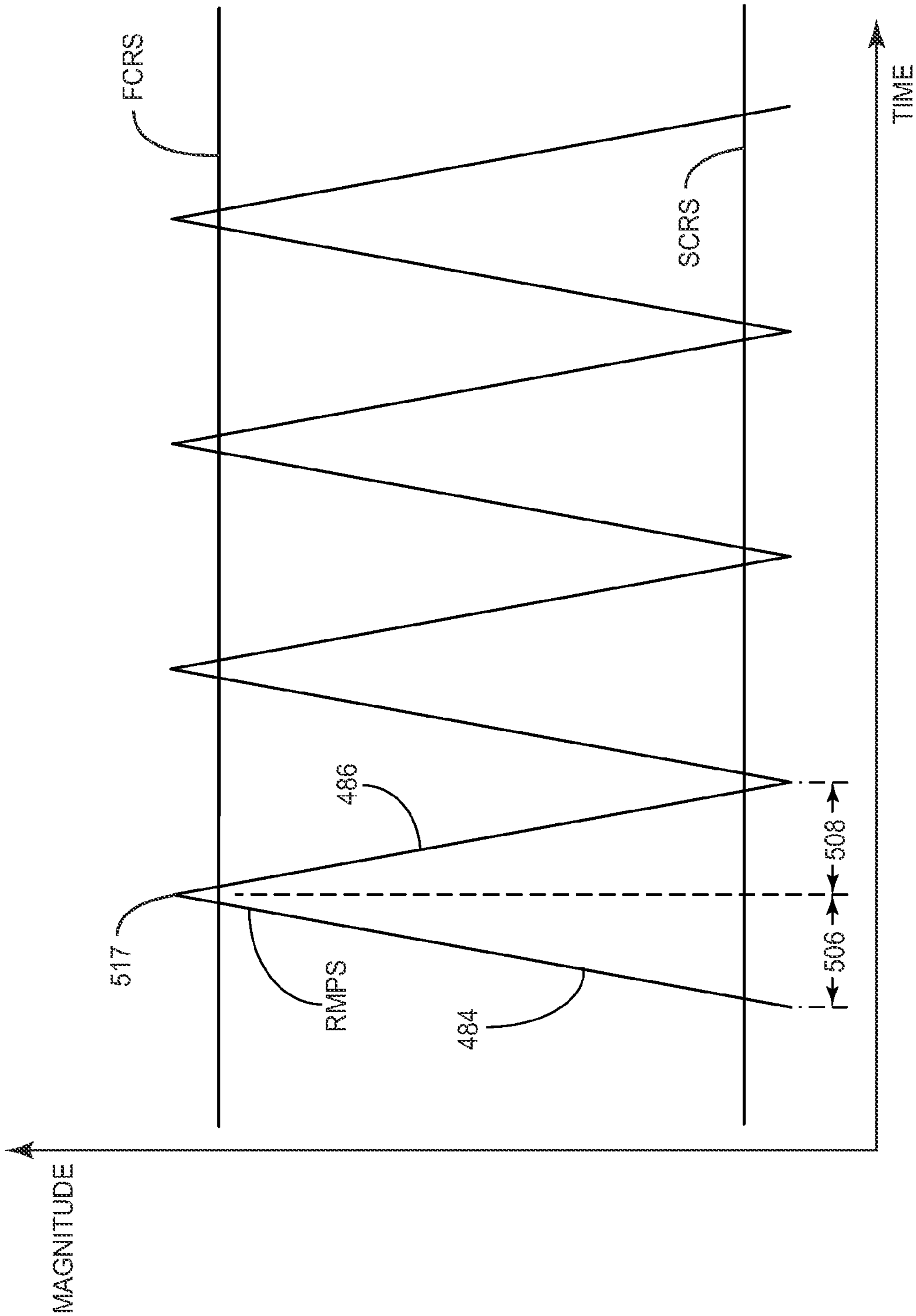

FIG. 84 is a graph showing the first comparator reference signal FCRS, the ramping signal RMPS, and the second comparator reference signal SCRS illustrated in FIG. 83 according to one embodiment of the first comparator reference signal FCRS, the ramping signal RMPS, and the second comparator reference signal SCRS.

Figure 85:
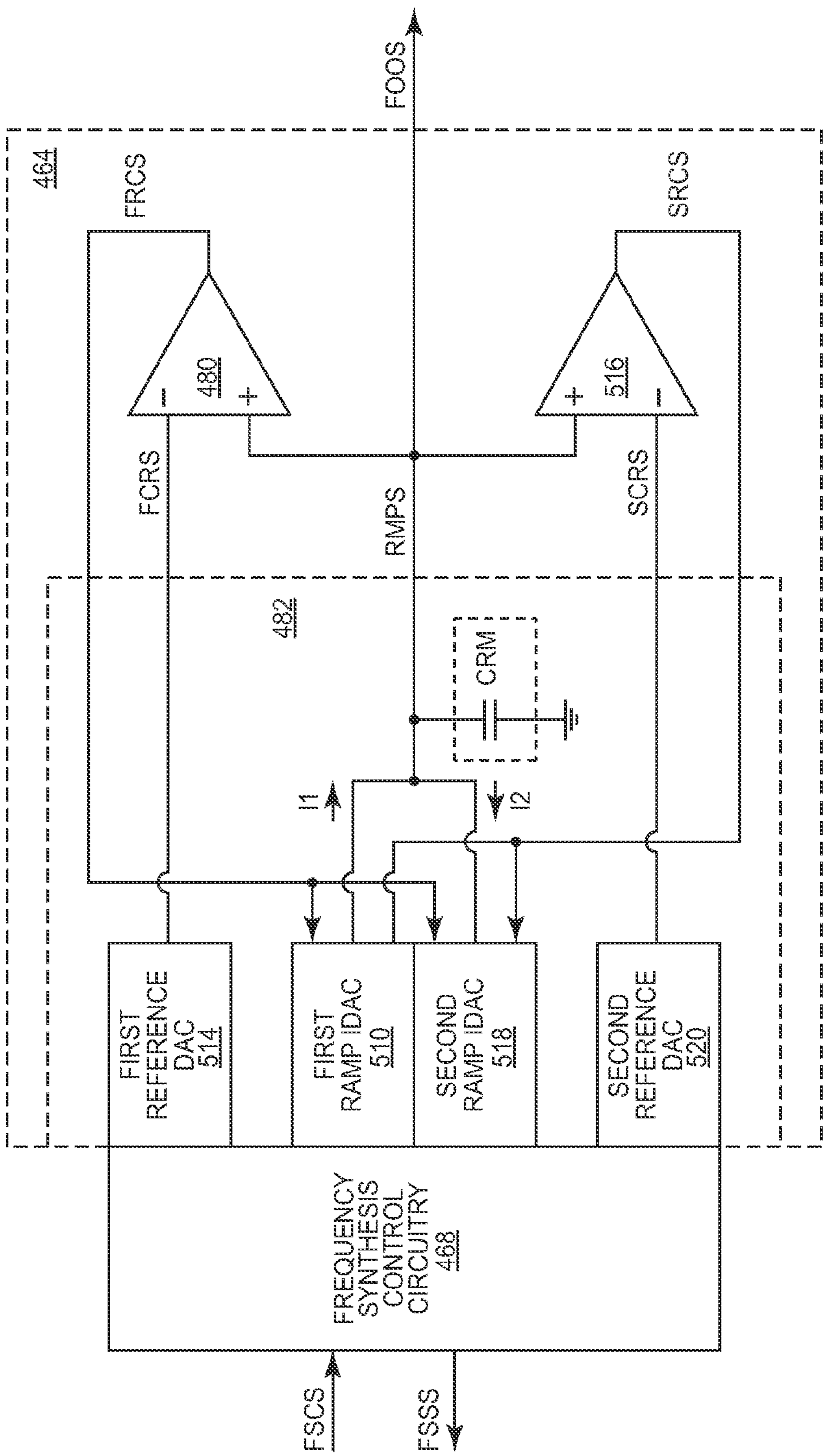

FIG. 85 shows details of the programmable signal generation circuitry illustrated in FIG. 83 according to an alternate embodiment of the programmable signal generation circuitry.

Figure 86:
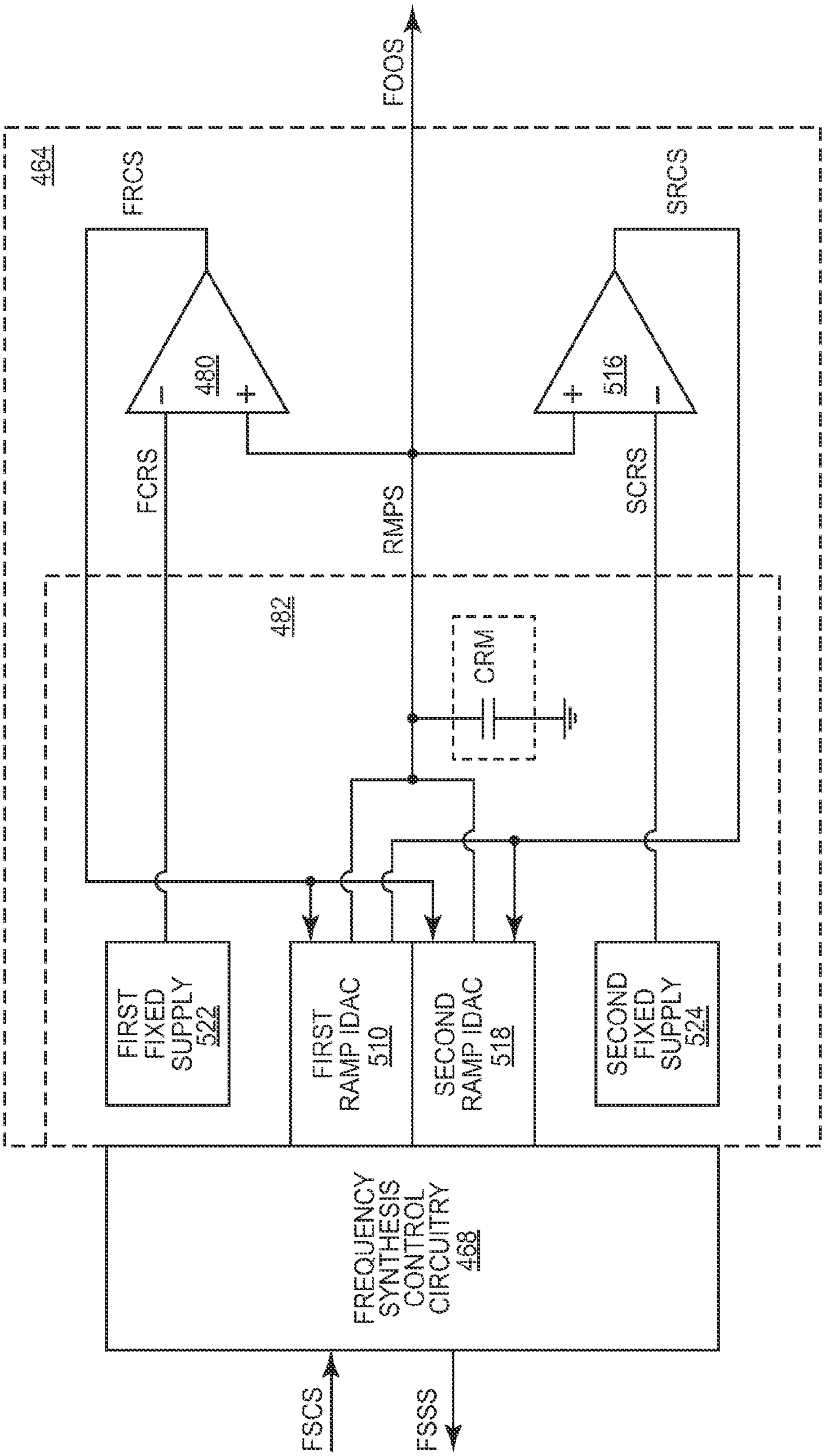

FIG. 86 shows details of the programmable signal generation circuitry illustrated in FIG. 83 according to an additional embodiment of the programmable signal generation circuitry.

Figure 87:
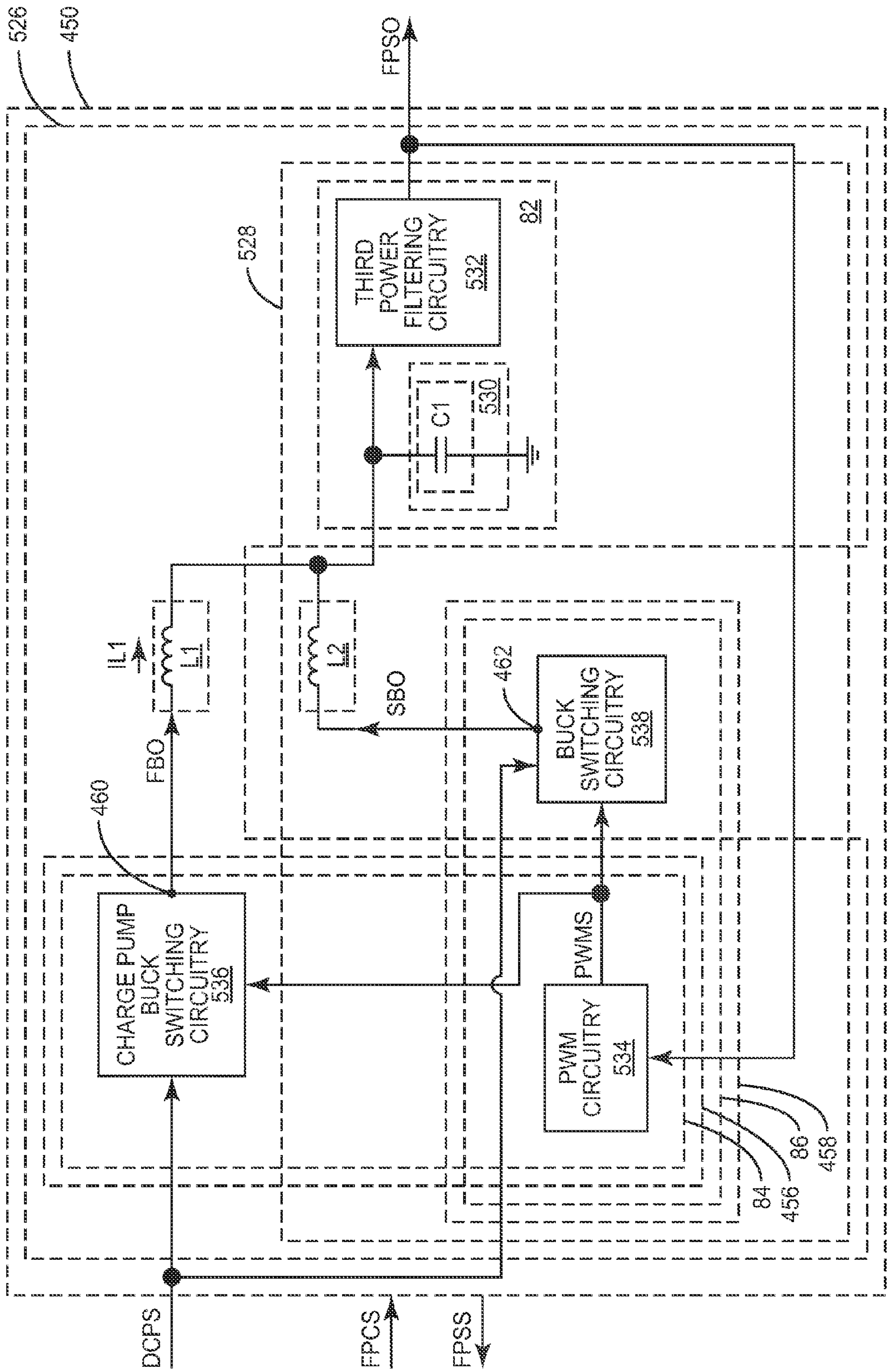

FIG. 87 shows details of the first switching power supply illustrated in FIG. 74 according to one embodiment of the first switching power supply.

Figure 88:
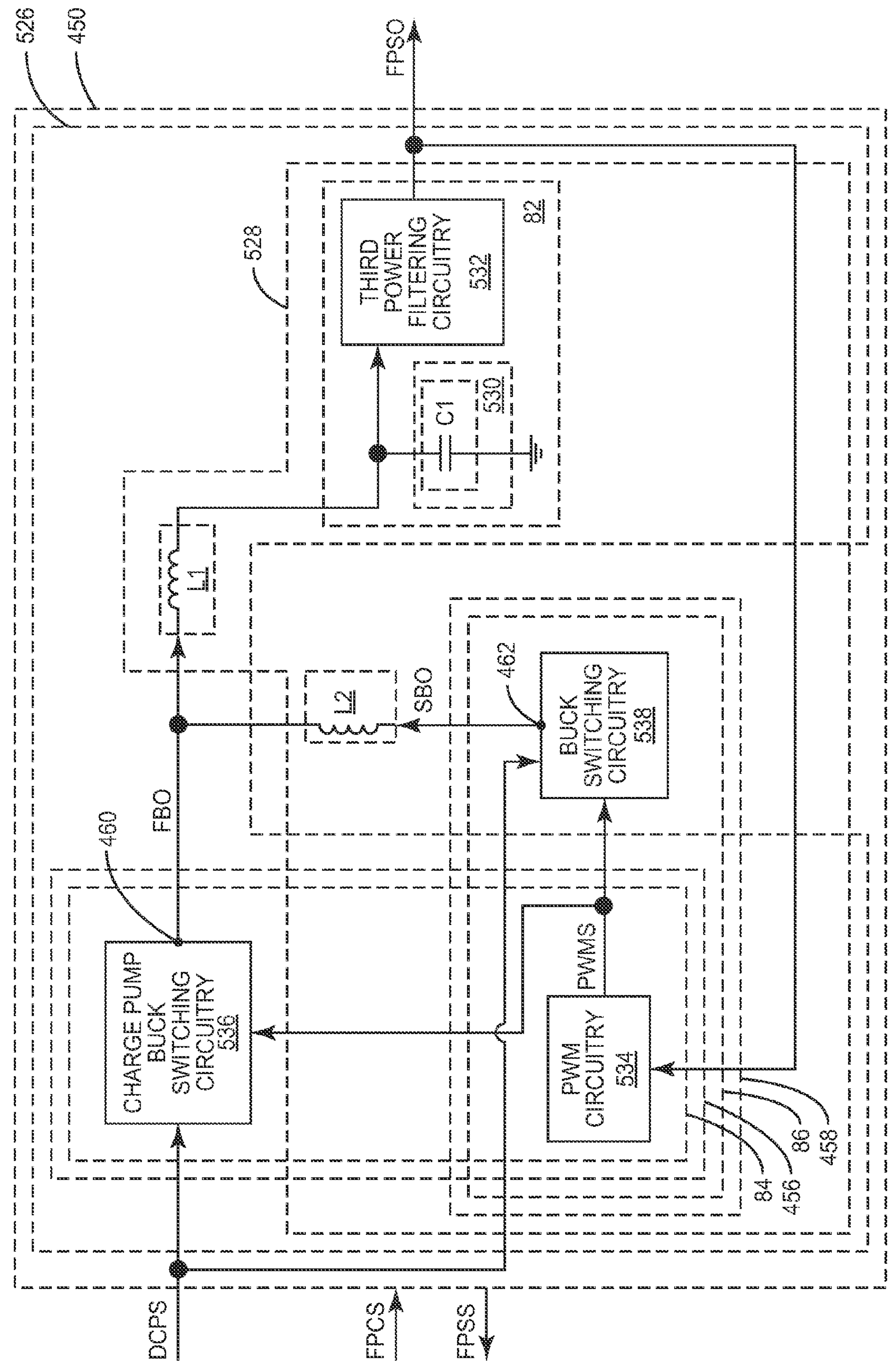

FIG. 88 shows details of the first switching power supply illustrated in FIG. 74 according to a further embodiment of the first switching power supply.

Figure 89:
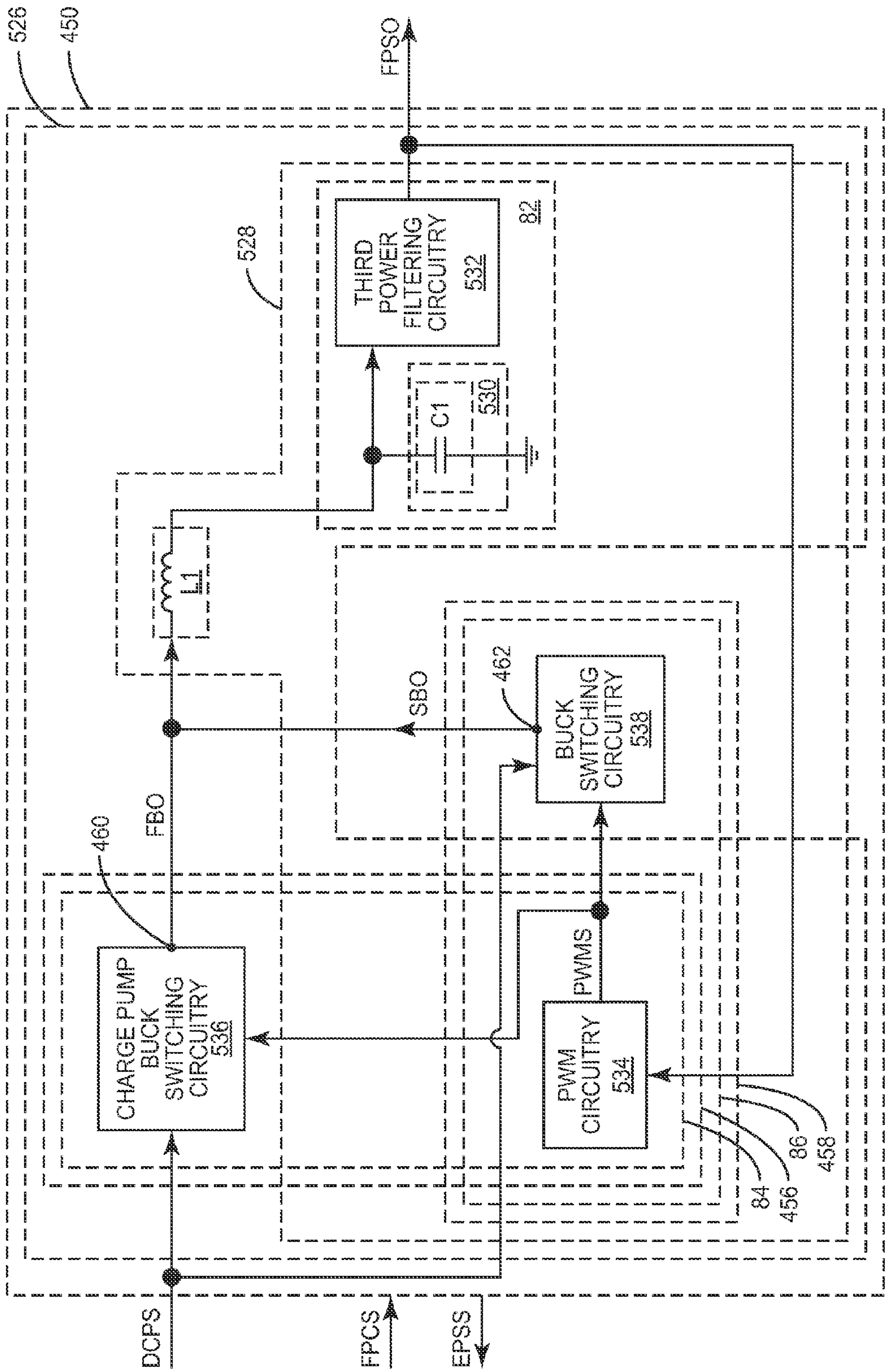

FIG. 89 shows details of the first switching power supply illustrated in FIG. 75 according to an alternate embodiment of the first switching power supply.

Figure 90:
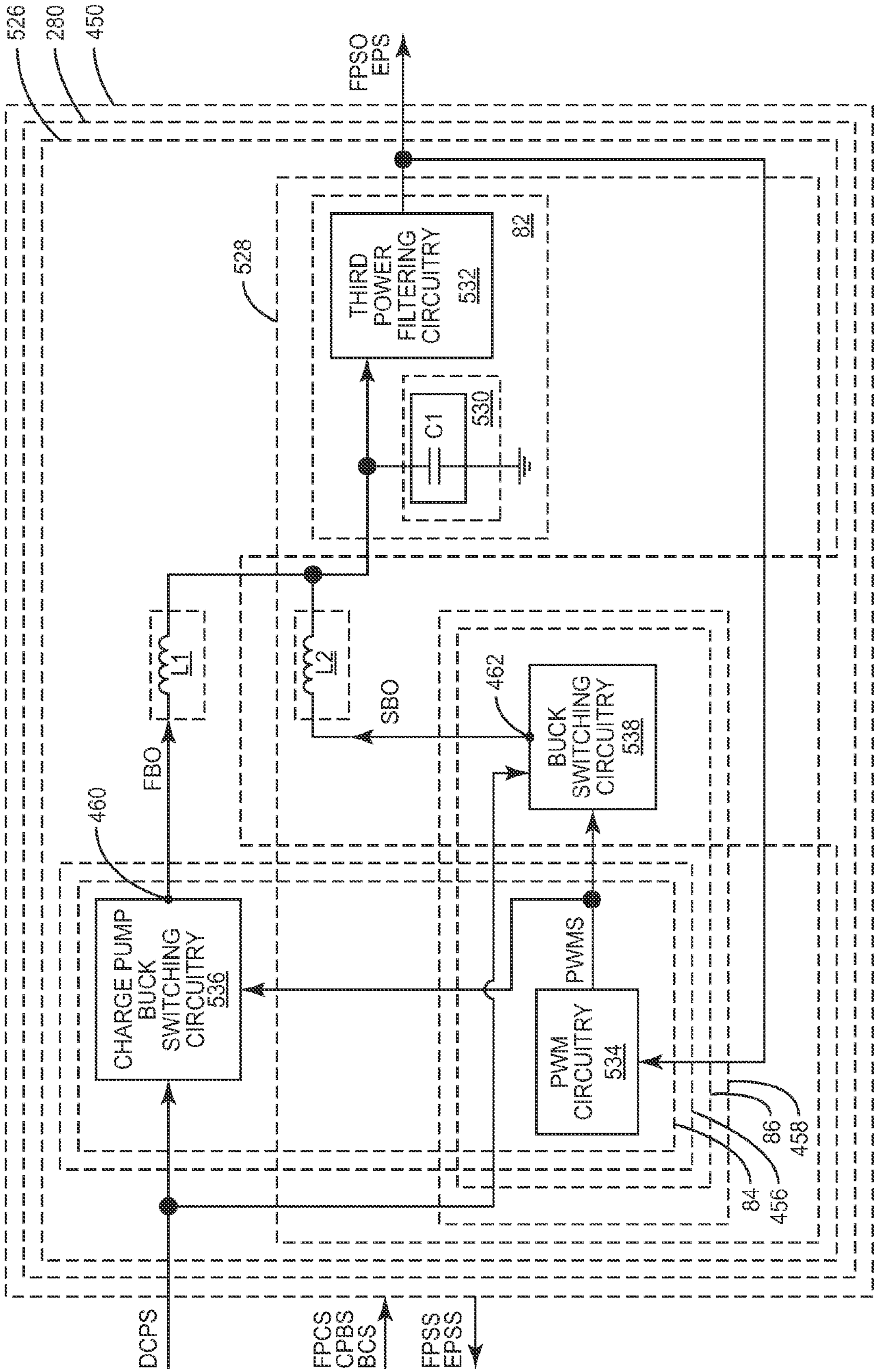

FIG. 90 shows details of the first switching power supply illustrated in FIG. 74 according to an additional embodiment of the first switching power supply.

Figure 91:
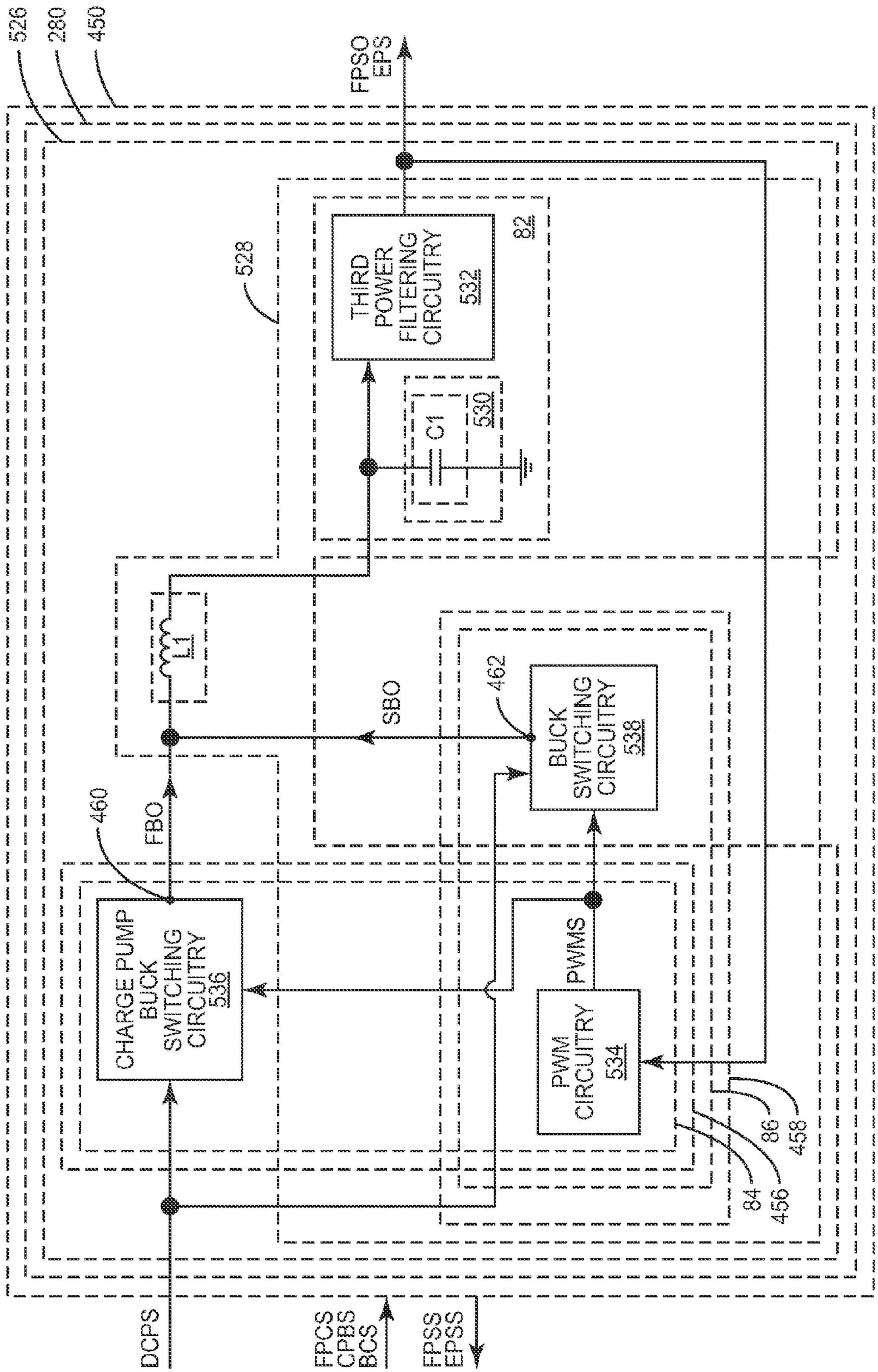

FIG. 91 shows details of the first switching power supply illustrated in FIG. 75 according to another embodiment of the first switching power supply.

Figure 92:
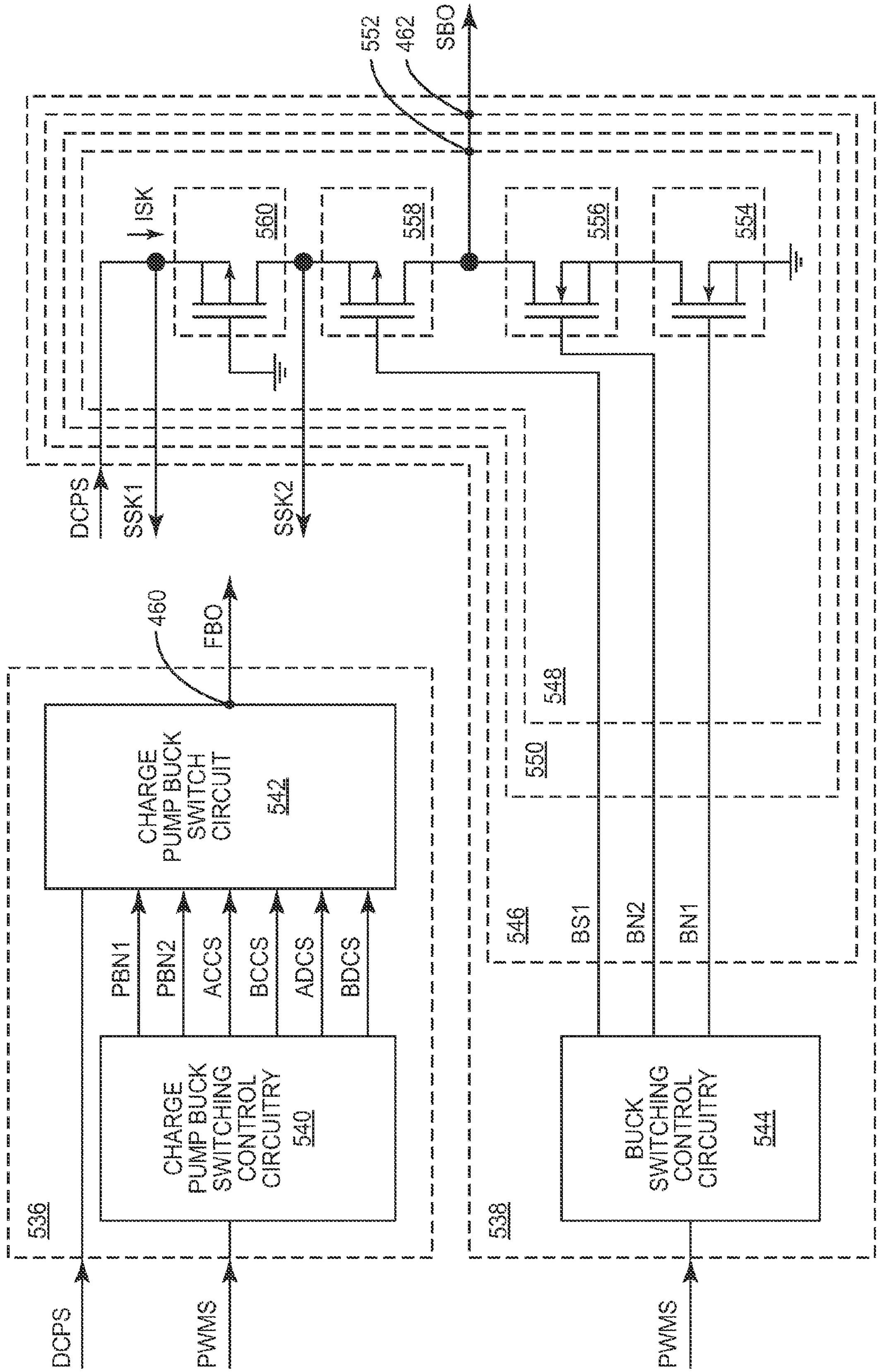

FIG. 92 shows details of charge pump buck switching circuitry and the buck switching circuitry illustrated in FIG. 87 according to one embodiment of the charge pump buck switching circuitry and the buck switching circuitry.

Figure 93:
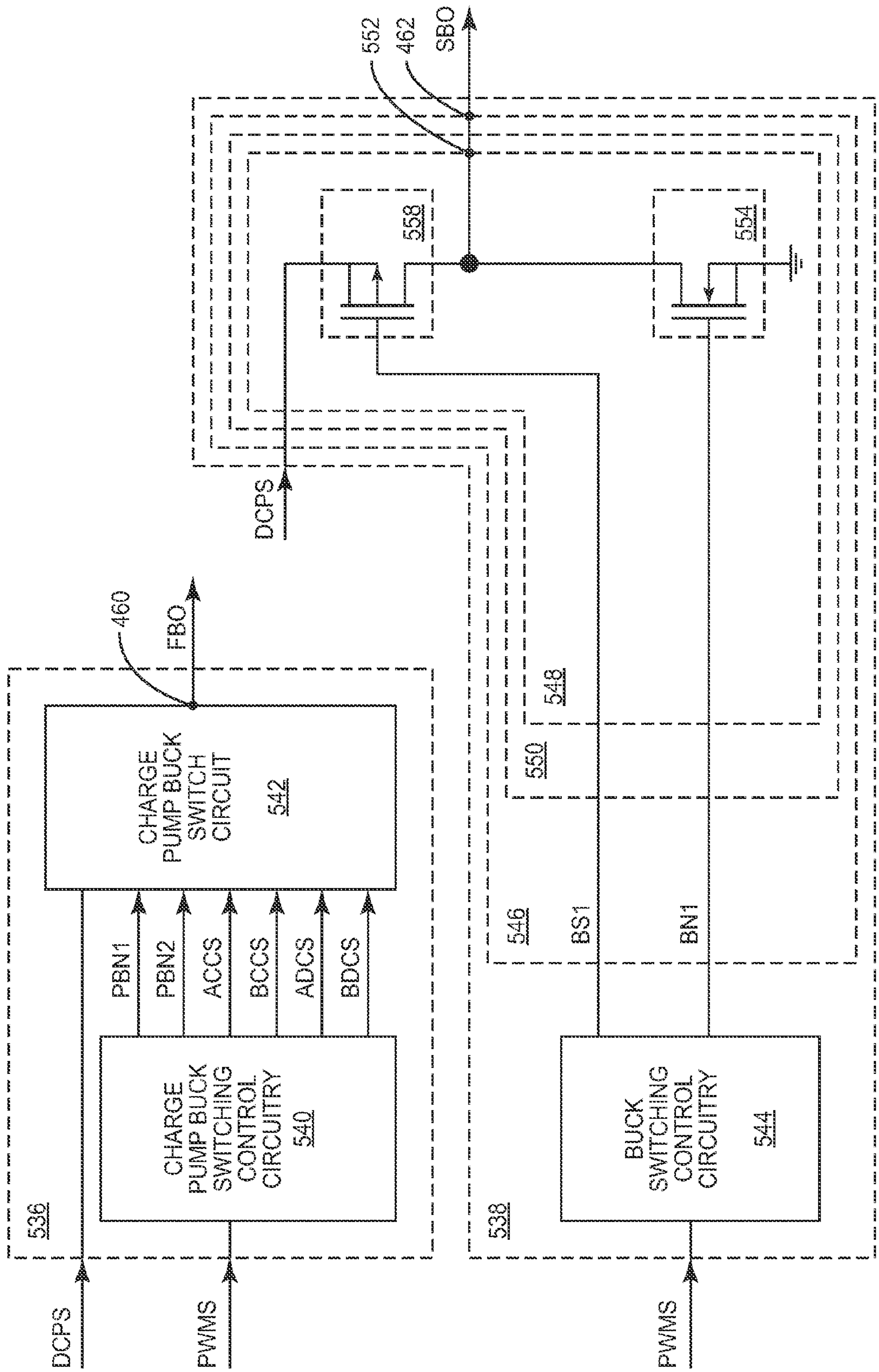

FIG. 93 shows details of charge pump buck switching circuitry and the buck switching circuitry illustrated in FIG. 87 according to an alternate embodiment of the buck switching circuitry.

Figure 94:
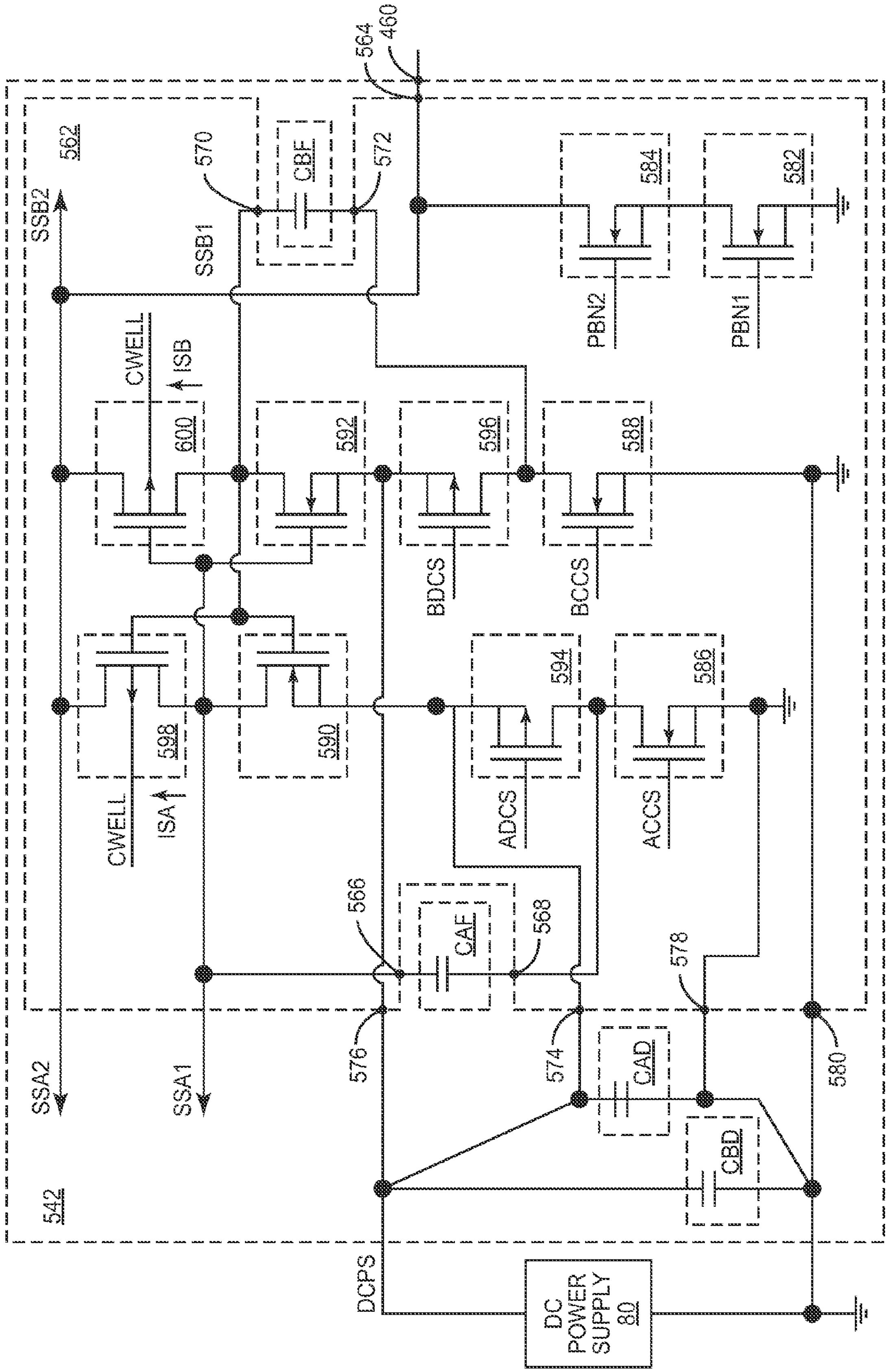

FIG. 94 shows details of a charge pump buck switch circuit illustrated in FIG. 92 according to one embodiment of the charge pump buck switch circuit.

Figure 95A:
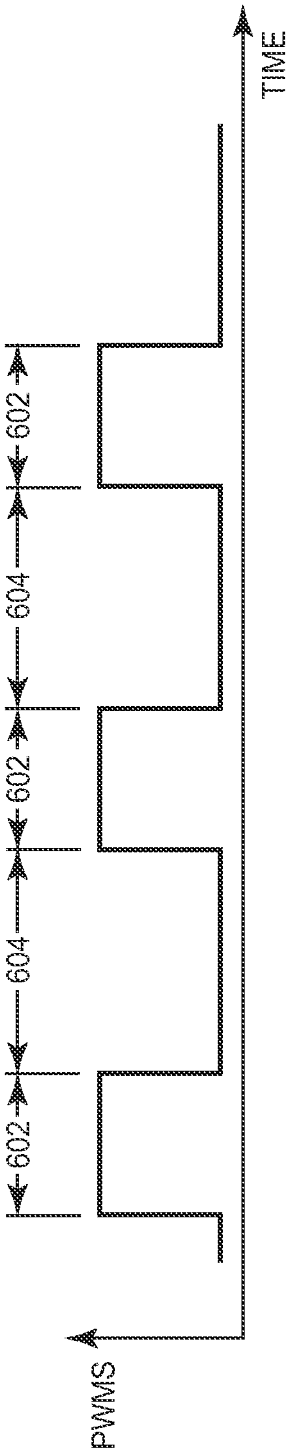
Figure 95B:
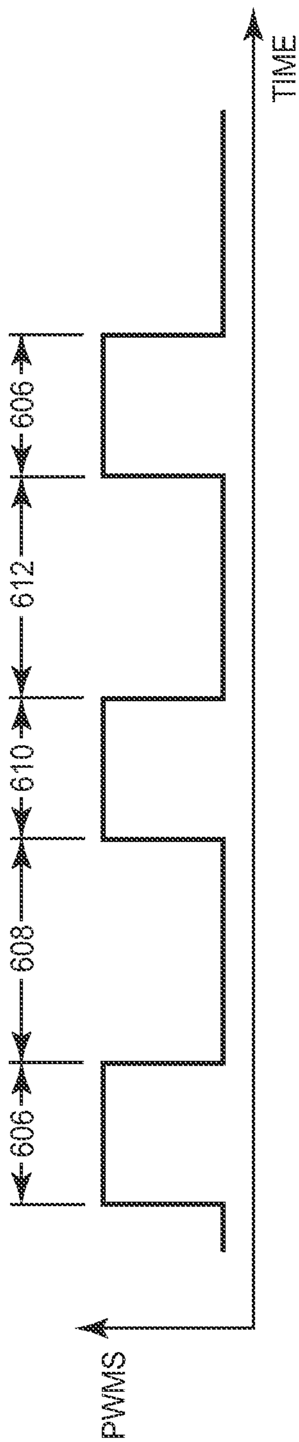

FIG. 95A and FIG. 95B are graphs of a pulse width modulation (PWM) signal of the first switching power supply illustrated in FIG. 87 according to one embodiment of the first switching power supply.

Figure 96:
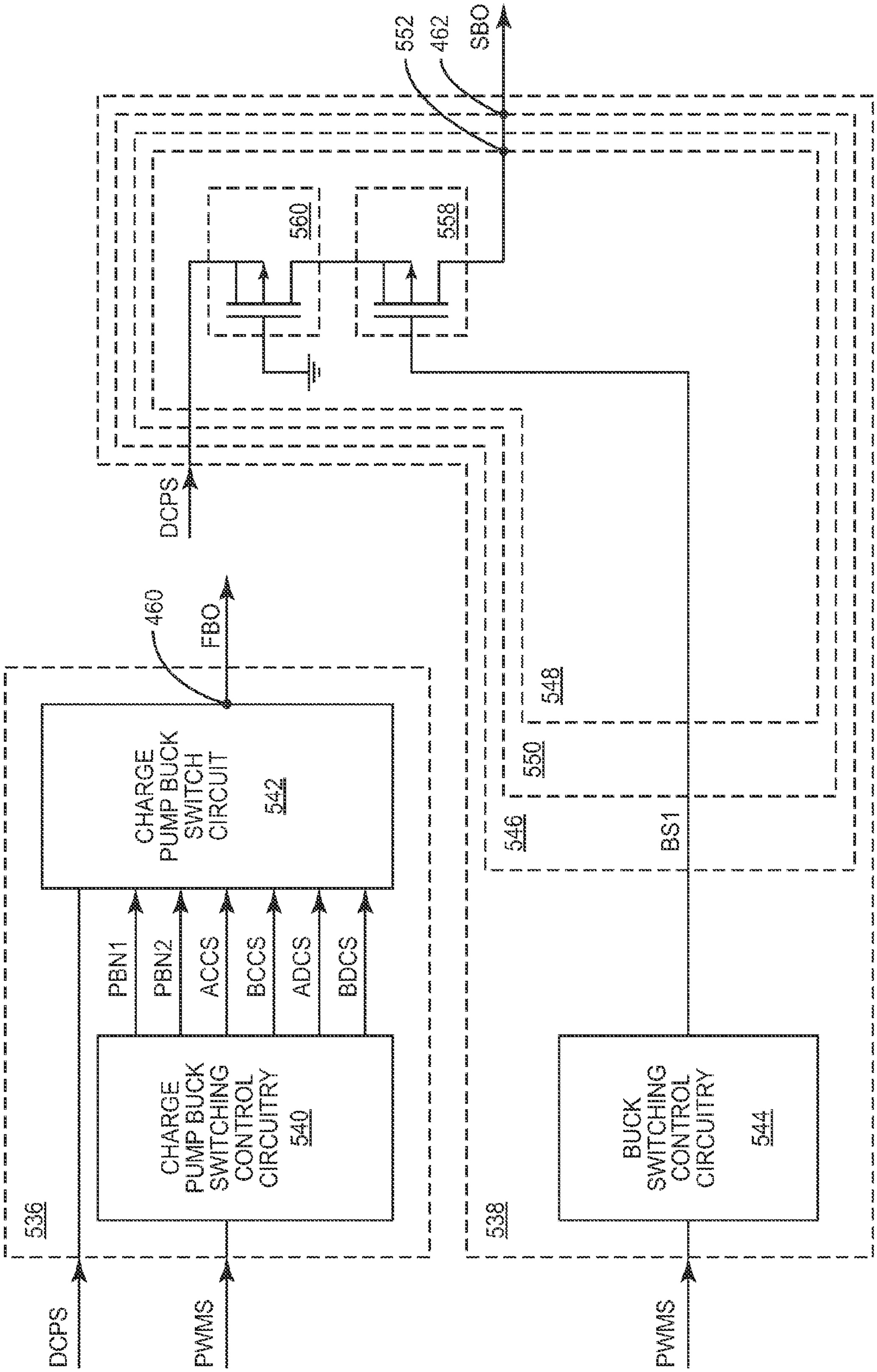

FIG. 96 shows details of the charge pump buck switching circuitry and the buck switching circuitry illustrated in FIG. 89 according to an additional embodiment of the buck switching circuitry.

Figure 97:
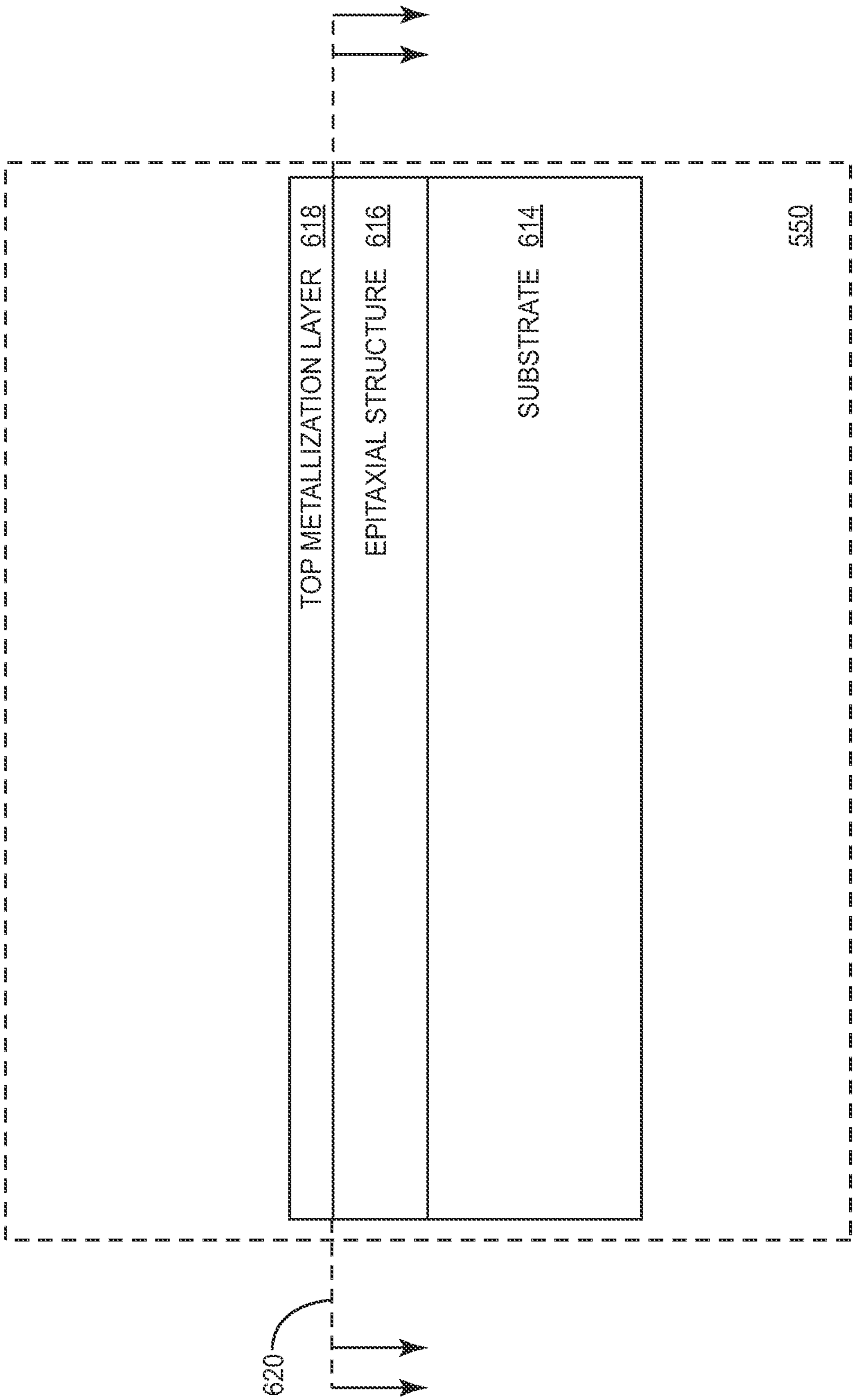

FIG. 97 shows a frontwise cross section of the a first portion and a second portion of a DC-DC converter semiconductor die illustrated in FIG. 92 and FIG. 94, respectively, according to one embodiment of the DC-DC converter semiconductor die.

Figure 98:
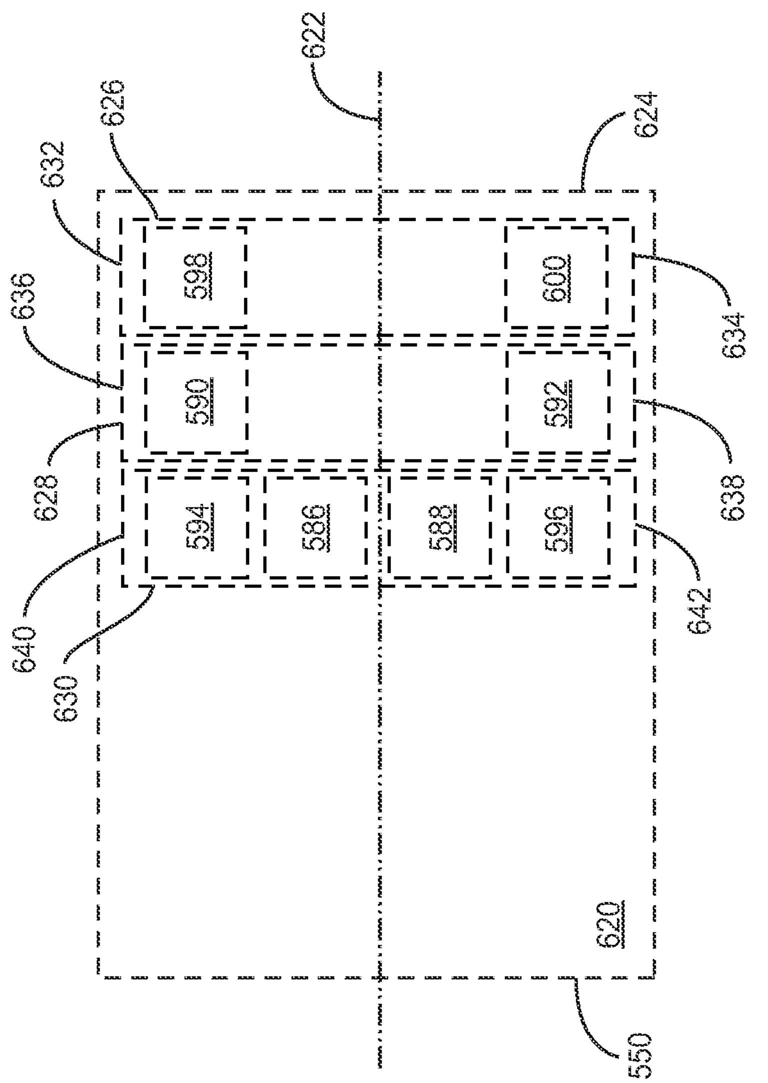

FIG. 98 shows a topwise cross section of the DC-DC converter semiconductor die 550 illustrated in FIG. 97 according to one embodiment of the DC-DC converter semiconductor die.

Figure 99:
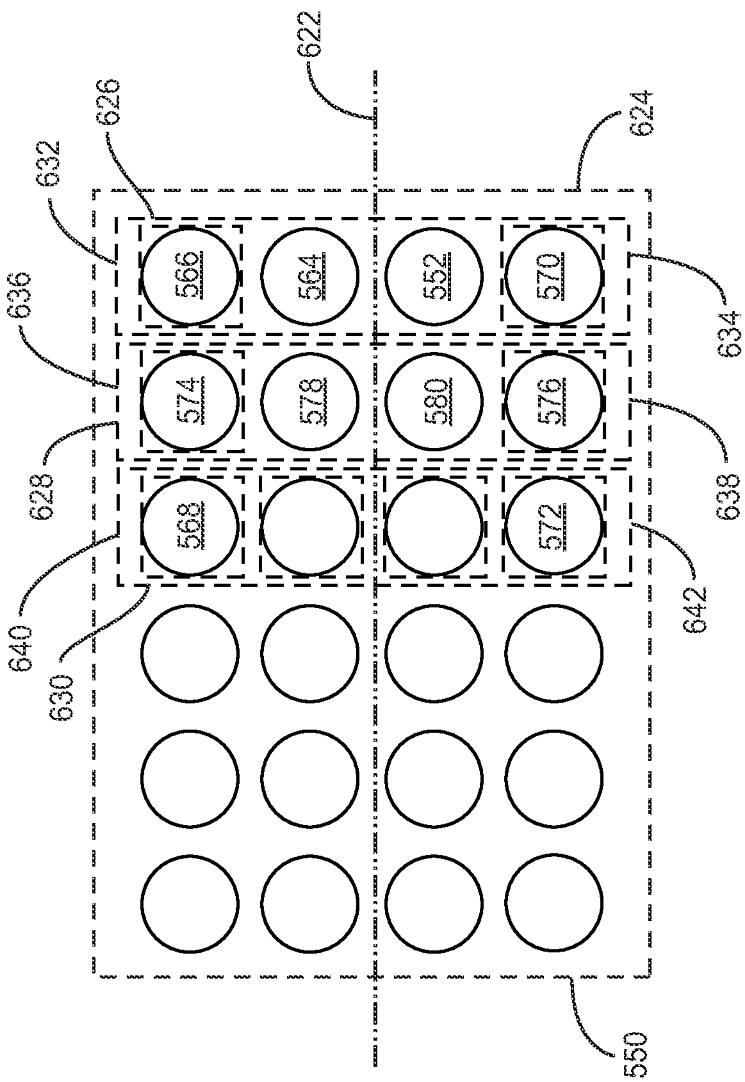

FIG. 99 shows a top view of the DC-DC converter semiconductor die illustrated in FIG. 97 according to one embodiment of the DC-DC converter semiconductor die.

Figure 100:
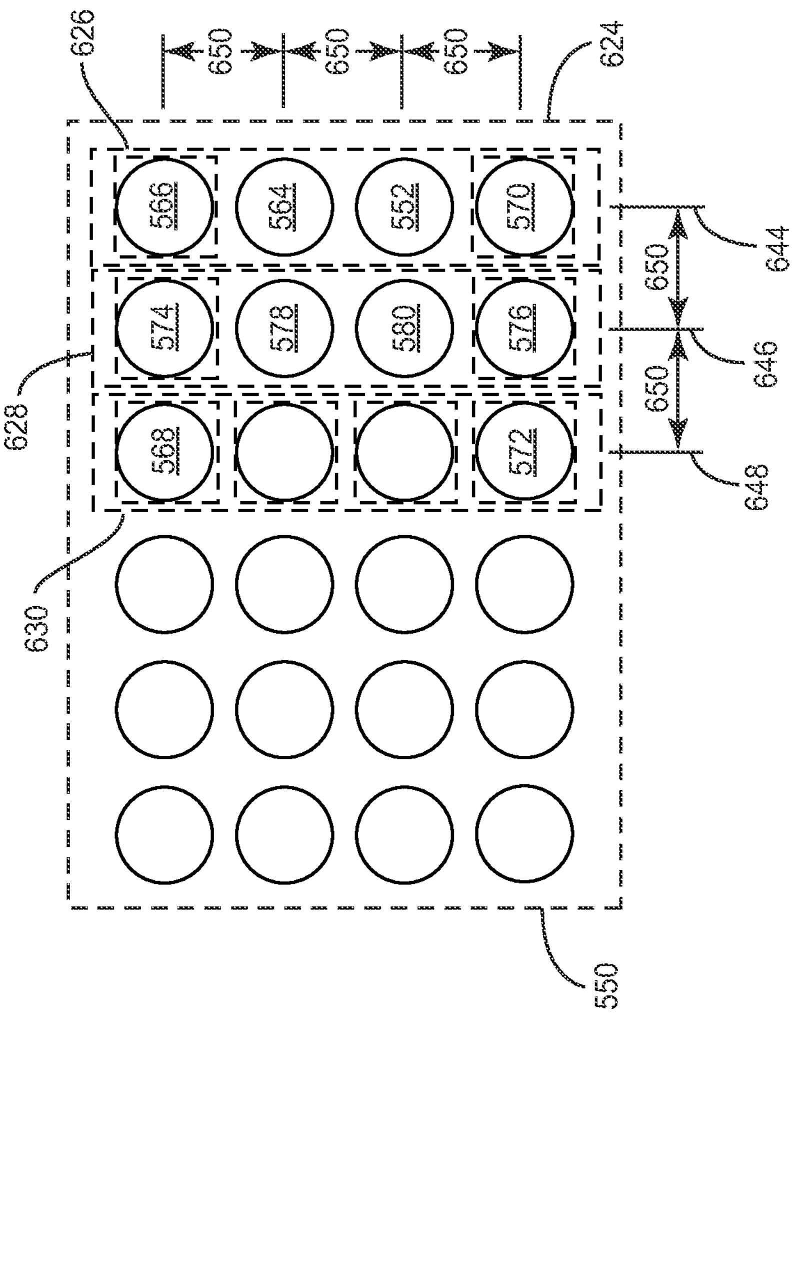

FIG. 100 shows additional details of the DC-DC converter semiconductor die illustrated in FIG. 99 according to one embodiment of the DC-DC converter semiconductor die.

Figure 101:
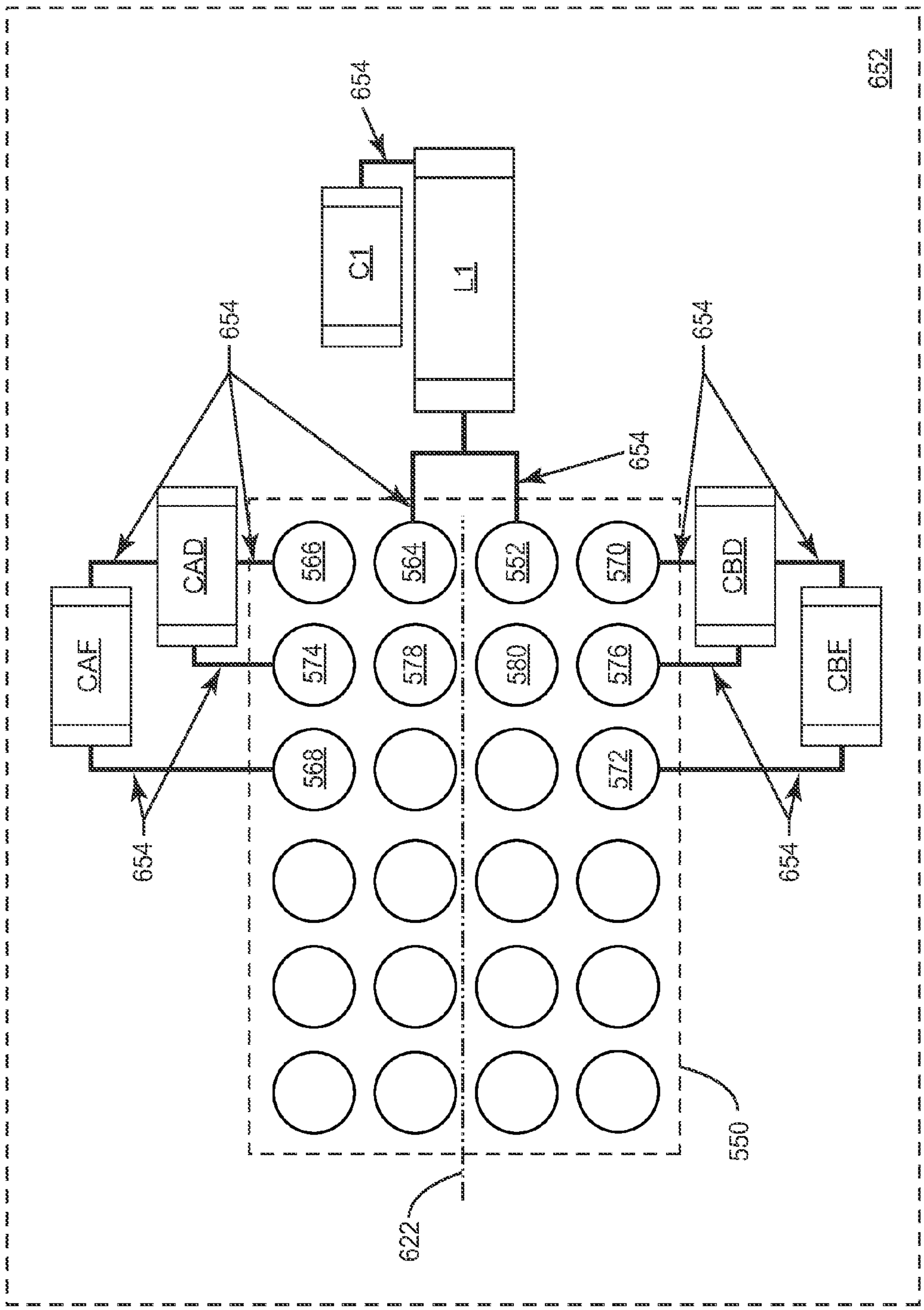

FIG. 101 shows details of a supporting structure according to one embodiment of the supporting structure.

Figure 102:
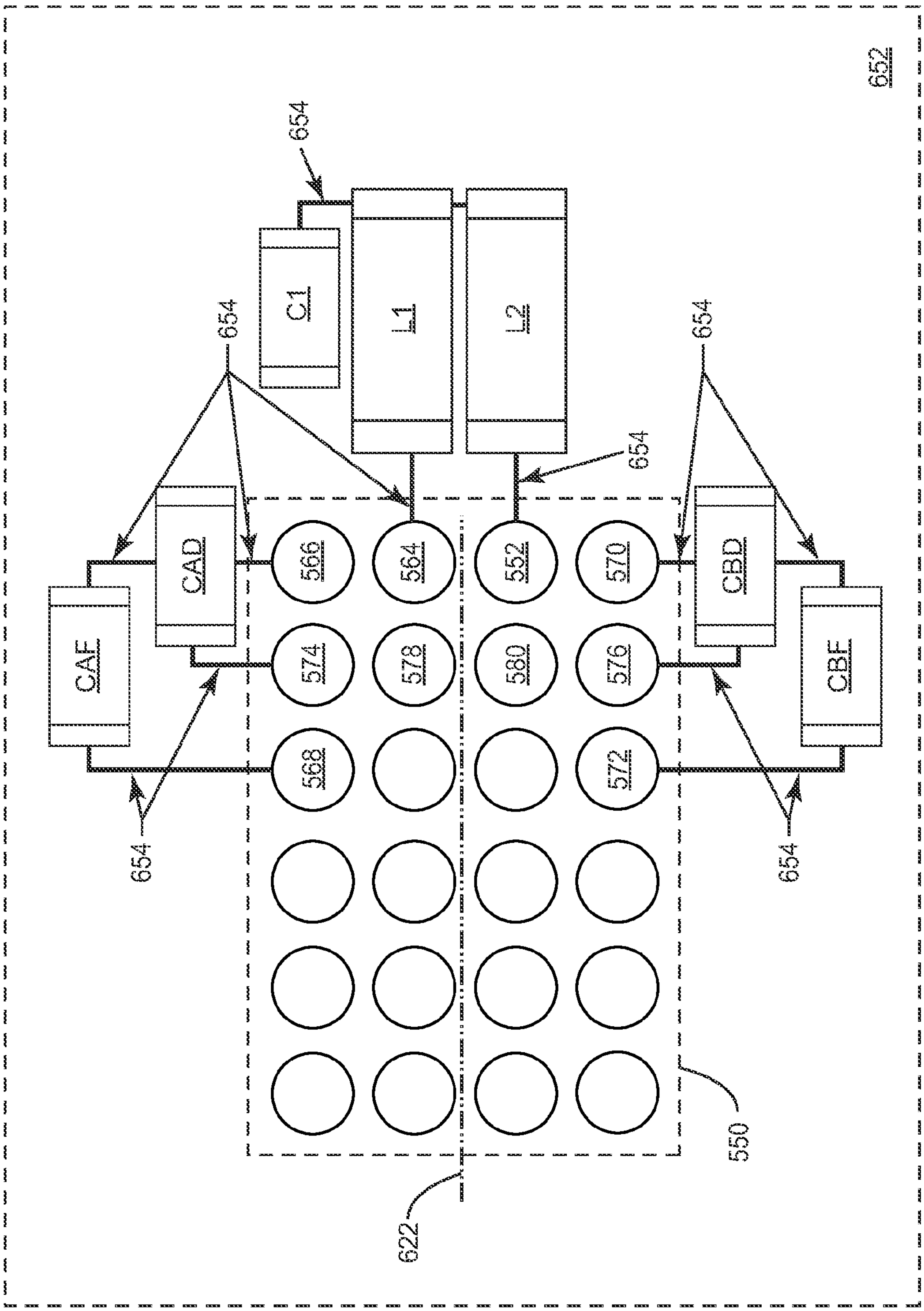

FIG. 102 shows details of the supporting structure according to an alternate embodiment of the supporting structure.

Figure 103:
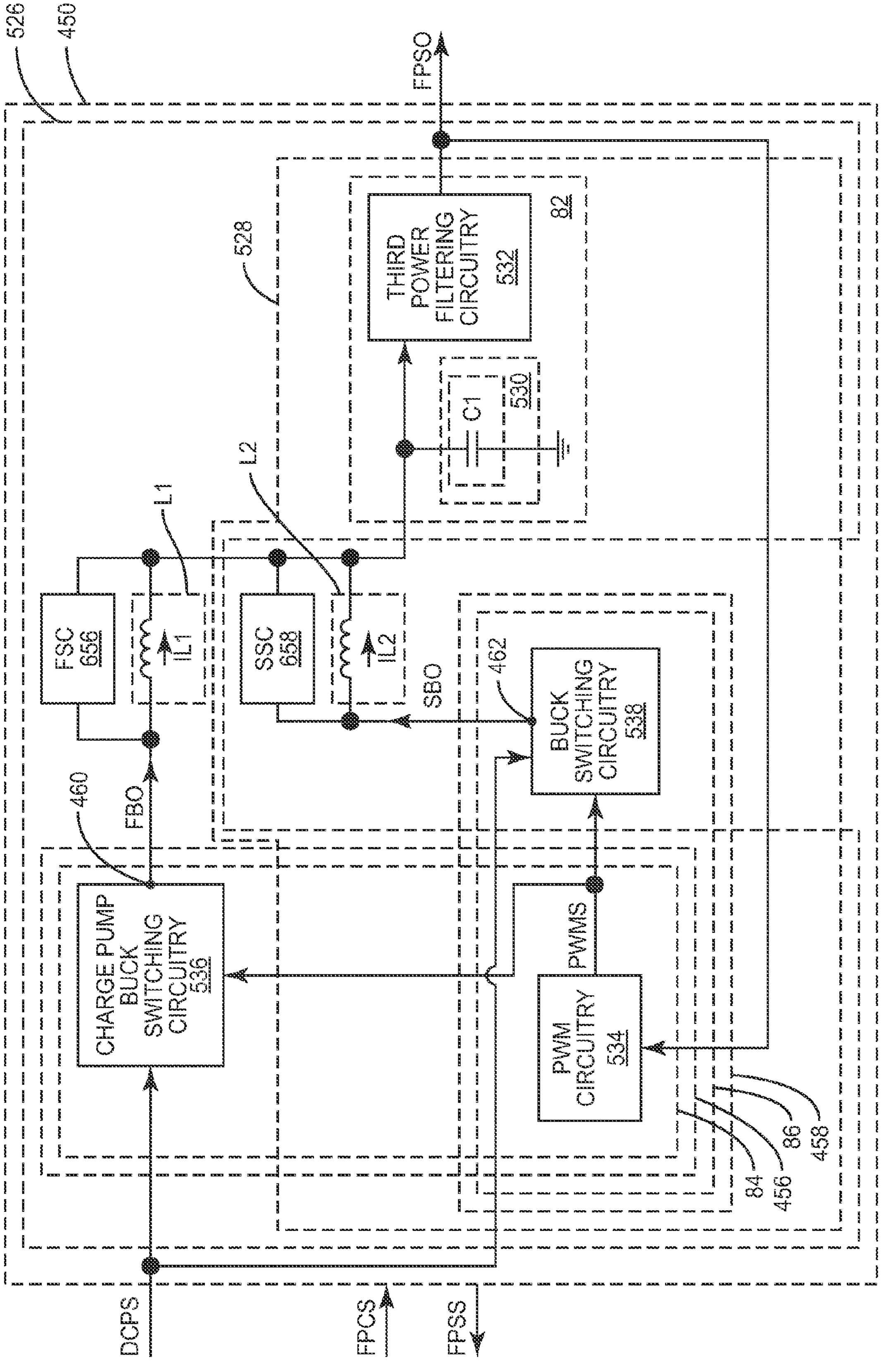

FIG. 103 shows details of the first switching power supply illustrated in FIG. 74 according to one embodiment of the first switching power supply.

Figure 104:
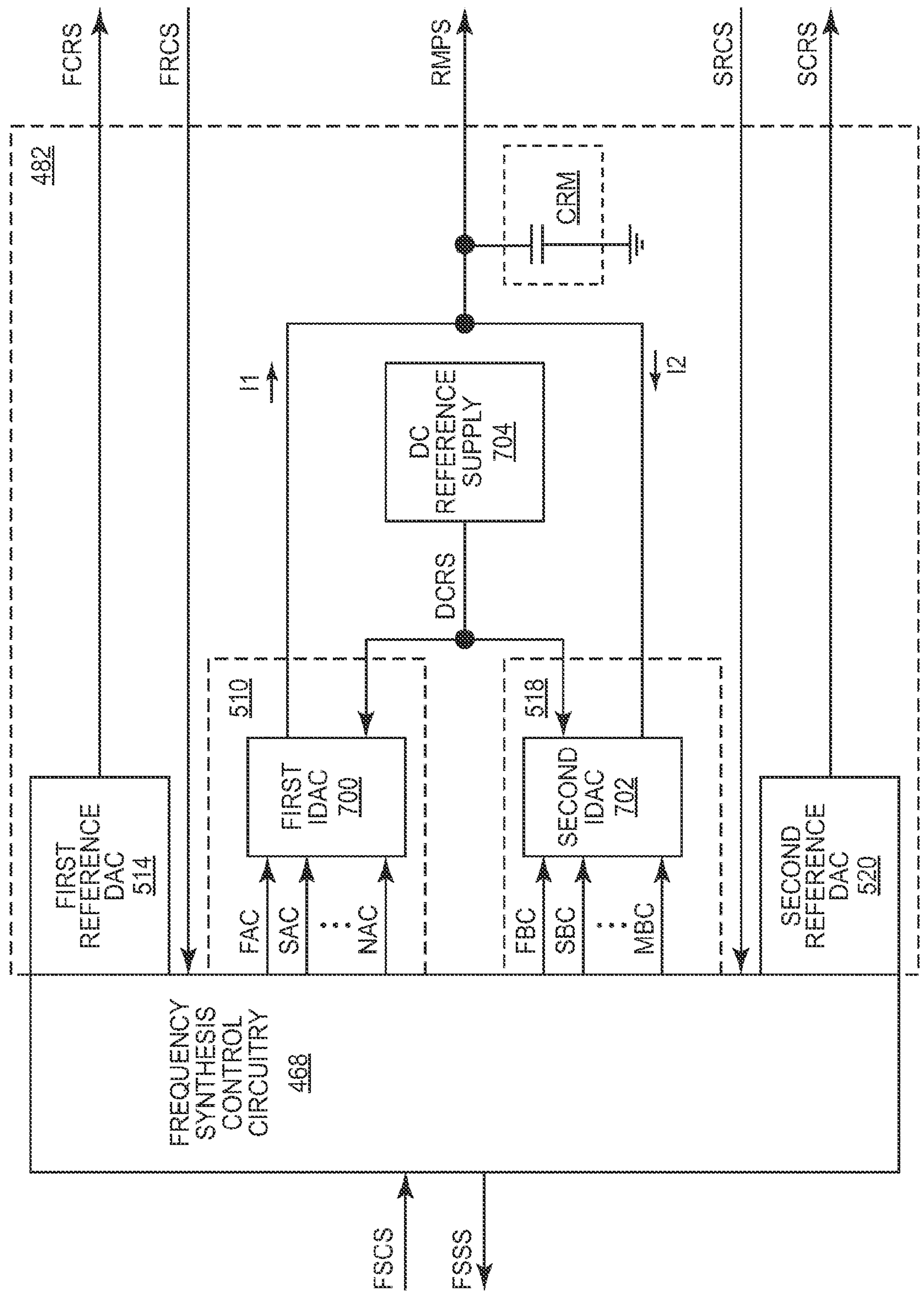

FIG. 104 shows frequency synthesis control circuitry and details of programmable signal generation circuitry illustrated in FIG. 85 according to one embodiment of the frequency synthesis control circuitry and the programmable signal generation circuitry.

Figure 105:
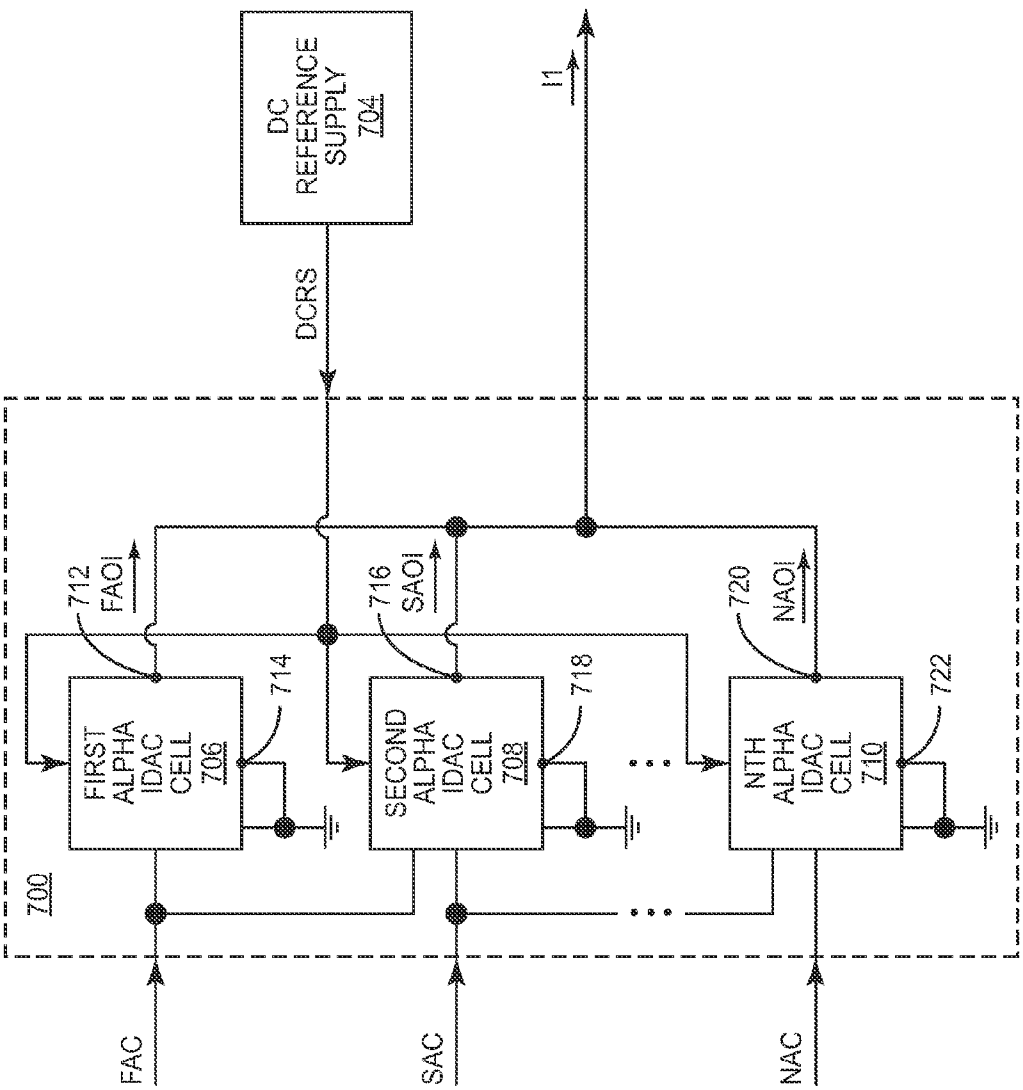

FIG. 105 shows a DC reference supply and details of a first IDAC 700 illustrated in FIG. 104 according to one embodiment of the DC reference supply and the first IDAC.

Figure 106:
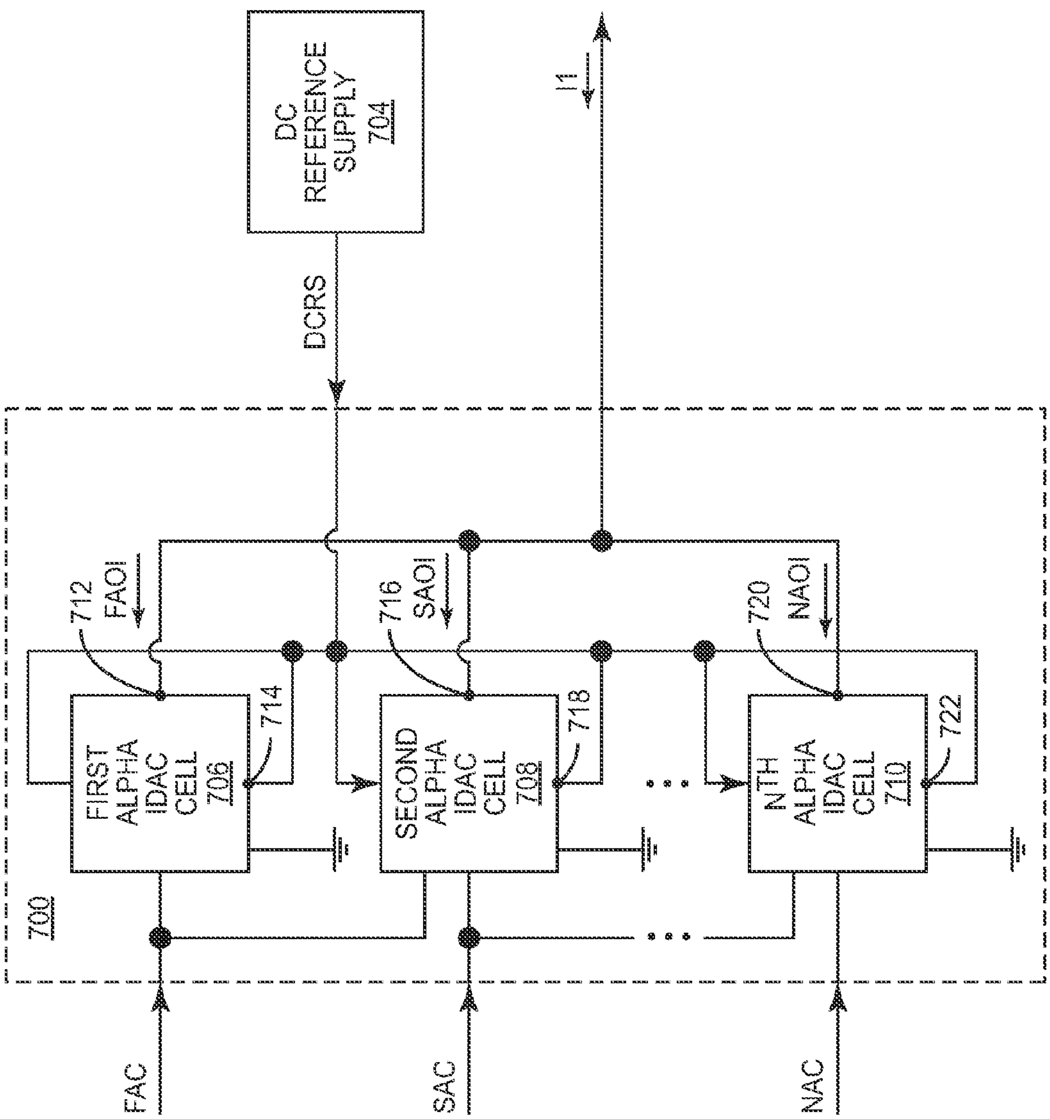

FIG. 106 shows the DC reference supply and details of the first IDAC illustrated in FIG. 104 according to one embodiment of the DC reference supply and an alternate embodiment of the first IDAC.

Figure 107:
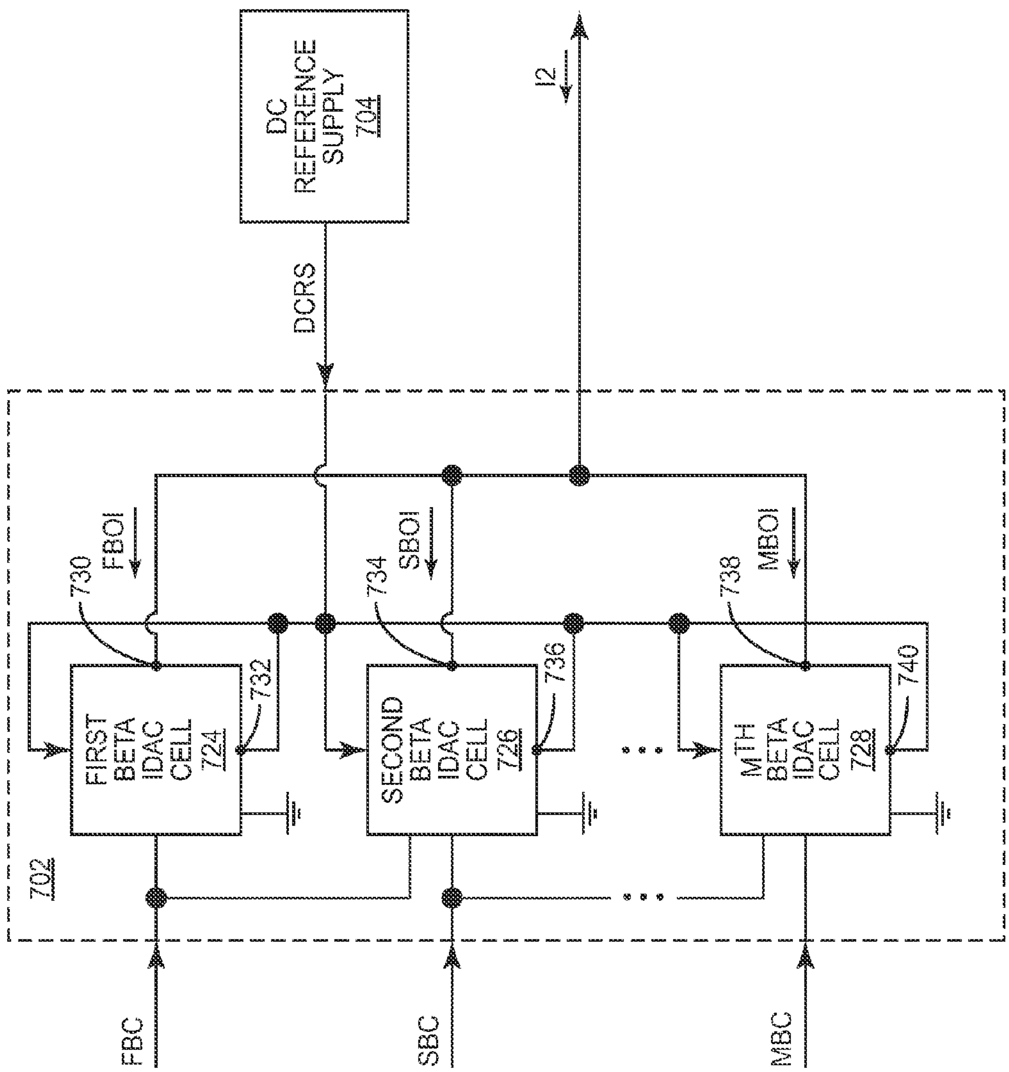

FIG. 107 shows the DC reference supply and details of a second IDAC illustrated in FIG. 104 according to one embodiment of the DC reference supply and the second IDAC.

Figure 108:
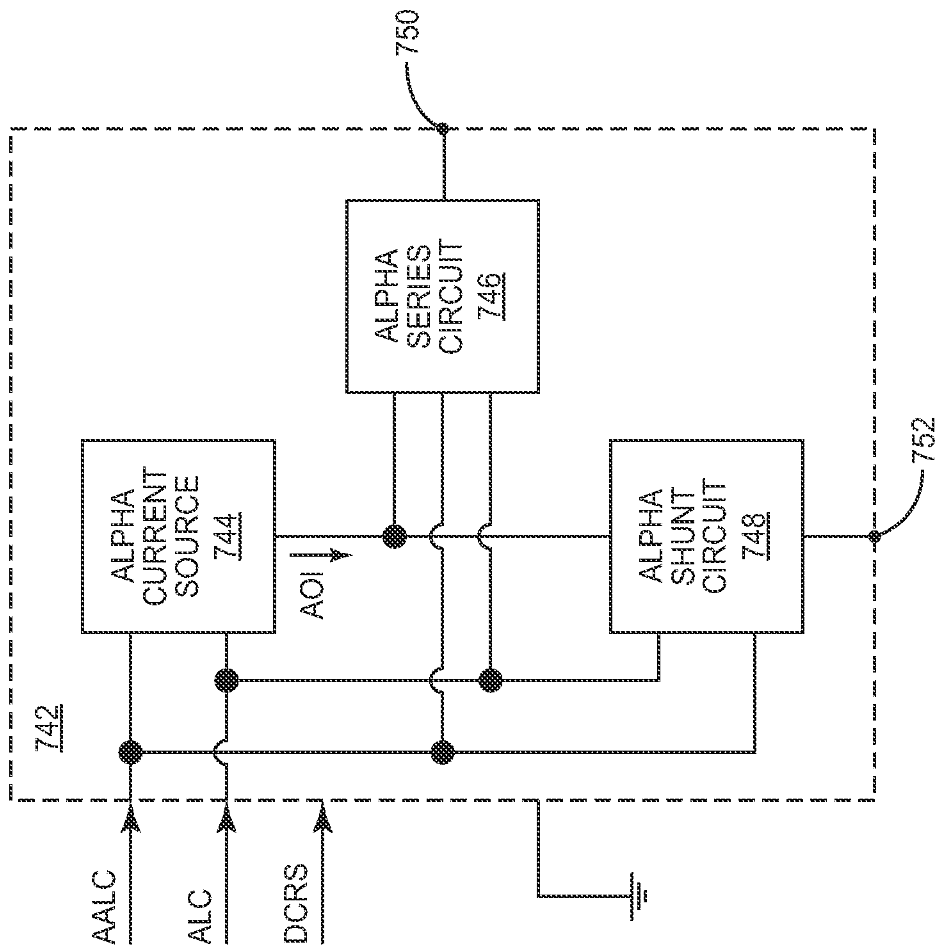

FIG. 108 shows details of an alpha IDAC cell according to one embodiment of the alpha IDAC cell.

Figure 109:
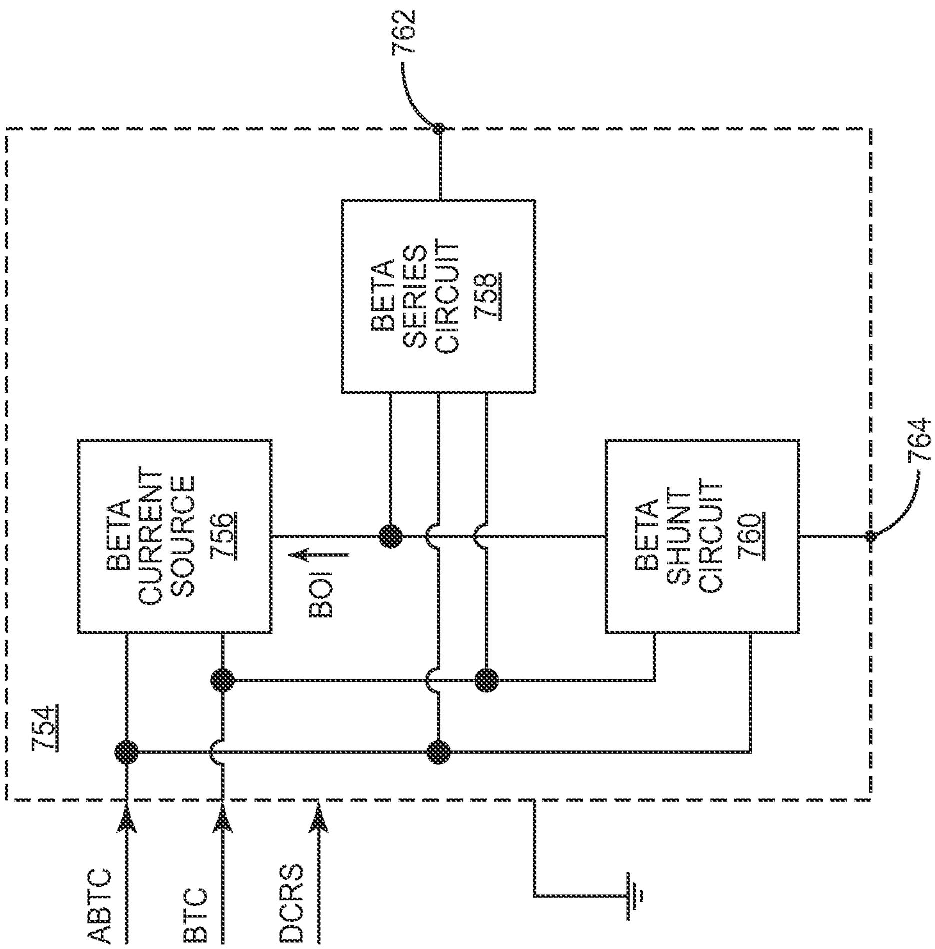

FIG. 109 shows details of a beta IDAC cell according to one embodiment of the beta IDAC cell.

Figure 110:
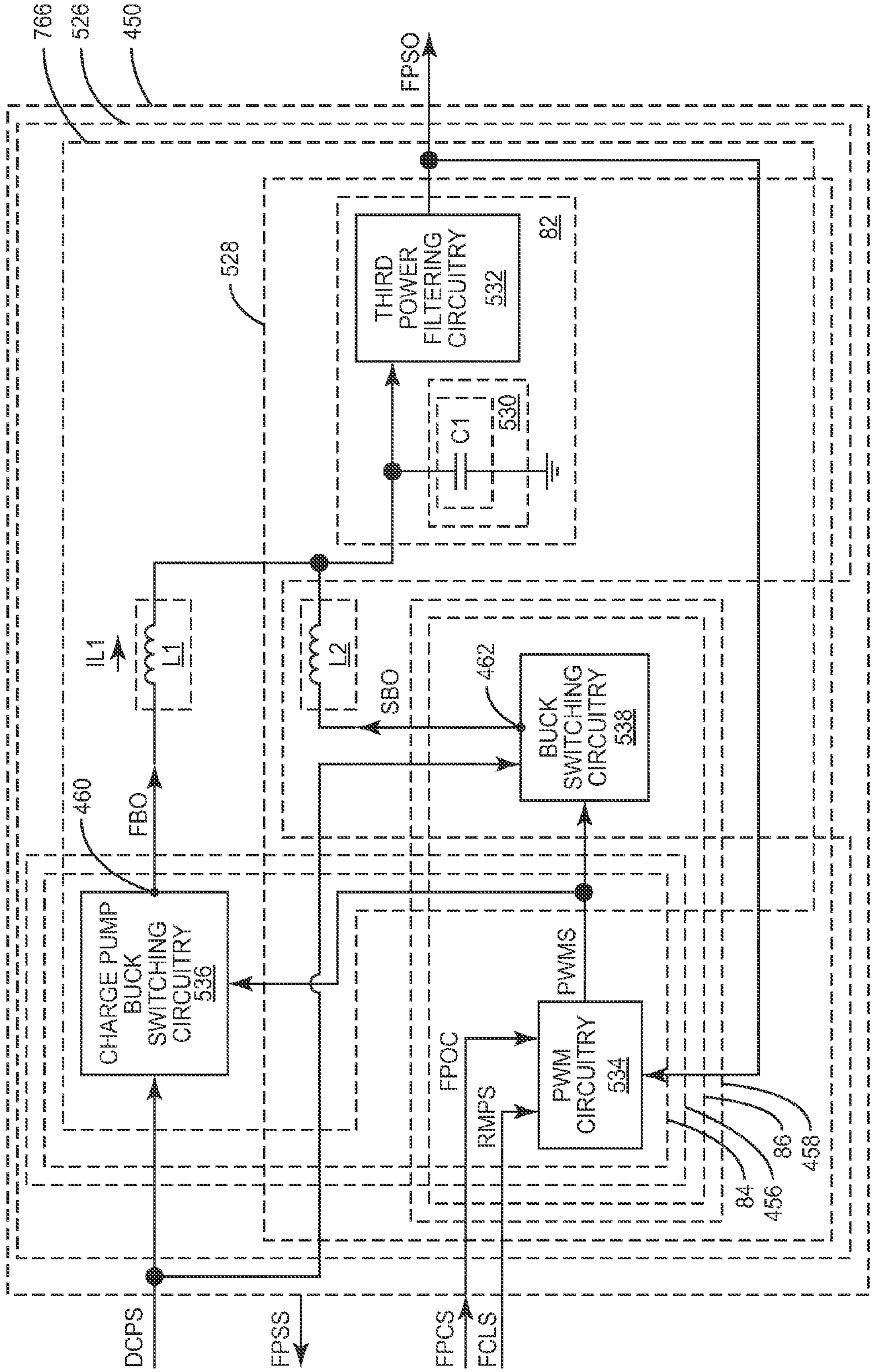

FIG. 110 shows details of the first switching power supply illustrated in FIG. 74 according to one embodiment of the first switching power supply.

Figure 111:
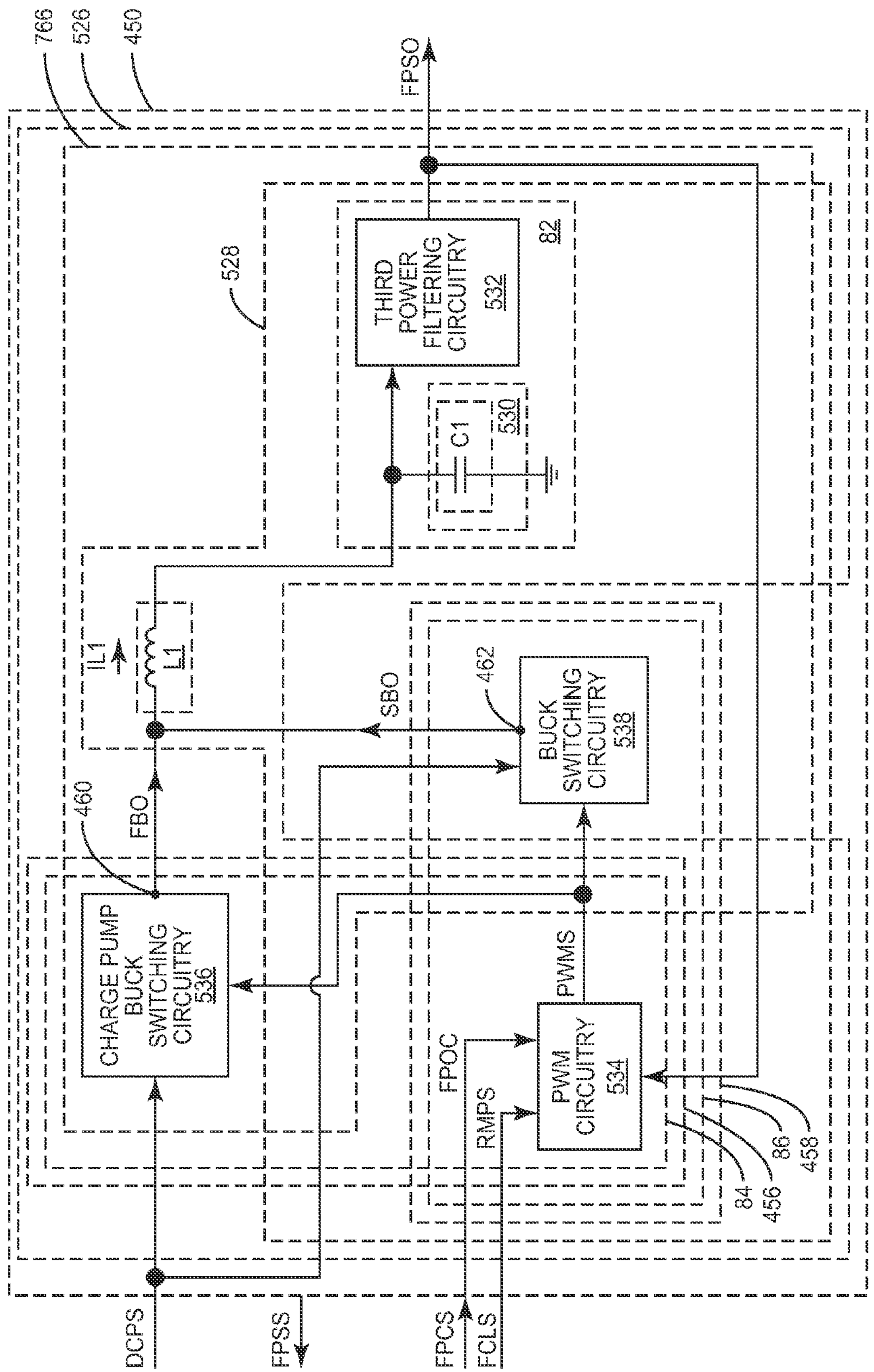

FIG. 111 shows details of the first switching power supply illustrated in FIG. 74 according to an alternate embodiment of the first switching power supply.

Figure 112:
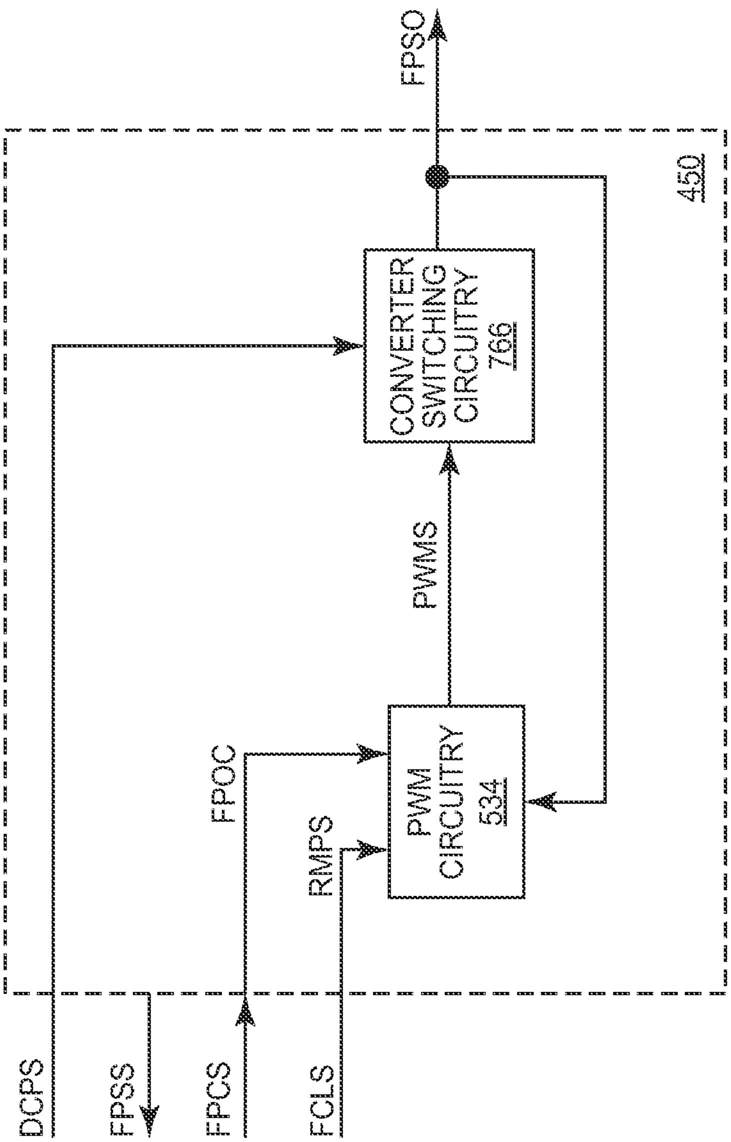

FIG. 112 shows details of the first switching power supply illustrated in FIG. 74 according to an additional embodiment of the first switching power supply.

Figure 113:
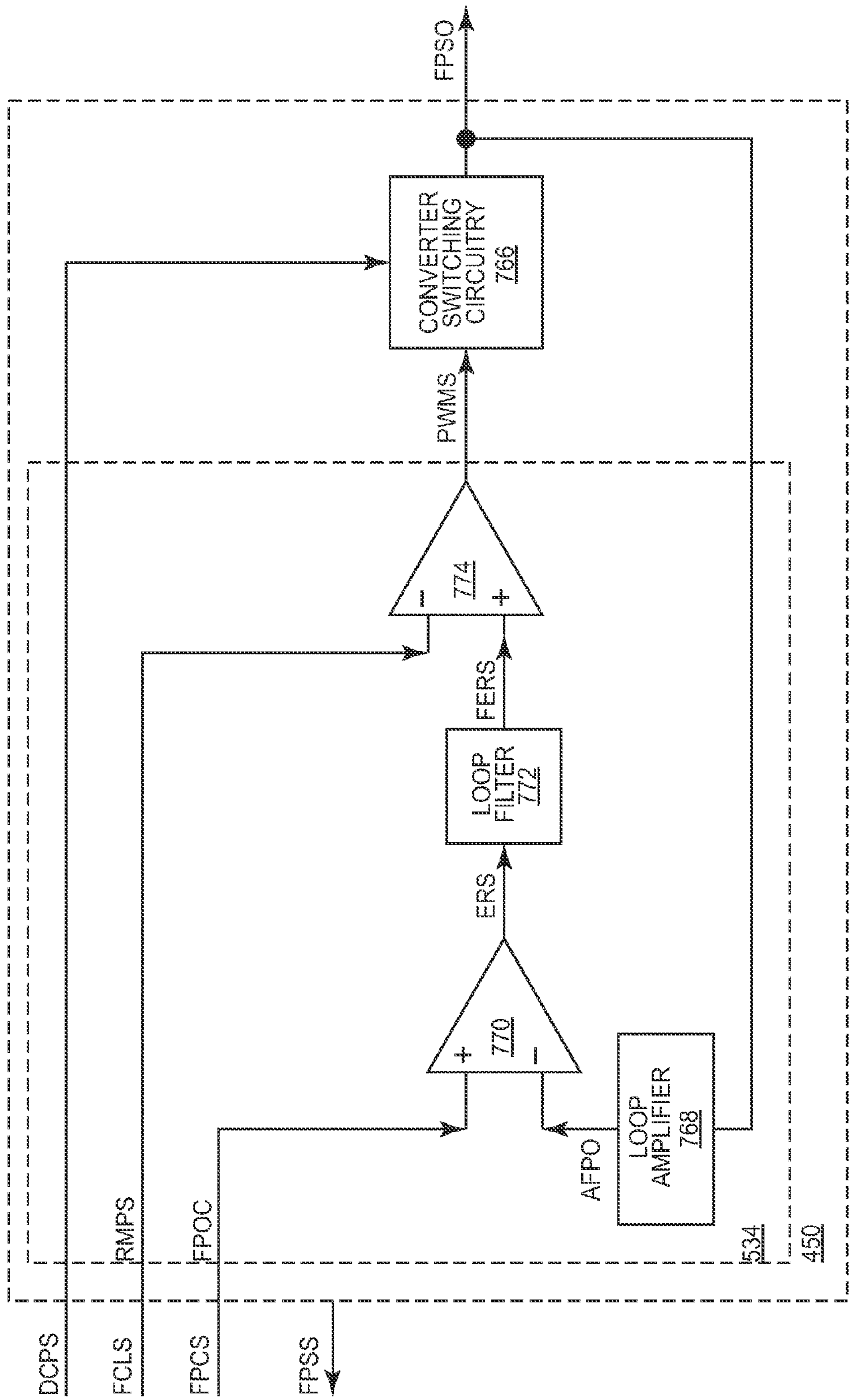

FIG. 113 shows details of PWM circuitry illustrated in FIG. 112 according to one embodiment of the PWM circuitry.

Figure 114A:
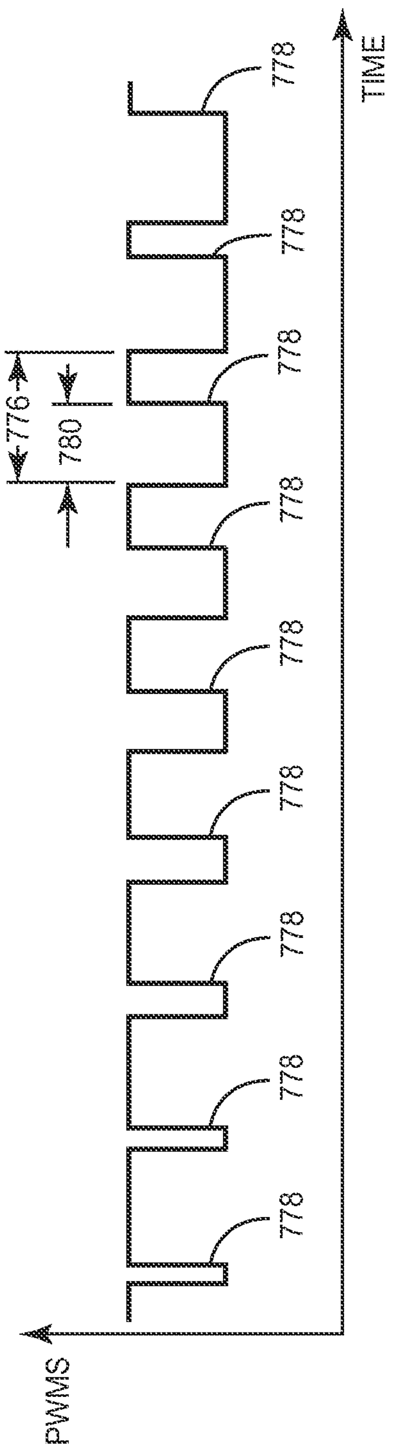
Figure 114B:
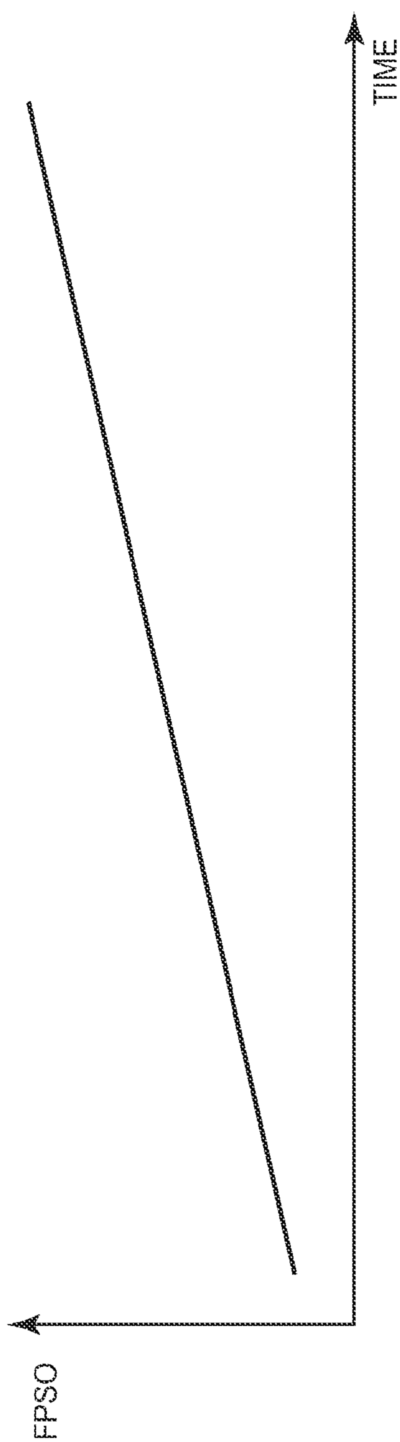

FIG. 114A and FIG. 114B are graphs showing a relationship between a PWM signal and a first switching power supply output signal, respectively, according to one embodiment of the first switching power supply.

Figure 115:
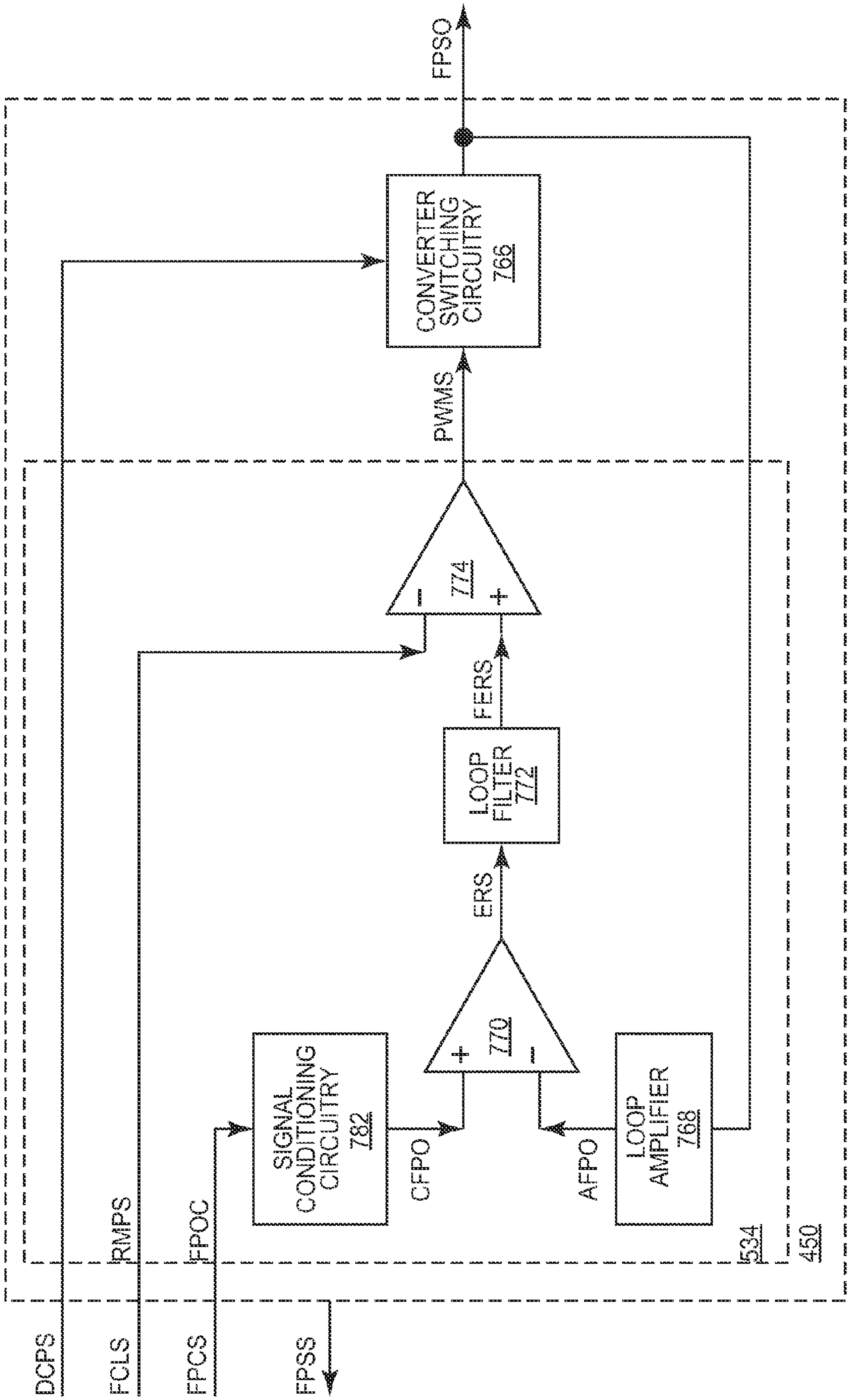

FIG. 115 shows details of the PWM circuitry illustrated in FIG. 112 according to an alternate embodiment of the PWM circuitry.

Figure 116:
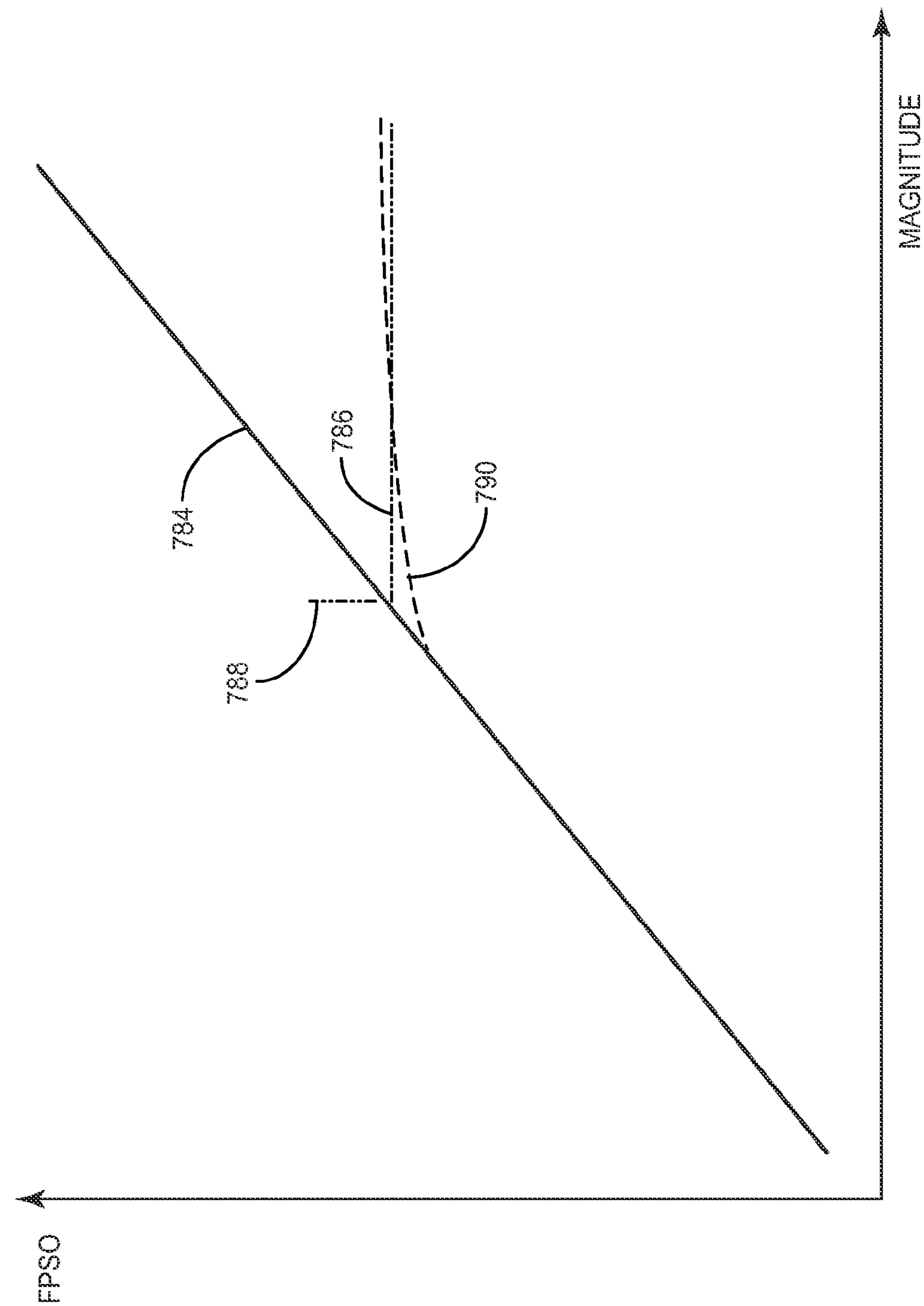

FIG. 116 is a graph showing an unlimited embodiment of a first power supply output control signal, a hard limited embodiment of the conditioned first power supply output control signal based on a limit threshold, and a soft limited embodiment of the conditioned first power supply output control signal based on the limit threshold according to one embodiment of the first switching power supply illustrated in FIG. 115.

Figure 117A:
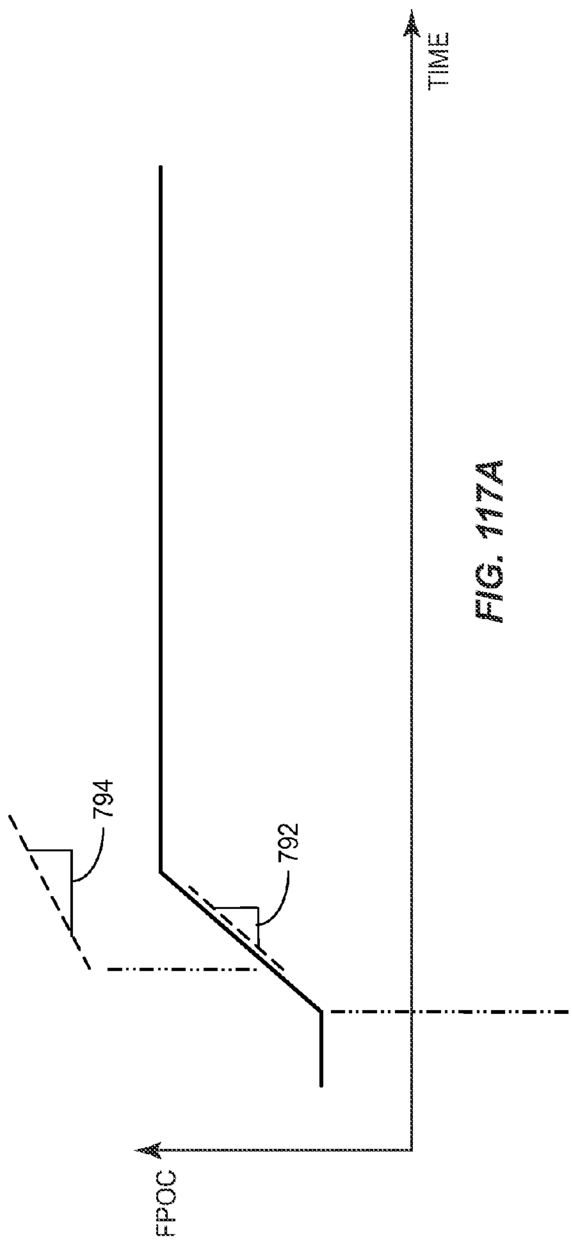
Figure 117B:
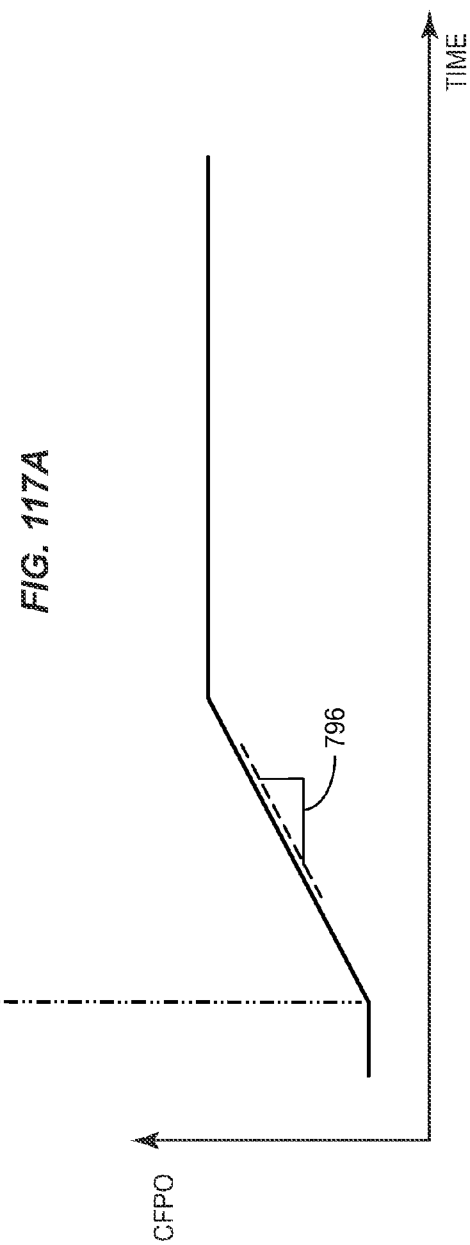

FIG. 117A and FIG. 117B are graphs illustrating the first power supply output control signal and a conditioned first power supply output control signal, respectively, illustrated in FIG. 115, according to one embodiment of the first switching power supply.

Figure 118:
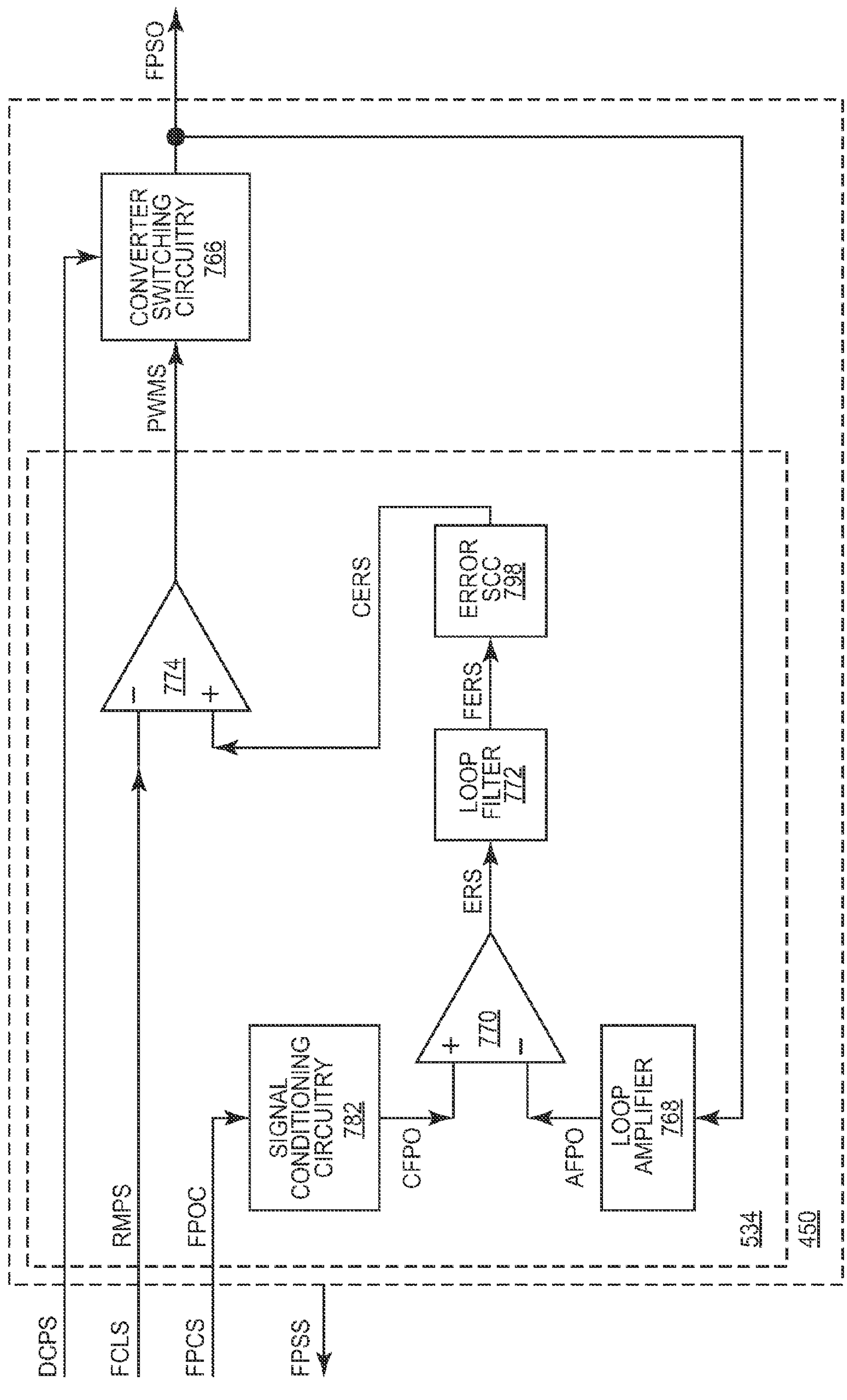

FIG. 118 shows details of the PWM circuitry illustrated in FIG. 112 according to another embodiment of the PWM circuitry.

Figure 119A:
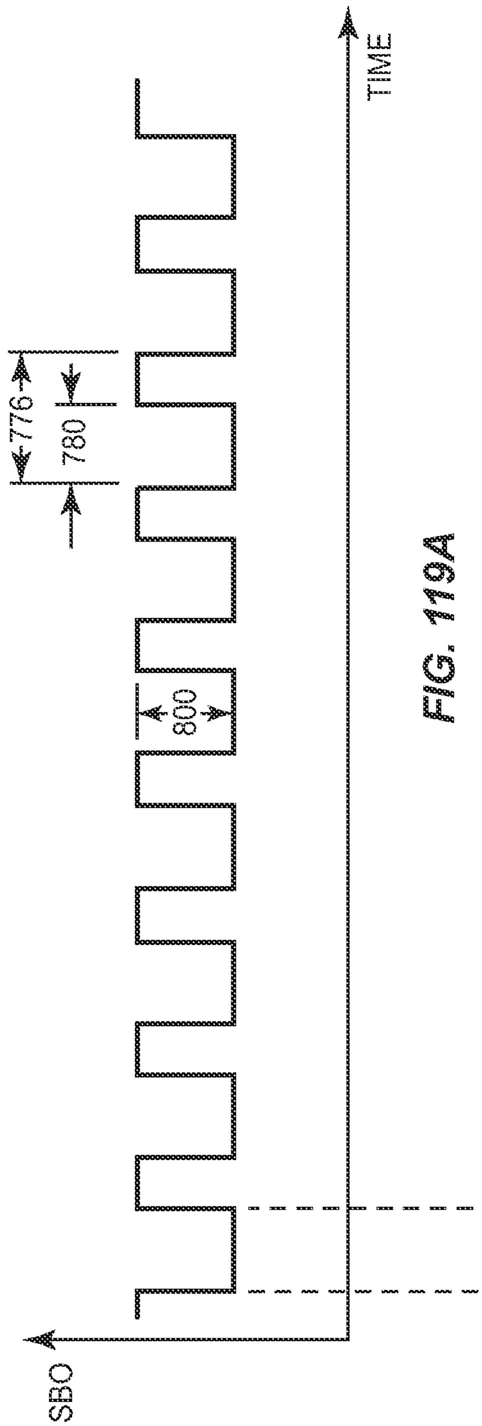
Figure 119B:
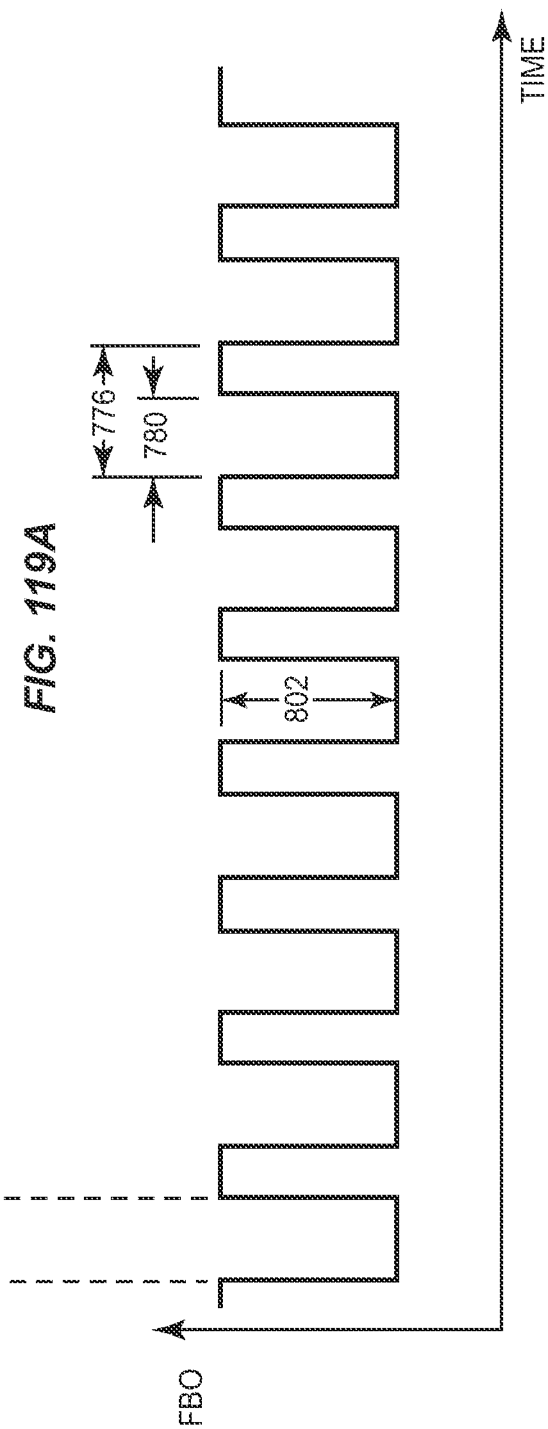

FIG. 119A and FIG. 119B are graphs showing a second buck output signal and a first buck output signal, respectively, illustrated in FIG. 89 according to one embodiment of the first switching power supply.

Figure 120:
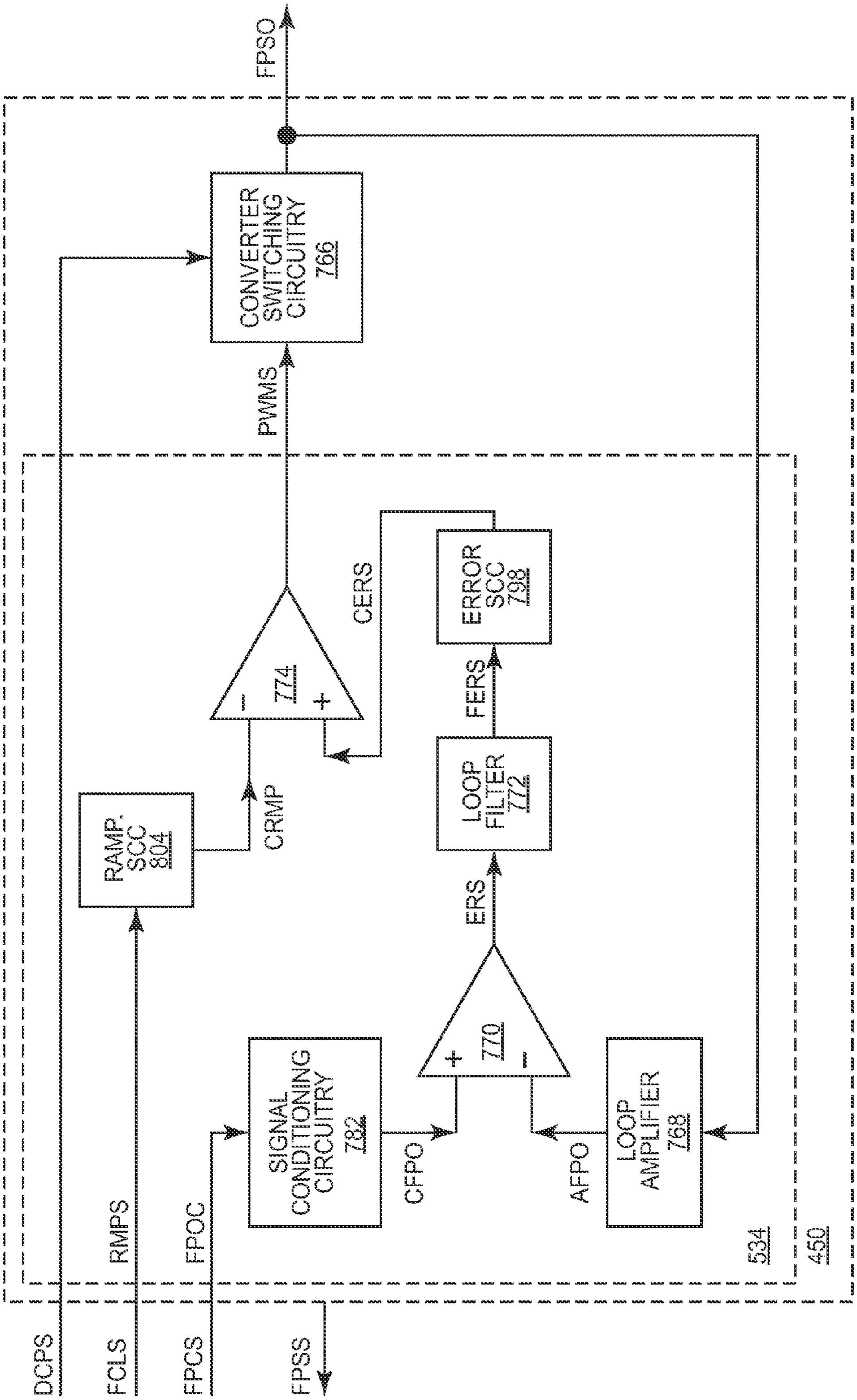

FIG. 120 shows details of the PWM circuitry illustrated in FIG. 112 according to one embodiment of the PWM circuitry.

Figure 121:
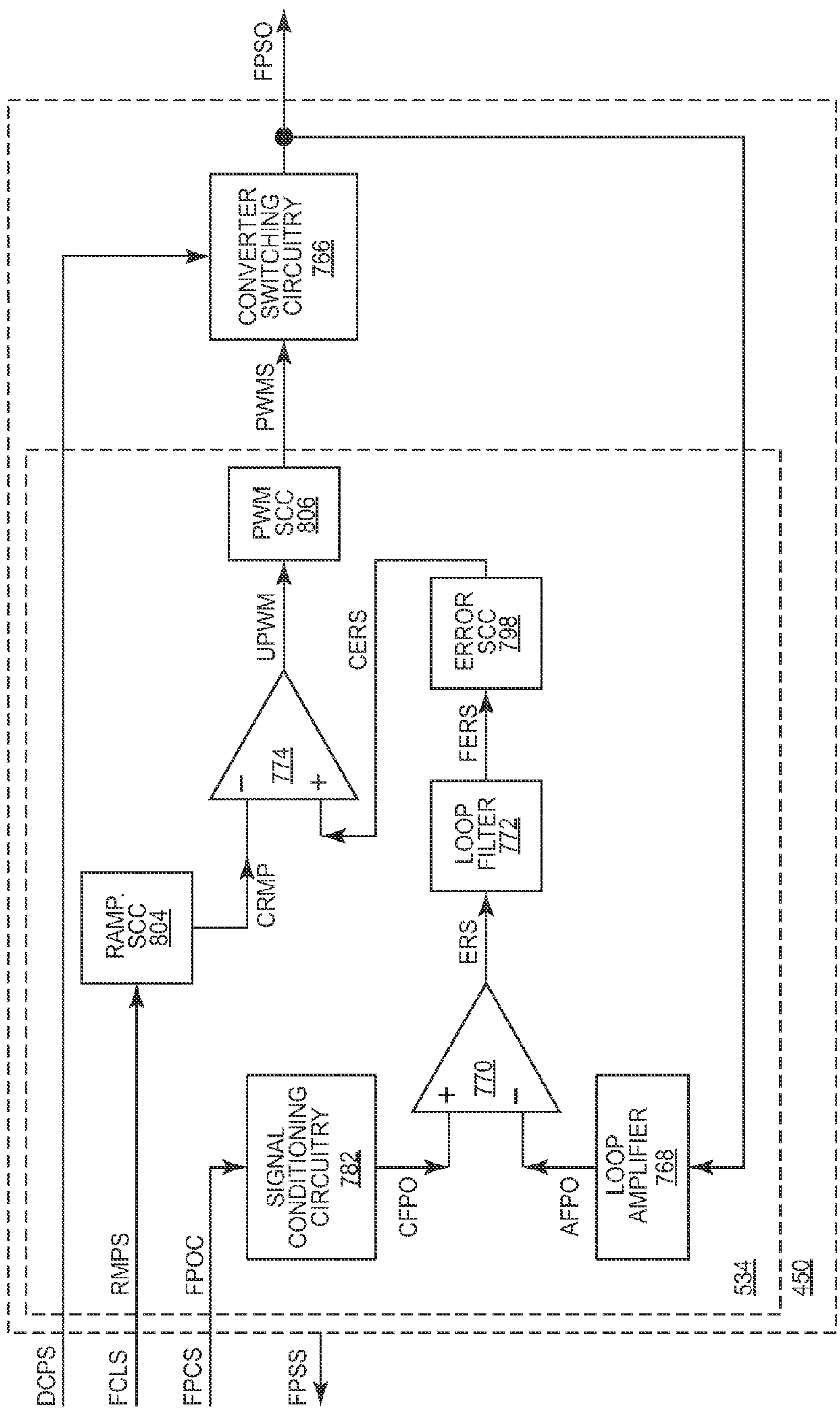

FIG. 121 shows details of the PWM circuitry illustrated in FIG. 112 according to one embodiment of the PWM circuitry.

Figure 122A:
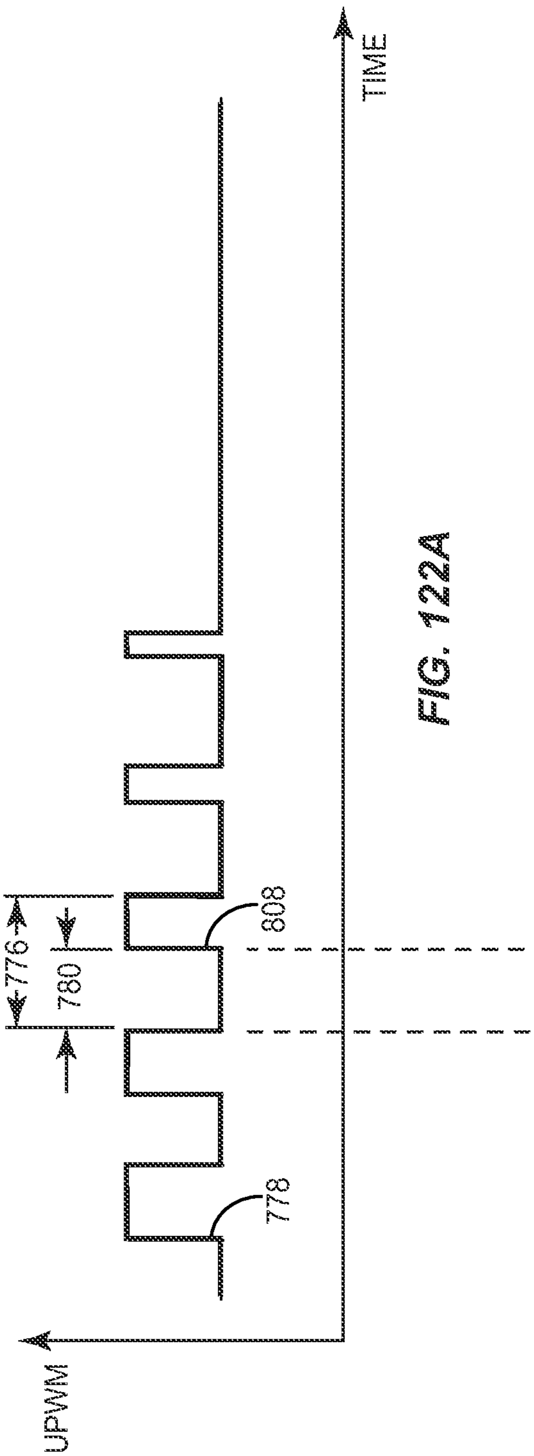
Figure 122B:
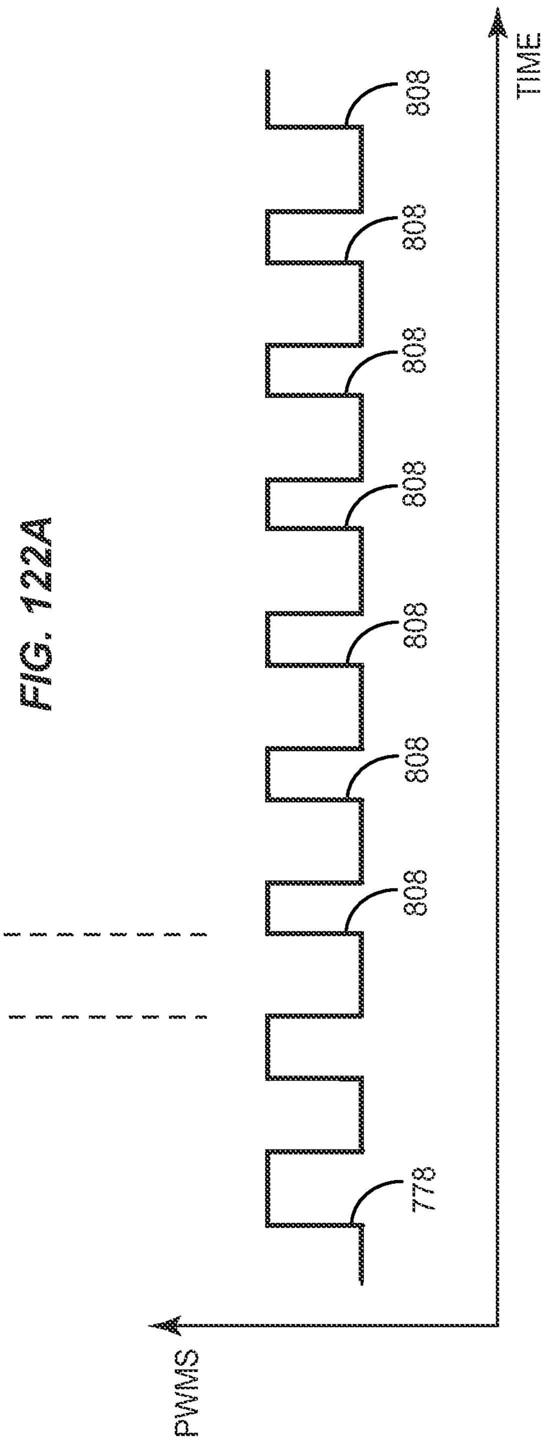

FIG. 122A and FIG. 122B are graphs showing an uncorrected PWM signal and a PWM signal, respectively, of the PWM circuitry illustrated in FIG. 121 according to one embodiment of the PWM circuitry.

Figure 123:
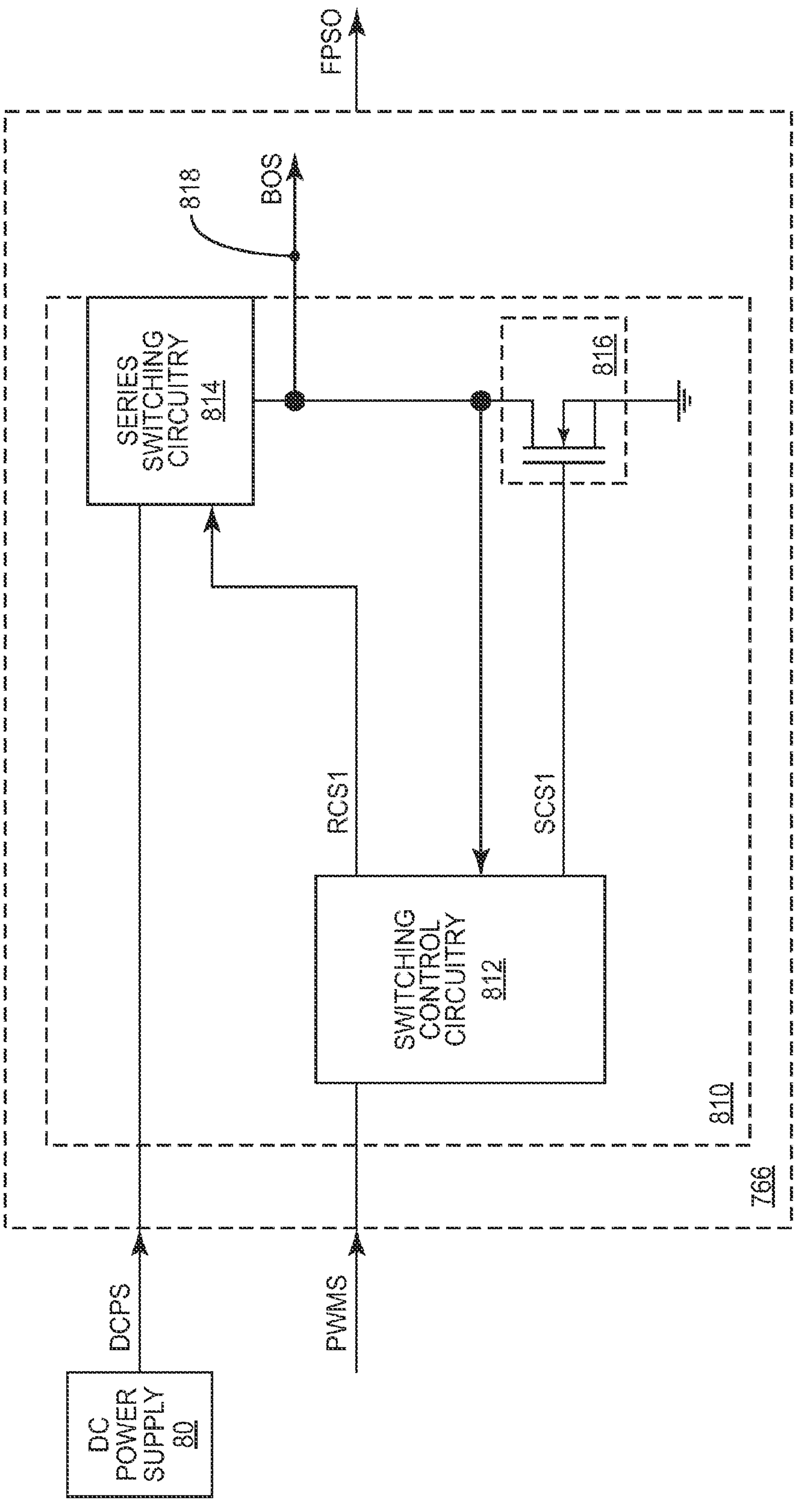

FIG. 123 shows a DC power supply illustrated in FIG. 74 and details of converter switching circuitry illustrated in FIG. 112 according to one embodiment of the converter switching circuitry.

Figure 124:
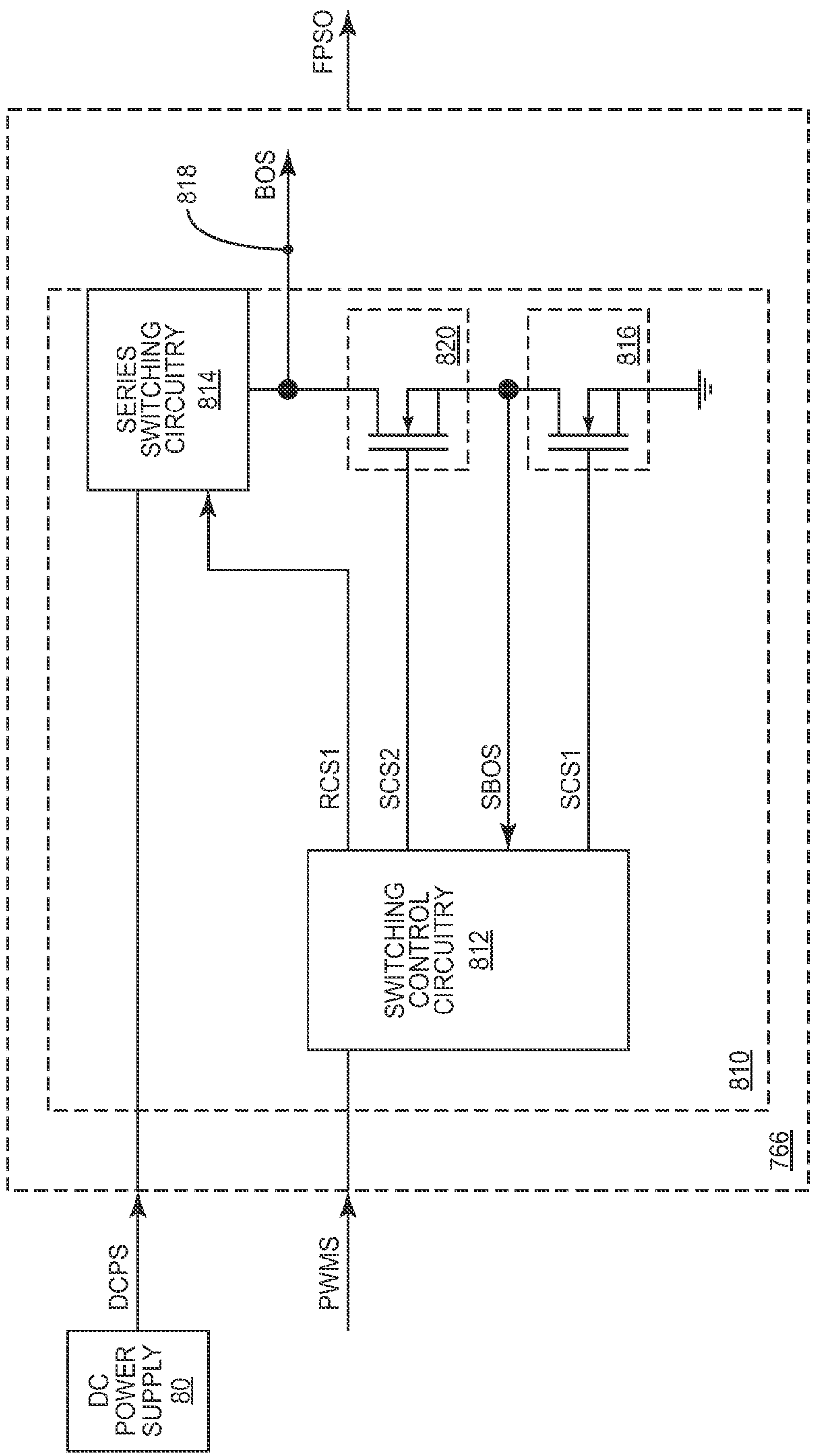

FIG. 124 shows the DC power supply illustrated in FIG. 74 and details of the converter switching circuitry illustrated in FIG. 112 according to an alternate embodiment of the converter switching circuitry.

Figure 125:
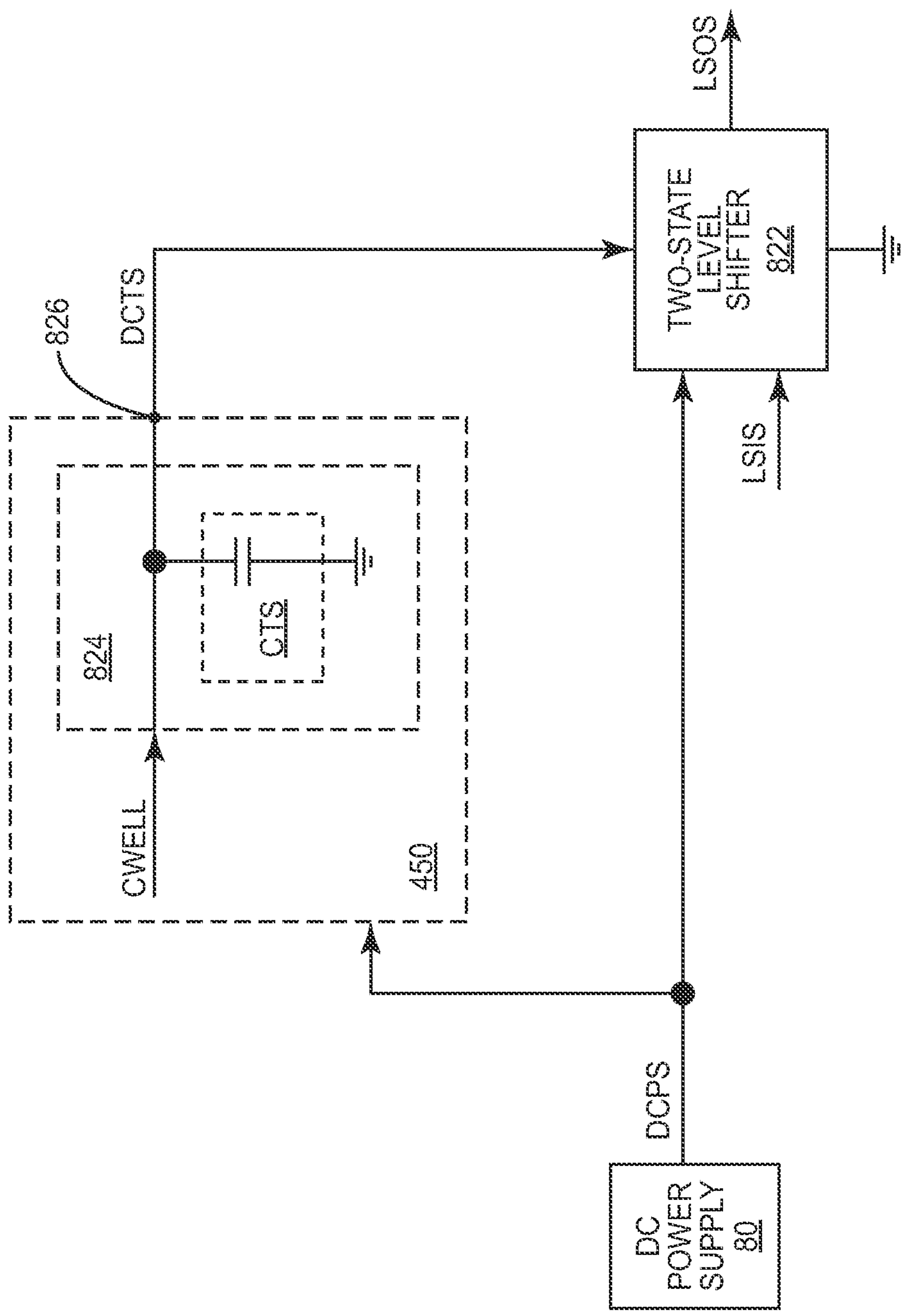

FIG. 125 shows details of the first switching power supply illustrated in FIG. 91, the DC power supply illustrated in FIG. 94, and a two-state level shifter according to one embodiment of the first switching power supply, the DC power supply, and the two-state level shifter.

Figure 126:
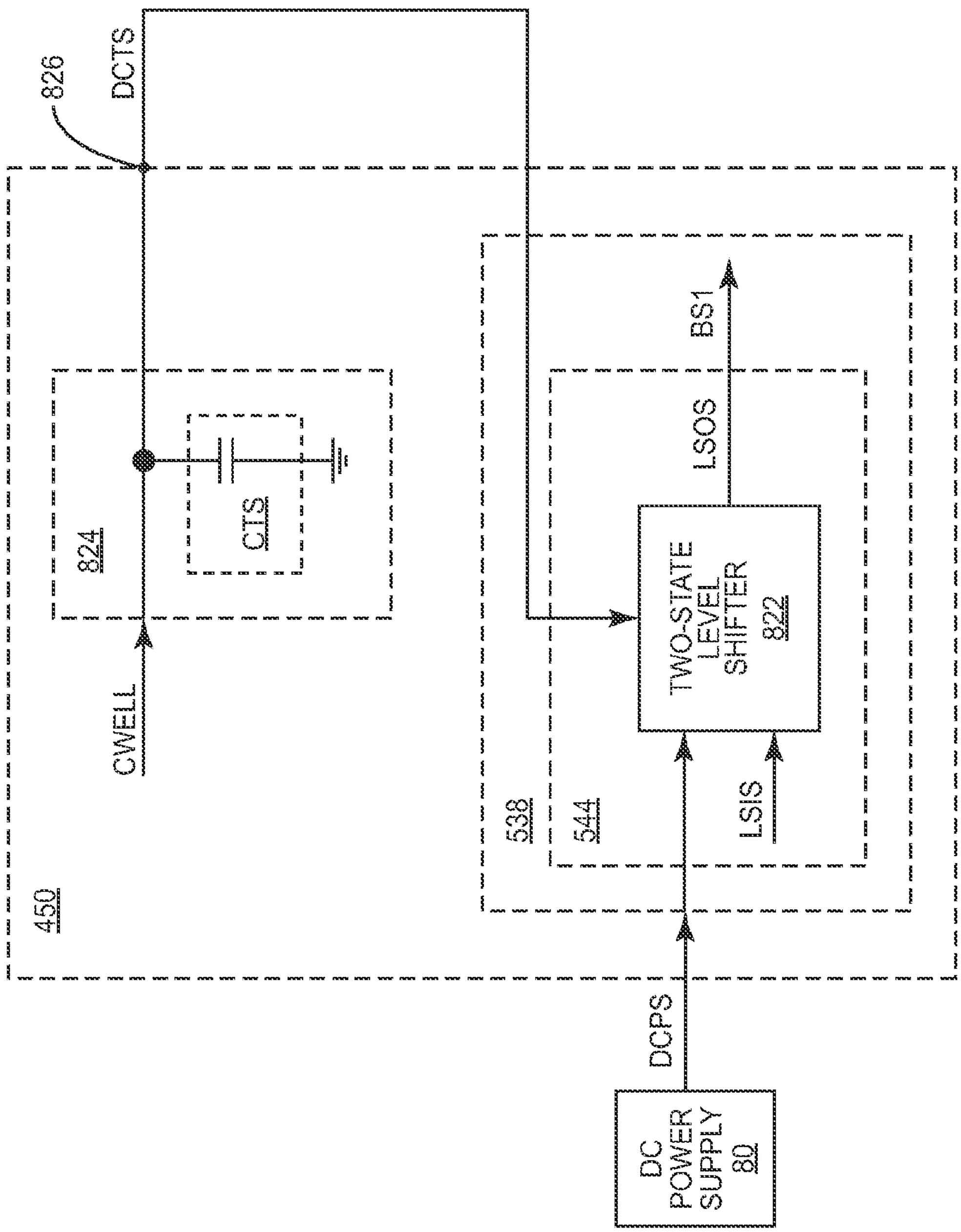

FIG. 126 shows details of the first switching power supply illustrated in FIG. 91 and the DC power supply illustrated in FIG. 94 according to an alternate embodiment of the first switching power supply.

Figure 127:
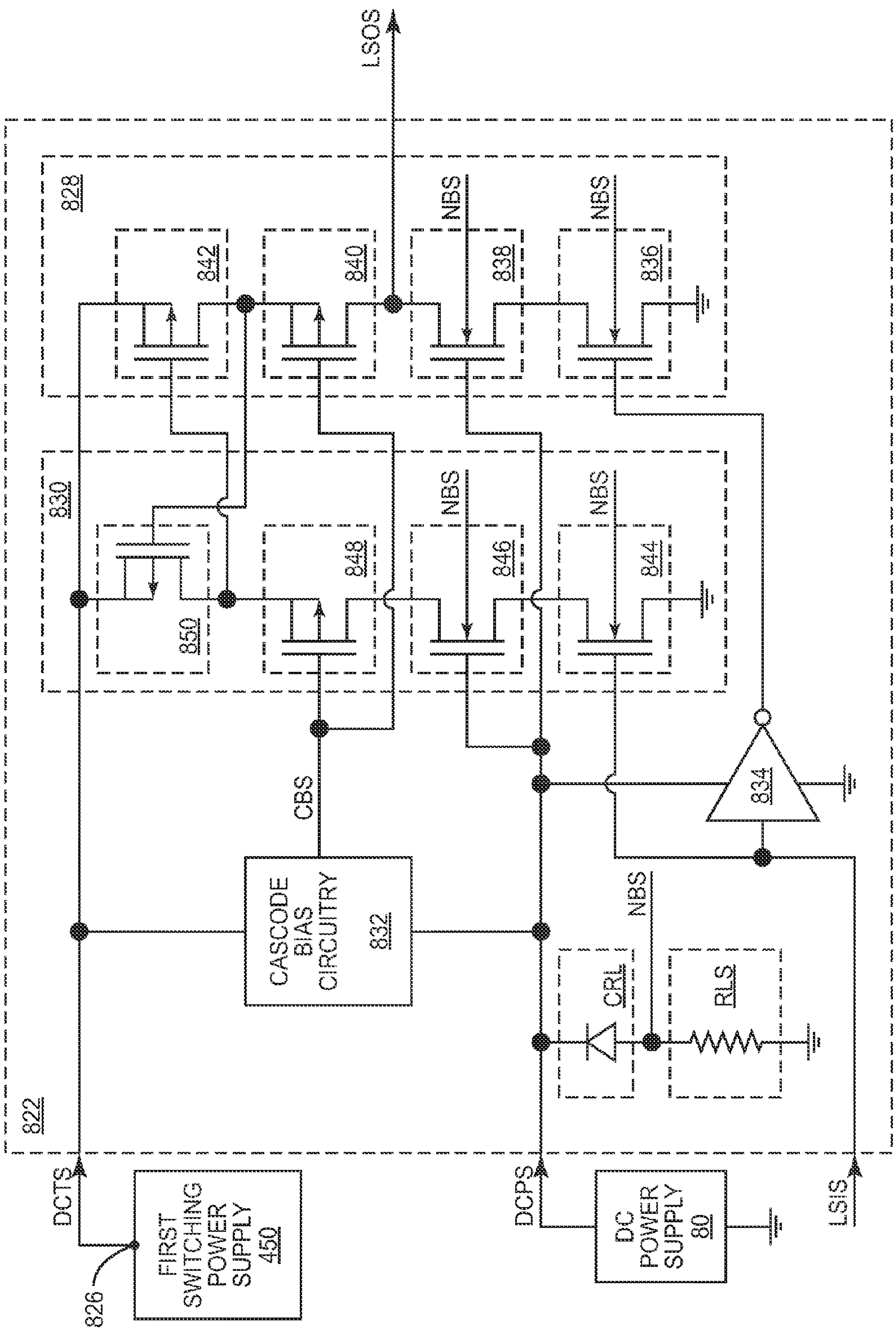

FIG. 127 shows details of the two-state level shifter illustrated in FIG. 125 according to one embodiment of the two-state level shifter.

Figure 128:
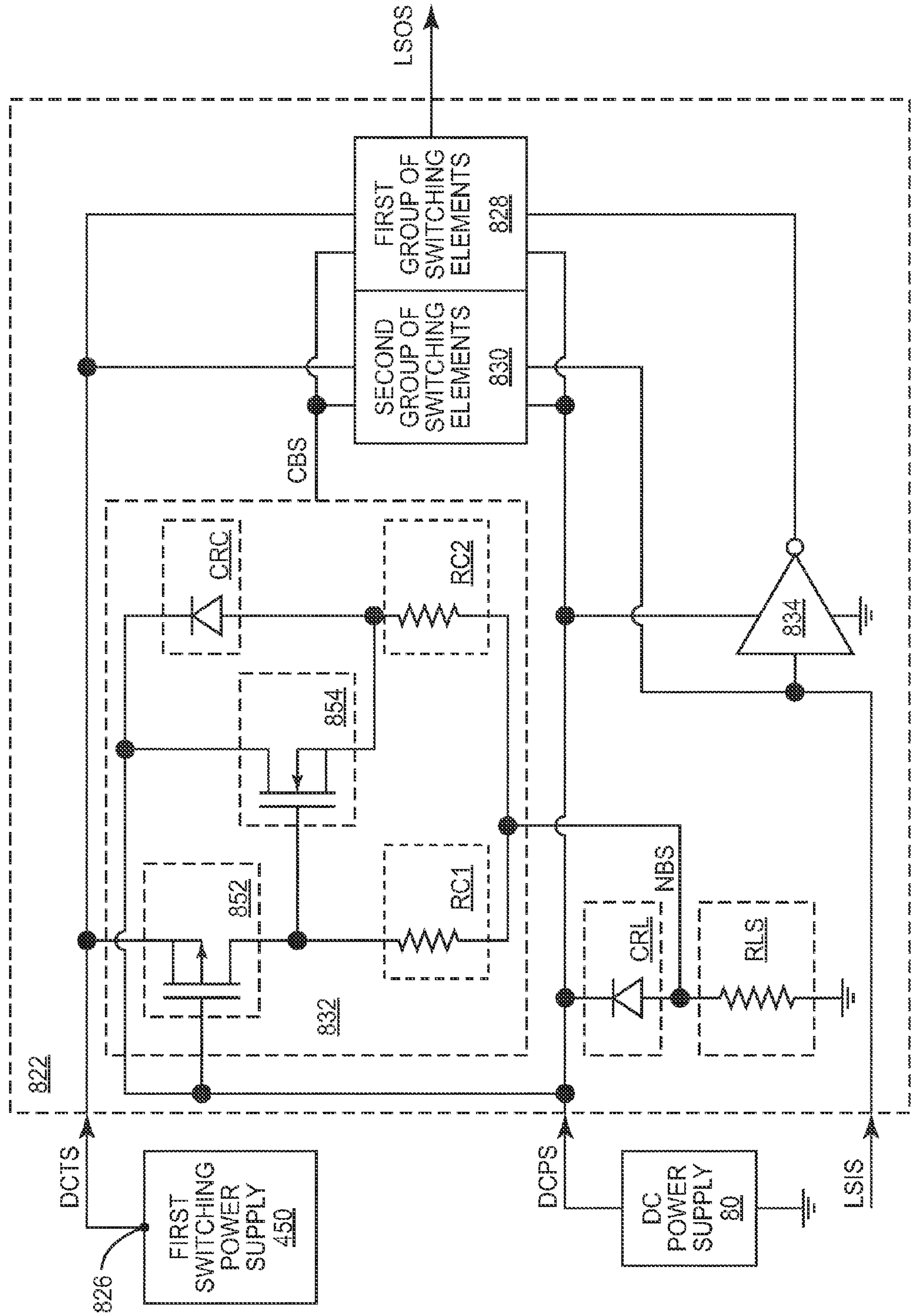

FIG. 128 shows details of cascode bias circuitry illustrated in FIG. 127 according to one embodiment of the cascode bias circuitry.

Figure 129:
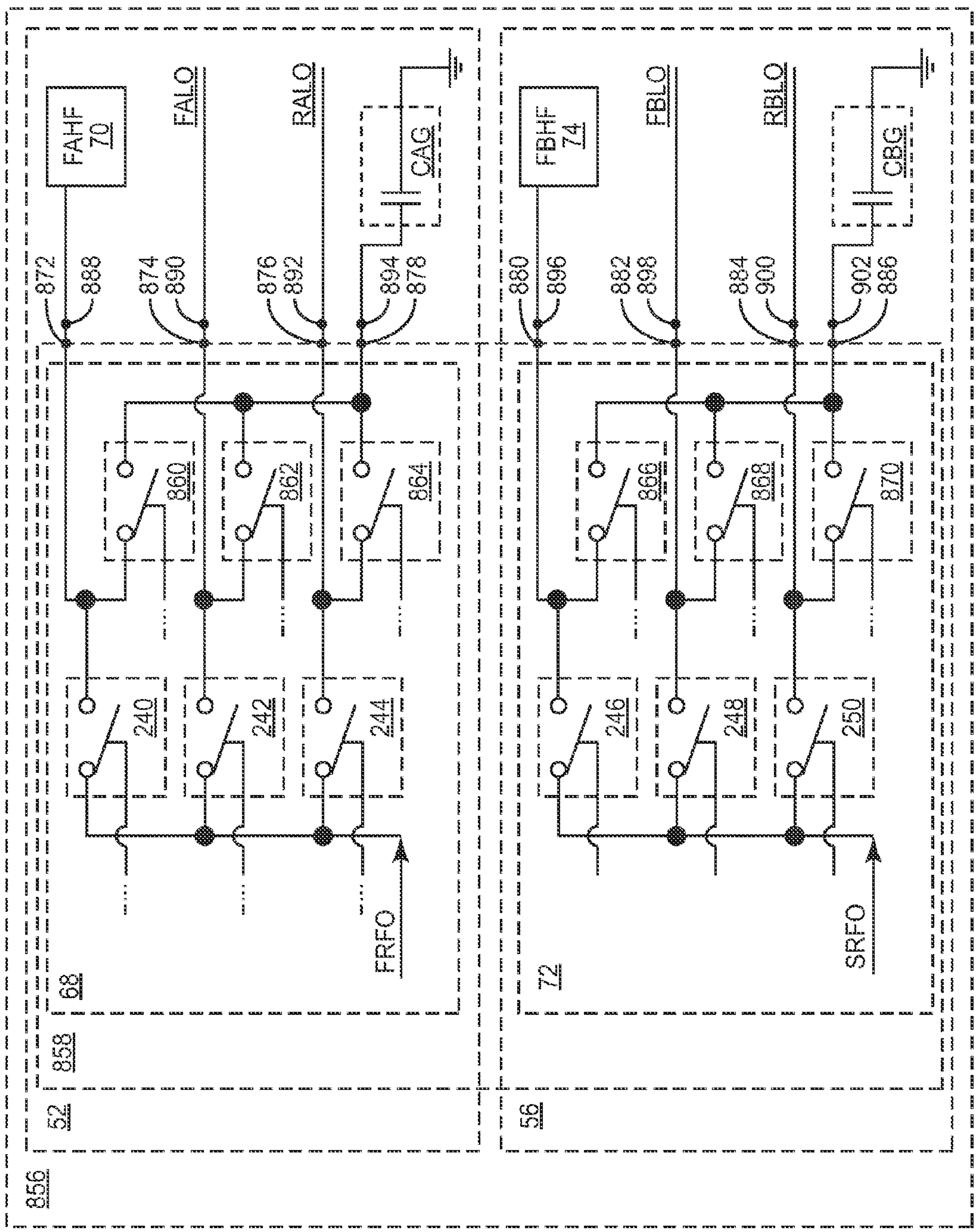

FIG. 129 is a schematic diagram showing details of alpha switching circuitry and beta switching circuitry illustrated in FIG. 39 according to one embodiment of the alpha switching circuitry and the beta switching circuitry.

Figure 130:
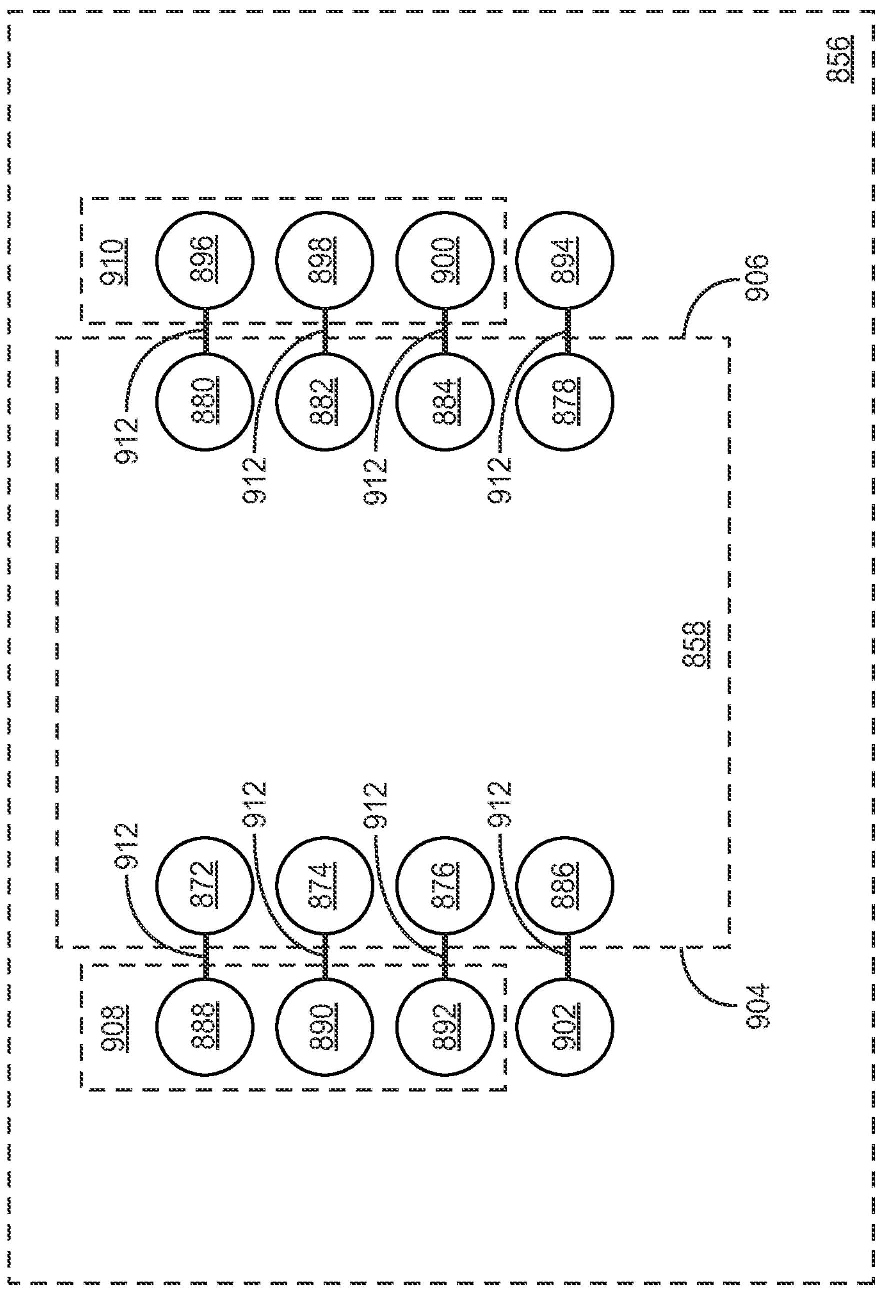

FIG. 130 shows a top view of an RF supporting structure illustrated in FIG. 129 according to one embodiment of the RF supporting structure.

Figure 131A:
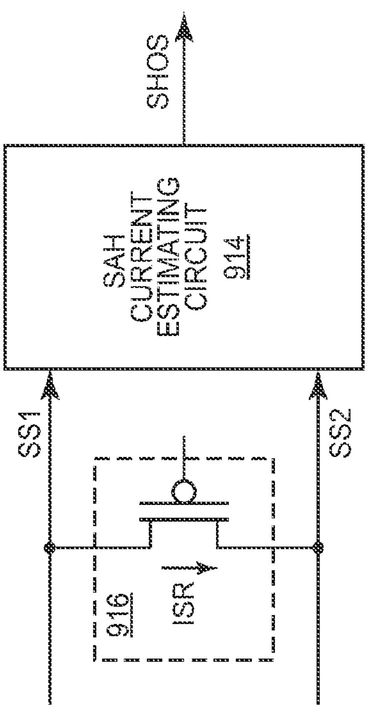

FIG. 131A shows a sample-and-hold (SAH) current estimating circuit and a series switching element according to one embodiment of the SAH current estimating circuit and the series switching element.

Figure 131B:
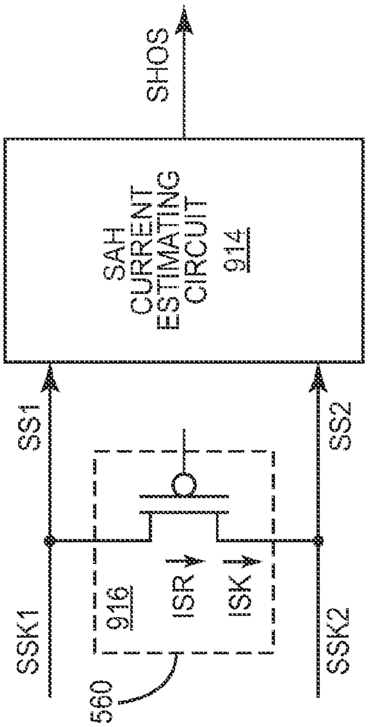

FIG. 131B shows the SAH current estimating circuit and the series switching element according to a first embodiment of the SAH current estimating circuit and the series switching element.

Figure 131C:
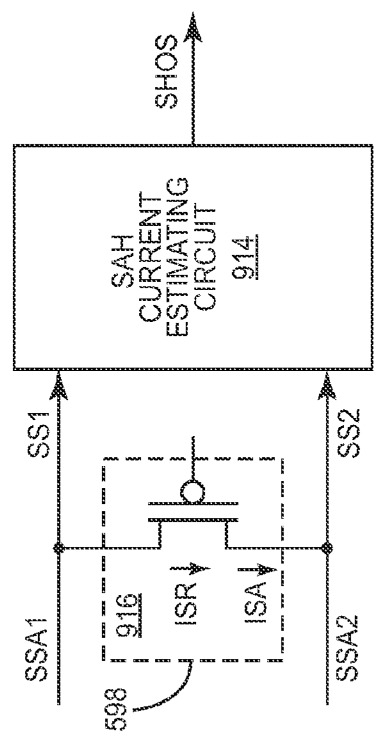

FIG. 131C shows the SAH current estimating circuit and the series switching element according to a second embodiment of the SAH current estimating circuit and the series switching element.

Figure 131D:
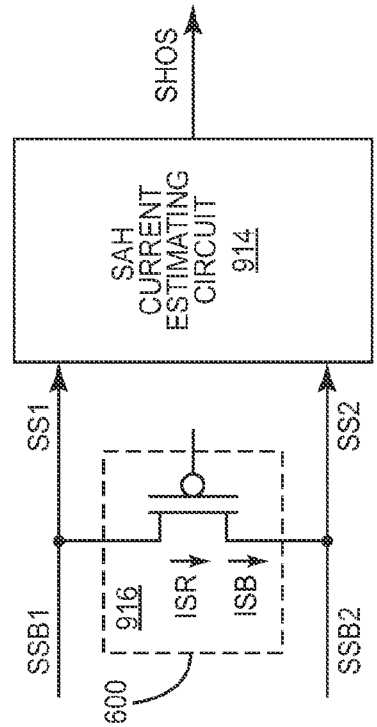

FIG. 131D shows the SAH current estimating circuit and the series switching element according to a third embodiment of the SAH current estimating circuit and the series switching element.

Figure 132:
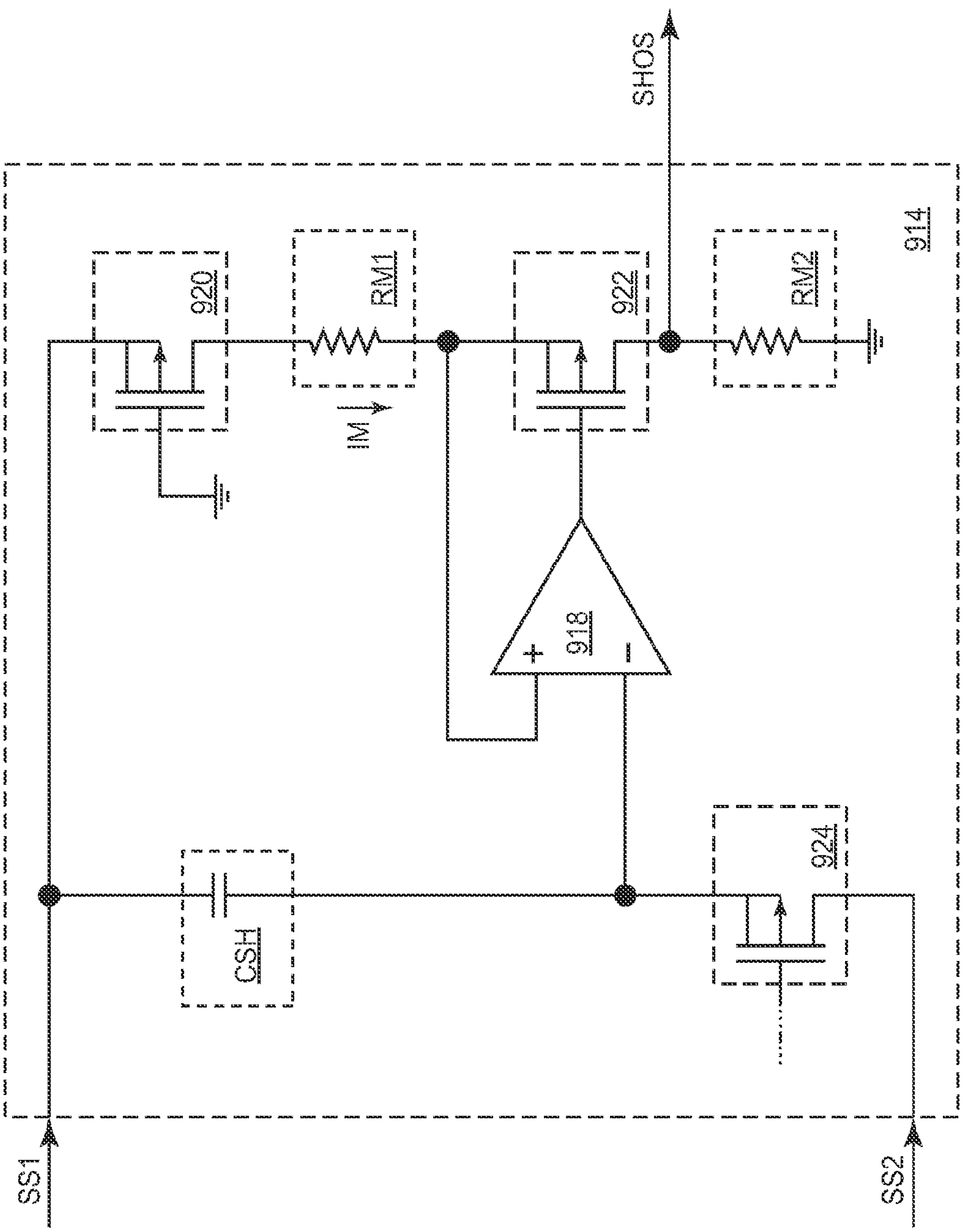

FIG. 132 shows details of the SAH current estimating circuit illustrated in FIG. 131A according to one embodiment of the SAH current estimating circuit.

Figure 133:
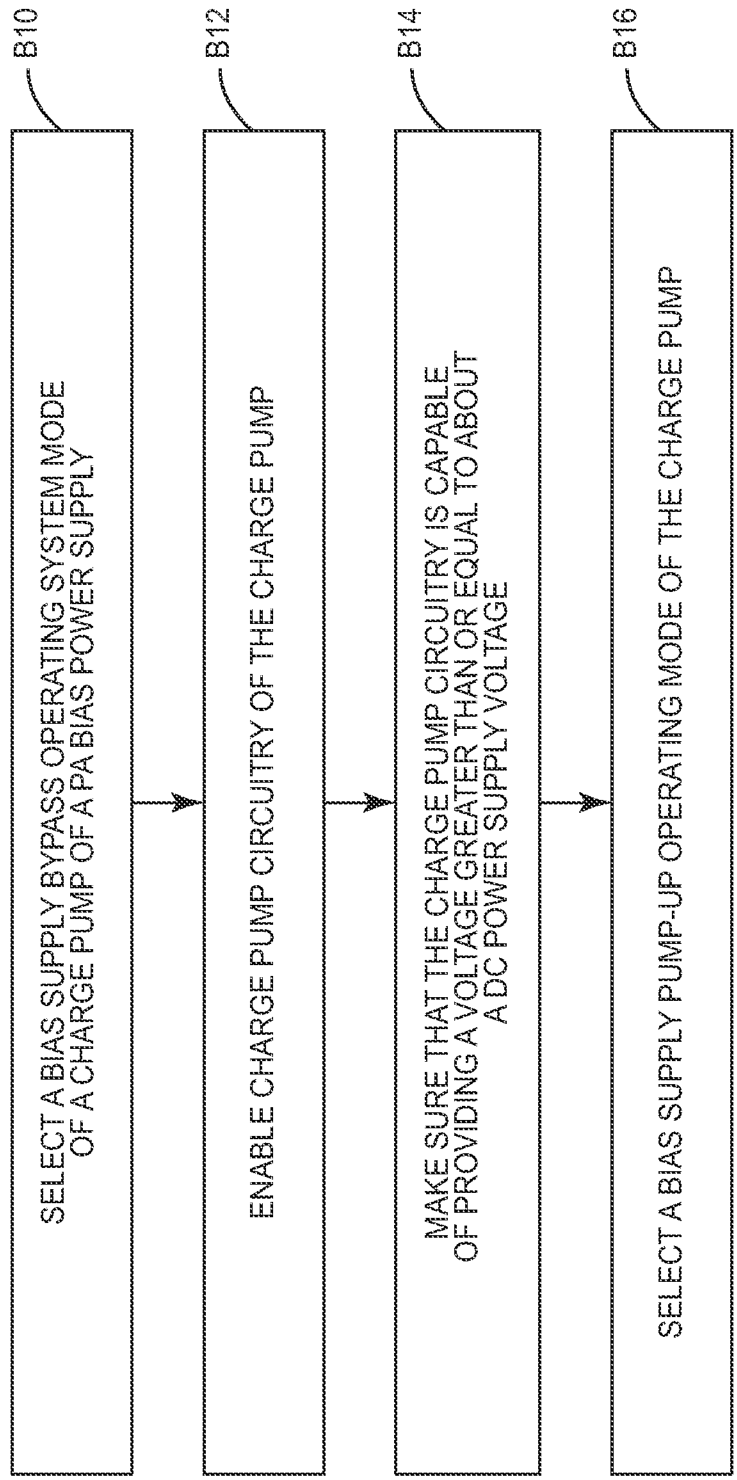

FIG. 133 shows a process for preventing undershoot disruption of a bias power supply signal illustrated in FIG. 44 according to one embodiment of the present disclosure.

Figure 134:
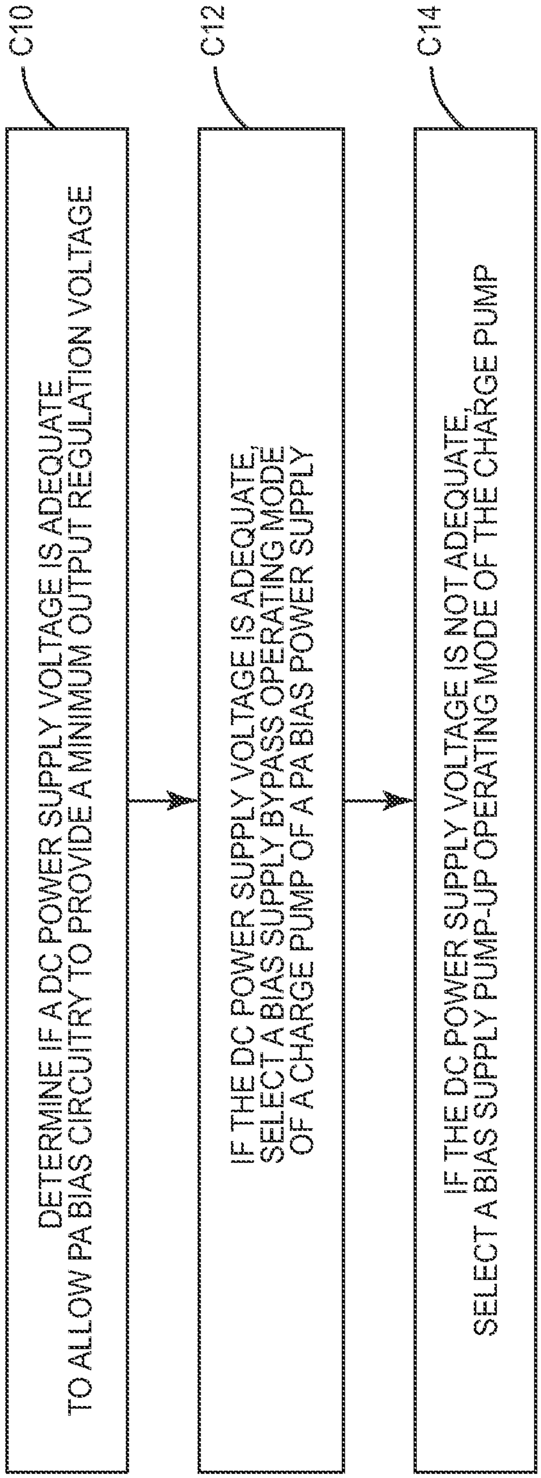

FIG. 134 shows a process for optimizing efficiency of a charge pump illustrated in FIG. 44 according to one embodiment of the present disclosure.

Figure 135:
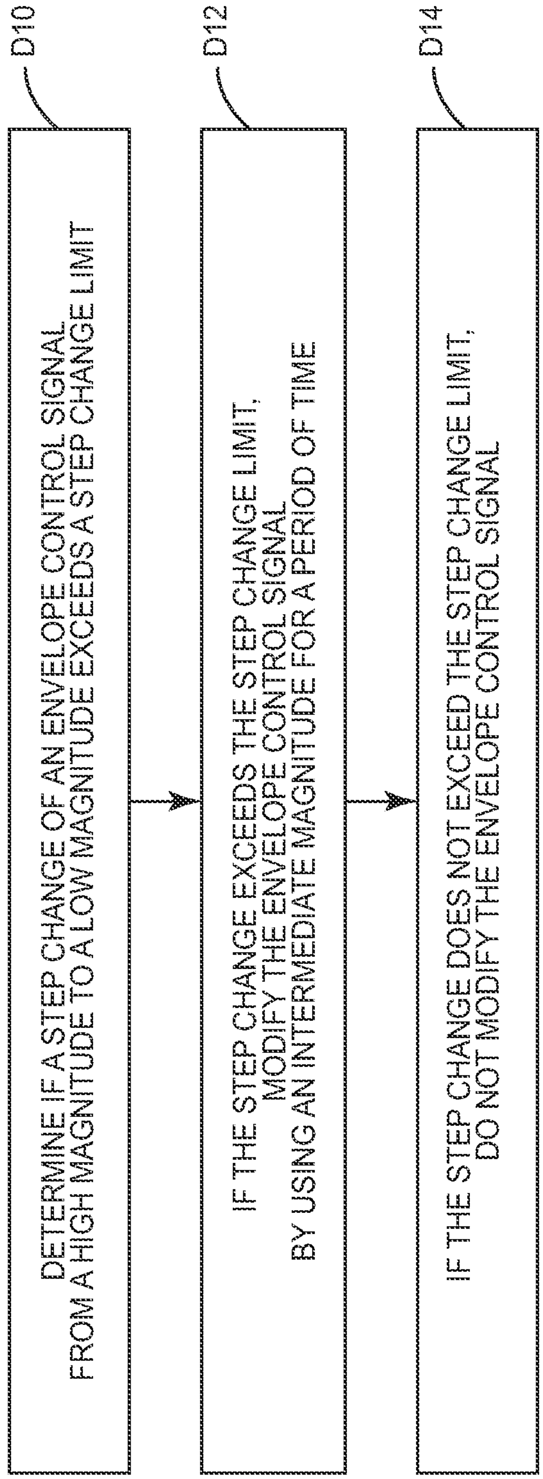

FIG. 135 shows a process for preventing undershoot of the PA envelope power supply illustrated in FIG. 43 according to one embodiment of the present disclosure.

Figure 136:
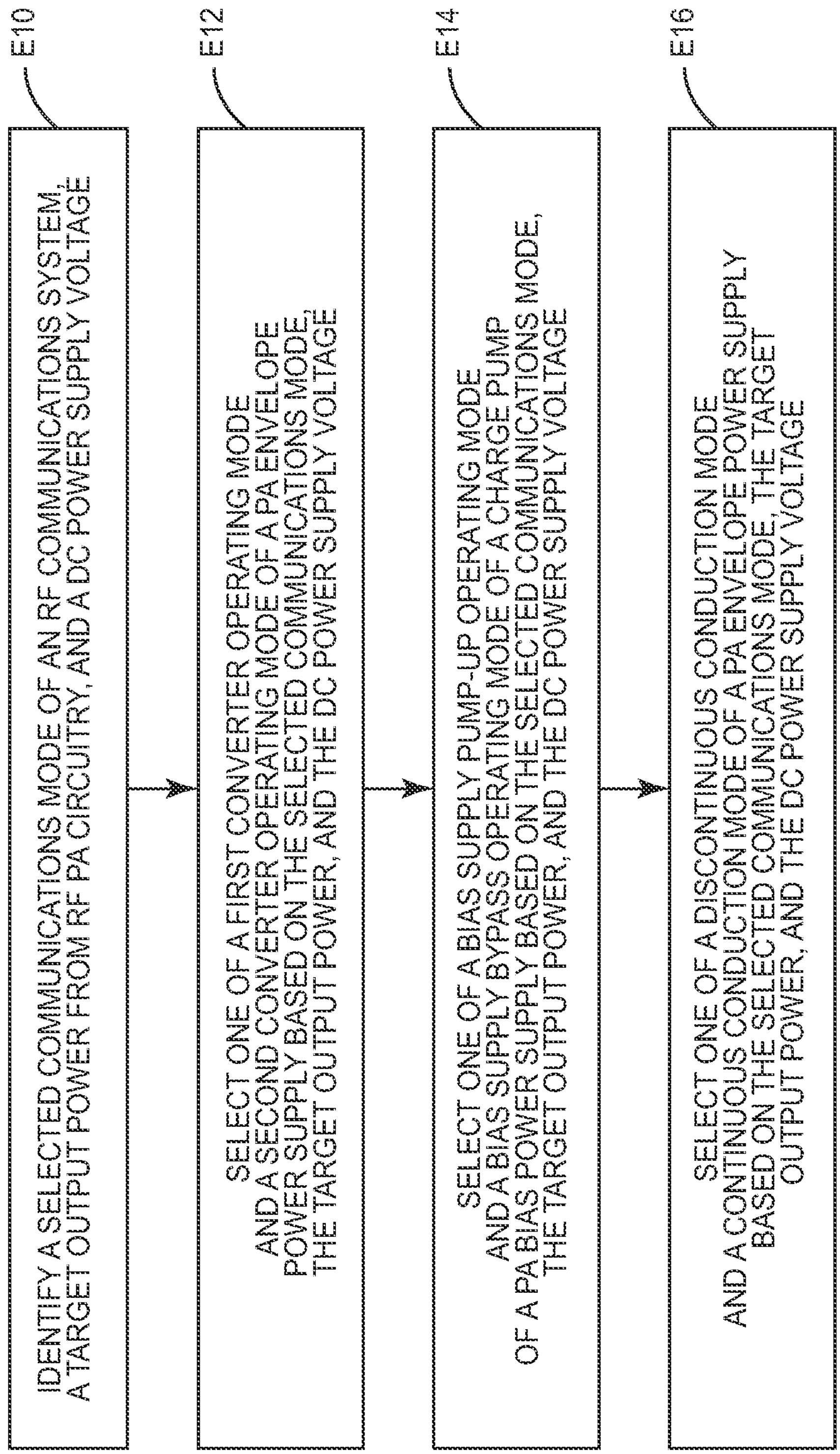

FIG. 136 shows a process for selecting a converter operating mode of the PA envelope power supply according to one embodiment of the present disclosure.

Figure 137:
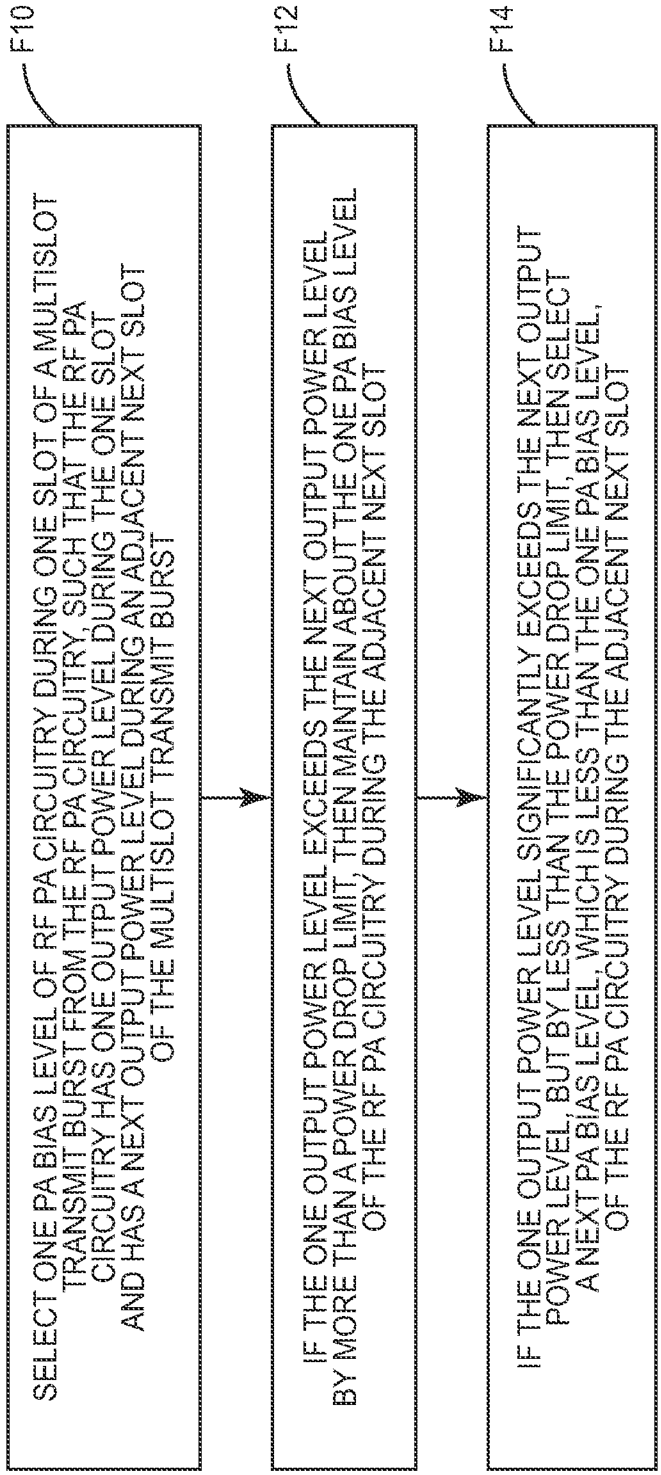

FIG. 137 shows a process for reducing output power drift that may result from significant output power drops from the RF PA circuitry during a multislot burst from the RF PA circuitry according to one embodiment of the present disclosure.

Figure 138:
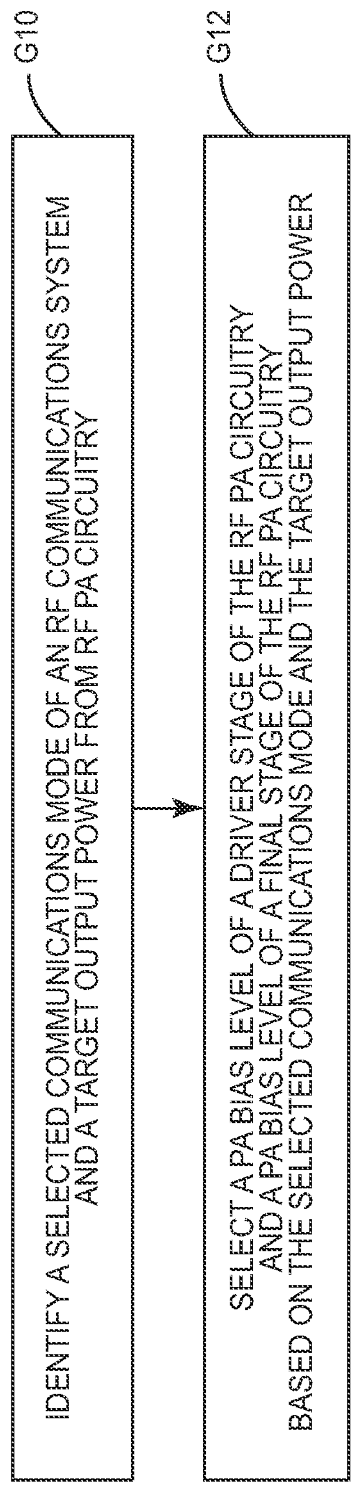

FIG. 138 shows a process for independently biasing a driver stage and a final stage of the RF PA circuitry according to one embodiment of the present disclosure.

Figure 139:
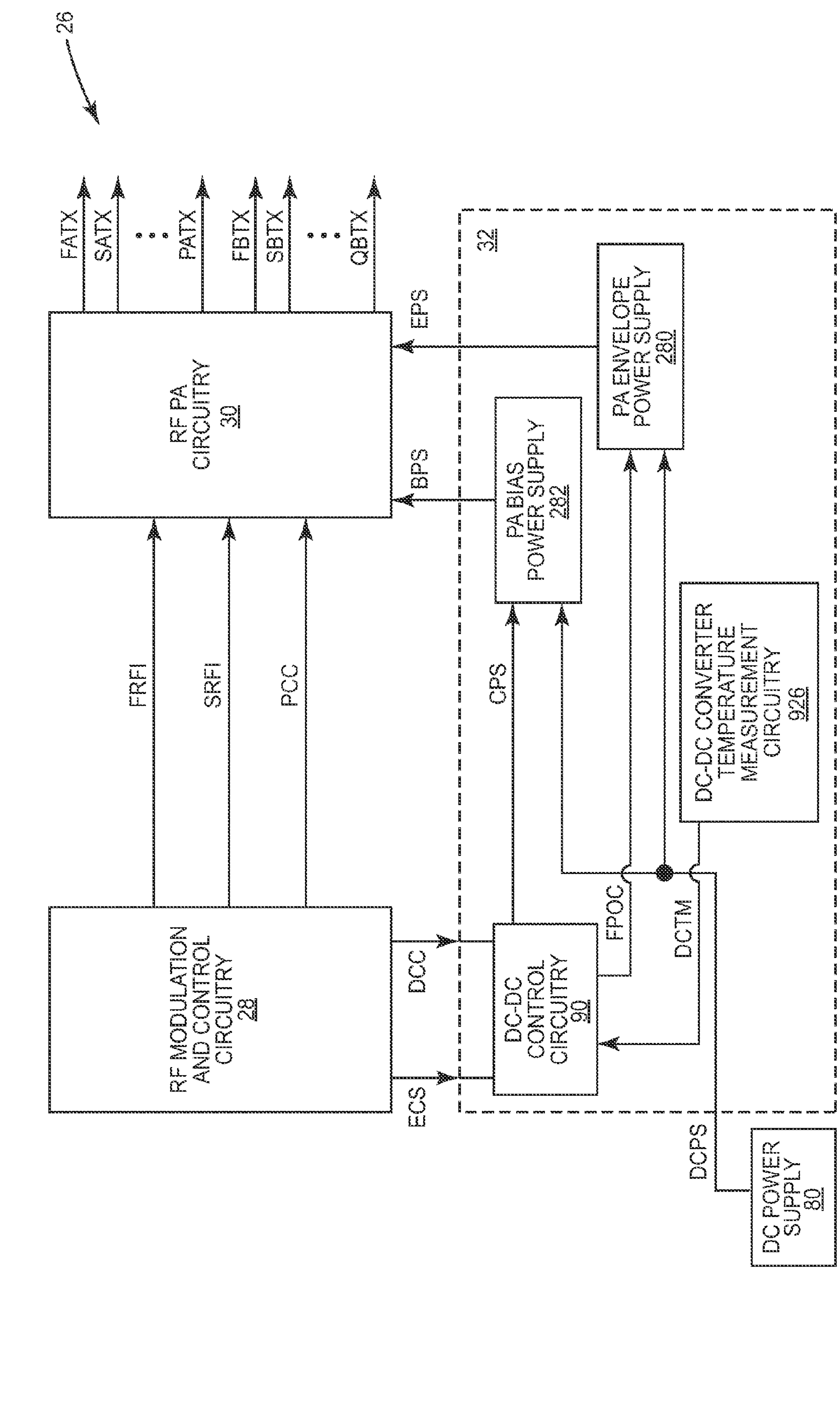

FIG. 139 shows the RF communications system according to one embodiment of the RF communications system.

Figure 140:
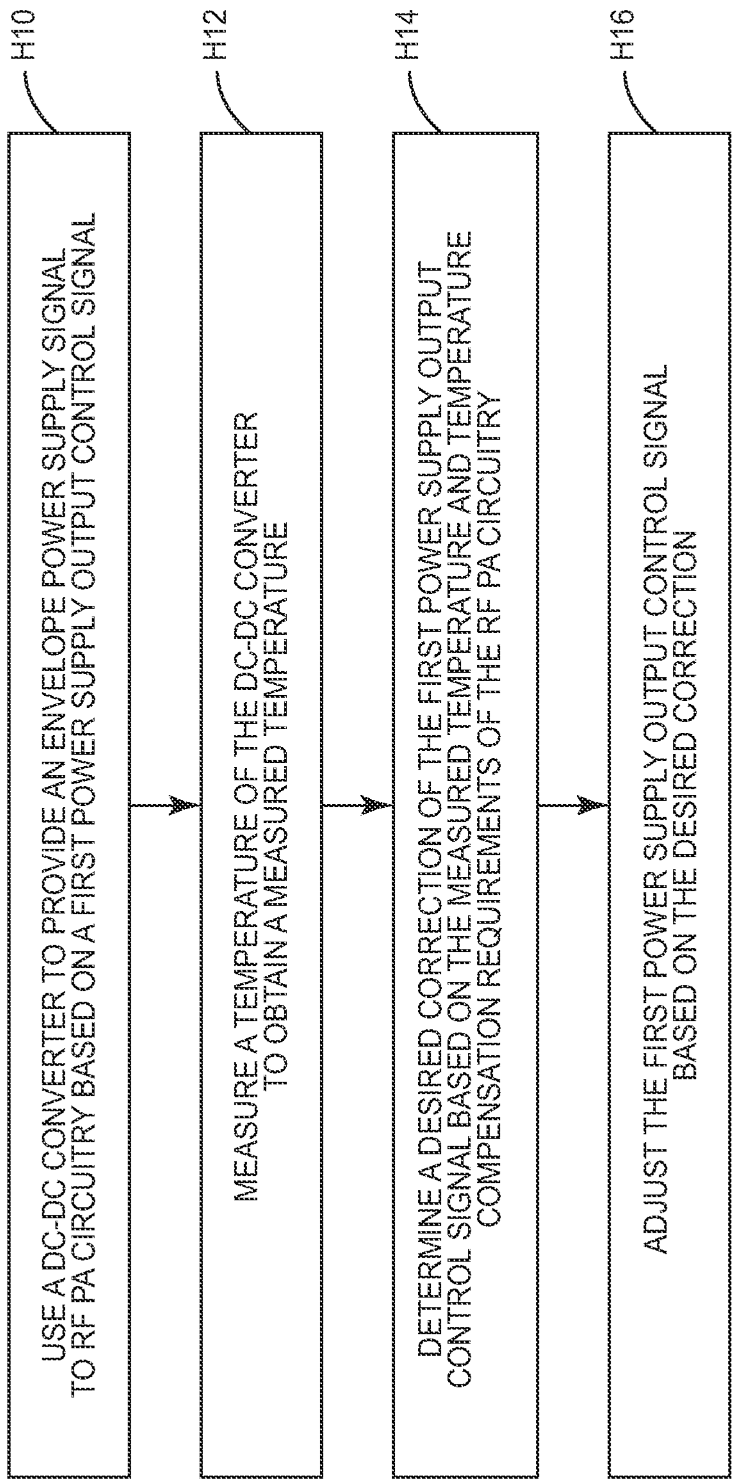

FIG. 140 shows a process for temperature correcting an envelope power supply signal to meet RF PA circuitry temperature compensation requirements according to one embodiment of the present disclosure.

Figure 141:
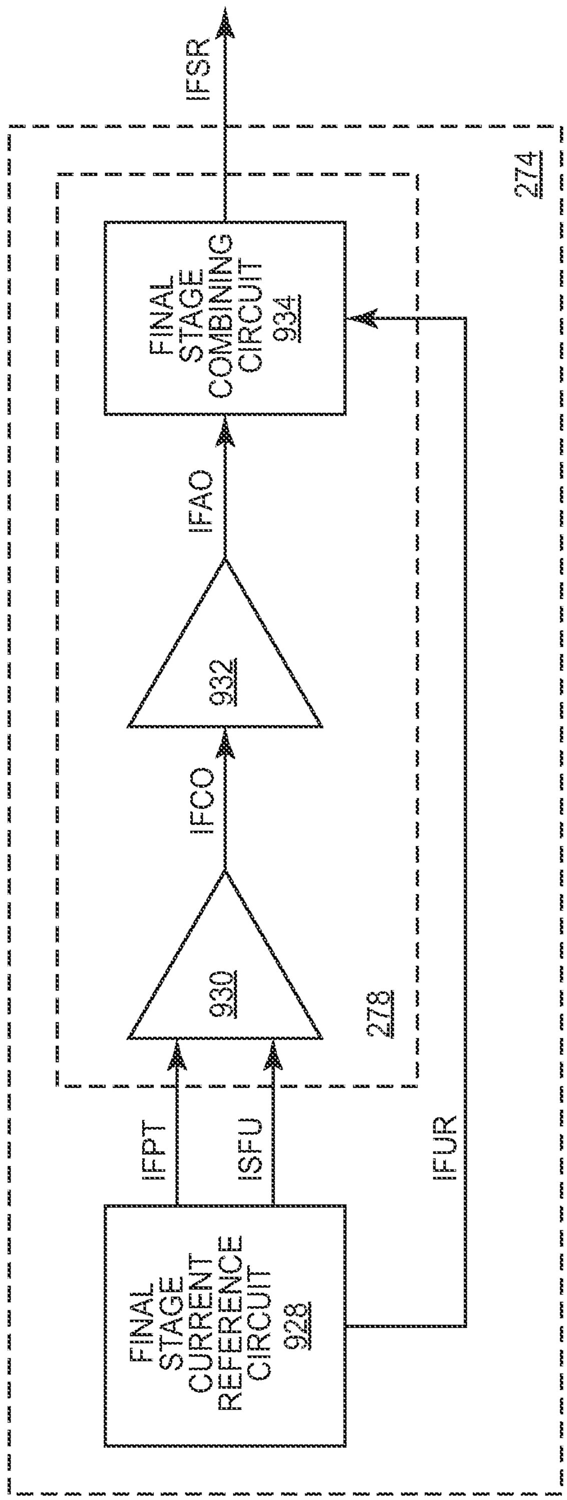

FIG. 141 shows details of final stage current reference circuitry and a final stage temperature compensation circuit illustrated in FIG. 42 according to one embodiment of the final stage current reference circuitry and the final stage temperature compensation circuit.

Figure 142:
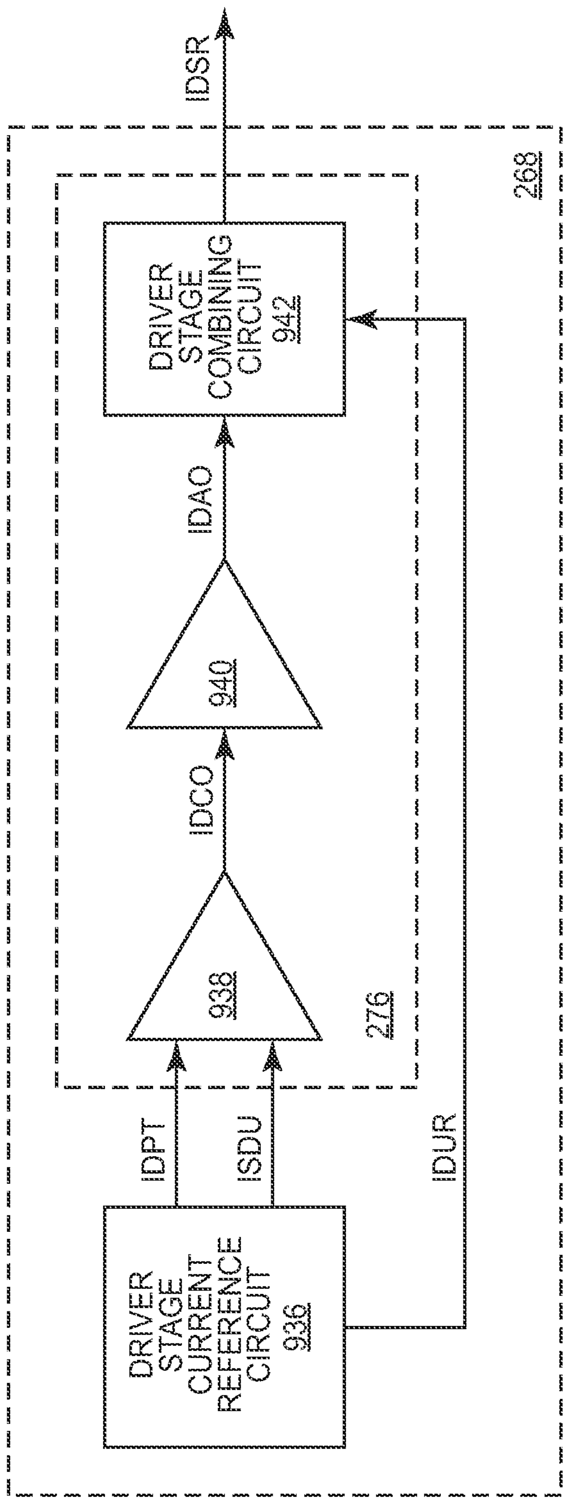

FIG. 142 shows details of driver stage current reference circuitry and a driver stage temperature compensation circuit illustrated in FIG. 42 according to one embodiment of the driver stage current reference circuitry and the driver stage temperature compensation circuit.

Figure 143:
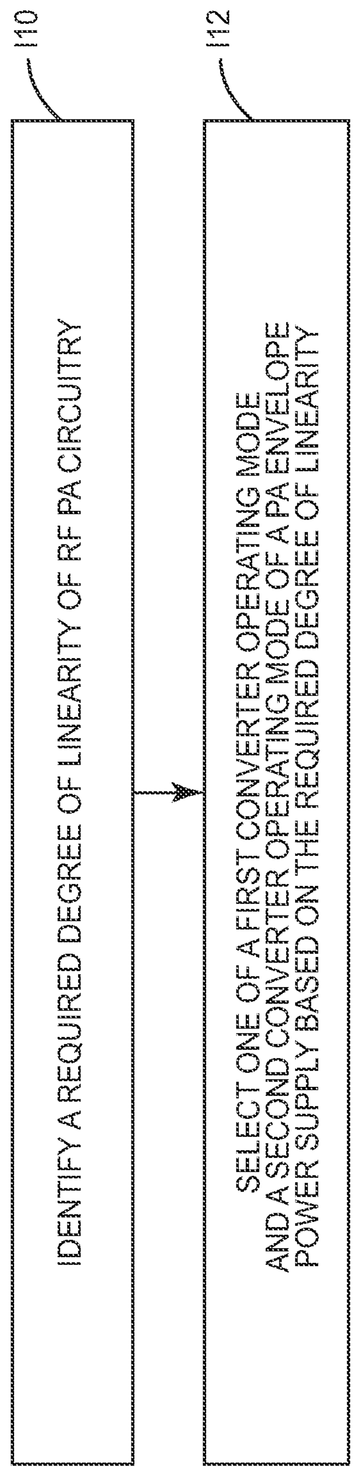

FIG. 143 shows a process for selecting the converter operating mode of the PA envelope power supply according to one embodiment of the present disclosure.

Figure 144:
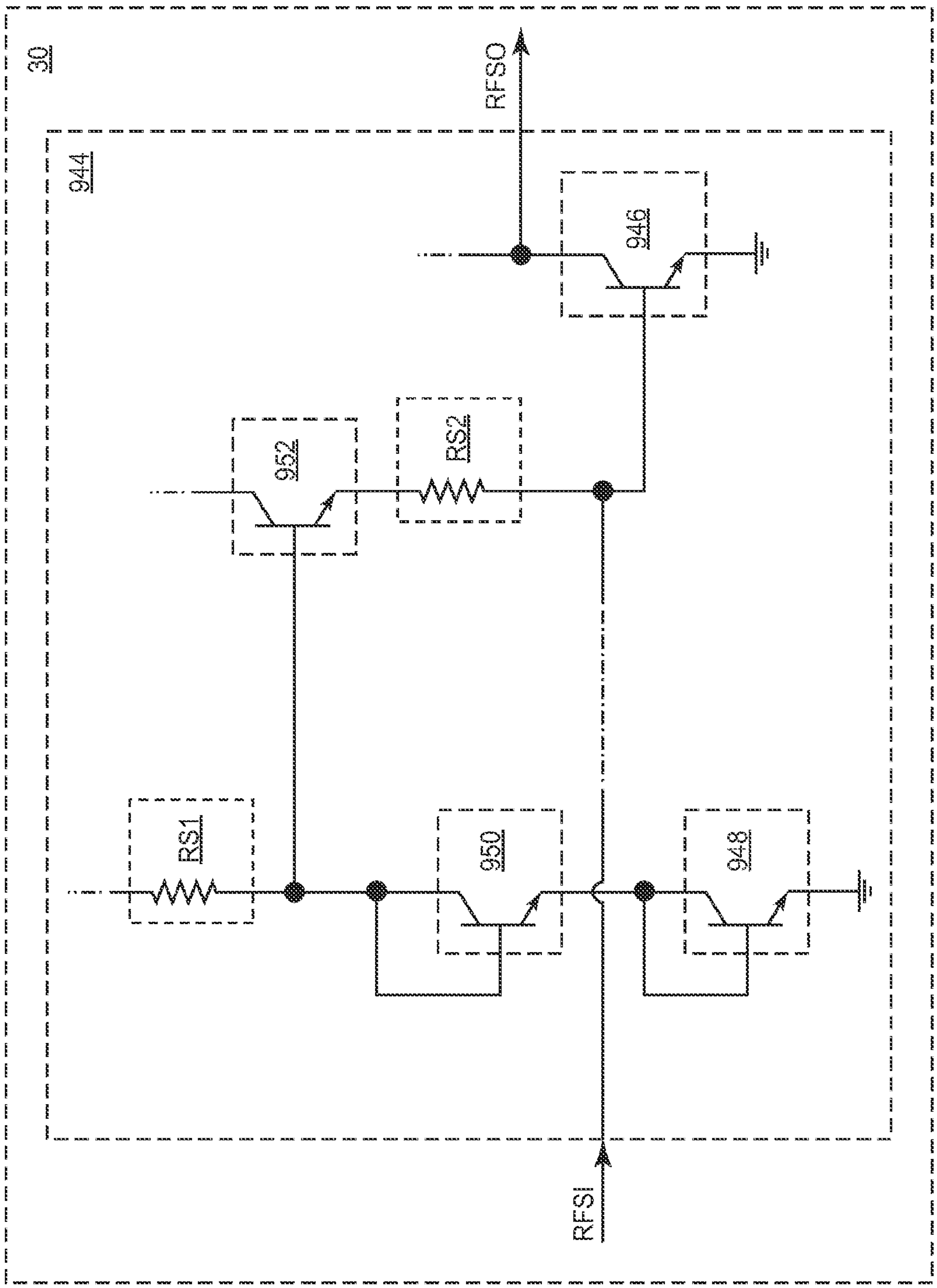

FIG. 144 shows an RF PA stage according to one embodiment of the RF PA stage.

Figure 145:
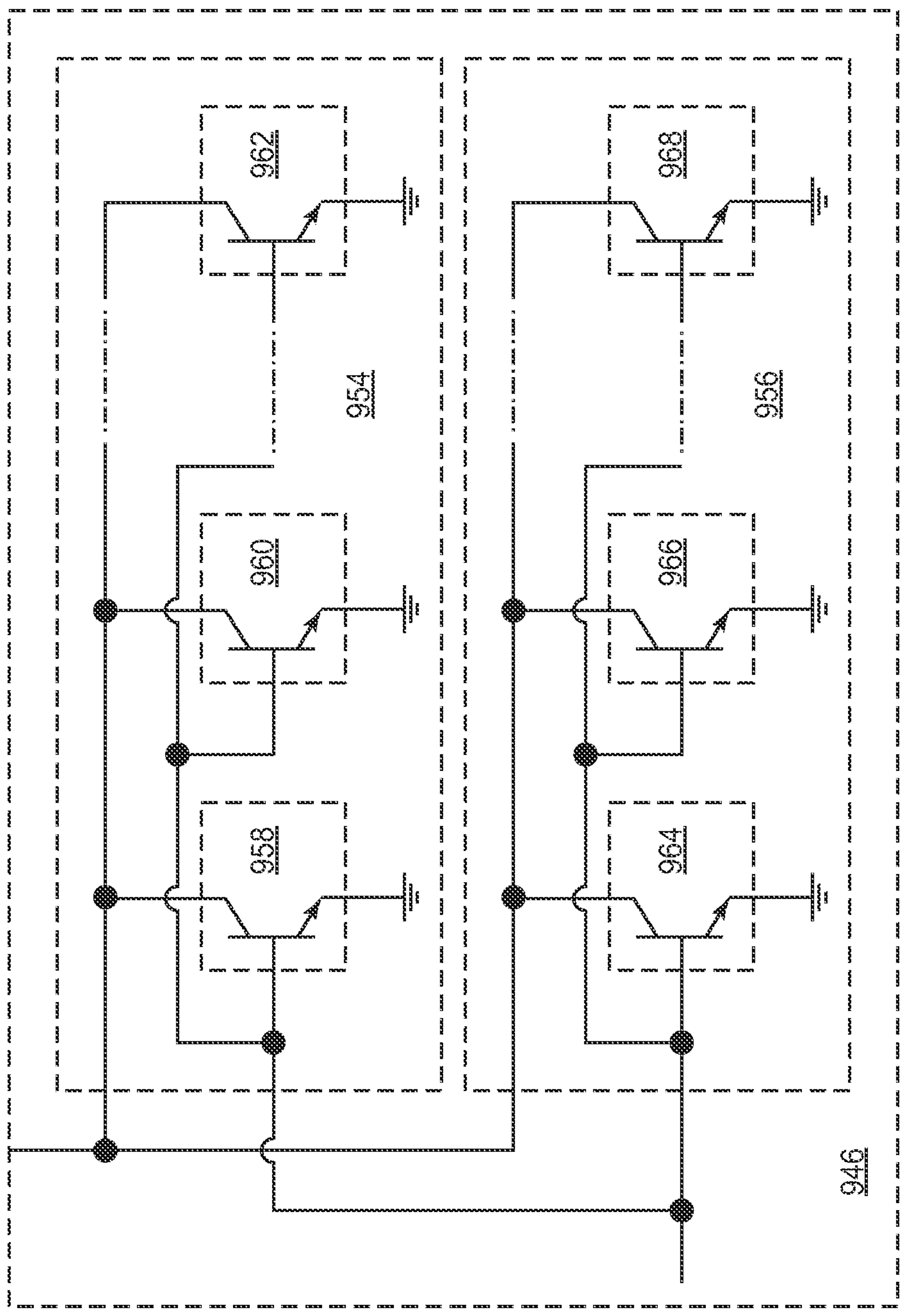

FIG. 145 shows details of the RF PA stage illustrated in FIG. 144 according to one embodiment of the RF PA stage.

Figure 146C:
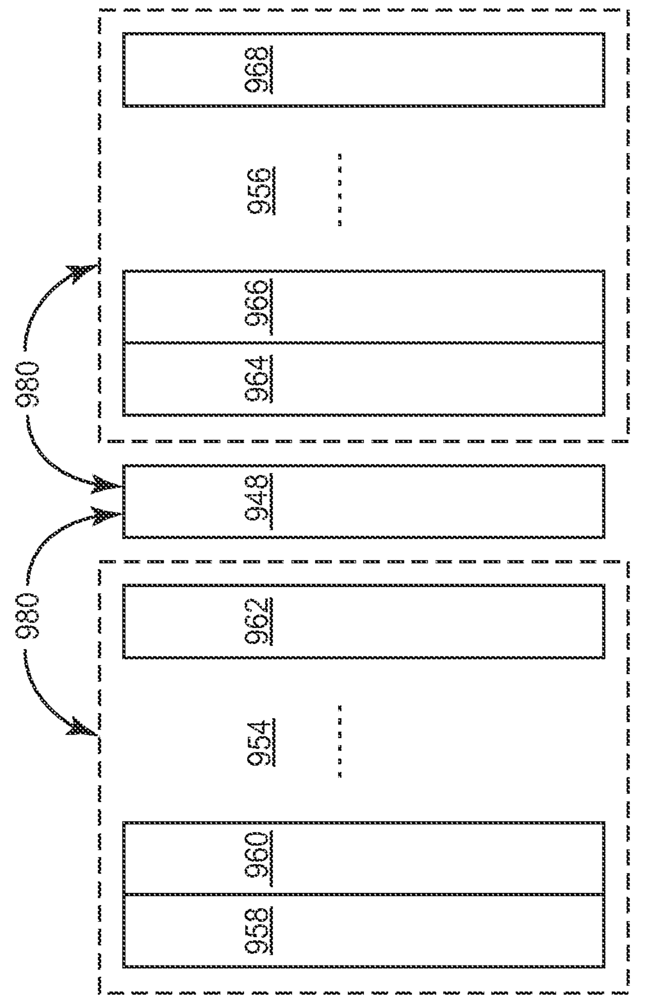
Figure 146B:
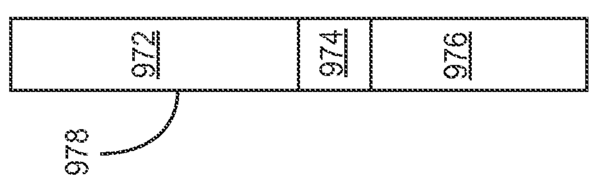
Figure 146A:
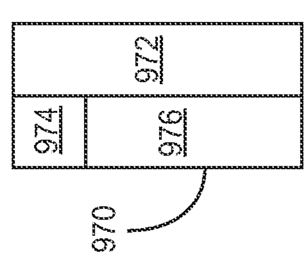

FIG. 146A shows a physical layout of a normal heterojunction bipolar transistor (HBT) according to the prior art.

FIG. 146B shows a physical layout of a linear HBT according to one embodiment of the linear HBT.

FIG. 146C shows a physical layout of a first array and a second array illustrated in FIG. 145, and a physical layout of an RF PA temperature compensating bias transistor illustrated in FIG. 144 according to one embodiment of the present disclosure.

Figure 147:
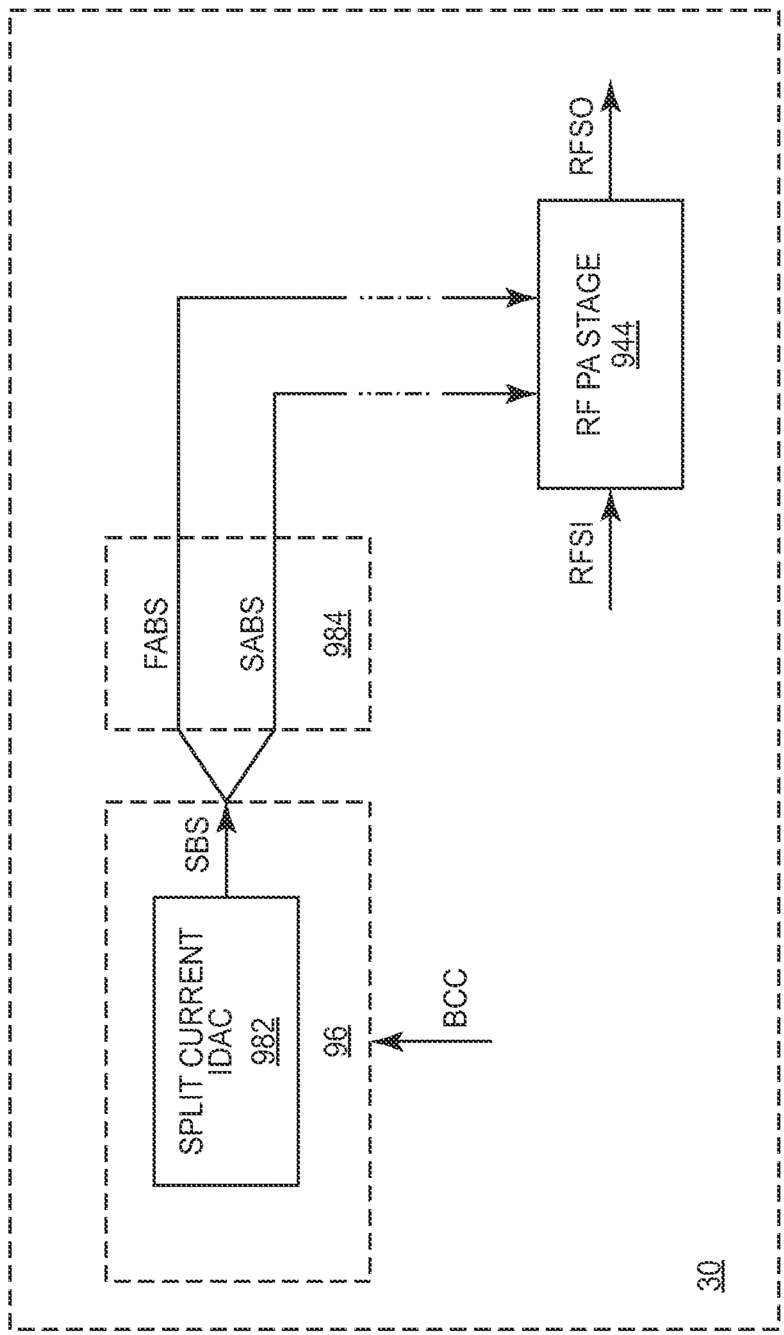

FIG. 147 shows details of the RF PA circuitry illustrated in FIG. 40 according to one embodiment of the RF PA circuitry.

Figure 148:
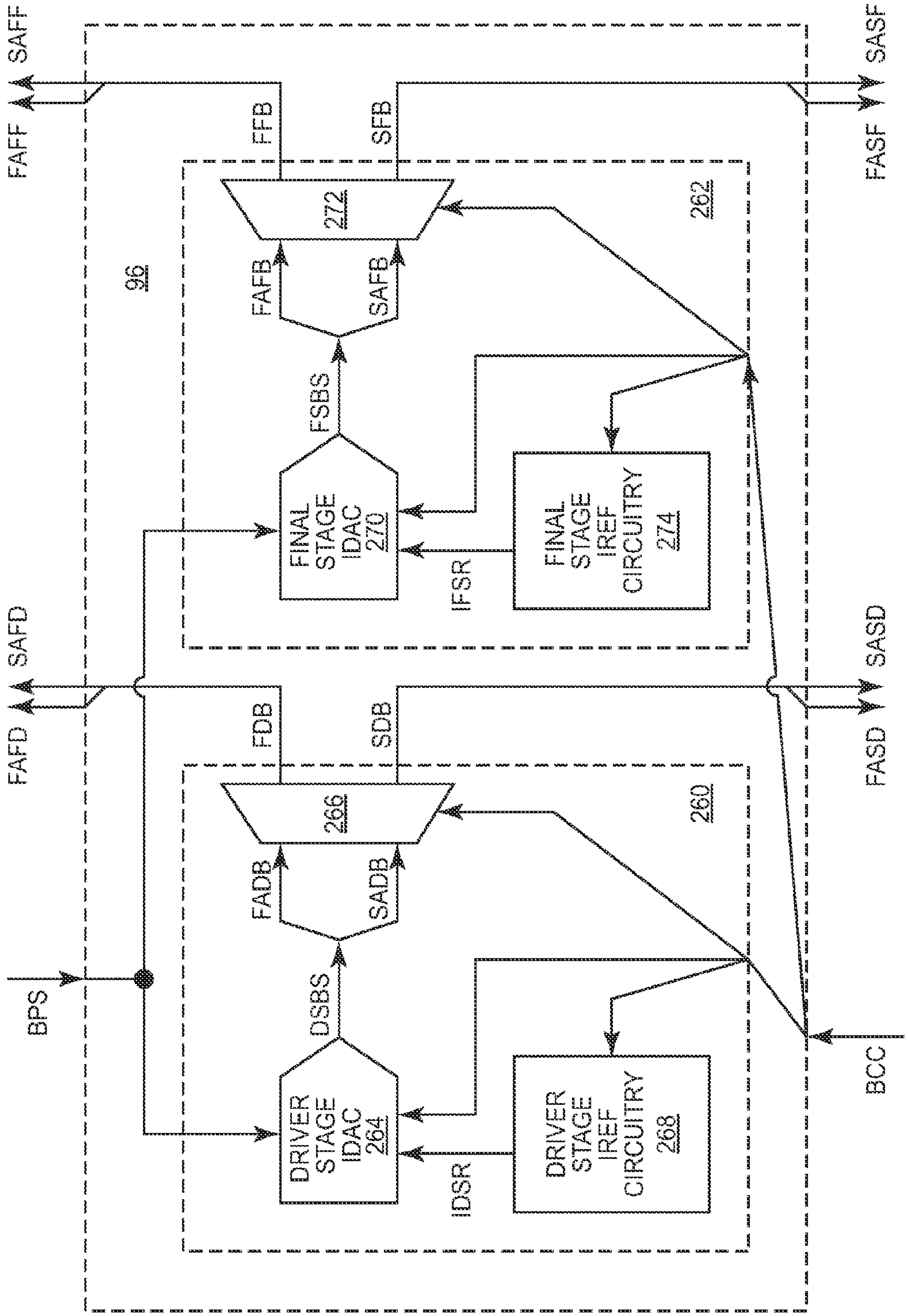

FIG. 148 shows details of the PA bias circuitry illustrated in FIG. 40 according to one embodiment of the PA bias circuitry.

Figure 149:
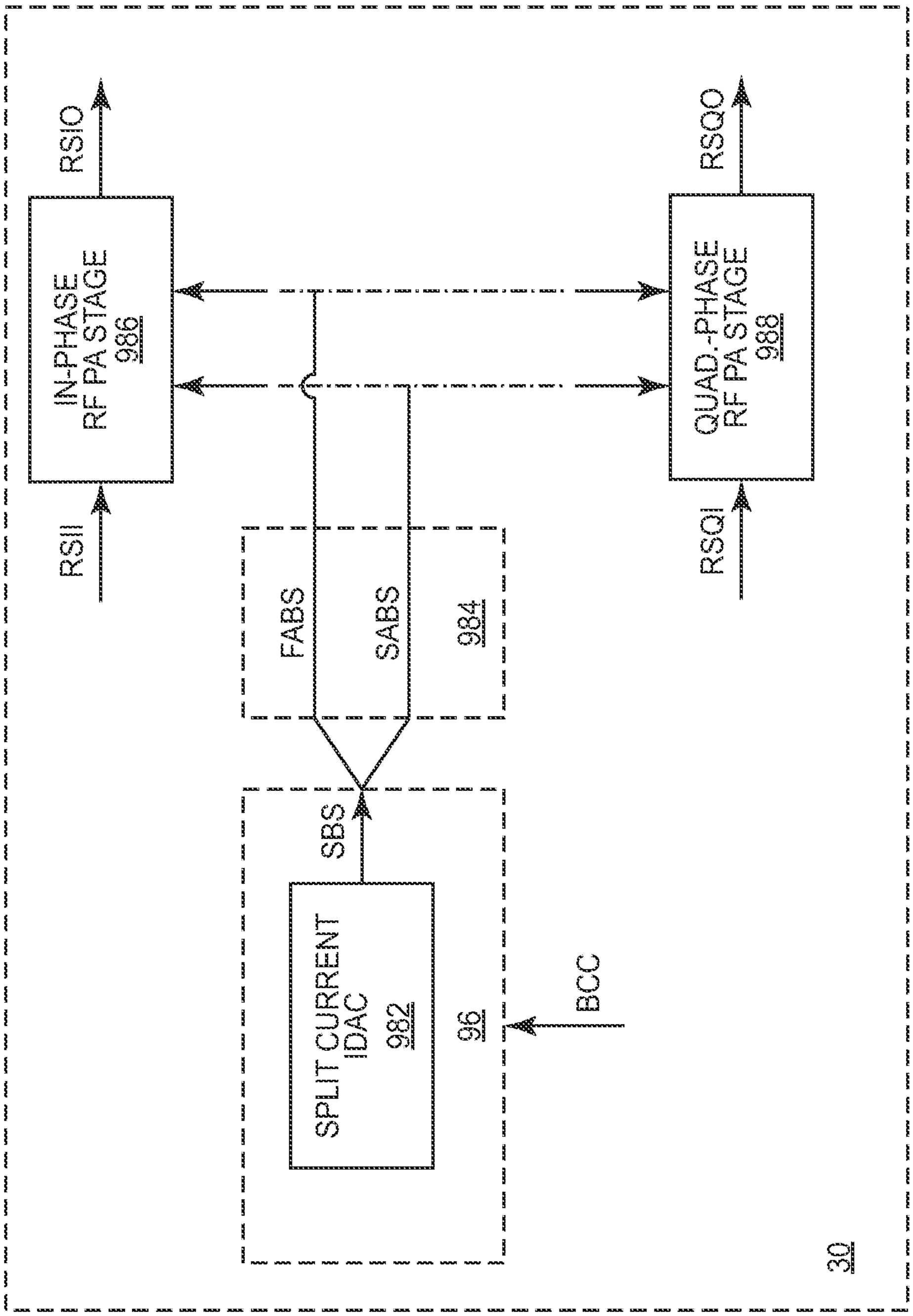

FIG. 149 shows details of the RF PA circuitry illustrated in FIG. 40 according to an alternate embodiment of the RF PA circuitry.

Figure 150:
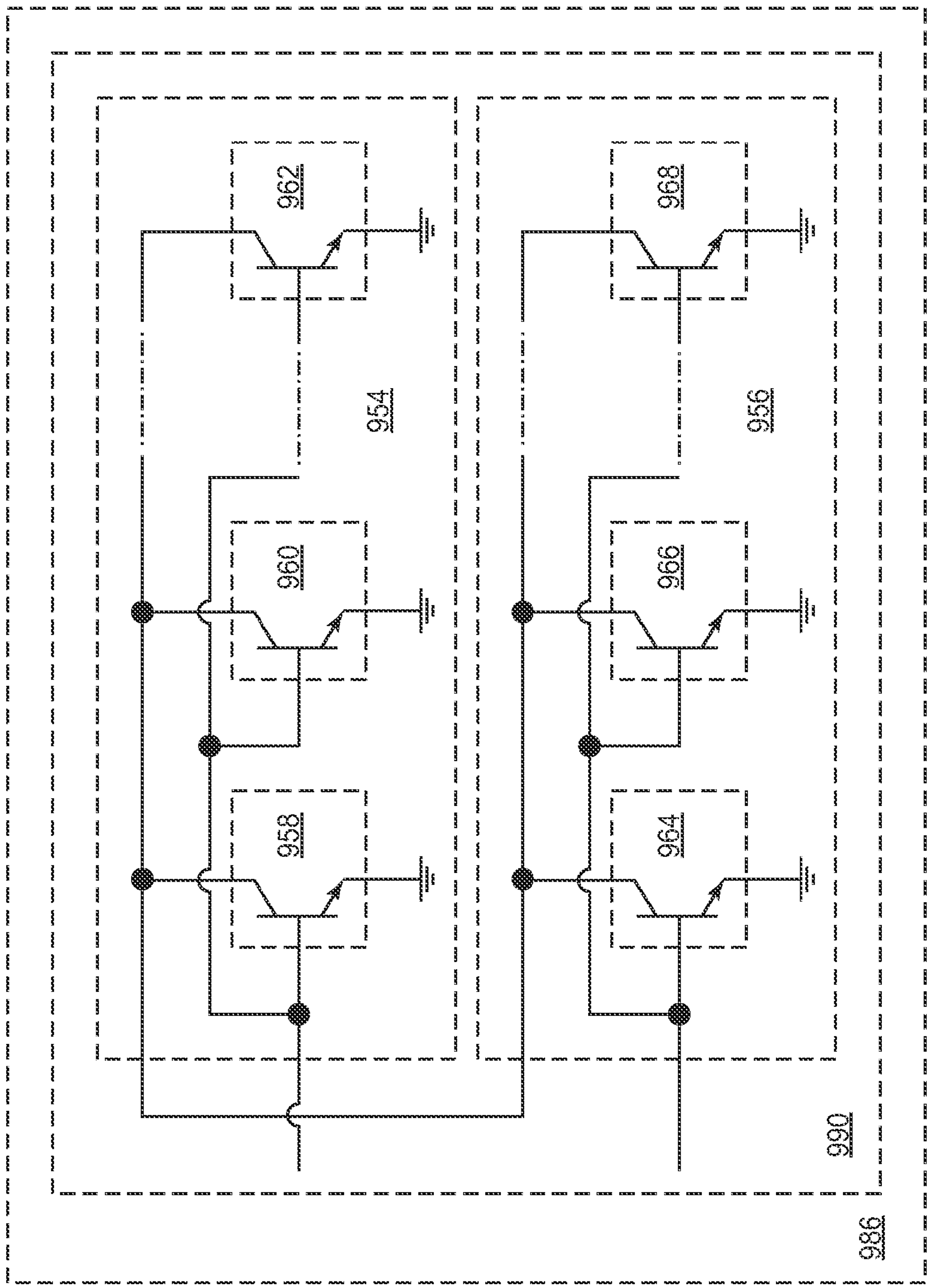

FIG. 150 shows details of an in-phase RF PA stage illustrated in FIG. 149 according to one embodiment of the in-phase RF PA stage.

Figure 151:
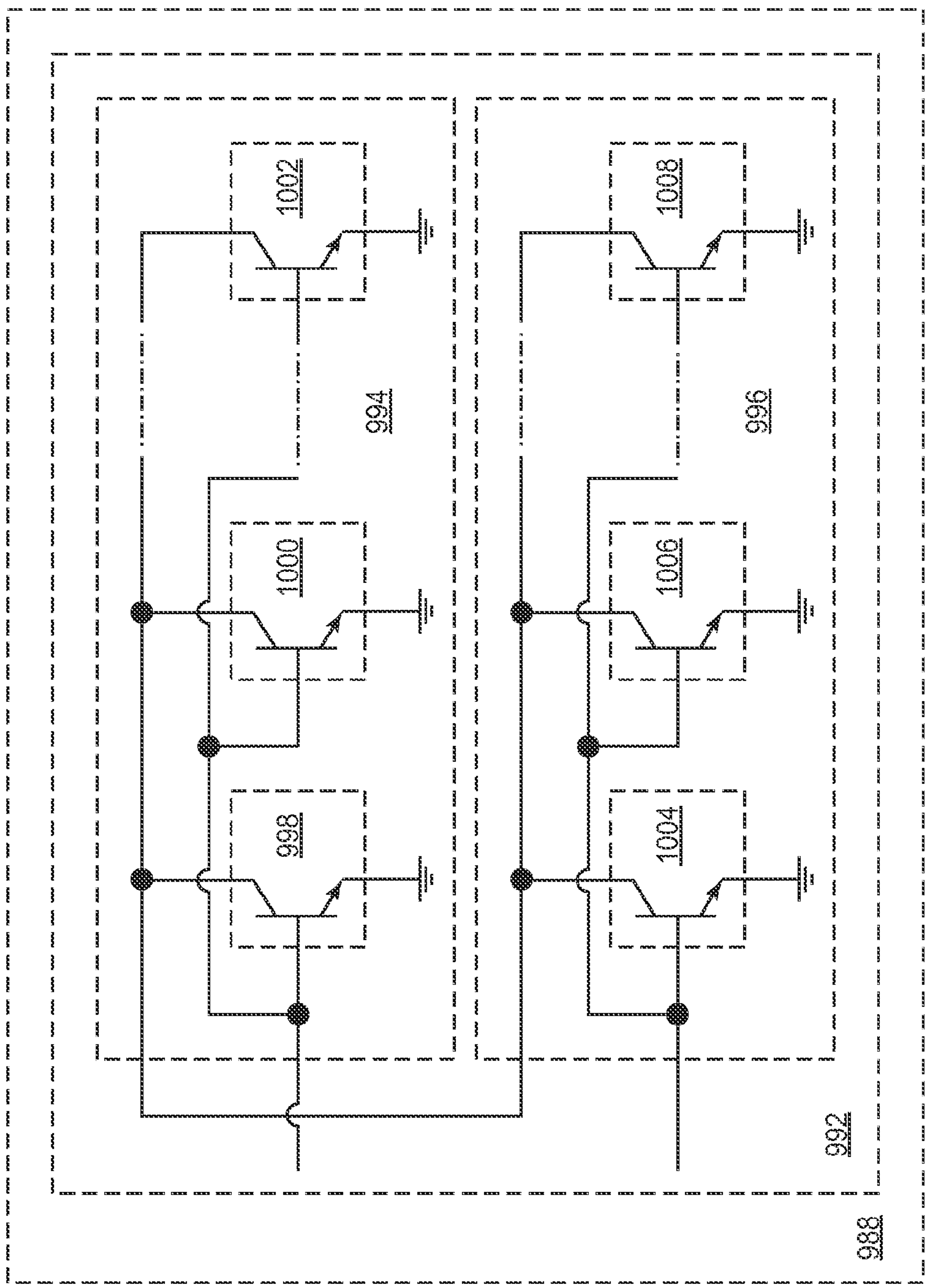

FIG. 151 shows details of a quadrature-phase RF PA stage illustrated in FIG. 149 according to one embodiment of the quadrature-phase RF PA stage.

Figure 152:
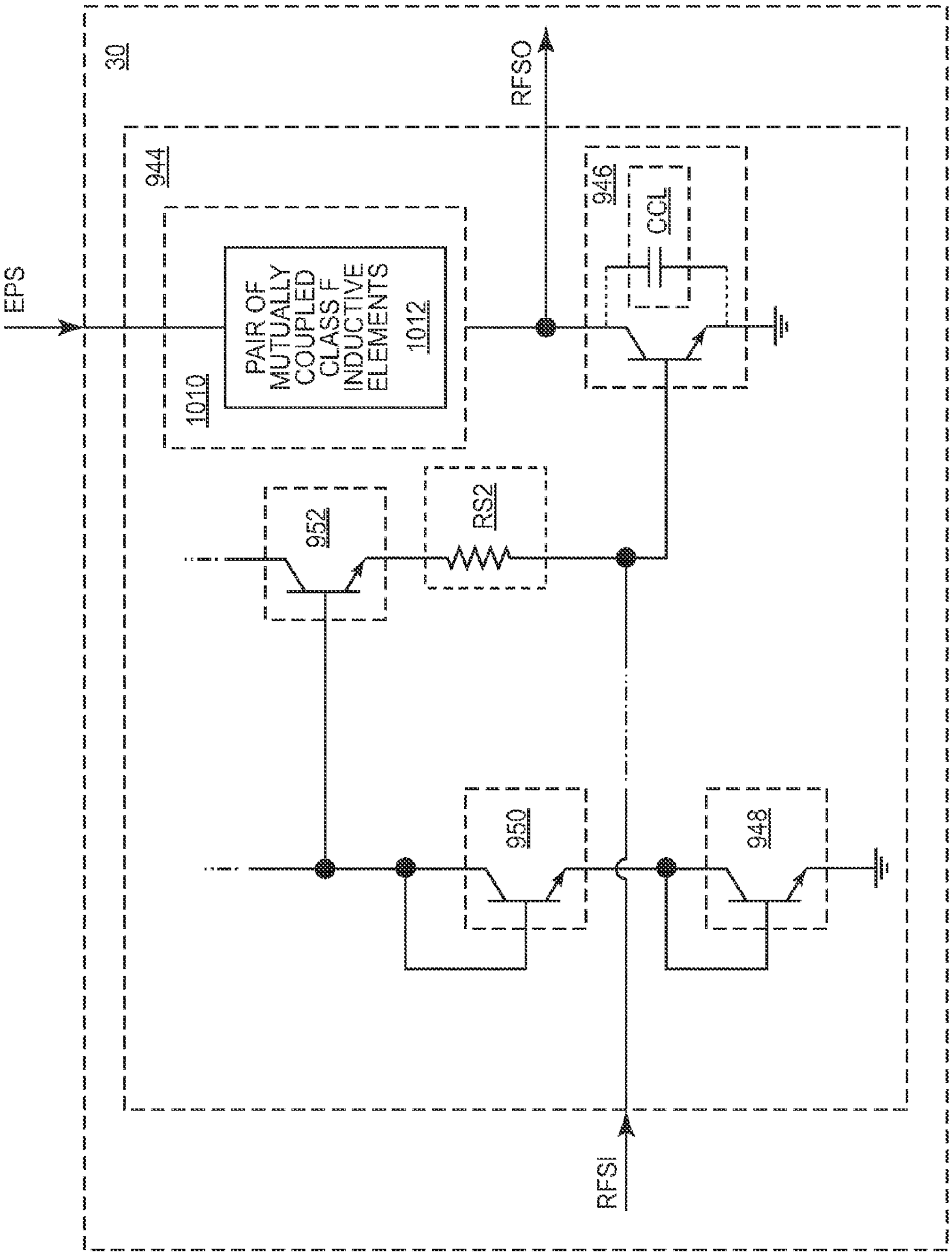

FIG. 152 shows details of the RF PA circuitry according to one embodiment of the RF PA circuitry.

Figure 153:
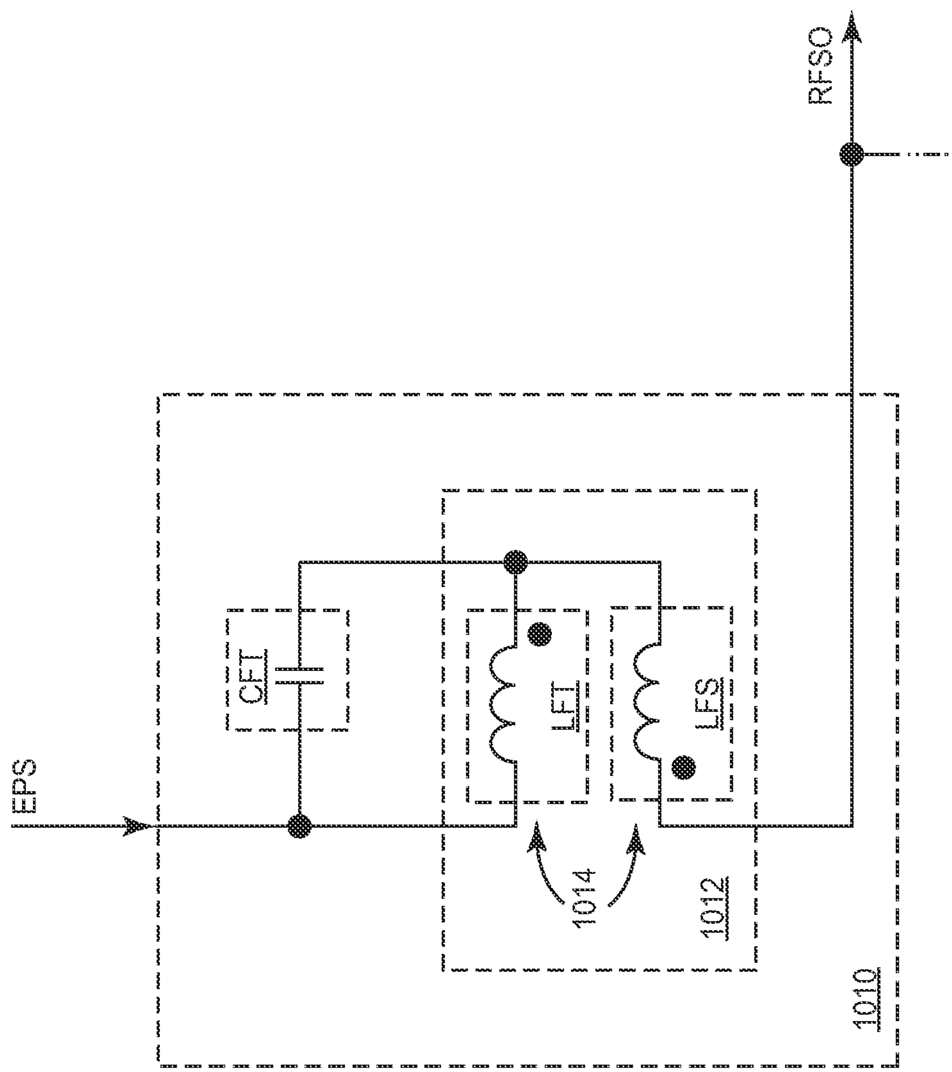

FIG. 153 shows details of an overlay class F choke illustrated in FIG. 152 according one embodiment of the overlay class F choke.

Figure 154:
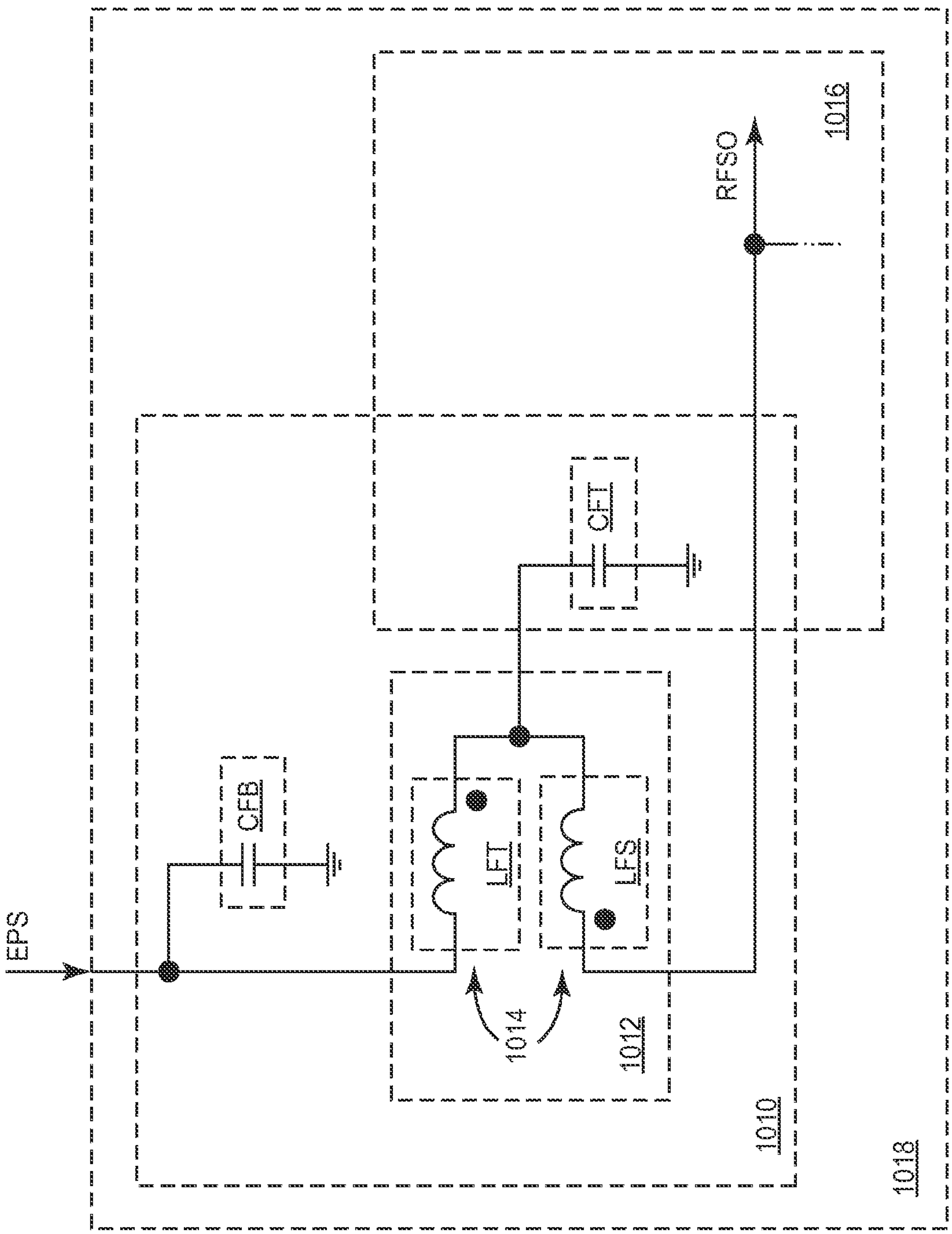

FIG. 154 shows details of the overlay class F choke illustrated in FIG. 152 according an alternate embodiment of the overlay class F choke.

Figure 155:
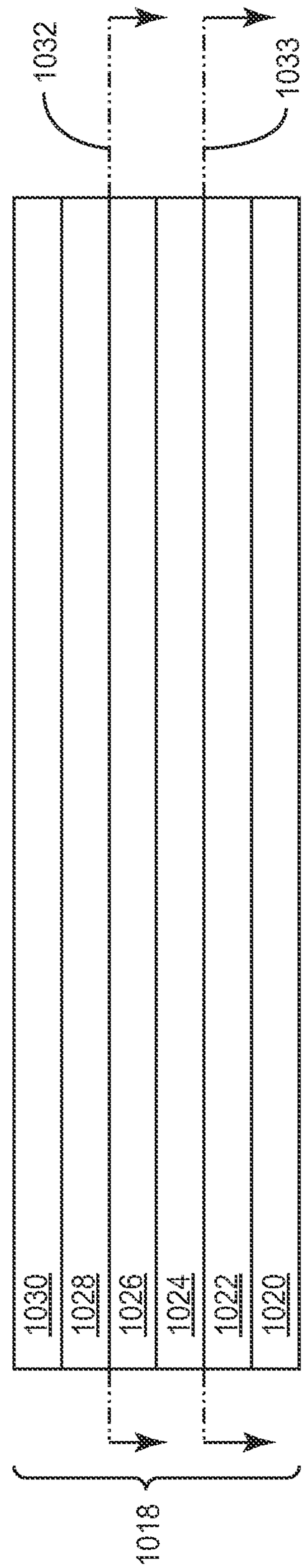

FIG. 155 shows details of a supporting structure illustrated in FIG. 154 according to one embodiment of the supporting structure.

Figure 156:
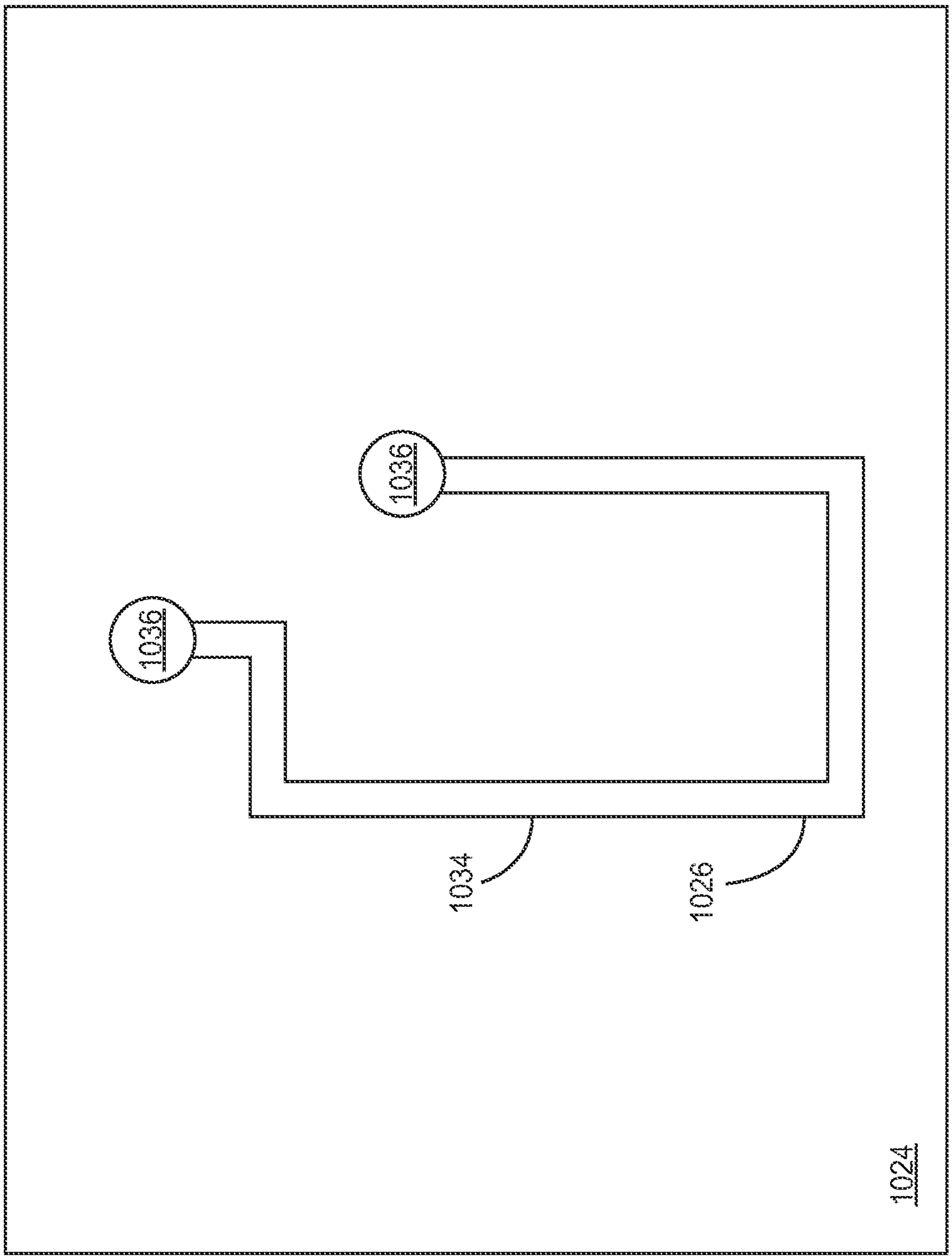

FIG. 156 shows details of a first cross-section illustrated in FIG. 155 according to one embodiment of the supporting structure.

Figure 157:
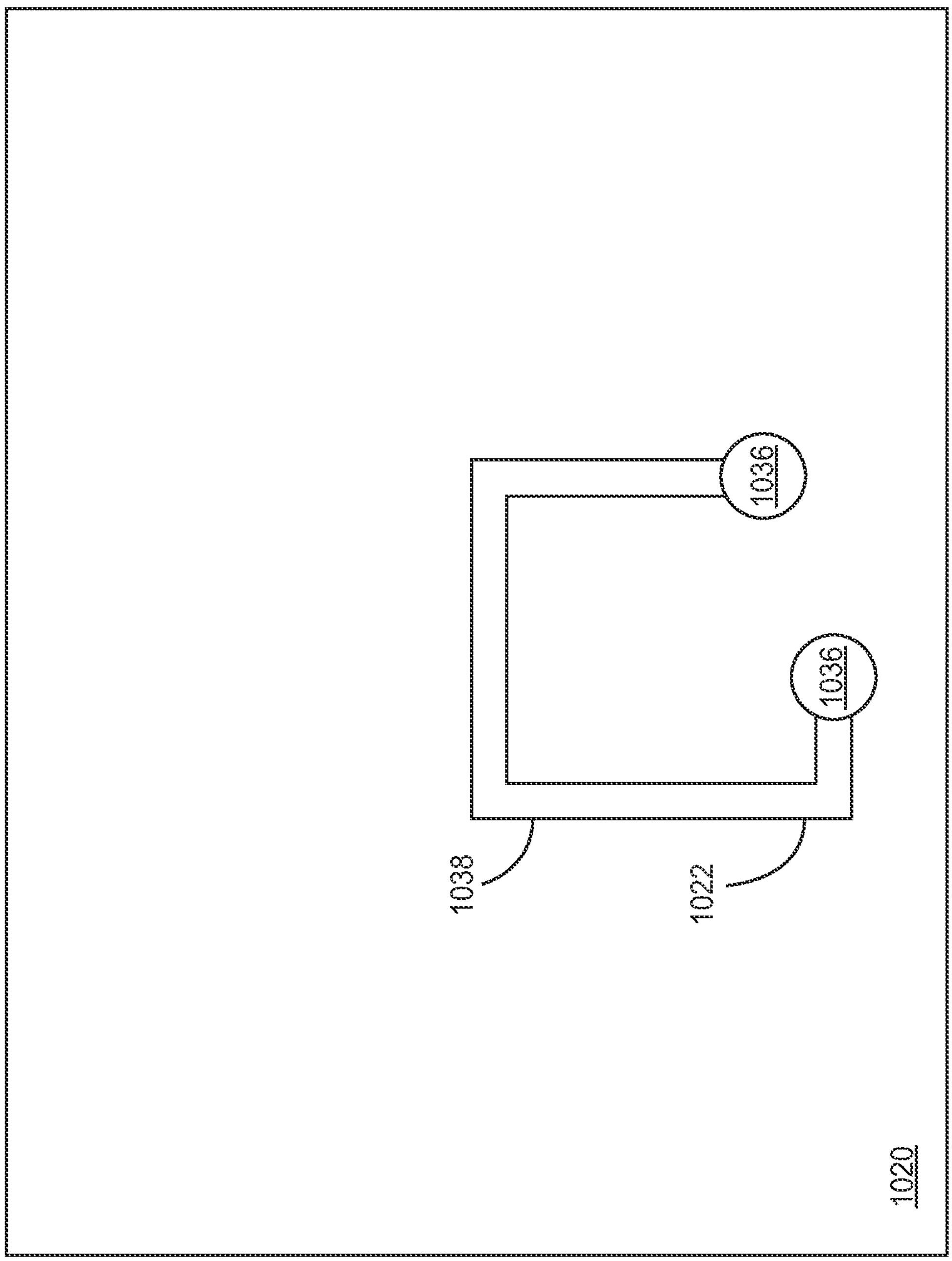

FIG. 157 shows details of a second cross-section illustrated in FIG. 155 according to one embodiment of the supporting structure.

Figure 158:
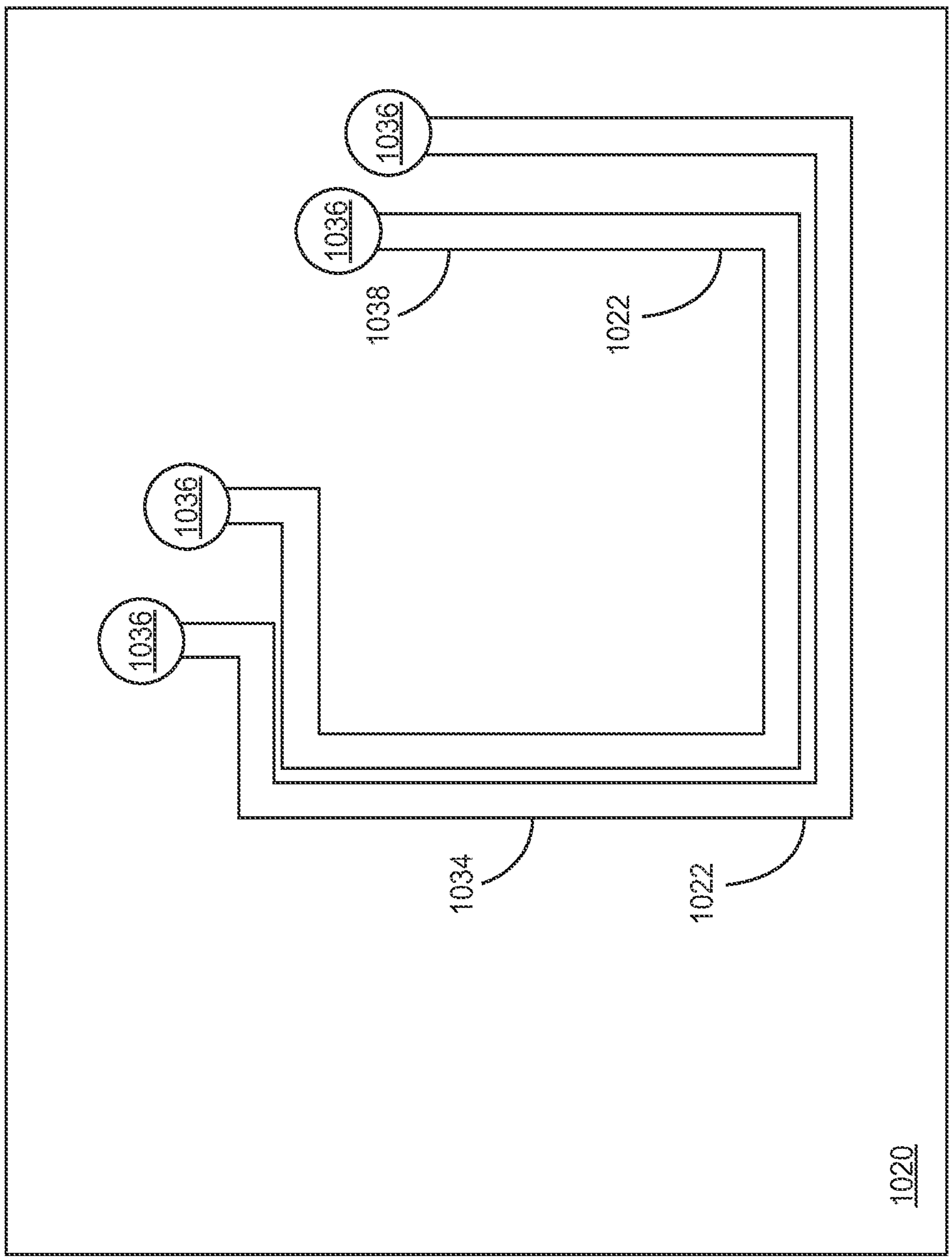

FIG. 158 shows details of the second cross-section illustrated in FIG. 155 according to an alternate embodiment of the supporting structure.

Figure 159A:
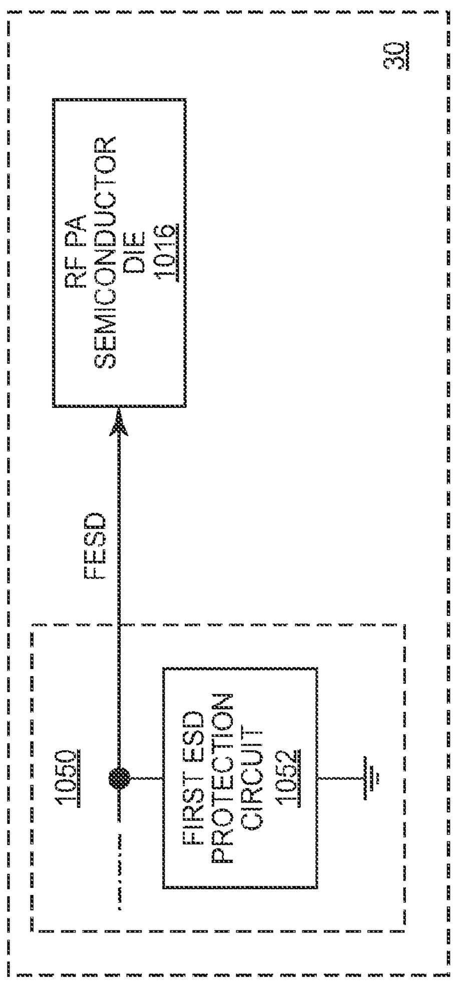

FIG. 159A shows the RF PA circuitry according to one embodiment of the RF PA circuitry.

Figure 159B:
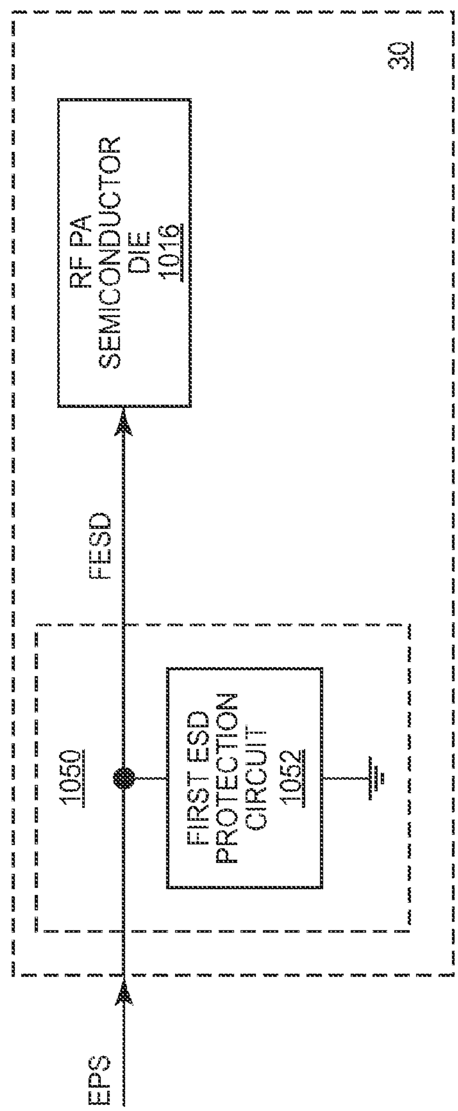

FIG. 159B shows the RF PA circuitry according to an alternate embodiment of the RF PA circuitry.

Figure 160:
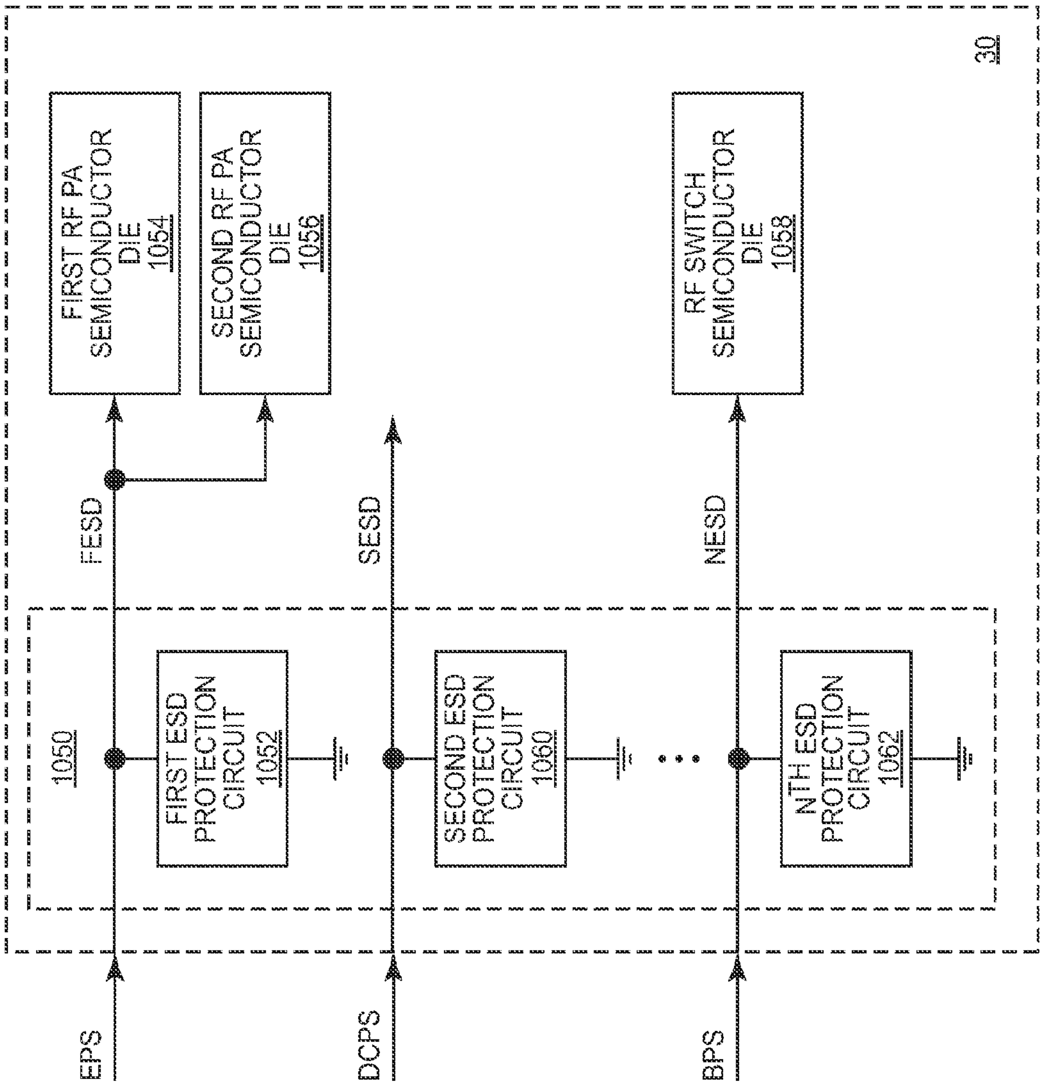

FIG. 160 shows the RF PA circuitry according to an additional embodiment of the RF PA circuitry.

Figure 161:
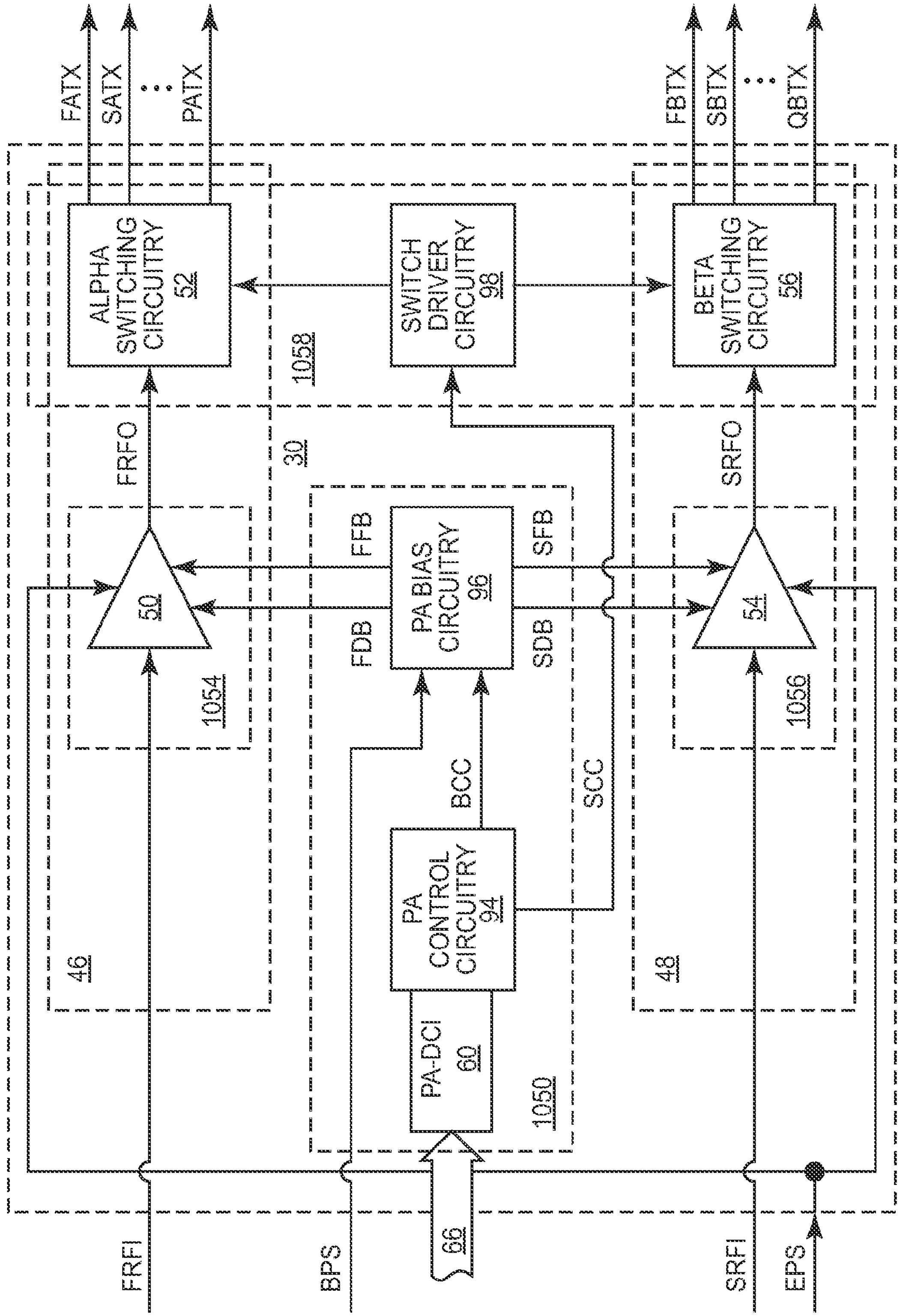

FIG. 161 shows the RF PA circuitry according to another embodiment of the RF PA circuitry.

Figure 162:
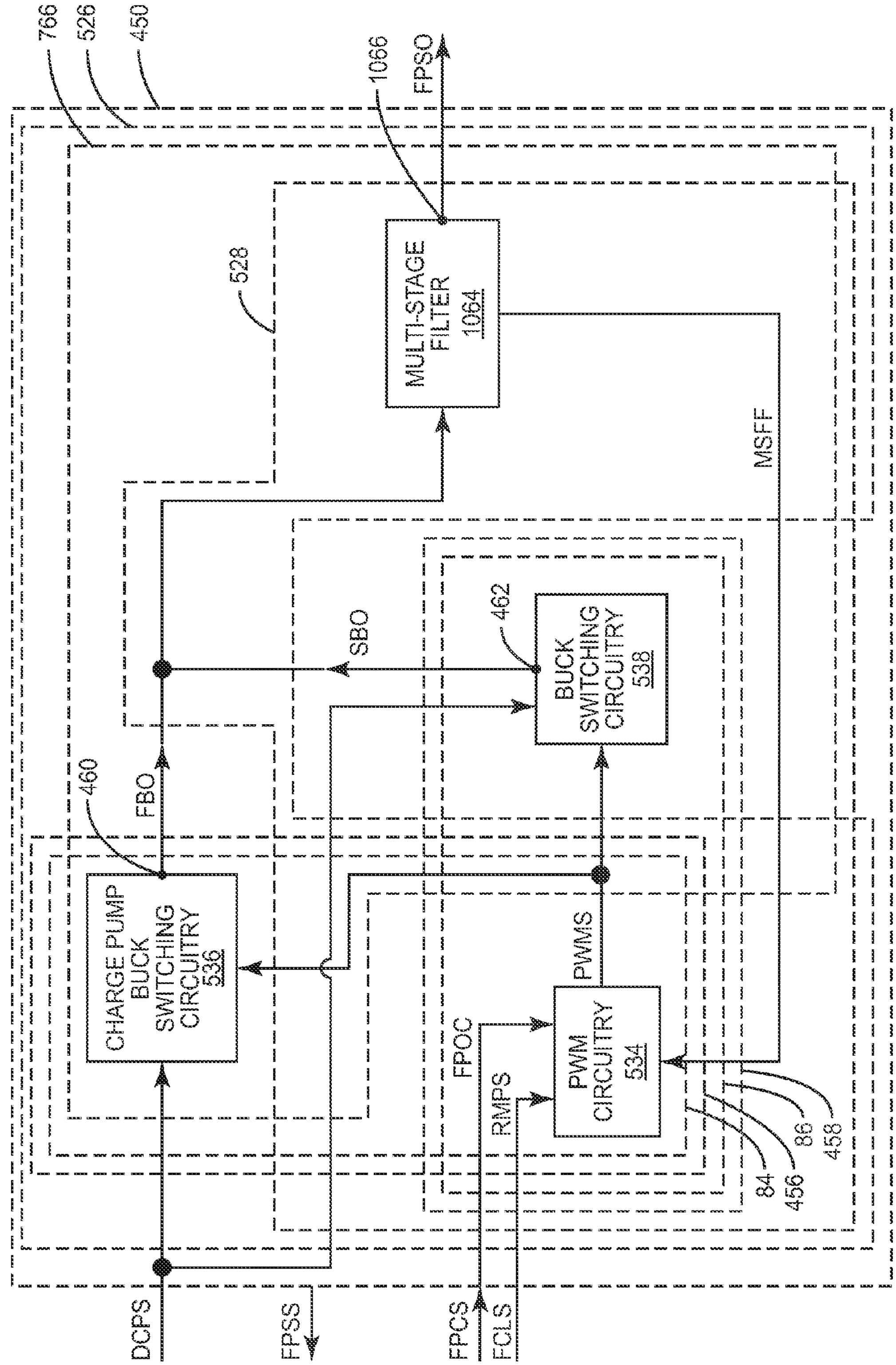

FIG. 162 shows details of the first switching power supply illustrated in FIG. 74 according to another embodiment of the first switching power supply.

Figure 163:
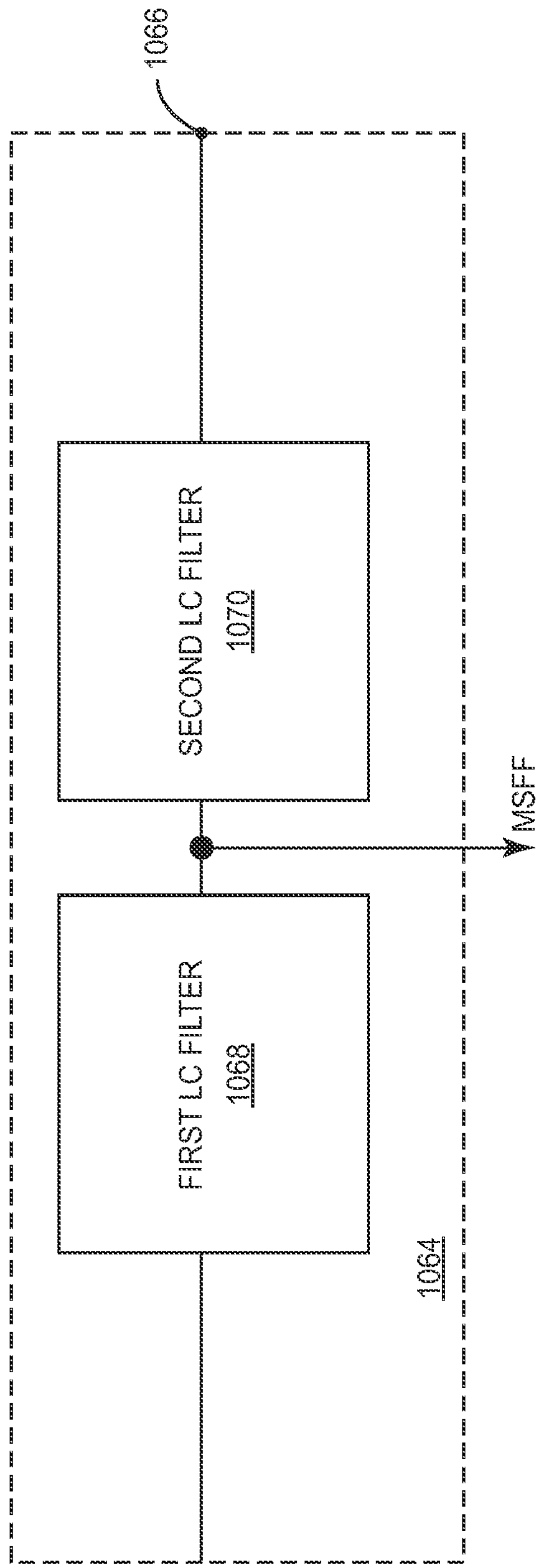

FIG. 163 shows details of a multi-stage filter illustrated in FIG. 162 according to one embodiment of the multi-stage filter.

Figure 164:
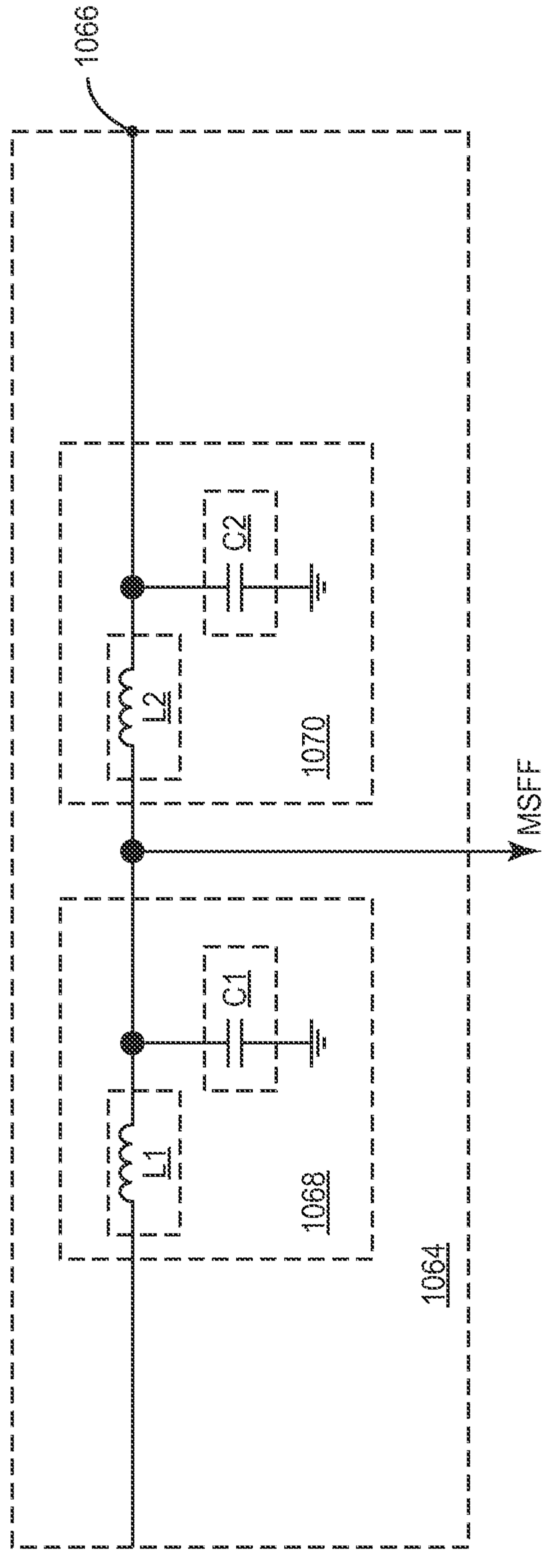

FIG. 164 shows details of the multi-stage filter illustrated in FIG. 163 according to an alternate embodiment of the multi-stage filter.

Figure 165:
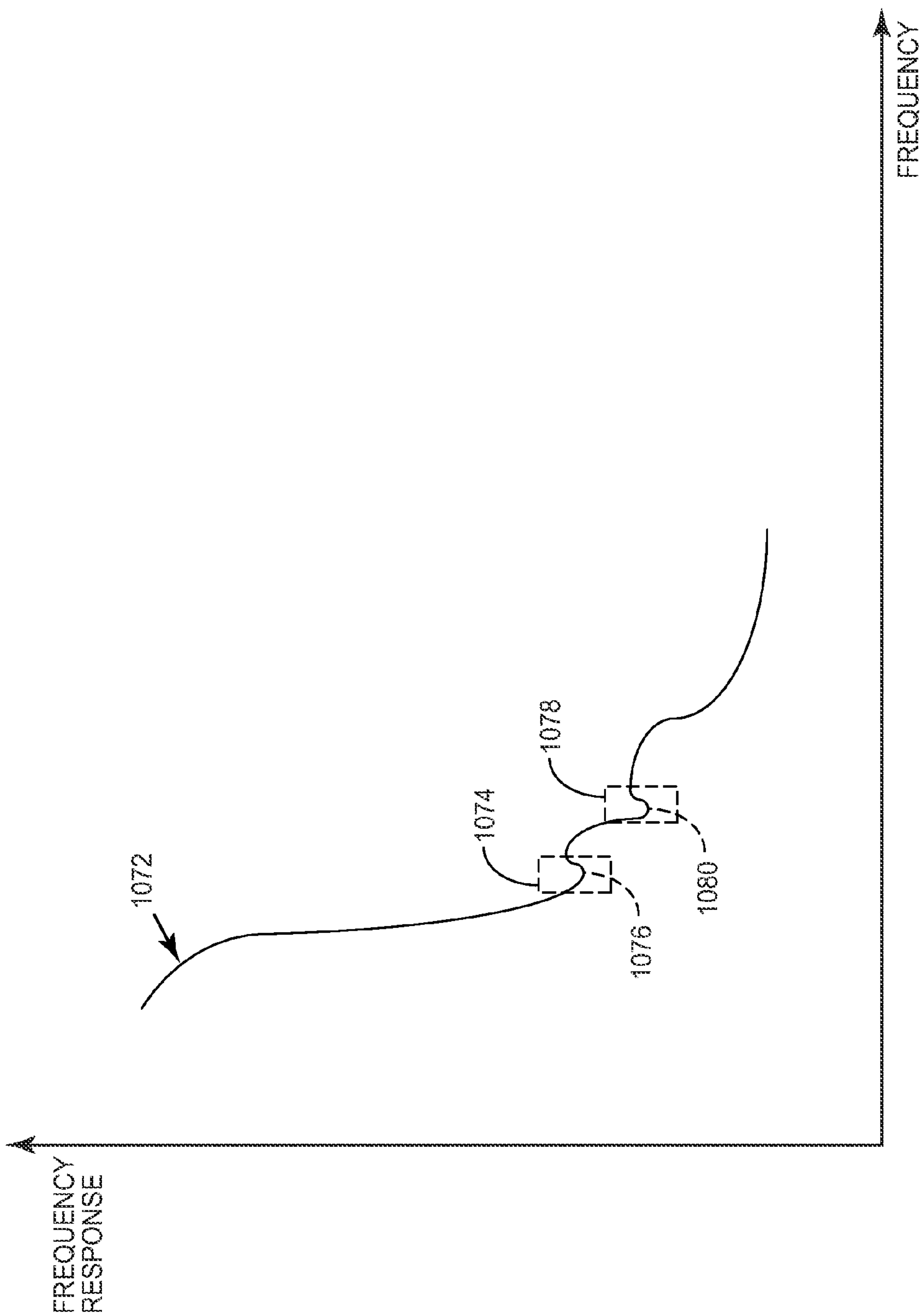

FIG. 165 is a graph showing a frequency response of the multi-stage filter illustrated in FIG. 164 according to one embodiment of the multi-stage filter.

Figure 166:
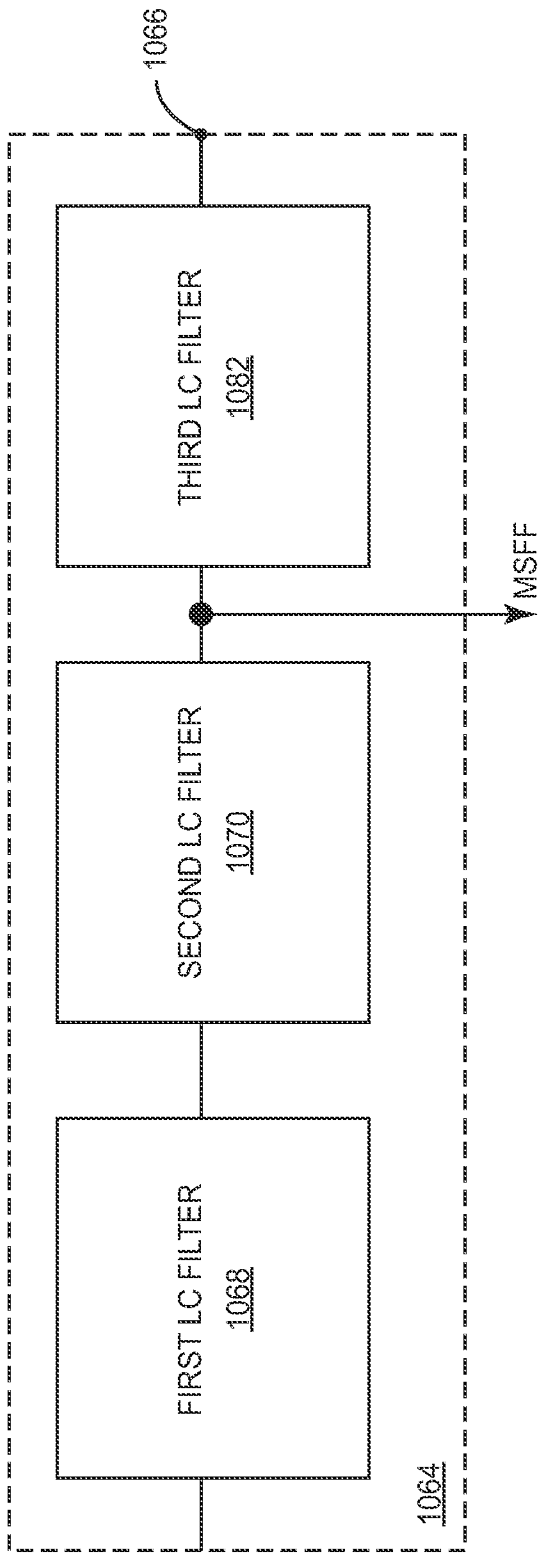

FIG. 166 shows details of the multi-stage filter illustrated in FIG. 162 according to an additional embodiment of the multi-stage filter.

Figure 167:
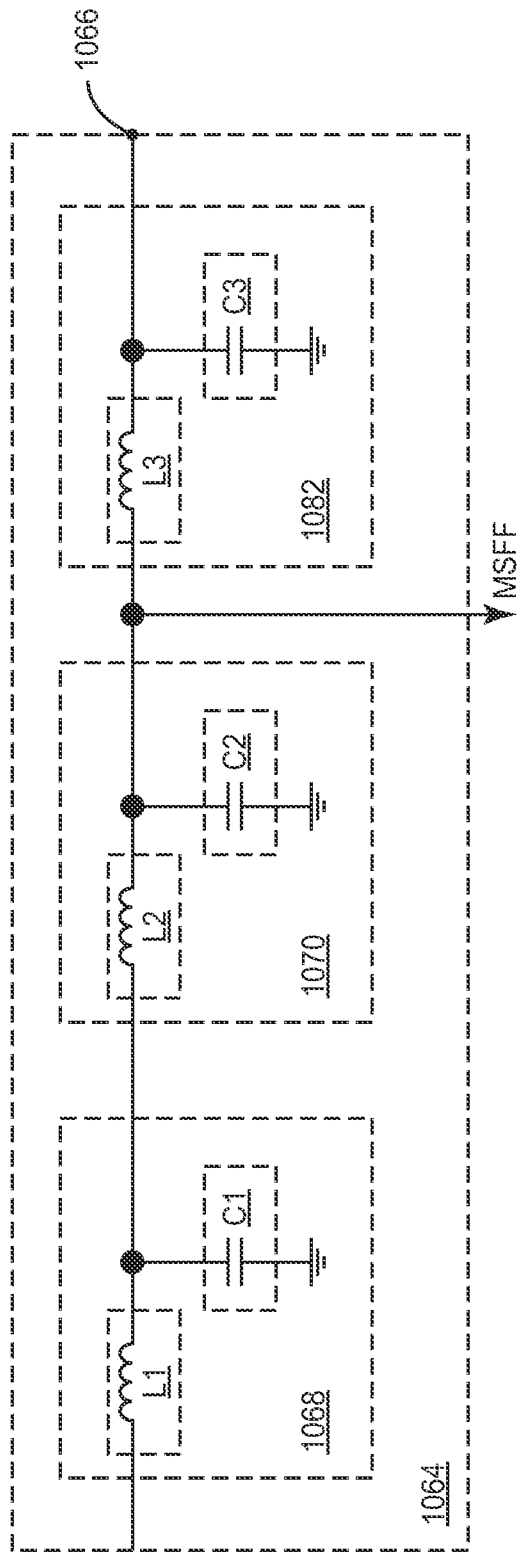

FIG. 167 shows details of the multi-stage filter illustrated in FIG. 166 according to another embodiment of the multi-stage filter.

Figure 168:
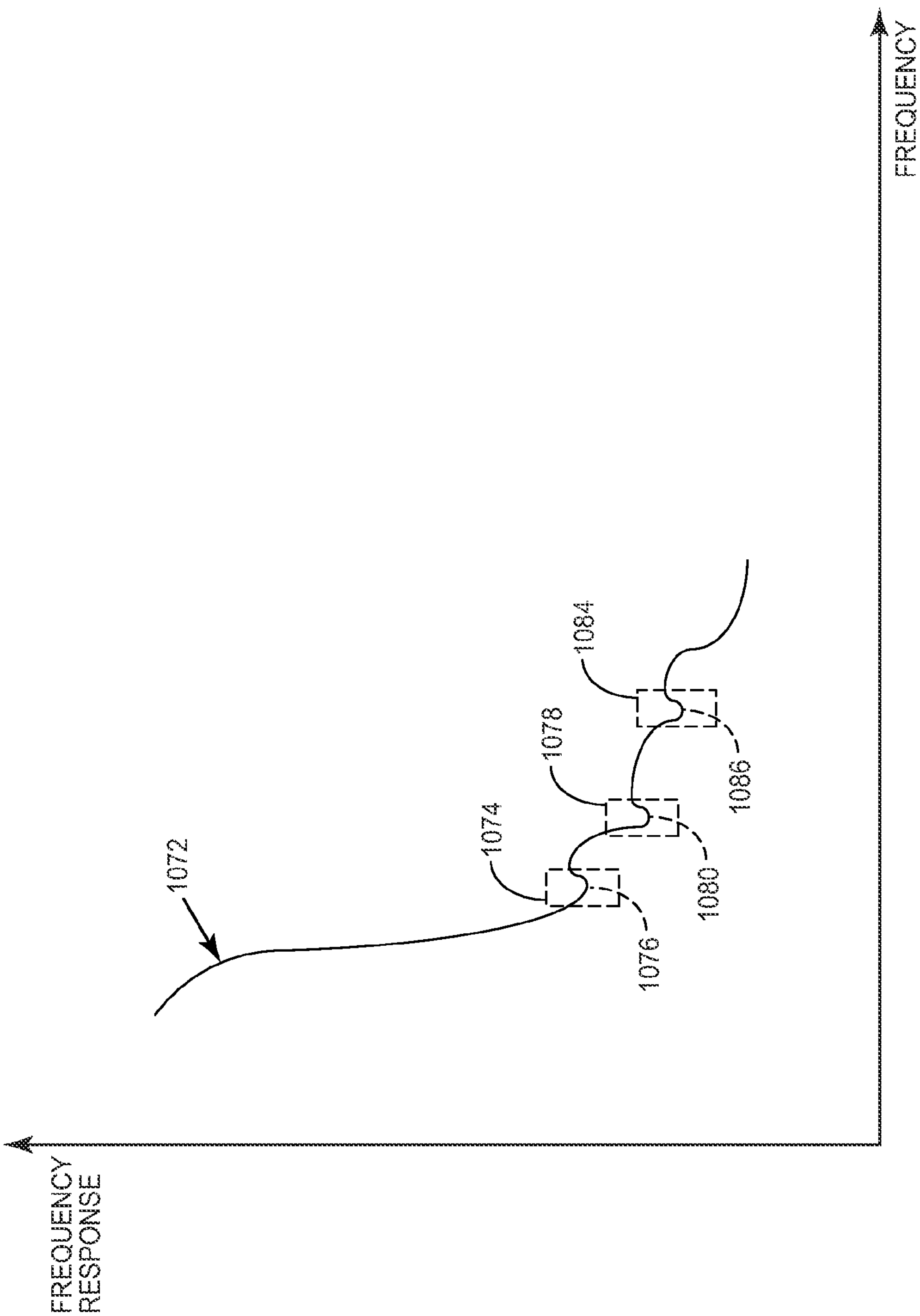

FIG. 168 is a graph showing a frequency response of the multi-stage filter illustrated in FIG. 167 according to one embodiment of the multi-stage filter.

Figure 169:
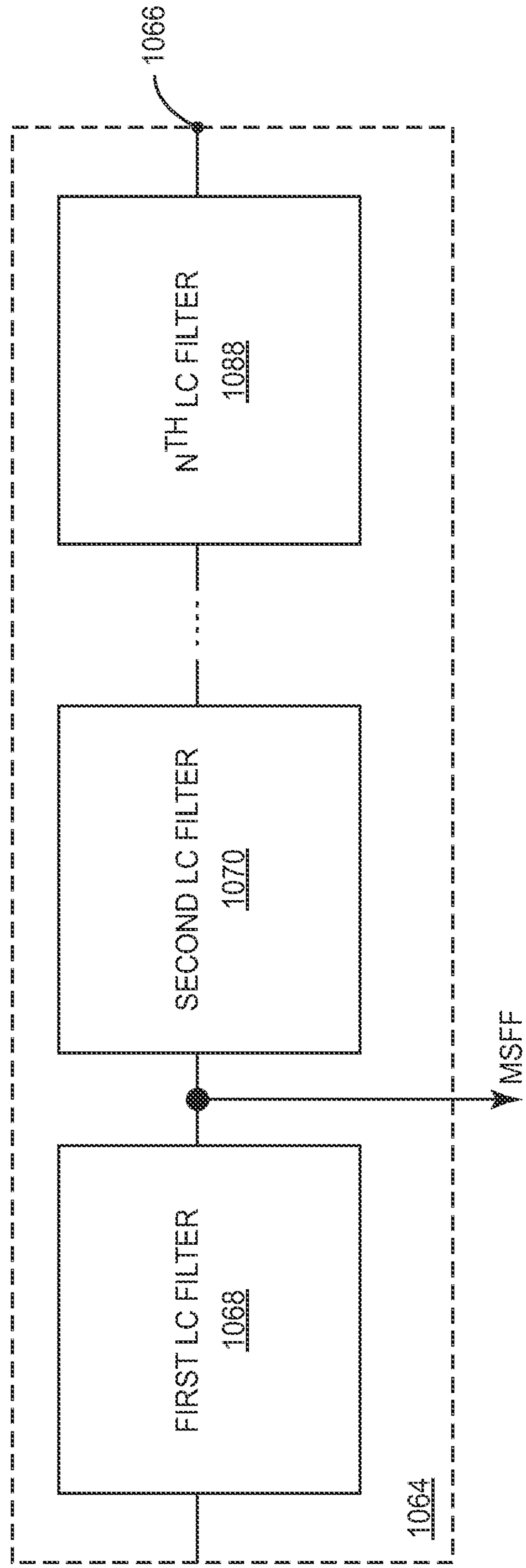

FIG. 169 shows details of the multi-stage filter illustrated in FIG. 162 according to a further embodiment of the multi-stage filter.

Figure 170:
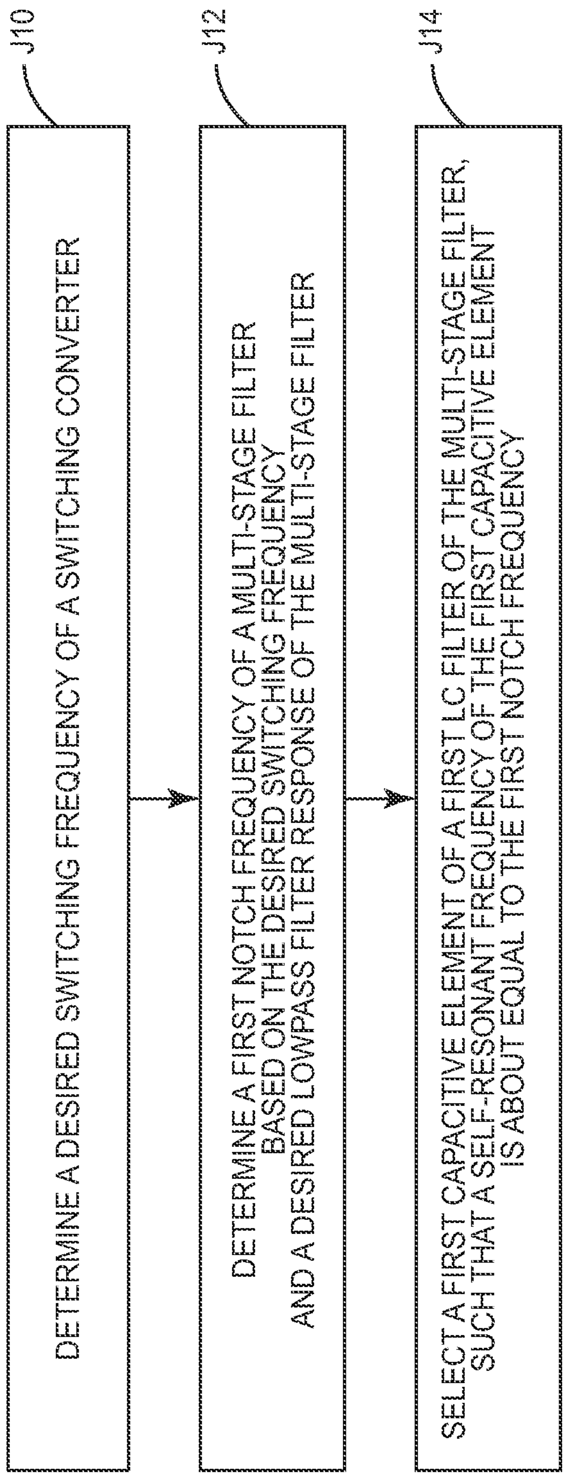

FIG. 170 illustrates a process for selecting components for a multi-stage filter used with a switching converter according to one embodiment of the present disclosure.

Figure 171:
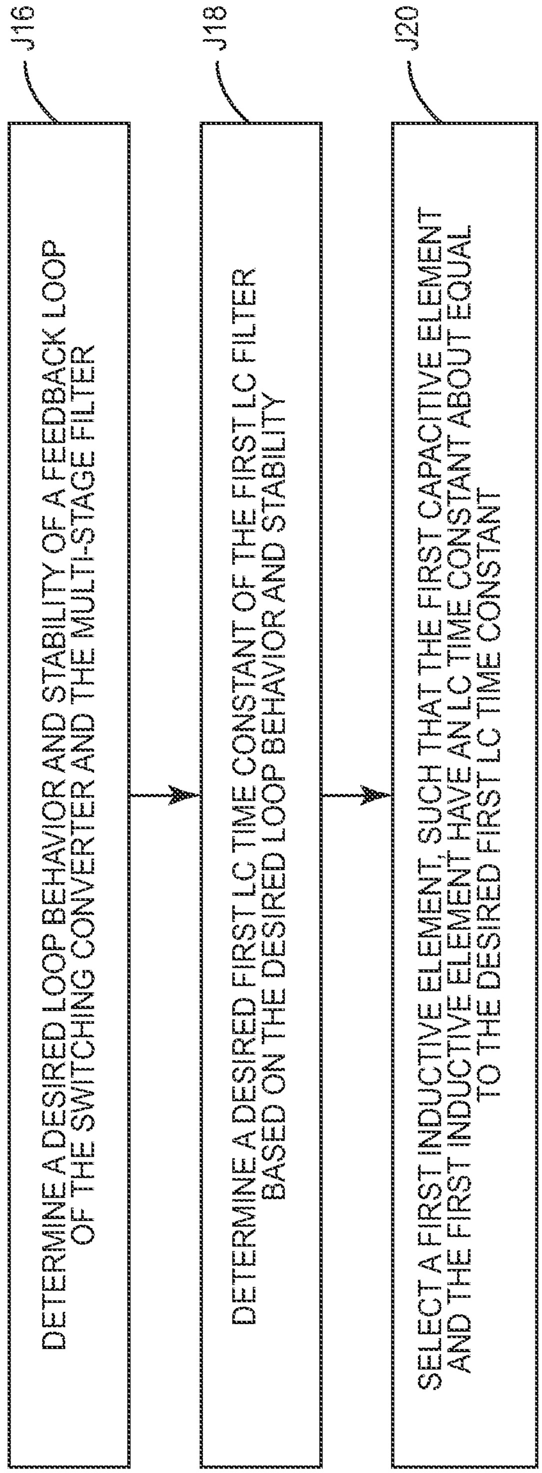

FIG. 171 illustrates a continuation of the process for selecting components for the multi-stage filter illustrated in FIG. 170 according to one embodiment of the present disclosure.

Figure 172:
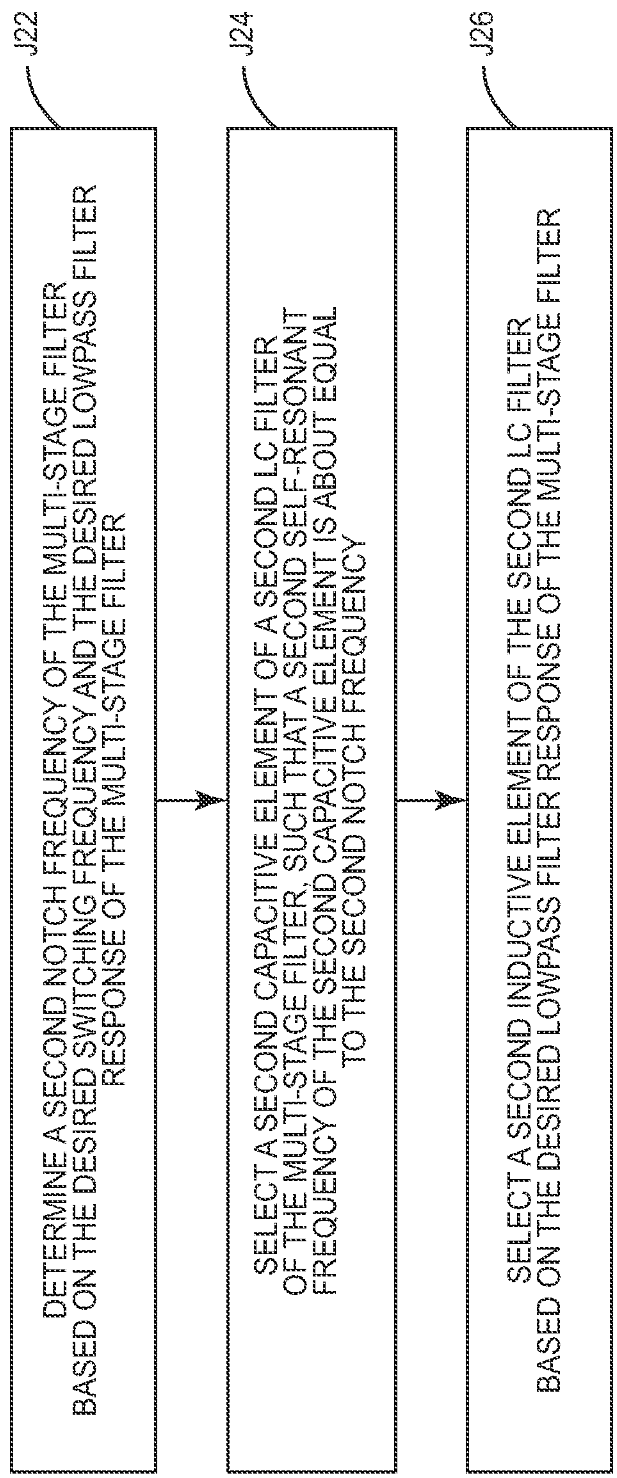

FIG. 172 illustrates a continuation of the process for selecting components for the multi-stage filter illustrated in FIG. 171 according to one embodiment of the present disclosure.

Figure 173:
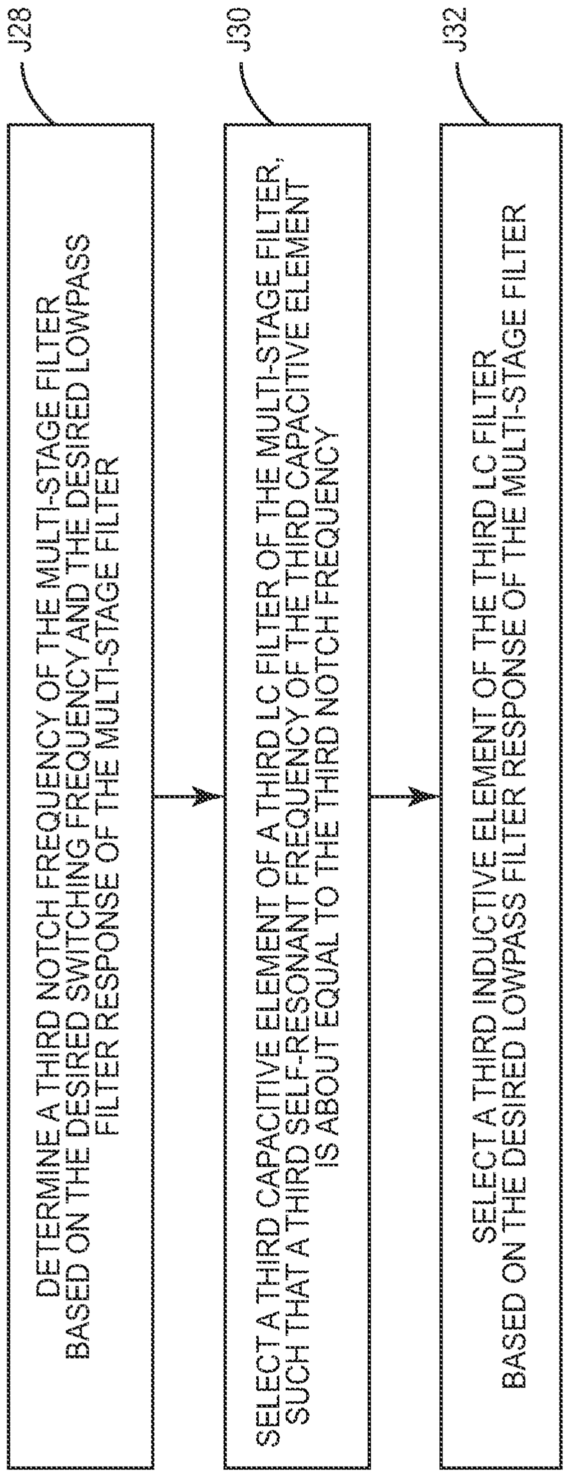

FIG. 173 illustrates a continuation of the process for selecting components for the multi-stage filter illustrated in FIG. 172 according to one embodiment of the present disclosure.

Figure 174:
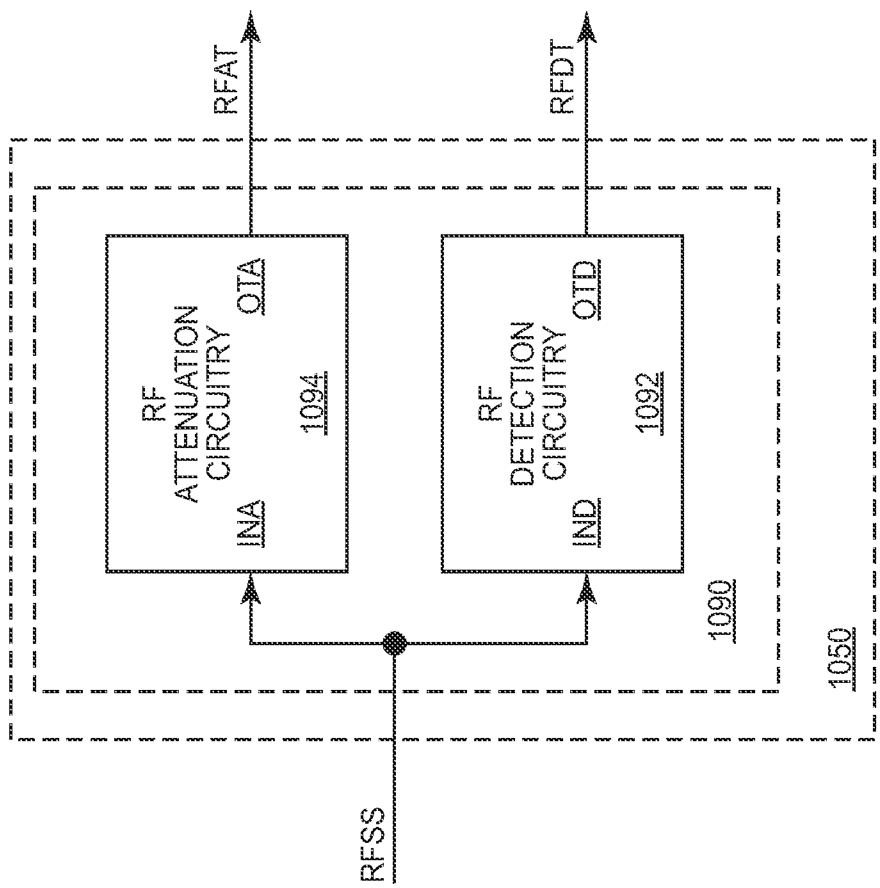

FIG. 174 shows RF signal conditioning circuitry according to one embodiment of the RF signal conditioning circuitry.

Figure 175:
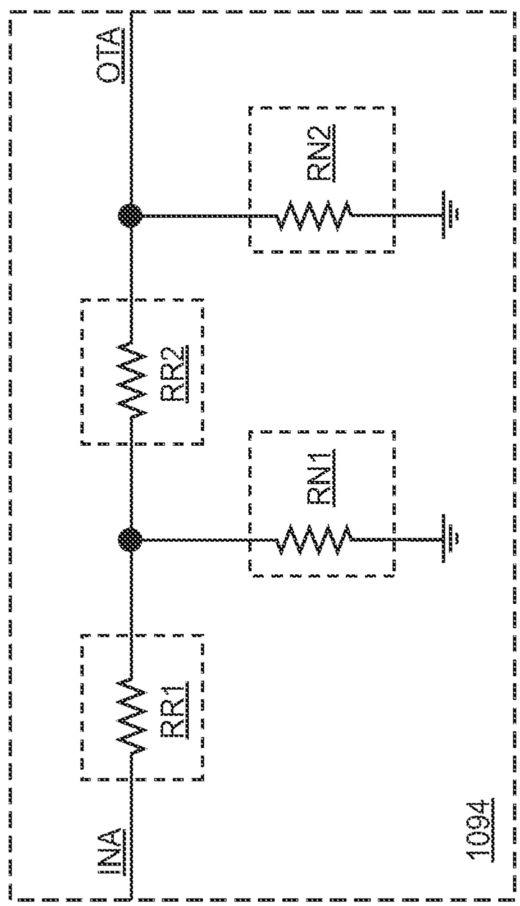

FIG. 175 shows details of RF attenuation circuitry illustrated in FIG. 174 according to one embodiment of the RF attenuation circuitry.

Figure 176:
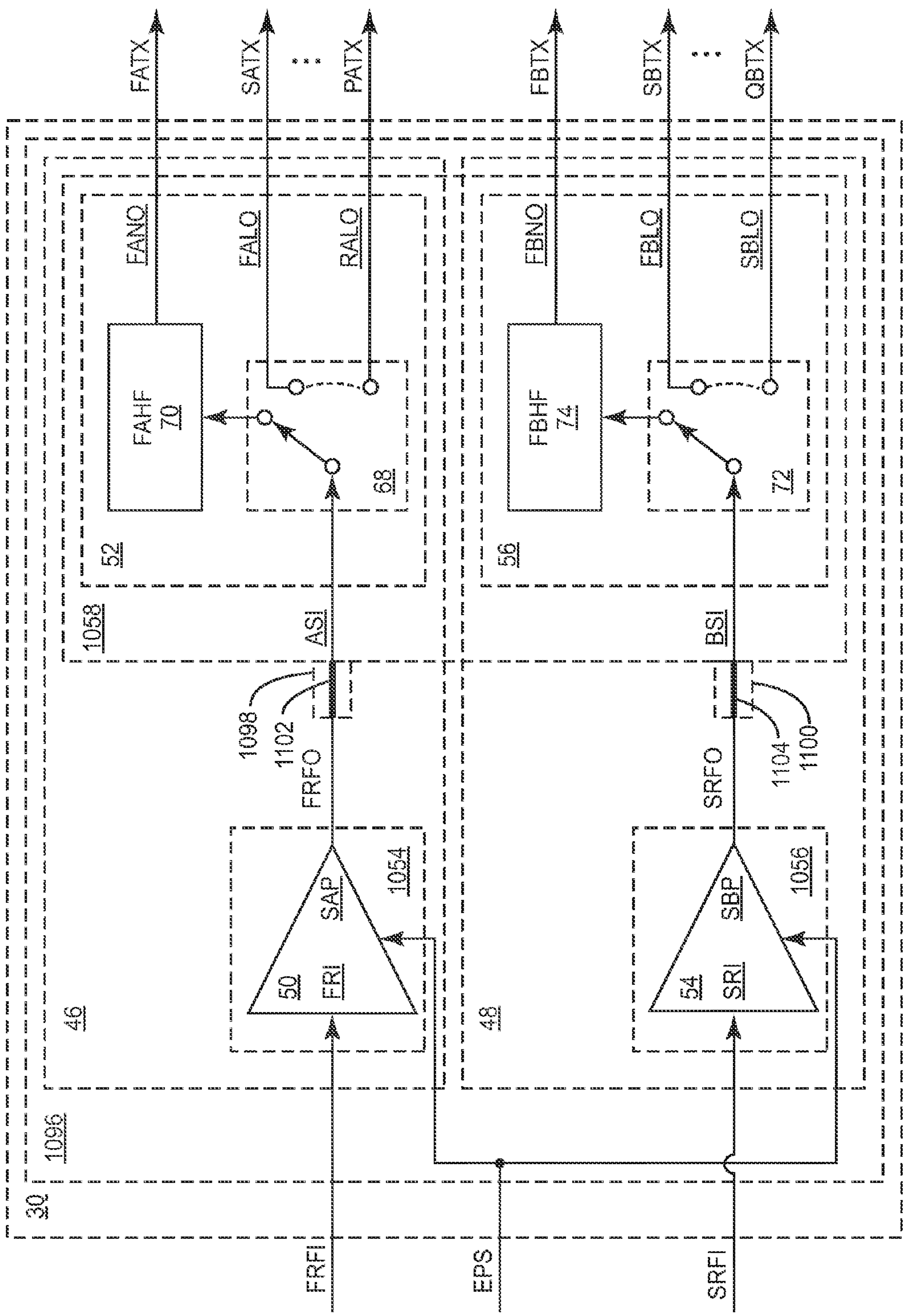

FIG. 176 is a schematic diagram showing details of the RF PA circuitry according to one embodiment of the RF PA circuitry.

Figure 177:
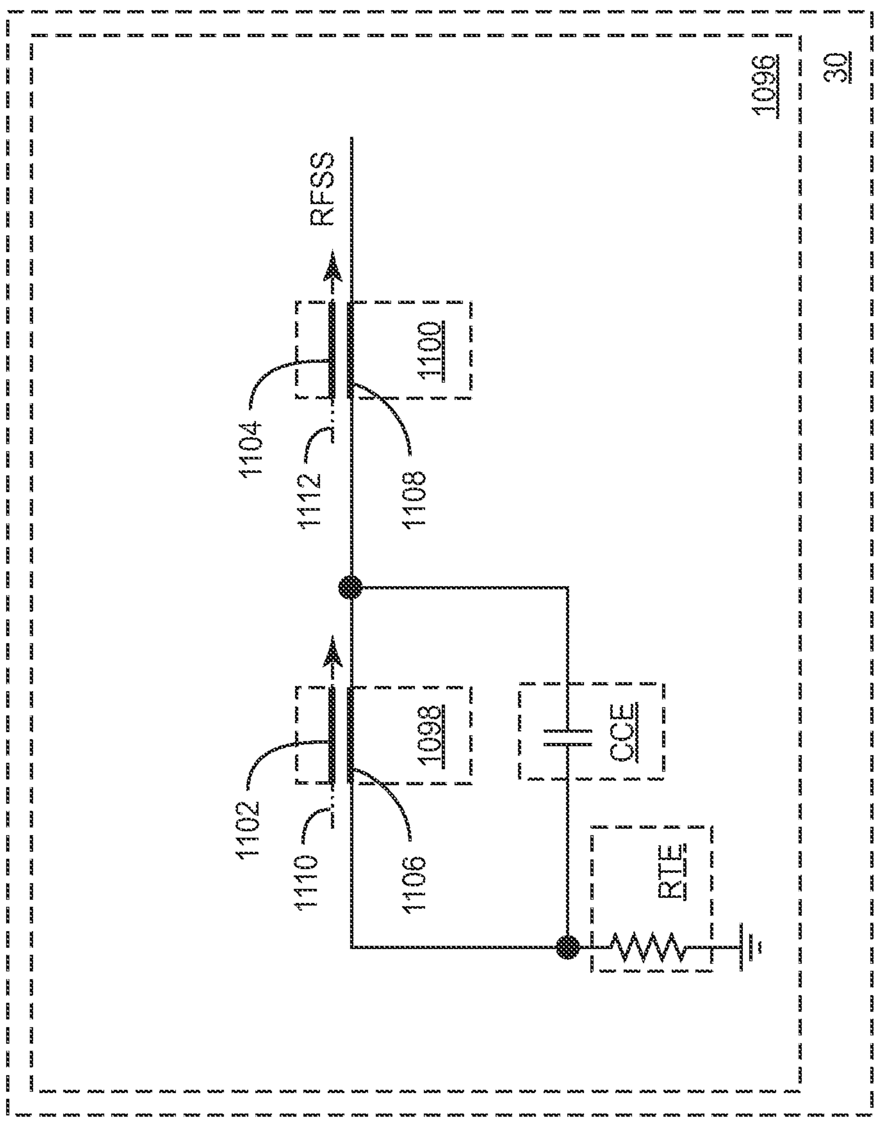

FIG. 177 shows details of the RF PA circuitry illustrated in FIG. 176 according to one embodiment of the RF PA circuitry.

Figure 178:
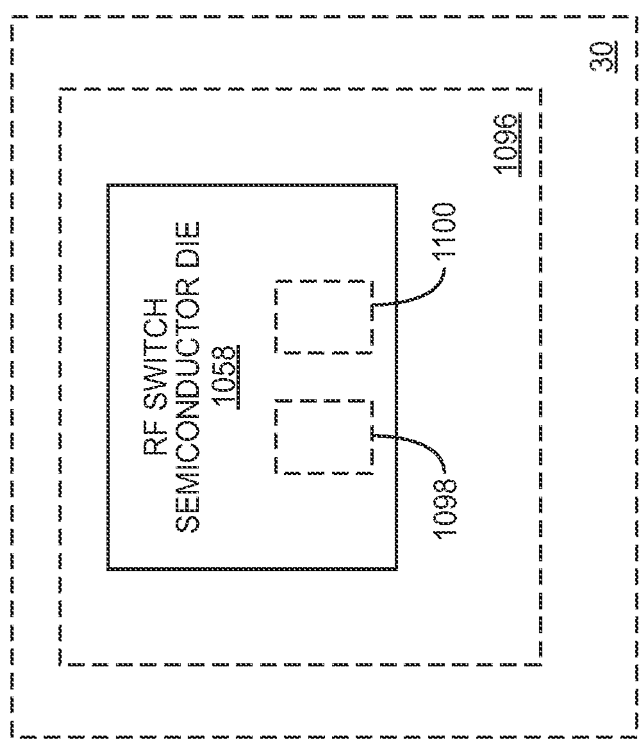

FIG. 178 shows a physical layout of the RF PA circuitry illustrated in FIG. 176 according to one embodiment of the RF PA circuitry.

DETAILED DESCRIPTION OF THE PREFERRED EMBODIMENTS

The embodiments set forth below represent the necessary information to enable those skilled in the art to practice the disclosure and illustrate the best mode of practicing the disclosure. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

Figure 1:
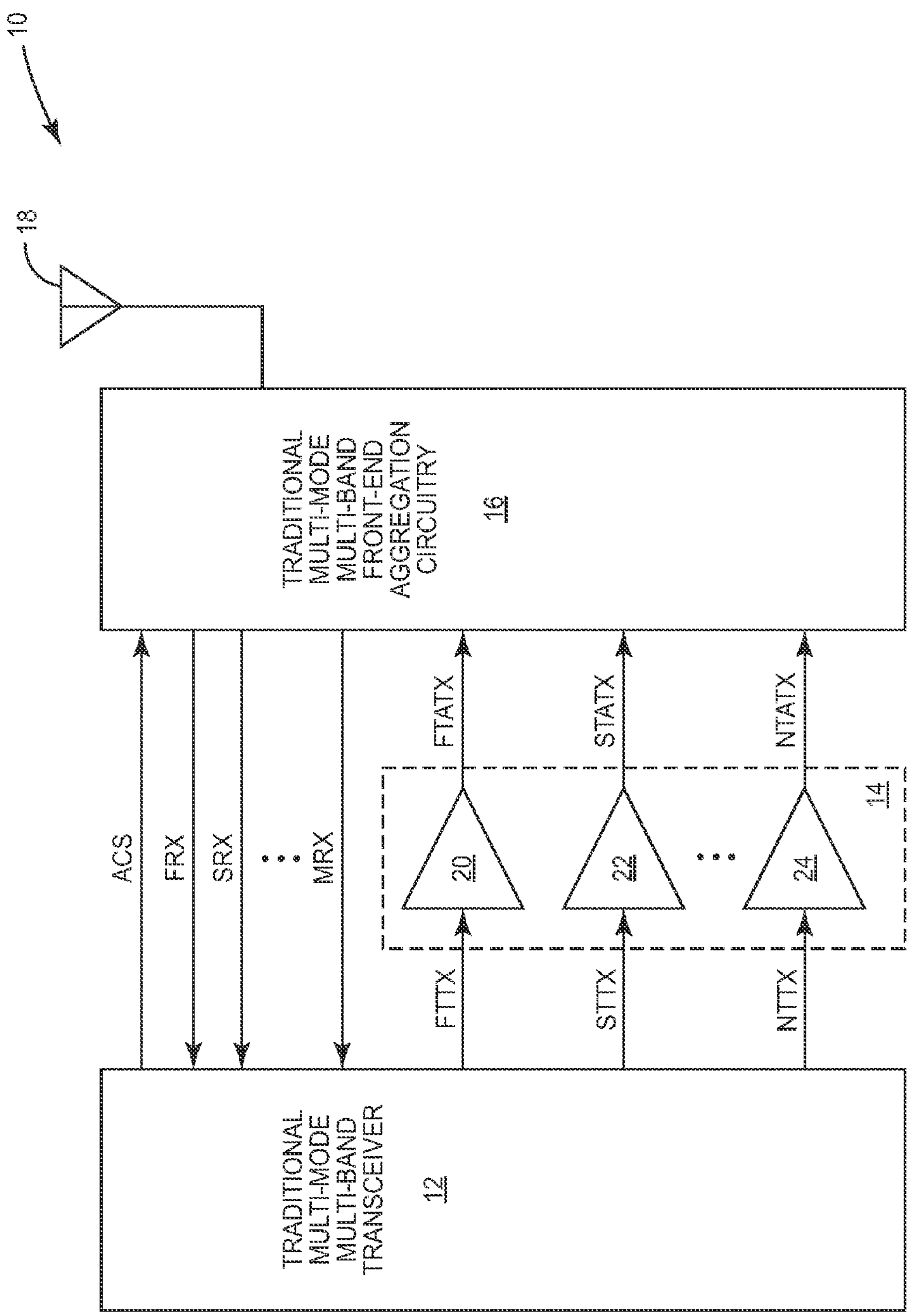
FIG. 1 shows a traditional multi-mode multi-band communications device according to the prior art.
Figure 2:
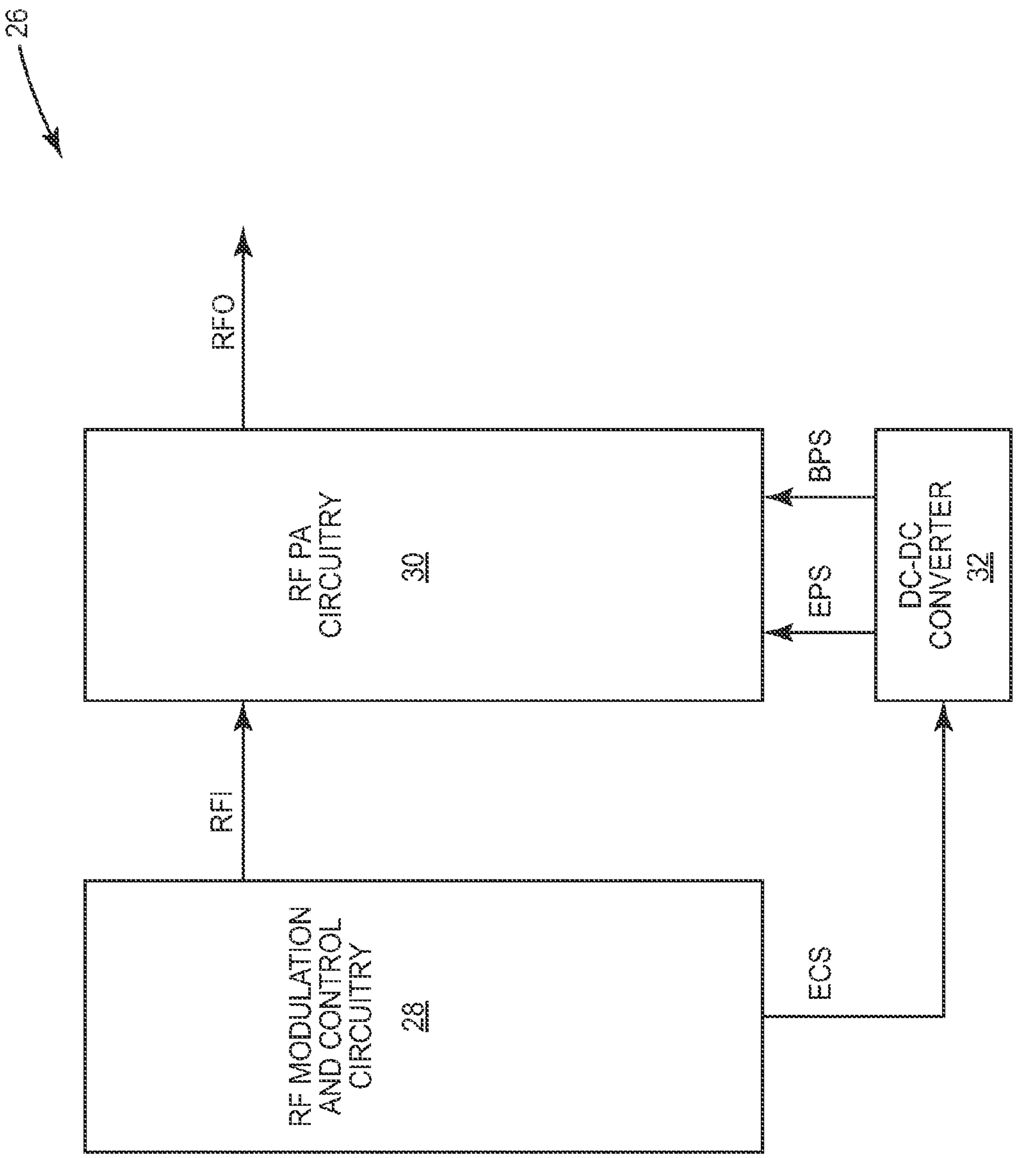
FIG. 2 shows an RF communications system according to one embodiment of the RF communications system.

FIG. 2 shows an RF communications system 26 according to one embodiment of the RF communications system 26. The RF communications system 26 includes RF modulation and control circuitry 28, RF PA circuitry 30, and a DC-DC converter 32. The RF modulation and control circuitry 28 provides an envelope control signal ECS to the DC-DC converter 32 and provides an RF input signal RFI to the RF PA circuitry 30. The DC-DC converter 32 provides a bias power supply signal BPS and an envelope power supply signal EPS to the RF PA circuitry 30. The envelope power supply signal EPS may be based on the envelope control signal ECS. As such, a magnitude of the envelope power supply signal EPS may be controlled by the RF modulation and control circuitry 28 via the envelope control signal ECS. The RF PA circuitry 30 may receive and amplify the RF input signal RFI to provide an RF output signal RFO. The envelope power supply signal EPS may provide power for amplification of the RF input signal RFI to the RF PA circuitry 30. The RF PA circuitry 30 may use the bias power supply signal BPS to provide biasing of amplifying elements in the RF PA circuitry 30.

In a first embodiment of the RF communications system 26, the RF communications system 26 is a multi-mode RF communications system 26. As such, the RF communications system 26 may operate using multiple communications modes. In this regard, the RF modulation and control circuitry 28 may be multi-mode RF modulation and control circuitry 28 and the RF PA circuitry 30 may be multi-mode RF PA circuitry 30. In a second embodiment of the RF communications system 26, the RF communications system 26 is a multi-band RF communications system 26. As such, the RF communications system 26 may operate using multiple RF communications bands. In this regard, the RF modulation and control circuitry 28 may be multi-band RF modulation and control circuitry 28 and the RF PA circuitry 30 may be multi-band RF PA circuitry 30. In a third embodiment of the RF communications system 26, the RF communications system 26 is a multi-mode multi-band RF communications system 26. As such, the RF communications system 26 may operate using multiple communications modes, multiple RF communications bands, or both. In this regard, the RF modulation and control circuitry 28 may be multi-mode multi-band RF modulation and control circuitry 28 and the RF PA circuitry 30 may be multi-mode multi-band RF PA circuitry 30.

The communications modes may be associated with any number of different communications protocols, such as Global System of Mobile communications (GSM), Gaussian Minimum Shift Keying (GMSK), IS-136, Enhanced Data rates for GSM Evolution (EDGE), Code Division Multiple Access (CDMA), Universal Mobile Telecommunications System (UMTS) protocols, such as Wideband CDMA (WCDMA), Worldwide Interoperability for Microwave Access (WIMAX), Long Term Evolution (LTE), or the like. The GSM, GMSK, and IS-136 protocols typically do not include amplitude modulation (AM). As such, the GSM, GMSK, and IS-136 protocols may be associated with a nonlinear mode. Further, the GSM, GMSK, and IS-136 protocols may be associated with a saturated mode. The EDGE, CDMA, UMTS, WCDMA, WIMAX, and LTE protocols may include AM. As such, the EDGE, CDMA, UMTS, WCDMA, WIMAX, and LTE protocols may be associated with a linear mode.

In one embodiment of the RF communications system 26, the RF communications system 26 is a mobile communications terminal, such as a cell phone, smartphone, laptop computer, tablet computer, personal digital assistant (PDA), or the like. In an alternate embodiment of the RF communications system 26, the RF communications system 26 is a fixed communications terminal, such as a base station, a cellular base station, a wireless router, a hotspot distribution node, a wireless access point, or the like. The antenna 18 may include any apparatus for conveying RF transmit and RF receive signals to and from at least one other RF communications system. As such, in one embodiment of the antenna 18, the antenna 18 is a single antenna. In an alternate embodiment of the antenna 18, the antenna 18 is an antenna array having multiple radiating and receiving elements. In an additional embodiment of the antenna 18, the antenna 18 is a distribution system for transmitting and receiving RF signals.

Figure 3:
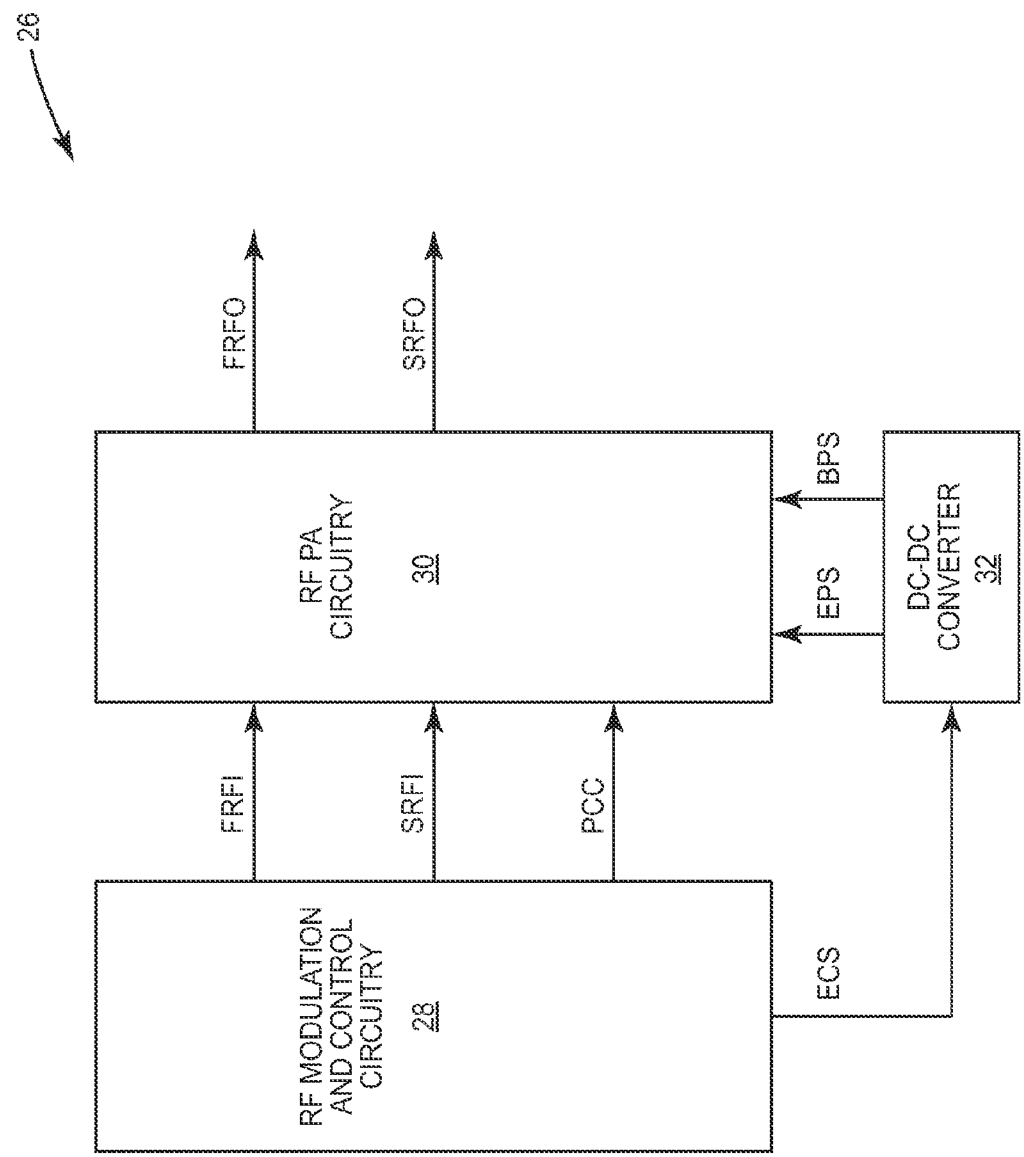
FIG. 3 shows the RF communications system according to an alternate embodiment of the RF communications system.

FIG. 3 shows the RF communications system 26 according to an alternate embodiment of the RF communications system 26. The RF communications system 26 illustrated in FIG. 3 is similar to the RF communications system 26 illustrated in FIG. 2, except in the RF communications system 26 illustrated in FIG. 3, the RF modulation and control circuitry 28 provides a first RF input signal FRFI, a second RF input signal SRFI, and a PA configuration control signal PCC to the RF PA circuitry 30. The RF PA circuitry 30 may receive and amplify the first RF input signal FRFI to provide a first RF output signal FRFO. The envelope power supply signal EPS may provide power for amplification of the first RF input signal FRFI to the RF PA circuitry 30. The RF PA circuitry 30 may receive and amplify the second RF input signal SRFI to provide a second RF output signal SRFO. The envelope power supply signal EPS may provide power for amplification of the second RF output signal SRFO to the RF PA circuitry 30. Certain configurations of the RF PA circuitry 30 may be based on the PA configuration control signal PCC. As a result, the RF modulation and control circuitry 28 may control such configurations of the RF PA circuitry 30.

Figure 4:
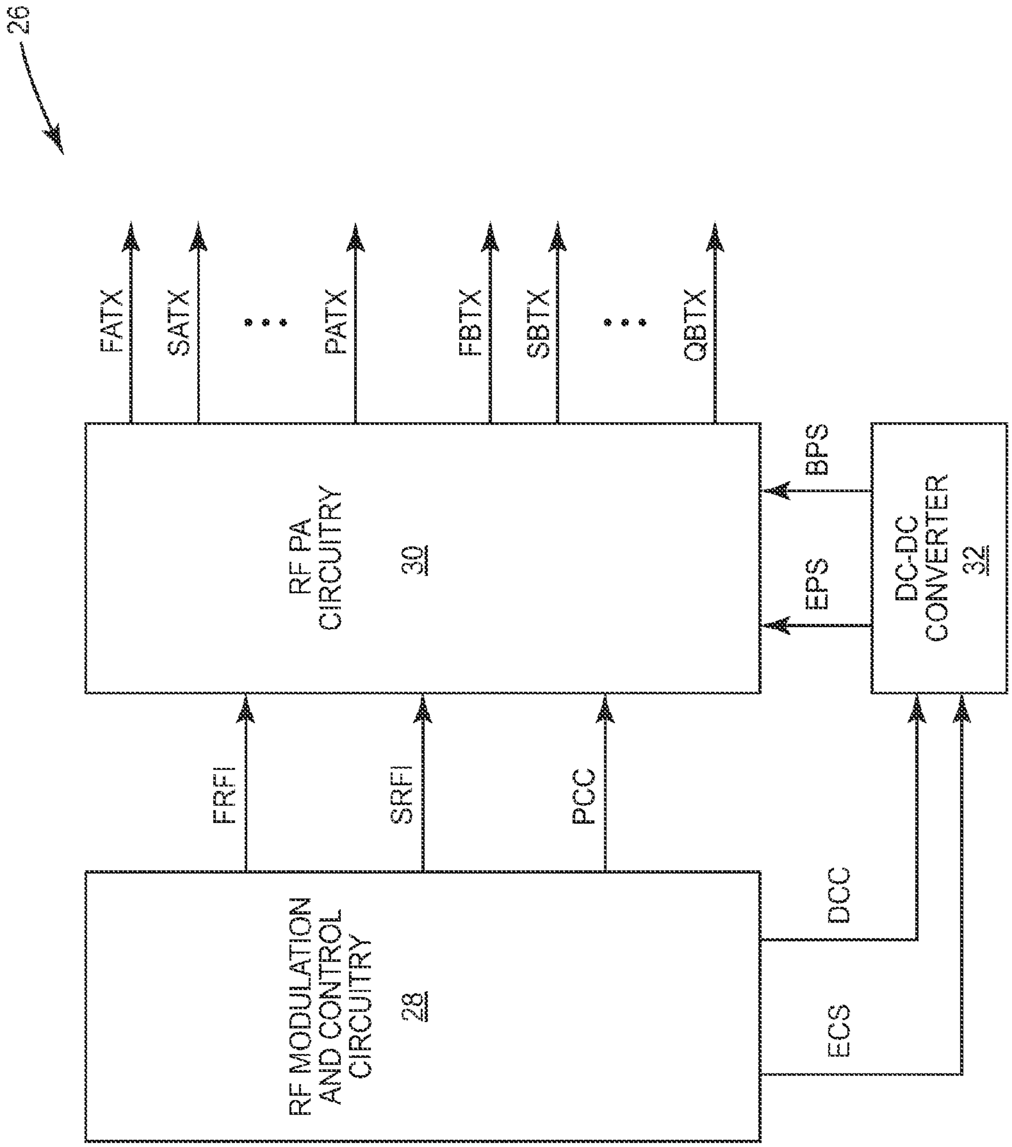
FIG. 4 shows the RF communications system according to an additional embodiment of the RF communications system.

FIG. 4 shows the RF communications system 26 according to an additional embodiment of the RF communications system 26. The RF communications system 26 illustrated in FIG. 4 is similar to the RF communications system 26 illustrated in FIG. 3, except in the RF communications system 26 illustrated in FIG. 4, the RF PA circuitry 30 does not provide the first RF output signal FRFO and the second RF output signal SRFO. Instead, the RF PA circuitry 30 may provide one of a first alpha RF transmit signal FATX, a second alpha RF transmit signal SATX, and up to and including a $P^{TH}$ alpha RF transmit signal PATX based on receiving and amplifying the first RF input signal FRFI. Similarly, the RF PA circuitry 30 may provide one of a first beta RF transmit signal FBTX, a second beta RF transmit signal SBTX, and up to and including a $Q^{TH}$ beta RF transmit signal QBTX based on receiving and amplifying the second RF input signal SRFI. The one of the transmit signals FATX, SATX, PATX, FBTX, SBTX, QBTX that is selected may be based on the PA configuration control signal PCC. Additionally, the RF modulation and control circuitry 28 may provide a DC configuration control signal DCC to the DC-DC converter 32. Certain configurations of the DC-DC converter 32 may be based on the DC configuration control signal DCC.

FIG. 5 shows the RF communications system 26 according to another embodiment of the RF communications system 26. The RF communications system 26 illustrated in FIG. 5 shows details of the RF modulation and control circuitry 28 and the RF PA circuitry 30 illustrated in FIG. 4. Additionally, the RF communications system 26 illustrated in FIG. 5 further includes transceiver circuitry 34, front-end aggregation circuitry 36, and the antenna 18. The transceiver circuitry 34 includes down-conversion circuitry 38, baseband processing circuitry 40, and the RF modulation and control circuitry 28, which includes control circuitry 42 and RF modulation circuitry 44. The RF PA circuitry 30 includes a first transmit path 46 and a second transmit path 48. The first transmit path 46 includes a first RF PA 50 and alpha switching circuitry 52. The second transmit path 48 includes a second RF PA 54 and beta switching circuitry 56. The front-end aggregation circuitry 36 is coupled to the antenna 18. The control circuitry 42 provides the aggregation control signal ACS to the front-end aggregation circuitry 36. Configuration of the front-end aggregation circuitry 36 may be based on the aggregation control signal ACS. As such, configuration of the front-end aggregation circuitry 36 may be controlled by the control circuitry 42 via the aggregation control signal ACS.

The control circuitry 42 provides the envelope control signal ECS and the DC configuration control signal DCC to the DC-DC converter 32. Further, the control circuitry 42 provides the PA configuration control signal PCC to the RF PA circuitry 30. As such, the control circuitry 42 may control configuration of the RF PA circuitry 30 via the PA configuration control signal PCC and may control a magnitude of the envelope power supply signal EPS via the envelope control signal ECS. The control circuitry 42 may select one of multiple communications modes, which may include a first half-duplex transmit mode, a first half-duplex receive mode, a second half-duplex transmit mode, a second half-duplex receive mode, a first full-duplex mode, a second full-duplex mode, at least one linear mode, at least one non-linear mode, multiple RF modulation modes, or any combination thereof. Further, the control circuitry 42 may select one of multiple frequency bands. The control circuitry 42 may provide the aggregation control signal ACS to the front-end aggregation circuitry 36 based on the selected mode and the selected frequency band. The front-end aggregation circuitry 36 may include various RF components, including RF switches; RF filters, such as bandpass filters, harmonic filters, and duplexers; RF amplifiers, such as low noise amplifiers (LNAs); impedance matching circuitry; the like; or any combination thereof. In this regard, routing of RF receive signals and RF transmit signals through the RF components may be based on the selected mode and the selected frequency band as directed by the aggregation control signal ACS.

The down-conversion circuitry 38 may receive the first RF receive signal FRX, the second RF receive signal SRX, and up to and including the $M^{TH}$ RF receive signal MRX from the antenna 18 via the front-end aggregation circuitry 36. Each of the RF receive signals FRX, SRX, MRX may be associated with at least one selected mode, at least one selected frequency band, or both. The down-conversion circuitry 38 may down-convert any of the RF receive signals FRX, SRX, MRX to baseband receive signals, which may be forwarded to the baseband processing circuitry 40 for processing. The baseband processing circuitry 40 may provide baseband transmit signals to the RF modulation circuitry 44, which may RF modulate the baseband transmit signals to provide the first RF input signal FRFI or the second RF input signal SRFI to the first RF PA 50 or the second RF PA 54, respectively, depending on the selected communications mode.

The first RF PA 50 may receive and amplify the first RF input signal FRFI to provide the first RF output signal FRFO to the alpha switching circuitry 52. Similarly, the second RF PA 54 may receive and amplify the second RF input signal SRFI to provide the second RF output signal SRFO to the beta switching circuitry 56. The first RF PA 50 and the second RF PA 54 may receive the envelope power supply signal EPS, which may provide power for amplification of the first RF input signal FRFI and the second RF input signal SRFI, respectively. The alpha switching circuitry 52 may forward the first RF output signal FRFO to provide one of the alpha transmit signals FATX, SATX, PATX to the antenna 18 via the front-end aggregation circuitry 36, depending on the selected communications mode based on the PA configuration control signal PCC. Similarly, the beta switching circuitry 56 may forward the second RF output signal SRFO to provide one of the beta transmit signals FBTX, SBTX, QBTX to the antenna 18 via the front-end aggregation circuitry 36, depending on the selected communications mode based on the PA configuration control signal PCC.

FIG. 6 shows the RF communications system 26 according to a further embodiment of the RF communications system 26. The RF communications system 26 illustrated in FIG. 6 is similar to the RF communications system 26 illustrated in FIG. 5, except in the RF communications system 26 illustrated in FIG. 6, the transceiver circuitry 34 includes a control circuitry digital communications interface (DCI) 58, the RF PA circuitry 30 includes a PA-DCI 60, the DC-DC converter 32 includes a DC-DC converter DCI 62, and the front-end aggregation circuitry 36 includes an aggregation circuitry DCI 64. The front-end aggregation circuitry 36 includes an antenna port AP, which is coupled to the antenna 18. In one embodiment of the RF communications system 26, the antenna port AP is directly coupled to the antenna 18. In one embodiment of the RF communications system 26, the front-end aggregation circuitry 36 is coupled between the alpha switching circuitry 52 and the antenna port AP. Further, the front-end aggregation circuitry 36 is coupled between the beta switching circuitry 56 and the antenna port AP. The alpha switching circuitry 52 may be multi-mode multi-band alpha switching circuitry and the beta switching circuitry 56 may be multi-mode multi-band beta switching circuitry.

The DCIs 58, 60, 62, 64 are coupled to one another using a digital communications bus 66. In the digital communications bus 66 illustrated in FIG. 6, the digital communications bus 66 is a uni-directional bus in which the control circuitry DCI 58 may communicate information to the PA-DCI 60, the DC-DC converter DCI 62, the aggregation circuitry DCI 64, or any combination thereof. As such, the control circuitry 42 may provide the envelope control signal ECS and the DC configuration control signal DCC via the control circuitry DCI 58 to the DC-DC converter 32 via the DC-DC converter DCI 62. Similarly, the control circuitry 42 may provide the aggregation control signal ACS via the control circuitry DCI 58 to the front-end aggregation circuitry 36 via the aggregation circuitry DCI 64. Additionally, the control circuitry 42 may provide the PA configuration control signal PCC via the control circuitry DCI 58 to the RF PA circuitry 30 via the PA-DCI 60.

Figure 7:
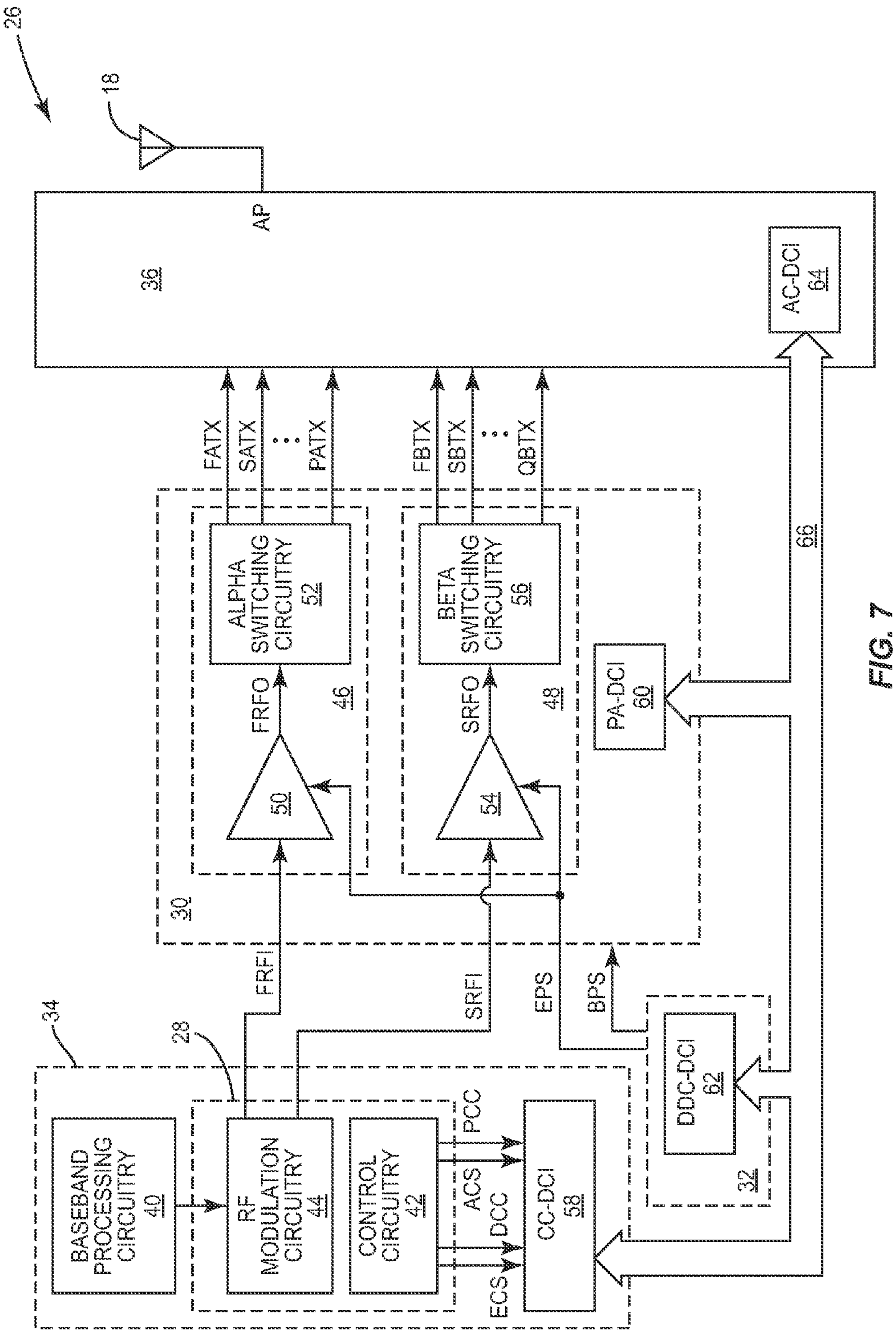
FIG. 7 shows the RF communications system according to one embodiment of the RF communications system.

FIG. 7 shows the RF communications system 26 according to one embodiment of the RF communications system 26. The RF communications system 26 illustrated in FIG. 7 is similar to the RF communications system 26 illustrated in FIG. 6, except in the RF communications system 26 illustrated in FIG. 7, the digital communications bus 66 is a bi-directional bus and each of the DCIs 58, 60, 62, 64 is capable of receiving or transmitting information. In alternate embodiments of the RF communications system 26, any or all of the DCIs 58, 60, 62, 64 may be uni-directional and any or all of the DCIs 58, 60, 62, 64 may be bi-directional.

Figure 8:
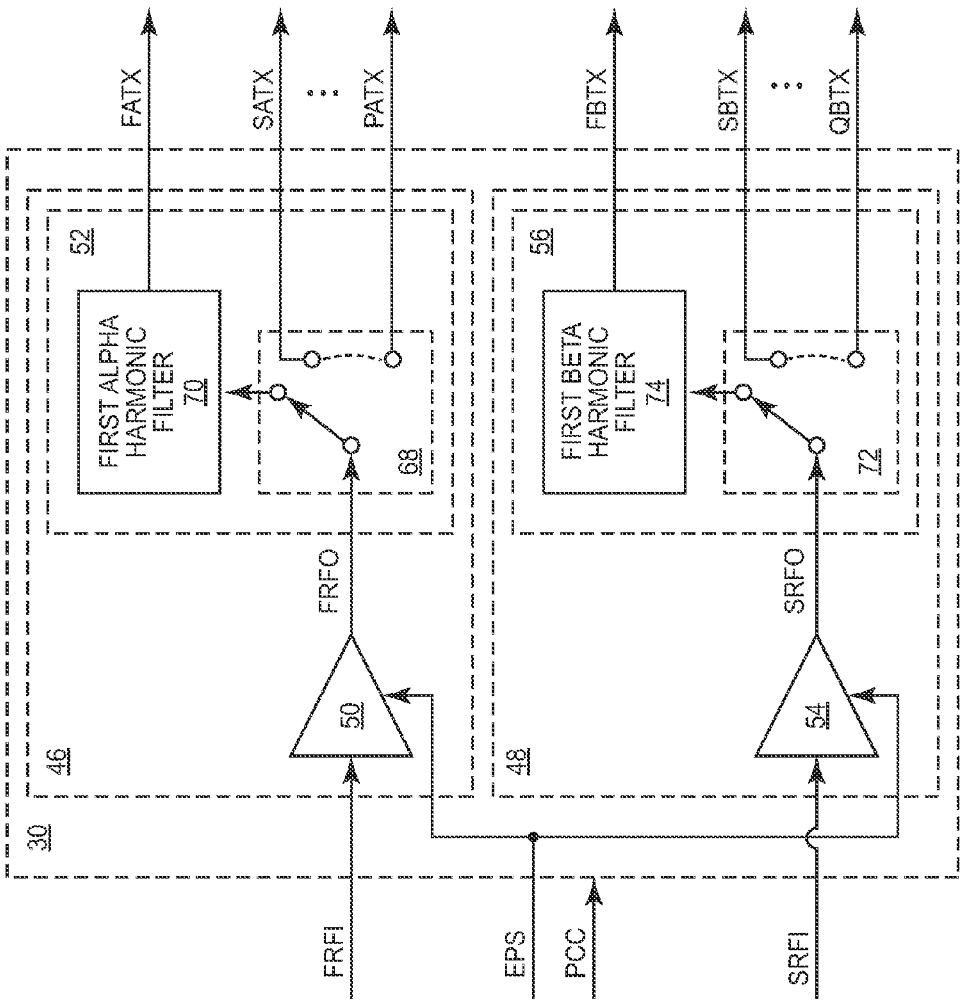
FIG. 8 shows details of RF power amplifier (PA) circuitry illustrated in FIG. 5 according to one embodiment of the RF PA circuitry.

FIG. 8 shows details of the RF PA circuitry 30 illustrated in FIG. 5 according to one embodiment of the RF PA circuitry 30. Specifically, FIG. 8 shows details of the alpha switching circuitry 52 and the beta switching circuitry 56 according to one embodiment of the alpha switching circuitry 52 and the beta switching circuitry 56. The alpha switching circuitry 52 includes an alpha RF switch 68 and a first alpha harmonic filter 70. The beta switching circuitry 56 includes a beta RF switch 72 and a first beta harmonic filter 74. Configuration of the alpha RF switch 68 and the beta RF switch 72 may be based on the PA configuration control signal PCC. In one communications mode, such as an alpha half-duplex transmit mode, an alpha saturated mode, or an alpha non-linear mode, the alpha RF switch 68 is configured to forward the first RF output signal FRFO to provide the first alpha RF transmit signal FATX via the first alpha harmonic filter 70. In another communications mode, such as an alpha full-duplex mode or an alpha linear mode, the alpha RF switch 68 is configured to forward the first RF output signal FRFO to provide any of the second alpha RF transmit signal SATX through the $P^{TH}$ alpha RF transmit signal PATX. When a specific RF band is selected, the alpha RF switch 68 may be configured to provide a corresponding selected one of the second alpha RF transmit signal SATX through the $P^{TH}$ alpha RF transmit signal PATX.

In one communications mode, such as a beta half-duplex transmit mode, a beta saturated mode, or a beta non-linear mode, the beta RF switch 72 is configured to forward the second RF output signal SRFO to provide the first beta RF transmit signal FBTX via the first beta harmonic filter 74. In another communications mode, such as a beta full-duplex mode or a beta linear mode, the beta RF switch 72 is configured to forward the second RF output signal SRFO to provide any of the second beta RF transmit signal SBTX through the $Q^{TH}$ beta RF transmit signal QBTX. When a specific RF band is selected, beta RF switch 72 may be configured to provide a corresponding selected one of the second beta RF transmit signal SBTX through the $Q^{TH}$ beta RF transmit signal QBTX. The first alpha harmonic filter 70 may be used to filter out harmonics of an RF carrier in the first RF output signal FRFO. The first beta harmonic filter 74 may be used to filter out harmonics of an RF carrier in the second RF output signal SRFO.

Figure 9:
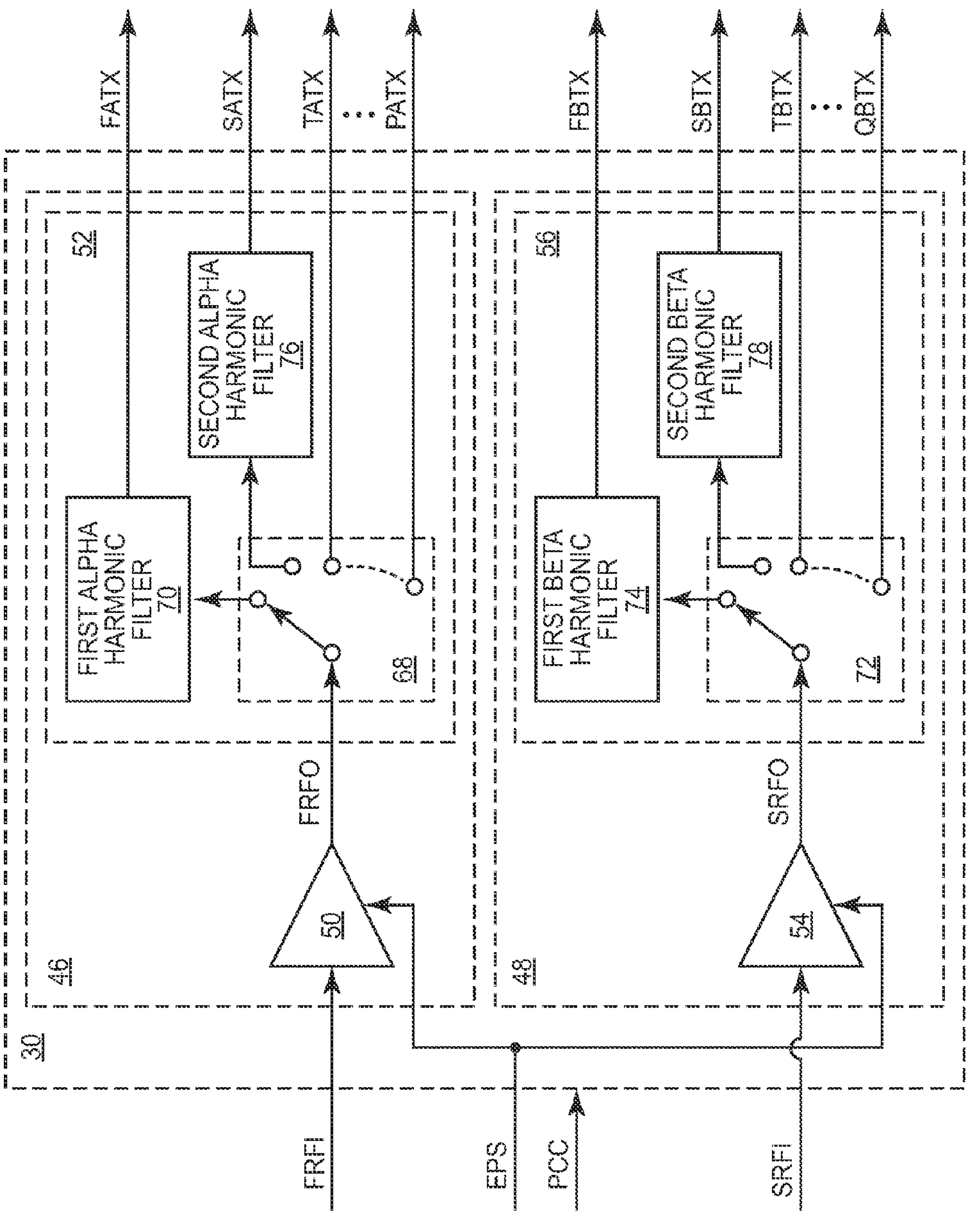
FIG. 9 shows details of the RF PA circuitry illustrated in FIG. 5 according to an alternate embodiment of the RF PA circuitry.

FIG. 9 shows details of the RF PA circuitry 30 illustrated in FIG. 5 according to an alternate embodiment of the RF PA circuitry 30. Specifically, FIG. 9 shows details of the alpha switching circuitry 52 and the beta switching circuitry 56 according to an alternate embodiment of the alpha switching circuitry 52 and the beta switching circuitry 56. The alpha switching circuitry 52 includes the alpha RF switch 68, the first alpha harmonic filter 70, and a second alpha harmonic filter 76. The beta switching circuitry 56 includes the beta RF switch 72, the first beta harmonic filter 74, and a second beta harmonic filter 78. Configuration of the alpha RF switch 68 and the beta RF switch 72 may be based on the PA configuration control signal PCC. In one communications mode, such as a first alpha half-duplex transmit mode, a first alpha saturated mode, or a first alpha non-linear mode, the alpha RF switch 68 is configured to forward the first RF output signal FRFO to provide the first alpha RF transmit signal FATX via the first alpha harmonic filter 70. In another communications mode, such as a second alpha half-duplex transmit mode, a second alpha saturated mode, or a second alpha non-linear mode, the alpha RF switch 68 is configured to forward the first RF output signal FRFO to provide the second alpha RF transmit signal SATX via the second alpha harmonic filter 76. In an alternate communications mode, such as an alpha full-duplex mode or an alpha linear mode, the alpha RF switch 68 is configured to forward the first RF output signal FRFO to provide any of a third alpha RF transmit signal TATX through the $P^{TH}$ alpha RF transmit signal PATX. When a specific RF band is selected, the alpha RF switch 68 may be configured to provide a corresponding selected one of the third alpha RF transmit signal TATX through the $P^{TH}$ alpha RF transmit signal PATX.

In one communications mode, such as a first beta half-duplex transmit mode, a first beta saturated mode, or a first beta non-linear mode, the beta RF switch 72 is configured to forward the second RF output signal SRFO to provide the first beta RF transmit signal FBTX via the first beta harmonic filter 74. In another communications mode, such as a second beta half-duplex transmit mode, a second beta saturated mode, or a second beta non-linear mode, the beta RF switch 72 is configured to forward the second RF output signal SRFO to provide the second beta RF transmit signal SBTX via the second beta harmonic filter 78. In an alternate communications mode, such as a beta full-duplex mode or a beta linear mode, the beta RF switch 72 is configured to forward the second RF output signal SRFO to provide any of a third beta RF transmit signal TBTX through the $Q^{TH}$ beta RF transmit signal QBTX. When a specific RF band is selected, the beta RF switch 72 may be configured to provide a corresponding selected one of the third beta RF transmit signal TBTX through the $Q^{TH}$ beta RF transmit signal QBTX. The first alpha harmonic filter 70 or the second alpha harmonic filter 76 may be used to filter out harmonics of an RF carrier in the first RF output signal FRFO. The first beta harmonic filter 74 or the second beta harmonic filter 78 may be used to filter out harmonics of an RF carrier in the second RF output signal SRFO.

Figure 10:
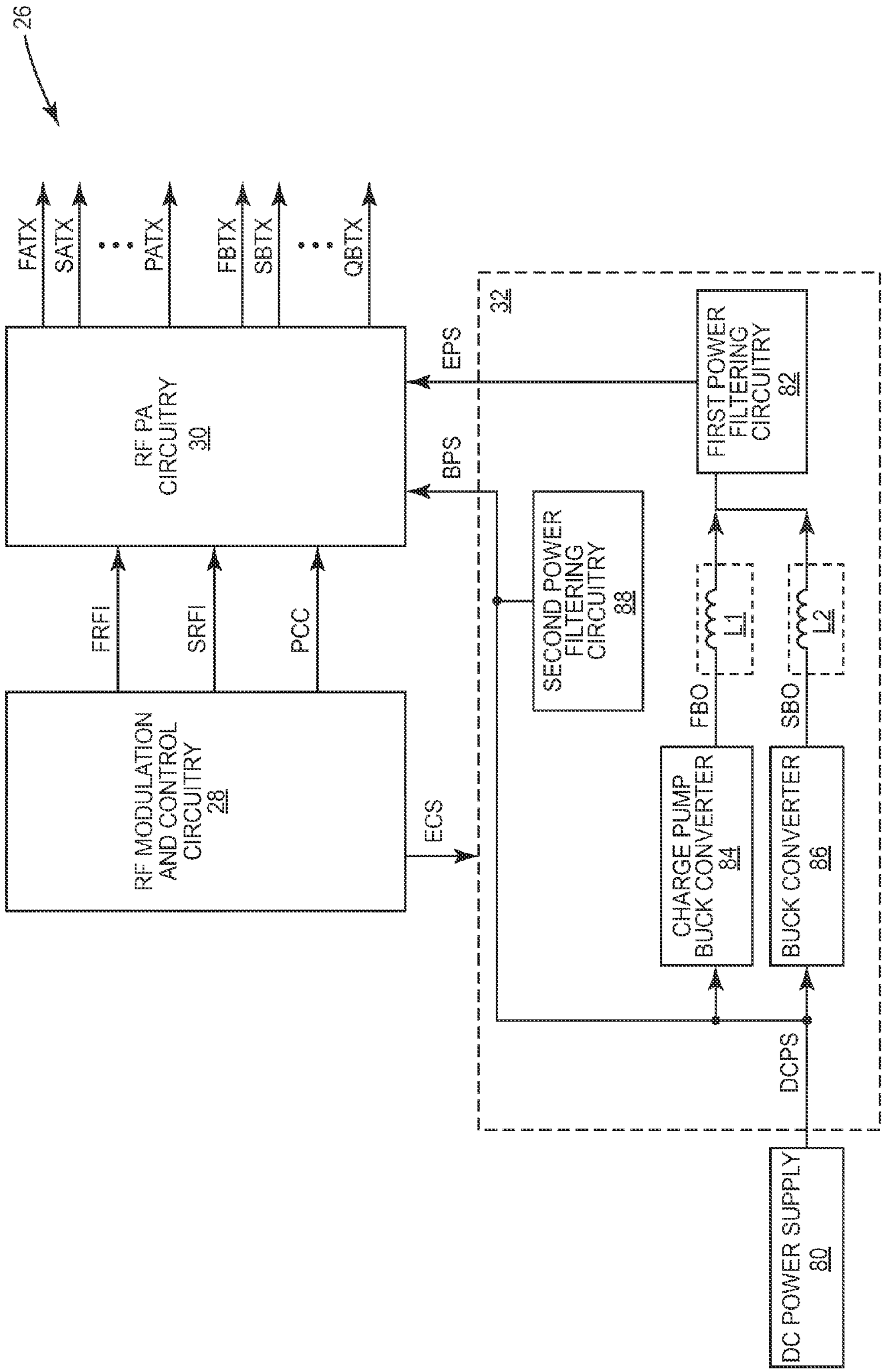
FIG. 10 shows the RF communications system according to one embodiment of the RF communications system.

FIG. 10 shows the RF communications system 26 according to one embodiment of the RF communications system 26. The RF communications system 26 shown in FIG. 10 is similar to the RF communications system 26 shown in FIG. 4, except the RF communications system 26 illustrated in FIG. 10 further includes a DC power supply 80 and the DC configuration control signal DCC is omitted. Additionally, details of the DC-DC converter 32 are shown according to one embodiment of the DC-DC converter 32. The DC-DC converter 32 includes first power filtering circuitry 82, a charge pump buck converter 84, a buck converter 86, second power filtering circuitry 88, a first inductive element L1, and a second inductive element L2. The DC power supply 80 provides a DC power supply signal DCPS to the charge pump buck converter 84, the buck converter 86, and the second power filtering circuitry 88. In one embodiment of the DC power supply 80, the DC power supply 80 is a battery.

The second power filtering circuitry 88 is coupled to the RF PA circuitry 30 and to the DC power supply 80. The charge pump buck converter 84 is coupled to the DC power supply 80. The first inductive element L1 is coupled between the charge pump buck converter 84 and the first power filtering circuitry 82. The buck converter 86 is coupled to the DC power supply 80. The second inductive element L2 is coupled between the buck converter 86 and the first power filtering circuitry 82. The first power filtering circuitry 82 is coupled to the RF PA circuitry 30. One end of the first inductive element L1 is coupled to one end of the second inductive element L2 at the first power filtering circuitry 82.

In one embodiment of the DC-DC converter 32, the DC-DC converter 32 operates in one of multiple converter operating modes, which include a first converter operating mode, a second converter operating mode, and a third converter operating mode. In an alternate embodiment of the DC-DC converter 32, the DC-DC converter 32 operates in one of the first converter operating mode and the second converter operating mode. In the first converter operating mode, the charge pump buck converter 84 is active, such that the envelope power supply signal EPS is based on the DC power supply signal DCPS via the charge pump buck converter 84, and the first inductive element L1. In the first converter operating mode, the buck converter 86 is inactive and does not contribute to the envelope power supply signal EPS. In the second converter operating mode, the buck converter 86 is active, such that the envelope power supply signal EPS is based on the DC power supply signal DCPS via the buck converter 86 and the second inductive element L2. In the second converter operating mode, the charge pump buck converter 84 is inactive, such that the charge pump buck converter 84 does not contribute to the envelope power supply signal EPS. In the third converter operating mode, the charge pump buck converter 84 and the buck converter 86 are active, such that either the charge pump buck converter 84; the buck converter 86; or both may contribute to the envelope power supply signal EPS. As such, in the third converter operating mode, the envelope power supply signal EPS is based on the DC power supply signal DCPS either via the charge pump buck converter 84, and the first inductive element L1; via the buck converter 86 and the second inductive element L2; or both.

The second power filtering circuitry 88 filters the DC power supply signal DCPS to provide the bias power supply signal BPS. The second power filtering circuitry 88 may function as a lowpass filter by removing ripple, noise, and the like from the DC power supply signal DCPS to provide the bias power supply signal BPS. As such, in one embodiment of the DC-DC converter 32, the bias power supply signal BPS is based on the DC power supply signal DCPS.

In the first converter operating mode or the third converter operating mode, the charge pump buck converter 84 may receive, charge pump, and buck convert the DC power supply signal DCPS to provide a first buck output signal FBO to the first inductive element L1. As such, in one embodiment of the charge pump buck converter 84, the first buck output signal FBO is based on the DC power supply signal DCPS. Further, the first inductive element L1 may function as a first energy transfer element of the charge pump buck converter 84 to transfer energy via the first buck output signal FBO to the first power filtering circuitry 82. In the first converter operating mode or the third converter operating mode, the first inductive element L1 and the first power filtering circuitry 82 may receive and filter the first buck output signal FBO to provide the envelope power supply signal EPS. The charge pump buck converter 84 may regulate the envelope power supply signal EPS by controlling the first buck output signal FBO based on a setpoint of the envelope power supply signal EPS provided by the envelope control signal ECS.

In the second converter operating mode or the third converter operating mode, the buck converter 86 may receive and buck convert the DC power supply signal DCPS to provide a second buck output signal SBO to the second inductive element L2. As such, in one embodiment of the buck converter 86, the second buck output signal SBO is based on the DC power supply signal DCPS. Further, the second inductive element L2 may function as a second energy transfer element of the buck converter 86 to transfer energy via the first power filtering circuitry 82 to the first power filtering circuitry 82. In the second converter operating mode or the third converter operating mode, the second inductive element L2 and the first power filtering circuitry 82 may receive and filter the second buck output signal SBO to provide the envelope power supply signal EPS. The buck converter 86 may regulate the envelope power supply signal EPS by controlling the second buck output signal SBO based on a setpoint of the envelope power supply signal EPS provided by the envelope control signal ECS.

In one embodiment of the charge pump buck converter 84, the charge pump buck converter 84 operates in one of multiple pump buck operating modes. During a pump buck pump-up operating mode of the charge pump buck converter 84, the charge pump buck converter 84 pumps-up the DC power supply signal DCPS to provide an internal signal (not shown), such that a voltage of the internal signal is greater than a voltage of the DC power supply signal DCPS. In an alternate embodiment of the charge pump buck converter 84, during the pump buck pump-up operating mode, a voltage of the envelope power supply signal EPS is greater than the voltage of the DC power supply signal DCPS. During a pump buck pump-down operating mode of the charge pump buck converter 84, the charge pump buck converter 84 pumps-down the DC power supply signal DCPS to provide the internal signal, such that a voltage of the internal signal is less than a voltage of the DC power supply signal DCPS. In an alternate embodiment of the charge pump buck converter 84, during the pump buck pump-down operating mode, the voltage of the envelope power supply signal EPS is less than the voltage of the DC power supply signal DCPS. During a pump buck pump-even operating mode of the charge pump buck converter 84, the charge pump buck converter 84 pumps the DC power supply signal DCPS to the internal signal, such that a voltage of the internal signal is about equal to a voltage of the DC power supply signal DCPS. One embodiment of the DC-DC converter 32 includes a pump buck bypass operating mode of the charge pump buck converter 84, such that during the pump buck bypass operating mode, the charge pump buck converter 84 by-passes charge pump circuitry (not shown) using by-pass circuitry (not shown) to forward the DC power supply signal DCPS to provide the internal signal, such that a voltage of the internal is about equal to a voltage of the DC power supply signal DCPS.

In one embodiment of the charge pump buck converter 84, the pump buck operating modes include the pump buck pump-up operating mode, the pump buck pump-down operating mode, the pump buck pump-even operating mode, and the pump buck bypass operating mode. In an alternate embodiment of the charge pump buck converter 84, the pump buck pump-even operating mode is omitted. In an additional embodiment of the charge pump buck converter 84, the pump buck bypass operating mode is omitted. In another embodiment of the charge pump buck converter 84, the pump buck pump-down operating mode is omitted. In a further embodiment of the charge pump buck converter 84, any or all of the pump buck pump-up operating mode, the pump buck pump-down operating mode, the pump buck pump-even operating mode, and the pump buck bypass operating mode are omitted. In a supplemental embodiment of the charge pump buck converter 84, the charge pump buck converter 84 operates in only the pump buck pump-up operating mode. In an additional embodiment of the charge pump buck converter 84, the charge pump buck converter 84 operates in one of the pump buck pump-up operating mode and at least one other pump buck operating mode of the charge pump buck converter 84. The at least one other pump buck operating mode of the charge pump buck converter 84 may include any or all of the pump buck pump-up operating mode, the pump buck pump-down operating mode, the pump buck pump-even operating mode, and the pump buck bypass operating mode.

Figure 11:
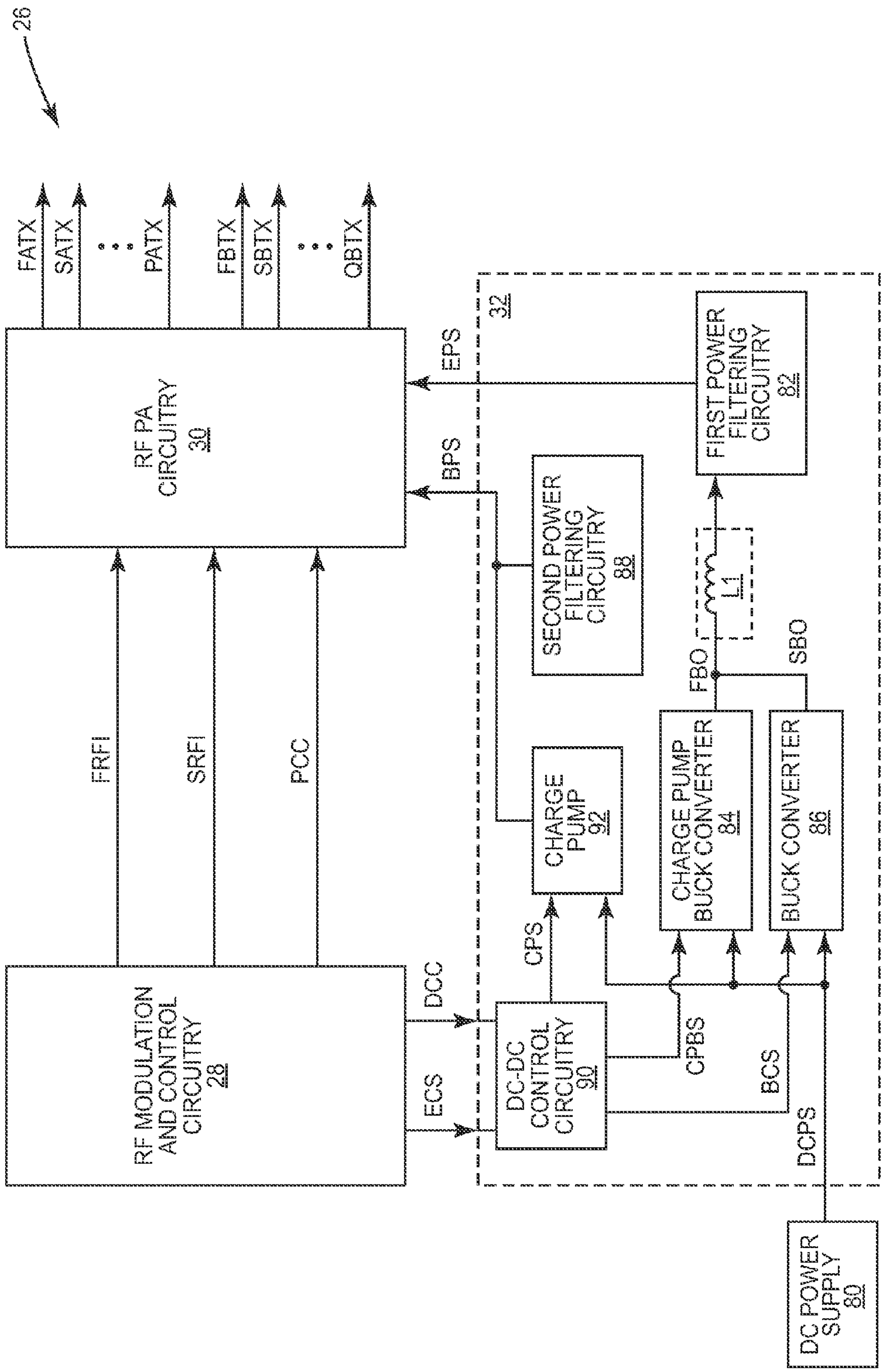
FIG. 11 shows the RF communications system according to an alternate embodiment of the RF communications system.

FIG. 11 shows the RF communications system 26 according to an alternate embodiment of the RF communications system 26. The RF communications system 26 illustrated in FIG. 11 is similar to the RF communications system 26 illustrated in FIG. 10, except in the RF communications system 26 illustrated in FIG. 11, the DC-DC converter 32 further includes DC-DC control circuitry 90 and a charge pump 92, and omits the second inductive element L2. Instead of the second power filtering circuitry 88 being coupled to the DC power supply 80 as shown in FIG. 10, the charge pump 92 is coupled to the DC power supply 80, such that the charge pump 92 is coupled between the DC power supply 80 and the second power filtering circuitry 88. Additionally, the RF modulation and control circuitry 28 provides the DC configuration control signal DCC and the envelope control signal ECS to the DC-DC control circuitry 90.

The DC-DC control circuitry 90 provides a charge pump buck control signal CPBS to the charge pump buck converter 84, provides a buck control signal BCS to the buck converter 86, and provides a charge pump control signal CPS to the charge pump 92. The charge pump buck control signal CPBS, the buck control signal BCS, or both may indicate which converter operating mode is selected. Further, the charge pump buck control signal CPBS, the buck control signal BCS, or both may provide the setpoint of the envelope power supply signal EPS as provided by the envelope control signal ECS. The charge pump buck control signal CPBS may indicate which pump buck operating mode is selected.

In one embodiment of the DC-DC converter 32, selection of the converter operating mode is made by the DC-DC control circuitry 90. In an alternate embodiment of the DC-DC converter 32, selection of the converter operating mode is made by the RF modulation and control circuitry 28 and may be communicated to the DC-DC converter 32 via the DC configuration control signal DCC. In an additional embodiment of the DC-DC converter 32, selection of the converter operating mode is made by the control circuitry 42 (FIG. 5) and may be communicated to the DC-DC converter 32 via the DC configuration control signal DCC. In general, selection of the converter operating mode is made by control circuitry, which may be any of the DC-DC control circuitry 90, the RF modulation and control circuitry 28, and the control circuitry 42 (FIG. 5).

In one embodiment of the DC-DC converter 32, selection of the pump buck operating mode is made by the DC-DC control circuitry 90. In an alternate embodiment of the DC-DC converter 32, selection of the pump buck operating mode is made by the RF modulation and control circuitry 28 and communicated to the DC-DC converter 32 via the DC configuration control signal DCC. In an additional embodiment of the DC-DC converter 32, selection of the pump buck operating mode is made by the control circuitry 42 (FIG. 5) and communicated to the DC-DC converter 32 via the DC configuration control signal DCC. In general, selection of the pump buck operating mode is made by control circuitry, which may be any of the DC-DC control circuitry 90, the RF modulation and control circuitry 28, and the control circuitry 42 (FIG. 5). As such, the control circuitry may select one of the pump buck pump-up operating mode and at least one other pump buck operating mode of the charge pump buck converter 84. The at least one other pump buck operating mode of the charge pump buck converter 84 may include any or all of the pump buck pump-down operating mode, the pump buck pump-even operating mode, and the pump buck bypass operating mode.

The charge pump 92 may operate in one of multiple bias supply pump operating modes. During a bias supply pump-up operating mode of the charge pump 92, the charge pump 92 receives and pumps-up the DC power supply signal DCPS to provide the bias power supply signal BPS, such that a voltage of the bias power supply signal BPS is greater than a voltage of the DC power supply signal DCPS. During a bias supply pump-down operating mode of the charge pump 92, the charge pump 92 pumps-down the DC power supply signal DCPS to provide the bias power supply signal BPS, such that a voltage of the bias power supply signal BPS is less than a voltage of the DC power supply signal DCPS. During a bias supply pump-even operating mode of the charge pump 92, the charge pump 92 pumps the DC power supply signal DCPS to provide the bias power supply signal BPS, such that a voltage of the bias power supply signal BPS is about equal to a voltage of the DC power supply signal DCPS. One embodiment of the DC-DC converter 32 includes a bias supply bypass operating mode of the charge pump 92, such that during the bias supply bypass operating mode, the charge pump 92 by-passes charge pump circuitry (not shown) using by-pass circuitry (not shown) to forward the DC power supply signal DCPS to provide the bias power supply signal BPS, such that a voltage of the bias power supply signal BPS is about equal to a voltage of the DC power supply signal DCPS. The charge pump control signal CPS may indicate which bias supply pump operating mode is selected.

In one embodiment of the charge pump 92, the bias supply pump operating modes include the bias supply pump-up operating mode, the bias supply pump-down operating mode, the bias supply pump-even operating mode, and the bias supply bypass operating mode. In an alternate embodiment of the charge pump 92, the bias supply pump-even operating mode is omitted. In an additional embodiment of the charge pump 92, the bias supply bypass operating mode is omitted. In another embodiment of the charge pump 92, the bias supply pump-down operating mode is omitted. In a further embodiment of the charge pump 92, any or all of the bias supply pump-up operating mode, the bias supply pump-down operating mode, the bias supply pump-even operating mode, and the bias supply bypass operating mode are omitted. In a supplemental embodiment of the charge pump 92, the charge pump 92 operates in only the bias supply pump-up operating mode. In an additional embodiment of the charge pump 92, the charge pump 92 operates in the bias supply pump-up operating mode and at least one other operating mode of the charge pump 92, which may include any or all of the bias supply pump-down operating mode, the bias supply pump-even operating mode, and the bias supply bypass operating mode.

In one embodiment of the DC-DC converter 32, selection of the bias supply pump operating mode is made by the DC-DC control circuitry 90. In an alternate embodiment of the DC-DC converter 32, selection of the bias supply pump operating mode is made by the RF modulation and control circuitry 28 and communicated to the DC-DC converter 32 via the DC configuration control signal DCC. In an additional embodiment of the DC-DC converter 32, selection of the bias supply pump operating mode is made by the control circuitry 42 (FIG. 5) and communicated to the DC-DC converter 32 via the DC configuration control signal DCC. In general, selection of the bias supply pump operating mode is made by control circuitry, which may be any of the DC-DC control circuitry 90, the RF modulation and control circuitry 28, and the control circuitry 42 (FIG. 5). As such, the control circuitry may select one of the bias supply pump-up operating mode and at least one other bias supply operating mode. The at least one other bias supply operating mode may include any or all of the bias supply pump-down operating mode, the bias supply pump-even operating mode, and the bias supply bypass operating mode.

The second power filtering circuitry 88 filters the bias power supply signal BPS. The second power filtering circuitry 88 may function as a lowpass filter by removing ripple, noise, and the like to provide the bias power supply signal BPS. As such, in one embodiment of the DC-DC converter 32, the bias power supply signal BPS is based on the DC power supply signal DCPS.

Regarding omission of the second inductive element L2, instead of the second inductive element L2 coupled between the buck converter 86 and the first power filtering circuitry 82 as shown in FIG. 10, one end of the first inductive element L1 is coupled to both the charge pump buck converter 84 and the buck converter 86. As such, in the second converter operating mode or the third converter operating mode, the buck converter 86 may receive and buck convert the DC power supply signal DCPS to provide the second buck output signal SBO to the first inductive element L1. As such, in one embodiment of the charge pump buck converter 84, the second buck output signal SBO is based on the DC power supply signal DCPS. Further, the first inductive element L1 may function as a first energy transfer element of the buck converter 86 to transfer energy via the second buck output signal SBO to the first power filtering circuitry 82. In the first converter operating mode, the second converter operating mode, or the third converter operating mode, the first inductive element L1 and the first power filtering circuitry 82 receive and filter the first buck output signal FBO, the second buck output signal SBO, or both to provide the envelope power supply signal EPS.

Figure 12:
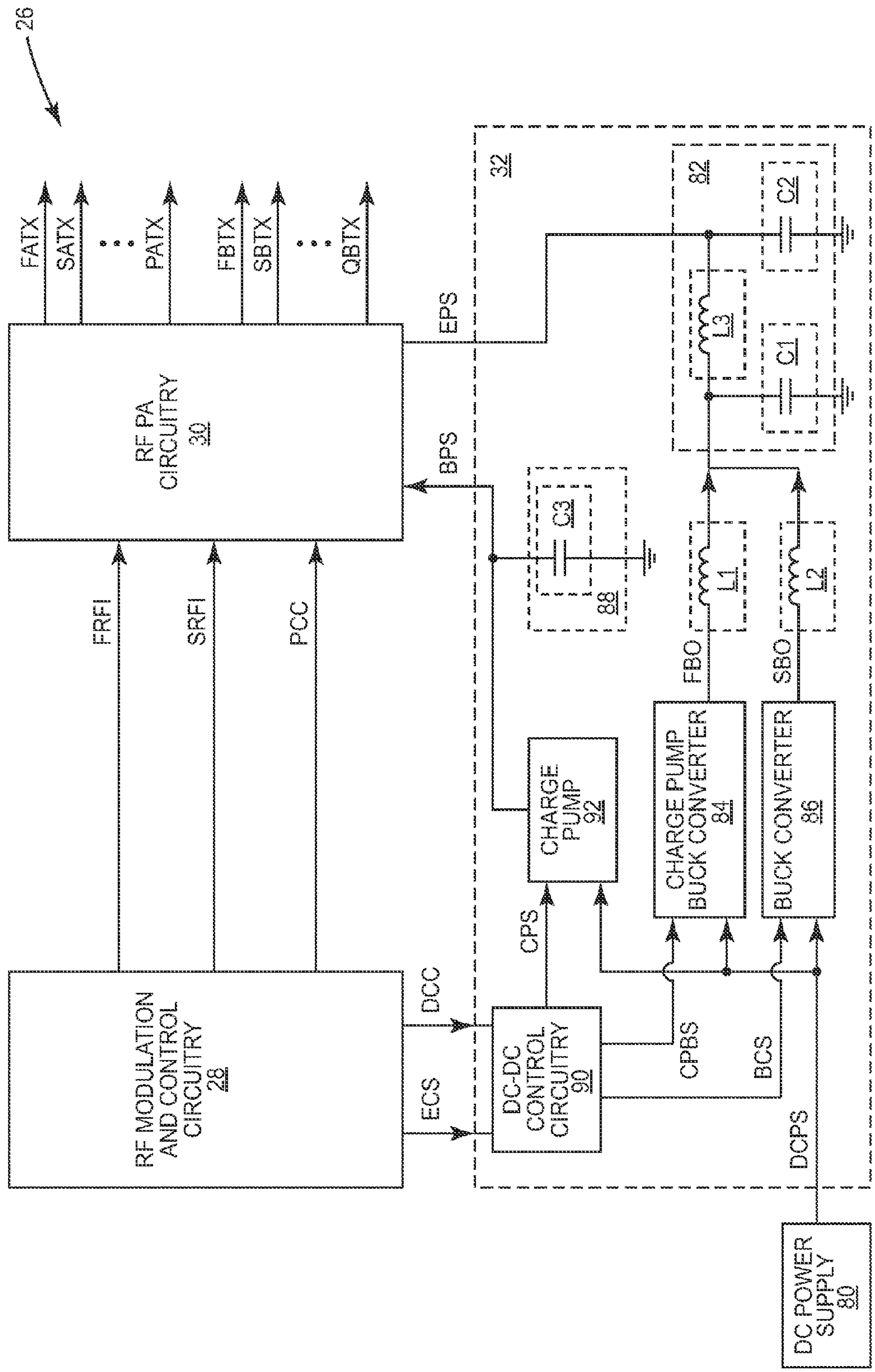
FIG. 12 shows details of a direct current (DC)-DC converter illustrated in FIG. 11 according to an alternate embodiment of the DC-DC converter.

FIG. 12 shows details of the DC-DC converter 32 illustrated in FIG. 11 according to an alternate embodiment of the DC-DC converter 32. The DC-DC converter 32 illustrated in FIG. 12 is similar to the DC-DC converter 32 illustrated in FIG. 10, except the DC-DC converter 32 illustrated in FIG. 12 shows details of the first power filtering circuitry 82 and the second power filtering circuitry 88. Further, the DC-DC converter 32 illustrated in FIG. 12 includes the DC-DC control circuitry 90 and the charge pump 92 as shown in FIG. 11.

The first power filtering circuitry 82 includes a first capacitive element C1, a second capacitive element C2, and a third inductive element L3. The first capacitive element C1 is coupled between one end of the third inductive element L3 and a ground. The second capacitive element C2 is coupled between an opposite end of the third inductive element L3 and ground. The one end of the third inductive element L3 is coupled to one end of the first inductive element L1. Further, the one end of the third inductive element L3 is coupled to one end of the second inductive element L2. In an additional embodiment of the DC-DC converter 32, the second inductive element L2 is omitted. The opposite end of the third inductive element L3 is coupled to the RF PA circuitry 30. As such, the opposite end of the third inductive element L3 and one end of the second capacitive element C2 provide the envelope power supply signal EPS. In an alternate embodiment of the first power filtering circuitry 82, the third inductive element L3, the second capacitive element C2, or both are omitted.

FIG. 13 shows details of the RF PA circuitry 30 illustrated in FIG. 5 according to one embodiment of the RF PA circuitry 30. The RF PA circuitry 30 illustrated in FIG. 13 is similar to the RF PA circuitry 30 illustrated in FIG. 5, except the RF PA circuitry 30 illustrated in FIG. 13 further includes PA control circuitry 94, PA bias circuitry 96, and switch driver circuitry 98. The PA bias circuitry 96 is coupled between the PA control circuitry 94 and the RF PAs 50, 54. The switch driver circuitry 98 is coupled between the PA control circuitry 94 and the switching circuitry 52, 56. The PA control circuitry 94 receives the PA configuration control signal PCC, provides a bias configuration control signal BCC to the PA bias circuitry 96 based on the PA configuration control signal PCC, and provides a switch configuration control signal SCC to the switch driver circuitry 98 based on the PA configuration control signal PCC. The switch driver circuitry 98 provides any needed drive signals to configure the alpha switching circuitry 52 and the beta switching circuitry 56.

The PA bias circuitry 96 receives the bias power supply signal BPS and the bias configuration control signal BCC. The PA bias circuitry 96 provides a first driver bias signal FDB and a first final bias signal FFB to the first RF PA 50 based on the bias power supply signal BPS and the bias configuration control signal BCC. The PA bias circuitry 96 provides a second driver bias signal SDB and a second final bias signal SFB to the second RF PA 54 based on the bias power supply signal BPS and the bias configuration control signal BCC. The bias power supply signal BPS provides the power necessary to generate the bias signals FDB, FFB, SDB, SFB. A selected magnitude of each of the bias signals FDB, FFB, SDB, SFB is provided by the PA bias circuitry 96. In one embodiment of the RF PA circuitry 30, the PA control circuitry 94 selects the magnitude of any or all of the bias signals FDB, FFB, SDB, SFB and communicates the magnitude selections to the PA bias circuitry 96 via the bias configuration control signal BCC. The magnitude selections by the PA control circuitry 94 may be based on the PA configuration control signal PCC. In an alternate embodiment of the RF PA circuitry 30, the control circuitry 42 (FIG. 5) selects the magnitude of any or all of the bias signals FDB, FFB, SDB, SFB and communicates the magnitude selections to the PA bias circuitry 96 via the PA control circuitry 94.

In one embodiment of the RF PA circuitry 30, the RF PA circuitry 30 operates in one of a first PA operating mode and a second PA operating mode. During the first PA operating mode, the first transmit path 46 is enabled and the second transmit path 48 is disabled. During the second PA operating mode, the first transmit path 46 is disabled and the second transmit path 48 is enabled. In one embodiment of the first RF PA 50 and the second RF PA 54, during the second PA operating mode, the first RF PA 50 is disabled, and during the first PA operating mode, the second RF PA 54 is disabled. In one embodiment of the alpha switching circuitry 52 and the beta switching circuitry 56, during the second PA operating mode, the alpha switching circuitry 52 is disabled, and during the first PA operating mode, the beta switching circuitry 56 is disabled.

In one embodiment of the first RF PA 50, during the second PA operating mode, the first RF PA 50 is disabled via the first driver bias signal FDB. In an alternate embodiment of the first RF PA 50, during the second PA operating mode, the first RF PA 50 is disabled via the first final bias signal FFB. In an additional embodiment of the first RF PA 50, during the second PA operating mode, the first RF PA 50 is disabled via both the first driver bias signal FDB and the first final bias signal FFB. In one embodiment of the second RF PA 54, during the first PA operating mode, the second RF PA 54 is disabled via the second driver bias signal SDB. In an alternate embodiment of the second RF PA 54, during the first PA operating mode, the second RF PA 54 is disabled via the second final bias signal SFB. In an additional embodiment of the second RF PA 54, during the first PA operating mode, the second RF PA 54 is disabled via both the second driver bias signal SDB and the second final bias signal SFB.

In one embodiment of the RF PA circuitry 30, the PA control circuitry 94 selects the one of the first PA operating mode and the second PA operating mode. As such, the PA control circuitry 94 may control any or all of the bias signals FDB, FFB, SDB, SFB via the bias configuration control signal BCC based on the PA operating mode selection. Further, the PA control circuitry 94 may control the switching circuitry 52, 56 via the switch configuration control signal SCC based on the PA operating mode selection. The PA operating mode selection may be based on the PA configuration control signal PCC. In an alternate embodiment of the RF PA circuitry 30, the control circuitry 42 (FIG. 5) selects the one of the first PA operating mode and the second PA operating mode. As such, the control circuitry 42 (FIG. 5) may indicate the operating mode selection to the PA control circuitry 94 via the PA configuration control signal PCC. In an additional embodiment of the RF PA circuitry 30, the RF modulation and control circuitry 28 (FIG. 5) selects the one of the first PA operating mode and the second PA operating mode. As such, the RF modulation and control circuitry 28 (FIG. 5) may indicate the operating mode selection to the PA control circuitry 94 via the PA configuration control signal PCC. In general, selection of the PA operating mode is made by control circuitry, which may be any of the PA control circuitry 94, the RF modulation and control circuitry 28 (FIG. 5), and the control circuitry 42 (FIG. 5).

FIG. 14 shows details of the RF PA circuitry 30 illustrated in FIG. 6 according to an alternate embodiment of the RF PA circuitry 30. The RF PA circuitry 30 illustrated in FIG. 14 is similar to the RF PA circuitry 30 illustrated in FIG. 13, except the RF PA circuitry 30 illustrated in FIG. 14 further includes the PA-DCI 60, which is coupled to the PA control circuitry 94 and to the digital communications bus 66. As such, the control circuitry 42 (FIG. 6) may provide the PA configuration control signal PCC via the control circuitry DCI 58 (FIG. 6) to the PA control circuitry 94 via the PA-DCI 60.

FIG. 15 shows details of the first RF PA 50 and the second RF PA 54 illustrated in FIG. 13 according one embodiment of the first RF PA 50 and the second RF PA 54. The first RF PA 50 includes a first non-quadrature PA path 100 and a first quadrature PA path 102. The second RF PA 54 includes a second non-quadrature PA path 104 and a second quadrature PA path 106. In one embodiment of the first RF PA 50, the first quadrature PA path 102 is coupled between the first non-quadrature PA path 100 and the antenna port AP (FIG. 6), which is coupled to the antenna 18 (FIG. 6). In an alternate embodiment of the first RF PA 50, the first non-quadrature PA path 100 is omitted, such that the first quadrature PA path 102 is coupled to the antenna port AP (FIG. 6). The first quadrature PA path 102 may be coupled to the antenna port AP (FIG. 6) via the alpha switching circuitry 52 (FIG. 6) and the front-end aggregation circuitry 36 (FIG. 6). The first non-quadrature PA path 100 may include any number of non-quadrature gain stages. The first quadrature PA path 102 may include any number of quadrature gain stages. In one embodiment of the second RF PA 54, the second quadrature PA path 106 is coupled between the second non-quadrature PA path 104 and the antenna port AP (FIG. 6). In an alternate embodiment of the second RF PA 54, the second non-quadrature PA path 104 is omitted, such that the second quadrature PA path 106 is coupled to the antenna port AP (FIG. 6). The second quadrature PA path 106 may be coupled to the antenna port AP (FIG. 6) via the beta switching circuitry 56 (FIG. 6) and the front-end aggregation circuitry 36 (FIG. 6). The second non-quadrature PA path 104 may include any number of non-quadrature gain stages. The second quadrature PA path 106 may include any number of quadrature gain stages.

In one embodiment of the RF communications system 26, the control circuitry 42 (FIG. 5) selects one of multiple communications modes, which include a first PA operating mode and a second PA operating mode. During the first PA operating mode, the first PA paths 100, 102 receive the envelope power supply signal EPS, which provides power for amplification. During the second PA operating mode, the second PA paths 104, 106 receive the envelope power supply signal EPS, which provides power for amplification. During the first PA operating mode, the first non-quadrature PA path 100 receives the first driver bias signal FDB, which provides biasing to the first non-quadrature PA path 100, and the first quadrature PA path 102 receives the first final bias signal FFB, which provides biasing to the first quadrature PA path 102. During the second PA operating mode, the second non-quadrature PA path 104 receives the second driver bias signal SDB, which provides biasing to the second non-quadrature PA path 104, and the second quadrature PA path 106 receives the second final bias signal SFB, which provides biasing to the second quadrature PA path 106.

The first non-quadrature PA path 100 has a first single-ended output FSO and the first quadrature PA path 102 has a first single-ended input FSI. The first single-ended output FSO may be coupled to the first single-ended input FSI. In one embodiment of the first RF PA 50, the first single-ended output FSO is directly coupled to the first single-ended input FSI. The second non-quadrature PA path 104 has a second single-ended output SSO and the second quadrature PA path 106 has a second single-ended input SSI. The second single-ended output SSO may be coupled to the second single-ended input SSI. In one embodiment of the second RF PA 54, the second single-ended output SSO is directly coupled to the second single-ended input SSI.

During the first PA operating mode, the first RF PA 50 receives and amplifies the first RF input signal FRFI to provide the first RF output signal FRFO, and the second RF PA 54 is disabled. During the second PA operating mode, the second RF PA 54 receives and amplifies the second RF input signal SRFI to provide the second RF output signal SRFO, and the first RF PA 50 is disabled. In one embodiment of the RF communications system 26, the first RF input signal FRFI is a highband RF input signal and the second RF input signal SRFI is a lowband RF input signal. In one exemplary embodiment of the RF communications system 26, a difference between a frequency of the highband RF input signal and a frequency of the lowband RF input signal is greater than about 500 megahertz, such that the frequency of the highband RF input signal is greater than the frequency of the lowband RF input signal. In an alternate exemplary embodiment of the RF communications system 26, a ratio of a frequency of the highband RF input signal divided by a frequency of the lowband RF input signal is greater than about 1.5.

In one embodiment of the first RF PA 50, during the first PA operating mode, the first non-quadrature PA path 100 receives and amplifies the first RF input signal FRFI to provide a first RF feeder output signal FFO to the first quadrature PA path 102 via the first single-ended output FSO. Further, during the first PA operating mode, the first quadrature PA path 102 receives and amplifies the first RF feeder output signal FFO via the first single-ended input FSI to provide the first RF output signal FRFO. In one embodiment of the second RF PA 54, during the second PA operating mode, the second non-quadrature PA path 104 receives and amplifies the second RF input signal SRFI to provide a second RF feeder output signal SFO to the second quadrature PA path 106 via the second single-ended output SSO. Further, during the second PA operating mode, the second quadrature PA path 106 receives and amplifies the second RF feeder output signal SFO via the second single-ended input SSI to provide the second RF output signal SRFO.

Quadrature PA Architecture

A summary of quadrature PA architecture is presented, followed by a detailed description of the quadrature PA architecture according to one embodiment of the present disclosure. One embodiment of the RF communications system 26 (FIG. 6) relates to a quadrature RF PA architecture that utilizes a single-ended interface to couple a non-quadrature PA path to a quadrature PA path, which may be coupled to the antenna port (FIG. 6). The quadrature nature of the quadrature PA path may provide tolerance for changes in antenna loading conditions. An RF splitter in the quadrature PA path may present a relatively stable input impedance, which may be predominantly resistive, to the non-quadrature PA path over a wide frequency range, thereby substantially isolating the non-quadrature PA path from changes in the antenna loading conditions. Further, the input impedance may substantially establish a load line slope of a feeder PA stage in the non-quadrature PA path, thereby simplifying the quadrature RF PA architecture. One embodiment of the quadrature RF PA architecture uses two separate PA paths, either of which may incorporate a combined non-quadrature and quadrature PA architecture.

Due to the relatively stable input impedance, RF power measurements taken at the single-ended interface may provide high directivity and accuracy. Further, by combining the non-quadrature PA path and the quadrature PA path, gain stages may be eliminated and circuit topology may be simplified. In one embodiment of the RF splitter, the RF splitter is a quadrature hybrid coupler, which may include a pair of tightly coupled inductors. The input impedance may be based on inductances of the pair of tightly coupled inductors and parasitic capacitance between the inductors. As such, construction of the pair of tightly coupled inductors may be varied to select a specific parasitic capacitance to provide a specific input impedance. Further, the RF splitter may be integrated onto one semiconductor die with amplifying elements of the non-quadrature PA path, with amplifying elements of the quadrature PA path, or both, thereby reducing size and cost. Additionally, the quadrature PA path may have only a single quadrature amplifier stage to further simplify the design. In certain embodiments, using only the single quadrature amplifier stage provides adequate tolerance for changes in antenna loading conditions.

FIG. 16 shows details of the first non-quadrature PA path 100 and the second non-quadrature PA path 104 illustrated in FIG. 15 according to one embodiment of the first non-quadrature PA path 100 and the second non-quadrature PA path 104. The first non-quadrature PA path 100 includes a first input PA impedance matching circuit 108, a first input PA stage 110, a first feeder PA impedance matching circuit 112, and a first feeder PA stage 114, which provides the first single-ended output FSO. The first input PA stage 110 is coupled between the first input PA impedance matching circuit 108 and the first feeder PA impedance matching circuit 112. The first feeder PA stage 114 is coupled between the first feeder PA impedance matching circuit 112 and the first quadrature PA path 102. The first input PA impedance matching circuit 108 may provide at least an approximate impedance match between the RF modulation circuitry 44 (FIG. 5) and the first input PA stage 110. The first feeder PA impedance matching circuit 112 may provide at least an approximate impedance match between the first input PA stage 110 and the first feeder PA stage 114. In alternate embodiments of the first non-quadrature PA path 100, any or all of the first input PA impedance matching circuit 108, the first input PA stage 110, and the first feeder PA impedance matching circuit 112, may be omitted.

During the first PA operating mode, the first input PA impedance matching circuit 108 receives and forwards the first RF input signal FRFI to the first input PA stage 110. During the first PA operating mode, the first input PA stage 110 receives and amplifies the forwarded first RF input signal FRFI to provide a first RF feeder input signal FFI to the first feeder PA stage 114 via the first feeder PA impedance matching circuit 112. During the first PA operating mode, the first feeder PA stage 114 receives and amplifies the first RF feeder input signal FFI to provide the first RF feeder output signal FFO via the first single-ended output FSO. The first feeder PA stage 114 may have a first output load line having a first load line slope. During the first PA operating mode, the envelope power supply signal EPS provides power for amplification to the first input PA stage 110 and to the first feeder PA stage 114. During the first PA operating mode, the first driver bias signal FDB provides biasing to the first input PA stage 110 and the first feeder PA stage 114.

The second non-quadrature PA path 104 includes a second input PA impedance matching circuit 116, a second input PA stage 118, a second feeder PA impedance matching circuit 120, and a second feeder PA stage 122, which provides the second single-ended output SSO. The second input PA stage 118 is coupled between the second input PA impedance matching circuit 116 and the second feeder PA impedance matching circuit 120. The second feeder PA stage 122 is coupled between the second feeder PA impedance matching circuit 120 and the second quadrature PA path 106. The second input PA impedance matching circuit 116 may provide at least an approximate impedance match between the RF modulation circuitry 44 (FIG. 5) and the second input PA stage 118. The second feeder PA impedance matching circuit 120 may provide at least an approximate impedance match between the second input PA stage 118 and the second feeder PA stage 122. In alternate embodiments of the second non-quadrature PA path 104, any or all of the second input PA impedance matching circuit 116, the second input PA stage 118, and the second feeder PA impedance matching circuit 120, may be omitted.

During the second PA operating mode, the second input PA impedance matching circuit 116 receives and forwards the second RF input signal SRFI to the second input PA stage 118. During the second PA operating mode, the second input PA stage 118 receives and amplifies the forwarded second RF input signal SRFI to provide a second RF feeder input signal SFI to the second feeder PA stage 122 via the second feeder PA impedance matching circuit 120. During the second PA operating mode, the second feeder PA stage 122 receives and amplifies the second RF feeder input signal SFI to provide the second RF feeder output signal SFO via the second single-ended output SSO. The second feeder PA stage 122 may have a second output load line having a second load line slope. During the second PA operating mode, the envelope power supply signal EPS provides power for amplification to the second input PA stage 118 and to the second feeder PA stage 122. During the second PA operating mode, the second driver bias signal SDB provides biasing to the second input PA stage 118 and the second feeder PA stage 122.

FIG. 17 shows details of the first quadrature PA path 102 and the second quadrature PA path 106 illustrated in FIG. 15 according to one embodiment of the first quadrature PA path 102 and the second quadrature PA path 106. The first quadrature PA path 102 includes a first quadrature RF splitter 124, a first in-phase amplification path 126, a first quadrature-phase amplification path 128, and a first quadrature RF combiner 130. The first quadrature RF splitter 124 has a first single-ended input FSI, a first in-phase output FIO, and a first quadrature-phase output FQO. The first quadrature RF combiner 130 has a first in-phase input FII, a first quadrature-phase input FQI, and a first quadrature combiner output FCO. The first single-ended output FSO is coupled to the first single-ended input FSI. In one embodiment of the first quadrature PA path 102, the first single-ended output FSO is directly coupled to the first single-ended input FSI. The first in-phase amplification path 126 is coupled between the first in-phase output FIO and the first in-phase input FII. The first quadrature-phase amplification path 128 is coupled between the first quadrature-phase output FQO and the first quadrature-phase input FQI. The first quadrature combiner output FCO is coupled to the antenna port AP (FIG. 6) via the alpha switching circuitry 52 (FIG. 6) and the front-end aggregation circuitry 36 (FIG. 6).

During the first PA operating mode, the first quadrature RF splitter 124 receives the first RF feeder output signal FFO via the first single-ended input FSI. Further, during the first PA operating mode, the first quadrature RF splitter 124 splits and phase-shifts the first RF feeder output signal FFO into a first in-phase RF input signal FIN and a first quadrature-phase RF input signal FQN, such that the first quadrature-phase RF input signal FQN is nominally phase-shifted from the first in-phase RF input signal FIN by about 90 degrees. The first quadrature RF splitter 124 has a first input impedance presented at the first single-ended input FSI. In one embodiment of the first quadrature RF splitter 124, the first input impedance establishes the first load line slope. During the first PA operating mode, the first in-phase amplification path 126 receives and amplifies the first in-phase RF input signal FIN to provide the first in-phase RF output signal FIT. The first quadrature-phase amplification path 128 receives and amplifies the first quadrature-phase RF input signal FQN to provide the first quadrature-phase RF output signal FQT.

During the first PA operating mode, the first quadrature RF combiner 130 receives the first in-phase RF output signal FIT via the first in-phase input FII, and receives the first quadrature-phase RF output signal FQT via the first quadrature-phase input FQI. Further, the first quadrature RF combiner 130 phase-shifts and combines the first in-phase RF output signal FIT and the first quadrature-phase RF output signal FQT to provide the first RF output signal FRFO via the first quadrature combiner output FCO, such that the phase-shifted first in-phase RF output signal FIT and first quadrature-phase RF output signal FQT are about phase-aligned with one another before combining. During the first PA operating mode, the envelope power supply signal EPS provides power for amplification to the first in-phase amplification path 126 and the first quadrature-phase amplification path 128. During the first PA operating mode, the first final bias signal FFB provides biasing to the first in-phase amplification path 126 and the first quadrature-phase amplification path 128.

The second quadrature PA path 106 includes a second quadrature RF splitter 132, a second in-phase amplification path 134, a second quadrature-phase amplification path 136, and a second quadrature RF combiner 138. The second quadrature RF splitter 132 has a second single-ended input SSI, a second in-phase output SIO, and a second quadrature-phase output SQO. The second quadrature RF combiner 138 has a second in-phase input SII, a second quadrature-phase input SQI, and a second quadrature combiner output SCO. The second single-ended output SSO is coupled to the second single-ended input SSI. In one embodiment of the second quadrature PA path 106, the second single-ended output SSO is directly coupled to the second single-ended input SSI. The second in-phase amplification path 134 is coupled between the second in-phase output SIO and the second in-phase input SII. The second quadrature-phase amplification path 136 is coupled between the second quadrature-phase output SQO and the second quadrature-phase input SQI. The second quadrature combiner output SCO is coupled to the antenna port AP (FIG. 6) via the alpha switching circuitry 52 (FIG. 6) and the front-end aggregation circuitry 36 (FIG. 6).

During the second PA operating mode, the second quadrature RF splitter 132 receives the second RF feeder output signal SFO via the second single-ended input SSI. Further, during the second PA operating mode, the second quadrature RF splitter 132 splits and phase-shifts the second RF feeder output signal SFO into a second in-phase RF input signal SIN and a second quadrature-phase RF input signal SQN, such that the second quadrature-phase RF input signal SQN is nominally phase-shifted from the second in-phase RF input signal SIN by about 90 degrees. The second quadrature RF splitter 132 has a second input impedance presented at the second single-ended input SSI. In one embodiment of the second quadrature RF splitter 132, the second input impedance establishes the second load line slope. During the second PA operating mode, the second in-phase amplification path 134 receives and amplifies the second in-phase RF input signal SIN to provide the second in-phase RF output signal SIT. The second quadrature-phase amplification path 136 receives and amplifies the second quadrature-phase RF input signal SQN to provide the second quadrature-phase RF output signal SQT.

During the second PA operating mode, the second quadrature RF combiner 138 receives the second in-phase RF output signal SIT via the second in-phase input SII, and receives the second quadrature-phase RF output signal SQT via the second quadrature-phase input SQI. Further, the second quadrature RF combiner 138 phase-shifts and combines the second in-phase RF output signal SIT and the second quadrature-phase RF output signal SQT to provide the second RF output signal SRFO via the second quadrature combiner output SCO, such that the phase-shifted second in-phase RF output signal SIT and second quadrature-phase RF output signal SQT are about phase-aligned with one another before combining. During the second PA operating mode, the envelope power supply signal EPS provides power for amplification to the second in-phase amplification path 134 and the second quadrature-phase amplification path 136. During the second PA operating mode, the second final bias signal SFB provides biasing to the second in-phase amplification path 134 and the second quadrature-phase amplification path 136.

In one embodiment of the RF PA circuitry 30 (FIG. 13), the second transmit path 48 (FIG. 13) is omitted. As such, the first feeder PA stage 114 (FIG. 16) is a feeder PA stage and the first single-ended output FSO (FIG. 16) is a single-ended output. The first RF feeder input signal FFI (FIG. 16) is an RF feeder input signal and the first RF feeder output signal FFO (FIG. 16) is an RF feeder output signal. The feeder PA stage receives and amplifies the RF feeder input signal to provide the RF feeder output signal via the single-ended output. The feeder PA stage has an output load line having a load line slope. The first quadrature RF splitter 124 is a quadrature RF splitter and the first single-ended input FSI is a single-ended input. As such, the quadrature RF splitter has the single-ended input. In one embodiment of the first RF PA 50, the single-ended output is directly coupled to the single-ended input.

In the embodiment in which the second transmit path 48 (FIG. 13) is omitted, the first in-phase RF input signal FIN is an in-phase RF input signal and the first quadrature-phase RF input signal FQN is a quadrature-phase RF input signal. The quadrature RF splitter receives the RF feeder output signal via the single-ended input. Further, the quadrature RF splitter splits and phase-shifts the RF feeder output signal into the in-phase RF input signal and the quadrature-phase RF input signal, such that the quadrature-phase RF input signal is nominally phase-shifted from the in-phase RF input signal by about 90 degrees. The quadrature RF splitter has an input impedance presented at the single-ended input. The input impedance substantially establishes the load line slope. The first in-phase amplification path 126 is an in-phase amplification path and the first quadrature-phase amplification path 128 is a quadrature-phase amplification path. The first in-phase RF output signal FIT is an in-phase RF output signal and the first quadrature-phase RF output signal FQT is a quadrature-phase RF output signal. As such, the in-phase amplification path receives and amplifies the in-phase RF input signal to provide the in-phase RF output signal. The quadrature-phase amplification path receives and amplifies the quadrature-phase RF input signal to provide the quadrature-phase RF output signal.

In the embodiment in which the second transmit path 48 (FIG. 13) is omitted, the first RF output signal FRFO is an RF output signal. As such, the quadrature RF combiner receives, phase-shifts, and combines the in-phase RF output signal and the quadrature-phase RF output signal to provide the RF output signal. In one embodiment of the quadrature RF splitter, the input impedance has resistance and reactance, such that the reactance is less than the resistance. In a first exemplary embodiment of the quadrature RF splitter, the resistance is greater than two times the reactance. In a second exemplary embodiment of the quadrature RF splitter, the resistance is greater than four times the reactance. In a third exemplary embodiment of the quadrature RF splitter, the resistance is greater than six times the reactance. In a fourth exemplary embodiment of the quadrature RF splitter, the resistance is greater than eight times the reactance. In a first exemplary embodiment of the quadrature RF splitter, the resistance is greater than ten times the reactance.

In alternate embodiments of the first quadrature PA path 102 and the second quadrature PA path 106, any or all of the first quadrature RF splitter 124, the first quadrature RF combiner 130, the second quadrature RF splitter 132, and the second quadrature RF combiner 138 may be any combination of quadrature RF couplers, quadrature hybrid RF couplers; Fisher couplers; lumped-element based RF couplers; transmission line based RF couplers; and combinations of phase-shifting circuitry and RF power couplers, such as phase-shifting circuitry and Wilkinson couplers; and the like. As such, any of the RF couplers listed above may be suitable to provide the first input impedance, the second input impedance, or both.

FIG. 18 shows details of the first in-phase amplification path 126, the first quadrature-phase amplification path 128, the second in-phase amplification path 134, and the second quadrature-phase amplification path 136 illustrated in FIG. 17 according to one embodiment of the first in-phase amplification path 126, the first quadrature-phase amplification path 128, the second in-phase amplification path 134, and the second quadrature-phase amplification path 136. The first in-phase amplification path 126 includes a first in-phase driver PA impedance matching circuit 140, a first in-phase driver PA stage 142, a first in-phase final PA impedance matching circuit 144, a first in-phase final PA stage 146, and a first in-phase combiner impedance matching circuit 148.

The first in-phase driver PA impedance matching circuit 140 is coupled between the first in-phase output FIO and the first in-phase driver PA stage 142. The first in-phase final PA impedance matching circuit 144 is coupled between the first in-phase driver PA stage 142 and the first in-phase final PA stage 146. The first in-phase combiner impedance matching circuit 148 is coupled between the first in-phase final PA stage 146 and the first in-phase input FII.

The first in-phase driver PA impedance matching circuit 140 may provide at least an approximate impedance match between the first quadrature RF splitter 124 and the first in-phase driver PA stage 142. The first in-phase final PA impedance matching circuit 144 may provide at least an approximate impedance match between the first in-phase driver PA stage 142 and the first in-phase final PA stage 146. The first in-phase combiner impedance matching circuit 148 may provide at least an approximate impedance match between the first in-phase final PA stage 146 and the first quadrature RF combiner 130.

During the first PA operating mode, the first in-phase driver PA impedance matching circuit 140 receives and forwards the first in-phase RF input signal FIN to the first in-phase driver PA stage 142, which receives and amplifies the forwarded first in-phase RF input signal to provide an amplified first in-phase RF input signal to the first in-phase final PA stage 146 via the first in-phase final PA impedance matching circuit 144. The first in-phase final PA stage 146 receives and amplifies the amplified first in-phase RF input signal to provide the first in-phase RF output signal FIT via the first in-phase combiner impedance matching circuit 148. During the first PA operating mode, the envelope power supply signal EPS provides power for amplification to the first in-phase driver PA stage 142 and the first in-phase final PA stage 146. During the first PA operating mode, the first final bias signal FFB provides biasing to the first in-phase driver PA stage 142 and the first in-phase final PA stage 146.

The first quadrature-phase amplification path 128 includes a first quadrature-phase driver PA impedance matching circuit 150, a first quadrature-phase driver PA stage 152, a first quadrature-phase final PA impedance matching circuit 154, a first quadrature-phase final PA stage 156, and a first quadrature-phase combiner impedance matching circuit 158. The first quadrature-phase driver PA impedance matching circuit 150 is coupled between the first quadrature-phase output FQO and the first quadrature-phase driver PA stage 152. The first quadrature-phase final PA impedance matching circuit 154 is coupled between the first quadrature-phase driver PA stage 152 and the first quadrature-phase final PA stage 156. The first quadrature-phase combiner impedance matching circuit 158 is coupled between the first quadrature-phase final PA stage 156 and the first quadrature-phase input FQI.

The first quadrature-phase driver PA impedance matching circuit 150 may provide at least an approximate impedance match between the first quadrature RF splitter 124 and the first quadrature-phase driver PA stage 152. The first quadrature-phase final PA impedance matching circuit 154 may provide at least an approximate impedance match between the first quadrature-phase driver PA stage 152 and the first quadrature-phase final PA stage 156. The first quadrature-phase combiner impedance matching circuit 158 may provide at least an approximate impedance match between the first quadrature-phase final PA stage 156 and the first quadrature RF combiner 130.

During the first PA operating mode, the first quadrature-phase driver PA impedance matching circuit 150 receives and forwards the first quadrature-phase RF input signal FQN to the first quadrature-phase driver PA stage 152, which receives and amplifies the forwarded first quadrature-phase RF input signal to provide an amplified first quadrature-phase RF input signal to the first quadrature-phase final PA stage 156 via the first quadrature-phase final PA impedance matching circuit 154. The first quadrature-phase final PA stage 156 receives and amplifies the amplified first quadrature-phase RF input signal to provide the first quadrature-phase RF output signal FQT via the first quadrature-phase combiner impedance matching circuit 158. During the first PA operating mode, the envelope power supply signal EPS provides power for amplification to the first quadrature-phase driver PA stage 152 and the first quadrature-phase final PA stage 156. During the first PA operating mode, the first final bias signal FFB provides biasing to the first quadrature-phase driver PA stage 152 and the first quadrature-phase final PA stage 156.

The second in-phase amplification path 134 includes a second in-phase driver PA impedance matching circuit 160, a second in-phase driver PA stage 162, a second in-phase final PA impedance matching circuit 164, a second in-phase final PA stage 166, and a second in-phase combiner impedance matching circuit 168. The second in-phase driver PA impedance matching circuit 160 is coupled between the second in-phase output SIO and the second in-phase driver PA stage 162. The second in-phase final PA impedance matching circuit 164 is coupled between the second in-phase driver PA stage 162 and the second in-phase final PA stage 166. The second in-phase combiner impedance matching circuit 168 is coupled between the second in-phase final PA stage 166 and the second in-phase input SII.

The second in-phase driver PA impedance matching circuit 160 may provide at least an approximate impedance match between the second quadrature RF splitter 132 and the second in-phase driver PA stage 162. The second in-phase final PA impedance matching circuit 164 may provide at least an approximate impedance match between the second in-phase driver PA stage 162 and the second in-phase final PA stage 166. The second in-phase combiner impedance matching circuit 168 may provide at least an approximate impedance match between the second in-phase final PA stage 166 and the second quadrature RF combiner 138.

During the second PA operating mode, the second in-phase driver PA impedance matching circuit 160 receives and forwards the second in-phase RF input signal SIN to the second in-phase driver PA stage 162, which receives and amplifies the forwarded second in-phase RF input signal to provide an amplified second in-phase RF input signal to the second in-phase final PA stage 166 via the second in-phase final PA impedance matching circuit 164. The second in-phase final PA stage 166 receives and amplifies the amplified second in-phase RF input signal to provide the second in-phase RF output signal SIT via the second in-phase combiner impedance matching circuit 168. During the second PA operating mode, the envelope power supply signal EPS provides power for amplification to the second in-phase driver PA stage 162 and the second in-phase final PA stage 166. During the second PA operating mode, the second final bias signal SFB provides biasing to the second in-phase driver PA stage 162 and the second in-phase final PA stage 166.

The second quadrature-phase amplification path 136 includes a second quadrature-phase driver PA impedance matching circuit 170, a second quadrature-phase driver PA stage 172, a second quadrature-phase final PA impedance matching circuit 174, a second quadrature-phase final PA stage 176, and a second quadrature-phase combiner impedance matching circuit 178. The second quadrature-phase driver PA impedance matching circuit 170 is coupled between the second quadrature-phase output SQO and the second quadrature-phase driver PA stage 172. The second quadrature-phase final PA impedance matching circuit 174 is coupled between the second quadrature-phase driver PA stage 172 and the second quadrature-phase final PA stage 176. The second quadrature-phase combiner impedance matching circuit 178 is coupled between the second quadrature-phase final PA stage 176 and the second quadrature-phase input SQI.

The second quadrature-phase driver PA impedance matching circuit 170 may provide at least an approximate impedance match between the second quadrature RF splitter 132 and the second quadrature-phase driver PA stage 172. The second quadrature-phase final PA impedance matching circuit 174 may provide at least an approximate impedance match between the second quadrature-phase driver PA stage 172 and the second quadrature-phase final PA stage 176. The second quadrature-phase combiner impedance matching circuit 178 may provide at least an approximate impedance match between the second quadrature-phase final PA stage 176 and the second quadrature RF combiner 138.

During the second PA operating mode, the second quadrature-phase driver PA impedance matching circuit 170 receives and forwards the second quadrature-phase RF input signal SQN to the second quadrature-phase driver PA stage 172, which receives and amplifies the forwarded second quadrature-phase RF input signal to provide an amplified second quadrature-phase RF input signal to the second quadrature-phase final PA stage 176 via the second quadrature-phase final PA impedance matching circuit 174. The second quadrature-phase final PA stage 176 receives and amplifies the amplified second quadrature-phase RF input signal to provide the second quadrature-phase RF output signal SQT via the second quadrature-phase combiner impedance matching circuit 178. During the second PA operating mode, the envelope power supply signal EPS provides power for amplification to the second quadrature-phase driver PA stage 172 and the second quadrature-phase final PA stage 176. During the second PA operating mode, the second final bias signal SFB provides biasing to the second quadrature-phase driver PA stage 172 and the second quadrature-phase final PA stage 176.

In alternate embodiments of the first in-phase amplification path 126, any or all of the first in-phase driver PA impedance matching circuit 140, the first in-phase driver PA stage 142, the first in-phase final PA impedance matching circuit 144, and the first in-phase combiner impedance matching circuit 148 may be omitted. In alternate embodiments of the first quadrature-phase amplification path 128, any or all of the first quadrature-phase driver PA impedance matching circuit 150, the first quadrature-phase driver PA stage 152, the first quadrature-phase final PA impedance matching circuit 154, and the first quadrature-phase combiner impedance matching circuit 158 may be omitted. In alternate embodiments of the second in-phase amplification path 134, any or all of the second in-phase driver PA impedance matching circuit 160, the second in-phase driver PA stage 162, the second in-phase final PA impedance matching circuit 164, and the second in-phase combiner impedance matching circuit 168 may be omitted. In alternate embodiments of the second quadrature-phase amplification path 136, any or all of the second quadrature-phase driver PA impedance matching circuit 170, the second quadrature-phase driver PA stage 172, the second quadrature-phase final PA impedance matching circuit 174, and the second quadrature-phase combiner impedance matching circuit 178 may be omitted.

FIG. 19 shows details of the first quadrature PA path 102 and the second quadrature PA path 106 illustrated in FIG. 15 according to an alternate embodiment of the first quadrature PA path 102 and the second quadrature PA path 106. The first quadrature PA path 102 and the second quadrature PA path 106 illustrated in FIG. 19 are similar to the first quadrature PA path 102 and the second quadrature PA path 106 illustrated in FIG. 17, except in the first quadrature PA path 102 and the second quadrature PA path 106 illustrated in FIG. 19, during the first PA operating mode, the first driver bias signal FDB provides further biasing to the first in-phase amplification path 126 and the first quadrature-phase amplification path 128, and during the second PA operating mode, the second driver bias signal SDB provides further biasing to the second in-phase amplification path 134 and the second quadrature-phase amplification path 136.

FIG. 20 shows details of the first in-phase amplification path 126, the first quadrature-phase amplification path 128, the second in-phase amplification path 134, and the second quadrature-phase amplification path 136 illustrated in FIG. 19 according to an alternate embodiment of the first in-phase amplification path 126, the first quadrature-phase amplification path 128, the second in-phase amplification path 134, and the second quadrature-phase amplification path 136. The amplification paths 126, 128, 134, 136 illustrated in FIG. 20 are similar to the amplification paths 126, 128, 134, 136 illustrated in FIG. 18, except in the amplification paths 126, 128, 134, 136 illustrated in FIG. 20, during the first PA operating mode, the first driver bias signal FDB provides biasing to the first in-phase driver PA stage 142 and the first quadrature-phase driver PA stage 152 instead of the first final bias signal FFB, and during the second PA operating mode, the second driver bias signal SDB provides biasing to the second in-phase driver PA stage 162 and the second quadrature-phase driver PA stage 172 instead of the second final bias signal SFB.

FIG. 21 shows details of the first RF PA 50 and the second RF PA 54 illustrated in FIG. 14 according an alternate embodiment of the first RF PA 50 and the second RF PA 54. The first RF PA 50 shown in FIG. 21 is similar to the first RF PA 50 illustrated in FIG. 15. The second RF PA 54 shown in FIG. 21 is similar to the second RF PA 54 illustrated in FIG. 15, except in the second RF PA 54 illustrated in FIG. 21 the second quadrature PA path 106 is omitted. As such, during the second PA operating mode, the second RF input signal SRFI provides the second RF feeder output signal SFO to the second quadrature PA path 106. In this regard, during the second PA operating mode, the second quadrature PA path 106 receives and amplifies the second RF input signal SRFI to provide the second RF output signal SRFO. During the second PA operating mode, the second quadrature PA path 106 receives the envelope power supply signal EPS, which provides power for amplification. Further, during the second PA operating mode, the second quadrature PA path 106 receives the second driver bias signal SDB and the second final bias signal SFB, both of which provide biasing to the second quadrature PA path 106.

FIG. 22 shows details of the first non-quadrature PA path 100, the first quadrature PA path 102, and the second quadrature PA path 106 illustrated in FIG. 21 according to an additional embodiment of the first non-quadrature PA path 100, the first quadrature PA path 102, and the second quadrature PA path 106. The second quadrature PA path 106 illustrated in FIG. 22 is similar to the second quadrature PA path 106 illustrated in FIG. 20. The first quadrature PA path 102 illustrated in FIG. 22 is similar to the first quadrature PA path 102 illustrated in FIG. 20, except in the first quadrature PA path 102 illustrated in FIG. 22, the first in-phase driver PA impedance matching circuit 140, the first in-phase driver PA stage 142, the first quadrature-phase driver PA impedance matching circuit 150, and the first quadrature-phase driver PA stage 152 are omitted. In this regard, the first in-phase final PA impedance matching circuit 144 is coupled between the first in-phase output FIO and the first in-phase final PA stage 146. The first in-phase combiner impedance matching circuit 148 is coupled between the first in-phase final PA stage 146 and the first in-phase input FII. The first in-phase final PA impedance matching circuit 144 may provide at least an approximate impedance match between the first quadrature RF splitter 124 and the first in-phase final PA stage 146. The first in-phase combiner impedance matching circuit 148 may provide at least an approximate impedance match between the first in-phase final PA stage 146 and the first quadrature RF combiner 130.

During the first PA operating mode, the first in-phase final PA impedance matching circuit 144 receives and forwards the first in-phase RF input signal FIN to the first in-phase final PA stage 146, which receives and amplifies the forwarded first in-phase RF input signal to provide the first in-phase RF output signal FIT via the first in-phase combiner impedance matching circuit 148. During the first PA operating mode, the envelope power supply signal EPS provides power for amplification to the first in-phase final PA stage 146. During the first PA operating mode, the first final bias signal FFB provides biasing to the first in-phase final PA stage 146.

The first quadrature-phase final PA impedance matching circuit 154 is coupled between the first quadrature-phase output FQO and the first quadrature-phase final PA stage 156. The first quadrature-phase combiner impedance matching circuit 158 is coupled between the first quadrature-phase final PA stage 156 and the first quadrature-phase input FQI. The first quadrature-phase final PA impedance matching circuit 154 may provide at least an approximate impedance match between the first quadrature RF splitter 124 and the first quadrature-phase final PA stage 156. The first quadrature-phase combiner impedance matching circuit 158 may provide at least an approximate impedance match between the first quadrature-phase final PA stage 156 and the first quadrature RF combiner 130.

During the first PA operating mode, the first quadrature-phase final PA impedance matching circuit 154 receives and forwards the first quadrature-phase RF input signal FQN to the first quadrature-phase final PA stage 156, which receives and amplifies the forwarded first quadrature-phase RF input signal to provide the first quadrature-phase RF output signal FQT via the first quadrature-phase combiner impedance matching circuit 158. During the first PA operating mode, the envelope power supply signal EPS provides power for amplification to the first quadrature-phase final PA stage 156. During the first PA operating mode, the first final bias signal FFB provides biasing to the first quadrature-phase final PA stage 156.

The first non-quadrature PA path 100 illustrated in FIG. 22 is similar to the first non-quadrature PA path 100 illustrated in FIG. 16, except in the first non-quadrature PA path 100 illustrated in FIG. 22, the first input PA impedance matching circuit 108 and the first input PA stage 110 are omitted. As such, the first feeder PA stage 114 is coupled between the first feeder PA impedance matching circuit 112 and the first quadrature PA path 102. The first feeder PA impedance matching circuit 112 may provide at least an approximate impedance match between the RF modulation circuitry 44 (FIG. 5) and the first feeder PA stage 114. During the first PA operating mode, the first feeder PA impedance matching circuit 112 receives and forwards the first RF input signal FRFI to provide the first RF feeder input signal FFI to the first feeder PA stage 114. During the first PA operating mode, the first feeder PA stage 114 receives and amplifies the first RF feeder input signal FFI to provide the first RF feeder output signal FFO via the first single-ended output FSO. During the first PA operating mode, the envelope power supply signal EPS provides power for amplification to the first feeder PA stage 114. During the first PA operating mode, the first final bias signal FFB provides biasing to the first feeder PA stage 114.

In one embodiment of the first quadrature PA path 102, the first quadrature PA path 102 has only one in-phase PA stage, which is the first in-phase final PA stage 146, and only one quadrature-phase PA stage, which is the first quadrature-phase final PA stage 156. In one embodiment of the second quadrature PA path 106, the second in-phase driver PA impedance matching circuit 160, the second in-phase driver PA stage 162, the second quadrature-phase driver PA impedance matching circuit 170, and the second quadrature-phase driver PA stage 172 are omitted. As such, the second quadrature PA path 106 has only one in-phase PA stage, which is the second in-phase final PA stage 166, and only one quadrature-phase PA stage, which is the second quadrature-phase final PA stage 176.

FIG. 23 shows details of the first feeder PA stage 114 and the first quadrature RF splitter 124 illustrated in FIG. 16 and FIG. 17, respectively, according to one embodiment of the first feeder PA stage 114 and the first quadrature RF splitter 124. FIGS. 23 and 24 show only a portion of the first feeder PA stage 114 and the first quadrature RF splitter 124. The first feeder PA stage 114 includes a first output transistor element 180, an inverting output inductive element LIO, and the first single-ended output FSO. The first output transistor element 180 has a first transistor inverting output FTIO, a first transistor non-inverting output FTNO, and a first transistor input FTIN. The first transistor non-inverting output FTNO is coupled to a ground and the first transistor inverting output FTIO is coupled to the first single-ended output FSO and to one end of the inverting output inductive element LIO. An opposite end of the inverting output inductive element LIO receives the envelope power supply signal EPS.

The first quadrature RF splitter 124 has the first single-ended input FSI, such that the first input impedance is presented at the first single-ended input FSI. Since the first input impedance may be predominantly resistive, the first input impedance may be approximated as a first input resistive element RFI coupled between the first single-ended input FSI and the ground. The first single-ended output FSO is directly coupled to the first single-ended input FSI. Therefore, the first input resistive element RFI is presented to the first transistor inverting output FTIO.

FIG. 24 shows details of the first feeder PA stage 114 and the first quadrature RF splitter 124 illustrated in FIG. 16 and FIG. 17, respectively, according to an alternate embodiment of the first feeder PA stage 114 and the first quadrature RF splitter 124. The first output transistor element 180 is an NPN bipolar transistor element, such that an emitter of the NPN bipolar transistor element provides the first transistor non-inverting output FTNO (FIG. 23), a base of the NPN bipolar transistor element provides the first transistor input FTIN (FIG. 23), and a collector of the NPN bipolar transistor element provides the first transistor inverting output FTIO (FIG. 23). The inverting output inductive element LIO has an inverting output inductor current IDC, the collector of the NPN bipolar transistor element has a collector current IC, and the first input resistive element RFI has a first input current IFR.

The NPN bipolar transistor element has a collector-emitter voltage VCE between the emitter and the collector of the NPN bipolar transistor element.

In general, the first feeder PA stage 114 is the feeder PA stage having the single-ended output and an output transistor element, which has an inverting output. In general, the first quadrature RF splitter 124 is the quadrature RF splitter having the single-ended input, such that the input impedance is presented at the single-ended input. The inverting output may provide the single-ended output and may be directly coupled to the single-ended input. The inverting output may be a collector of the output transistor element and the output transistor element has the output load line.

FIG. 25 is a graph illustrating output characteristics of the first output transistor element 180 illustrated in FIG. 24 according to one embodiment of the first output transistor element 180. The horizontal axis of the graph represents the collector-emitter voltage VCE of the NPN bipolar transistor element and the vertical axis represents the collector current IC of the NPN bipolar transistor element. Characteristic curves 182 of the NPN bipolar transistor element are shown relating the collector-emitter voltage VCE to the collector current IC at different base currents (not shown). The NPN bipolar transistor element has a first output load line 184 having a first load line slope 186. The first output load line 184 may be represented by an equation for a straight line having the form Y=mX+b, where X represents the horizontal axis, Y represents the vertical axis, b represents the Y-intercept, and m represents the first load line slope 186. As such, Y=IC, X=VCE, and b=ISAT, which is a saturation current ISAT of the NPN bipolar transistor element. Further, an X-intercept occurs at an off transistor voltage VCO. Substituting into the equation for a straight line provides EQ. 1, as shown below.

$$IC=m(VCE)+ISAT. \quad \text{EQ. 1}$$

EQ. 2 illustrates Ohm's Law as applied to the first input resistive element RFI, as shown below.

$$VCE=(IFR)(RFI). \quad \text{EQ. 2}$$

EQ. 3 illustrates Kirchhoff's Current Law applied to the circuit illustrated in FIG. 24 as shown below.

$$IDC=IC+IFR. \quad \text{EQ. 3}$$

The inductive reactance of the inverting output inductive element LIO at frequencies of interest may be large compared to the resistance of the first input resistive element RFI. As such, for the purpose of analysis, the inverting output inductor current IDC may be treated as a constant DC current. Therefore, when VCE=0, the voltage across the first input resistive element RFI is zero, which makes IFR=0. From EQ. 3, if IFR=0, then IC=IDC. However, from EQ. 1, when VCE=0 and IC=IDC, then ISAT=IDC, which is a constant. Substituting into EQ. 1 provides EQ. 1A as shown below.

$$IC=m(VCE)+IDC. \quad \text{EQ. 1A}$$

From FIG. 25, when IC=0, VCE=VCO. Substituting into EQ. 1A, EQ. 2, and EQ. 3 provides EQ. 1 B, EQ. 2A, and EQ. 3A as shown below.

$$0=m(VCO)+IDC. \quad \text{EQ. 1B}$$

$$VCO=(IFR)(RFI). \quad \text{EQ. 2A}$$

$$IDC=0+IFR. \quad \text{EQ. 3A}$$

EQ. 3A may be substituted into EQ. 2A, which may be substituted into EQ. 1B to provide EQ. 1C as shown below.

$$0=m(VCO)+IDC=m(IDC)(RFI)+IDC. \quad \text{EQ. 1C}$$

Therefore, m=−1/RFI. As a result, the first load line slope 186, which is represented by m is determined by the first input resistive element RFI, such that there is a negative inverse relationship between the first load line slope 186 and the first input resistive element RFI. In general, the first load line slope 186 is based on the first input impedance, such that the first input impedance substantially establishes the first load line slope 186. Further, there may be a negative inverse relationship between the first load line slope 186 and the first input impedance.

FIG. 26 illustrates a process for matching an input impedance, such as the first input impedance to the first quadrature RF splitter 124 (FIG. 16) to a target load line slope for a feeder PA stage, such as the first feeder PA stage 114 (FIG. 17). The first step of the process is to determine an operating power range of an RF PA, which has the feeder PA stage feeding a quadrature RF splitter (Step A10). The next step of the process is to determine the target load line slope for the feeder PA stage based on the operating power range (Step A12). A further step is to determine the input impedance to the quadrature RF splitter that substantially provides the target load line slope (Step A14). The final step of the process is to determine an operating frequency range of the RF PA, such that the target load line slope is further based on the operating frequency range (Step A16). In an alternate embodiment of the process for matching the input impedance to the target load line slope, the final step (Step A16) is omitted.

FIG. 27 shows details of the first RF PA 50 illustrated in FIG. 14 according an alternate embodiment of the first RF PA 50. The first RF PA 50 illustrated in FIG. 27 is similar to the first RF PA 50 illustrated in FIG. 15, except the first RF PA 50 illustrated in FIG. 27 further includes a first non-quadrature path power coupler 188. As previously mentioned, the first quadrature PA path 102 may present a first input impedance at the first single-ended input FSI that is predominantly resistive. Further, the first input impedance may be stable over a wide frequency range and over widely varying antenna loading conditions. As a result, coupling RF power from the first single-ended output FSO may be used for RF power detection or sampling with a high degree of accuracy and directivity. Since the first single-ended input FSI may be directly coupled to the first single-ended output FSO, coupling RF power from the first single-ended output FSO may be equivalent to coupling RF power from the first single-ended input FSI.

The first non-quadrature path power coupler 188 is coupled to the first single-ended output FSO and couples a portion of RF power flowing though the first single-ended output FSO to provide a first non-quadrature path power output signal FNPO. In an additional embodiment of the first RF PA 50, the first non-quadrature path power coupler 188 is coupled to the first single-ended input FSI and couples a portion of RF power flowing though the first single-ended input FSI to provide the first non-quadrature path power output signal FNPO.

FIG. 28 shows details of the second RF PA 54 illustrated in FIG. 14 according an alternate embodiment of the second RF PA 54. The second RF PA 54 illustrated in FIG. 28 is similar to the second RF PA 54 illustrated in FIG. 15, except the second RF PA 54 illustrated in FIG. 28 further includes a second non-quadrature path power coupler 190. As previously mentioned, the second quadrature PA path 106 may present a second input impedance at the second single-ended input SSI that is predominantly resistive. Further, the second input impedance may be stable over a wide frequency range and over widely varying antenna loading conditions. As a result, coupling RF power from the second single-ended output SSO may be used for RF power detection or sampling with a high degree of accuracy and directivity. Since the second single-ended input SSI may be directly coupled to the second single-ended output SSO, coupling RF power from the second single-ended output SSO may be equivalent to coupling RF power from the second single-ended input SSI.

The second non-quadrature path power coupler 190 is coupled to the second single-ended output SSO and couples a portion of RF power flowing though the second single-ended output SSO to provide a second non-quadrature path power output signal SNPO. In an additional embodiment of the second RF PA 54, the second non-quadrature path power coupler 190 is coupled to the second single-ended input SSI and couples a portion of RF power flowing though the second single-ended input SSI to provide the second non-quadrature path power output signal SNPO.

FIG. 29 shows details of the first in-phase amplification path 126, the first quadrature-phase amplification path 128, and the first quadrature RF combiner 130 illustrated in FIG. 22 according to one embodiment of the first in-phase amplification path 126, the first quadrature-phase amplification path 128, and the first quadrature RF combiner 130. The first in-phase combiner impedance matching circuit 148 and the first quadrature-phase combiner impedance matching circuit 158 have been omitted from the first in-phase amplification path 126 and the first quadrature-phase amplification path 128, respectively. The first quadrature RF combiner 130 includes first phase-shifting circuitry 192 and a first Wilkinson RF combiner 194. The first phase-shifting circuitry 192 has the first in-phase input FII and the first quadrature-phase input FQI. The first Wilkinson RF combiner 194 has the first quadrature combiner output FCO.

During the first PA operating mode, the first phase-shifting circuitry 192 receives and phase-aligns RF signals from the first in-phase final PA stage 146 and the first quadrature-phase final PA stage 156 via the first in-phase input FII and the first quadrature-phase input FQI, respectively, to provide phase-aligned RF signals to the first Wilkinson RF combiner 194. The first Wilkinson RF combiner 194 combines phase-aligned RF signals to provide the first RF output signal FRFO via the first quadrature combiner output FCO. The first phase-shifting circuitry 192 and the first Wilkinson RF combiner 194 may provide stable input impedances presented at the first in-phase input FII and the first quadrature-phase input FQI, respectively, which allows elimination of the first in-phase combiner impedance matching circuit 148 and the first quadrature-phase combiner impedance matching circuit 158.

FIG. 30 shows details of the first feeder PA stage 114, the first quadrature RF splitter 124, the first in-phase final PA impedance matching circuit 144, the first in-phase final PA stage 146, the first quadrature-phase final PA impedance matching circuit 154, and the first quadrature-phase final PA stage 156 illustrated in FIG. 29 according to one embodiment of the first feeder PA stage 114, the first quadrature RF splitter 124, the first in-phase final PA impedance matching circuit 144, the first in-phase final PA stage 146, the first quadrature-phase final PA impedance matching circuit 154, and the first quadrature-phase final PA stage 156. Further, FIG. 30 shows a portion of the first phase-shifting circuitry 192 illustrated in FIG. 29.

The first in-phase final PA stage 146 includes a first in-phase final transistor element 196, first in-phase biasing circuitry 198, and a first in-phase collector inductive element LCI. The first quadrature-phase final PA stage 156 includes a first quadrature-phase final transistor element 200, first quadrature-phase biasing circuitry 202, and a first quadrature-phase collector inductive element LCQ. The first in-phase final PA impedance matching circuit 144 includes a first in-phase series capacitive element CSI1, a second in-phase series capacitive element CSI2, and a first in-phase shunt inductive element LUI. The first quadrature-phase final PA impedance matching circuit 154 includes a first quadrature-phase series capacitive element CSQ1, a second quadrature-phase series capacitive element CSQ2, and a first quadrature-phase shunt inductive element LUQ.

The first quadrature RF splitter 124 includes a first pair 204 of tightly coupled inductors and a first isolation port resistive element RI1. The first pair 204 of tightly coupled inductors has first parasitic capacitance 206 between the first pair 204 of tightly coupled inductors. Additionally, the first quadrature RF splitter 124 has the first single-ended input FSI, the first in-phase output FIO, and the first quadrature-phase output FQO. The first feeder PA stage 114 includes the first output transistor element 180, first feeder biasing circuitry 208, a first DC blocking capacitive element CD1, a first base resistive element RB1, and a first collector inductive element LC1. Additionally, the first feeder PA stage 114 has the first single-ended output FSO.

The first output transistor element 180 shown is an NPN bipolar transistor element. Other embodiments of the first output transistor element 180 may use other types of transistor elements, such as field effect transistor elements (FET) elements. The first DC blocking capacitive element CD1 is coupled between the first feeder PA impedance matching circuit 112 (FIG. 22) and the first base resistive element RB. A base of the first output transistor element 180 and the first feeder biasing circuitry 208 are coupled to the first base resistive element RB1. In alternate embodiments of the first feeder PA stage 114, the first base resistive element RB1, the first DC blocking capacitive element CD1, or both may be omitted. The first feeder biasing circuitry 208 receives the first driver bias signal FDB. An emitter of the first output transistor element 180 is coupled to a ground. A collector of the first output transistor element 180 is coupled to the first single-ended output FSO. One end of the first collector inductive element LC1 is coupled to the first single-ended output FSO. An opposite end of the first collector inductive element LC1 receives the envelope power supply signal EPS. The first single-ended output FSO is coupled to the first single-ended input FSI.

During the first PA operating mode, the first output transistor element 180 receives and amplifies an RF signal from the first feeder PA impedance matching circuit 112 (FIG. 22) via the first DC blocking capacitive element CD1 and the first base resistive element RB1 to provide the first RF feeder output signal FFO (FIG. 29) to the first single-ended input FSI via the first single-ended output FSO. The envelope power supply signal EPS provides power for amplification via the first collector inductive element LC1. The first feeder biasing circuitry 208 biases the first output transistor element 180. The first driver bias signal FDB provides power for biasing the first output transistor element 180 to the first feeder biasing circuitry 208.

The first quadrature RF splitter 124 illustrated in FIG. 30 is a quadrature hybrid coupler. In this regard, the first pair 204 of tightly coupled inductors, the first parasitic capacitance 206, and the first isolation port resistive element RI1 provide quadrature hybrid coupler functionality. As such, the first single-ended input FSI functions as an input port to the quadrature hybrid coupler, the first in-phase output FIO functions as a zero degree output port from the quadrature hybrid coupler, and the first quadrature-phase output FQO functions as a 90 degree output port from the quadrature hybrid coupler. One of the first pair 204 of tightly coupled inductors is coupled between the first single-ended input FSI and the first in-phase output F10. Another of the first pair 204 of tightly coupled inductors has a first end coupled to the first quadrature-phase output FQO and a second end coupled to the first isolation port resistive element RI1. As such, the second end functions as an isolation port of the quadrature hybrid coupler. In this regard, the first isolation port resistive element RI1 is coupled between the isolation port and the ground. The first in-phase output FIO is coupled to the first in-phase series capacitive element CSI1 and the first quadrature-phase output FQO is coupled to the first quadrature-phase series capacitive element CSQ1.

During the first PA operating mode, the first pair 204 of tightly coupled inductors receives, splits, and phase-shifts the first RF feeder output signal FFO (FIG. 29) from the first single-ended output FSO via the first single-ended input FSI to provide split, phase-shifted output signals to the first in-phase series capacitive element CSI1 and the first quadrature-phase series capacitive element CSQ1. As previously mentioned, the first input impedance is presented at the first single-ended input FSI. As such, the first input impedance is substantially based on the first parasitic capacitance 206 and inductances of the first pair 204 of tightly coupled inductors.

The first in-phase series capacitive element CSI1 and the second in-phase series capacitive element CSI2 are coupled in series between the first in-phase output FIO and a base of the first in-phase final transistor element 196. The first in-phase shunt inductive element LUI is coupled between the ground and a junction between the first in-phase series capacitive element CSI1 and the second in-phase series capacitive element CSI2. The first quadrature-phase series capacitive element CSQ1 and the second quadrature-phase series capacitive element CSQ2 are coupled in series between the first quadrature-phase output FQO and a base of the first quadrature-phase final transistor element 200. The first quadrature-phase shunt inductive element LUQ is coupled between the ground and a junction between the first quadrature-phase series capacitive element CSQ1 and the second quadrature-phase series capacitive element CSQ2.

The first in-phase series capacitive element CSI1, the second in-phase series capacitive element CSI2, and the first in-phase shunt inductive element LUI form a "T" network, which may provide at least an approximate impedance match between the first in-phase output FIO and the base of the first in-phase final transistor element 196. Similarly, the first quadrature-phase series capacitive element CSQ1, the second quadrature-phase series capacitive element CSQ2, and the first quadrature-phase shunt inductive element LUQ form a "T" network, which may provide at least an approximate impedance match between the first quadrature-phase output FQO and the base of the first quadrature-phase final transistor element 200.

During the first PA operating mode, the first in-phase final PA impedance matching circuit 144 receives and forwards an RF signal from the first in-phase output FIO to the base of the first in-phase final transistor element 196 via the first in-phase series capacitive element CSI1 and the second in-phase series capacitive element CSI2. During the first PA operating mode, the first quadrature-phase final PA impedance matching circuit 154 receives and forwards an RF signal from the first quadrature-phase output FQO to the base of the first quadrature-phase final transistor element 200 via the first quadrature-phase series capacitive element CSQ1 and the second quadrature-phase series capacitive element CSQ2.

The first in-phase final transistor element 196 shown is an NPN bipolar transistor element. Other embodiments of the first in-phase final transistor element 196 may use other types of transistor elements, such as FET elements. The base of the first in-phase final transistor element 196 and the first in-phase biasing circuitry 198 are coupled to the second in-phase series capacitive element CSI2. The first in-phase biasing circuitry 198 receives the first final bias signal FFB. An emitter of the first in-phase final transistor element 196 is coupled to the ground. A collector of the first in-phase final transistor element 196 is coupled to the first in-phase input FII. One end of the first in-phase collector inductive element LCI is coupled to the collector of the first in-phase final transistor element 196. An opposite end of the first in-phase collector inductive element LCI receives the envelope power supply signal EPS.

During the first PA operating mode, the first in-phase final transistor element 196 receives and amplifies an RF signal from the second in-phase series capacitive element CSI2 to provide an RF output signal to the first in-phase input FII. The envelope power supply signal EPS provides power for amplification via the first in-phase collector inductive element LCI. The first in-phase biasing circuitry 198 biases the first in-phase final transistor element 196. The first final bias signal FFB provides power for biasing the first in-phase final transistor element 196 to the first in-phase biasing circuitry 198. The first quadrature-phase final transistor element 200 shown is an NPN bipolar transistor element. Other embodiments of the first quadrature-phase final transistor element 200 may use other types of transistor elements, such as FET elements. The base of the first quadrature-phase final transistor element 200 and the first quadrature-phase biasing circuitry 202 are coupled to the second quadrature-phase series capacitive element CSQ2. The first quadrature-phase biasing circuitry 202 receives the first final bias signal FFB. An emitter of the first quadrature-phase final transistor element 200 is coupled to the ground. A collector of the first quadrature-phase final transistor element 200 is coupled to the first quadrature-phase input FQI. One end of the first quadrature-phase collector inductive element LCQ is coupled to the collector of the first quadrature-phase final transistor element 200. An opposite end of the first quadrature-phase collector inductive element LCQ receives the envelope power supply signal EPS.

During the first PA operating mode, the first quadrature-phase final transistor element 200 receives and amplifies an RF signal from the second quadrature-phase series capacitive element CSQ2 to provide an RF output signal to the first quadrature-phase input FQI. The envelope power supply signal EPS provides power for amplification via the first quadrature-phase collector inductive element LCQ. The first quadrature-phase biasing circuitry 202 biases the first quadrature-phase final transistor element 200. The first final bias signal FFB provides power for biasing the first quadrature-phase final transistor element 200 to the first quadrature-phase biasing circuitry 202.

In one embodiment of the RF PA circuitry 30 (FIG. 5), the RF PA circuitry 30 includes a first PA semiconductor die 210. In one embodiment of the first PA semiconductor die 210, the first PA semiconductor die 210 includes the first output transistor element 180, the first in-phase final transistor element 196, the first in-phase biasing circuitry 198, the first quadrature-phase final transistor element 200, the first quadrature-phase biasing circuitry 202, the first pair 204 of tightly coupled inductors, the first feeder biasing circuitry 208, the first in-phase series capacitive element CSI1, the second in-phase series capacitive element CSI2, the first quadrature-phase series capacitive element CSQ1, the second quadrature-phase series capacitive element CSQ2, the first isolation port resistive element RI1, the first base resistive element RB1, and the first DC blocking capacitive element CD1.

In alternate embodiments of the first PA semiconductor die 210, the first PA semiconductor die 210 may not include any or all of the first output transistor element 180, the first in-phase final transistor element 196, the first in-phase biasing circuitry 198, the first quadrature-phase final transistor element 200, the first quadrature-phase biasing circuitry 202, the first pair 204 of tightly coupled inductors, the first feeder biasing circuitry 208, the first in-phase series capacitive element CSI1, the second in-phase series capacitive element CSI2, the first quadrature-phase series capacitive element CSQ1, the second quadrature-phase series capacitive element CSQ2, the first isolation port resistive element RI1, the first base resistive element RB1, and the first DC blocking capacitive element CD1.

FIG. 31 shows details of the first feeder PA stage 114, the first quadrature RF splitter 124, the first in-phase final PA impedance matching circuit 144, the first in-phase final PA stage 146, the first quadrature-phase final PA impedance matching circuit 154, and the first quadrature-phase final PA stage 156 illustrated in FIG. 29 according to an alternate embodiment of the first feeder PA stage 114, the first quadrature RF splitter 124, the first in-phase final PA impedance matching circuit 144, the first in-phase final PA stage 146, the first quadrature-phase final PA impedance matching circuit 154, and the first quadrature-phase final PA stage 156. Further, FIG. 31 shows a portion of the first phase-shifting circuitry 192 illustrated in FIG. 29.

The first feeder PA stage 114, the first in-phase final PA impedance matching circuit 144, the first in-phase final PA stage 146, the first quadrature-phase final PA impedance matching circuit 154, and the first quadrature-phase final PA stage 156 illustrated in FIG. 31 are similar to the first feeder PA stage 114, the first in-phase final PA impedance matching circuit 144, the first in-phase final PA stage 146, the first quadrature-phase final PA impedance matching circuit 154, and the first quadrature-phase final PA stage 156 illustrated in FIG. 30. The first quadrature RF splitter 124 illustrated in FIG. 31 is similar to the first quadrature RF splitter 124 illustrated in FIG. 30, except the first quadrature RF splitter 124 illustrated in FIG. 31 further includes a first coupler capacitive element CC1 coupled between the first pair 204 of tightly coupled inductors and a second coupler capacitive element CC2 coupled between the first pair 204 of tightly coupled inductors. Specifically, the first coupler capacitive element CC1 is coupled between the first in-phase output FIO and the first isolation port resistive element RI1. The second coupler capacitive element CC2 is coupled between the first single-ended input FSI and the first quadrature-phase output FQO.

The first input impedance is substantially based on the first parasitic capacitance 206, inductances of the first pair 204 of tightly coupled inductors, the first coupler capacitive element CC1, and the second coupler capacitive element CC2. In general, the first input impedance is based on the first parasitic capacitance 206 and inductances of the first pair 204 of tightly coupled inductors. The first input impedance is further based on at least one coupler capacitive element, such as the first coupler capacitive element CC1, the second coupler capacitive element CC2, or both, coupled between the first pair 204 of tightly coupled inductors. In an alternate embodiment of the first quadrature RF splitter 124, either the first coupler capacitive element CC1 or the second coupler capacitive element CC2 is omitted.

FIG. 32 shows details of the first phase-shifting circuitry 192 and the first Wilkinson RF combiner 194 illustrated in FIG. 29 according to one embodiment of the first phase-shifting circuitry 192 and the first Wilkinson RF combiner 194. The first phase-shifting circuitry 192 includes a first in-phase phase-shift capacitive element CPI1, a first quadrature-phase phase-shift capacitive element CPQ1, a first in-phase phase-shift inductive element LPI1, and a first quadrature-phase phase-shift inductive element LPQ1. The first Wilkinson RF combiner 194 includes a first Wilkinson resistive element RW1, a first Wilkinson capacitive element CW1, a first Wilkinson in-phase side capacitive element CWI1, a first Wilkinson quadrature-phase side capacitive element CWQ1, a first Wilkinson in-phase side inductive element LWI1, a first Wilkinson quadrature-phase side inductive element LWQ1, a second DC blocking capacitive element CD2, a third DC blocking capacitive element CD3, and a fourth DC blocking capacitive element CD4

The first in-phase phase-shift capacitive element CPI1 is coupled between the first in-phase input FII and a first internal node (not shown). The first in-phase phase-shift inductive element LPI1 is coupled between the first internal node and the ground. The first quadrature-phase phase-shift inductive element LPQ1 is coupled between the first quadrature-phase input FQI and a second internal node (not shown). The first quadrature-phase phase-shift capacitive element CPQ1 is coupled between the second internal node and the ground. The second DC blocking capacitive element CD2 and the first Wilkinson resistive element RW1 are coupled in series between the first internal node and the second internal node. The first Wilkinson in-phase side capacitive element CWI1 is coupled between the first internal node and the ground. The first Wilkinson quadrature-phase side capacitive element CWQ1 is coupled between the first internal node and the ground. The first Wilkinson in-phase side inductive element LWI1 is coupled in series with the third DC blocking capacitive element CD3 between the first internal node and the first quadrature combiner output FCO. The first Wilkinson quadrature-phase side inductive element LWQ1 is coupled in series with the fourth DC blocking capacitive element CD4 between the second internal node and the first quadrature combiner output FCO. The first Wilkinson capacitive element CW1 is coupled between the first quadrature combiner output FCO and the ground.

FIG. 33 shows details of the second non-quadrature PA path 104 illustrated in FIG. 16 and details of the second quadrature PA path 106 illustrated in FIG. 18 according to one embodiment of the second non-quadrature PA path 104 and the second quadrature PA path 106. Further, FIG. 33 shows details of the second quadrature RF combiner 138 illustrated in FIG. 18 according to one embodiment of the second quadrature RF combiner 138 illustrated in FIG. 18. The second input PA impedance matching circuit 116, the second input PA stage 118, the second in-phase driver PA impedance matching circuit 160, the second in-phase driver PA stage 162, the second in-phase combiner impedance matching circuit 168, the second quadrature-phase driver PA impedance matching circuit 170, the second quadrature-phase driver PA stage 172, and the second quadrature-phase combiner impedance matching circuit 178 have been omitted from the second non-quadrature PA path 104 and the second quadrature PA path 106.

The second quadrature RF combiner 138 includes second phase-shifting circuitry 212 and a second Wilkinson RF combiner 214. The second phase-shifting circuitry 212 has the second in-phase input SII and the second quadrature-phase input SQI, and the second Wilkinson RF combiner 214 has the second quadrature combiner output SCO.

During the second PA operating mode, the second phase-shifting circuitry 212 receives and phase-aligns RF signals from the second in-phase final PA stage 166 and the second quadrature-phase final PA stage 176 via the second in-phase input SII and the second quadrature-phase input SQI, respectively, to provide phase-aligned RF signals to the second Wilkinson RF combiner 214. The second Wilkinson RF combiner 214 combines phase-aligned RF signals to provide the second RF output signal SRFO via the second quadrature combiner output SCO. The second phase-shifting circuitry 212 and the second Wilkinson RF combiner 214 may provide stable input impedances presented at the second in-phase input SII and the second quadrature-phase input SQI, respectively, which allows elimination of the second in-phase combiner impedance matching circuit 168 and the second quadrature-phase combiner impedance matching circuit 178.

FIG. 34 shows details of the second feeder PA stage 122, the second quadrature RF splitter 132, the second in-phase final PA impedance matching circuit 164, the second in-phase final PA stage 166, the second quadrature-phase final PA impedance matching circuit 174, and the second quadrature-phase final PA stage 176 illustrated in FIG. 33 according to one embodiment of the second feeder PA stage 122, the second quadrature RF splitter 132, the second in-phase final PA impedance matching circuit 164, the second in-phase final PA stage 166, the second quadrature-phase final PA impedance matching circuit 174, and the second quadrature-phase final PA stage 176. Further, FIG. 34 shows a portion of the second phase-shifting circuitry 212 illustrated in FIG. 33.

The second in-phase final PA stage 166 includes a second in-phase final transistor element 216, second in-phase biasing circuitry 218, and a second in-phase collector inductive element LLI. The second quadrature-phase final PA stage 176 includes a second quadrature-phase final transistor element 220, a second quadrature-phase biasing circuitry 222, and a second quadrature-phase collector inductive element LLQ. The second in-phase final PA impedance matching circuit 164 includes a third in-phase series capacitive element CSI3, a fourth in-phase series capacitive element CSI4, and a second in-phase shunt inductive element LNI. The second quadrature-phase final PA impedance matching circuit 174 includes a third quadrature-phase series capacitive element CSQ3, a fourth quadrature-phase series capacitive element CSQ4, and a second quadrature-phase shunt inductive element LNQ.

The second quadrature RF splitter 132 includes a second pair 224 of tightly coupled inductors and a second isolation port resistive element RI2. The second pair 224 of tightly coupled inductors has second parasitic capacitance 226 between the second pair 224 of tightly coupled inductors. Additionally, the second quadrature RF splitter 132 has the second single-ended input SSI, the second in-phase output SIO, and the second quadrature-phase output SQO. The second feeder PA stage 122 includes a second output transistor element 228, second feeder biasing circuitry 230, a fifth DC blocking capacitive element CD5, a second base resistive element RB2, and a second collector inductive element LC2. Additionally, the second feeder PA stage 122 has the second single-ended output SSO.

The second output transistor element 228 shown is an NPN bipolar transistor element. Other embodiments of the second output transistor element 228 may use other types of transistor elements, such as field effect transistor elements (FET) elements. The fifth DC blocking capacitive element CD5 is coupled between the second feeder PA impedance matching circuit 120 (FIG. 33) and the second base resistive element RB2. A base of the second output transistor element 228 and the second feeder biasing circuitry 230 are coupled to the second base resistive element RB2. In alternate embodiments of the second feeder PA stage 122, the second base resistive element RB2, the fifth DC blocking capacitive element CD5, or both may be omitted. The second feeder biasing circuitry 230 receives the second driver bias signal SDB. An emitter of the second output transistor element 228 is coupled to a ground. A collector of the second output transistor element 228 is coupled to the second single-ended output SSO. One end of the second collector inductive element LC2 is coupled to the second single-ended output SSO. An opposite end of the second collector inductive element LC2 receives the envelope power supply signal EPS. The second single-ended output SSO is coupled to the second single-ended input SSI.

During the second PA operating mode, the second output transistor element 228 receives and amplifies an RF signal from the second feeder PA impedance matching circuit 120 (FIG. 33) via the fifth DC blocking capacitive element CD5 and the second base resistive element RB2 to provide the second RF feeder output signal SFO (FIG. 33) to the second single-ended input SSI via the second single-ended output SSO. The envelope power supply signal EPS provides power for amplification via the second collector inductive element LC2. The second feeder biasing circuitry 230 biases the second output transistor element 228. The second driver bias signal SDB provides power for biasing the second output transistor element 228 to the second feeder biasing circuitry 230.

The second quadrature RF splitter 132 illustrated in FIG. 34 is a quadrature hybrid coupler. In this regard, the second pair 224 of tightly coupled inductors, the second parasitic capacitance 226, and the second isolation port resistive element RI2 provide quadrature hybrid coupler functionality. As such, the second single-ended input SSI functions as an input port to the quadrature hybrid coupler, the second in-phase output SIO functions as a zero degree output port from the quadrature hybrid coupler, and the second quadrature-phase output SQO functions as a 90 degree output port from the quadrature hybrid coupler. One of the second pair 224 of tightly coupled inductors is coupled between the second single-ended input SSI and the second in-phase output SIO. Another of the second pair 224 of tightly coupled inductors has a first end coupled to the second quadrature-phase output SQO and a second end coupled to the second isolation port resistive element RI2. As such, the second end functions as an isolation port of the quadrature hybrid coupler. In this regard, the second isolation port resistive element RI2 is coupled between the isolation port and the ground. The second in-phase output SIO is coupled to the third in-phase series capacitive element CSI3 and the second quadrature-phase output SQO is coupled to the third quadrature-phase series capacitive element CSQ3.

During the second PA operating mode, the second pair 224 of tightly coupled inductors receives, splits, and phase-shifts the second RF feeder output signal SFO (FIG. 33) from the second single-ended output SSO via the second single-ended input SSI to provide split, phase-shifted output signals to the third in-phase series capacitive element CSI3 and the third quadrature-phase series capacitive element CSQ3. As previously mentioned, the second input impedance is presented at the second single-ended input SSI. As such, the second input impedance is substantially based on the second parasitic capacitance 226 and inductances of the second pair 224 of tightly coupled inductors.

The third in-phase series capacitive element CSI3 and the fourth in-phase series capacitive element CSI4 are coupled in series between the second in-phase output SIO and a base of the second in-phase final transistor element 216. The second in-phase shunt inductive element LNI is coupled between the ground and a junction between the third in-phase series capacitive element CSI3 and the fourth in-phase series capacitive element CSI4. The third quadrature-phase series capacitive element CSQ3 and the fourth quadrature-phase series capacitive element CSQ4 are coupled in series between the second quadrature-phase output SQO and a base of the second quadrature-phase final transistor element 220. The second quadrature-phase shunt inductive element LNQ is coupled between the ground and a junction between the third quadrature-phase series capacitive element CSQ3 and the fourth quadrature-phase series capacitive element CSQ4.

The third in-phase series capacitive element CSI3, the fourth in-phase series capacitive element CSI4, and the second in-phase shunt inductive element LNI form a "T" network, which may provide at least an approximate impedance match between the second in-phase output SIO and the base of the second in-phase final transistor element 216. Similarly, the third quadrature-phase series capacitive element CSQ3, the fourth quadrature-phase series capacitive element CSQ4, and the second quadrature-phase shunt inductive element LNQ form a "T" network, which may provide at least an approximate impedance match between the second quadrature-phase output SQO and the base of the second quadrature-phase final transistor element 220.

During the second PA operating mode, the second in-phase final PA impedance matching circuit 164 receives and forwards an RF signal from the second in-phase output SIO to the base of the second in-phase final transistor element 216 via the third in-phase series capacitive element CSI3 and the fourth in-phase series capacitive element CSI4. During the second PA operating mode, the second quadrature-phase final PA impedance matching circuit 174 receives and forwards an RF signal from the second quadrature-phase output SQO to the base of the second quadrature-phase final transistor element 220 via the third quadrature-phase series capacitive element CSQ3 and the fourth quadrature-phase series capacitive element CSQ4. The second in-phase final transistor element 216 shown is an NPN bipolar transistor element. Other embodiments of the second in-phase final transistor element 216 may use other types of transistor elements, such as FET elements. The base of the second in-phase final transistor element 216 and the second in-phase biasing circuitry 218 are coupled to the fourth in-phase series capacitive element CSI4.

The second in-phase biasing circuitry 218 receives the second final bias signal SFB. An emitter of the second in-phase final transistor element 216 is coupled to the ground. A collector of the second in-phase final transistor element 216 is coupled to the second in-phase input SII. One end of the second in-phase collector inductive element LLI is coupled to the collector of the second in-phase final transistor element 216. An opposite end of the second in-phase collector inductive element LLI receives the envelope power supply signal EPS.

During the second PA operating mode, the second in-phase final transistor element 216 receives and amplifies an RF signal from the fourth in-phase series capacitive element CSI4 to provide an RF output signal to the second in-phase input SII. The envelope power supply signal EPS provides power for amplification via the second in-phase collector inductive element LLI. The second in-phase biasing circuitry 218 biases the second in-phase final transistor element 216. The second final bias signal SFB provides power for biasing the second in-phase final transistor element 216 to the second in-phase biasing circuitry 218.

The second quadrature-phase final transistor element 220 shown is an NPN bipolar transistor element. Other embodiments of the second quadrature-phase final transistor element 220 may use other types of transistor elements, such as FET elements. The base of the second quadrature-phase final transistor element 220 and the second quadrature-phase biasing circuitry 222 are coupled to the fourth quadrature-phase series capacitive element CSQ4. The second quadrature-phase biasing circuitry 222 receives the second final bias signal SFB. An emitter of the second quadrature-phase final transistor element 220 is coupled to the ground. A collector of the second quadrature-phase final transistor element 220 is coupled to the second quadrature-phase input SQI. One end of the second quadrature-phase collector inductive element LLQ is coupled to the collector of the second quadrature-phase final transistor element 220. An opposite end of the second quadrature-phase collector inductive element LLQ receives the envelope power supply signal EPS.

During the second PA operating mode, the second quadrature-phase final transistor element 220 receives and amplifies an RF signal from the fourth quadrature-phase series capacitive element CSQ4 to provide an RF output signal to the second quadrature-phase input SQI. The envelope power supply signal EPS provides power for amplification via the second quadrature-phase collector inductive element LLQ. The second quadrature-phase biasing circuitry 222 biases the second quadrature-phase final transistor element 220. The second final bias signal SFB provides power for biasing the second quadrature-phase final transistor element 220 to the second quadrature-phase biasing circuitry 222.

In one embodiment of the RF PA circuitry 30 (FIG. 5), the RF PA circuitry 30 includes a second PA semiconductor die 232. In one embodiment of the second PA semiconductor die 232, the second PA semiconductor die 232 includes the second output transistor element 228, second in-phase final transistor element 216, second in-phase biasing circuitry 218, the second quadrature-phase final transistor element 220, second quadrature-phase biasing circuitry 222, the second pair 224 of tightly coupled inductors, the second feeder biasing circuitry 230, the third in-phase series capacitive element CSI3, the fourth in-phase series capacitive element CSI4, the third quadrature-phase series capacitive element CSQ3, the fourth quadrature-phase series capacitive element CSQ4, the second isolation port resistive element RI2, the second base resistive element RB2, and the fifth DC blocking capacitive element CD5.

In alternate embodiments of the second PA semiconductor die 232, the second PA semiconductor die 232 may not include any or all of the second output transistor element 228, the second in-phase final transistor element 216, the second in-phase biasing circuitry 218, the second quadrature-phase final transistor element 220, the second quadrature-phase biasing circuitry 222, the second pair 224 of tightly coupled inductors, the second feeder biasing circuitry 230, the third in-phase series capacitive element CSI3, the fourth in-phase series capacitive element CSI4, the third quadrature-phase series capacitive element CSQ3, the fourth quadrature-phase series capacitive element CSQ4, the second isolation port resistive element RI2, the second base resistive element RB2, and the fifth DC blocking capacitive element CD5.

FIG. 35 shows details of the second phase-shifting circuitry 212 and the second Wilkinson RF combiner 214 illustrated in FIG. 33 according to one embodiment of the second phase-shifting circuitry 212 and the second Wilkinson RF combiner 214. The second phase-shifting circuitry 212 includes a second in-phase phase-shift capacitive element CPI2, a second quadrature-phase phase-shift capacitive element CPQ2, a second in-phase phase-shift inductive element LPI2, and a second quadrature-phase phase-shift inductive element LPQ2. The second Wilkinson RF combiner 214 includes a second Wilkinson resistive element RW2, a second Wilkinson capacitive element CW2, a second Wilkinson in-phase side capacitive element CWI2, a second Wilkinson quadrature-phase side capacitive element CWQ2, a second Wilkinson in-phase side inductive element LWI2, a second Wilkinson quadrature-phase side inductive element LWQ2, a sixth DC blocking capacitive element CD6, a seventh DC blocking capacitive element CD7, and a eighth DC blocking capacitive element CD8.

The second in-phase phase-shift capacitive element CPI2 is coupled between the second in-phase input SII and a third internal node (not shown). The second in-phase phase-shift inductive element LPI2 is coupled between the third internal node and the ground. The second quadrature-phase phase-shift inductive element LPQ2 is coupled between the second quadrature-phase input SQI and a fourth internal node (not shown). The second quadrature-phase phase-shift capacitive element CPQ2 is coupled between the fourth internal node and the ground. The sixth DC blocking capacitive element CD6 and the second Wilkinson resistive element RW2 are coupled in series between the third internal node and the fourth internal node. The second Wilkinson in-phase side capacitive element CWI2 is coupled between the third internal node and the ground. The second Wilkinson quadrature-phase side capacitive element CWQ2 is coupled between the third internal node and the ground. The second Wilkinson in-phase side inductive element LWI2 is coupled in series with the seventh DC blocking capacitive element CD7 between the third internal node and the second quadrature combiner output SCO. The second Wilkinson quadrature-phase side inductive element LWQ2 is coupled in series with the eighth DC blocking capacitive element CD8 between the fourth internal node and the second quadrature combiner output SCO. The second Wilkinson capacitive element CW2 is coupled between the second quadrature combiner output SCO and the ground.

FIG. 36 shows details of the first PA semiconductor die 210 illustrated in FIG. 30 according to one embodiment of the first PA semiconductor die 210. The first PA semiconductor die 210 includes a first substrate and functional layers 234, multiple insulating layers 236, and multiple metallization layers 238. Some of the insulating layers 236 may be used to separate some of the metallization layers 238 from one another. In one embodiment of the metallization layers 238, each of the metallization layers 238 is about parallel to at least another of the metallization layers 238. In this regard the metallization layers 238 may be planar. In an alternate embodiment of the metallization layers 238, the metallization layers 238 are formed over a non-planar structure, such that spacing between pairs of the metallization layers 238 is about constant. In one embodiment of the metallization layers 238, each of the first pair 204 of tightly coupled inductors (FIG. 30) is constructed using at least one of the metallization layers 238.

Linear Mode and Non-Linear Mode Quadrature PA Circuitry

A summary of linear mode and non-linear mode quadrature PA circuitry is presented, followed by a detailed description of the linear mode and non-linear mode quadrature PA circuitry according to one embodiment of the present disclosure. Multi-mode multi-band RF PA circuitry includes a multi-mode multi-band quadrature RF PA coupled to multi-mode multi-band switching circuitry via a single output. The switching circuitry provides at least one non-linear mode output and multiple linear mode outputs. The non-linear mode output may be associated with at least one non-linear mode RF communications band and each linear mode output may be associated with a corresponding linear mode RF communications band. The outputs from the switching circuitry may be coupled to an antenna port via front-end aggregation circuitry. The quadrature nature of the quadrature PA path may provide tolerance for changes in antenna loading conditions.

One embodiment of the RF PA circuitry includes a highband multi-mode multi-band quadrature RF PA coupled to highband multi-mode multi-band switching circuitry and a lowband multi-mode multi-band quadrature RF PA coupled to lowband multi-mode multi-band switching circuitry. The highband switching circuitry may be associated with at least one highband non-linear mode RF communications band and multiple highband linear mode RF communications bands. The lowband switching circuitry may be associated with at least one lowband non-linear mode RF communications band and multiple lowband linear mode RF communications bands.

FIG. 37 shows details of the RF PA circuitry 30 illustrated in FIG. 5 according to one embodiment of the RF PA circuitry 30. The RF PA circuitry 30 illustrated in FIG. 37 is similar to the RF PA circuitry 30 illustrated in FIG. 8, except in the RF PA circuitry 30 illustrated in FIG. 37, the first RF PA 50 is a first multi-mode multi-band quadrature RF PA; the second RF PA 54 is a second multi-mode multi-band quadrature RF PA; the alpha switching circuitry 52 is multi-mode multi-band RF switching circuitry; the first RF PA 50 includes a single alpha PA output SAP; the second RF PA 54 includes a single beta PA output SBP; the alpha switching circuitry 52 further includes a first alpha non-linear mode output FANO, a first alpha linear mode output FALO, and up to and including an $R^{TH}$ alpha linear mode output RALO; and the beta switching circuitry 56 further includes a first beta non-linear mode output FBNO, a first beta linear mode output FBLO, and up to and including an $S^{TH}$ beta linear mode output SBLO. In general, the alpha switching circuitry 52 includes a group of alpha linear mode outputs FALO, RALO and the beta switching circuitry 56 includes a group of beta linear mode outputs FBLO, SBLO.

The first RF PA 50 is coupled to the alpha switching circuitry 52 via the single alpha PA output SAP. The second RF PA 54 is coupled to the beta switching circuitry 56 via the single beta PA output SBP. In one embodiment of the first RF PA 50, the single alpha PA output SAP is a single-ended output. In one embodiment of the second RF PA 54, the single beta PA output SBP is a single-ended output. In one embodiment of the alpha switching circuitry 52, the first alpha non-linear mode output FANO is associated with a first non-linear mode RF communications band and each of the group of alpha linear mode outputs FALO, RALO is associated with a corresponding one of a first group of linear mode RF communications bands. In one embodiment of the beta switching circuitry 56, the first beta non-linear mode output FBNO is associated with a second non-linear mode RF communications band and each of the group of beta linear mode outputs FBLO, SBLO is associated with a corresponding one of a second group of linear mode RF communications bands.

In an alternate embodiment of the alpha switching circuitry 52, the first alpha non-linear mode output FANO is associated with a first group of non-linear mode RF communications bands, which includes the first non-linear mode RF communications band. In an alternate embodiment of the beta switching circuitry 56, the first beta non-linear mode output FBNO is associated with a second group of non-linear mode RF communications bands, which includes the second non-linear mode RF communications band.

In one embodiment of the RF communications system 26 (FIG. 5), the RF communications system 26 operates in one of a group of communications modes. Control circuitry, which may include the control circuitry 42 (FIG. 5), the PA control circuitry 94 (FIG. 13), or both, selects one of the group of communications modes. In one embodiment of the RF communications system 26, the group of communications modes includes a first alpha non-linear mode and a group of alpha linear modes. In an alternate embodiment of the RF communications system 26, the group of communications modes includes the first alpha non-linear mode, the group of alpha linear modes, a first beta non-linear mode, and a group of beta non-linear modes. In an additional embodiment of the RF communications system 26, the group of communications modes includes a group of alpha non-linear modes, the group of alpha linear modes, a group of beta non-linear modes, and the group of beta non-linear modes. Other embodiments of the RF communications system 26 may omit any or all of the communications modes. In one embodiment of the first alpha non-linear mode, the first alpha non-linear mode is a half-duplex mode. In one embodiment of the first beta non-linear mode, the beta alpha non-linear mode is a half-duplex mode. In one embodiment of the group of alpha linear modes, each of the group of alpha linear modes is a full-duplex mode. In one embodiment of the group of beta linear modes, each of the group of beta linear modes is a full-duplex mode.

In one embodiment of the first RF PA 50, during the first alpha non-linear mode and during each of the group of alpha linear modes, the first RF PA 50 receives and amplifies the first RF input signal FRFI to provide the first RF output signal FRFO via the single alpha PA output SAP. Further, during the first beta non-linear mode and during each of the group of beta linear modes, the first RF PA 50 does not receive or amplify the first RF input signal FRFI to provide the first RF output signal FRFO.

In one embodiment of the second RF PA 54, during the first beta non-linear mode and during each of the group of beta linear modes, the second RF PA 54 receives and amplifies the second RF input signal SRFI to provide the second RF output signal SRFO via the single beta PA output SBP. Further, during the first alpha non-linear mode and during each of the group of alpha linear modes, the second RF PA 54 does not receive or amplify the second RF input signal SRFI to provide the second RF output signal SRFO.

In one embodiment of the alpha switching circuitry 52, during the first alpha non-linear mode, the alpha switching circuitry 52 receives and forwards the first RF output signal FRFO to provide the first alpha RF transmit signal FATX via the first alpha non-linear mode output FANO. During a first alpha linear mode, the alpha switching circuitry 52 receives and forwards the first RF output signal FRFO to provide the second alpha RF transmit signal SATX via the first alpha linear mode output FALO. During an $R^{TH}$ alpha linear mode, the alpha switching circuitry 52 receives and forwards the first RF output signal FRFO to provide the $P^{TH}$ alpha RF transmit signal PATX. In general, during each of the group of alpha linear modes, the alpha switching circuitry 52 receives and forwards the first RF output signal FRFO to provide a corresponding one of a group of alpha RF transmit signals SATX, PATX via a corresponding one of the group of alpha linear mode outputs FALO, RALO.

In one embodiment of the beta switching circuitry 56, during the first beta non-linear mode, the beta switching circuitry 56 receives and forwards the second RF output signal SRFO to provide the first beta RF transmit signal FBTX via the first beta non-linear mode output FBNO. During a first beta linear mode, the beta switching circuitry 56 receives and forwards the second RF output signal SRFO to provide the second beta RF transmit signal SBTX via the first beta linear mode output FBLO. During an $S^{TH}$ beta linear mode, the beta switching circuitry 56 receives and forwards the second RF output signal SRFO to provide the $Q^{TH}$ beta RF transmit signal QBTX. In general, during each of the group of beta linear modes, the beta switching circuitry 56 receives and forwards the second RF output signal SRFO to provide a corresponding one of a group of beta RF transmit signals SBTX, QBTX via a corresponding one of the group of beta linear mode outputs FBLO, SBLO.

FIG. 38 shows details of the RF PA circuitry 30 illustrated in FIG. 5 according to an alternate embodiment of the RF PA circuitry 30. The RF PA circuitry 30 illustrated in FIG. 38 is similar to the RF PA circuitry 30 illustrated in FIG. 9, except in the RF PA circuitry 30 illustrated in FIG. 38, the first RF PA 50 is the first multi-mode multi-band quadrature RF PA; the second RF PA 54 is the second multi-mode multi-band quadrature RF PA; the alpha switching circuitry 52 is multi-mode multi-band RF switching circuitry; the first RF PA 50 includes the single alpha PA output SAP; the second RF PA 54 includes the single beta PA output SBP; the alpha switching circuitry 52 further includes the first alpha non-linear mode output FANO, a second alpha non-linear mode output SANO, the first alpha linear mode output FALO, and up to and including the $R^{TH}$ alpha linear mode output RALO; and the beta switching circuitry 56 further includes the first beta non-linear mode output FBNO, a second beta non-linear mode output SBNO, the first beta linear mode output FBLO, and up to and including the $S^{TH}$ beta linear mode output SBLO. In general, the alpha switching circuitry 52 includes the group of alpha linear mode outputs FALO, RALO and the beta switching circuitry 56 includes the group of beta linear mode outputs FBLO, SBLO. Additionally, in general, the alpha switching circuitry 52 includes at least the first alpha harmonic filter 70 and the beta switching circuitry 56 includes at least the first beta harmonic filter 74.

Dual-Path PA Circuitry with Harmonic Filters

A summary of dual-path PA circuitry with harmonic filters is presented, followed by a detailed description of the dual-path PA circuitry with harmonic filters according to one embodiment of the present disclosure. The dual-path PA circuitry includes a first transmit path and a second transmit path. Each transmit path has an RF PA and switching circuitry having at least one harmonic filter. Each RF PA may be coupled to its corresponding switching circuitry via a single output. Each switching circuitry provides at least one output via a harmonic filter and multiple outputs without harmonic filtering. The output via the harmonic filter may be a non-linear mode output and the outputs without harmonic filtering may be linear mode outputs. The non-linear mode output may be associated with at least one non-linear mode RF communications band and the linear mode outputs may be associated with multiple linear mode RF communications bands. As such, each RF PA may be a multi-mode multi-band RF PA.

The outputs from the switching circuitry may be coupled to an antenna port via front-end aggregation circuitry. The quadrature nature of the quadrature PA path may provide tolerance for changes in antenna loading conditions. One embodiment of the RF PA circuitry includes a highband multi-mode multi-band quadrature RF PA coupled to highband multi-mode multi-band switching circuitry and a lowband multi-mode multi-band quadrature RF PA coupled to lowband multi-mode multi-band switching circuitry. The highband switching circuitry may be associated with at least one highband non-linear mode RF communications band and multiple highband linear mode RF communications bands. The lowband switching circuitry may be associated with at least one lowband non-linear mode RF communications band and multiple lowband linear mode RF communications bands.

In one embodiment of the RF PA circuitry 30, the first alpha non-linear mode output FANO is a first alpha output, the second alpha non-linear mode output SANO is a second alpha output, the first beta non-linear mode output FBNO is a first beta output, the second beta non-linear mode output SBNO is a second beta output, the group of alpha linear mode outputs FALO, RALO is a group of alpha outputs, and the group of beta linear mode outputs FBLO, SBLO is a group of beta outputs. The alpha switching circuitry 52 provides the first alpha output via the first alpha harmonic filter 70. The alpha switching circuitry 52 provides the second alpha output via the second alpha harmonic filter 76. The alpha switching circuitry 52 provides the group of alpha outputs without harmonic filtering. The beta switching circuitry 56 provides the first beta output via the first beta harmonic filter 74. The beta switching circuitry 56 provides the second beta output via the second beta harmonic filter 78. The beta switching circuitry 56 provides the group of beta outputs without harmonic filtering.

In one embodiment of the RF communications system 26 (FIG. 5), the RF communications system 26 operates in one of a group of communications modes. Control circuitry, which may include the control circuitry 42 (FIG. 5), the PA control circuitry 94 (FIG. 13), or both, selects one of the group of communications modes. In one embodiment of the RF communications system 26, the group of communications modes includes the first alpha non-linear mode, the group of alpha linear modes, the first beta non-linear mode, and the group of beta non-linear modes. Other embodiments of the RF communications system 26 may omit any or all of the communications modes. In one embodiment of the first alpha non-linear mode, the first alpha non-linear mode is a half-duplex mode. In one embodiment of the first beta non-linear mode, the beta alpha non-linear mode is a half-duplex mode. In one embodiment of the group of alpha linear modes, each of the group of alpha linear modes is a full-duplex mode. In one embodiment of the group of beta linear modes, each of the group of beta linear modes is a full-duplex mode.

In one embodiment of the first RF PA 50, during the first alpha non-linear mode and during each of the group of alpha linear modes, the first RF PA 50 receives and amplifies the first RF input signal FRFI to provide the first RF output signal FRFO via the single alpha PA output SAP. Further, during the first beta non-linear mode and during each of the group of beta linear modes, the first RF PA 50 does not receive or amplify the first RF input signal FRFI to provide the first RF output signal FRFO.

In one embodiment of the second RF PA 54, during the first beta non-linear mode and during each of the group of beta linear modes, the second RF PA 54 receives and amplifies the second RF input signal SRFI to provide the second RF output signal SRFO via the single beta PA output SBP. Further, during the first alpha non-linear mode and during each of the group of alpha linear modes, the second RF PA 54 does not receive or amplify the second RF input signal SRFI to provide the second RF output signal SRFO.

In one embodiment of the alpha switching circuitry 52, during the first alpha non-linear mode, the alpha switching circuitry 52 receives and forwards the first RF output signal FRFO to provide the first alpha RF transmit signal FATX via the first alpha harmonic filter 70 and the first alpha output. During each of the group of alpha linear modes, the alpha switching circuitry 52 receives and forwards the first RF output signal FRFO to provide a corresponding one of a group of alpha RF transmit signals TATX, PATX via a corresponding one of the group of alpha outputs.

In one embodiment of the beta switching circuitry 56, during the first beta non-linear mode, the beta switching circuitry 56 receives and forwards the second RF output signal SRFO to provide the first beta RF transmit signal FBTX via the first beta harmonic filter 74 and the first beta output. During each of the group of beta linear modes, the beta switching circuitry 56 receives and forwards the second RF output signal SRFO to provide a corresponding one of a group of beta RF transmit signals TBTX, QBTX via a corresponding one of the group of beta outputs.

FIG. 39 shows details of the RF PA circuitry 30 illustrated in FIG. 5 according to an additional embodiment of the RF PA circuitry 30. The RF PA circuitry 30 illustrated in FIG. 39 is similar to the RF PA circuitry 30 illustrated in FIG. 37, except the RF PA circuitry 30 illustrated in FIG. 39 further includes the switch driver circuitry 98 (FIG. 13) and shows details of the alpha RF switch 68 and the beta RF switch 72. The alpha RF switch 68 includes a first alpha switching device 240, a second alpha switching device 242, and a third alpha switching device 244. The beta RF switch 72 includes a first beta switching device 246, a second beta switching device 248, and a third beta switching device 250. Alternate embodiments of the alpha RF switch 68 may include any number of alpha switching devices. Alternate embodiments of the beta RF switch 72 may include any number of beta switching devices.

The first alpha switching device 240 is coupled between the single alpha PA output SAP and the first alpha harmonic filter 70. As such, the first alpha switching device 240 is coupled between the single alpha PA output SAP and the first alpha non-linear mode output FANO via the first alpha harmonic filter 70. The second alpha switching device 242 is coupled between the single alpha PA output SAP and the first alpha linear mode output FALO. The third alpha switching device 244 is coupled between the single alpha PA output SAP and the $R^{TH}$ alpha linear mode output RALO. In general, the alpha RF switch 68 includes the first alpha switching device 240 and a group of alpha switching devices, which includes the second alpha switching device 242 and the third alpha switching device 244. As previously mentioned, the alpha switching circuitry 52 includes the group of alpha linear mode outputs FALO, RALO. As such, each of the group of alpha switching devices 242, 244 is coupled between the single alpha PA output SAP and a corresponding one of the group of alpha linear mode outputs FALO, RALO. Additionally, each of the alpha switching devices 240, 242, 244 has a corresponding control input, which is coupled to the switch driver circuitry 98.

The first beta switching device 246 is coupled between the single beta PA output SBP and the first beta harmonic filter 74. As such, the first beta switching device 246 is coupled between the single beta PA output SBP and the first beta non-linear mode output FBNO via the first beta harmonic filter 74. The second beta switching device 248 is coupled between the single beta PA output SBP and the first beta linear mode output FBLO. The third beta switching device 250 is coupled between the single beta PA output SBP and the $S^{TH}$ beta linear mode output SBLO. In general, the beta RF switch 72 includes the first beta switching device 246 and a group of beta switching devices, which includes the second beta switching device 248 and the third beta switching device 250. As previously mentioned, the beta switching circuitry 56 includes the group of beta linear mode outputs FBLO, SBLO.

As such, each of the group of beta switching devices 248, 250 is coupled between the single beta PA output SBP and a corresponding one of the group of beta linear mode outputs FBLO, SBLO. Additionally, each of the beta switching devices 246, 248, 250 has a corresponding control input, which is coupled to the switch driver circuitry 98.

In one embodiment of the alpha RF switch 68, the first alpha switching device 240 includes multiple switching elements (not shown) coupled in series. Each of the group of alpha switching devices 242, 244 includes multiple switching elements (not shown) coupled in series. In one embodiment of the beta RF switch 72, the first beta switching device 246 includes multiple switching elements (not shown) coupled in series. Each of the group of beta switching devices 248, 250 includes multiple switching elements (not shown) coupled in series.

PA Bias Supply Using Boosted Voltage

A summary of a PA bias supply using boosted voltage is presented, followed by a detailed description of the PA bias supply using boosted voltage according to one embodiment of the present disclosure. An RF PA bias power supply signal is provided to RF PA circuitry by boosting a voltage from a DC power supply, such as a battery. In this regard, a DC-DC converter receives a DC power supply signal from the DC power supply. The DC-DC converter provides the bias power supply signal based on the DC power supply signal, such that a voltage of the bias power supply signal is greater than a voltage of the DC power supply signal. The RF PA circuitry has an RF PA, which has a final stage that receives a final bias signal to bias the final stage, such that the final bias signal is based on the bias power supply signal. Boosting the voltage from the DC power supply may provide greater flexibility in biasing the RF PA.

In one embodiment of the DC-DC converter, the DC-DC converter includes a charge pump, which may receive and pump-up the DC power supply signal to provide the bias power supply signal. Further, the DC-DC converter may operate in one of a bias supply pump-up operating mode and at least one other operating mode, which may include any or all of a bias supply pump-even operating mode, a bias supply pump-down operating mode, and a bias supply bypass operating mode. Additionally, the DC-DC converter provides an envelope power supply signal to the RF PA, which uses the envelope power supply signal to provide power for amplification. In one embodiment of the RF PA circuitry, the RF PA circuitry includes PA bias circuitry, which receives the bias power supply signal to provide the final bias signal. The PA bias circuitry may include a final stage current analog-to-digital converter (IDAC) to receive and use the bias power supply signal in a digital-to-analog conversion to provide the final bias signal.

In an alternate embodiment of the RF PA circuitry, the RF PA circuitry includes a first RF PA and a second RF PA, which include a first final stage and a second final stage, respectively. The first RF PA may be used to receive and amplify a highband RF input signal and the second RF PA may be used to receive and amplify a lowband RF input signal. The RF PA circuitry operates in one of a first PA operating mode and a second PA operating mode, such that during the first PA operating mode, the first RF PA is active and the second RF PA is disabled. Conversely, during the second PA operating mode, the first RF PA is disabled and the second RF PA is active. The PA bias circuitry may include the final stage IDAC and a final stage multiplexer. The final stage IDAC receives and uses the bias power supply signal in a digital-to-analog conversion to provide a final stage bias signal to the final stage multiplexer. During the first PA operating mode, the final stage multiplexer receives and forwards the final stage bias signal to provide a first final bias signal to the first RF PA to bias the first final stage. During the second PA operating mode, the final stage multiplexer receives and forwards the final stage bias signal to provide a second final bias signal to the second RF PA to bias the second final stage.

FIG. 40 shows details of the first RF PA 50, the second RF PA 54, and the PA bias circuitry 96 illustrated in FIG. 13 according to one embodiment of the first RF PA 50, the second RF PA 54, and the PA bias circuitry 96. The first RF PA 50 includes a first driver stage 252 and a first final stage 254. The second RF PA 54 includes a second driver stage 256 and a second final stage 258. The PA bias circuitry 96 includes driver stage IDAC circuitry 260 and final stage IDAC circuitry 262. In general, the first RF PA 50 receives and amplifies the first RF input signal FRFI to provide the first RF output signal FRFO. Similarly, the second RF PA 54 receives and amplifies the second RF input signal SRFI to provide the second RF output signal SRFO. Specifically, the first driver stage 252 receives and amplifies the first RF input signal FRFI to provide a first final stage input signal FFSI, and the first final stage 254 receives and amplifies the first final stage input signal FFSI to provide the first RF output signal FRFO. Similarly, the second driver stage 256 receives and amplifies the second RF input signal SRFI to provide a second final stage input signal SFSI, and the second final stage 258 receives and amplifies the second final stage input signal SFSI to provide the second RF output signal SRFO.

The first driver stage 252 receives the envelope power supply signal EPS, which provides power for amplification; the first final stage 254 receives the envelope power supply signal EPS, which provides power for amplification; the second driver stage 256 receives the envelope power supply signal EPS, which provides power for amplification; and the second final stage 258 receives the envelope power supply signal EPS, which provides power for amplification. In general, the first RF PA 50 receives the first driver bias signal FDB to bias first driver stage 252 and receives the first final bias signal FFB to bias the first final stage 254. Specifically, the first driver stage 252 receives the first driver bias signal FDB to bias the first driver stage 252 and the first final stage 254 receives the first final bias signal FFB to bias the first final stage 254. Similarly, the second RF PA 54 receives the second driver bias signal SDB to bias the second driver stage 256 and receives the second final bias signal SFB to bias the second final stage 258. Specifically, the second driver stage 256 receives the second driver bias signal SDB to bias the second driver stage 256 and the second final stage 258 receives the second final bias signal SFB to bias the second final stage 258.

In general, the PA bias circuitry 96 provides the first driver bias signal FDB based on the bias power supply signal BPS, the first final bias signal FFB based on the bias power supply signal BPS, the second driver bias signal SDB based on the bias power supply signal BPS, and the second final bias signal SFB based on the bias power supply signal BPS. Specifically, the driver stage IDAC circuitry 260 provides the first driver bias signal FDB based on the bias power supply signal BPS and provides the second driver bias signal SDB based on the bias power supply signal BPS. Similarly, the final stage IDAC circuitry 262 provides the first final bias signal FFB based on the bias power supply signal BPS and provides the second final bias signal SFB based on the bias power supply signal BPS.

In one embodiment of the driver stage IDAC circuitry 260 and the final stage IDAC circuitry 262, the driver stage IDAC circuitry 260 and the final stage IDAC circuitry 262 receive the bias power supply signal BPS and the bias configuration control signal BCC. The driver stage IDAC circuitry 260 provides the first driver bias signal FDB and the second driver bias signal SDB based on the bias power supply signal BPS and the bias configuration control signal BCC. The final stage IDAC circuitry 262 provides the first final bias signal FFB and the second final bias signal SFB based on the bias power supply signal BPS and the bias configuration control signal BCC. The bias power supply signal BPS provides the power necessary to generate the bias signals FDB, FFB, SDB, SFB. A selected magnitude of each of the bias signals FDB, FFB, SDB, SFB is provided by the driver stage IDAC circuitry 260 and the final stage IDAC circuitry 262. In one embodiment of the RF PA circuitry 30, the PA control circuitry 94 selects the magnitude of any or all of the bias signals FDB, FFB, SDB, SFB and communicates the magnitude selections to the driver stage IDAC circuitry 260 and the final stage IDAC circuitry 262 via the bias configuration control signal BCC. The magnitude selections by the PA control circuitry 94 may be based on the PA configuration control signal PCC. In an alternate embodiment of the RF PA circuitry 30, the control circuitry 42 (FIG. 5) selects the magnitude of any or all of the bias signals FDB, FFB, SDB, SFB and communicates the magnitude selections to the driver stage IDAC circuitry 260 and the final stage IDAC circuitry 262 via the PA control circuitry 94.

As previously discussed, in one embodiment of the RF PA circuitry 30, the RF PA circuitry 30 operates in one of the first PA operating mode and the second PA operating mode. During the first PA operating mode, the first RF PA 50 receives and amplifies the first RF input signal FRFI to provide the first RF output signal FRFO, and the second RF PA 54 is disabled. During the second PA operating mode, the second RF PA 54 receives and amplifies the second RF input signal SRFI to provide the second RF output signal SRFO, and the first RF PA 50 is disabled.

In one embodiment of the first RF PA 50, during the second PA operating mode, the first RF PA 50 is disabled via the first driver bias signal FDB. As such, the first driver stage 252 is disabled. In an alternate embodiment of the first RF PA 50, during the second PA operating mode, the first RF PA 50 is disabled via the first final bias signal FFB. As such, the first final stage 254 is disabled. In an additional embodiment of the first RF PA 50, during the second PA operating mode, the first RF PA 50 is disabled via both the first driver bias signal FDB and the first final bias signal FFB. As such, both the first driver stage 252 and the first final stage 254 are disabled.

In one embodiment of the second RF PA 54, during the first PA operating mode, the second RF PA 54 is disabled via the second driver bias signal SDB. As such, the second driver stage 256 is disabled. In an alternate embodiment of the second RF PA 54, during the first PA operating mode, the second RF PA 54 is disabled via the second final bias signal SFB. As such, the second final stage 258 is disabled. In an additional embodiment of the second RF PA 54, during the first PA operating mode, the second RF PA 54 is disabled via both the second driver bias signal SDB and the second final bias signal SFB. As such, both the second driver stage 256 and the second final stage 258 are disabled.

In one embodiment of the RF PA circuitry 30, the PA control circuitry 94 selects the one of the first PA operating mode and the second PA operating mode. As such, the PA control circuitry 94 may control any or all of the bias signals FDB, FFB, SDB, SFB via the bias configuration control signal BCC based on the PA operating mode selection. The PA operating mode selection may be based on the PA configuration control signal PCC. In an alternate embodiment of the RF PA circuitry 30, the control circuitry 42 (FIG. 5) selects the one of the first PA operating mode and the second PA operating mode. As such, the control circuitry 42 (FIG. 5) may indicate the operating mode selection to the PA control circuitry 94 via the PA configuration control signal PCC. In an additional embodiment of the RF PA circuitry 30, the RF modulation and control circuitry 28 (FIG. 5) selects the one of the first PA operating mode and the second PA operating mode. As such, the RF modulation and control circuitry 28 (FIG. 5) may indicate the operating mode selection to the PA control circuitry 94 via the PA configuration control signal PCC. In general, selection of the PA operating mode is made by control circuitry, which may be any of the PA control circuitry 94, the RF modulation and control circuitry 28 (FIG. 5), and the control circuitry 42 (FIG. 5).

Further, during the first PA operating mode, the control circuitry selects a desired magnitude of the first driver bias signal FDB, a desired magnitude of the first final bias signal FFB, or both. During the second PA operating mode, the control circuitry selects a desired magnitude of the second driver bias signal SDB, a desired magnitude of the second final bias signal SFB, or both As such, during the first PA operating mode, the PA control circuitry 94 provides the bias configuration control signal BCC to the PA bias circuitry 96 in general and to the driver stage IDAC circuitry 260 in particular based on the desired magnitude of the first driver bias signal FDB, and the PA control circuitry 94 provides the bias configuration control signal BCC to the PA bias circuitry 96 in general and to the final stage IDAC circuitry 262 in particular based on the desired magnitude of the first final bias signal FFB. During the second PA operating mode, the PA control circuitry 94 provides the bias configuration control signal BCC to the PA bias circuitry 96 in general and to the driver stage IDAC circuitry 260 in particular based on the desired magnitude of the second driver bias signal SDB, and the PA control circuitry 94 provides the bias configuration control signal BCC to the PA bias circuitry 96 in general and to the final stage IDAC circuitry 262 in particular based on the desired magnitude of the second final bias signal SFB. In one embodiment of the PA control circuitry 94, the bias configuration control signal BCC is a digital signal.

FIG. 41 shows details of the driver stage IDAC circuitry 260 and the final stage IDAC circuitry 262 illustrated in FIG. 40 according to one embodiment of the driver stage IDAC circuitry 260 and the final stage IDAC circuitry 262. The driver stage IDAC circuitry 260 includes a driver stage IDAC 264, a driver stage multiplexer 266, and driver stage current reference circuitry 268. The final stage IDAC circuitry 262 includes a final stage IDAC 270, a final stage multiplexer 272, and final stage current reference circuitry 274.

The driver stage IDAC 264 receives the bias power supply signal BPS, the bias configuration control signal BCC, and a driver stage reference current IDSR. As such, the driver stage IDAC 264 uses the bias power supply signal BPS and the driver stage reference current IDSR in a digital-to-analog conversion to provide a driver stage bias signal DSBS. A magnitude of the digital-to-analog conversion is based on the bias configuration control signal BCC. The driver stage current reference circuitry 268 is coupled to the driver stage IDAC 264 and provides the driver stage reference current IDSR to the driver stage IDAC 264, such that during the first PA operating mode, the first driver bias signal FDB is based on the driver stage reference current IDSR, and during the second PA operating mode, the second driver bias signal SDB is based on the driver stage reference current IDSR. The driver stage current reference circuitry 268 may be disabled based on the bias configuration control signal BCC. The driver stage current reference circuitry 268 and the driver stage multiplexer 266 receive the bias configuration control signal BCC. The driver stage multiplexer 266 receives and forwards the driver stage bias signal DSBS, which is a current signal, to provide either the second driver bias signal SDB or the first driver bias signal FDB based on the bias configuration control signal BCC. During the first PA operating mode, the driver stage multiplexer 266 receives and forwards the driver stage bias signal DSBS to provide the first driver bias signal FDB based on the bias configuration control signal BCC. During the second PA operating mode, the driver stage multiplexer 266 receives and forwards the driver stage bias signal DSBS to provide the second driver bias signal SDB based on the bias configuration control signal BCC.

In this regard, during the first PA operating mode, the driver stage IDAC 264 provides the first driver bias signal FDB via the driver stage multiplexer 266, such that a magnitude of the first driver bias signal FDB is about equal to the desired magnitude of the first driver bias signal FDB. During the second PA operating mode, the driver stage IDAC 264 provides the second driver bias signal SDB via the driver stage multiplexer 266, such that a magnitude of the second driver bias signal SDB is about equal to the desired magnitude of the second driver bias signal SDB.

In one embodiment of the driver stage multiplexer 266, during the first PA operating mode, the driver stage multiplexer 266 disables the second RF PA 54 via the second driver bias signal SDB. In one embodiment of the second RF PA 54, the second RF PA 54 is disabled when the second driver bias signal SDB is about zero volts. In one embodiment of the driver stage multiplexer 266, during the second PA operating mode, the driver stage multiplexer 266 disables the first RF PA 50 via the first driver bias signal FDB. In one embodiment of the first RF PA 50, the first RF PA 50 is disabled when the first driver bias signal FDB is about zero volts. As such, in one embodiment of the driver stage multiplexer 266, during the first PA operating mode, the driver stage multiplexer 266 provides the second driver bias signal SDB, which is about zero volts, such that the second RF PA 54 is disabled, and during the second PA operating mode, the driver stage multiplexer 266 provides the first driver bias signal FDB, which is about zero volts, such that the first RF PA 50 is disabled.

The final stage IDAC 270 receives the bias power supply signal BPS, the bias configuration control signal BCC, and a final stage reference current IFSR. As such, the final stage IDAC 270 uses the bias power supply signal BPS and the final stage reference current IFSR in a digital-to-analog conversion to provide a final stage bias signal FSBS. A magnitude of the digital-to-analog conversion is based on the bias configuration control signal BCC. The final stage current reference circuitry 274 is coupled to the final stage IDAC 270 and provides the final stage reference current IFSR to the final stage IDAC 270, such that during the first PA operating mode, the first final bias signal FFB is based on the final stage reference current IFSR, and during the second PA operating mode, the second final bias signal SFB is based on the final stage reference current IFSR. The final stage current reference circuitry 274 and the final stage IDAC 270 receive the bias configuration control signal BCC. The final stage current reference circuitry 274 may be disabled based on the bias configuration control signal BCC. The final stage multiplexer 272 receives and forwards the final stage bias signal FSBS, which is a current signal, to provide either the second final bias signal SFB or the first final bias signal FFB based on the bias configuration control signal BCC. During the first PA operating mode, the final stage multiplexer 272 receives and forwards the final stage bias signal FSBS to provide the first final bias signal FFB based on the bias configuration control signal BCC. During the second PA operating mode, the final stage multiplexer 272 receives and forwards the final stage bias signal FSBS to provide the second final bias signal SFB based on the bias configuration control signal BCC.

In this regard, during the first PA operating mode, the final stage IDAC 270 provides the first final bias signal FFB via the final stage multiplexer 272, such that a magnitude of the first final bias signal FFB is about equal to the desired magnitude of the first final bias signal FFB. Specifically, the final stage IDAC 270 receives and uses the bias power supply signal BPS and the bias configuration control signal BCC in a digital-to-analog conversion to provide the first final bias signal FFB. During the second PA operating mode, the final stage IDAC 270 provides the second final bias signal SFB via the final stage multiplexer 272, such that a magnitude of the second final bias signal SFB is about equal to the desired magnitude of the second final bias signal SFB. Specifically, the final stage IDAC 270 receives and uses the bias power supply signal BPS and the bias configuration control signal BCC in a digital-to-analog conversion to provide the second final bias signal SFB.

In one embodiment of the final stage multiplexer 272, during the first PA operating mode, the final stage multiplexer 272 disables the second RF PA 54 via the second final bias signal SFB. In one embodiment of the second RF PA 54, the second RF PA 54 is disabled when the second final bias signal SFB is about zero volts. In one embodiment of the final stage multiplexer 272, during the second PA operating mode, the final stage multiplexer 272 disables the first RF PA 50 via the first final bias signal FFB. In one embodiment of the first RF PA 50, the first RF PA 50 is disabled when the first final bias signal FFB is about zero volts. As such, in one embodiment of the final stage multiplexer 272, during the first PA operating mode, the final stage multiplexer 272 provides the second final bias signal SFB, which is about zero volts, such that the second RF PA 54 is disabled, and during the second PA operating mode, the final stage multiplexer 272 provides the first final bias signal FFB, which is about zero volts, such that the first RF PA 50 is disabled.

FIG. 42 shows details of the driver stage current reference circuitry 268 and the final stage current reference circuitry 274 illustrated in FIG. 41 according to one embodiment of the driver stage current reference circuitry 268 and the final stage current reference circuitry 274. The driver stage current reference circuitry 268 includes a driver stage temperature compensation circuit 276 to temperature compensate the driver stage reference current IDSR. The final stage current reference circuitry 274 includes a final stage temperature compensation circuit 278 to temperature compensate the final stage reference current IFSR.

Charge Pump Based PA Envelope Power Supply and Bias Power Supply

A summary of a charge pump based PA envelope power supply and bias power supply is presented, followed by a detailed description of the charge pump based PA envelope power supply according to one embodiment of the present disclosure. The present disclosure relates to a DC-DC converter, which includes a charge pump based RF PA envelope power supply and a charge pump based PA bias power supply. The DC-DC converter is coupled between RF PA circuitry and a DC power supply, such as a battery. As such, the PA envelope power supply provides an envelope power supply signal to the RF PA circuitry and the PA bias power supply provides a bias power supply signal to the RF PA circuitry.

Both the PA envelope power supply and the PA bias power supply receive power via a DC power supply signal from the DC power supply. The PA envelope power supply includes a charge pump buck converter and the PA bias power supply includes a charge pump.

By using charge pumps, a voltage of the envelope power supply signal may be greater than a voltage of the DC power supply signal, a voltage of the bias power supply signal may be greater than the voltage of the DC power supply signal, or both. Providing boosted voltages may provide greater flexibility in providing envelope power for amplification and in biasing the RF PA circuitry. The charge pump buck converter provides the functionality of a charge pump feeding a buck converter. However, the charge pump buck converter requires fewer switching elements than a charge pump feeding a buck converter by sharing certain switching elements.

The charge pump buck converter is coupled between the DC power supply and the RF PA circuitry. The charge pump is coupled between the DC power supply and the RF PA circuitry. In one embodiment of the PA envelope power supply, the PA envelope power supply further includes a buck converter coupled between the DC power supply and the RF PA circuitry. The PA envelope power supply may operate in one of a first envelope operating mode and a second envelope operating mode. During the first envelope operating mode, the charge pump buck converter is active, and the buck converter is inactive. Conversely, during the second envelope operating mode, the charge pump buck converter is inactive, and the buck converter is active. As such, the PA envelope power supply may operate in the first envelope operating mode when a voltage above the voltage of the DC power supply signal may be needed. Conversely, the PA envelope power supply may operate in the second envelope operating mode when a voltage above the voltage of the DC power supply signal is not needed.

In one embodiment of the charge pump buck converter, the charge pump buck converter operates in one of a pump buck pump-up operating mode and at least one other pump buck operating mode, which may include any or all of a pump buck pump-down operating mode, a pump buck pump-even operating mode, and a pump buck bypass operating mode. In one embodiment of the charge pump, the charge pump operates in one of a bias supply pump-up operating mode and at least one other bias supply operating mode, which may include any or all of a bias supply pump-down operating mode, a bias supply pump-even operating mode, and a bias supply bypass operating mode.

In one embodiment of the RF PA circuitry, the RF PA circuitry has an RF PA, which is biased based on the bias power supply signal and receives the envelope power supply signal to provide power for amplification. In one embodiment of the RF PA circuitry, the RF PA has a final stage that receives a final bias signal to bias the final stage, such that the final bias signal is based on the bias power supply signal. Additionally, the DC-DC converter provides the envelope power supply signal to the RF PA, which uses the envelope power supply signal to provide power for amplification. In one embodiment of the RF PA circuitry, the RF PA circuitry includes PA bias circuitry, which receives the bias power supply signal to provide the final bias signal. In one embodiment of the PA bias circuitry, the PA bias circuitry includes a final stage IDAC to receive and use the bias power supply signal in a digital-to-analog conversion to provide the final bias signal.

In one embodiment of the RF PA circuitry, the RF PA circuitry includes a first RF PA and a second RF PA, which may include a first final stage and a second final stage, respectively. The first RF PA is used to receive and amplify a highband RF input signal and the second RF PA is used to receive and amplify a lowband RF input signal. The RF PA circuitry may operate in one of a first PA operating mode and a second PA operating mode, such that during the first PA operating mode, the first RF PA is active and the second RF PA is disabled. Conversely, during the second PA operating mode, the first RF PA is disabled and the second RF PA is active. The PA bias circuitry includes the final stage IDAC and a final stage multiplexer. The final stage IDAC receives and uses the bias power supply signal in a digital-to-analog conversion to provide a final stage bias signal to the final stage multiplexer. During the first PA operating mode, the final stage multiplexer receives and forwards the final stage bias signal to provide a first final bias signal to the first RF PA to bias the first final stage. During the second PA operating mode, the final stage multiplexer receives and forwards the final stage bias signal to provide a second final bias signal to the second RF PA to bias the second final stage.

FIG. 43 shows the RF communications system 26 according to one embodiment of the RF communications system 26. The RF communications system 26 illustrated in FIG. 43 is similar to the RF communications system 26 illustrated in FIG. 11; except in the RF communications system 26 illustrated in FIG. 43; the DC-DC converter 32 shows a PA envelope power supply 280 instead of showing the first power filtering circuitry 82, the charge pump buck converter 84, the buck converter 86, and the first inductive element L1; and shows a PA bias power supply 282 instead of showing the second power filtering circuitry 88 and the charge pump 92. The PA envelope power supply 280 is coupled to the RF PA circuitry 30 and the PA bias power supply 282 is coupled to the RF PA circuitry 30. Further, the PA envelope power supply 280 is coupled to the DC power supply 80 and the PA bias power supply 282 is coupled to the DC power supply 80.

The PA bias power supply 282 receives the DC power supply signal DCPS from the DC power supply 80 and provides the bias power supply signal BPS based on DC-DC conversion of the DC power supply signal DCPS. The PA envelope power supply 280 receives the DC power supply signal DCPS from the DC power supply 80 and provides the envelope power supply signal EPS based on DC-DC conversion of the DC power supply signal DCPS.

FIG. 44 shows details of the PA envelope power supply 280 and the PA bias power supply 282 illustrated in FIG. 43 according to one embodiment of the PA envelope power supply 280 and the PA bias power supply 282. The PA envelope power supply 280 includes the charge pump buck converter 84, the first inductive element L1, and the first power filtering circuitry 82. The PA bias power supply 282 includes the charge pump 92. In general, the charge pump buck converter 84 is coupled between the RF PA circuitry 30 and the DC power supply 80. Specifically, the first inductive element L1 is coupled between the charge pump buck converter 84 and the first power filtering circuitry 82. The charge pump buck converter 84 is coupled between the DC power supply 80 and the first inductive element L1. The first power filtering circuitry 82 is coupled between the first inductive element L1 and the RF PA circuitry 30. The charge pump 92 is coupled between the RF PA circuitry 30 and the DC power supply 80.

The charge pump buck converter 84 receives and converts the DC power supply signal DCPS to provide the first buck output signal FBO, such that the envelope power supply signal EPS is based on the first buck output signal FBO. The charge pump 92 receives and charge pumps the DC power supply signal DCPS to provide the bias power supply signal BPS.

FIG. 45 shows details of the PA envelope power supply 280 and the PA bias power supply 282 illustrated in FIG. 43 according to an alternate embodiment of the PA envelope power supply 280 and the PA bias power supply 282. The PA envelope power supply 280 illustrated in FIG. 45 is similar to the PA envelope power supply 280 illustrated in FIG. 44, except the PA envelope power supply 280 illustrated in FIG. 45 further includes the buck converter 86 coupled across the charge pump buck converter 84. The PA bias power supply 282 illustrated in FIG. 45 is similar to the PA bias power supply 282 illustrated in FIG. 44, except the PA bias power supply 282 illustrated in FIG. 45 further includes the second power filtering circuitry 88 coupled between the RF PA circuitry 30 and ground.

In one embodiment of the DC-DC converter 32, the DC-DC converter 32 operates in one of multiple converter operating modes, which include the first converter operating mode, the second converter operating mode, and the third converter operating mode. In an alternate embodiment of the DC-DC converter 32, the DC-DC converter 32 operates in one of the first converter operating mode and the second converter operating mode. In the first converter operating mode, the charge pump buck converter 84 is active, such that the envelope power supply signal EPS is based on the DC power supply signal DCPS via the charge pump buck converter 84. In the first converter operating mode, the buck converter 86 is inactive and does not contribute to the envelope power supply signal EPS. In the second converter operating mode, the buck converter 86 is active, such that the envelope power supply signal EPS is based on the DC power supply signal DCPS via the buck converter 86. In the second converter operating mode, the charge pump buck converter 84 is inactive, such that the charge pump buck converter 84 does not contribute to the envelope power supply signal EPS. In the third converter operating mode, the charge pump buck converter 84 and the buck converter 86 are active, such that either the charge pump buck converter 84; the buck converter 86; or both may contribute to the envelope power supply signal EPS. As such, in the third converter operating mode, the envelope power supply signal EPS is based on the DC power supply signal DCPS via the charge pump buck converter 84, via the buck converter 86, or both.

In one embodiment of the DC-DC converter 32, selection of the converter operating mode is made by the DC-DC control circuitry 90. In an alternate embodiment of the DC-DC converter 32, selection of the converter operating mode is made by the RF modulation and control circuitry 28 and may be communicated to the DC-DC converter 32 via the DC configuration control signal DCC. In an additional embodiment of the DC-DC converter 32, selection of the converter operating mode is made by the control circuitry 42 (FIG. 5) and may be communicated to the DC-DC converter 32 via the DC configuration control signal DCC. In general, selection of the converter operating mode is made by control circuitry, which may be any of the DC-DC control circuitry 90, the RF modulation and control circuitry 28, and the control circuitry 42 (FIG. 5).

FIG. 46 shows details of the PA envelope power supply 280 and the PA bias power supply 282 illustrated in FIG. 43 according to an additional embodiment of the PA envelope power supply 280 and the PA bias power supply 282. The PA envelope power supply 280 illustrated in FIG. 46 is similar to the PA envelope power supply 280 illustrated in FIG. 44, except the PA envelope power supply 280 illustrated in FIG. 46 further includes the buck converter 86 and the second inductive element L2 coupled in series to form a first series coupling 284. The charge pump buck converter 84 and the first inductive element L1 are coupled in series to form a second series coupling 286, which is coupled across the first series coupling 284. The PA bias power supply 282 illustrated in FIG. 45 is similar to the PA bias power supply 282 illustrated in FIG. 44, except the PA bias power supply 282 illustrated in FIG. 45 further includes the second power filtering circuitry 88 coupled between the RF PA circuitry 30 and ground.

In the first converter operating mode, the charge pump buck converter 84 is active, such that the envelope power supply signal EPS is based on the DC power supply signal DCPS via the charge pump buck converter 84, and the first inductive element L1. In the first converter operating mode, the buck converter 86 is inactive and does not contribute to the envelope power supply signal EPS. In the second converter operating mode, the buck converter 86 is active, such that the envelope power supply signal EPS is based on the DC power supply signal DCPS via the buck converter 86 and the second inductive element L2. In the second converter operating mode, the charge pump buck converter 84 is inactive, such that the charge pump buck converter 84 does not contribute to the envelope power supply signal EPS. In the third converter operating mode, the charge pump buck converter 84 and the buck converter 86 are active, such that either the charge pump buck converter 84; the buck converter 86; or both may contribute to the envelope power supply signal EPS. As such, in the third converter operating mode, the envelope power supply signal EPS is based on the DC power supply signal DCPS either via the charge pump buck converter 84, and the first inductive element L1; via the buck converter 86 and the second inductive element L2; or both.

Automatically Configurable 2-Wire/3-Wire Serial communications Interface

A summary of an automatically configurable 2-wire/3-wire serial communications interface (AC23SCI) is presented, followed by a detailed description of the AC23SCI according to one embodiment of the present disclosure. The present disclosure relates to the AC23SCI, which includes start-of-sequence (SOS) detection circuitry and sequence processing circuitry. When the SOS detection circuitry is coupled to a 2-wire serial communications bus, the SOS detection circuitry detects an SOS of a received sequence based on a serial data signal and a serial clock signal. When the SOS detection circuitry is coupled to a 3-wire serial communications bus, the SOS detection circuitry detects the SOS of the received sequence based on a chip select (CS) signal. The SOS detection circuitry provides an indication of detection of the SOS to the sequence processing circuitry, which initiates processing of the received sequence using the serial data signal and the serial clock signal upon the detection of the SOS. As such, an SOS detection signal, which is indicative of the detection of the SOS, is provided to the sequence processing circuitry from the SOS detection circuitry. In this regard, the AC23SCI automatically configures itself for operation with some 2-wire and some 3-wire serial communications buses without external intervention.

Since some 2-wire serial communications buses have only the serial data signal and the serial clock signal, some type of special encoding of the serial data signal and the serial clock signal is used to represent the SOS. However, some 3-wire serial communications buses have a dedicated signal, such as the CS signal, to represent the SOS. As such, some 3-wire serial communications devices, such as test equipment, RF transceivers, baseband controllers, or the like, may not be able to provide the special encoding to represent the SOS, thereby mandating use of the CS signal. As a result, the first AC23SCI must be capable of detecting the SOS based on either the CS signal or the special encoding.

FIG. 47 shows a first AC23SCI 300 according to one embodiment of the first AC23SCI 300. The first AC23SCI 300 includes SOS detection circuitry 302 and sequence processing circuitry 304. In this regard, the SOS detection circuitry 302 and the sequence processing circuitry 304 provide the first AC23SCI 300. The SOS detection circuitry 302 has a CS input CSIN, a serial clock input SCIN, and a serial data input SD IN. The SOS detection circuitry 302 is coupled to a 3-wire serial communications bus 306. The SOS detection circuitry 302 receives a CS signal CSS, a serial clock signal SCLK, and a serial data signal SDATA via the 3-wire serial communications bus 306. As such, the SOS detection circuitry 302 receives the CS signal CSS via the CS input CSIN, receives the serial clock signal SCLK via the serial clock input SCIN, and receives the serial data signal SDATA via the serial data input SDIN.

The serial clock signal SCLK is used to synchronize to data provided by the serial data signal SDATA. A received sequence is provided to the first AC23SCI 300 by the serial data signal SDATA. The SOS is the beginning of the received sequence and is used by the sequence processing circuitry 304 to initiate processing the received sequence. In one embodiment of the SOS detection circuitry 302, the SOS detection circuitry 302 detects the SOS based on the CS signal CSS. In an alternate embodiment of the SOS detection circuitry 302, the SOS detection circuitry 302 detects the SOS based on special encoding of the serial data signal SDATA and the serial clock signal SCLK. In either embodiment of the SOS detection circuitry 302, the SOS detection circuitry 302 provides an SOS detection signal SSDS, which is indicative of the SOS. The sequence processing circuitry 304 receives the SOS detection signal SSDS, the serial data signal SDATA, and the serial clock signal SCLK. As such, the sequence processing circuitry 304 initiates processing of the received sequence using the serial data signal SDATA and the serial clock signal SCLK upon detection of the SOS. In one embodiment of the 3-wire serial communications bus 306, the 3-wire serial communications bus 306 is the digital communications bus 66. In one embodiment of the 3-wire serial communications bus 306, the 3-wire serial communications bus 306 is a bi-directional bus, such that the sequence processing circuitry 304 may provide the serial data input SDIN, the serial clock signal SCLK, or both.

FIG. 48 shows the first AC23SCI 300 according an alternate embodiment of the first AC23SCI 300. The first AC23SCI 300 illustrated in FIG. 48 is similar to the first AC23SCI 300 illustrated in FIG. 47, except in the first AC23SCI 300 illustrated in FIG. 48, the SOS detection circuitry 302 is coupled to a 2-wire serial communications bus 308 instead of the 3-wire serial communications bus 306 (FIG. 47). The SOS detection circuitry 302 receives the serial clock signal SCLK and the serial data signal SDATA via the 2-wire serial communications bus 308. As such, the SOS detection circuitry 302 receives the serial clock signal SCLK via the serial clock input SCIN, and receives the serial data signal SDATA via the serial data input SDIN. The 2-wire serial communications bus 308 does not include the CS signal CSS (FIG. 47). As such, the CS input CSIN may be left unconnected as illustrated.

The serial clock signal SCLK is used to synchronize to data provided by the serial data signal SDATA. A received sequence is provided to the first AC23SCI 300 by the serial data signal SDATA. The SOS is the beginning of the received sequence and is used by the sequence processing circuitry 304 to initiate processing the received sequence. The SOS detection circuitry 302 detects the SOS based on the special encoding of the serial data signal SDATA and the serial clock signal SCLK. The SOS detection circuitry 302 provides the SOS detection signal SSDS, which is indicative of the SOS. The sequence processing circuitry 304 receives the SOS detection signal SSDS, the serial data signal SDATA, and the serial clock signal SCLK. As such, the sequence processing circuitry 304 initiates processing of the received sequence using the serial data signal SDATA and the serial clock signal SCLK upon detection of the SOS. In one embodiment of the 2-wire serial communications bus 308, the 2-wire serial communications bus 308 is the digital communications bus 66. In one embodiment of the 2-wire serial communications bus 308, the 2-wire serial communications bus 308 is a bi-directional bus, such that the sequence processing circuitry 304 may provide the serial data input SDIN, the serial clock signal SCLK, or both.

In one embodiment of the SOS detection circuitry 302, when the SOS detection circuitry 302 is coupled to the 2-wire serial communications bus 308, the SOS detection circuitry 302 receives the serial data signal SDATA and receives the serial clock signal SCLK via the 2-wire serial communications bus 308, and the SOS detection circuitry 302 detects the SOS based on the serial data signal SDATA and the serial clock signal SCLK. When the SOS detection circuitry 302 is coupled to the 3-wire serial communications bus 306 (FIG. 47), the SOS detection circuitry 302 receives the CS signal CSS (FIG. 47), receives the serial data signal SDATA, and receives the serial clock signal SCLK via the 3-wire serial communications bus 306; and the SOS detection circuitry 302 detects the SOS based on the CS signal CSS (FIG. 47).

In an alternate embodiment of the SOS detection circuitry 302, when the SOS detection circuitry 302 is coupled to the 3-wire serial communications bus 306 (FIG. 47), the SOS detection circuitry 302 receives the CS signal CSS (FIG. 47), receives the serial data signal SDATA, and receives the serial clock signal SCLK via the 3-wire serial communications bus 306; and the SOS detection circuitry 302 detects the SOS based on either the CS signal CSS (FIG. 47) or the serial data signal SDATA and the serial clock signal SCLK.

FIG. 49 shows details of the SOS detection circuitry 302 illustrated in FIG. 47 according to one embodiment of the SOS detection circuitry 302. The SOS detection circuitry 302 includes a sequence detection OR gate 310, CS detection circuitry 312, start sequence condition (SSC) detection circuitry 314, and a CS resistive element RCS. The CS resistive element RCS is coupled to the CS input CSIN. In one embodiment of the SOS detection circuitry 302, the CS resistive element RCS is coupled between the CS input CSIN and a ground. As such, when the CS input CSIN is left unconnected, the CS input CSIN is in a LOW state. In an alternate embodiment of the SOS detection circuitry 302, the CS resistive element RCS is coupled between the CS input CSIN and a DC power supply (not shown).

The CS detection circuitry 312 is coupled to the serial clock input SCIN and the CS input CSIN. As such, the CS detection circuitry 312 receives the serial clock signal SCLK and the CS signal CSS via the serial clock input SCIN and the CS input CSIN, respectively. The CS detection circuitry 312 feeds one input to the sequence detection OR gate 310 based on the serial clock signal SCLK and the CS signal CSS. In an alternate embodiment of the CS detection circuitry 312, the CS detection circuitry 312 is not coupled to the serial clock input SCIN. As such, the CS detection circuitry 312 feeds one input to the sequence detection OR gate 310 based on only the CS signal CSS. In an alternate embodiment of the SOS detection circuitry 302, the CS detection circuitry 312 is omitted, such that the CS input CSIN is directly coupled to one input to the sequence detection OR gate 310.

The SSC detection circuitry 314 is coupled to the serial clock input SCIN and the serial data input SDIN. As such, the SSC detection circuitry 314 receives the serial clock signal SCLK and the serial data signal SDATA via the serial clock input SCIN and the serial data input SDIN, respectively. The SSC detection circuitry 314 feeds another input to the sequence detection OR gate 310 based on the serial clock signal SCLK and the serial data signal SDATA. An output from the sequence detection OR gate 310 provides the SOS detection signal SSDS to the sequence processing circuitry 304 based on signals received from the CS detection circuitry 312 and the SSC detection circuitry 314. In this regard, the CS detection circuitry 312, the SSC detection circuitry 314, or both may detect an SOS of a received sequence.

Figures 50A, 50B, 50C, 50D:
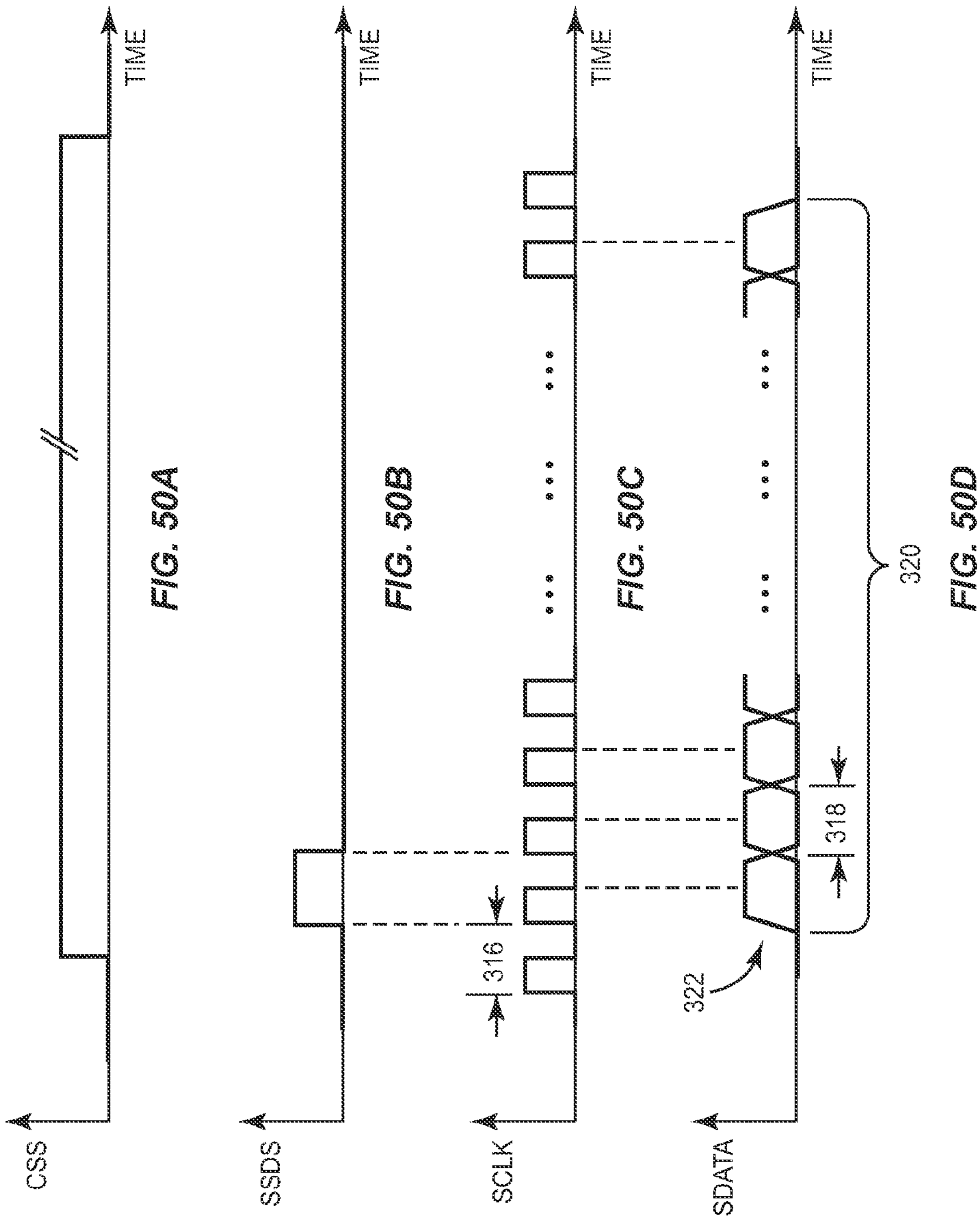

FIGS. 50A, 50B, 50C, and 50D are graphs illustrating the chip select signal CSS, the SOS detection signal SSDS, the serial clock signal SCLK, and the serial data signal SDATA, respectively, of the first AC23SCI 300 illustrated in FIG. 49 according to one embodiment of the first AC23SCI 300. The serial clock signal SCLK has a serial clock period 316 (FIG. 50C) and the serial data signal SDATA has a data bit period 318 (FIG. 50D) during a received sequence 320 (FIG. 50D). In one embodiment of the first AC23SCI 300, the serial clock period 316 is about equal to the data bit period 318. As such, the serial clock signal SCLK may be used to sample data provided by the serial data signal SDATA. An SOS 322 of the received sequence 320 is shown in FIG. 50D.

The SOS detection circuitry 302 may detect the SOS 322 based on a LOW to HIGH transition of the CS signal CSS as shown in FIG. 50A. The CS detection circuitry 312 may use the CS signal CSS and the serial clock signal SCLK, such that the SOS detection signal SSDS is a pulse. A duration of the pulse may be about equal to the serial clock period 316. The pulse may be a positive pulse as shown in FIG. 50B. In an alternate embodiment (not shown) of the CS detection circuitry 312, the CS detection circuitry 312 may use the CS signal CSS and the serial clock signal SCLK, such that the SOS detection signal SSDS is a negative pulse. In an alternate embodiment (not shown) of the SOS detection circuitry 302, the SOS detection circuitry 302 may detect the SOS 322 based on a HIGH to LOW transition of the CS signal CSS.

Figures 51A, 51B, 51C, 51D:
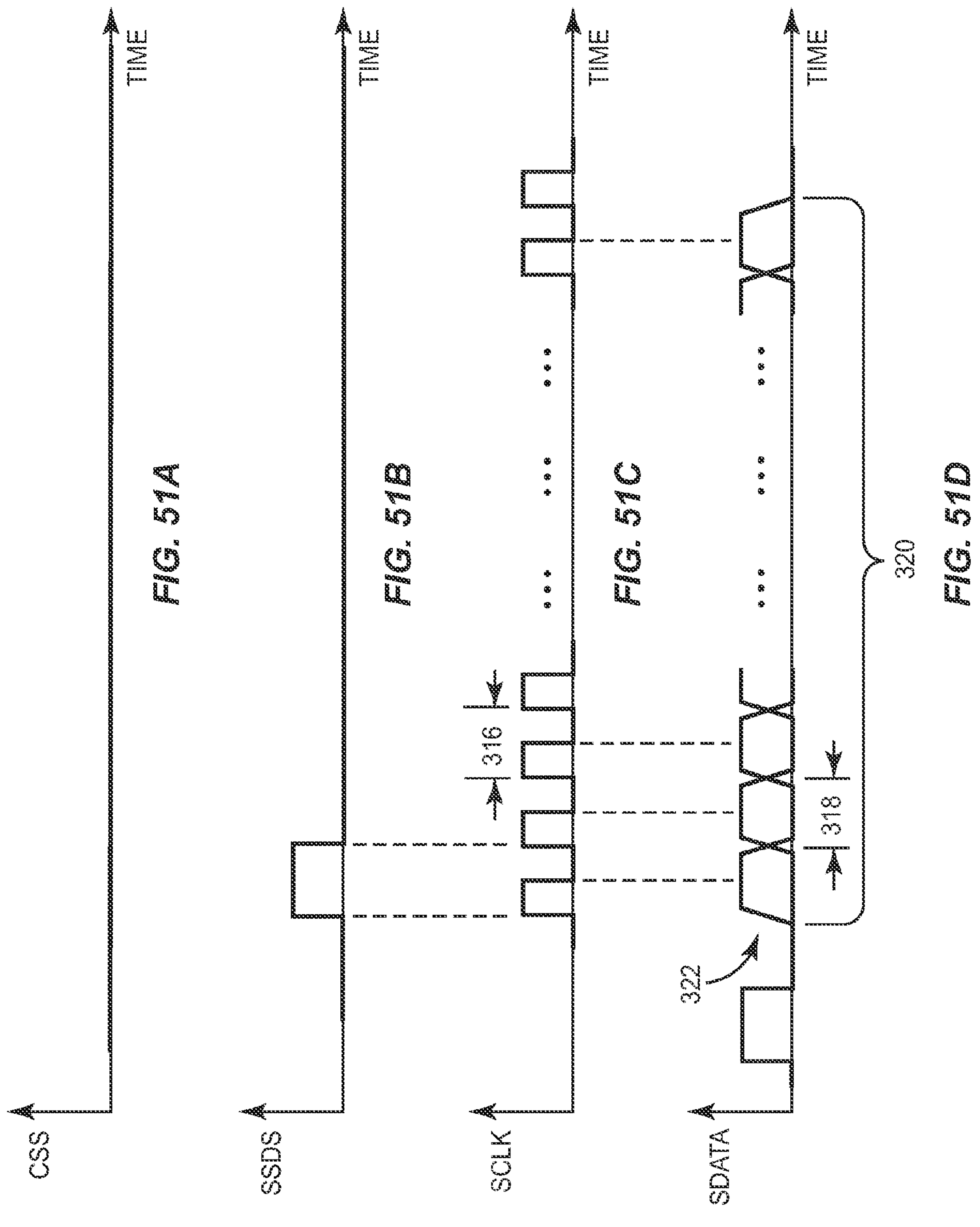

FIGS. 51A, 51B, 51C, and 51D are graphs illustrating the chip select signal CSS, the SOS detection signal SSDS, the serial clock signal SCLK, and the serial data signal SDATA, respectively, of the first AC23SCI 300 illustrated in FIG. 49 according to one embodiment of the first AC23SCI 300. The CS signal CSS illustrated in FIG. 51A is LOW during the received sequence 320 (FIG. 51D). As such, the CS signal CSS is not used to detect the SOS 322 (FIG. 51D). Instead, detection of the SOS 322 is based on the special encoding of the serial data signal SDATA and the serial clock signal SCLK. Specifically, the SOS detection circuitry 302 uses the SSC detection circuitry 314 to detect the SOS 322 based on a pulse of the serial data signal SDATA, such that during the pulse of the serial data signal SDATA, the serial clock signal SCLK does not transition. The pulse of the serial data signal SDATA may be a positive pulse as shown in FIG. 51D. A duration of the serial data signal SDATA may be about equal to the data bit period 318.

The SSC detection circuitry 314 may use the serial data signal SDATA and the serial clock signal SCLK, such that the SOS detection signal SSDS is a pulse. A duration of the pulse may be about equal to the serial clock period 316. The pulse may be a positive pulse as shown in FIG. 51B. In an alternate embodiment (not shown) of the SSC detection circuitry 314, the SSC detection circuitry 314 may use the serial data signal SDATA and the serial clock signal SCLK, such that the SOS detection signal SSDS is a negative pulse. In an alternate embodiment (not shown) of the SOS detection circuitry 302, the SOS detection circuitry 302 may detect the SOS 322 based on a negative pulse of the serial data signal SDATA while the serial clock signal SCLK does not transition.

In one embodiment of the sequence processing circuitry 304, if another SOS 322 is detected before processing of the received sequence 320 is completed; the sequence processing circuitry 304 will abort processing of the received sequence 320 in process and initiate processing of the next received sequence 320. In one embodiment of the first AC23SCI 300, the first AC23SCI 300 is a mobile industry processor interface (MiPi). In an alternate embodiment of the first AC23SCI 300, the first AC23SCI 300 is an RF front-end (FE) interface. In an additional embodiment of the first AC23SCI 300, the first AC23SCI 300 is a slave device. In another embodiment of the first AC23SCI 300, the first AC23SCI 300 is a MiPi RFFE interface. In a further embodiment of the first AC23SCI 300, the first AC23SCI 300 is a MiPi RFFE slave device. In a supplemental embodiment of the first AC23SCI 300, the first AC23SCI 300 is a MiPi slave device. In an alternative embodiment of the first AC23SCI 300, the first AC23SCI 300 is an RFFE slave device.

Figures 52A, 52B, 52C, 52D:
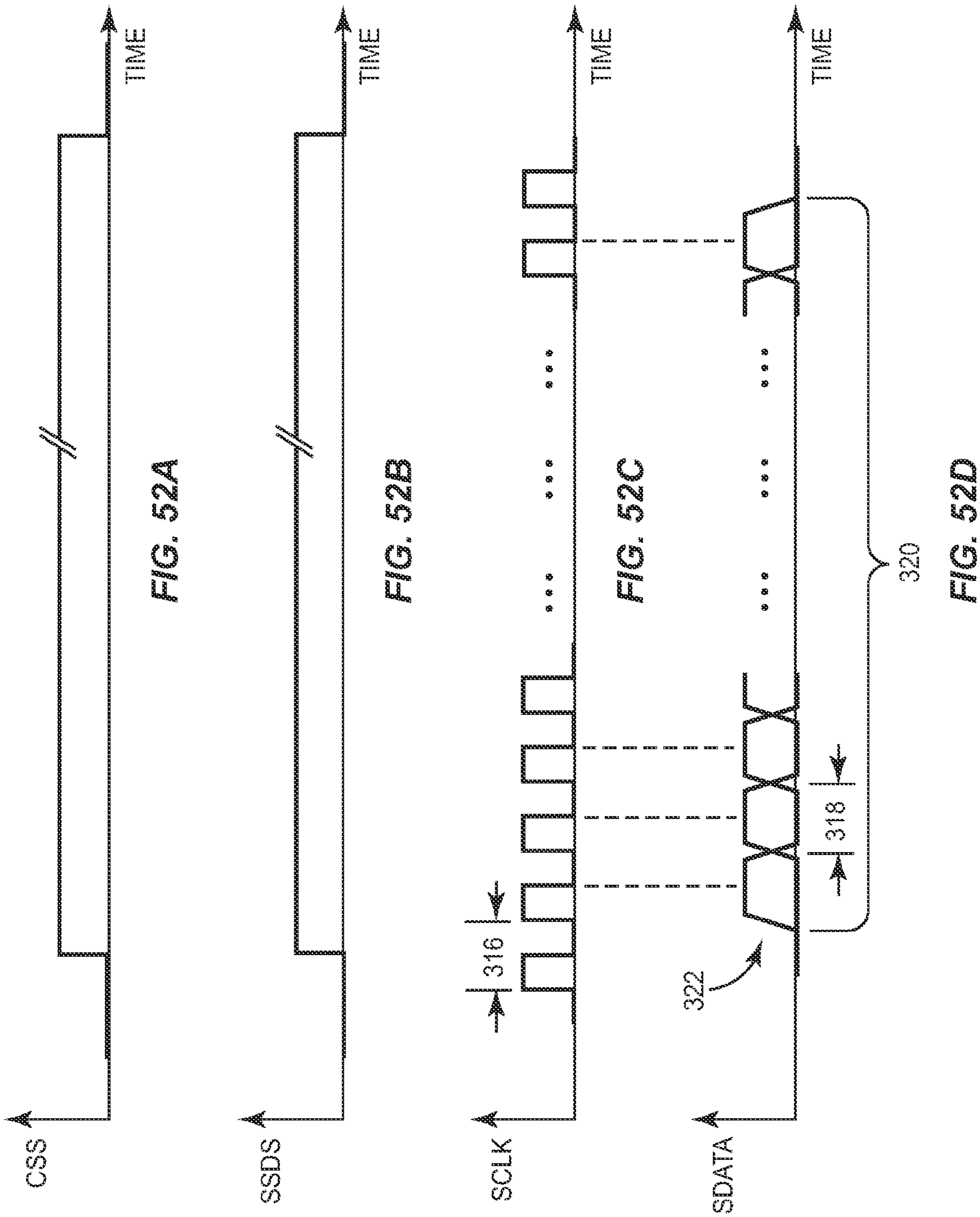

FIGS. 52A, 52B, 52C, and 52D are graphs illustrating the chip select signal CSS, the SOS detection signal SSDS, the serial clock signal SCLK, and the serial data signal SDATA, respectively, of the first AC23SCI 300 illustrated in FIG. 49 according to one embodiment of the first AC23SCI 300. FIGS. 52A, 52C, and 52D are duplicates of FIGS. 50A, 50C, and 50D, respectively for clarity. The SOS detection circuitry 302 may detect the SOS 322 based on the LOW to HIGH transition of the CS signal CSS as shown in FIG. 52A. The CS detection circuitry 312 may uses the CS signal CSS, such that the SOS detection signal SSDS follows the CS signal CSS as shown in FIG. 52B. In an alternate embodiment of the SOS detection circuitry 302, the CS detection circuitry 312 is omitted, such that the CS input CSIN is directly coupled to the sequence detection OR gate 310. As such, the SOS detection signal SSDS follows the CS signal CSS as shown in FIG. 52B.

FIG. 53 shows the RF communications system 26 according to one embodiment of the RF communications system 26. The RF communications system 26 illustrated in FIG. 53 is similar to the RF communications system 26 illustrated in FIG. 6, except in the RF communications system 26 illustrated in FIG. 53, the RF PA circuitry 30 further includes the first AC23SCI 300, the DC-DC converter 32 further includes a second AC23SCI 324, and the front-end aggregation circuitry 36 further includes a third AC23SCI 326. In one embodiment of the RF communications system 26, the first AC23SCI 300 is the PA-DCI 60, the second AC23SCI 324 is the DC-DC converter DCI 62, and the third AC23SCI 326 is the aggregation circuitry DCI 64. In an alternate embodiment (not shown) of the RF communications system 26, the first AC23SCI 300 is the DC-DC converter DCI 62. In an additional embodiment (not shown) of the RF communications system 26, the first AC23SCI 300 is the aggregation circuitry DCI 64.

In one embodiment of the RF communications system 26, the S-wire serial communications bus 306 (FIG. 47) is the digital communications bus 66. The control circuitry 42 is coupled to the SOS detection circuitry 302 (FIG. 47) via the 3-wire serial communications bus 306 (FIG. 47) and via the control circuitry DCI 58. As such, the control circuitry 42 provides the CS signal CSS (FIG. 47) via the control circuitry DCI 58, the control circuitry 42 provides the serial clock signal SCLK (FIG. 47) via the control circuitry DCI 58, and the control circuitry 42 provides the serial data signal SDATA (FIG. 47) via the control circuitry DCI 58.

In an alternate embodiment of the RF communications system 26, the 2-wire serial communications bus 308 (FIG. 48) is the digital communications bus 66. The control circuitry 42 is coupled to the SOS detection circuitry 302 (FIG. 48) via the 2-wire serial communications bus 308 (FIG. 48) and via the control circuitry DCI 58. As such, the control circuitry 42 provides the serial clock signal SCLK (FIG. 48) via the control circuitry DCI 58 and the control circuitry 42 provides the serial data signal SDATA (FIG. 48) via the control circuitry DCI 58.

Look-Up Table Based Configuration of Multi-Mode Multi-Band RF PA Circuitry

A summary of look-up table (LUT) based configuration of multi-mode multi-band RF PA circuitry is presented, followed by a detailed description of the LUT based configuration of the multi-mode multi-band RF PA circuitry according to one embodiment of the present disclosure. Circuitry includes the multi-mode multi-band RF power amplification circuitry, the PA control circuitry, and the PA-DCI. The PA control circuitry is coupled between the amplification circuitry and the PA-DCI, which is coupled to a digital communications bus, and configures the amplification circuitry. The amplification circuitry includes at least a first RF input and multiple RF outputs, such that at least some of the RF outputs are associated with multiple communications modes and at least some of the RF outputs are associated with multiple frequency bands. Configuration of the amplification circuitry associates one RF input with one RF output, and is correlated with configuration information defined by at least a first defined parameter set. The PA control circuitry stores at least a first LUT, which provides the configuration information.

The PA control circuitry configures the amplification circuitry to operate in a selected communications mode and a selected frequency band or group of frequency bands based on information received via the digital communications bus. Specifically, the PA control circuitry uses the information as an index to at least the first LUT to retrieve the configuration information. As such, the PA control circuitry configures the amplification circuitry based on the configuration information.

In one embodiment of the amplification circuitry, the amplification circuitry includes at least a first transmit path, which has a first RF PA and alpha switching circuitry. The first RF PA has a single alpha PA output, which is coupled to the alpha switching circuitry. The alpha switching circuitry has multiple alpha outputs, including at least a first alpha output and multiple alpha outputs. The first alpha output is associated with a first alpha non-linear mode and at least one non-linear mode RF communications band. The multiple alpha outputs are associated with multiple alpha linear modes and multiple linear mode RF communications bands. Configuration of the amplification circuitry includes operation in one of the multiple communications modes, which includes at least the first alpha non-linear mode and the multiple alpha linear modes.

In an alternate embodiment of the amplification circuitry, the amplification circuitry includes the first transmit path and a second transmit path. The first transmit path includes the first RF PA and the second path includes a second RF PA. Configuration of the amplification circuitry includes operation in one of a first PA operating mode and a second PA operating mode. During the first PA operating mode, the first RF PA receives and amplifies a first RF input signal to provide a first RF output signal, and the second RF PA is disabled. Conversely, during the second PA operating mode, the second RF PA receives and amplifies a second RF input signal to provide a second RF output signal, and the first RF PA is disabled. The first RF input signal may be a highband RF input signal associated with at least one highband RF communications band. The second RF input signal may be a lowband RF input signal associated with at least one lowband RF communications band.

In an additional embodiment of the amplification circuitry, the amplification circuitry includes the first transmit path and the second transmit path. The first transmit path includes the first RF PA and the alpha switching circuitry. The second transmit path includes a second RF PA and beta switching circuitry. The first RF PA has the single alpha PA output, which is coupled to the alpha switching circuitry. The second RF PA has a single beta PA output, which is coupled to the beta switching circuitry. The alpha switching circuitry has multiple outputs, including at least the first alpha output and multiple alpha outputs. The first alpha output is associated with the first alpha non-linear mode and at least one non-linear mode RF communications band. The multiple alpha outputs are associated with multiple alpha linear modes and multiple linear mode RF communications bands. The beta switching circuitry has multiple outputs, including at least a first beta output and multiple beta outputs. The first beta output is associated with a first beta non-linear mode and at least one non-linear mode RF communications band. The multiple beta outputs are associated with multiple beta linear modes and multiple linear mode RF communications bands. Configuration of the amplification circuitry includes operation in one of the multiple communications modes, which includes at least the first alpha non-linear mode, the multiple alpha linear modes, the first beta non-linear mode and the multiple beta linear modes.

FIG. 54 shows details of the RF PA circuitry 30 illustrated in FIG. 6 according to an additional embodiment of the RF PA circuitry 30. The RF PA circuitry 30 illustrated in FIG. 54 is similar to the RF PA circuitry 30 illustrated in FIG. 14, except the RF PA circuitry 30 illustrated in FIG. 54 shows multi-mode multi-band RF power amplification circuitry 328 in place of the first transmit path 46 and the second transmit path 48 that are shown in FIG. 14. The PA control circuitry 94 is coupled between the multi-mode multi-band RF power amplification circuitry 328 and the PA-DCI 60. The PA-DCI 60 is coupled to the digital communications bus 66. The PA control circuitry 94 receives information via the digital communications bus 66. In general, configuration of the multi-mode multi-band RF power amplification circuitry 328 is based on the information received via the digital communications bus 66.

In one embodiment of the PA-DCI 60, the PA-DCI 60 is a serial digital interface. In one embodiment of the PA-DCI 60, the PA-DCI 60 is a mobile industry processor interface (MiPi). In an alternate embodiment of the PA-DCI 60, the PA-DCI 60 is an RFFE interface. In an additional embodiment of the PA-DCI 60, the PA-DCI 60 is a slave device. In another embodiment of the PA-DCI 60, the PA-DCI 60 is a MiPi RFFE interface. In a further embodiment of the PA-DCI 60, the PA-DCI 60 is a MiPi RFFE slave device. In a supplemental embodiment of the PA-DCI 60, the PA-DCI 60 is a MiPi slave device. In an alternative embodiment of the PA-DCI 60, the PA-DCI 60 is an RFFE slave device.

FIG. 55 shows details of the multi-mode multi-band RF power amplification circuitry 328 illustrated in FIG. 54 according to one embodiment of the multi-mode multi-band RF power amplification circuitry 328. The multi-mode multi-band RF power amplification circuitry 328 includes the first transmit path 46 and the second transmit path 48. The first transmit path 46 and the second transmit path 48 illustrated in FIG. 55 are similar to the first transmit path 46 and the second transmit path 48 illustrated in FIG. 37, except in the first transmit path 46 and the second transmit path 48 illustrated in FIG. 55, the first RF PA 50 has a first RF input FRI and the second RF PA 54 has a second RF input SRI. As such, the first transmit path 46 includes the first RF PA 50 and the alpha switching circuitry 52, and the second transmit path 48 includes the second RF PA 54 and the beta switching circuitry 56. The first RF PA 50 receives and amplifies the first RF input signal FRFI to provide the first RF output signal FRFO. The second RF PA 54 receives and amplifies the second RF input signal SRFI to provide the second RF output signal SRFO. As such, the first RF PA 50 receives the first RF input signal FRFI via the first RF input FRI and provides the first RF output signal FRFO via the single alpha PA output SAP. The second RF PA 54 receives the second RF input signal SRFI via the second RF input SRI and provides the second RF output signal SRFO via the single beta PA output SBP.

In general, the multi-mode multi-band RF power amplification circuitry 328 has at least the first RF input FRI and a group of RF outputs FANO, FALO, RALO, FBNO, FBLO, SBLO. The configuration of the multi-mode multi-band RF power amplification circuitry 328 associates one of the RF inputs FRI, SRI with one of the group of RF outputs FANO, FALO, RALO, FBNO, FBLO, SBLO. In one embodiment of the multi-mode multi-band RF power amplification circuitry 328, configuration of the multi-mode multi-band RF power amplification circuitry 328 includes operation in one of the first PA operating mode and the second PA operating mode. During the first PA operating mode, the first transmit path 46 is active and the second transmit path 48 is inactive. During the second PA operating mode, the first transmit path 46 is inactive and the second transmit path 48 is active. In one embodiment of the first RF PA 50 and the second RF PA 54, during the second PA operating mode, the first RF PA 50 is disabled, and during the first PA operating mode, the second RF PA 54 is disabled. In one embodiment of the alpha switching circuitry 52 and the beta switching circuitry 56, during the second PA operating mode, the alpha switching circuitry 52 is disabled, and during the first PA operating mode, the beta switching circuitry 56 is disabled.

During the first PA operating mode, the first RF PA 50 receives and amplifies the first RF input signal FRFI via the first RF input FRI to provide the first RF output signal FRFO via the single alpha PA output SAP. During the second PA operating mode, the second RF PA 54 receives and amplifies the second RF input signal SRFI via the second RF input SRI to provide the second RF output signal SRFO via the single beta PA output SBP.

FIGS. 56A and 56B show details of the PA control circuitry 94 illustrated in FIG. 54 according to one embodiment of the PA control circuitry 94. The PA control circuitry 94 stores at least a first LUT 330 as shown in FIG. 56A. The first LUT 330 provides configuration information 332 as shown in FIG. 56B. The PA control circuitry 94 uses the information received via the digital communications bus 66 (FIG. 54) as an index to at least the first LUT 330 to retrieve the configuration information 332. The configuration information 332 may be defined by at least a first defined parameter set. The PA control circuitry 94 configures the multi-mode multi-band RF power amplification circuitry 328 based on the configuration information 332 to provide the configuration of the multi-mode multi-band RF power amplification circuitry 328. In this regard, the configuration of the multi-mode multi-band RF power amplification circuitry 328 is based on and correlated with the configuration information 332.

LUT Based Configuration of a DC-DC Converter

A summary of a LUT based configuration of a DC-DC converter is presented, followed by a detailed description of the LUT based configuration of a DC-DC converter according to one embodiment of the present disclosure. The present disclosure relates to RF PA circuitry and a DC-DC converter, which includes an RF PA envelope power supply and DC-DC control circuitry. The PA envelope power supply provides an envelope power supply signal to the RF PA circuitry. The DC-DC control circuitry has a DC-DC look-up table (LUT) structure, which has at least a first DC-DC LUT. The DC-DC control circuitry uses DC-DC LUT index information as an index to the DC-DC LUT structure to obtain DC-DC converter operational control parameters. The DC-DC control circuitry then configures the PA envelope power supply using the DC-DC converter operational control parameters. Using the DC-DC LUT structure provides flexibility in configuring the DC-DC converter for different applications, for multiple static operating conditions, for multiple dynamic operating conditions, or any combination thereof. Such flexibility may provide a system capable of supporting many different options and applications. Configuration may be done in a manufacturing environment, in a service depot environment, in a user operation environment, the like, or any combination thereof.

The DC-DC LUT index information may include DC-DC converter configuration information, which may be used to statically configure the DC-DC converter for a specific application or specific operating conditions, and operating status information, which may be used to dynamically configure the DC-DC converter based on changing conditions. The DC-DC converter operational control parameters may be indicative of a number of DC-DC converter configurations, such as an envelope power supply setpoint, a selected converter operating mode, a selected pump buck operating mode, a selected charge pump buck base switching frequency, a selected charge pump buck switching frequency dithering mode, a selected bias supply pump operating mode, a selected bias supply base switching frequency, a selected bias supply switching frequency dithering mode, the like, or any combination thereof. The contents of the DC-DC LUT structure may be based on DC-DC converter operating criteria, such as one or more operating efficiencies, one or more operating limits, at least one operating headroom, electrical noise reduction, PA operating linearity, the like, or any combination thereof.

FIG. 57 shows the RF communications system 26 according to one embodiment of the RF communications system 26. The RF communications system 26 illustrated in FIG. 57 is similar to the RF communications system 26 illustrated in FIG. 43; except in the RF communications system 26 illustrated in FIG. 57; the DC-DC converter 32 further includes the DC-DC converter DCI 62; and the digital communications bus 66 is coupled between the RF modulation and control circuitry 28, the RF PA circuitry 30, and the DC-DC converter DCI 62. As such, the digital communications bus 66 provides the DC configuration control signal DCC (FIG. 6) and the envelope control signal ECS (FIG. 6) to the DC-DC control circuitry 90 via the DC-DC converter DCI 62. Additionally, the DC-DC control circuitry 90 provides the buck control signal BCS to the PA envelope power supply 280, the PA envelope power supply 280 provides an envelope power supply status signal EPSS to the DC-DC control circuitry 90, and the PA bias power supply 282 provides a bias power supply status signal BPSS to the DC-DC control circuitry 90.

The envelope power supply signal EPS has an envelope power supply voltage EPSV and an envelope power supply current EPSI. The bias power supply signal BPS has a bias power supply voltage BPSV and a bias power supply current BPSI. The DC power supply signal DCPS has a DC power supply voltage DCPV. The PA envelope power supply 280 provides the envelope power supply signal EPS to the RF PA circuitry 30 based on DC-DC conversion of the DC power supply signal DCPS. The PA bias power supply 282 provides the bias power supply signal BPS to the RF PA circuitry 30 based on DC-DC conversion of the DC power supply signal DCPS.

In one embodiment of the PA envelope power supply 280, the PA envelope power supply 280 includes the charge pump buck converter 84 (FIG. 45), which provides the envelope power supply signal EPS based on DC-DC conversion of the DC power supply signal DCPS. In an alternate embodiment of the PA envelope power supply 280, the PA envelope power supply 280 includes the charge pump buck converter 84 (FIG. 45) and the buck converter 86 (FIG. 45), which is coupled across the charge pump buck converter 84 (FIG. 45). In one embodiment of the DC-DC converter 32, the DC-DC converter 32 includes the PA bias power supply 282, as shown. The PA bias power supply 282 provides the bias power supply signal BPS to the RF PA circuitry 30 based on a DC-DC conversion of the DC power supply signal DCPS. In one embodiment of the PA bias power supply 282, the PA bias power supply 282 includes the charge pump 92 (FIG. 45), which provides the bias power supply signal BPS to the RF PA circuitry 30 based on the DC-DC conversion of the DC power supply signal DCPS. In an alternate embodiment of the DC-DC converter 32, the PA bias power supply 282 is omitted. In an additional embodiment of the DC-DC converter 32, the PA envelope power supply 280 is omitted.

In one embodiment of the DC-DC converter 32, the DC-DC converter 32 operates in one of the multiple converter operating modes, which include at least the first converter operating mode and the second converter operating mode. During the first converter operating mode, the charge pump buck converter 84 (FIG. 45) is active and the buck converter 86 (FIG. 45) is inactive, such that the charge pump buck converter 84 (FIG. 45) provides the envelope power supply signal EPS based on DC-DC conversion of the DC power supply signal DCPS. In the second converter operating mode, the buck converter 86 (FIG. 45) is active and the charge pump buck converter 84 (FIG. 45) is inactive, such that the buck converter 86 (FIG. 45) provides the envelope power supply signal EPS based on DC-DC conversion of the DC power supply signal DCPS.

In one embodiment of the charge pump buck converter 84 (FIG. 45), the charge pump buck converter 84 (FIG. 45) operates in one of the multiple pump buck operating modes. During the pump buck pump-up operating mode of the charge pump buck converter 84 (FIG. 45), the charge pump buck converter 84 (FIG. 45) pumps-up the DC power supply signal DCPS to provide an internal signal (not shown), such that a voltage of the internal signal is greater than a voltage of the DC power supply signal DCPS. During the pump buck pump-down operating mode of the charge pump buck converter 84 (FIG. 45), the charge pump buck converter 84 (FIG. 45) pumps-down the DC power supply signal DCPS to provide the internal signal, such that a voltage of the internal signal is less than a voltage of the DC power supply signal DCPS. During the pump buck pump-even operating mode of the charge pump buck converter 84 (FIG. 45), the charge pump buck converter 84 (FIG. 45) pumps the DC power supply signal DCPS to the internal signal, such that a voltage of the internal signal is about equal to a voltage of the DC power supply signal DCPS.

One embodiment of the DC-DC converter 32 includes the pump buck bypass operating mode of the charge pump buck converter 84 (FIG. 45), such that during the pump buck bypass operating mode, the charge pump buck converter 84 (FIG. 45) by-passes charge pump circuitry (not shown) using by-pass circuitry (not shown) to forward the DC power supply signal DCPS to provide the internal signal, such that a voltage of the internal signal is about equal to a voltage of the DC power supply signal DCPS. In one embodiment of the charge pump buck converter 84 (FIG. 45), the pump buck operating modes include the pump buck pump-up operating mode and at least one other pump buck operating mode of the charge pump buck converter 84 (FIG. 45).

The charge pump 92 (FIG. 45) may operate in one of multiple bias supply pump operating modes. During the bias supply pump-up operating mode of the charge pump 92 (FIG. 45), the charge pump 92 (FIG. 45) receives and pumps-up the DC power supply signal DCPS to provide the bias power supply signal BPS, such that a voltage of the bias power supply signal BPS is greater than a voltage of the DC power supply signal DCPS. During the bias supply pump-down operating mode of the charge pump 92 (FIG. 45), the charge pump 92 (FIG. 45) pumps-down the DC power supply signal DCPS to provide the bias power supply signal BPS, such that a voltage of the bias power supply signal BPS is less than a voltage of the DC power supply signal DCPS. During the bias supply pump-even operating mode of the charge pump 92 (FIG. 45), the charge pump 92 (FIG. 45) pumps the DC power supply signal DCPS to provide the bias power supply signal BPS, such that a voltage of the bias power supply signal BPS is about equal to a voltage of the DC power supply signal DCPS.

One embodiment of the DC-DC converter 32 includes the bias supply bypass operating mode of the charge pump 92 (FIG. 45), such that during the bias supply bypass operating mode, the charge pump 92 (FIG. 45) by-passes charge pump circuitry (not shown) using by-pass circuitry (not shown) to forward the DC power supply signal DCPS to provide the bias power supply signal BPS, such that a voltage of the bias power supply signal BPS is about equal to a voltage of the DC power supply signal DCPS. In one embodiment of the charge pump 92 (FIG. 45), the bias supply pump operating modes include the bias supply pump-up operating mode and at least one other bias supply pump operating mode of the charge pump 92 (FIG. 45).

FIGS. 58A and 58B show details of the DC-DC control circuitry 90 illustrated in FIG. 57 according to one embodiment of the DC-DC control circuitry 90. The DC-DC control circuitry 90 illustrated in FIG. 58A includes a DC-DC LUT structure 334. Contents of the DC-DC LUT structure 334 are based on DC-DC converter operating criteria 336. FIG. 58B shows details of the DC-DC LUT structure 334 illustrated of the DC-DC LUT structure 334 illustrated in FIG. 58A according to one embodiment of the DC-DC LUT structure 334. The DC-DC LUT structure 334 includes at least a first DC-DC LUT 338.

The DC-DC control circuitry 90 uses DC-DC LUT index information 340 as an index to the DC-DC LUT structure 334 to obtain DC-DC converter operational control parameters 342. The DC-DC control circuitry 90 configures the DC-DC converter 32 (FIG. 57) using the DC-DC converter operational control parameters 342. In one embodiment of the DC-DC control circuitry 90, the DC-DC control circuitry 90 configures the PA envelope power supply 280 (FIG. 57) using the DC-DC converter operational control parameters 342. In an alternate embodiment of the DC-DC control circuitry 90, the DC-DC control circuitry 90 configures the PA bias power supply 282 (FIG. 57) using the DC-DC converter operational control parameters 342. In an additional embodiment of the DC-DC control circuitry 90, the DC-DC control circuitry 90 configures the PA envelope power supply 280 (FIG. 57) and the PA bias power supply 282 (FIG. 57) using the DC-DC converter operational control parameters 342.

The DC-DC control circuitry 90 may receive the DC-DC LUT index information 340 from the DC-DC converter DCI 62 (FIG. 57), from the DC power supply 80 (FIG. 57) via the DC power supply signal DCPS, from the PA envelope power supply 280 (FIG. 57) via the envelope power supply status signal EPSS, from the PA bias power supply 282 (FIG. 57) via the bias power supply status signal BPSS, or any combination thereof. The DC-DC control circuitry 90 may provide the DC-DC converter operational control parameters 342 to the DC-DC converter DCI 62 (FIG. 57), to the PA envelope power supply 280 (FIG. 57) via the charge pump buck control signal CPBS, to the PA envelope power supply 280 (FIG. 57) via the buck control signal BCS, to the PA bias power supply 282 (FIG. 57) via the charge pump control signal CPS, or any combination thereof.

FIG. 59 shows details of the DC-DC LUT index information 340 and the DC-DC converter operational control parameters 342 illustrated in FIG. 58B according to one embodiment of the DC-DC LUT index information 340 and the DC-DC converter operational control parameters 342. The DC-DC LUT index information 340 includes DC-DC converter configuration information 344 and operating status information 346. The DC-DC converter configuration information 344 may be used to configure the DC-DC converter 32 (FIG. 57) for different applications, for specific operating conditions, or both. As such, the DC-DC control circuitry 90 may receive the DC-DC converter configuration information 344 from the DC-DC converter DCI 62 (FIG. 57), from the DC power supply 80 (FIG. 57) via the DC power supply signal DCPS, from the PA envelope power supply 280 (FIG. 57) via the envelope power supply status signal EPSS, from the PA bias power supply 282 (FIG. 57) via the bias power supply status signal BPSS, or any combination thereof.

The operating status information 346 may be used to dynamically configure the DC-DC converter 32 (FIG. 57) based on changing conditions. As such, the DC-DC control circuitry 90 may receive the operating status information 346 from the DC-DC converter DCI 62 (FIG. 57), from the DC power supply 80 (FIG. 57) via the DC power supply signal DCPS, from the PA envelope power supply 280 (FIG. 57) via the envelope power supply status signal EPSS, from the PA bias power supply 282 (FIG. 57) via the bias power supply status signal BPSS, or any combination thereof.

The DC-DC converter operational control parameters 342 may be indicative of an envelope power supply setpoint 348, a selected converter operating mode 350, a selected pump buck operating mode 352, a selected charge pump buck base switching frequency 354, a selected charge pump buck switching frequency dithering mode 356, a selected charge pump buck dithering characteristics 358, a selected charge pump buck dithering frequency 360, a selected bias supply pump operating mode 362, a selected bias supply base switching frequency 364, a selected bias supply switching frequency dithering mode 366, a selected bias supply dithering characteristics 368, a selected bias supply dithering frequency 370, the like, or any combination thereof.

The DC-DC control circuitry 90 (FIG. 57) configures a setpoint of the PA envelope power supply 280 (FIG. 57) using the envelope power supply setpoint 348. The selected converter operating mode 350 is one of at least the first converter operating mode and the second converter operating mode. The DC-DC control circuitry 90 (FIG. 57) configures the PA envelope power supply 280 (FIG. 57) using the selected converter operating mode 350. The selected pump buck operating mode 352 is one of the pump buck pump-up operating mode and at least one other pump buck operating mode of the charge pump buck converter 84 (FIG. 45). The DC-DC control circuitry 90 (FIG. 57) configures the charge pump buck converter 84 (FIG. 45) using the selected pump buck operating mode 352.

The DC-DC control circuitry 90 (FIG. 57) configures a base switching frequency of the charge pump buck converter 84 (FIG. 45) using the selected charge pump buck base switching frequency 354. The DC-DC control circuitry 90 (FIG. 57) configures a frequency dithering mode of the charge pump buck converter 84 (FIG. 45) using the selected charge pump buck switching frequency dithering mode 356. The DC-DC control circuitry 90 (FIG. 57) configures dithering characteristics of the charge pump buck converter 84 (FIG. 45) using the selected charge pump buck dithering characteristics 358. The DC-DC control circuitry 90 (FIG. 57) configures a dithering frequency of the charge pump buck converter 84 (FIG. 45) using the selected charge pump buck dithering frequency 360, The selected bias supply pump operating mode 362 is one of the bias supply pump-up operating mode and at least one other bias supply pump operating mode of the charge pump 92 (FIG. 45). The DC-DC control circuitry 90 (FIG. 57) configures the PA bias power supply 282 (FIG. 57) using the selected bias supply pump operating mode 362. The DC-DC control circuitry 90 (FIG. 57) configures a base switching frequency of the charge pump 92 (FIG. 45) using the selected bias supply base switching frequency 364. The DC-DC control circuitry 90 (FIG. 57) configures a frequency dithering mode of the charge pump 92 (FIG. 45) using the selected bias supply switching frequency dithering mode 366. The DC-DC control circuitry 90 (FIG. 57) configures dithering characteristics of the charge pump 92 (FIG. 45) using the selected bias supply dithering characteristics 368. The DC-DC control circuitry 90 (FIG. 57) configures a dithering frequency of the charge pump 92 (FIG. 45) using the selected bias supply dithering frequency 370.

FIG. 60 shows details of the DC-DC LUT index information 340 illustrated in FIG. 59 and details of the DC-DC converter operating criteria 336 illustrated in FIG. 58A according to one embodiment of the DC-DC LUT index information 340 and the DC-DC converter operating criteria 336. The operating status information 346 may be indicative of a desired envelope power supply setpoint 372 of the PA envelope power supply 280 (FIG. 57), a DC-DC converter temperature 374 of the DC-DC converter 32 (FIG. 57), an RF PA circuitry temperature 376 of the RF PA circuitry 30 (FIG. 57), the envelope power supply voltage EPSV, the envelope power supply current EPSI, the DC power supply voltage DCPV, the bias power supply voltage BPSV, the bias power supply current BPSI, the like, or any combination thereof. The DC-DC converter operating criteria 336 includes one or more operating efficiencies 378, one or more operating limits 380, at least one operating headroom 382, electrical noise reduction 384, PA operating linearity 386, the like, or any combination thereof.

FIG. 61 is a graph showing eight efficiency curves of the PA envelope power supply 280 illustrated in FIG. 57 according to one embodiment of the PA envelope power supply 280. Specifically, the graph includes a first efficiency curve 388, a second efficiency curve 390, a third efficiency curve 392, a fourth efficiency curve 394, a fifth efficiency curve 396, a sixth efficiency curve 398, a seventh efficiency curve 400, and an eighth efficiency curve 402. The horizontal axis is indicative of the envelope power supply voltage EPSV and the vertical axis is indicative of efficiency of the PA envelope power supply 280 (FIG. 57).

The first, second, third, and fourth efficiency curves 388, 390, 392, 394 are associated with operation of the PA envelope power supply 280 (FIG. 57) at a first magnitude of the envelope power supply voltage EPSV (FIG. 57). The fifth, sixth, seventh, and eighth efficiency curves 396, 398, 400, 402 are associated with operation of the PA envelope power supply 280 (FIG. 57) at a second magnitude of the envelope power supply voltage EPSV (FIG. 57). The first and fifth efficiency curves 388, 396 are associated with operation of the PA envelope power supply 280 (FIG. 57) using a first base switching frequency. The second and sixth efficiency curves 390, 398 are associated with operation of the PA envelope power supply 280 (FIG. 57) using a second base switching frequency. The third and seventh efficiency curves 392, 400 are associated with operation of the PA envelope power supply 280 (FIG. 57) using a third base switching frequency. The fourth and eighth efficiency curves 394, 402 are associated with operation of the PA envelope power supply 280 (FIG. 57) using a fourth base switching frequency.

As a result, to maximize efficiency of the PA envelope power supply 280 (FIG. 57), the DC-DC control circuitry 90 (FIG. 57) may dynamically select the base switching frequency of the PA envelope power supply 280 (FIG. 57) based on the envelope power supply voltage EPSV, which may be measured or estimated, and based on the DC power supply voltage DCPV (FIG. 57), which may be measured or estimated. For example, when the PA envelope power supply 280 (FIG. 57) is operating using the first magnitude of the DC power supply voltage DCPV (FIG. 57) and a magnitude of the envelope power supply voltage EPSV is relatively low, the first efficiency curve 388 indicates a higher efficiency than the second, third, and fourth efficiency curves 390, 392, 394. As a result, the DC-DC control circuitry 90 (FIG. 57) would select the first base switching frequency to maximize efficiency. Similarly, when the PA envelope power supply 280 (FIG. 57) is operating using the first magnitude of the DC power supply voltage DCPV (FIG. 57) and a magnitude of the envelope power supply voltage EPSV is relatively high, the fourth efficiency curve 394 indicates a higher efficiency than the first, second, and third efficiency curves 388, 390, 392. As a result, the DC-DC control circuitry 90 (FIG. 57) would select the fourth base switching frequency to maximize efficiency. Additionally, when the PA envelope power supply 280 (FIG. 57) is operating using the second magnitude of the DC power supply voltage DCPV (FIG. 57) and a magnitude of the envelope power supply voltage EPSV is relatively low, the sixth efficiency curve 398 indicates a higher efficiency than the fifth, seventh, and eighth efficiency curves 396, 400, 402. As a result, the DC-DC control circuitry 90 (FIG. 57) would select the first base switching frequency to maximize efficiency.

FIG. 61 is one example of certain operational dependencies in the RF communications system 26 (FIG. 57) between the DC-DC converter 32 (FIG. 57) and the RF PA circuitry 30 (FIG. 57). In general, there may be many operational dependencies within the DC-DC converter 32 (FIG. 57) and between the DC-DC converter 32 (FIG. 57) and the RF PA circuitry 30 (FIG. 57). As a result, the DC-DC control circuitry 90 (FIG. 57) may configure the DC-DC converter 32 (FIG. 57) using the DC-DC LUT structure 334 (FIG. 58A) to optimize operation of the RF communications system 26 (FIG. 57) based on the operational dependencies.

Configurable 2-Wire/3-Wire Serial Communications Interface

A summary of a configurable 2-wire/3-wire serial communications interface C23SCI is presented, followed by a detailed description of the C23SCI according to one embodiment of the present disclosure. The present disclosure relates to the C23SCI, which includes start-of-sequence (SOS) detection circuitry and sequence processing circuitry. When the SOS detection circuitry is coupled to a 2-wire serial communications bus, the SOS detection circuitry detects an SOS of a received sequence based on a serial data signal and a serial clock signal. When the SOS detection circuitry is coupled to a 3-wire serial communications bus, the SOS detection circuitry detects the SOS of the received sequence based on a chip select (CS) signal. In response to detecting the SOS, the SOS detection circuitry provides an SOS detection signal to the sequence processing circuitry, which initiates processing of the received sequence using the serial data signal and the serial clock signal. The received sequence is associated with one of multiple serial communications protocols.

Since some 2-wire serial communications buses have only the serial data signal and the serial clock signal, some type of special encoding of the serial data signal and the serial clock signal is used to represent the SOS. However, some 3-wire serial communications buses have a dedicated signal, such as the CS signal, to represent the SOS. As such, some 3-wire serial communications devices, such as test equipment, RF transceivers, baseband controllers, or the like, may not be able to provide the special encoding to represent the SOS, thereby mandating use of the CS signal. As a result, the first C23SCI must be capable of detecting the SOS based on either the CS signal or the special encoding.

Certain 2-wire serial communications protocols may have compatibility issues with certain 3-wire serial communications protocols. Further, the C23SCI may be used in a system using certain serial communications protocols having sequences that cannot be properly processed by the sequence processing circuitry. As a result, in one embodiment of the C23SCI, the sequence processing circuitry receives a protocol configuration signal, such that the sequence processing circuitry inhibits processing of certain serial communications protocols based on the protocol configuration signal. Additionally, in a system using certain serial communications protocols having sequences that cannot be properly processed by the sequence processing circuitry, the sequence processing circuitry may stall or react incorrectly. As a result, in one embodiment of the C23SCI, the sequence processing circuitry receives a sequence abort signal, such that the sequence processing circuitry aborts processing of a received sequence based on the sequence abort signal, which may be based on the CS signal.

FIG. 62 shows a first C23SCI 404 according to one embodiment of the first C23SCI 404. The first C23SCI 404 includes the SOS detection circuitry 302 and the sequence processing circuitry 304. In this regard, the SOS detection circuitry 302 and the sequence processing circuitry 304 provide the first C23SCI 404. The SOS detection circuitry 302 has the CS input CSIN, the serial clock input SCIN, and the serial data input SDIN. The SOS detection circuitry 302 is coupled to the 3-wire serial communications bus 306. The SOS detection circuitry 302 receives the CS signal CSS, the serial clock signal SCLK, and the serial data signal SDATA via the 3-wire serial communications bus 306. As such, the SOS detection circuitry 302 receives the CS signal CSS via the CS input CSIN, receives the serial clock signal SCLK via the serial clock input SCIN, and receives the serial data signal SDATA via the serial data input SDIN.

The serial clock signal SCLK is used to synchronize to data provided by the serial data signal SDATA. A received sequence is provided to the first C23SCI 404 by the serial data signal SDATA. The SOS is the beginning of the received sequence and is used by the sequence processing circuitry 304 to initiate processing the received sequence. The received sequence is associated with one of multiple serial communications protocols. In one embodiment of the SOS detection circuitry 302, the SOS detection circuitry 302 detects the SOS based on the CS signal CSS. In an alternate embodiment of the SOS detection circuitry 302, the SOS detection circuitry 302 detects the SOS based on special encoding of the serial data signal SDATA and the serial clock signal SCLK. In either embodiment of the SOS detection circuitry 302, the SOS detection circuitry 302 provides the SOS detection signal SSDS, which is indicative of the SOS. The sequence processing circuitry 304 receives the SOS detection signal SSDS, the serial data signal SDATA, and the serial clock signal SCLK. As such, the sequence processing circuitry 304 initiates processing of the received sequence using the serial data signal SDATA and the serial clock signal SCLK upon detection of the SOS. In one embodiment of the 3-wire serial communications bus 306, the 3-wire serial communications bus 306 is the digital communications bus 66. In one embodiment of the 3-wire serial communications bus 306, the S-wire serial communications bus 306 is a bi-directional bus, such that the sequence processing circuitry 304 may provide the serial data input SDIN, the serial clock signal SCLK, or both.

Certain 2-wire serial communications protocols may have compatibility issues with certain 3-wire serial communications protocols. Further, the first C23SCI 404 may be used in a system using certain serial communications protocols having sequences that cannot be properly processed by the sequence processing circuitry 304. As a result, in one embodiment of the first C23SCI 404, the sequence processing circuitry 304 receives a protocol configuration signal PCS, such that the sequence processing circuitry 304 is inhibited from processing a received sequence associated with at least one of the multiple serial communications protocols based on the protocol configuration signal PCS.

FIG. 63 shows the first C23SCI 404 according to an alternate embodiment of the first C23SCI 404. The first C23SCI 404 illustrated in FIG. 63 is similar to the first C23SCI 404 illustrated in FIG. 62, except in the first C23SCI 404 illustrated in FIG. 63, the SOS detection circuitry 302 is coupled to a 2-wire serial communications bus 308 instead of the 3-wire serial communications bus 306 (FIG. 62). The SOS detection circuitry 302 receives the serial clock signal SCLK and the serial data signal SDATA via the 2-wire serial communications bus 308. As such, the SOS detection circuitry 302 receives the serial clock signal SCLK via the serial clock input SCIN, and receives the serial data signal SDATA via the serial data input SDIN. The 2-wire serial communications bus 308 does not include the CS signal CSS (FIG. 62). As such, the CS input CSIN may be left unconnected as illustrated.

The serial clock signal SCLK is used to synchronize to data provided by the serial data signal SDATA. A received sequence is provided to the first C23SCI 404 by the serial data signal SDATA. The SOS is the beginning of the received sequence and is used by the sequence processing circuitry 304 to initiate processing the received sequence. The SOS detection circuitry 302 detects the SOS based on the special encoding of the serial data signal SDATA and the serial clock signal SCLK. The SOS detection circuitry 302 provides the SOS detection signal SSDS, which is indicative of the SOS. The sequence processing circuitry 304 receives the SOS detection signal SSDS, the serial data signal SDATA, and the serial clock signal SCLK. As such, the sequence processing circuitry 304 initiates processing of the received sequence using the serial data signal SDATA and the serial clock signal SCLK upon detection of the SOS. In one embodiment of the 2-wire serial communications bus 308, the 2-wire serial communications bus 308 is the digital communications bus 66. In one embodiment of the 2-wire serial communications bus 308, the 2-wire serial communications bus 308 is a bi-directional bus, such that the sequence processing circuitry 304 may provide the serial data input SDIN, the serial clock signal SCLK, or both.

In one embodiment of the SOS detection circuitry 302, when the SOS detection circuitry 302 is coupled to the 2-wire serial communications bus 308, the SOS detection circuitry 302 receives the serial data signal SDATA and receives the serial clock signal SCLK via the 2-wire serial communications bus 308, and the SOS detection circuitry 302 detects the SOS based on the serial data signal SDATA and the serial clock signal SCLK. When the SOS detection circuitry 302 is coupled to the 3-wire serial communications bus 306 (FIG. 62), the SOS detection circuitry 302 receives the CS signal CSS (FIG. 62), receives the serial data signal SDATA, and receives the serial clock signal SCLK via the 3-wire serial communications bus 306; and the SOS detection circuitry 302 detects the SOS based on the CS signal CSS (FIG. 62).

In an alternate embodiment of the SOS detection circuitry 302, when the SOS detection circuitry 302 is coupled to the 3-wire serial communications bus 306 (FIG. 62), the SOS detection circuitry 302 receives the CS signal CSS (FIG. 62), receives the serial data signal SDATA, and receives the serial clock signal SCLK via the 3-wire serial communications bus 306; and the SOS detection circuitry 302 detects the SOS based on either the CS signal CSS (FIG. 62) or the serial data signal SDATA and the serial clock signal SCLK.

FIG. 64 shows the first C23SCI 404 according an additional embodiment of the first C23SCI 404. The SOS detection circuitry 302 includes the sequence detection OR gate 310, the CS detection circuitry 312, the start sequence condition (SSC) detection circuitry 314, the CS resistive element RCS, and a sequence abort inverter 406. The CS resistive element RCS is coupled to the CS input CSIN. In one embodiment of the SOS detection circuitry 302, the CS resistive element RCS is coupled between the CS input CSIN and a DC reference VDC. As such, in one embodiment of the SOS detection circuitry 302, when the CS input CSIN is left unconnected, the CS input CSIN is in a LOW state. In an alternate embodiment of the SOS detection circuitry 302, when the CS input CSIN is left unconnected, the CS input CSIN is in a HIGH state.

The CS detection circuitry 312 is coupled to the serial clock input SCIN and the CS input CSIN. As such, the CS detection circuitry 312 receives the serial clock signal SCLK and the CS signal CSS via the serial clock input SCIN and the CS input CSIN, respectively. The CS detection circuitry 312 feeds one input to the sequence detection OR gate 310 based on the serial clock signal SCLK and the CS signal CSS. In an alternate embodiment of the CS detection circuitry 312, the CS detection circuitry 312 is not coupled to the serial clock input SCIN. As such, the CS detection circuitry 312 feeds one input to the sequence detection OR gate 310 based on only the CS signal CSS. In an alternate embodiment of the SOS detection circuitry 302, the CS detection circuitry 312 is omitted, such that the CS input CSIN is directly coupled to one input to the sequence detection OR gate 310.

The SSC detection circuitry 314 is coupled to the serial clock input SCIN and the serial data input SDIN. As such, the SSC detection circuitry 314 receives the serial clock signal SCLK and the serial data signal SDATA via the serial clock input SCIN and the serial data input SDIN, respectively. The SSC detection circuitry 314 feeds another input to the sequence detection OR gate 310 based on the serial clock signal SCLK and the serial data signal SDATA. An output from the sequence detection OR gate 310 provides the SOS detection signal SSDS to the sequence processing circuitry 304 based on signals received from the CS detection circuitry 312 and the SSC detection circuitry 314. In this regard, the CS detection circuitry 312, the SSC detection circuitry 314, or both may detect an SOS of a received sequence.

In a system using certain serial communications protocols having sequences that cannot be properly processed by the sequence processing circuitry 304, the sequence processing circuitry 304 may stall or react incorrectly. As a result, if a stall occurs during a read operation from the first C23SCI 404, the first C23SCI 404 may hang or lock-up the digital communications bus 66. To remove the stall or recover from an incorrect reaction, the sequence processing circuitry 304 may need to abort processing of a received sequence. In this regard, in one embodiment of the C23SCI 404, the sequence processing circuitry 304 receives a sequence abort signal SAS, such that the sequence processing circuitry 304 aborts processing of a received sequence based on the sequence abort signal SAS, which may be based on the CS signal CSS. The CS input CSIN is coupled to an input to the sequence abort inverter 406. As such, the sequence abort inverter 406 receives and inverts the CS signal CSS to provide the sequence abort signal SAS to the sequence processing circuitry 304. In this regard, when the SOS detection circuitry 302 is coupled to the 3-wire serial communications bus 306, the sequence abort signal SAS is based on the CS signal CSS. The sequence abort signal SAS may be used by the sequence processing circuitry 304 to abort commands, to abort read operations, to abort write operations, to abort configurations, the like, or any combination thereof.

FIG. 65 shows the first C23SCI 404 according to another embodiment of the first C23SCI 404. The first C23SCI 404 illustrated in FIG. 65 is similar to the first C23SCI 404 illustrated in FIG. 64, except the first C23SCI 404 illustrated in FIG. 65 further includes a sequence abort AND gate 408. Additionally, the SOS detection circuitry 302 is coupled to the 2-wire serial communications bus 308 instead of the 3-wire serial communications bus 306. The CS input CSIN is coupled to the input to the sequence abort inverter 406 and an output from the sequence abort inverter 406 is coupled to a first input to the sequence abort AND gate 408. A second input to the sequence abort AND gate 408 receives a sequence abort enable signal ANS. The sequence abort AND gate 408 provides the sequence abort signal SAS to the sequence processing circuitry 304 based on the sequence abort enable signal ANS. In this regard, the capability of the first C23SCI 404 to abort processing of a received sequence may be either enabled or disabled based on the sequence abort enable signal ANS.

FIGS. 50A, 50B, 50C, and 50D are graphs illustrating the chip select signal CSS, the SOS detection signal SSDS, the serial clock signal SCLK, and the serial data signal SDATA, respectively, of the first C23SCI 404 illustrated in FIG. 64 according to one embodiment of the first C23SCI 404. The serial clock signal SCLK has the serial clock period 316 (FIG. 50C) and the serial data signal SDATA has the data bit period 318 (FIG. 50D) during the received sequence 320 (FIG. 50D). In one embodiment of the first C23SCI 404, the serial clock period 316 is about equal to the data bit period 318. As such, the serial clock signal SCLK may be used to sample data provided by the serial data signal SDATA. An SOS 322 of the received sequence 320 is shown in FIG. 50D.

The SOS detection circuitry 302 may detect the SOS 322 based on a LOW to HIGH transition of the CS signal CSS as shown in FIG. 50A. The CS detection circuitry 312 may use the CS signal CSS and the serial clock signal SCLK, such that the SOS detection signal SSDS is a pulse. A duration of the pulse may be about equal to the serial clock period 316. The pulse may be a positive pulse as shown in FIG. 50B. In an alternate embodiment (not shown) of the CS detection circuitry 312, the CS detection circuitry 312 may use the CS signal CSS and the serial clock signal SCLK, such that the SOS detection signal SSDS is a negative pulse. In an alternate embodiment (not shown) of the SOS detection circuitry 302, the SOS detection circuitry 302 may detect the SOS 322 based on a HIGH to LOW transition of the CS signal CSS.

FIGS. 51A, 51B, 51C, and 51D are graphs illustrating the chip select signal CSS, the SOS detection signal SSDS, the serial clock signal SCLK, and the serial data signal SDATA, respectively, of the first C23SCI 404 illustrated in FIG. 64 according to one embodiment of the first C23SCI 404. The CS signal CSS illustrated in FIG. 51A is LOW during the received sequence 320 (FIG. 51D). As such, the CS signal CSS is not used to detect the SOS 322 (FIG. 51D). Instead, detection of the SOS 322 is based on the special encoding of the serial data signal SDATA and the serial clock signal SCLK. Specifically, the SOS detection circuitry 302 uses the SSC detection circuitry 314 to detect the SOS 322 based on a pulse of the serial data signal SDATA, such that during the pulse of the serial data signal SDATA, the serial clock signal SCLK does not transition. The pulse of the serial data signal SDATA may be a positive pulse as shown in FIG. 51D. A duration of the serial data signal SDATA may be about equal to the data bit period 318.

The SSC detection circuitry 314 may use the serial data signal SDATA and the serial clock signal SCLK, such that the SOS detection signal SSDS is a pulse. A duration of the pulse may be about equal to the serial clock period 316. The pulse may be a positive pulse as shown in FIG. 51B. In an alternate embodiment (not shown) of the SSC detection circuitry 314, the SSC detection circuitry 314 may use the serial data signal SDATA and the serial clock signal SCLK, such that the SOS detection signal SSDS is a negative pulse. In an alternate embodiment (not shown) of the SOS detection circuitry 302, the SOS detection circuitry 302 may detect the SOS 322 based on a negative pulse of the serial data signal SDATA while the serial clock signal SCLK does not transition.

In one embodiment of the sequence processing circuitry 304, if another SOS 322 is detected before processing of the received sequence 320 is completed; the sequence processing circuitry 304 will abort processing of the received sequence 320 in process and initiate processing of the next received sequence 320. In one embodiment of the first C23SCI 404, the first C23SCI 404 is a mobile industry processor interface (MiPi). In an alternate embodiment of the first C23SCI 404, the first C23SCI 404 is an RF front-end (FE) interface. In an additional embodiment of the first C23SCI 404, the first C23SCI 404 is a slave device. In another embodiment of the first C23SCI 404, the first C23SCI 404 is a MiPi RFFE interface. In a further embodiment of the first C23SCI 404, the first C23SCI 404 is a MiPi RFFE slave device. In a supplemental embodiment of the first C23SCI 404, the first C23SCI 404 is a MiPi slave device. In an alternative embodiment of the first C23SCI 404, the first C23SCI 404 is an RFFE slave device.

FIGS. 52A, 52B, 52C, and 52D are graphs illustrating the chip select signal CSS, the SOS detection signal SSDS, the serial clock signal SCLK, and the serial data signal SDATA, respectively, of the first C23SCI 404 illustrated in FIG. 64 according to one embodiment of the first C23SCI 404. FIGS. 52A, 52C, and 52D are duplicates of FIGS. 50A, 50C, and 50D, respectively for clarity. The SOS detection circuitry 302 may detect the SOS 322 based on the LOW to HIGH transition of the CS signal CSS as shown in FIG. 52A. The CS detection circuitry 312 may uses the CS signal CSS, such that the SOS detection signal SSDS follows the CS signal CSS as shown in FIG. 52B. In an alternate embodiment of the SOS detection circuitry 302, the CS detection circuitry 312 is omitted, such that the CS input CSIN is directly coupled to the sequence detection OR gate 310. As such, the SOS detection signal SSDS follows the CS signal CSS as shown in FIG. 52B.

FIG. 66 shows the RF communications system 26 according to one embodiment of the RF communications system 26. The RF communications system 26 illustrated in FIG. 66 is similar to the RF communications system 26 illustrated in FIG. 6, except in the RF communications system 26 illustrated in FIG. 66, the RF PA circuitry 30 further includes the first C23SCI 404, the DC-DC converter 32 further includes a second C23SCI 410, and the front-end aggregation circuitry 36 further includes a third C23SCI 412. In one embodiment of the RF communications system 26, the first C23SCI 404 is the PA-DCI 60, the second C23SCI 410 is the DC-DC converter DCI 62, and the third C23SCI 412 is the aggregation circuitry DCI 64. In an alternate embodiment (not shown) of the RF communications system 26, the first C23SCI 404 is the DC-DC converter DCI 62. In an additional embodiment (not shown) of the RF communications system 26, the first C23SCI 404 is the aggregation circuitry DCI 64.

In one embodiment of the RF communications system 26, the S-wire serial communications bus 306 (FIG. 62) is the digital communications bus 66. The control circuitry 42 is coupled to the SOS detection circuitry 302 (FIG. 62) via the 3-wire serial communications bus 306 (FIG. 62) and via the control circuitry DCI 58. As such, the control circuitry 42 provides the CS signal CSS (FIG. 62) via the control circuitry DCI 58, the control circuitry 42 provides the serial clock signal SCLK (FIG. 62) via the control circuitry DCI 58, and the control circuitry 42 provides the serial data signal SDATA (FIG. 62) via the control circuitry DCI 58.

In an alternate embodiment of the RF communications system 26, the 2-wire serial communications bus 308 (FIG. 63) is the digital communications bus 66. The control circuitry 42 is coupled to the SOS detection circuitry 302 (FIG. 63) via the 2-wire serial communications bus 308 (FIG. 63) and via the control circuitry DCI 58. As such, the control circuitry 42 provides the serial clock signal SCLK (FIG. 63) via the control circuitry DCI 58 and the control circuitry 42 provides the serial data signal SDATA (FIG. 63) via the control circuitry DCI 58.

FIG. 67 shows details of the RF PA circuitry 30 illustrated in FIG. 6 according to one embodiment of the RF PA circuitry 30. The RF PA circuitry 30 illustrated in FIG. 67 is similar to the RF PA circuitry 30 illustrated in FIG. 54, except in the RF PA circuitry 30 illustrated in FIG. 67, the first C23SCI 404 is the PA-DCI 60 and the PA control circuitry 94 provides the sequence abort signal SAS and the protocol configuration signal PCS to the PA-DCI 60. In alternate embodiments of the PA control circuitry 94, the sequence abort signal SAS, the protocol configuration signal PCS, or both are omitted.

FIG. 68 shows the RF communications system 26 according to an alternate embodiment of the RF communications system 26. The RF communications system 26 illustrated in FIG. 68 is similar to the RF communications system 26 illustrated in FIG. 57, except in the RF communications system 26 illustrated in FIG. 68, the first C23SCI 404 is the DC-DC converter DCI 62 and the DC-DC control circuitry 90 provides the sequence abort signal SAS and the protocol configuration signal PCS to the DC-DC converter DCI 62. In alternate embodiments of the DC-DC control circuitry 90, the sequence abort signal SAS, the protocol configuration signal PCS, or both are omitted.

Current Digital-to-Analog Converter (IDAC) Controlled PA Bias

A summary of IDAC controlled PA bias is presented followed by a detailed description of the IDAC controlled PA bias according to one embodiment of the present disclosure. The present disclosure relates to RF PA circuitry, which includes an RF PA having a final stage, PA control circuitry, a PA-DCI, and a final stage IDAC. The final stage IDAC is coupled between the PA control circuitry and a final bias input to the final stage of the RF PA. The PA-DCI is coupled between a digital communications bus and the PA control circuitry. The PA control circuitry receives information from the digital communications bus via the PA-DCI. The final stage IDAC biases the final stage of the RF PA via the final bias input based on the information. Specifically, the final stage IDAC provides a final bias signal to the final bias input based on the information. As such, the PA control circuitry controls bias to the final stage by controlling the final stage IDAC via a bias configuration control signal. The PA-DCI may be a serial digital interface (SDI), a mobile industry processor interface (MiPi), or other digital interface.

In one embodiment of the RF PA circuitry, the RF PA circuitry includes a first RF PA, a second RF PA, the final stage IDAC, the PA control circuitry, the PA-DCI, and a final stage multiplexer coupled between the final stage IDAC and the RF PAs. During a first PA operating mode, the first RF PA is enabled and the second RF PA is disabled. Conversely, during a second PA operating mode, the first RF PA is disabled and the second RF PA is enabled. As such, the final stage multiplexer is controlled by the PA control circuitry based on which PA operating mode is selected. During the first PA operating mode, the PA control circuitry routes the final bias signal from the final stage IDAC though the final stage multiplexer to the first RF PA and disables the second RF PA by providing a disabling final bias signal to the second RF PA from the final stage multiplexer. Conversely, during the second PA operating mode, the PA control circuitry routes the final bias signal from the final stage IDAC though the final stage multiplexer to the second RF PA and disables the first RF PA by providing a disabling final bias signal to the first RF PA from the final stage multiplexer.

In an alternate embodiment of the RF PA circuitry, the RF PA circuitry further includes a driver stage IDAC and a driver stage multiplexer coupled to driver stages in the first and second RF PAs. During the first PA operating mode, the PA control circuitry routes a driver bias signal from the driver stage IDAC though the driver stage multiplexer to the first RF PA. During the second PA operating mode, the PA control circuitry routes the driver bias signal from the driver stage IDAC though the driver stage multiplexer to the second RF PA.

FIG. 69 shows details of the RF PA circuitry 30 illustrated in FIG. 6 according to another embodiment of the RF PA circuitry 30. The RF PA circuitry 30 illustrated in FIG. 69 is similar to the RF PA circuitry 30 illustrated in FIG. 40, except the RF PA circuitry 30 illustrated in FIG. 69 further includes the PA-DCI 60, which is coupled to the PA control circuitry 94 and to the digital communications bus 66. The control circuitry 42 (FIG. 6) is coupled to the digital communications bus 66. As such, the control circuitry 42 (FIG. 6) may provide the PA configuration control signal PCC via the control circuitry DCI 58 (FIG. 6) to the PA control circuitry 94 via the PA-DCI 60. Additionally, the first driver stage 252 has a first driver bias input FDBI, the first final stage 254 has a first final bias input FFBI, the second driver stage 256 has a second driver bias input SDBI, and the second final stage 258 has a second final bias input SFBI. The driver stage IDAC circuitry 260 illustrated in FIG. 41 includes the driver stage IDAC 264 and the final stage IDAC circuitry 262 illustrated in FIG. 41 includes the final stage IDAC 270 (FIG. 41).

In this regard, the final stage IDAC 270 (FIG. 41) is coupled between the PA control circuitry 94 and the first final bias input FFBI through the final stage multiplexer 272 (FIG. 41). As such, the final stage multiplexer 272 (FIG. 41) is coupled between the final stage IDAC 270 (FIG. 41) and the first final bias input FFBI. The final stage IDAC 270 (FIG. 41) is coupled between the PA control circuitry 94 and the second final bias input SFBI through the final stage multiplexer 272 (FIG. 41). As such, the final stage multiplexer 272 (FIG. 41) is coupled between the final stage IDAC 270 (FIG. 41) and the second final bias input SFBI. The driver stage IDAC 264 (FIG. 41) is coupled between the PA control circuitry 94 and the first driver bias input FDBI through the driver stage multiplexer 266 (FIG. 41). As such, the driver stage multiplexer 266 (FIG. 41) is coupled between driver stage IDAC 264 (FIG. 41) and the first driver bias input FDBI. The driver stage IDAC 264 (FIG. 41) is coupled between the PA control circuitry 94 and the second driver bias input SDBI through the driver stage multiplexer 266 (FIG. 41). As such, the driver stage multiplexer 266 (FIG. 41) is coupled between the driver stage IDAC 264 (FIG. 41) and the second driver bias input SDBI.

The PA-DCI 60 is coupled between the digital communications bus 66 and the PA control circuitry 94. The PA control circuitry 94 receives information from the digital communications bus 66 via the PA-DCI 60. In one embodiment of the PA-DCI 60, the PA-DCI 60 is a serial digital interface. In one embodiment of the PA-DCI 60, the PA-DCI 60 is a mobile industry processor interface (MiPi). The final stage IDAC 270 (FIG. 41) biases the first final stage 254 via the first final bias input FFBI based on the information. As such, the first RF PA 50 receives the first final bias signal FFB via the first final bias input FFBI to bias the first final stage 254. The final stage IDAC 270 (FIG. 41) biases the second final stage 258 via the second final bias input SFBI based on the information. As such, the second RF PA 54 receives the second final bias signal SFB via the second final bias input SFBI to bias the second final stage 258. The driver stage IDAC 264 (FIG. 41) biases the first driver stage 252 via the first driver bias input FDBI based on the information. As such, the first RF PA 50 receives the first driver bias signal FDB via the first driver bias input FDBI to bias the first driver stage 252. The driver stage IDAC 264 (FIG. 41) biases the second driver stage 256 via the second driver bias input SDBI based on the information. As such, the second RF PA 54 receives the second driver bias signal SDB via the second driver bias input SDBI to bias the second driver stage 256.

In one embodiment of the control circuitry 42 (FIG. 6), the control circuitry 42 (FIG. 6) selects a desired magnitude of the first final bias signal FFB and provides the information based on the desired magnitude of the first final bias signal FFB. In one embodiment of the control circuitry 42 (FIG. 6), the control circuitry 42 (FIG. 6) selects a desired magnitude of the second final bias signal SFB and provides the information based on the desired magnitude of the second final bias signal SFB. In one embodiment of the control circuitry 42 (FIG. 6), the control circuitry 42 (FIG. 6) selects a desired magnitude of the first driver bias signal FDB and provides the information based on the desired magnitude of the first driver bias signal FDB. In one embodiment of the control circuitry 42 (FIG. 6), the control circuitry 42 (FIG. 6) selects a desired magnitude of the second driver bias signal SDB and provides the information based on the desired magnitude of the second driver bias signal SDB.

The PA control circuitry 94 provides the bias configuration control signal BCC based on the information. As such, the PA control circuitry 94 controls bias to the first final stage 254 by controlling the final stage IDAC 270 (FIG. 41) via the bias configuration control signal BCC based on the information. The PA control circuitry 94 controls bias to the second final stage 258 by controlling the final stage IDAC 270 (FIG. 41) via the bias configuration control signal BCC based on the information. The PA control circuitry 94 controls bias to the first driver stage 252 by controlling the driver stage IDAC 264 (FIG. 41) via the bias configuration control signal BCC based on the information. The PA control circuitry 94 controls bias to the second driver stage 256 by controlling the driver stage IDAC 264 (FIG. 41) via the bias configuration control signal BCC based on the information.

In one embodiment of the first driver stage 252, the first driver stage 252 is a quadrature driver stage. In an alternate embodiment of the first driver stage 252, the first driver stage 252 is a non-quadrature driver stage. In one embodiment of the second driver stage 256, the second driver stage 256 is a quadrature driver stage. In an alternate embodiment of the second driver stage 256, the second driver stage 256 is a non-quadrature driver stage. In one embodiment of the first final stage 254, the first final stage 254 is a quadrature final stage. In an alternate embodiment of the first final stage 254, the first final stage 254 is a non-quadrature final stage. In one embodiment of the second final stage 258, the second final stage 258 is a quadrature final stage. In an alternate embodiment of the second final stage 258, the second final stage 258 is a non-quadrature final stage.

FIG. 70 shows details of the first final stage 254 illustrated in FIG. 69 according to one embodiment of the first final stage 254. The first final stage 254 includes the first quadrature RF splitter 124, the first in-phase amplification path 126, the first quadrature-phase amplification path 128 and the first quadrature RF combiner 130. The first in-phase amplification path 126 includes the first in-phase final PA impedance matching circuit 144, the first in-phase final PA stage 146, and the first in-phase combiner impedance matching circuit 148. The first in-phase final PA impedance matching circuit 144 is coupled between the first in-phase output FIO and the first in-phase final PA stage 146. The first in-phase combiner impedance matching circuit 148 is coupled between the first in-phase final PA stage 146 and the first in-phase input FII. The first in-phase final PA impedance matching circuit 144 may provide at least an approximate impedance match between the first quadrature RF splitter 124 and the first in-phase final PA stage 146. The first in-phase combiner impedance matching circuit 148 may provide at least an approximate impedance match between the first in-phase final PA stage 146 and the first quadrature RF combiner 130. The first in-phase final PA stage 146 has a first in-phase final bias input FIFI, which is coupled to the first final bias input FFBI. In one embodiment of the first in-phase final PA stage 146, the first in-phase final bias input FIFI is directly coupled to the first final bias input FFBI.

During the first PA operating mode, the first quadrature RF splitter 124 receives the first final stage input signal FFSI via the first single-ended input FSI. Further, during the first PA operating mode, the first quadrature RF splitter 124 splits and phase-shifts the first final stage input signal FFSI into the first in-phase RF input signal FIN and the first quadrature-phase RF input signal FQN, such that the first quadrature-phase RF input signal FQN is nominally phase-shifted from the first in-phase RF input signal FIN by about 90 degrees.

During the first PA operating mode, the first in-phase final PA impedance matching circuit 144 receives and forwards the first in-phase RF input signal FIN to the first in-phase final PA stage 146, which receives and amplifies the forwarded first in-phase RF input signal to provide the first in-phase RF output signal FIT via the first in-phase combiner impedance matching circuit 148. During the first PA operating mode, the envelope power supply signal EPS provides power for amplification to the first in-phase final PA stage 146. During the first PA operating mode, the first final bias signal FFB provides biasing to the first in-phase final PA stage 146 via the first in-phase final bias input FIFI.

The first quadrature-phase amplification path 128 includes the first quadrature-phase final PA impedance matching circuit 154, the first quadrature-phase final PA stage 156, and the first quadrature-phase combiner impedance matching circuit 158. The first quadrature-phase final PA impedance matching circuit 154 is coupled between the first quadrature-phase output FQO and the first quadrature-phase final PA stage 156. The first quadrature-phase combiner impedance matching circuit 158 is coupled between the first quadrature-phase final PA stage 156 and the first quadrature-phase input FQI.

The first quadrature-phase final PA impedance matching circuit 154 may provide at least an approximate impedance match between the first quadrature RF splitter 124 and the first quadrature-phase final PA stage 156. The first quadrature-phase combiner impedance matching circuit 158 may provide at least an approximate impedance match between the first quadrature-phase final PA stage 156 and the first quadrature RF combiner 130. The first quadrature-phase final PA stage 156 has a first quadrature-phase final bias input FQFI, which is coupled to the first final bias input FFBI. In one embodiment of the first quadrature-phase final PA stage 156, the first quadrature-phase final bias input FQFI is directly coupled to the first final bias input FFBI.

During the first PA operating mode, the first quadrature-phase final PA impedance matching circuit 154 receives and forwards the first quadrature-phase RF input signal FQN to provide a forwarded first quadrature-phase RF input signal to the first quadrature-phase final PA stage 156 via the first quadrature-phase final PA impedance matching circuit 154. The first quadrature-phase final PA stage 156 receives and amplifies the forwarded first quadrature-phase RF input signal to provide the first quadrature-phase RF output signal FQT via the first quadrature-phase combiner impedance matching circuit 158. During the first PA operating mode, the first quadrature RF combiner 130 receives the first in-phase RF output signal FIT via the first in-phase input FII, and receives the first quadrature-phase RF output signal FQT via the first quadrature-phase input FQI. Further, the first quadrature RF combiner 130 phase-shifts and combines the first in-phase RF output signal FIT and the first quadrature-phase RF output signal FQT to provide the first RF output signal FRFO via the first quadrature combiner output FCO, such that the phase-shifted first in-phase RF output signal FIT and first quadrature-phase RF output signal FQT are about phase-aligned with one another before combining. During the first PA operating mode, the envelope power supply signal EPS provides power for amplification to the first quadrature-phase final PA stage 156. During the first PA operating mode, the first final bias signal FFB provides biasing to the first quadrature-phase final PA stage 156 via the first quadrature-phase final bias input FQFI.

FIG. 71 shows details of the second final stage 258 illustrated in FIG. 69 according to one embodiment of the second final stage 258. The second final stage 258 includes the second quadrature RF splitter 132, the second in-phase amplification path 134, the second quadrature-phase amplification path 136, and the second quadrature RF combiner 138. The second in-phase amplification path 134 includes the second in-phase final PA impedance matching circuit 164, the second in-phase final PA stage 166, and the second in-phase combiner impedance matching circuit 168. The second in-phase final PA impedance matching circuit 164 is coupled between the second in-phase RF input signal SIN and the second in-phase final PA stage 166. The second in-phase combiner impedance matching circuit 168 is coupled between the second in-phase final PA stage 166 and the second in-phase input SII.

The second in-phase final PA impedance matching circuit 164 may provide at least an approximate impedance match between the second quadrature RF splitter 132 and the second in-phase final PA stage 166. The second in-phase combiner impedance matching circuit 168 may provide at least an approximate impedance match between the second in-phase final PA stage 166 and the second quadrature RF combiner 138. The second in-phase final PA stage 166 has a second in-phase final bias input SIFI, which is coupled to the second final bias input SFBI. In one embodiment of the second in-phase final PA stage 166, the second in-phase final bias input SIFI is directly coupled to the second final bias input SFBI.

During the second PA operating mode, the second quadrature RF splitter 132 receives the second final stage input signal SFSI via the second single-ended input SSI. Further, during the second PA operating mode, the second quadrature RF splitter 132 splits and phase-shifts the second final stage input signal SFSI into the second in-phase RF input signal SIN and the second quadrature-phase RF input signal SQN, such that the second quadrature-phase RF input signal SQN is nominally phase-shifted from the second in-phase RF input signal SIN by about 90 degrees.

During the second PA operating mode, the second in-phase final PA impedance matching circuit 164 receives and forwards the second in-phase RF input signal SIN to the second in-phase final PA stage 166. The second in-phase final PA stage 166 receives and amplifies the forwarded second in-phase RF input signal to provide the second in-phase RF output signal SIT via the second in-phase combiner impedance matching circuit 168. During the second PA operating mode, the envelope power supply signal EPS provides power for amplification to the second in-phase final PA stage 166. During the second PA operating mode, the second final bias signal SFB provides biasing to the second in-phase final PA stage 166 via the second in-phase final bias input SIFI.

The second quadrature-phase amplification path 136 includes the second quadrature-phase final PA impedance matching circuit 174, the second quadrature-phase final PA stage 176, and the second quadrature-phase combiner impedance matching circuit 178. The second quadrature-phase final PA impedance matching circuit 174 is coupled between the second quadrature-phase output SQO and the second quadrature-phase final PA stage 176. The second quadrature-phase combiner impedance matching circuit 178 is coupled between the second quadrature-phase final PA stage 176 and the second quadrature-phase input SQI.

The second quadrature-phase final PA impedance matching circuit 174 may provide at least an approximate impedance match between second quadrature RF splitter 132 and the second quadrature-phase final PA stage 176. The second quadrature-phase combiner impedance matching circuit 178 may provide at least an approximate impedance match between the second quadrature-phase final PA stage 176 and the second quadrature RF combiner 138. The second quadrature-phase final PA stage 176 has a second quadrature-phase final bias input SQFI, which is coupled to the second final bias input SFBI. In one embodiment of the second quadrature-phase final PA stage 176, the second quadrature-phase final bias input SQFI is directly coupled to the second final bias input SFBI.

During the second PA operating mode, the second quadrature-phase final PA impedance matching circuit 174 receives and forwards the second quadrature-phase RF input signal SQN to the second quadrature-phase final PA stage 176. The second quadrature-phase final PA stage 176 receives and amplifies the forwarded the second quadrature-phase RF input signal to provide the second quadrature-phase RF output signal SQT via the second quadrature-phase combiner impedance matching circuit 178. During the second PA operating mode, the second quadrature RF combiner 138 receives the second in-phase RF output signal SIT via the second in-phase input SII, and receives the second quadrature-phase RF output signal SQT via the second quadrature-phase input SQI. Further, the second quadrature RF combiner 138 phase-shifts and combines the second in-phase RF output signal SIT and the second quadrature-phase RF output signal SQT to provide the second RF output signal SRFO via the second quadrature combiner output SCO, such that the phase-shifted second in-phase RF output signal SIT and second quadrature-phase RF output signal SQT are about phase-aligned with one another before combining. During the second PA operating mode, the envelope power supply signal EPS provides power for amplification to the second quadrature-phase final PA stage 176. During the second PA operating mode, the second final bias signal SFB provides biasing to the second quadrature-phase final PA stage 176 via the second quadrature-phase final bias input SQFI.

Noise Reduction of Dual Switching Power Supplies Using Synchronized Switching Frequencies A summary of noise reduction of dual switching power supplies using synchronized switching frequencies is followed by a detailed description of the noise reduction of dual switching power supplies using synchronized switching frequencies according to one embodiment of the present disclosure. In this regard, the present disclosure relates to a DC-DC converter having a first switching power supply, a second switching power supply, and frequency synthesis circuitry, which provides a first clock signal to the first switching power supply and a second clock signal to the second switching power supply. The first switching power supply receives and converts a DC power supply signal from a DC power supply, such as a battery, to provide a first switching power supply output signal using the first clock signal, which has a first frequency. The second switching power supply receives and converts the DC power supply signal to provide a second switching power supply output signal using the second clock signal, which has a second frequency. The second clock signal is phase-locked to the first clock signal. A switching frequency of the first switching power supply is equal to the first frequency and a switching frequency of the second switching power supply is equal to the second frequency.

The first and the second switching power supply output signals are used to provide power to application circuitry. By phase-locking the second clock signal to the first clock signal, an uncontrolled low frequency beat between the first and the second clock signals is avoided. Such a beat could interfere with proper operation of the application circuitry, particularly in applications that have sensitivities to certain frequencies. An uncontrolled low frequency beat may be manifested in ripple in the first switching power supply output signal, in ripple in the second switching power supply output signal, via switching circuitry in the first switching power supply, via switching circuitry in the second switching power supply, or any combination thereof. As a result, filtering out or avoiding such a beat may be difficult. By phase-locking the first and the second clock signals, spectral content of the first and the second switching power supplies is harmonically related and controlled. In one embodiment of the application circuitry, the first switching power supply output signal is an envelope power supply signal for an RF power amplifier (PA) and the second switching power supply output signal is a bias power supply signal used for biasing the RF PA. By avoiding an uncontrolled low frequency beat between the first and the second clock signals, interference in the RF PA and other RF circuitry, may be avoided.

In one embodiment of the frequency synthesis circuitry, the first frequency divided by the second frequency is about equal to a positive integer. In an alternate embodiment of the frequency synthesis circuitry, the first frequency divided by the second frequency is about equal to a first positive integer divided by a second positive integer. In one embodiment of the frequency synthesis circuitry, the frequency synthesis circuitry includes a first frequency oscillator, which provides the first clock signal, and a second frequency oscillator, which provides the second clock signal, such that the second frequency oscillator is phase-locked to the first frequency oscillator. In one embodiment of the first frequency oscillator, the first frequency oscillator is a programmable frequency oscillator. In one embodiment of the second frequency oscillator, the second frequency oscillator is a programmable frequency oscillator.

In one embodiment of the frequency synthesis circuitry, the frequency synthesis circuitry includes the first frequency oscillator, which provides a first oscillator output signal, and a first divider, which receives and divides the first oscillator output signal to provide the second clock signal. The first oscillator output signal has the first frequency and the first clock signal is based on the first oscillator output signal. In one embodiment of the frequency synthesis circuitry, the first oscillator output signal is the first clock signal. In an alternate embodiment of the frequency synthesis circuitry, the frequency synthesis circuitry further includes a buffer, which receives and buffers the first oscillator output signal to provide the first clock signal. In one embodiment of the first divider, the first divider is a fractional divider, such that the first frequency divided by the second frequency is about equal to the first positive integer divided by the second positive integer. In an alternate embodiment of the first divider, the first divider is an integer divider, such that the first frequency divided by the second frequency is about equal to the positive integer. In an additional embodiment of the first divider, the first divider is a programmable divider, such that any or all of the first positive integer, the second positive integer, and the positive integer are programmable.

In another embodiment of the frequency synthesis circuitry, the frequency synthesis circuitry includes the first frequency oscillator, which provides the first oscillator output signal, the first divider, which receives and divides the first oscillator output signal to provide the second clock signal, and a second divider, which receives and divides the first oscillator output signal to provide the first clock signal. In one embodiment of the second divider, the second divider is a fractional divider. In an alternate embodiment of the second divider, the second divider is an integer divider.

FIG. 72 shows the DC-DC converter 32 according to one embodiment of the DC-DC converter 32. In one embodiment of the DC-DC converter 32, the DC-DC converter 32 illustrated in FIG. 72 is used as the DC-DC converter 32 illustrated in FIG. 6. The DC-DC converter 32 includes the DC-DC converter DCI 62, the DC-DC control circuitry 90, a first switching power supply 450, a second switching power supply 452, and frequency synthesis circuitry 454. The DC-DC converter DCI 62 is coupled between the digital communications bus 66 and the DC-DC control circuitry 90. The DC power supply 80 provides the DC power supply signal DCPS to the first switching power supply 450 and the second switching power supply 452.

The DC-DC control circuitry 90 provides a first power supply control signal FPCS to the first switching power supply 450, a second power supply control signal SPCS to the second switching power supply 452, and a frequency synthesis control signal FSCS to the frequency synthesis circuitry 454. The first switching power supply 450 provides a first power supply status signal FPSS to the DC-DC control circuitry 90. The second switching power supply 452 provides a second power supply status signal SPSS to the DC-DC control circuitry 90. The frequency synthesis circuitry 454 provides a frequency synthesis status signal FSSS to the DC-DC control circuitry 90.

The frequency synthesis circuitry 454 provides a first clock signal FCLS to the first switching power supply 450 and a second clock signal SCLS to the second switching power supply 452. The first clock signal FCLS has a first frequency and the second clock signal SCLS has a second frequency. The second clock signal SCLS is phase-locked to the first clock signal FCLS. The first switching power supply 450 receives and converts the DC power supply signal DCPS to provide a first switching power supply output signal FPSO using the first clock signal FCLS, such that a switching frequency of the first switching power supply 450 is equal to the first frequency. The second switching power supply 452 receives and converts the DC power supply signal DCPS to provide a second switching power supply output signal SPSO using the second clock signal SCLS, such that a switching frequency of the second switching power supply 452 is equal to the second frequency.

In one embodiment of the frequency synthesis circuitry 454, the first frequency divided by the second frequency is about equal to a positive integer. In one embodiment of the frequency synthesis circuitry 454, the first frequency divided by the second frequency is about equal to a first positive integer divided by a second positive integer. In one embodiment of the first switching power supply 450, the first switching power supply 450 is a charge pump buck power supply. In one embodiment of the second switching power supply 452, the second switching power supply 452 is a charge pump power supply.

FIG. 73 shows details of the first switching power supply 450 illustrated in FIG. 72 according to one embodiment of the first switching power supply 450. The first switching power supply 450 includes a first switching converter 456, a second switching converter 458, the first power filtering circuitry 82, the first inductive element L1, and the second inductive element L2. The first switching converter 456 is coupled between the DC power supply 80 and the first inductive element L1. The first inductive element L1 is coupled between the first switching converter 456 and the first power filtering circuitry 82. The second switching converter 458 is coupled between the DC power supply 80 and the second inductive element L2. The second inductive element L2 is coupled between the second switching converter 458 and the first power filtering circuitry 82. The first power filtering circuitry 82 provides the first switching power supply output signal FPSO.

During the first converter operating mode, the first switching converter 456 is active and the second switching converter 458 is inactive, such that the first switching converter 456 receives and converts the DC power supply signal DCPS to provide the first switching power supply output signal FPSO via the first inductive element L1 and the first power filtering circuitry 82. During the second converter operating mode, the first switching converter 456 is inactive and the second switching converter 458 is active, such that the second switching converter 458 receives and converts the DC power supply signal DCPS to provide the first switching power supply output signal FPSO via the second inductive element L2 and the first power filtering circuitry 82.

In an alternate embodiment of the first switching power supply 450, the second switching converter 458 and the second inductive element L2 are omitted. In an additional embodiment of the first switching power supply 450, the second inductive element L2 is omitted, such that the second switching converter 458 is coupled across the first switching converter 456.

FIG. 74 shows details of the first switching power supply 450 and the second switching power supply 452 illustrated in FIG. 73 according to an alternate embodiment of the first switching power supply 450 and one embodiment of the second switching power supply 452. The first switching power supply 450 is the PA envelope power supply 280. The second switching power supply 452 is the PA bias power supply 282. The first switching converter 456 is the charge pump buck converter 84. The second switching converter 458 is the buck converter 86. The charge pump buck converter 84 has a first output inductance node 460. The buck converter 86 has a second output inductance node 462. The first inductive element L1 is coupled between the first output inductance node 460 and the first power filtering circuitry 82. The second inductive element L2 is coupled between the second output inductance node 462 and the first power filtering circuitry 82.

The frequency synthesis circuitry 454 provides the first clock signal FCLS to the PA envelope power supply 280 and the second clock signal SCLS to the PA bias power supply 282. A switching frequency of the PA envelope power supply 280 is equal to the first frequency. A switching frequency of the PA bias power supply 282 is equal to the second frequency. The first switching power supply output signal FPSO is the envelope power supply signal EPS. The second switching power supply output signal SPSO is the bias power supply signal BPS. The first power supply control signal FPCS provides the charge pump buck control signal CPBS and the buck control signal BCS. The second power supply control signal SPCS is the charge pump control signal CPS. The first power supply status signal FPSS is the envelope power supply status signal EPSS. The second power supply status signal SPSS is the bias power supply status signal BPSS.

FIG. 75 shows details of the first switching power supply 450 and the second switching power supply 452 illustrated in FIG. 73 according to an additional embodiment of the first switching power supply 450 and one embodiment of the second switching power supply 452. The first switching power supply 450 illustrated in FIG. 75 is similar to the first switching power supply 450 illustrated in FIG. 74, except in the first switching power supply 450 illustrated in FIG. 75, the second inductive element L2 is omitted. As such, the first output inductance node 460 is coupled to the second output inductance node 462. Specifically, the first output inductance node 460 may be directly coupled to the second output inductance node 462.

FIG. 76A shows details of the frequency synthesis circuitry 454 illustrated in FIG. 72 according to one embodiment of the frequency synthesis circuitry 454. The frequency synthesis circuitry 454 includes a first frequency oscillator 464, a second frequency oscillator 466, frequency synthesis control circuitry 468, a first buffer 470, and a second buffer 472. The frequency synthesis control circuitry 468 provides the frequency synthesis status signal FSSS to the DC-DC control circuitry 90 (FIG. 72). The DC-DC control circuitry 90 (FIG. 72) provides the frequency synthesis control signal FSCS to the frequency synthesis control circuitry 468. The first frequency oscillator 464 provides a first oscillator output signal FOOS to the first buffer 470, which receives and buffers the first oscillator output signal FOOS to provide the first clock signal FCLS. As such, the first clock signal FCLS is based on the first oscillator output signal FOOS. The second frequency oscillator 466 provides a second oscillator output signal SOOS to the second buffer 472, which receives and buffers the second oscillator output signal SOOS to provide the second clock signal SCLS. As such, the second clock signal SCLS is based on the second oscillator output signal SOOS.

The first frequency oscillator 464 provides a frequency synchronization signal FSS to the second frequency oscillator 466, which uses the frequency synchronization signal FSS to phase-lock the second frequency oscillator 466 to the first frequency oscillator 464. As such, the second frequency oscillator 466 is phase-locked to the first frequency oscillator 464. In this regard, both the first oscillator output signal FOOS and the first clock signal FCLS have the first frequency, and both the second oscillator output signal SOOS and the second clock signal SCLS have the second frequency. In an alternate embodiment of the first frequency oscillator 464, the frequency synchronization signal FSS is the first oscillator output signal FOOS.

In one embodiment of the frequency synthesis circuitry 454, the first buffer 470 is omitted, such that the first oscillator output signal FOOS is the first clock signal FCLS. In this regard, the first frequency oscillator 464 provides the first clock signal FCLS. Further, the first oscillator output signal FOOS has the first frequency. In one embodiment of the frequency synthesis circuitry 454, the second buffer 472 is omitted, such that the second oscillator output signal SOOS is the second clock signal SCLS. In this regard, the second frequency oscillator 466 provides the second clock signal SCLS. Further, the second oscillator output signal SOOS has the second frequency.

In one embodiment of the first frequency oscillator 464, the first frequency oscillator 464 is a programmable frequency oscillator. As such, a frequency of the first oscillator output signal FOOS is programmable by the frequency synthesis control circuitry 468, which provides frequency programming information to the first frequency oscillator 464. The DC-DC control circuitry 90 (FIG. 72) may select the frequency of the first oscillator output signal FOOS and provide indication of the frequency selection to the frequency synthesis control circuitry 468 via the frequency synthesis control signal FSCS.

In one embodiment of the second frequency oscillator 466, the second frequency oscillator 466 is a programmable frequency oscillator. As such, a frequency of the second oscillator output signal SOOS is programmable by the frequency synthesis control circuitry 468, which provides frequency programming information to the second frequency oscillator 466. The DC-DC control circuitry 90 (FIG. 72) may select the frequency of the second oscillator output signal SOOS and provide indication of the frequency selection to the frequency synthesis control circuitry 468 via the frequency synthesis control signal FSCS.

FIG. 76B shows details of the frequency synthesis circuitry 454 illustrated in FIG. 72 according to an alternate embodiment of the frequency synthesis circuitry 454. The frequency synthesis circuitry 454 illustrated in FIG. 76B is similar to the frequency synthesis circuitry 454 illustrated in FIG. 76A, except in the frequency synthesis circuitry 454 illustrated in FIG. 76B, the second frequency oscillator 466 is omitted, the second buffer 472 is omitted, and the frequency synthesis circuitry 454 further includes a first divider 474. The first divider 474 receives and divides the first oscillator output signal FOOS to provide the second clock signal SCLS. As such, the first clock signal FCLS and the second clock signal SCLS are based on the first oscillator output signal FOOS. Further, the second frequency is less than the first frequency. In one embodiment of the first divider 474, the first divider 474 is an integer divider, such that the first frequency divided by the second frequency is about equal to a positive integer. In an alternate embodiment of the first divider 474, the first divider 474 is a fractional divider, such that the first frequency divided by the second frequency is about equal to a first positive integer divided by a second positive integer.

In one embodiment of the first divider 474, the first divider 474 is a programmable divider, such that a ratio of the first frequency divided by the second frequency is programmable. As such, the frequency synthesis control circuitry 468 provides a first divider control signal FDCS to the first divider 474. The first divider control signal FDCS is indicative of division programming information. The DC-DC control circuitry 90 (FIG. 72) may select a desired ratio of the first frequency divided by the second frequency and provide indication of the desired ratio to the frequency synthesis control circuitry 468 via the frequency synthesis control signal FSCS.

FIG. 77A shows details of the frequency synthesis circuitry 454 illustrated in FIG. 72 according to an additional embodiment of the frequency synthesis circuitry 454. The frequency synthesis circuitry 454 illustrated in FIG. 77A is similar to the frequency synthesis circuitry 454 illustrated in FIG. 76B, except in the frequency synthesis circuitry 454 illustrated in FIG. 77A, the first buffer 470 is replaced with a second divider 476. The second divider 476 receives and divides the first oscillator output signal FOOS to provide the first clock signal FCLS. As such, the first clock signal FCLS and the second clock signal SCLS are based on the first oscillator output signal FOOS. Further, the first frequency is less than the frequency of the first oscillator output signal FOOS. In one embodiment of the second divider 476, the second divider 476 is an integer divider, such that the frequency of the first oscillator output signal FOOS divided by the first frequency is about equal to a positive integer. In an alternate embodiment of the second divider 476, the second divider 476 is a fractional divider, such that the frequency of the first oscillator output signal FOOS divided by the first frequency is about equal to a first positive integer divided by a second positive integer.

In one embodiment of the second divider 476, the second divider 476 is a programmable divider, such that a ratio of the frequency of the first oscillator output signal FOOS divided by the first frequency is programmable. As such, the frequency synthesis control circuitry 468 further provides a second divider control signal SDCS to the second divider 476. The second divider control signal SDCS is indicative of division programming information. The DC-DC control circuitry 90 (FIG. 72) may select a desired ratio of the frequency of the first oscillator output signal FOOS divided by the first frequency and provide indication of the desired ratio to the frequency synthesis control circuitry 468 via the frequency synthesis control signal FSCS.

FIG. 77B shows details of the frequency synthesis circuitry 454 illustrated in FIG. 72 according to another embodiment of the frequency synthesis circuitry 454. The frequency synthesis circuitry 454 illustrated in FIG. 77B is similar to the frequency synthesis circuitry 454 illustrated in FIG. 76B, except in the frequency synthesis circuitry 454 illustrated in FIG. 77B, the first buffer 470 is omitted and the frequency synthesis circuitry 454 further includes a clock signal comparator 478 coupled between the first frequency oscillator 464 and the first divider 474. An inverting input to the clock signal comparator 478 receives a clock comparator reference signal CCRS and a non-inverting input to the clock signal comparator 478 receives the first oscillator output signal FOOS. An output from the clock signal comparator 478 feeds the first divider 474.

In one embodiment of the first frequency oscillator 464, the first oscillator output signal FOOS is not a digital signal. Instead, the first oscillator output signal FOOS is a ramping signal, such as a triangle-wave signal or a sawtooth signal, having the first frequency. The clock signal comparator 478 converts the ramping signal into a digital signal, which is fed to the first divider 474. As such, the first clock signal FCLS and the second clock signal SCLS are based on the first oscillator output signal FOOS. Further, the first clock signal FCLS is a ramping signal having the first frequency and the second clock signal SCLS is a digital signal having the second frequency.

Frequency Correction of a Programmable Frequency Oscillator by Propagation Delay Compensation A summary of frequency correction of a programmable frequency oscillator by propagation delay compensation is followed by a detailed description of the frequency correction of a programmable frequency oscillator by propagation delay compensation according to one embodiment of the present disclosure. In this regard, the present disclosure relates to a first programmable frequency oscillator, which includes a first ramp comparator and programmable signal generation circuitry. The programmable signal generation circuitry provides a ramping signal, which has a first frequency, based on a desired first frequency. The first ramp comparator receives the ramping signal and provides a first ramp comparator output signal based on the ramping signal. The first ramp comparator output signal is fed back to the programmable signal generation circuitry, such that the ramping signal is based on the desired first frequency and the first ramp comparator output signal. Normally, the first frequency would be about proportional to one or more slopes of the ramping signal. However, the first ramp comparator has a first propagation delay, which introduces a frequency error into the programmable frequency oscillator. As a result, the first frequency is not proportional to the one or more slopes of the ramping signal. In this regard, the programmable signal generation circuitry compensates for the frequency error based on the desired first frequency.

In one embodiment of the programmable signal generation circuitry compensates for the frequency error by adjusting a first comparator reference signal to the first ramp comparator. In an alternate embodiment of the programmable signal generation circuitry, the programmable signal generation circuitry compensates for the frequency error by adjusting at least a first slope of the ramping signal. In one embodiment of the programmable signal generation circuitry, the programmable signal generation circuitry frequency dithers the ramping signal. As such, a desired frequency of the ramping signal changes based on the frequency dithering. As a result, the frequency error of the ramping signal changes as the desired frequency of the ramping signal changes. Therefore, the signal generation circuitry must adjust the compensation for the frequency error in response to the desired frequency changes of the ramping signal.

FIG. 78 shows the frequency synthesis control circuitry 468 and details of the first frequency oscillator 464 illustrated in FIG. 77B according to one embodiment of the first frequency oscillator 464. The first frequency oscillator 464 includes a first ramp comparator 480 and programmable signal generation circuitry 482. The programmable signal generation circuitry 482 provides a ramping signal RMPS having the first frequency based on a desired first frequency. The ramping signal RMPS is the first oscillator output signal FOOS. Further, the first ramp comparator 480 receives the ramping signal RMPS via a non-inverting input and provides a first ramp comparator output signal FRCS based on the ramping signal RMPS. The programmable signal generation circuitry 482 provides a first comparator reference signal FCRS. The first ramp comparator 480 receives the first comparator reference signal FCRS via an inverting input, such that the first ramp comparator output signal FRCS is based on a difference between the ramping signal RMPS and the first comparator reference signal FCRS. The first ramp comparator output signal FRCS is fed back to the programmable signal generation circuitry 482, such that the ramping signal RMPS is based on the desired first frequency and the first ramp comparator output signal FRCS.

The first frequency oscillator 464 is a first programmable frequency oscillator. As such, the first ramp comparator 480 and the programmable signal generation circuitry 482 provide the first programmable frequency oscillator. The control circuitry 42 (FIG. 6), the DC-DC control circuitry 90 (FIG. 72), or the frequency synthesis control circuitry 468 may select the desired first frequency. In general, control circuitry selects the desired first frequency.

FIG. 79 shows the frequency synthesis control circuitry 468 and details of the first frequency oscillator 464 illustrated in FIG. 77B according to an alternate embodiment of the first frequency oscillator 464. The first frequency oscillator 464 illustrated in FIG. 79 is similar to the first frequency oscillator 464 illustrated in FIG. 78, except in the first frequency oscillator 464 illustrated in FIG. 79, the first ramp comparator output signal FRCS is the first oscillator output signal FOOS instead of the ramping signal RMPS.

FIG. 80 is a graph showing the first comparator reference signal FCRS and the ramping signal RMPS illustrated in FIG. 78 according to one embodiment of the first comparator reference signal FCRS and the ramping signal RMPS. The ramping signal RMPS has a first slope 484 and a second slope 486. The graph in FIG. 80 shows the ramping signal RMPS under two different operating conditions. At the left end of the graph, the ramping signal RMPS has a first desired period 488 and at the right end of the graph, the ramping signal RMPS has a second desired period 490. The second desired period 490 is longer than the first desired period 488. As such, the first frequency under the operating condition at the left end of the graph is higher than the first frequency under the operating condition to the right.

The ramping signal RMPS illustrated in FIG. 80 is a saw-tooth signal. As such, the first slope 484 shows the ramping signal RMPS ramping-up in a linear manner and the second slope 486 shows the ramping signal RMPS dropping rapidly. As such, the second slope 486 doesn't change significantly between the ramping signal RMPS at the left end of the graph and the ramping signal RMPS at the right end of the graph. However, the first slope 484 changes significantly between the ramping signal RMPS at the left end of the graph and the ramping signal RMPS at the right end of the graph. The programmable signal generation circuitry 482 transitions the ramping signal RMPS from the first slope 484 to the second slope 486 based on the first ramp comparator output signal FRCS (FIG. 78). As such, when the first ramp comparator 480 detects the ramping signal RMPS exceeding the first comparator reference signal FCRS, the first ramp comparator 480 will transition the first ramp comparator output signal FRCS, thereby triggering the programmable signal generation circuitry 482 to transition the ramping signal RMPS from the first slope 484 to the second slope 486.

However, the first ramp comparator 480 has a first propagation delay 492. If the first propagation delay 492 was small enough to be negligible, when the ramping signal RMPS reached the first comparator reference signal FCRS, the programmable signal generation circuitry 482 would transitions the ramping signal RMPS from the first slope 484 to the second slope 486. If the first propagation delay 492 is not negligible, the ramping signal RMPS overshoots the first comparator reference signal FCRS. Therefore, the ramping signal RMPS at the left end of the graph has a first actual period 494 instead of the first desired period 488 and the ramping signal RMPS at the right end of the graph has a second actual period 496 instead of the second desired period 490. The ramping signal RMPS at the left end of the graph has a first overshoot 498 and the ramping signal RMPS at the right end of the graph has a second overshoot 500. As such, the ramping signal RMPS at the left end of the graph has a first example slope 502 and the ramping signal RMPS at the right end of the graph has a second example slope 504.

If the first propagation delay 492 was small enough to be negligible, a product of the first desired period 488 times the first example slope 502 would be about equal to a product of the second desired period 490 times the second example slope 504. As such, the first frequency would be about proportional to the first slope 484. However, if the first propagation delay 492 is not negligible, since the first overshoot 498 is not equal to the second overshoot 500, the first frequency is not equal to the first slope 484. As such, the first propagation delay 492 introduces a frequency error into the first frequency oscillator 464 (FIG. 78) that is frequency dependent. Therefore, the programmable signal generation circuitry 482 (FIG. 78) compensates for the first propagation delay 492 based on the desired first frequency. As such, the compensation for the first propagation delay 492 frequency corrects the first frequency.

In one embodiment of the programmable signal generation circuitry 482 (FIG. 78), the programmable signal generation circuitry 482 (FIG. 78) adjusts the first comparator reference signal FCRS to compensate for the first propagation delay 492 based on the desired first frequency. In an alternate embodiment of the programmable signal generation circuitry 482 (FIG. 78), the programmable signal generation circuitry 482 (FIG. 78) adjusts the first slope 484 of the ramping signal RMPS to compensate for the first propagation delay 492 based on the desired first frequency. In one embodiment of the programmable signal generation circuitry 482 (FIG. 78), the programmable signal generation circuitry 482 (FIG. 78) operates in one of a first phase 506 and a second phase 508, such that during the first phase 506, the ramping signal RMPS has the first slope 484 and during the second phase 508, the ramping signal RMPS has the second slope 486.

FIG. 81 is a graph showing the first comparator reference signal FCRS and the ramping signal RMPS illustrated in FIG. 78 according to an alternate embodiment of the first comparator reference signal FCRS and the ramping signal RMPS. The first comparator reference signal FCRS and the ramping signal RMPS illustrated in FIG. 81 are similar to the first comparator reference signal FCRS and the ramping signal RMPS illustrated in FIG. 80, except the ramping signal RMPS illustrated in FIG. 81 is frequency dithered. As such, the programmable signal generation circuitry 482 frequency dithers the ramping signal RMPS, such that the ramping signal RMPS has multiple frequencies based on multiple desired frequencies. Each of the multiple frequencies is based on a corresponding one of the multiple desired frequencies. The multiple frequencies may include the first frequency and the multiple desired frequencies may include the desired first frequency.

Since the first propagation delay 492 (FIG. 80) introduces a frequency error into the first frequency oscillator 464 (FIG. 78) that is frequency dependent. The programmable signal generation circuitry 482 compensates for the first propagation delay 492 (FIG. 80) based on the multiple desired frequencies.

FIG. 82 shows details of the programmable signal generation circuitry 482 illustrated in FIG. 78 according to one embodiment of the programmable signal generation circuitry 482. The programmable signal generation circuitry 482 has a ramp capacitive element CRM, a first ramp IDAC 510, a capacitor discharge circuit 512, and a first reference DAC 514. Since the first ramp IDAC 510, the capacitor discharge circuit 512, and the first reference DAC 514 are programmable circuits, the first ramp IDAC 510, the capacitor discharge circuit 512, and the first reference DAC 514 are coupled to the frequency synthesis control circuitry 468. The first ramp IDAC 510, the capacitor discharge circuit 512, and the ramp capacitive element CRM are coupled together to provide the ramping signal RMPS.

During the first phase 506 (FIG. 80) of the programmable signal generation circuitry 482, the first ramp IDAC 510 provides a charging current to the ramp capacitive element CRM. The charging current provides the first slope 484 (FIG. 80) of the ramping signal RMPS. During the second phase 508 (FIG. 80) of the programmable signal generation circuitry 482, the capacitor discharge circuit 512 provides a discharging current to the ramp capacitive element CRM. The discharging current provides the second slope 486 (FIG. 80) of the ramping signal RMPS. Both the first ramp IDAC 510 and the capacitor discharge circuit 512 receive the first ramp comparator output signal FRCS, which is indicative of a transition from the first phase 506 (FIG. 80) to the second phase 508 (FIG. 80). The first reference DAC 514 provides the first comparator reference signal FCRS.

The frequency synthesis control circuitry 468 selects the first frequency of the ramping signal RMPS by controlling the charging current to the ramp capacitive element CRM using the first ramp IDAC 510. As such, the frequency synthesis control circuitry 468 adjusts the first comparator reference signal FCRS to compensate for the first propagation delay 492 (FIG. 80) based on the desired first frequency using the first reference DAC 514. During frequency dithering, the frequency synthesis control circuitry 468 may need to rapidly change the first ramp IDAC 510 to switch between the multiple frequencies of the ramping signal RMPS. As such, the frequency synthesis control circuitry 468 may need to rapidly change the first reference DAC 514 to switch between the multiple magnitudes of the first comparator reference signal FCRS necessary to compensate for the first propagation delay 492 (FIG. 80).

FIG. 83 shows the frequency synthesis control circuitry 468 and details of the first frequency oscillator 464 illustrated in FIG. 77B according to an additional embodiment of the first frequency oscillator 464. The first frequency oscillator 464 illustrated in FIG. 83 is similar to the first frequency oscillator 464 illustrated in FIG. 78, except the first frequency oscillator 464 further includes a second ramp comparator 516. The second ramp comparator 516 receives the ramping signal RMPS via a non-inverting input and provides a second ramp comparator output signal SRCS based on the ramping signal RMPS. The programmable signal generation circuitry 482 further provides a second comparator reference signal SCRS. The second ramp comparator 516 receives the second comparator reference signal SCRS via an inverting input, such that the second ramp comparator output signal SRCS is based on a difference between the ramping signal RMPS and the second comparator reference signal SCRS. The second ramp comparator output signal SRCS is fed back to the programmable signal generation circuitry 482, such that the ramping signal RMPS is based on the desired first frequency, the first ramp comparator output signal FRCS, and the second ramp comparator output signal SRCS. The first frequency oscillator 464 is a first programmable frequency oscillator. As such, the first ramp comparator 480, the second ramp comparator 516, and the programmable signal generation circuitry 482 provide the first programmable frequency oscillator.

The second ramp comparator 516 has a second propagation delay. The programmable signal generation circuitry 482 further compensates for the second propagation delay based on the desired first frequency. As such, the compensation for the first propagation delay 492 (FIG. 80) and the second propagation delay frequency corrects the first frequency. In one embodiment of the programmable signal generation circuitry 482, the programmable signal generation circuitry 482 adjusts the first comparator reference signal FCRS to compensate for the first propagation delay 492 based on the desired first frequency. Further, the programmable signal generation circuitry 482 adjusts the second comparator reference signal SCRS to compensate for the second propagation delay based on the desired first frequency. In an alternate embodiment of the programmable signal generation circuitry 482, the programmable signal generation circuitry 482 adjusts the first slope 484 (FIG. 80) of the ramping signal RMPS to compensate for the first propagation delay 492 (FIG. 80) based on the desired first frequency. Further, the programmable signal generation circuitry 482 adjusts the second slope 486 (FIG. 80) of the ramping signal RMPS to compensate for the second propagation delay based on the desired first frequency.

FIG. 84 is a graph showing the first comparator reference signal FCRS, the ramping signal RMPS, and the second comparator reference signal SCRS illustrated in FIG. 83 according to one embodiment of the first comparator reference signal FCRS, the ramping signal RMPS, and the second comparator reference signal SCRS. The ramping signal RMPS illustrated in FIG. 94 is a triangular signal. As such, during the first phase 506 of the programmable signal generation circuitry 482 (FIG. 83), the ramping signal RMPS has the first slope 484 and during the second phase 508 of the programmable signal generation circuitry 482, the ramping signal RMPS has the second slope 486. The first slope 484 is a positive slope and the second slope 486 is a negative slope. However, magnitudes of the first slope 484 and the second slope 486 may be about equal to one another. The ramping signal RMPS has a ramping signal peak 517 when transitioning from the first phase 506 to the second phase 508.

FIG. 85 shows details of the programmable signal generation circuitry 482 illustrated in FIG. 83 according to an alternate embodiment of the programmable signal generation circuitry 482. The programmable signal generation circuitry 482 has the ramp capacitive element CRM, the first ramp IDAC 510, a second ramp IDAC 518, the first reference DAC 514, and a second reference DAC 520. Since the first ramp IDAC 510, the second ramp IDAC 518, the first reference DAC 514, and the second reference DAC 520 are programmable circuits, the first ramp IDAC 510, the second ramp IDAC 518, the first reference DAC 514, and the second reference DAC 520 are coupled to the frequency synthesis control circuitry 468. The first ramp IDAC 510, the second ramp IDAC 518, and the ramp capacitive element CRM are coupled together to provide the ramping signal RMPS.

During the first phase 506 (FIG. 84) of the programmable signal generation circuitry 482, the first ramp IDAC 510 provides a first current I1, which is the charging current, to the ramp capacitive element CRM. The charging current provides the first slope 484 (FIG. 84) of the ramping signal RMPS. During the second phase 508 (FIG. 84) of the programmable signal generation circuitry 482, the second ramp IDAC 518 provides a second current I2, which is the discharging current from the ramp capacitive element CRM. The discharging current provides the second slope 486 (FIG. 84) of the ramping signal RMPS. Both the first ramp IDAC 510 and the second ramp IDAC 518 receive both the first ramp comparator output signal FRCS and the second ramp comparator output signal SRCS, which are indicative of a transition from the first phase 506 (FIG. 84) to the second phase 508 (FIG. 84) and a transition from the second phase 508 (FIG. 84) to the first phase 506 (FIG. 84). The first reference DAC 514 provides the first comparator reference signal FCRS and the second reference DAC 520 provides the second comparator reference signal SCRS.

The frequency synthesis control circuitry 468 selects the first frequency of the ramping signal RMPS by controlling the charging current to the ramp capacitive element CRM using the first ramp IDAC 510 and by controlling the discharging current from the ramp capacitive element CRM using the second ramp IDAC 518. As such, the frequency synthesis control circuitry 468 adjusts the first comparator reference signal FCRS to compensate for the first propagation delay 492 (FIG. 80) based on the desired first frequency using the first reference DAC 514. Further, the frequency synthesis control circuitry 468 adjusts the second comparator reference signal SCRS to compensate for the second propagation delay based on the desired first frequency using the second reference DAC 520.

During frequency dithering, the frequency synthesis control circuitry 468 may need to rapidly change the first ramp IDAC 510 and the second ramp IDAC 518 to switch between the multiple frequencies of the ramping signal RMPS. As such, the frequency synthesis control circuitry 468 may need to rapidly change the first reference DAC 514 and the second reference DAC 520 to switch between the multiple magnitudes of the first comparator reference signal FCRS and the second comparator reference signal SCRS necessary to compensate for the first propagation delay 492 (FIG. 80) and the second propagation delay, respectively.

FIG. 86 shows details of the programmable signal generation circuitry 482 illustrated in FIG. 83 according to an additional embodiment of the programmable signal generation circuitry 482. The programmable signal generation circuitry 482 illustrated in FIG. 86 is similar to the programmable signal generation circuitry 482 illustrated in FIG. 85, except in the programmable signal generation circuitry 482 illustrated in FIG. 86, the first reference DAC 514 is replaced with a first fixed supply 522 and the second reference DAC 520 is replaced with a second fixed supply 524. As such, the first fixed supply 522 provides the first comparator reference signal FCRS and the second fixed supply 524 provides the second comparator reference signal SCRS. In this regard, the first comparator reference signal FCRS and the second comparator reference signal SCRS are not selectable. As a result, the programmable signal generation circuitry 482 adjusts the first slope 484 (FIG. 84) of the ramping signal RMPS to compensate for the first propagation delay 492 (FIG. 80) based on the desired first frequency and the programmable signal generation circuitry 482 adjusts the second slope 486 (FIG. 84) of the ramping signal RMPS to compensate for the second propagation delay based on the desired first frequency.

Voltage Compatible Charge Pump Buck and Buck Power Supplies

A summary of voltage compatible charge pump buck and buck power supplies is followed by a summary of dual inductive element charge pump buck and buck power supplies and a summary of a DC-DC converter using continuous and discontinuous conduction modes. The summaries are followed by a detailed description of the voltage compatible charge pump buck and buck power supplies and the dual inductive element charge pump buck and buck power supplies according to one embodiment of the present disclosure. The present disclosure relates to a flexible DC-DC converter, which includes a charge pump buck power supply and a buck power supply. The charge pump buck power supply and the buck power supply are voltage compatible with one another at respective output inductance nodes to provide flexibility. In one embodiment of the DC-DC converter, capacitances at the output inductance nodes are at least partially isolated from one another by using at least an isolating inductive element between the output inductance nodes to increase efficiency. In an alternate embodiment of the DC-DC converter, the output inductance nodes are coupled to one another, such that the charge pump buck power supply and the buck power supply share a first inductive element, thereby eliminating the isolating inductive element, which reduces size and cost but may also reduce efficiency. In both embodiments, the charge pump buck power supply and the buck power supply share an energy storage element. Specifically, the charge pump buck power supply includes a charge pump buck converter having a first output inductance node, a first inductive element, and the energy storage element, such that the first inductive element is coupled between the first output inductance node and the energy storage element. The buck power supply includes a buck converter having a second output inductance node, and the energy storage element. The buck power supply at the second output inductance node is voltage compatible with the charge pump buck power supply at the first output inductance node to provide flexibility.

Only one of the charge pump buck power supply and the buck power supply is active at any one time. As such, either the charge pump buck power supply or the buck power supply receives and converts a DC power supply signal from a DC power supply to provide a first switching power supply output signal to a load based on a setpoint. In one embodiment of the energy storage element, the energy storage element is a capacitive element. In one embodiment of the DC-DC converter, the buck power supply further includes the first inductive element and a second inductive element, which is coupled between the first output inductance node and the second output inductance node, such that the charge pump buck power supply and the buck power supply further share the first inductive element. In another embodiment of the DC-DC converter, the buck power supply further includes the second inductive element, which is coupled between the second output inductance node and the energy storage element. In an alternate embodiment of the DC-DC converter, the first output inductance node is coupled to the second output inductance node and the buck power supply further includes the first inductive element, such that the charge pump buck power supply and the buck power supply further share the first inductive element.

The charge pump buck converter combines the functionality of a charge pump with the functionality of a buck converter. However, the charge pump buck converter uses fewer switching elements than a separate charge pump and buck converter by using common switching elements for both charge pump and buck converter functionalities. As such, the charge pump buck power supply is capable of providing an output voltage that is greater than a voltage of the DC power supply signal. Conversely, the buck power supply is only capable of providing an output voltage that is about equal to or less than the voltage of the DC power supply signal. However, for the buck power supply to be voltage compatible with the charge pump buck power supply, the buck power supply must not be damaged or function improperly in the presence of a voltage at the second output inductance node that is equivalent to a voltage at the first output inductance node during normal operation of the charge pump buck power supply.

In one embodiment of the DC-DC converter, during a first converter operating mode, the charge pump buck power supply receives and converts the DC power supply signal to provide the first switching power supply output signal, and the buck power supply is disabled. During a second converter operating mode, the buck power supply receives and converts the DC power supply signal to provide the first switching power supply output signal, and the charge pump buck power supply is disabled. The setpoint is based on a desired voltage of the first switching power supply output signal.

In one embodiment of the DC-DC converter, selection of either the first converter operating mode or the second converter operating mode is based on a voltage of the DC power supply signal and the setpoint. The first converter operating mode is selected when the desired voltage of the first switching power supply output signal is greater than the voltage of the DC power supply signal. In one embodiment of the DC-DC converter, selection of either the first converter operating mode or the second converter operating mode is further based on a load current of the load. The second converter operating mode is selected when the desired voltage of the first switching power supply output signal is less than the voltage of the DC power supply signal and the load current is less than a load current threshold.

In a first exemplary embodiment of the DC-DC converter, selection of either the first converter operating mode or the second converter operating mode is further based on maximizing efficiency of the DC-DC converter. In a second exemplary embodiment of the DC-DC converter, selection of either the first converter operating mode or the second converter operating mode is further based on exceeding a minimum acceptable efficiency of the DC-DC converter. In a third exemplary embodiment of the DC-DC converter, selection of either the first converter operating mode or the second converter operating mode is further based on exceeding a desired efficiency of the DC-DC converter. In one embodiment of the DC-DC converter, the DC-DC converter further includes a charge pump, which receives and converts the DC power supply signal to provide a second switching power supply output signal. In one embodiment of the DC-DC converter, the first switching power supply output signal is an envelope power supply signal for a first RF power amplifier (PA) and the second switching power supply output signal is a bias power supply signal used for biasing the first RF PA.

As previously mentioned, in one embodiment of the DC-DC converter, the first output inductance node is coupled to the second output inductance node. During the first converter operating mode, the charge pump buck converter may boost the voltage of the DC power supply signal significantly, such that a voltage at the first and second output inductance nodes may be significantly higher than the voltage of the DC power supply signal. As a result, even though the buck converter is disabled during the first converter operating mode, the buck converter must be able to withstand the boosted voltage at the second output inductance node. In an exemplary embodiment of the DC-DC converter, the voltage at the first and second output inductance nodes is equal to about 11 volts and a breakdown voltage of individual switching elements in the buck converter is equal to about 7 volts.

To withstand boosted voltage at the second output inductance node, in one embodiment of the buck converter, the buck converter includes multiple shunt buck switching elements and multiple series buck switching elements. The shunt buck switching elements are coupled in series between the second output inductance node and a ground, and the series buck switching elements are coupled in series between the DC power supply and the first output inductance node. In one embodiment of the buck converter, the series buck switching elements are configured in a cascode arrangement.

Dual Inductive Element Charge Pump Buck and Buck Power Supplies

A summary of dual inductive element charge pump buck and buck power supplies is followed by a summary of a DC-DC converter using continuous and discontinuous conduction modes. Next, a detailed description of the dual inductive element charge pump buck and buck power supplies is presented according to one embodiment of the present disclosure. The present disclosure relates to a DC-DC converter, which includes a charge pump buck power supply and a buck power supply. The charge pump buck power supply includes a charge pump buck converter, a first inductive element, and an energy storage element. The charge pump buck converter and the first inductive element are coupled in series between a DC power supply, such as a battery, and the energy storage element. The buck power supply includes a buck converter, a second inductive element, and the energy storage element. The buck converter and the second inductive element are coupled in series between the DC power supply and the energy storage element. As such, the charge pump buck power supply and the buck power supply share the energy storage element. Only one of the charge pump buck power supply and the buck power supply is active at any one time. As such, either the charge pump buck power supply or the buck power supply receives and converts a DC power supply signal from the DC power supply to provide a first switching power supply output signal to a load based on a setpoint. In one embodiment of the energy storage element, the energy storage element is a capacitive element.

The charge pump buck converter combines the functionality of a charge pump with the functionality of a buck converter. However, the charge pump buck converter uses fewer switching elements than a separate charge pump and buck converter by using common switching elements for both charge pump and buck converter functionalities. As such, the charge pump buck power supply is capable of providing an output voltage that is greater than a voltage of the DC power supply signal. Conversely, the buck power supply is only capable of providing an output voltage that is about equal to or less than the voltage of the DC power supply signal. In one embodiment of the DC-DC converter, during a first converter operating mode, the charge pump buck power supply receives and converts the DC power supply signal to provide the first switching power supply output signal, and the buck power supply is disabled. During a second converter operating mode, the buck power supply receives and converts the DC power supply signal to provide the first switching power supply output signal, and the charge pump buck power supply is disabled. The setpoint is based on a desired voltage of the first switching power supply output signal.

In one embodiment of the DC-DC converter, selection of either the first converter operating mode or the second converter operating mode is based on a voltage of the DC power supply signal and the setpoint. The first converter operating mode is selected when the desired voltage of the first switching power supply output signal is greater than the voltage of the DC power supply signal. In one embodiment of the DC-DC converter, selection of either the first converter operating mode or the second converter operating mode is further based on a load current of the load. The second converter operating mode is selected when the desired voltage of the first switching power supply output signal is less than the voltage of the DC power supply signal and the load current is less than a load current threshold.

In a first exemplary embodiment of the DC-DC converter, selection of either the first converter operating mode or the second converter operating mode is further based on maximizing efficiency of the DC-DC converter. In a second exemplary embodiment of the DC-DC converter, selection of either the first converter operating mode or the second converter operating mode is further based on exceeding a minimum acceptable efficiency of the DC-DC converter. In a third exemplary embodiment of the DC-DC converter, selection of either the first converter operating mode or the second converter operating mode is further based on exceeding a desired efficiency of the DC-DC converter. In one embodiment of the DC-DC converter, the DC-DC converter further includes a charge pump, which receives and converts the DC power supply signal to provide a second switching power supply output signal. In one embodiment of the DC-DC converter, the first switching power supply output signal is an envelope power supply signal for a first RF power amplifier (PA) and the second switching power supply output signal is a bias power supply signal used for biasing the first RF PA.

In one embodiment of the DC-DC converter, the charge pump buck converter has a first output inductance node and the buck converter has a second output inductance node. The first inductive element is coupled between the first output inductance node and the energy storage element, and the second inductive element is coupled between the second output inductance node and the energy storage element. The buck converter has a shunt buck switching element coupled between the second output inductance node and a ground, and a series buck switching element coupled between the DC power supply and the second output inductance node.

During the first converter operating mode, the charge pump buck converter may boost the voltage of the DC power supply signal significantly, such that a voltage at the first output inductance node may be significantly higher than the voltage of the DC power supply signal. In an exemplary embodiment of the DC-DC converter, the voltage at the first output inductance node is equal to about 11 volts and a breakdown voltage of individual switching elements in the charge pump buck converter is equal to about 7 volts. To withstand boosted voltage at the first output inductance node, in one embodiment of the charge pump buck converter, the charge pump buck converter includes multiple shunt pump switching elements and multiple series pump switching elements.

DC-DC Converter Using Continuous and Discontinuous Conduction Modes

A summary of a DC-DC converter using continuous and discontinuous conduction modes is presented followed by a detailed description of the DC-DC converter using continuous and discontinuous conduction modes. As such, the present disclosure relates to circuitry, which includes a DC-DC converter having DC-DC control circuitry and a first switching power supply. The first switching power supply includes switching control circuitry, a first switching converter, an energy storage element, and a first inductive element, which is coupled between the first switching converter and the energy storage element. The first switching power supply receives and converts a DC power supply signal to provide a first switching power supply output signal based on a setpoint. During a continuous conduction mode (CCM), the switching control circuitry allows energy to flow from the energy storage element to the first inductive element. During a discontinuous conduction mode (DCM), the switching control circuitry does not allow energy to flow from the energy storage element to the first inductive element. Selection of either the CCM or the DCM is based on a rate of change of the setpoint.

If an output voltage of the first switching power supply output signal is above the setpoint, then the energy storage element needs to be depleted of some energy to drive the first switching power supply output signal toward the setpoint. During the CCM, two mechanisms operate to deplete the energy storage element. The first mechanism is provided by a load presented to the first switching power supply. The second mechanism is provided by the first switching converter, which allows energy to flow from the energy storage element to the first inductive element. During the DCM, only the first mechanism is allowed to deplete the energy storage element, which may slow the depletion of the energy storage element. As such, efficiency of the first switching power supply may be higher during the DCM than during the CCM. However, during the DCM, if the setpoint drops quickly, particularly during light loading conditions of the first switching power supply, there may be significant lag between the setpoint and the output voltage, thereby causing an output voltage error. Thus, there is a trade-off between minimizing output voltage error, by operating in the CCM, and maximizing efficiency, by operating in the DCM. To balance the trade-off, selection between the CCM and the DCM is based on the rate of change of the setpoint.

In one embodiment of the circuitry, selection between the CCM and the DCM is based only on the rate of change of the setpoint. In an alternate embodiment of the circuitry, selection between the CCM and the DCM is based on the rate of change of the setpoint and loading of the first switching power supply. In a first exemplary embodiment of the circuitry, when a negative rate of change of the setpoint is greater than a first threshold, the CCM is selected and when the negative rate of change of the setpoint is less than a second threshold, the DCM is selected, such that the second threshold is less than the first threshold and a difference between the first threshold and the second threshold provides hysteresis. In a second exemplary embodiment of the circuitry, the first threshold and the second threshold are based on loading of the first switching power supply.

In one embodiment of the first inductive element, the first inductive element has an inductive element current, which is positive when energy flows from the first inductive element to the energy storage element and is negative when energy flows from the energy storage element to the first inductive element. In one embodiment of the energy storage element, the energy storage element is a first capacitive element. In one embodiment of the circuitry, the circuitry includes control circuitry, which provides the setpoint to the DC-DC control circuitry. In one embodiment of the circuitry, the circuitry includes transceiver circuitry, which includes the control circuitry. In one embodiment of the control circuitry, the control circuitry makes the selection between the CCM and the DCM, and provides a DC configuration control signal to the DC-DC control circuitry, such that the DC configuration control signal is based on the selection between the CCM and the DCM. In one embodiment of the DC-DC control circuitry, the DC-DC control circuitry makes the selection between the CCM and the DCM.

In one embodiment of the first switching power supply, the first switching power supply further includes a second switching converter, which receives the DC power supply signal. The first switching power supply may use the first switching converter for heavy loading conditions and the second switching converter for light loading conditions. In one embodiment of the first switching power supply, the first switching converter is a charge pump buck converter and the second switching converter is a buck converter.

In one embodiment of the first switching power supply, the second switching converter is coupled across the first switching converter. As such, the second switching converter shares the first inductive element with the first switching converter. In an alternate embodiment of the first switching power supply, the first switching power supply further includes the second switching converter and a second inductive element, which is coupled between the second switching converter and the energy storage element. During the CCM, the switching control circuitry allows energy to flow from the energy storage element to the second inductive element. During the DCM, the switching control circuitry does not allow energy to flow from the energy storage element to the second inductive element.

In one embodiment of the DC-DC converter, the DC-DC converter further includes a second switching power supply, which receives and converts the DC power supply signal to provide a second switching power supply output signal. In one embodiment of the DC-DC converter, the first switching power supply output signal is an envelope power supply signal for an RF power amplifier (PA) and the second switching power supply output signal is a bias power supply signal, which is used for biasing the RF PA. In one embodiment of the second switching power supply, the second switching power supply is a charge pump.

FIG. 87 shows details of the first switching power supply 450 illustrated in FIG. 74 according to one embodiment of the first switching power supply 450. The first switching power supply 450 includes a charge pump buck power supply 526 and a buck power supply 528. The charge pump buck power supply 526 includes the first switching converter 456, the first inductive element L1, and the first power filtering circuitry 82. The buck power supply 528 includes the second switching converter 458, the second inductive element L2 and the first power filtering circuitry 82. The first switching converter 456 is the charge pump buck converter 84, which includes pulse width modulation (PWM) circuitry 534 and charge pump buck switching circuitry 536. The second switching converter 458 is the buck converter 86, which includes the PWM circuitry 534 and buck switching circuitry 538. As such, the charge pump buck converter 84 and the buck converter 86 share the PWM circuitry 534. Further, the charge pump buck power supply 526 and the buck power supply 528 share the PWM circuitry 534 and the first power filtering circuitry 82.

The first power filtering circuitry 82 includes an energy storage element 530 and third power filtering circuitry 532. In one embodiment of the energy storage element 530, the energy storage element 530 is the first capacitive element C1. The charge pump buck switching circuitry 536 includes the first output inductance node 460 and the buck switching circuitry 538 includes the second output inductance node 462. As such, the charge pump buck converter 84 has the first output inductance node 460 and the buck converter 86 has the second output inductance node 462. In this regard, the charge pump buck power supply 526 includes the charge pump buck converter 84, the first inductive element L1, and the energy storage element 530. The buck power supply 528 includes the buck converter 86, the second inductive element L2, and the energy storage element 530.

The first inductive element L1 is coupled between the first switching converter 456 and the energy storage element 530. The second inductive element L2 is coupled between the second switching converter 458 and the energy storage element 530. Specifically, the first inductive element L1 is coupled between the first output inductance node 460 and the energy storage element 530, and the second inductive element L2 is coupled between the second output inductance node 462 and the energy storage element 530. In this regard, the charge pump buck power supply 526 and the buck power supply 528 share the energy storage element 530. The charge pump buck converter 84 and the first inductive element L1 are coupled in series between the DC power supply 80 (FIG. 74) and the energy storage element 530. The buck converter 86 and the second inductive element L2 are coupled in series between the DC power supply 80 (FIG. 74) and the energy storage element 530.

As previously mentioned, in one embodiment of the first switching power supply 450, during the first converter operating mode, the charge pump buck power supply 526 receives and converts the DC power supply signal DCPS from the DC power supply 80 (FIG. 74) to provide the first switching power supply output signal FPSO to a load, such as the RF PA circuitry 30 (FIG. 6), based on a setpoint. During the first converter operating mode, the buck power supply 528 is disabled. During the second converter operating mode, the buck power supply 528 receives and converts the DC power supply signal DCPS from the DC power supply 80 (FIG. 74) to provide the first switching power supply output signal FPSO to the load, such as the RF PA circuitry 30 (FIG. 6), based on the setpoint. During the second converter operating mode, the charge pump buck power supply 526 is disabled. The setpoint is based on a desired voltage of the first switching power supply output signal FPSO.

During the first converter operating mode, the first inductive element L1 and the first capacitive element C1 form a lowpass filter, such that the charge pump buck switching circuitry 536 provides the first buck output signal FBO to the lowpass filter, which receives and filters the first buck output signal FBO to provide a filtered first buck output signal to the third power filtering circuitry 532. The third power filtering circuitry 532 receives and filters the filtered first buck output signal to provide the first switching power supply output signal FPSO. During the second converter operating mode, the second inductive element L2 and the first capacitive element C1 form a lowpass filter, such that the buck switching circuitry 538 provides the second buck output signal SBO to the lowpass filter, which receives and filters the second buck output signal SBO to provide a filtered second buck output signal to the third power filtering circuitry 532. The third power filtering circuitry 532 receives and filters the filtered second buck output signal to provide the first switching power supply output signal FPSO.

In one embodiment of the first switching power supply 450, selection of either the first converter operating mode or the second converter operating mode is based on a voltage of the DC power supply signal DCPS and the setpoint. As such, the first converter operating mode is selected when the desired voltage of the first switching power supply output signal FPSO is greater than the voltage of the DC power supply signal DCPS. In an alternate embodiment of the first switching power supply 450, selection of either the first converter operating mode or the second converter operating mode is based on the voltage of the DC power supply signal DCPS, the setpoint, and a load current of the load. As such, the second converter operating mode may be selected when the desired voltage of the first switching power supply output signal FPSO is less than the voltage of the DC power supply signal DCPS and the load current is less than a load current threshold. Selection of either the first converter operating mode or the second converter operating mode may be further based on maximizing efficiency.

In one embodiment of the first switching power supply 450, the control circuitry 42 (FIG. 6) provides the setpoint to the DC-DC control circuitry 90 (FIG. 74), which selects either the first converter operating mode or the second converter operating mode. As such, the DC configuration control signal DCC (FIG. 6) is based on the setpoint. In an alternate embodiment of the first switching power supply 450, the control circuitry 42 (FIG. 6) selects either the first converter operating mode or the second converter operating mode and provides the setpoint and the selection of either the first converter operating mode or the second converter operating mode to the DC-DC control circuitry 90 (FIG. 74). As such, the DC configuration control signal DCC (FIG. 6) is based on the setpoint and the selection of either the first converter operating mode or the second converter operating mode. Further, the DC-DC control circuitry 90 (FIG. 74) provides the first power supply control signal FPCS to the first switching power supply 450. As such, the first power supply control signal FPCS is based on the setpoint and the selection of either the first converter operating mode or the second converter operating mode.

The PWM circuitry 534 receives the setpoint and the first switching power supply output signal FPSO. The PWM circuitry 534 provides a PWM signal PWMS to the charge pump buck switching circuitry 536 and the buck switching circuitry 538 based on a difference between the setpoint and the first switching power supply output signal FPSO. The PWM signal PWMS has a duty-cycle based on the difference between the setpoint and the first switching power supply output signal FPSO. During the first converter operating mode, a duty-cycle of the charge pump buck switching circuitry 536 is based on the duty-cycle of the PWM signal PWMS. During the second converter operating mode, a duty-cycle of the buck switching circuitry 538 is based on the duty-cycle of the PWM signal PWMS. In this regard, during the first converter operating mode, the PWM circuitry 534, the charge pump buck switching circuitry 536, the first inductive element L1, the first capacitive element C1, and the third power filtering circuitry 532 form a control loop to regulate the first switching power supply output signal FPSO based on the setpoint. Similarly, during the second converter operating mode, the PWM circuitry 534, the buck switching circuitry 538, the second inductive element L2, the first capacitive element C1, and the third power filtering circuitry 532 form a control loop to regulate the first switching power supply output signal FPSO based on the setpoint.

In one embodiment of the charge pump buck power supply 526 and the buck power supply 528, the buck power supply 528 at the second output inductance node 462 is voltage compatible with the charge pump buck power supply 526 at the first output inductance node 460. Such voltage compatibility between the charge pump buck power supply 526 and the buck power supply 528 provides flexibility and may allow the charge pump buck converter 84 and the buck converter 86 to be used in different configurations. One example of a different configuration is the elimination of the second inductive element L2, such that the first output inductance node 460 is directly coupled to the second output inductance node 462.

As previously mentioned, the first switching power supply 450 receives and converts the DC power supply signal DCPS to provide the first switching power supply output signal FPSO based on the setpoint. The first switching power supply 450 includes the first switching converter 456, the first inductive element L1, the energy storage element 530, and switching control circuitry. A portion of charge pump buck switching control circuitry 540 (FIG. 92), a portion of buck switching control circuitry 544 (FIG. 92), or both provides the switching control circuitry. In one embodiment of the DC-DC converter 32 (FIG. 74), the DC-DC control circuitry 90 (FIG. 74) provides indication of selection of one of the CCM and the DCM to the first switching power supply 450 via the first power supply control signal FPCS. The selection of the one of the CCM and the DCM is based on a rate of change of the setpoint. During the CCM, the switching control circuitry allows energy to flow from the energy storage element 530 to the first inductive element L1. During the DCM, the switching control circuitry does not allow energy to flow from the energy storage element 530 to the first inductive element L1. The rate of change of the setpoint may be a negative rate of change of the setpoint.

The first inductive element L1 has a first inductive element current IL1, which is positive when energy flows from the first inductive element L1 to the energy storage element 530, and is negative when energy flows from the energy storage element 530 to the first inductive element L1. In one embodiment of the DC-DC converter 32 (FIG. 74), the control circuitry 42 (FIG. 6) provides the setpoint to the DC-DC control circuitry 90 (FIG. 74) via the envelope control signal ECS (FIG. 6) and the DC-DC control circuitry 90 (FIG. 74) makes the selection of the one of the CCM and the DCM. In an alternate embodiment of the DC-DC converter 32 (FIG. 74), the control circuitry 42 (FIG. 6) provides the setpoint to the DC-DC control circuitry 90 (FIG. 74) via the envelope control signal ECS (FIG. 6), and the control circuitry 42 (FIG. 6) makes the selection of the one of the CCM and the DCM and provides indication of the selection to the DC-DC control circuitry 90 (FIG. 74) via the DC configuration control signal DCC (FIG. 6). As such, the DC configuration control signal DCC (FIG. 6) is based on the selection of the one of the CCM and the DCM.

In one embodiment of the DC-DC converter 32 (FIG. 74), during the first converter operating mode and during the CCM, the switching control circuitry allows energy to flow from the energy storage element 530 to the first inductive element L1. During the first converter operating mode and during the DCM, the switching control circuitry does not allow energy to flow from the energy storage element 530 to the first inductive element L1. During the second converter operating mode and during the CCM, the switching control circuitry allows energy to flow from the energy storage element 530 to the second inductive element L2. During the second converter operating mode and during the DCM, the switching control circuitry does not allow energy to flow from the energy storage element 530 to the second inductive element L2.

Parallel Charge Pump Buck and Buck Power Supplies

A summary of parallel charge pump buck and buck power supplies is followed by a summary of shared shunt switching element charge pump buck and buck power supplies. Then, a detailed description of the parallel charge pump buck and buck power supplies is presented according to one embodiment of the present disclosure. The present disclosure relates to a DC-DC converter, which includes a charge pump buck power supply coupled in parallel with a buck power supply. The charge pump buck power supply includes a charge pump buck converter, a first inductive element, and an energy storage element. The charge pump buck converter and the first inductive element are coupled in series between a DC power supply, such as a battery, and the energy storage element. The buck power supply includes a buck converter, the first inductive element, and the energy storage element. The buck converter is coupled across the charge pump buck converter. As such, the charge pump buck power supply and the buck power supply share the first inductive element and the energy storage element. Only one of the charge pump buck power supply and the buck power supply is active at any one time. As such, either the charge pump buck power supply or the buck power supply receives and converts a DC power supply signal from the DC power supply to provide a first switching power supply output signal to a load based on a setpoint. In one embodiment of the energy storage element, the energy storage element is a capacitive element.

The charge pump buck converter combines the functionality of a charge pump with the functionality of a buck converter. However, the charge pump buck converter uses fewer switching elements than a separate charge pump and buck converter by using common switching elements for both charge pump and buck converter functionalities. As such, the charge pump buck power supply is capable of providing an output voltage that is greater than a voltage of the DC power supply signal. Conversely, the buck power supply is only capable of providing an output voltage that is about equal to or less than the voltage of the DC power supply signal. In one embodiment of the DC-DC converter, during a first converter operating mode, the charge pump buck power supply receives and converts the DC power supply signal to provide the first switching power supply output signal, and the buck power supply is disabled. During a second converter operating mode, the buck power supply receives and converts the DC power supply signal to provide the first switching power supply output signal, and the charge pump buck power supply is disabled. The setpoint is based on a desired voltage of the first switching power supply output signal.

In one embodiment of the DC-DC converter, selection of either the first converter operating mode or the second converter operating mode is based on a voltage of the DC power supply signal and the setpoint. The first converter operating mode is selected when the desired voltage of the first switching power supply output signal is greater than the voltage of the DC power supply signal. In one embodiment of the DC-DC converter, selection of either the first converter operating mode or the second converter operating mode is further based on a load current of the load. The second converter operating mode is selected when the desired voltage of the first switching power supply output signal is less than the voltage of the DC power supply signal and the load current is less than a load current threshold.

In a first exemplary embodiment of the DC-DC converter, selection of either the first converter operating mode or the second converter operating mode is further based on maximizing efficiency of the DC-DC converter. In a second exemplary embodiment of the DC-DC converter, selection of either the first converter operating mode or the second converter operating mode is further based on exceeding a minimum acceptable efficiency of the DC-DC converter. In a third exemplary embodiment of the DC-DC converter, selection of either the first converter operating mode or the second converter operating mode is further based on exceeding a desired efficiency of the DC-DC converter. In one embodiment of the DC-DC converter, the DC-DC converter further includes a charge pump, which receives and converts the DC power supply signal to provide a second switching power supply output signal. In one embodiment of the DC-DC converter, the first switching power supply output signal is an envelope power supply signal for a first RF power amplifier (PA) and the second switching power supply output signal is a bias power supply signal used for biasing the first RF PA.

In one embodiment the DC-DC converter, the charge pump buck converter has a first output inductance node and the buck converter has a second output inductance node, which is coupled to the first output inductance node. The first inductive element is coupled between the first output inductance node and the energy storage element. During the first converter operating mode, the charge pump buck converter may boost the voltage of the DC power supply signal significantly, such that a voltage at the second output inductance node may be significantly higher than the voltage of the DC power supply signal. As a result, even though the buck converter is disabled during the first converter operating mode, the buck converter must be able to withstand the boosted voltage at the second output inductance node. In an exemplary embodiment of the DC-DC converter, the voltage at the second output inductance node is equal to about 11 volts and a breakdown voltage of individual switching elements in the buck converter is equal to about 7 volts.

To withstand boosted voltage at the second output inductance node, in one embodiment of the buck converter, the buck converter includes multiple shunt buck switching elements and multiple series buck switching elements. The shunt buck switching elements are coupled in series between the second output inductance node and a ground, and the series buck switching elements are coupled in series between the DC power supply and the second output inductance node. In one embodiment of the buck converter, the series buck switching elements are configured in a cascode arrangement. In an exemplary embodiment of the buck converter, the buck converter includes two shunt buck switching elements coupled in series between the second output inductance node and the ground, and the buck converter includes two series buck switching elements coupled in series between the DC power supply and the second output inductance node.

Shared Shunt Switching Element Charge Pump Buck and Buck Only Power Supplies A summary of shared shunt switching element charge pump buck and buck power supplies is followed by a detailed description of the shared shunt switching element charge pump buck and buck power supplies according to one embodiment of the present disclosure. The present disclosure relates to a DC-DC converter, which includes a charge pump buck power supply and a buck power supply. The charge pump buck power supply includes a first output inductance node, a first inductive element, an energy storage element, and at least a first shunt pump buck switching element. The first inductive element is coupled between the first output inductance node and the energy storage element. The first shunt pump buck switching element is coupled between the first output inductance node and a ground. The buck power supply includes a second output inductance node, the first inductive element, the energy storage element, and the first shunt pump buck switching element. As such, the charge pump buck power supply and the buck power supply share the first inductive element, the energy storage element, and the first shunt pump buck switching element. Only one of the charge pump buck power supply and the buck power supply is active at any one time. As such, either the charge pump buck power supply or the buck power supply receives and converts a DC power supply signal from a DC power supply to provide a first switching power supply output signal to a load based on a setpoint. In one embodiment of the energy storage element, the energy storage element is a capacitive element.

The charge pump buck power supply combines the functionality of a charge pump with the functionality of a buck converter. However, the charge pump buck power supply uses fewer switching elements than a separate charge pump and buck converter by using common switching elements for both charge pump and buck converter functionalities. As such, the charge pump buck power supply is capable of providing an output voltage that is greater than a voltage of the DC power supply signal. Conversely, the buck power supply is only capable of providing an output voltage that is about equal to or less than the voltage of the DC power supply signal. In one embodiment of the DC-DC converter, during a first converter operating mode, the charge pump buck power supply receives and converts the DC power supply signal to provide the first switching power supply output signal, and the buck power supply is disabled. During a second converter operating mode, the buck power supply receives and converts the DC power supply signal to provide the first switching power supply output signal, and the charge pump buck power supply is disabled. The setpoint is based on a desired voltage of the first switching power supply output signal.

In one embodiment of the DC-DC converter, selection of either the first converter operating mode or the second converter operating mode is based on a voltage of the DC power supply signal and the setpoint. The first converter operating mode is selected when the desired voltage of the first switching power supply output signal is greater than the voltage of the DC power supply signal. In one embodiment of the DC-DC converter, selection of either the first converter operating mode or the second converter operating mode is further based on a load current of the load. The second converter operating mode is selected when the desired voltage of the first switching power supply output signal is less than the voltage of the DC power supply signal and the load current is less than a load current threshold.

In a first exemplary embodiment of the DC-DC converter, selection of either the first converter operating mode or the second converter operating mode is further based on maximizing efficiency of the DC-DC converter. In a second exemplary embodiment of the DC-DC converter, selection of either the first converter operating mode or the second converter operating mode is further based on exceeding a minimum acceptable efficiency of the DC-DC converter. In a third exemplary embodiment of the DC-DC converter, selection of either the first converter operating mode or the second converter operating mode is further based on exceeding a desired efficiency of the DC-DC converter. In one embodiment of the DC-DC converter, the DC-DC converter further includes a charge pump, which receives and converts the DC power supply signal to provide a second switching power supply output signal. In one embodiment of the DC-DC converter, the first switching power supply output signal is an envelope power supply signal for a first RF power amplifier (PA) and the second switching power supply output signal is a bias power supply signal used for biasing the first RF PA.

During the first converter operating mode, the charge pump buck power supply may boost the voltage of the DC power supply signal significantly, such that a voltage at the first output inductance node may be significantly higher than the voltage of the DC power supply signal. As a result, even though the buck power supply is disabled during the first converter operating mode, the buck power supply must be able to withstand the boosted voltage at the second output inductance node. In an exemplary embodiment of the DC-DC converter, the voltage at the second output inductance node is equal to about 11 volts and a breakdown voltage of individual switching elements in the buck power supply is equal to about 7 volts.

FIG. 88 shows details of the first switching power supply 450 illustrated in FIG. 74 according to a further embodiment of the first switching power supply 450. The first switching power supply 450 illustrated in FIG. 88 is similar to the first switching power supply 450 illustrated in FIG. 87, except in the first switching power supply 450 illustrated in FIG. 88, the second inductive element L2 is coupled between the first output inductance node 460 and the second output inductance node 462. As such, the buck power supply 528 includes the second inductive element L2 and the charge pump buck power supply 526 and the buck power supply 528 share the first inductive element L1.

FIG. 89 shows details of the first switching power supply 450 illustrated in FIG. 75 according to an alternate embodiment of the first switching power supply 450. The first switching power supply 450 includes the charge pump buck power supply 526 and the buck power supply 528. The charge pump buck power supply 526 includes the first switching converter 456, the first inductive element L1, and the first power filtering circuitry 82. The buck power supply 528 includes the second switching converter 458, the first inductive element L1 and the first power filtering circuitry 82. The second switching converter 458 is coupled across the first switching converter 456. The first switching converter 456 is the charge pump buck converter 84, which includes the PWM circuitry 534 and the charge pump buck switching circuitry 536. The second switching converter 458 is the buck converter 86, which includes the PWM circuitry 534 and the buck switching circuitry 538. As such, the charge pump buck converter 84 and the buck converter 86 share the PWM circuitry 534. Further, the charge pump buck power supply 526 and the buck power supply 528 share the PWM circuitry 534, the first inductive element L1, and the first power filtering circuitry 82.

The first power filtering circuitry 82 includes the energy storage element 530 and the third power filtering circuitry 532. In one embodiment of the energy storage element 530, the energy storage element 530 is the first capacitive element C1. The charge pump buck switching circuitry 536 includes the first output inductance node 460 and the buck switching circuitry 538 includes the second output inductance node 462. The first output inductance node 460 is coupled to the second output inductance node 462. As such, the charge pump buck converter 84 has the first output inductance node 460 and the buck converter 86 has the second output inductance node 462. In this regard, the charge pump buck power supply 526 includes the charge pump buck converter 84, the first inductive element L1, and the energy storage element 530. The buck power supply 528 includes the buck converter 86, the first inductive element L1, and the energy storage element 530. As such, the charge pump buck power supply 526 and the buck power supply 528 share the first inductive element L1 and the energy storage element 530.

The first inductive element L1 is coupled between the first output inductance node 460 and the energy storage element 530. Further, the first inductive element L1 is coupled between the second output inductance node 462 and the energy storage element 530. The charge pump buck converter 84 and the first inductive element L1 are coupled in series between the DC power supply 80 (FIG. 74) and the energy storage element 530. The buck converter 86 and the first inductive element L1 are coupled in series between the DC power supply 80 (FIG. 74) and the energy storage element 530. The buck converter 86 is coupled across the charge pump buck converter 84.

As previously mentioned, in one embodiment of the first switching power supply 450, during the first converter operating mode, the charge pump buck power supply 526 receives and converts the DC power supply signal DCPS from the DC power supply 80 (FIG. 74) to provide the first switching power supply output signal FPSO to a load, such as the RF PA circuitry 30 (FIG. 6), based on a setpoint. During the first converter operating mode, the buck power supply 528 is disabled. During the second converter operating mode, the buck power supply 528 receives and converts the DC power supply signal DCPS from the DC power supply 80 (FIG. 74) to provide the first switching power supply output signal FPSO to the load, such as the RF PA circuitry 30 (FIG. 6), based on the setpoint. During the second converter operating mode, the charge pump buck power supply 526 is disabled. The setpoint is based on a desired voltage of the first switching power supply output signal FPSO.

During the first converter operating mode, the first inductive element L1 and the first capacitive element C1 form a lowpass filter, such that the charge pump buck switching circuitry 536 provides the first buck output signal FBO to the lowpass filter, which receives and filters the first buck output signal FBO to provide a filtered first buck output signal to the third power filtering circuitry 532. The third power filtering circuitry 532 receives and filters the filtered first buck output signal to provide the first switching power supply output signal FPSO. During the second converter operating mode, the first inductive element L1 and the first capacitive element C1 form the lowpass filter, such that the buck switching circuitry 538 provides the second buck output signal SBO to the lowpass filter, which receives and filters the second buck output signal SBO to provide a filtered second buck output signal to the third power filtering circuitry 532. The third power filtering circuitry 532 receives and filters the filtered second buck output signal to provide the first switching power supply output signal FPSO.

In one embodiment of the first switching power supply 450, selection of either the first converter operating mode or the second converter operating mode is based on a voltage of the DC power supply signal DCPS and the setpoint. As such, the first converter operating mode is selected when the desired voltage of the first switching power supply output signal FPSO is greater than the voltage of the DC power supply signal DCPS. In an alternate embodiment of the first switching power supply 450, selection of either the first converter operating mode or the second converter operating mode is based on the voltage of the DC power supply signal DCPS, the setpoint, and a load current of the load. As such, the second converter operating mode may be selected when the desired voltage of the first switching power supply output signal FPSO is less than the voltage of the DC power supply signal DCPS and the load current is less than a load current threshold. Selection of either the first converter operating mode or the second converter operating mode may be further based on maximizing efficiency.

In one embodiment of the first switching power supply 450, the control circuitry 42 (FIG. 6) provides the setpoint to the DC-DC control circuitry 90 (FIG. 74), which selects either the first converter operating mode or the second converter operating mode. As such, the DC configuration control signal DCC (FIG. 6) is based on the setpoint. In an alternate embodiment of the first switching power supply 450, the control circuitry 42 (FIG. 6) selects either the first converter operating mode or the second converter operating mode and provides the setpoint and the selection of either the first converter operating mode or the second converter operating mode to the DC-DC control circuitry 90 (FIG. 74). As such, the DC configuration control signal DCC (FIG. 6) is based on the setpoint and the selection of either the first converter operating mode or the second converter operating mode. Further, the DC-DC control circuitry 90 (FIG. 74) provides the first power supply control signal FPCS to the first switching power supply 450. As such, the first power supply control signal FPCS is based on the setpoint and the selection of either the first converter operating mode or the second converter operating mode.

The PWM circuitry 534 receives the setpoint and the first switching power supply output signal FPSO. The PWM circuitry 534 provides the PWM signal PWMS to the charge pump buck switching circuitry 536 and the buck switching circuitry 538 based on a difference between the setpoint and the first switching power supply output signal FPSO. The PWM signal PWMS has a duty-cycle based on the difference between the setpoint and the first switching power supply output signal FPSO. During the first converter operating mode, a duty-cycle of the charge pump buck switching circuitry 536 is based on the duty-cycle of the PWM signal PWMS. During the second converter operating mode, a duty-cycle of the buck switching circuitry 538 is based on the duty-cycle of the PWM signal PWMS. In this regard, during the first converter operating mode, the PWM circuitry 534, the charge pump buck switching circuitry 536, the first inductive element L1, the first capacitive element C1, and the third power filtering circuitry 532 form a control loop to regulate the first switching power supply output signal FPSO based on the setpoint. Similarly, during the second converter operating mode, the PWM circuitry 534, the buck switching circuitry 538, the first inductive element L1, the first capacitive element C1, and the third power filtering circuitry 532 form a control loop to regulate the first switching power supply output signal FPSO based on the setpoint.

FIG. 90 shows details of the first switching power supply 450 illustrated in FIG. 74 according to an additional embodiment of the first switching power supply 450. The first switching power supply 450 illustrated in FIG. 90 is similar to the first switching power supply 450 illustrated in FIG. 87, except the first switching power supply 450 illustrated in FIG. 90 is the PA envelope power supply 280. The first switching power supply output signal FPSO is the envelope power supply signal EPS. The first power supply control signal FPCS provides the charge pump buck control signal CPBS and the buck control signal BCS. The first power supply status signal FPSS is the envelope power supply status signal EPSS.

FIG. 91 shows details of the first switching power supply 450 illustrated in FIG. 75 according to another embodiment of the first switching power supply 450. The first switching power supply 450 illustrated in FIG. 91 is similar to the first switching power supply 450 illustrated in FIG. 89, except the first switching power supply 450 illustrated in FIG. 91 is the PA envelope power supply 280. The first switching power supply output signal FPSO is the envelope power supply signal EPS. The first power supply control signal FPCS provides the charge pump buck control signal CPBS and the buck control signal BCS. The first power supply status signal FPSS is the envelope power supply status signal EPSS.

DC-DC Converter Semiconductor Die Locations

A summary of DC-DC converter semiconductor die locations is followed by a summary of a DC-DC converter die structure. Then, a detailed description of the DC-DC converter semiconductor die locations is presented according to one embodiment of the present disclosure. The present disclosure relates to a DC-DC converter having a DC-DC converter semiconductor die, an alpha flying capacitive element, and a beta flying capacitive element. The DC-DC converter semiconductor die has a centerline axis, a pair of alpha flying capacitor connection nodes, and a pair of beta flying capacitor connection nodes. The pair of alpha flying capacitor connection nodes is located approximately symmetrical to the pair of beta flying capacitor connection nodes about the centerline axis. The alpha flying capacitive element is electrically coupled between the pair of alpha flying capacitor connection nodes. The beta flying capacitive element is electrically coupled between the pair of beta flying capacitor connection nodes. By locating the pair of alpha flying capacitor connection nodes approximately symmetrical to the pair of beta flying capacitor connection nodes, the alpha flying capacitive element may be located close to the pair of alpha flying capacitor connection nodes and the beta flying capacitive element may be located close to the pair of beta flying capacitor connection nodes. As such, lengths of transient current paths may be minimized, thereby reducing noise and potential interference.

DC-DC Converter Semiconductor Die Structure

A summary of a DC-DC converter semiconductor die structure is followed by a detailed description of the DC-DC converter semiconductor die structure according to one embodiment of the present disclosure. The present disclosure relates to a DC-DC converter having a DC-DC converter semiconductor die and an alpha flying capacitive element. The DC-DC converter semiconductor die includes a first series alpha switching element, a second series alpha switching element, a first alpha flying capacitor connection node, which is about over the second series alpha switching element, and a second alpha flying capacitor connection node, which is about over the first series alpha switching element. The alpha flying capacitive element is electrically coupled between the first alpha flying capacitor connection node and the second alpha flying capacitor connection node. By locating the first alpha flying capacitor connection node and the second alpha flying capacitor connection node about over the second series alpha switching element and the first series alpha switching element, respectively, lengths of transient current paths may be minimized, thereby reducing noise and potential interference.

FIG. 92 shows details of the charge pump buck switching circuitry 536 and the buck switching circuitry 538 illustrated in FIG. 87 according to one embodiment of the charge pump buck switching circuitry 536 and the buck switching circuitry 538. The charge pump buck switching circuitry 536 includes charge pump buck switching control circuitry 540 and a charge pump buck switch circuit 542. During the first converter operating mode, the charge pump buck switching control circuitry 540 receives the PWM signal PWMS and provides a first shunt pump buck control signal PBN1, a second shunt pump buck control signal PBN2, an alpha charging control signal ACCS, a beta charging control signal BCCS, an alpha discharging control signal ADCS, and a beta discharging control signal BDCS to the charge pump buck switch circuit 542 based on the PWM signal PWMS. The charge pump buck switch circuit 542 has the first output inductance node 460 and receives the DC power supply signal DCPS. During the first converter operating mode, the charge pump buck switch circuit 542 provides the first buck output signal FBO via the first output inductance node 460 based on the DC power supply signal DCPS, the first shunt pump buck control signal PBN1, the second shunt pump buck control signal PBN2, the alpha charging control signal ACCS, the beta charging control signal BCCS, the alpha discharging control signal ADCS, and the beta discharging control signal BDCS.

The buck switching circuitry 538 includes buck switching control circuitry 544 and a buck switch circuit 546. The buck switch circuit 546 includes a first portion 548 of a DC-DC converter semiconductor die 550. The first portion 548 of the DC-DC converter semiconductor die 550 includes a beta inductive element connection node 552, a first shunt buck switching element 554, a second shunt buck switching element 556, a first series buck switching element 558, and a second series buck switching element 560. The buck switch circuit 546 has the second output inductance node 462. The first shunt buck switching element 554, the second shunt buck switching element 556, the first series buck switching element 558, and the second series buck switching element 560 are coupled in series between the DC power supply 80 (FIG. 74) and a ground. When the second series buck switching element 560 is ON, the second series buck switching element 560 has a series buck current ISK. A first buck sample signal SSK1 and a second buck sample signal SSK2 are used for measuring a voltage across the second series buck switching element 560.

In one embodiment of the buck switch circuit 546, the first shunt buck switching element 554 is an NMOS transistor element, the second shunt buck switching element 556 is an NMOS transistor element, the first series buck switching element 558 is a PMOS transistor element, and the second series buck switching element 560 is a PMOS transistor element. A source of the second series buck switching element 560 is coupled to the DC power supply 80 (FIG. 74). A drain of the second series buck switching element 560 is coupled to a source of the first series buck switching element 558. A drain of the first series buck switching element 558 is coupled to a drain of the second shunt buck switching element 556, to the beta inductive element connection node 552, and to the second output inductance node 462. A source of the second shunt buck switching element 556 is coupled to a drain of the first shunt buck switching element 554. A source of the first shunt buck switching element 554 is coupled to the ground. A gate of the second series buck switching element 560 is coupled to the ground.

During the second converter operating mode, the buck switching control circuitry 544 receives the PWM signal PWMS and provides a first shunt buck control signal BN1, a second shunt buck control signal BN2, and a first series buck control signal BS1 based on the PWM signal PWMS. A gate of the first shunt buck switching element 554 receives the first shunt buck control signal BN1. A gate of the second shunt buck switching element 556 receives the second shunt buck control signal BN2. A gate of the first series buck switching element 558 receives the first series buck control signal BS1. As such, the first shunt buck switching element 554, the second shunt buck switching element 556, the first series buck switching element 558, and the second series buck switching element 560 provide the second buck output signal SBO via the beta inductive element connection node 552 and the second output inductance node 462 based on the first shunt buck control signal BN1, the second shunt buck control signal BN2, and the first series buck control signal BS1.

During the second converter operating mode, the PWM signal PWMS has a series phase 602 (FIG. 95A) and a shunt phase 604 (FIG. 95A). During the series phase 602 (FIG. 95A) of the second converter operating mode, the first series buck switching element 558 and the second series buck switching element 560 are both ON, and the first shunt buck switching element 554 and the second shunt buck switching element 556 are both OFF. As such, the DC power supply signal DCPS is forwarded via the first series buck switching element 558 and the second series buck switching element 560 to provide the second buck output signal SBO. During the shunt phase 604 (FIG. 95A) of the second converter operating mode, the first series buck switching element 558 is OFF, and the first shunt buck switching element 554 and the second shunt buck switching element 556 are both ON. As such, the beta inductive element connection node 552 and the second output inductance node 462 are coupled to the ground via the first shunt buck switching element 554 and the second shunt buck switching element 556 to provide the second buck output signal SBO.

For the buck power supply 528 (FIG. 87) to be voltage compatible with the charge pump buck power supply 526 (FIG. 87), the buck power supply 528 (FIG. 87) must not be damaged or function improperly in the presence of a voltage at the second output inductance node 462 that is equivalent to a voltage at the first output inductance node 460 during normal operation of the charge pump buck power supply 526 (FIG. 87). In an exemplary embodiment of the DC-DC converter 32 (FIG. 74), the voltage at the first output inductance node 460 may be as high as about 11 volts and a breakdown voltage of each of the first shunt buck switching element 554, the second shunt buck switching element 556, the first series buck switching element 558, and the second series buck switching element 560 is equal to about 7 volts. Therefore, the first shunt buck switching element 554 and the second shunt buck switching element 556 are cascaded in series to handle the high voltage at the first output inductance node 460. Further, the first series buck switching element 558 and the second series buck switching element 560 are cascaded in series to handle the high voltage at the first output inductance node 460.

In general, the buck converter 86 (FIG. 87) has a group of shunt buck switching elements coupled in series between the second output inductance node 462 and the ground. The group of shunt buck switching elements includes the first shunt buck switching element 554 and the second shunt buck switching element 556. The buck converter 86 (FIG. 87) has a group of series buck switching elements coupled in series between the DC power supply 80 (FIG. 74) and the second output inductance node 462. The group of series buck switching elements includes the first series buck switching element 558 and the second series buck switching element 560. In one embodiment of the buck converter 86 (FIG. 87), the first series buck switching element 558 and the second series buck switching element 560 are configured in a cascode arrangement. In general, the group of series buck switching elements may be configured in a cascode arrangement.

FIG. 93 shows details of the charge pump buck switching circuitry 536 and the buck switching circuitry 538 illustrated in FIG. 87 according to an alternate embodiment of the buck switching circuitry 538. The buck switching circuitry 538 illustrated in FIG. 93 is similar to the buck switching circuitry 538 illustrated in FIG. 92, except in the buck switching circuitry 538 illustrated in FIG. 93, the second shunt buck switching element 556 and the second series buck switching element 560 are omitted. As such, the first series buck switching element 558 is coupled between the DC power supply 80 (FIG. 74) and the second output inductance node 462. In one embodiment of the buck switching circuitry 538, only the first series buck switching element 558 is coupled between the DC power supply 80 (FIG. 74) and the second output inductance node 462. Further, the first shunt buck switching element 554 is coupled between the second output inductance node 462 and the ground. In one embodiment of the buck switching circuitry 538, only the first shunt buck switching element 554 is coupled between the second output inductance node 462 and the ground.

FIG. 94 shows details of the charge pump buck switch circuit 542 illustrated in FIG. 92 according to one embodiment of the charge pump buck switch circuit 542. The charge pump buck switch circuit 542 includes a second portion 562 of the DC-DC converter semiconductor die 550 (FIG. 92), an alpha flying capacitive element CAF, a beta flying capacitive element CBF, an alpha decoupling capacitive element CAD, and a beta decoupling capacitive element CBD.

The second portion 562 of the DC-DC converter semiconductor die 550 (FIG. 92) has an alpha inductive element connection node 564, a first alpha flying capacitor connection node 566, a second alpha flying capacitor connection node 568, a first beta flying capacitor connection node 570, a second beta flying capacitor connection node 572, an alpha decoupling connection node 574, a beta decoupling connection node 576, an alpha ground connection node 578, and a beta ground connection node 580. Additionally, the second portion 562 of the DC-DC converter semiconductor die 550 (FIG. 92) includes a first shunt pump buck switching element 582, a second shunt pump buck switching element 584, a first alpha charging switching element 586, a first beta charging switching element 588, a second alpha charging switching element 590, a second beta charging switching element 592, a first series alpha switching element 594, a first series beta switching element 596, a second series alpha switching element 598, and a second series beta switching element 600.

When the second series alpha switching element 598 is ON, the second series alpha switching element 598 has a series alpha current ISA. When the second series beta switching element 600 is ON, the second series beta switching element 600 has a series beta current ISB. A first alpha sample signal SSA1 and a second alpha sample signal SSA2 are used for measuring a voltage across the second series alpha switching element 598. A first beta sample signal SSB1 and a second beta sample signal SSB2 are used for measuring a voltage across the second series beta switching element 600.

In one embodiment of the charge pump buck switch circuit 542, the first shunt pump buck switching element 582 is an NMOS transistor element, the second shunt pump buck switching element 584 is an NMOS transistor element, the first alpha charging switching element 586 is an NMOS transistor element, the first beta charging switching element 588 is an NMOS transistor element, the second alpha charging switching element 590 is an NMOS transistor element, and the second beta charging switching element 592 is an NMOS transistor element. Further, the first series alpha switching element 594 is a PMOS transistor element, the first series beta switching element 596 is a PMOS transistor element, the second series alpha switching element 598 is a PMOS transistor element, and the second series beta switching element 600 is a PMOS transistor element.

A source of the first shunt pump buck switching element 582 is coupled to a ground. A drain of the first shunt pump buck switching element 582 is coupled to a source of the second shunt pump buck switching element 584. A drain of the second shunt pump buck switching element 584 is coupled to the alpha inductive element connection node 564. A source of the first alpha charging switching element 586 is coupled to the alpha ground connection node 578 and to the ground. A drain of the first alpha charging switching element 586 is coupled to a first terminal of the first series alpha switching element 594 and to the second alpha flying capacitor connection node 568. A second terminal of the first series alpha switching element 594 is coupled to a first terminal of the second alpha charging switching element 590 and to the alpha decoupling connection node 574. A second terminal of the second alpha charging switching element 590 is coupled to a first terminal of the second series alpha switching element 598, to a gate of the second beta charging switching element 592, to a gate of the second series beta switching element 600, and to the first alpha flying capacitor connection node 566. A second terminal of the second series alpha switching element 598 is coupled to a second terminal of the second series beta switching element 600, and to the alpha inductive element connection node 564.

A source of the first beta charging switching element 588 is coupled to the beta ground connection node 580 and to the ground. A drain of the first beta charging switching element 588 is coupled to a first terminal of the first series beta switching element 596 and to the second beta flying capacitor connection node 572. A second terminal of the first series beta switching element 596 is coupled to a first terminal of the second beta charging switching element 592 and to the beta decoupling connection node 576. A second terminal of the second beta charging switching element 592 is coupled to a first terminal of the second series beta switching element 600, to a gate of the second alpha charging switching element 590, to a gate of the second series alpha switching element 598, and to the first beta flying capacitor connection node 570. A body of the second series alpha switching element 598 is coupled to a CMOS well CWELL. A body of the second series beta switching element 600 is coupled to the CMOS well CWELL.

A gate of the first shunt pump buck switching element 582 receives the first shunt pump buck control signal PBN1. A gate of the second shunt pump buck switching element 584 receives the second shunt pump buck control signal PBN2. A gate of the first alpha charging switching element 586 receives the alpha charging control signal ACCS. A gate of the first beta charging switching element 588 receives the beta charging control signal BCCS. A gate of the first series alpha switching element 594 receives the alpha discharging control signal ADCS. A gate of the first series beta switching element 596 receives the beta discharging control signal BDCS.

A first end of the alpha flying capacitive element CAF is coupled to the second alpha flying capacitor connection node 568. A second end of the alpha flying capacitive element CAF is coupled to the first alpha flying capacitor connection node 566. A first end of the beta flying capacitive element CBF is coupled to the second beta flying capacitor connection node 572. A second end of the beta flying capacitive element CBF is coupled to the first beta flying capacitor connection node 570. A first end of the alpha decoupling capacitive element CAD is coupled to the alpha decoupling connection node 574 and to an output from the DC power supply 80. A first end of the beta decoupling capacitive element CBD is coupled to the beta decoupling connection node 576 and to the output from the DC power supply 80. A second end of the alpha decoupling capacitive element CAD is coupled to the alpha ground connection node 578 and to a ground of the DC power supply 80. A second end of the beta decoupling capacitive element CBD is coupled to the beta ground connection node 580 and to the ground of the DC power supply 80.

The alpha decoupling capacitive element CAD may be tightly coupled to the alpha decoupling connection node 574 and to the alpha ground connection node 578 to maximize decoupling and to minimize the length of transient current paths. The beta decoupling capacitive element CBD may be tightly coupled to the beta decoupling connection node 576 and the beta ground connection node 580 to maximize decoupling and to minimize the length of transient current paths. The alpha flying capacitive element CAF may be tightly coupled to the first alpha flying capacitor connection node 566 and to the second alpha flying capacitor connection node 568 to minimize the length of transient current paths. The beta flying capacitive element CBF may be tightly coupled to the first beta flying capacitor connection node 570 and to the second beta flying capacitor connection node 572 to minimize the length of transient current paths.

During the first converter operating mode, the PWM signal PWMS has an alpha series phase 606 (FIG. 95B), an alpha shunt phase 608 (FIG. 95B), a beta series phase 610 (FIG. 95B), and a beta shunt phase 612 (FIG. 95B). During the alpha series phase 606 (FIG. 95B) and the alpha shunt phase 608 (FIG. 95B), the alpha flying capacitive element CAF is coupled to the DC power supply 80 to be recharged. During the beta series phase 610 (FIG. 95B), the alpha flying capacitive element CAF is coupled to the first output inductance node 460 to provide current to the first inductive element L1 (FIG. 87). During the beta shunt phase 612 (FIG. 95B), the alpha flying capacitive element CAF is disconnected and the first shunt pump buck switching element 582 and the second shunt pump buck switching element 584 are both ON to provide current to the first inductive element L1 (FIG. 87). Further, during the beta series phase 610 (FIG. 95B) and the beta shunt phase 612 (FIG. 95B), the beta flying capacitive element CBF is coupled to the DC power supply 80 to be recharged. During the alpha series phase 606 (FIG. 95B), the beta flying capacitive element CBF is coupled to the first output inductance node 460 to provide current to the first inductive element L1 (FIG. 87). During the alpha shunt phase 608 (FIG. 95B), the beta flying capacitive element CBF is disconnected and the first shunt pump buck switching element 582 and the second shunt pump buck switching element 584 are both ON to provide current to the first inductive element L1 (FIG. 87).

In this regard, during the alpha series phase 606 (FIG. 95B), the first alpha charging switching element 586, the second alpha charging switching element 590, the first series beta switching element 596, and the second series beta switching element 600 are ON; and the first series alpha switching element 594, the second series alpha switching element 598, the first beta charging switching element 588, the second beta charging switching element 592, the first shunt pump buck switching element 582, and the second shunt pump buck switching element 584 are OFF.

During the alpha shunt phase 608 (FIG. 95B), the first alpha charging switching element 586, the second alpha charging switching element 590, the first shunt pump buck switching element 582, and the second shunt pump buck switching element 584 are ON; and the first series alpha switching element 594, the second series alpha switching element 598, the first beta charging switching element 588, the first series beta switching element 596, the second beta charging switching element 592, and the second series beta switching element 600 are OFF.

During the beta series phase 610 (FIG. 95B), the first beta charging switching element 588, the second beta charging switching element 592, the first series alpha switching element 594, and the second series alpha switching element 598 are ON, and the first series beta switching element 596, the second series beta switching element 600, the first alpha charging switching element 586, the second alpha charging switching element 590, the first shunt pump buck switching element 582, and the second shunt pump buck switching element 584 are OFF.

During the beta shunt phase 612 (FIG. 95B), the first beta charging switching element 588, the second beta charging switching element 592, the first shunt pump buck switching element 582, and the second shunt pump buck switching element 584 are ON, and the first series beta switching element 596, the second series beta switching element 600, the first alpha charging switching element 586, the second alpha charging switching element 590, the first series alpha switching element 594, and the second series alpha switching element 598 are OFF.

In general, the charge pump buck converter 84 (FIG. 87) has a group of shunt pump buck switching elements coupled in series between the first output inductance node 460 and the ground. The group of shunt pump buck switching elements includes the first shunt pump buck switching element 582 and the second shunt pump buck switching element 584. The charge pump buck converter 84 (FIG. 87) has an alpha group of series pump buck switching elements coupled in series between the DC power supply 80 (FIG. 74) and the first output inductance node 460 through the alpha flying capacitive element CAF. The alpha group of series pump buck switching elements includes the first series alpha switching element 594 and the second series alpha switching element 598. Further, the charge pump buck converter 84 (FIG. 87) has a beta group of series pump buck switching elements coupled in series between the DC power supply 80 (FIG. 74) and the first output inductance node 460 through the beta flying capacitive element CBF. The beta group of series pump buck switching elements includes the first series beta switching element 596 and the second series beta switching element 600.

FIG. 95A and FIG. 95B are graphs of the PWM signal PWMS of the first switching power supply 450 illustrated in FIG. 87 according to one embodiment of the first switching power supply 450 (FIG. 87). FIG. 95A shows the PWM signal PWMS during the second converter operating mode of the first switching power supply 450 (FIG. 87). The PWM signal PWMS alternates between the series phase 602 and the shunt phase 604. FIG. 95B shows the PWM signal PWMS during the first converter operating mode of the first switching power supply 450 (FIG. 87). The PWM signal PWMS has the alpha series phase 606, which is followed by the alpha shunt phase 608, which is followed by the beta series phase 610, which is followed by the beta shunt phase 612, which is followed by the alpha series phase 606, and so on.

FIG. 96 shows details of the charge pump buck switching circuitry 536 and the buck switching circuitry 538 illustrated in FIG. 89 according to an additional embodiment of the buck switching circuitry 538. The buck switching circuitry 538 illustrated in FIG. 96 is similar to the buck switching circuitry 538 illustrated in FIG. 92, except in the buck switching circuitry 538 illustrated in FIG. 96, the first shunt buck switching element 554 (FIG. 92) and the second shunt buck switching element 556 (FIG. 92) are omitted. Instead of using the first shunt buck switching element 554 (FIG. 92) and the second shunt buck switching element 556 (FIG. 96), the buck power supply 528 (FIG. 89) shares the first shunt pump buck switching element 582 (FIG. 94) and the second shunt pump buck switching element 584 (FIG. 94) with the charge pump buck power supply 526 (FIG. 89).

As such, the charge pump buck power supply 526 (FIG. 89) includes the first output inductance node 460 (FIG. 89), the first inductive element L1 (FIG. 89), and at least the first shunt pump buck switching element 582 (FIG. 94). The buck power supply 528 (FIG. 89) includes the second output inductance node 462, the first inductive element L1 (FIG. 89), and at least the first shunt pump buck switching element 582 (FIG. 94). The second output inductance node 462 is coupled to the first output inductance node 460. The first inductive element L1 (FIG. 89) is coupled between the first output inductance node 460 (FIG. 89) and the energy storage element 530 (FIG. 89). The first shunt pump buck switching element 582 (FIG. 94) is coupled between the first output inductance node 460 (FIG. 94) and a ground. The charge pump buck power supply 526 (FIG. 89) and the buck power supply 528 (FIG. 89) share the first inductive element L1 (FIG. 89), the energy storage element 530 (FIG. 89), and the first shunt pump buck switching element 582 (FIG. 94).

In general, the charge pump buck power supply 526 (FIG. 89) includes a group of shunt pump buck switching elements coupled in series between the first output inductance node 460 and the ground. The group of shunt pump buck switching elements includes at least the first shunt pump buck switching element 582 (FIG. 94) and may further include the second shunt pump buck switching element 584 (FIG. 94). The charge pump buck power supply 526 (FIG. 89) and the buck power supply 528 (FIG. 89) share the group of shunt pump buck switching elements.

FIG. 97 shows a frontwise cross section of the first portion 548 and the second portion 562 of the DC-DC converter semiconductor die 550 illustrated in FIG. 92 and FIG. 94, respectively, according to one embodiment of the DC-DC converter semiconductor die 550. The DC-DC converter semiconductor die 550 includes a substrate 614, an epitaxial structure 616 over the substrate 614, and a top metallization layer 618 over the epitaxial structure 616. A topwise cross section 620 of the DC-DC converter semiconductor die 550 shows a top view of the DC-DC converter semiconductor die 550 without the top metallization layer 618. The epitaxial structure 616 may include at least one epitaxial layer, at least one dielectric layer, at least one metallization layer, the like, or any combination thereof.

FIG. 98 shows the topwise cross section 620 of the DC-DC converter semiconductor die 550 illustrated in FIG. 97 according to one embodiment of the DC-DC converter semiconductor die 550. The substrate 614 (FIG. 97) and the epitaxial structure 616 (FIG. 97) provide the first alpha charging switching element 586, the first beta charging switching element 588, the second alpha charging switching element 590, the second beta charging switching element 592, the first series alpha switching element 594, the first series beta switching element 596, the second series alpha switching element 598, and the second series beta switching element 600.

The DC-DC converter semiconductor die 550 has a centerline axis 622 and a first end 624. Further, the DC-DC converter semiconductor die 550 includes a first row 626, a second row 628, and a third row 630. The first row 626 has a first alpha end 632 and a first beta end 634. The second row 628 has a second alpha end 636 and a second beta end 638. The third row 630 has a third alpha end 640 and a third beta end 642. The first row 626 is adjacent to the first end 624 of the DC-DC converter semiconductor die 550. The second row 628 adjacent to the first row 626. The third row 630 is adjacent to the second row 628. The first alpha end 632 is adjacent to the second alpha end 636. The third alpha end 640 is adjacent to the second alpha end 636. The first beta end 634 is adjacent to the second beta end 638. The third beta end 642 is adjacent to the second beta end 638.

The first row 626 includes the second series alpha switching element 598 and the second series beta switching element 600. The second series alpha switching element 598 is adjacent to the first alpha end 632. The second series beta switching element 600 is adjacent to the first beta end 634. The second row 628 includes the second alpha charging switching element 590 and the second beta charging switching element 592. The second alpha charging switching element 590 is adjacent to the second alpha end 636. The second beta charging switching element 592 is adjacent to the second beta end 638. The third row 630 includes the first series alpha switching element 594, the first alpha charging switching element 586, the first beta charging switching element 588, and the first series beta switching element 596.

The first series alpha switching element 594 is adjacent to the third alpha end 640. The first alpha charging switching element 586 is adjacent to the first series alpha switching element 594. The first beta charging switching element 588 is adjacent to the first alpha charging switching element 586. The first series beta switching element 596 is adjacent to the first beta charging switching element 588. The first series beta switching element 596 is adjacent to the third beta end 642. In this regard, the second alpha charging switching element 590 is adjacent to the second series alpha switching element 598.

The first series alpha switching element 594 is adjacent to the second alpha charging switching element 590. The second beta charging switching element 592 is adjacent to the second series beta switching element 600. The first series beta switching element 596 is adjacent to the second beta charging switching element 592. As such, the second alpha charging switching element 590 is between the first series alpha switching element 594 and the second series alpha switching element 598. The second beta charging switching element 592 is between the first series beta switching element 596 and the second series beta switching element 600.

FIG. 99 shows a top view of the DC-DC converter semiconductor die 550 illustrated in FIG. 97 according to one embodiment of the DC-DC converter semiconductor die 550. The DC-DC converter semiconductor die 550 illustrated in FIG. 99 is similar to the DC-DC converter semiconductor die 550 illustrated in FIG. 98, except the DC-DC converter semiconductor die 550 illustrated in FIG. 99 further includes the top metallization layer 618 (FIG. 97). As such, the top metallization layer 618 (FIG. 97) may provide the first alpha flying capacitor connection node 566, the second alpha flying capacitor connection node 568, the first beta flying capacitor connection node 570, the second beta flying capacitor connection node 572, the alpha decoupling connection node 574, the beta decoupling connection node 576, the beta inductive element connection node 552, the alpha inductive element connection node 564, the alpha ground connection node 578, and the beta ground connection node 580. Further, any or all of the first alpha flying capacitor connection node 566, the second alpha flying capacitor connection node 568, the first beta flying capacitor connection node 570, the second beta flying capacitor connection node 572, the alpha decoupling connection node 574, the beta decoupling connection node 576, the beta inductive element connection node 552, the alpha inductive element connection node 564, the alpha ground connection node 578, and the beta ground connection node 580 may be pads, solder pads, wirebond pads, solder bumps, pins, sockets, solder holes, the like, or any combination thereof.

The first alpha flying capacitor connection node 566 is about over the second series alpha switching element 598 (FIG. 98). The alpha decoupling connection node 574 is about over the second alpha charging switching element 590 (FIG. 98). The second alpha flying capacitor connection node 568 is about over the first series alpha switching element 594 (FIG. 98). The first beta flying capacitor connection node 570 is about over the second series beta switching element 600 (FIG. 98). The beta decoupling connection node 576 is about over the second beta charging switching element 592 (FIG. 98). The second beta flying capacitor connection node 572 is about over the first series beta switching element 596 (FIG. 98).

The first row 626 includes the first alpha flying capacitor connection node 566, the first beta flying capacitor connection node 570, the alpha inductive element connection node 564, and the beta inductive element connection node 552. The second row 628 includes the alpha decoupling connection node 574, the beta decoupling connection node 576, the alpha ground connection node 578, and the beta ground connection node 580. The third row 630 includes the second alpha flying capacitor connection node 568 and the second beta flying capacitor connection node 572.

The first alpha flying capacitor connection node 566 is adjacent to the first alpha end 632. The alpha inductive element connection node 564 is adjacent to the first alpha flying capacitor connection node 566. The beta inductive element connection node 552 is adjacent to the alpha inductive element connection node 564. The first beta flying capacitor connection node 570 is adjacent to the beta inductive element connection node 552. The first beta flying capacitor connection node 570 is adjacent to the first beta end 634.

The alpha decoupling connection node 574 is adjacent to the second alpha end 636. The alpha ground connection node 578 is adjacent to the alpha decoupling connection node 574. The beta ground connection node 580 is adjacent to the alpha ground connection node 578. The beta decoupling connection node 576 is adjacent to the beta ground connection node 580. The beta decoupling connection node 576 is adjacent to the second beta end 638. The second alpha flying capacitor connection node 568 is adjacent to the third alpha end 640. The second beta flying capacitor connection node 572 is adjacent to the third beta end 642.

The first alpha flying capacitor connection node 566 and the second alpha flying capacitor connection node 568 form a pair of alpha flying capacitor connection nodes. The first beta flying capacitor connection node 570 and the second beta flying capacitor connection node 572 form a pair of beta flying capacitor connection nodes. The pair of alpha flying capacitor connection nodes is located approximately symmetrical to the pair of beta flying capacitor connection nodes about the centerline axis 622. The alpha decoupling connection node 574 is located approximately symmetrical to the beta decoupling connection node 576 about the centerline axis 622. At least the alpha ground connection node 578 and the beta ground connection node 580 form a group of ground connection nodes, which is located between the pair of alpha flying capacitor connection nodes and the pair of beta flying capacitor connection nodes. At least the alpha inductive element connection node 564 is located between the pair of alpha flying capacitor connection nodes and the pair of beta flying capacitor connection nodes. The alpha inductive element connection node 564 and the beta inductive element connection node 552 are located between the pair of alpha flying capacitor connection nodes and the pair of beta flying capacitor connection nodes. Further, the alpha ground connection node 578 and the beta ground connection node 580 are located between the pair of alpha flying capacitor connection nodes and the pair of beta flying capacitor connection nodes. In general, the DC-DC converter semiconductor die 550 has a group of ground connection nodes located between the pair of alpha flying capacitor connection nodes and the pair of beta flying capacitor connection nodes.

The first terminal of the first series alpha switching element 594 is electrically coupled to the second alpha flying capacitor connection node 568. The first terminal of the second series alpha switching element 598 is electrically coupled to the first alpha flying capacitor connection node 566. A first terminal of the first series beta switching element 596 is electrically coupled to the second beta flying capacitor connection node 572. A first terminal of the second series beta switching element 600 is electrically coupled to the first beta flying capacitor connection node 570.

FIG. 100 shows additional details of the DC-DC converter semiconductor die 550 illustrated in FIG. 99 according to one embodiment of the DC-DC converter semiconductor die 550. The first row 626 has a first row centerline 644. The second row 628 has a second row centerline 646. The third row 630 has a third row centerline 648. The first row 626 and the second row 628 are separated by a centerline spacing 650. The third row 630 and the second row 628 are separated by the centerline spacing 650. The first alpha flying capacitor connection node 566 and the alpha inductive element connection node 564 are separated by the centerline spacing 650. The beta inductive element connection node 552 and the alpha inductive element connection node 564 are separated by the centerline spacing 650. The first beta flying capacitor connection node 570 and the beta inductive element connection node 552 are separated by the centerline spacing 650. In one embodiment of the DC-DC converter semiconductor die 550, the centerline spacing 650 is equal to about 400 micrometers.

FIG. 101 shows details of a supporting structure 652 according to one embodiment of the supporting structure 652. The DC-DC converter 32 (FIG. 74) includes the supporting structure 652, the alpha flying capacitive element CAF, the beta flying capacitive element CBF, the alpha decoupling capacitive element CAD, the beta decoupling capacitive element CBD, the first inductive element L1, the first capacitive element C1, and the DC-DC converter semiconductor die 550. The alpha flying capacitive element CAF, the beta flying capacitive element CBF, the alpha decoupling capacitive element CAD, the beta decoupling capacitive element CBD, the first inductive element L1, the first capacitive element C1, and the DC-DC converter semiconductor die 550 are attached to the supporting structure 652. In alternate embodiments of the supporting structure 652, any or all of the alpha flying capacitive element CAF, the beta flying capacitive element CBF, the alpha decoupling capacitive element CAD, the beta decoupling capacitive element CBD, the first inductive element L1, the first capacitive element C1, and the DC-DC converter semiconductor die 550 may be omitted.

The alpha flying capacitive element CAF is located approximately symmetrical to the beta flying capacitive element CBF about the centerline axis 622. The alpha flying capacitive element CAF is electrically coupled between the first alpha flying capacitor connection node 566 and the second alpha flying capacitor connection node 568 via interconnects 654. In general, the alpha flying capacitive element CAF is electrically coupled between the pair of alpha flying capacitor connection nodes. The interconnects 654 may be bonding wires, laminate traces, printed wiring board (PWB) traces, the like, or any combination thereof. The beta flying capacitive element CBF is electrically coupled between the first beta flying capacitor connection node 570 and the second beta flying capacitor connection node 572 via interconnects 654. In general, the beta flying capacitive element CBF is electrically coupled between the pair of beta flying capacitor connection nodes. By locating the pair of alpha flying capacitor connection nodes approximately symmetrical to the pair of beta flying capacitor connection nodes, the alpha flying capacitive element CAF may be located close to the pair of alpha flying capacitor connection nodes and the beta flying capacitive element CBF may be located close to the pair of beta flying capacitor connection nodes. As such, lengths of transient current paths may be minimized, thereby reducing noise and potential interference.

The first end of the alpha decoupling capacitive element CAD is electrically coupled to the alpha decoupling connection node 574 via one of the interconnects 654. The first end of the beta decoupling capacitive element CBD is electrically coupled to the beta decoupling connection node 576 via one of the interconnects 654. The alpha decoupling capacitive element CAD is located approximately symmetrical to the beta decoupling capacitive element CBD about the centerline axis 622. The alpha decoupling capacitive element CAD is adjacent to the DC-DC converter semiconductor die 550 and the alpha decoupling capacitive element CAD is adjacent to the alpha flying capacitive element CAF. The beta decoupling capacitive element CBD is adjacent to the DC-DC converter semiconductor die 550 and the beta decoupling capacitive element CBD is adjacent to the beta flying capacitive element CBF.

By locating the alpha decoupling capacitive element CAD approximately symmetrical to the beta decoupling capacitive element CBD, by locating the alpha decoupling capacitive element CAD adjacent to the alpha flying capacitive element CAF and adjacent to the DC-DC converter semiconductor die 550, and by locating the beta decoupling capacitive element CBD adjacent to the beta flying capacitive element CBF and adjacent to the DC-DC converter semiconductor die 550, decoupling may be maximized and the lengths of transient current paths may be minimized, thereby reducing noise and potential interference.

The first end of the alpha decoupling capacitive element CAD is electrically coupled to the DC power supply 80 (FIG. 94). The first end of the beta decoupling capacitive element CBD is electrically coupled to the DC power supply 80 (FIG. 94). The second end of the alpha decoupling capacitive element CAD is electrically coupled to the alpha ground connection node 578. The second end of the beta decoupling capacitive element CBD is electrically coupled to the beta ground connection node 580. In general, the second end of the alpha decoupling capacitive element CAD is electrically coupled to the ground and the second end of the beta decoupling capacitive element CBD is electrically coupled to the ground.

The first inductive element L1 is adjacent to the DC-DC converter semiconductor die 550. Specifically, a first end of the first inductive element L1 is adjacent to the alpha inductive element connection node 564. The first end of the first inductive element L1 is electrically coupled to the beta inductive element connection node 552 and to the alpha inductive element connection node 564 via interconnects 654. A second end of the first inductive element L1 is electrically coupled to the first capacitive element C1 via one of the interconnects 654.

FIG. 102 shows details of the supporting structure 652 according to an alternate embodiment of the supporting structure 652. The supporting structure 652 illustrated in FIG. 102 is similar to the supporting structure 652 illustrated in FIG. 101, except in the supporting structure 652 illustrated in FIG. 102, the DC-DC converter 32 (FIG. 74) further includes the second inductive element L2, such that a first end of the second inductive element L2 is electrically coupled to the beta inductive element connection node 552 via one of the interconnects 654, and the first end of the first inductive element L1 is electrically coupled to the alpha inductive element connection node 564 via one of the interconnects 654. A second end of the second inductive element L2 is electrically coupled to the second end of the first inductive element L1 via one of the interconnects 654.

Snubber for a DC-DC Converter

A summary of a snubber for a DC-DC converter is presented, followed by a detailed description of the snubber for the DC-DC converter. The present disclosure relates to circuitry, which may include a DC-DC converter having a first switching power supply. The first switching power supply includes a first switching converter, an energy storage element, a first inductive element, which is coupled between the first switching converter and the energy storage element, and a first snubber circuit, which is coupled across the first inductive element. The first switching power supply receives and converts a DC power supply signal to provide a first switching power supply output signal based on a setpoint.

In one embodiment of the DC-DC converter, the DC-DC converter further includes DC-DC control circuitry and the first switching power supply further includes switching control circuitry. The DC-DC control circuitry provides indication of a selection of either a continuous conduction mode (CCM) or a discontinuous conduction mode (DCM) to the first switching power supply. During the CCM, the switching control circuitry allows energy to flow from the energy storage element to the first inductive element. During the DCM, the switching control circuitry does not allow energy to flow from the energy storage element to the first inductive element.

Selection of either the CCM or the DCM may be based on a rate of change of the setpoint. If an output voltage of the first switching power supply output signal is above the setpoint, then the energy storage element needs to be depleted of some energy to drive the first switching power supply output signal toward the setpoint. During the CCM, two mechanisms operate to deplete the energy storage element. The first mechanism is provided by a load presented to the first switching power supply. The second mechanism is provided by the first switching converter, which allows energy to flow from the energy storage element to the first inductive element. During the DCM, only the first mechanism is allowed to deplete the energy storage element, which may slow depletion of the energy storage element. As such, efficiency of the first switching power supply may be higher during the DCM than during the CCM. However, during the DCM, if the setpoint drops quickly, particularly during light loading conditions of the first switching power supply, there may be significant lag between the setpoint and the output voltage, thereby causing an output voltage error. Thus, there is a trade-off between minimizing output voltage error, by operating in the CCM, and maximizing efficiency, by operating in the DCM. To balance the trade-off, selection between the CCM and the DCM is based on the rate of change of the setpoint.

In one embodiment of the circuitry, during the CCM, the first snubber circuit is in an OPEN state, and during the DCM, when a first inductive element current of the first inductive element reaches about zero from previously being positive, the first snubber circuit transitions from the OPEN state to a CLOSED state. As such, the first snubber circuit essentially shorts out the first inductive element, such that ringing at a first output inductance node of the first switching converter is substantially reduced or eliminated, thereby reducing noise in the circuitry.

In one embodiment of the circuitry, selection between the CCM and the DCM is based only on the rate of change of the setpoint. In an alternate embodiment of the circuitry, selection between the CCM and the DCM is based on the rate of change of the setpoint and loading of the first switching power supply. In a first exemplary embodiment of the circuitry, when a negative rate of change of the setpoint is greater than a first threshold, the CCM is selected and when the negative rate of change of the setpoint is less than a second threshold, the DCM is selected, such that the second threshold is less than the first threshold and a difference between the first threshold and the second threshold provides hysteresis. In a second exemplary embodiment of the circuitry, the first threshold and the second threshold are based on loading of the first switching power supply.

In one embodiment of the first inductive element, the first inductive element has the first inductive element current, which is positive when energy flows from the first inductive element to the energy storage element and is negative when energy flows from the energy storage element to the first inductive element. In one embodiment of the energy storage element, the energy storage element is a first capacitive element. In one embodiment of the circuitry, the circuitry includes control circuitry, which provides the setpoint to the DC-DC control circuitry. In one embodiment of the circuitry, the circuitry includes transceiver circuitry, which includes the control circuitry. In one embodiment of the control circuitry, the control circuitry makes the selection between the CCM and the DCM, and provides a DC configuration control signal to the DC-DC control circuitry, such that the DC configuration control signal is based on the selection between the CCM and the DCM. In one embodiment of the DC-DC control circuitry, the DC-DC control circuitry makes the selection between the CCM and the DCM.

In one embodiment of the first switching power supply, the first switching power supply further includes a second switching converter, which receives the DC power supply signal. The first switching power supply may use the first switching converter for heavy loading conditions and the second switching converter for light loading conditions. In one embodiment of the first switching power supply, the first switching converter is a charge pump buck converter and the second switching converter is a buck converter.

In one embodiment of the first switching power supply, the second switching converter is coupled across the first switching converter. As such, the second switching converter shares the first inductive element with the first switching converter. In an alternate embodiment of the first switching power supply, the first switching power supply further includes the second switching converter and a second inductive element, which is coupled between the second switching converter and the energy storage element. During the CCM, the switching control circuitry allows energy to flow from the energy storage element to the second inductive element. During the DCM, the switching control circuitry does not allow energy to flow from the energy storage element to the second inductive element.

In one embodiment of the circuitry, during the CCM, the second snubber circuit is in an OPEN state, and during the DCM, when a second inductive element current of the second inductive element reaches about zero from previously being positive, the second snubber circuit transitions from the OPEN state to a CLOSED state. As such, the second snubber circuit essentially shorts out the second inductive element, such that ringing at a second output inductance node of the second switching converter is substantially reduced or eliminated, thereby reducing noise in the circuitry.

In one embodiment of the DC-DC converter, the DC-DC converter further includes a second switching power supply, which receives and converts the DC power supply signal to provide a second switching power supply output signal. In one embodiment of the DC-DC converter, the first switching power supply output signal is an envelope power supply signal for an RF power amplifier (PA) and the second switching power supply output signal is a bias power supply signal, which is used for biasing the RF PA. In one embodiment of the second switching power supply, the second switching power supply is a charge pump.

FIG. 103 shows details of the first switching power supply 450 illustrated in FIG. 74 according to one embodiment of the first switching power supply 450. The first switching power supply 450 illustrated in FIG. 103 is similar to the first switching power supply 450 illustrated in FIG. 87, except the first switching power supply 450 illustrated in FIG. 103 further includes a first snubber circuit 656 coupled across the first inductive element L1 and a second snubber circuit 658 coupled across the second inductive element L2.

As previously mentioned, the first switching power supply 450 receives and converts the DC power supply signal DCPS to provide the first switching power supply output signal FPSO based on the setpoint. The first switching power supply 450 includes the first switching converter 456, the first inductive element L1, the energy storage element 530, the switching control circuitry, and the first snubber circuit 656. A portion of charge pump buck switching control circuitry 540 (FIG. 92), a portion of buck switching control circuitry 544 (FIG. 92), or both provides the switching control circuitry. In one embodiment of the DC-DC converter 32 (FIG. 74), the DC-DC control circuitry 90 (FIG. 74) provides indication of selection of one of the CCM and the DCM to the first switching power supply 450 via the first power supply control signal FPCS. The selection of the one of the CCM and the DCM may be based on a rate of change of the setpoint. During the CCM, the switching control circuitry allows energy to flow from the energy storage element 530 to the first inductive element L1. During the DCM, the switching control circuitry does not allow energy to flow from the energy storage element 530 to the first inductive element L1. The rate of change of the setpoint may be a negative rate of change of the setpoint.

The first inductive element L1 has a first inductive element current IL1, which is positive when energy flows from the first inductive element L1 to the energy storage element 530, and is negative when energy flows from the energy storage element 530 to the first inductive element L1. In one embodiment of the first switching power supply 450, during the CCM, the first snubber circuit 656 is in an OPEN state, and during the DCM, when the first inductive element current IL1 of the first inductive element L1 reaches about zero from previously being positive, the first snubber circuit 656 transitions from the OPEN state to a CLOSED state. As such, the first snubber circuit 656 essentially shorts out the first inductive element, such that ringing at a first output inductance node 460 is substantially reduced or eliminated, thereby reducing noise in the circuitry.

In one embodiment of the DC-DC converter 32 (FIG. 74), the control circuitry 42 (FIG. 6) provides the setpoint to the DC-DC control circuitry 90 (FIG. 74) via the envelope control signal ECS (FIG. 6) and the DC-DC control circuitry 90 (FIG. 74) makes the selection of the one of the CCM and the DCM. In an alternate embodiment of the DC-DC converter 32 (FIG. 74), the control circuitry 42 (FIG. 6) provides the setpoint to the DC-DC control circuitry 90 (FIG. 74) via the envelope control signal ECS (FIG. 6), and the control circuitry 42 (FIG. 6) makes the selection of the one of the CCM and the DCM and provides indication of the selection to the DC-DC control circuitry 90 (FIG. 74) via the DC configuration control signal DCC (FIG. 6). As such, the DC configuration control signal DCC (FIG. 6) is based on the selection of the one of the CCM and the DCM.

In one embodiment of the DC-DC converter 32 (FIG. 74), during the first converter operating mode and during the CCM, the switching control circuitry allows energy to flow from the energy storage element 530 to the first inductive element L1 and the first snubber circuit 656 is in the OPEN state. During the first converter operating mode and during the DCM, the switching control circuitry does not allow energy to flow from the energy storage element 530 to the first inductive element L1, and when the first inductive element current IL1 of the first inductive element L1 reaches about zero from previously being positive, the first snubber circuit 656 transitions from the OPEN state to the CLOSED state.

During the second converter operating mode and during the CCM, the switching control circuitry allows energy to flow from the energy storage element 530 to the second inductive element L2 and the second snubber circuit 658 is in an OPEN state. During the second converter operating mode and during the DCM, the switching control circuitry does not allow energy to flow from the energy storage element 530 to the second inductive element L2, and when a second inductive element current IL2 of the second inductive element L2 reaches about zero from previously being positive, the second snubber circuit 658 transitions from the OPEN state to a CLOSED state. As such, second snubber circuit 658 essentially shorts out the second inductive element L2, such that ringing at the second output inductance node 462 is substantially reduced or eliminated, thereby reducing noise in the circuitry.

Shunt Current Diversion Based Current Digital-to-Analog Converter

A summary of a shunt current diversion based IDAC is presented, followed by a detailed description of the shunt current diversion based IDAC. In this regard, the present disclosure relates to a first shunt current diversion based IDAC, which includes a group of alpha IDAC cells and provides a first current. Each of the group of alpha IDAC cells has an alpha shunt connection node and an alpha series connection node. When each alpha IDAC cell is in an ENABLED state, the alpha IDAC cell provides an alpha output current via its alpha series connection node, such that at least a portion of the first current is provided by the alpha output current. When each alpha IDAC cell is in a DISABLED state and a previous adjacent alpha IDAC cell is in the ENABLED state, the alpha IDAC cell diverts the alpha output current to its alpha shunt connection node. When each alpha IDAC cell is in the DISABLED state and no previous adjacent alpha IDAC cell is in the ENABLED state, the alpha IDAC cell does not provide the alpha output current, which may minimize power consumption. Providing the alpha output current, but diverting it to the alpha shunt connection node in anticipation of being enabled provides quick activation of an IDAC cell, which may be useful for applications in which the IDAC cells are enabled and disabled sequentially, such as linear frequency dithering.

FIG. 104 shows the frequency synthesis control circuitry 468 and details of the programmable signal generation circuitry 482 illustrated in FIG. 85 according to one embodiment of the frequency synthesis control circuitry 468 and the programmable signal generation circuitry 482. The first ramp IDAC 510 includes a first IDAC 700 and the second ramp IDAC 518 includes a second IDAC 702. The programmable signal generation circuitry 482 further includes a DC reference supply 704, which provides a DC reference supply signal DCRS to the first IDAC 700 and the second IDAC 702. The frequency synthesis control circuitry 468 provides a first alpha control signal FAC, a second alpha control signal SAC, and up to and including an $N^{TH}$ alpha control signal NAC to the first IDAC 700. The frequency synthesis control circuitry 468 provides a first beta control signal FBC, a second beta control signal SBC, and up to and including an $M^{TH}$ beta control signal MBC to the second IDAC 702. In this regard, the frequency synthesis control circuitry 468, which is control circuitry, provides a group of alpha control signals FAC, SAC, NAC to the first IDAC 700 and a group of beta control signals FBS, SBC, MBC to the second IDAC 702. The first IDAC 700 provides the first current I1 based on the group of alpha control signals FAC, SAC, NAC and the DC reference supply signal DCRS. The second IDAC 702 provides the second current I2 based on the group of beta control signals FBS, SBC, MBC and the DC reference supply signal DCRS. In an alternate embodiment of the programmable signal generation circuitry 482, either the first ramp IDAC 510 or the second ramp IDAC 518 is omitted.

FIG. 105 shows the DC reference supply 704 and details of the first IDAC 700 illustrated in FIG. 104 according to one embodiment of the DC reference supply 704 and the first IDAC 700. The first IDAC 700 includes a first alpha IDAC cell 706, a second alpha IDAC cell 708, and up to an including an $N^{TH}$ alpha IDAC cell 710. In general, the first IDAC 700 includes a group of alpha IDAC cells 706, 708, 710. As such, each of the group of alpha IDAC cells 706, 708, 710 receives the DC reference supply signal DCRS from the DC reference supply 704. The first alpha IDAC cell 706 has a first alpha series connection node 712 and a first alpha shunt connection node 714. The second alpha IDAC cell 708 has a second alpha series connection node 716 and a second alpha shunt connection node 718. The $N^{TH}$ alpha IDAC cell 710 has an $N^{TH}$ alpha series connection node 720 and an $N^{TH}$ alpha shunt connection node 722. Therefore, the group of alpha IDAC cells 706, 708, 710 has a group of alpha series connection nodes 712, 716, 720 and a group of alpha shunt connection nodes 714, 718, 722. Specifically, each of the group of alpha IDAC cells 706, 708, 710 has an alpha series connection node 750 (FIG. 108) and an alpha shunt connection node 752 (FIG. 108). All of the group of alpha series connection nodes 712, 716, 720 are coupled together and all of the group of alpha shunt connection nodes 714, 718, 722 are coupled together. The group of alpha IDAC cells 706, 708, 710 provides the first current I1.

The first alpha IDAC cell 706 receives the first alpha control signal FAC and operates in one of an ENABLED state and a DISABLED state based on the first alpha control signal FAC. When in the ENABLED state, the first alpha IDAC cell 706 provides a first alpha output current FAOI via the first alpha series connection node 712, such that the first alpha output current FAOI provides at least a portion of the first current I1. When in the DISABLED state, the first alpha IDAC cell 706 does not provide the first alpha output current FAOI.

The second alpha IDAC cell 708 receives the second alpha control signal SAC and the first alpha control signal FAC, which is a previous adjacent alpha control signal from a previous adjacent alpha IDAC cell, namely the first alpha IDAC cell 706. The second alpha IDAC cell 708 operates in one of the ENABLED state and the DISABLED state based on the second alpha control signal SAC. When in the ENABLED state, the second alpha IDAC cell 708 provides a second alpha output current SAOI via the second alpha series connection node 716, such that the second alpha output current SAOI provides at least a portion of the first current I1. When in the DISABLED state and the previous adjacent alpha IDAC cell, namely the first alpha IDAC cell 706, is in the ENABLED state, the second alpha IDAC cell 708 diverts the second alpha output current SAOI to the second alpha shunt connection node 718. When in the DISABLED state and the previous adjacent alpha IDAC cell, namely the first alpha IDAC cell 706, is in the DISABLED state, the second alpha IDAC cell 708 does not provide the second alpha output current SAOI.

The $N^{TH}$ alpha IDAC cell 710 receives the $N^{TH}$ alpha control signal NAC a previous adjacent alpha control signal (not shown) from a previous adjacent alpha IDAC cell (not shown). The $N^{TH}$ alpha IDAC cell 710 operates in one of the ENABLED state and the DISABLED state based on the $N^{TH}$ alpha control signal NAC. When in the ENABLED state, the $N^{TH}$ alpha IDAC cell 710 provides an $N^{TH}$ alpha output current NAOI via the $N^{TH}$ alpha series connection node 720, such that the $N^{TH}$ alpha output current NAOI provides at least a portion of the first current I1. When in the DISABLED state and the previous adjacent alpha IDAC cell (not shown) is in the ENABLED state, the $N^{TH}$ alpha IDAC cell 710 diverts the $N^{TH}$ alpha output current NAOI to the $N^{TH}$ alpha shunt connection node 722. When in the DISABLED state and the previous adjacent alpha IDAC cell (not shown) is in the DISABLED state, the $N^{TH}$ alpha IDAC cell 710 does not provide the $N^{TH}$ alpha output current NAOI.

In general, when operating, each of the group of alpha IDAC cells 706, 708, 710 is in one of the ENABLED state and the DISABLED state based on a corresponding one of the group of alpha control signals FAC, SAC, NAC. When in the ENABLED state, each of the group of alpha IDAC cells 706, 708, 710 provides an alpha output current AOI (FIG. 108), which is a corresponding one of a group of alpha output currents FAOI, SAOI, NAOI, via an alpha series connection node 750 (FIG. 108), which is a corresponding one of the group of alpha series connection nodes 712, 716, 720. At least a portion of the first current I1 is provided by the alpha output current AOI (FIG. 108). Each of the group of alpha IDAC cells 706, 708, 710, when in the DISABLED state and a previous adjacent one of the group of alpha IDAC cells 706, 708, 710 is in the ENABLED state, diverts the alpha output current AOI (FIG. 108) to an alpha shunt connection node 752 (FIG. 108), which is a corresponding one of the group of alpha shunt connection nodes 714, 718, 722. Each of the group of alpha IDAC cells 706, 708, 710, when in the DISABLED state and no previous adjacent one of the group of alpha IDAC cells 706, 708, 710 is in the ENABLED state, does not provide the alpha output current AOI (FIG. 108).

In one embodiment of the first IDAC 700, no two of the group of alpha IDAC cells 706, 708, 710 simultaneously provide the alpha output current AOI (FIG. 108) to the alpha shunt connection node 752 (FIG. 108). In one embodiment of the first IDAC 700, the previous adjacent one of the group of alpha IDAC cells 706, 708, 710 is physically adjacent. In an alternate embodiment of the first IDAC 700, the previous adjacent one of the group of alpha IDAC cells 706, 708, 710 is logically adjacent. In another embodiment of the first IDAC 700, the previous adjacent one of the group of alpha IDAC cells 706, 708, 710 is both physically adjacent and logically adjacent. A ground is coupled to the alpha shunt connection node 752 (FIG. 108) of each of the group of alpha IDAC cells 706, 708, 710. As such, the group of alpha IDAC cells 706, 708, 710 provides the group of alpha output currents FAOI, SAOI, NAOI away from the group of alpha IDAC cells 706, 708, 710.

FIG. 106 shows the DC reference supply 704 and details of the first IDAC 700 illustrated in FIG. 104 according to one embodiment of the DC reference supply 704 and an alternate embodiment of the first IDAC 700. The first IDAC 700 illustrated in FIG. 106 is similar to the first IDAC 700 illustrated in FIG. 105, except in the first IDAC 700 illustrated in FIG. 106, the DC reference supply 704 is coupled to the alpha shunt connection node 752 (FIG. 108) of each of the group of alpha IDAC cells 706, 708, 710. As such, the group of alpha IDAC cells 706, 708, 710 provides the group of alpha output currents FAOI, SAOI, NAOI toward the group of alpha IDAC cells 706, 708, 710.

FIG. 107 shows the DC reference supply 704 and details of the second IDAC 702 illustrated in FIG. 104 according to one embodiment of the DC reference supply 704 and the second IDAC 702. The second IDAC 702 includes a first beta IDAC cell 724, a second beta IDAC cell 726, and up to an including an $M^{TH}$ beta IDAC cell 728. In general, the second IDAC 702 includes a group of beta IDAC cells 724, 726, 728. As such, each of the group of beta IDAC cells 724, 726, 728 receives the DC reference supply signal DCRS from the DC reference supply 704. The first beta IDAC cell 724 has a first beta series connection node 730 and a first beta shunt connection node 732. The second beta IDAC cell 726 has a second beta series connection node 734 and a second beta shunt connection node 736. The $M^{TH}$ beta IDAC cell 728 has an $M^{TH}$ beta series connection node 738 and an $M^{TH}$ beta shunt connection node 740. Therefore, the group of beta IDAC cells 724, 726, 728 has a group of beta series connection nodes 730, 734, 738 and a group of beta shunt connection nodes 732, 736, 740. Specifically, each of the group of beta IDAC cells 724, 726, 728 has a beta series connection node 762 (FIG. 109) and a beta shunt connection node 764 (FIG. 109). All of the group of beta series connection nodes 730, 734, 738 are coupled together and all of the group of beta shunt connection nodes 732, 736, 740 are coupled together. The group of beta IDAC cells 724, 726, 728 provides the second current I2.

The first beta IDAC cell 724 receives the first beta control signal FBC and operates in one of an ENABLED state and a DISABLED state based on the first beta control signal FBC. When in the ENABLED state, the first beta IDAC cell 724 provides a first beta output current FBOI via the first beta series connection node 730, such that the first beta output current FBOI provides at least a portion of the second current I2. When in the DISABLED state, the first beta IDAC cell 724 does not provide the first beta output current FBOI.

The second beta IDAC cell 726 receives the second beta control signal SBC and the first beta control signal FBC, which is a previous adjacent beta control signal from a previous adjacent beta IDAC cell, namely the first beta IDAC cell 724. The second beta IDAC cell 726 operates in one of the ENABLED state and the DISABLED state based on the second beta control signal SBC. When in the ENABLED state, the first beta IDAC cell 724 provides a second beta output current SBOI via the second beta series connection node 734, such that the second beta output current SBOI provides at least a portion of the second current I2. When in the DISABLED state and the previous adjacent beta IDAC cell, namely the first beta IDAC cell 724, is in the ENABLED state, the second beta IDAC cell 726 diverts the second beta output current SBOI to the second beta shunt connection node 736. When in the DISABLED state and the previous adjacent beta IDAC cell, namely the first beta IDAC cell 724, is in the DISABLED state, the second beta IDAC cell 726 does not provide the second beta output current SBOI.

The $M^{TH}$ beta IDAC cell 728 receives the $M^{TH}$ beta control signal MBC and a previous adjacent beta control signal (not shown) from a previous adjacent beta IDAC cell (not shown). The $M^{TH}$ beta IDAC cell 728 operates in one of the ENABLED state and the DISABLED state based on the $M^{TH}$ beta control signal MBC. When in the ENABLED state, the $M^{TH}$ beta IDAC cell 728 provides an $M^{TH}$ beta output current MBOI via the $M^{TH}$ beta series connection node 738, such that the $M^{TH}$ beta output current MBOI provides at least a portion of the second current I2. When in the DISABLED state and the previous adjacent beta IDAC cell (not shown) is in the ENABLED state, the $M^{TH}$ beta IDAC cell 728 diverts the $M^{TH}$ beta output current MBOI to the $M^{TH}$ beta shunt connection node 740. When in the DISABLED state and the previous adjacent beta IDAC cell (not shown) is in the DISABLED state, the $M^{TH}$ beta IDAC cell 728 does not provide the $M^{TH}$ beta output current MBOI.

In general, when operating, each of the group of beta IDAC cells 724, 726, 728 is in one of the ENABLED state and the DISABLED state based on a corresponding one of the group of beta control signals FBC, SBC, MBC. When in the ENABLED state, each of the group of beta IDAC cells 724, 726, 728 provides a beta output current BOI (FIG. 109), which is a corresponding one of a group of beta output currents FBOI, SBOI, MBOI, via a beta series connection node 762 (FIG. 109), which is a corresponding one of the group of beta series connection nodes 730, 734, 738. At least a portion of the second current I2 is provided by the beta output current BOI (FIG. 109). Each of the group of beta IDAC cells 724, 726, 728, when in the DISABLED state and a previous adjacent one of the group of beta IDAC cells 724, 726, 728 is in the ENABLED state, diverts the beta output current BOI (FIG. 109) to a beta shunt connection node 764 (FIG. 109), which is a corresponding one of the group of beta shunt connection nodes 732, 736, 740. Each of the group of beta IDAC cells 724, 726, 728, when in the DISABLED state and no previous adjacent one of the group of beta IDAC cells 724, 726, 728 is in the ENABLED state, does not provide the beta output current BOI (FIG. 109).

In one embodiment of the second IDAC 702, no two of the group of beta IDAC cells 724, 726, 728 simultaneously provide the beta output current BOI (FIG. 109) to the beta shunt connection node 764 (FIG. 109). In one embodiment of the second IDAC 702, the previous adjacent one of the group of beta IDAC cells 724, 726, 728 is physically adjacent. In an alternate embodiment of the second IDAC 702, the previous adjacent one of the group of beta IDAC cells 724, 726, 728 is logically adjacent. In another embodiment of the second IDAC 702, the previous adjacent one of the group of beta IDAC cells 724, 726, 728 is both physically adjacent and logically adjacent. The DC reference supply 704 is coupled to the beta shunt connection node 764 (FIG. 109) of each of the group of beta IDAC cells 724, 726, 728. As such, the group of beta IDAC cells 724, 726, 728 provides the group of beta output currents FBOI, SBOI, MBOI toward the group of beta IDAC cells 724, 726, 728.

FIG. 108 shows details of an alpha IDAC cell 742 according to one embodiment of the alpha IDAC cell 742. The alpha IDAC cell 742 may be representative of any or all of the group of alpha IDAC cells 706, 708, 710 (FIG. 106). The alpha IDAC cell 742 receives an alpha control signal ALC and a previous adjacent alpha control signal AALC, which may be representative of any or all of the group of alpha control signals FAC, SAC, NAC. However, when the alpha IDAC cell 742 is representative of the first alpha IDAC cell 706 (FIG. 106), the previous adjacent alpha control signal AALC is omitted. The alpha IDAC cell 742 includes an alpha current source 744, an alpha series circuit 746, an alpha shunt circuit 748, an alpha series connection node 750, and an alpha shunt connection node 752. The alpha series connection node 750 may be representative of any or all of the group of alpha series connection nodes 712, 716, 720 (FIG. 106). The alpha shunt connection node 752 may be representative of any or all of the group of alpha shunt connection nodes 714, 718, 722 (FIG. 106).

Each of the alpha current source 744, the alpha series circuit 746, and the alpha shunt circuit 748 receives the alpha control signal ALC and the previous adjacent alpha control signal AALC. The alpha series circuit 746 is coupled between the alpha current source 744 and the alpha series connection node 750. The alpha shunt circuit 748 is coupled between the alpha current source 744 and the alpha shunt connection node 752.

When the alpha IDAC cell 742 is in the ENABLED state, as indicated by the alpha control signal ALC, the alpha series circuit 746 connects the alpha current source 744 to the alpha series connection node 750, the alpha shunt circuit 748 isolates the alpha current source 744 from the alpha shunt connection node 752, and the alpha current source 744 provides the alpha output current AOI to the alpha series connection node 750 via the alpha series circuit 746.

When the alpha IDAC cell 742 is in the DISABLED state, as indicated by the alpha control signal ALC, and a previous adjacent alpha IDAC cell is in the ENABLED state, as indicated by the previous adjacent alpha control signal AALC, the alpha series circuit 746 isolates the alpha current source 744 from the alpha series connection node 750, the alpha shunt circuit 748 connects the alpha current source 744 to the alpha shunt connection node 752, and the alpha current source 744 provides the alpha output current AOI to the alpha shunt connection node 752 via the alpha shunt circuit 748. As such, the alpha shunt circuit 748 diverts the alpha output current AOI to the alpha shunt connection node 752. By keeping the alpha current source 744 active in anticipation of the alpha IDAC cell 742 soon being enabled, enabling the alpha IDAC cell 742 may be quick.

When the alpha IDAC cell 742 is in the DISABLED state, as indicated by the alpha control signal ALC, and a previous adjacent alpha IDAC cell is in the DISABLED state, as indicated by the previous adjacent alpha control signal AALC, the alpha series circuit 746 may isolate the alpha current source 744 from the alpha series connection node 750, the alpha shunt circuit 748 may isolate the alpha current source 744 from the alpha shunt connection node 752, and the alpha current source 744 does not provide the alpha output current AOI to conserve power. By keeping the alpha current source 744 inactive until the previous adjacent alpha IDAC cell becomes enabled provides an effective trade-off between power conservation and quick activation of needed alpha IDAC cells. Such a system may be useful when each alpha IDAC cell 742 is enabled and disabled sequentially, such as in a linear frequency dithering system.

FIG. 109 shows details of a beta IDAC cell 754 according to one embodiment of the beta IDAC cell 754. The beta IDAC cell 754 may be representative of any or all of the group of beta IDAC cells 724, 726, 728 (FIG. 107). The beta IDAC cell 754 receives a beta control signal BTC and a previous adjacent beta control signal ABTC, which may be representative of any or all of the group of beta IDAC cells 724, 726, 728 (FIG. 107). However, when the beta IDAC cell 754 is representative of the first beta IDAC cell 724 (FIG. 107), the previous adjacent beta control signal ABTC is omitted. The beta IDAC cell 754 includes a beta current source 756, a beta series circuit 758, a beta shunt circuit 760, a beta series connection node 762, and a beta shunt connection node 764. The beta series connection node 762 may be representative of any or all of the group of beta series connection nodes 730, 734, 738 (FIG. 107). The beta shunt connection node 764 may be representative of any or all of the group of beta shunt connection nodes 732, 736, 740 (FIG. 107).

Each of the beta current source 756, the beta series circuit 758, and the beta shunt circuit 760 receives the beta control signal BTC and the previous adjacent beta control signal ABTC. The beta series circuit 758 is coupled between the beta current source 756 and the beta series connection node 762. The beta shunt circuit 760 is coupled between the beta current source 756 and the beta shunt connection node 764. The beta IDAC cell 754 may operate in a similar manner to the alpha IDAC cell 742 (FIG. 108), as previously presented.

Summaries of amplitude limiting of a first switching power supply output signal, slew rate limiting of a first switching power supply output signal, minimum limiting of a filtered error signal, loop gain compensation of charge pump buck and buck power supplies, and a maximum duty-cycle of a PWM signal are presented followed by detailed embodiments of the amplitude limiting of a first switching power supply output signal, the slew rate limiting of a first switching power supply output signal, the minimum limiting of a filtered error signal, the loop gain compensation of charge pump buck and buck power supplies, and the maximum duty-cycle of a PWM signal.

Amplitude Limiting of a First Switching Power Supply Output Signal

Embodiments of the present disclosure relate to DC-DC control circuitry and a first switching power supply. The first switching power supply provides a first switching power supply output signal. The DC-DC control circuitry provides a first power supply output control signal, which is representative of a setpoint of the first switching power supply output signal. The first switching power supply applies a limit to the first power supply output control signal based on a limit threshold to provide a conditioned first power supply output control signal. The first switching power supply provides the first switching power supply output signal based on the conditioned first power supply output control signal, such that the setpoint of the first switching power supply output signal is limited based on the limit threshold.

Slew Rate Limiting of a First Switching Power Supply Output Signal

Embodiments of the present disclosure relate to DC-DC control circuitry and a first switching power supply. The first switching power supply provides a first switching power supply output signal. The DC-DC control circuitry provides a first power supply output control signal, which is representative of a setpoint of the first switching power supply output signal. The first switching power supply applies a slew rate limit to the first power supply output control signal based on a slew rate threshold to provide a conditioned first power supply output control signal. The first switching power supply provides the first switching power supply output signal based on the conditioned first power supply output control signal, such that the setpoint of the first switching power supply output signal is slew rate limited based on the slew rate threshold.

Minimum Limiting of a Filtered Error Signal

Embodiments of the present disclosure relate to a PWM comparator and error signal correction circuitry of a first switching power supply. The PWM comparator has a minimum operating input amplitude. The PWM comparator receives a corrected error signal and provides a PWM signal based on the corrected error signal. The error signal correction circuitry applies a minimum limit to a filtered error signal based on a minimum limit threshold to provide the corrected error signal. The minimum limit threshold is based on the minimum operating input amplitude. The first switching power supply provides a first switching power supply output signal based on the PWM signal.

Loop Gain Compensation of Charge Pump Buck and Buck Power Supplies

The present disclosure relates to a DC-DC converter, which includes a charge pump buck power supply coupled in parallel with a buck power supply. The charge pump buck power supply includes a charge pump buck converter, a first inductive element, and an energy storage element. The charge pump buck converter and the first inductive element are coupled in series between a DC power supply, such as a battery, and the energy storage element. The buck power supply includes a buck converter, the first inductive element, and the energy storage element. The buck converter is coupled across the charge pump buck converter. As such, the charge pump buck power supply and the buck power supply share the first inductive element and the energy storage element. Only one of the charge pump buck power supply and the buck power supply is active at any one time. As such, either the charge pump buck power supply or the buck power supply receives and converts a DC power supply signal from the DC power supply to provide a first switching power supply output signal to a load based on a setpoint. In one embodiment of the energy storage element, the energy storage element is a capacitive element.

The charge pump buck converter combines the functionality of a charge pump with the functionality of a buck converter. However, the charge pump buck converter uses fewer switching elements than a separate charge pump and buck converter by using common switching elements for both charge pump and buck converter functionalities. As such, the charge pump buck power supply is capable of providing an output voltage that is greater than a voltage of the DC power supply signal. Conversely, the buck power supply is only capable of providing an output voltage that is about equal to or less than the voltage of the DC power supply signal. In one embodiment of the DC-DC converter, during a first converter operating mode, the charge pump buck power supply receives and converts the DC power supply signal to provide the first switching power supply output signal, and the buck power supply is disabled. During a second converter operating mode, the buck power supply receives and converts the DC power supply signal to provide the first switching power supply output signal, and the charge pump buck power supply is disabled. The setpoint is based on a desired voltage of the first switching power supply output signal.

In one embodiment of the DC-DC converter, selection of either the first converter operating mode or the second converter operating mode is based on a voltage of the DC power supply signal and the setpoint. The first converter operating mode is selected when the desired voltage of the first switching power supply output signal is greater than the voltage of the DC power supply signal. In one embodiment of the DC-DC converter, selection of either the first converter operating mode or the second converter operating mode is further based on a load current of the load. The second converter operating mode is selected when the desired voltage of the first switching power supply output signal is less than the voltage of the DC power supply signal and the load current is less than a load current threshold.

In a first exemplary embodiment of the DC-DC converter, selection of either the first converter operating mode or the second converter operating mode is further based on maximizing efficiency of the DC-DC converter. In a second exemplary embodiment of the DC-DC converter, selection of either the first converter operating mode or the second converter operating mode is further based on exceeding a minimum acceptable efficiency of the DC-DC converter. In a third exemplary embodiment of the DC-DC converter, selection of either the first converter operating mode or the second converter operating mode is further based on exceeding a desired efficiency of the DC-DC converter. In one embodiment of the DC-DC converter, the DC-DC converter further includes a charge pump, which receives and converts the DC power supply signal to provide a second switching power supply output signal. In one embodiment of the DC-DC converter, the first switching power supply output signal is an envelope power supply signal for a first RF power amplifier (PA) and the second switching power supply output signal is a bias power supply signal used for biasing the first RF PA.

In one embodiment of the DC-DC converter, the charge pump buck converter and the buck converter share an output inductance node, such that the first inductive element is coupled between the output inductance node and the energy storage element. During the first converter operating mode, the charge pump buck converter may boost the voltage of the DC power supply signal significantly, such that a voltage at the output inductance node may be significantly higher than the voltage of the DC power supply signal. As a result, even though the buck converter is disabled during the first converter operating mode, the buck converter must be able to withstand the boosted voltage at the output inductance node. In an exemplary embodiment of the DC-DC converter, the voltage at the output inductance node is equal to about 11 volts and a breakdown voltage of individual switching elements in the buck converter is equal to about 7 volts.

Maximum Duty-Cycle of a PWM Signal

Embodiments of the present disclosure relate to a PWM comparator and PWM signal correction circuitry of a first switching power supply. The PWM comparator provides an uncorrected PWM signal based on a comparison between a ramping signal and a filtered error signal. The PWM signal correction circuitry receives and corrects the uncorrected PWM signal to provide a PWM signal. When a duty-cycle of the uncorrected PWM signal exceeds a maximum duty-cycle threshold, a duty-cycle of the PWM signal is about equal to the maximum duty-cycle threshold. When the duty-cycle of the uncorrected PWM signal is less than or equal to the maximum duty-cycle threshold, the duty-cycle of the PWM signal is about equal to the duty-cycle of the uncorrected PWM signal. The first switching power supply provides a first switching power supply output signal based on the PWM signal.

FIG. 110 shows details of the first switching power supply 450 illustrated in FIG. 74 according to one embodiment of the first switching power supply 450. The first switching power supply 450 illustrated in FIG. 110 is similar to the first switching power supply 450 illustrated in FIG. 87, except in the first switching power supply 450 illustrated in FIG. 110, the first power supply control signal FPCS provides a first power supply output control signal FPOC to the PWM circuitry 534, the PWM circuitry 534 receives the first clock signal FCLS, which is the ramping signal RMPS, and the first switching power supply 450 further includes converter switching circuitry 766. The converter switching circuitry 766 includes the charge pump buck switching circuitry 536, the buck switching circuitry 538, the first inductive element L1, the second inductive element L2, and the first power filtering circuitry 82. The PWM circuitry 534 provides the PWM signal PWMS based on the first power supply output control signal FPOC, the ramping signal RMPS, and the first switching power supply output signal FPSO.

FIG. 111 shows details of the first switching power supply 450 illustrated in FIG. 74 according to an alternate embodiment of the first switching power supply 450. The first switching power supply 450 illustrated in FIG. 111 is similar to the first switching power supply 450 illustrated in FIG. 89, except in the first switching power supply 450 illustrated in FIG. 111, the first power supply control signal FPCS provides the first power supply output control signal FPOC to the PWM circuitry 534, the PWM circuitry 534 receives the first clock signal FCLS, which is the ramping signal RMPS, and the first switching power supply 450 further includes the converter switching circuitry 766. The converter switching circuitry 766 includes the charge pump buck switching circuitry 536, the buck switching circuitry 538, the first inductive element L1, and the first power filtering circuitry 82. The PWM circuitry 534 provides the PWM signal PWMS based on the first power supply output control signal FPOC, the ramping signal RMPS, and the first switching power supply output signal FPSO.

FIG. 112 shows details of the first switching power supply 450 illustrated in FIG. 74 according to an additional embodiment of the first switching power supply 450. The first switching power supply 450 illustrated in FIG. 112 is a simplified representation of the first switching power supply 450. As such, embodiments of the first switching power supply 450 illustrated in FIG. 112 may be representative of the first switching power supply 450 illustrated in FIG. 72, FIG. 73, FIG. 74, FIG. 75, FIG. 87, FIG. 88, FIG. 89, FIG. 90, FIG. 91, the like, or any combination thereof. As previously mentioned, the first switching power supply 450 receives and converts the DC power supply signal DCPS to provide the first switching power supply output signal FPSO based on the setpoint.

In one embodiment of the DC-DC converter 32 (FIG. 74), the control circuitry 42 (FIG. 6) determines and provides the setpoint to the DC-DC control circuitry 90 (FIG. 74) via the envelope control signal ECS (FIG. 6). The DC-DC control circuitry 90 (FIG. 74) then provides the setpoint to the first switching power supply 450 via the first power supply control signal FPCS, which provides the first power supply output control signal FPOC to the PWM circuitry 534. As such, the first power supply output control signal FPOC is representative of the setpoint. In an alternate embodiment of the DC-DC converter 32 (FIG. 74), the DC-DC control circuitry 90 (FIG. 74) determines and provides the setpoint to the first switching power supply 450 via the first power supply control signal FPCS. The frequency synthesis circuitry 454 (FIG. 74) provides the first clock signal FCLS, which is the ramping signal RMPS, to the PWM circuitry 534.

The converter switching circuitry 766 receives and converts the DC power supply signal DCPS to provide the first switching power supply output signal FPSO based on the PWM signal PWMS, which is based on the setpoint. The first switching power supply output signal FPSO is fed back to the PWM circuitry 534, which further receives and processes the first power supply output control signal FPOC, which is based on the setpoint, and the ramping signal RMPS to provide the PWM signal PWMS. In this regard, the PWM circuitry 534 and the converter switching circuitry 766 combine to form a feedback loop, which has a loop gain.

FIG. 113 shows details of the PWM circuitry 534 illustrated in FIG. 112 according to one embodiment of the PWM circuitry 534. The PWM circuitry 534 includes a loop amplifier 768, a loop differential amplifier 770, a loop filter 772, and a PWM comparator 774. The loop amplifier 768 receives and amplifies the first switching power supply output signal FPSO to provide an amplified first power supply output signal AFPO to an inverting input to the loop differential amplifier 770. The loop differential amplifier 770 has a non-inverting input, which receives the first power supply output control signal FPOC. The loop differential amplifier 770 provides an error signal ERS based on a difference between the first power supply output control signal FPOC and the amplified first power supply output signal AFPO. The loop filter 772 receives and filters the error signal ERS to provide a filtered error signal FERS to a non-inverting input to the PWM comparator 774. The PWM comparator 774 has an inverting input, which receives the ramping signal RMPS. The PWM comparator 774 provides the PWM signal PWMS to the converter switching circuitry 766 based on a comparison of the filtered error signal FERS and the ramping signal RMPS. Specifically, when the ramping signal RMPS is greater than the filtered error signal FERS, the PWM signal PWMS is driven low. When the ramping signal RMPS is less than the filtered error signal FERS, the PWM signal PWMS is driven high. Alternate embodiments of the PWM circuitry 534 may reverse the polarity of the PWM comparator 774, the polarity of the loop differential amplifier 770, or both.

The loop amplifier 768, the loop differential amplifier 770, the loop filter 772, the PWM comparator 774, and the converter switching circuitry 766 form the feedback loop, which has the loop gain based on a gain or attenuation of each component in the feedback loop. The loop amplifier 768 may have a gain that is equal to, less than, or greater than one. Since the first power supply output control signal FPOC is representative of the setpoint, by amplifying the difference between the first power supply output control signal FPOC and the amplified first power supply output signal AFPO, the loop differential amplifier 770 operates to drive the first switching power supply output signal FPSO toward the setpoint via the error signal ERS. The loop filter 772 operates to provide loop stability. The PWM signal PWMS is a digital signal that has a duty-cycle based on a relationship between the ramping signal RMPS and the filtered error signal FERS. In one embodiment of the PWM signal PWMS, an increasing duty-cycle drives the first switching power supply output signal FPSO in a positive direction. In an alternate embodiment of the PWM signal PWMS, an increasing duty-cycle drives the first switching power supply output signal FPSO in a negative direction.

FIG. 114A and FIG. 114B are graphs showing a relationship between the PWM signal PWMS and the first switching power supply output signal FPSO, respectively, according to one embodiment of the first switching power supply 450. The PWM signal PWMS shown in FIG. 114A has a switching period 776 and multiples of a negative pulse 778, such that each switching period 776 has a corresponding negative pulse. Each negative pulse 778 has a pulse width 780. As such, the duty-cycle of the PWM signal PWMS is equal to the pulse width 780 divided by the switching period 776. As the pulse width 780 increases, the duty-cycle of the PWM signal PWMS increases, which drives the first switching power supply output signal FPSO in a positive direction, as shown in FIGS. 114A and 1148. In alternate embodiments (not shown) of the first switching power supply 450, as the pulse width 780 decreases, the duty-cycle of the PWM signal PWMS decreases, which drives the first switching power supply output signal FPSO in a positive direction.

FIG. 115 shows details of the PWM circuitry 534 illustrated in FIG. 112 according to an alternate embodiment of the PWM circuitry 534. The PWM circuitry 534 illustrated in FIG. 115 is similar to the PWM circuitry 534 illustrated in FIG. 113, except the PWM circuitry 534 illustrated in FIG. 115 further includes signal conditioning circuitry 782. The signal conditioning circuitry 782 receives the first power supply output control signal FPOC and provides a conditioned first power supply output control signal CFPO to the non-inverting input to the loop differential amplifier 770 instead of providing the first power supply output control signal FPOC to the non-inverting input to the loop differential amplifier 770. As such, the first switching power supply output signal FPSO is further based on the conditioned first power supply output control signal CFPO.

In one embodiment of the first switching power supply 450, the first switching power supply 450 may be capable of providing amplitudes of the first switching power supply output signal FPSO that are high enough to damage a load that is coupled to the first switching power supply 450. The load may include the RF PA circuitry 30 (FIG. 6). As such, the first switching power supply 450 may limit the setpoint of the first switching power supply output signal FPSO to prevent damage to the load. In this regard, the first switching power supply 450 may provide the conditioned first power supply output control signal CFPO based on applying a limit to the first power supply output control signal FPOC.

FIG. 116 is a graph showing an unlimited embodiment 784 of the first power supply output control signal FPOC (FIG. 115), a hard limited embodiment 786 of the conditioned first power supply output control signal CFPO (FIG. 115) based on a limit threshold 788, and a soft limited embodiment 790 of the conditioned first power supply output control signal CFPO (FIG. 115) based on the limit threshold 788. If no limits are applied to the unlimited embodiment 784 of the first power supply output control signal FPOC (FIG. 115), the first switching power supply 450 (FIG. 115) may damage the load, as previously mentioned. In one embodiment of the first switching power supply 450 (FIG. 115), as illustrated in the hard limited embodiment 786, the signal conditioning circuitry 782 (FIG. 115) applies a hard limit to the first power supply output control signal FPOC to provide the conditioned first power supply output control signal CFPO, such that for any values of the first power supply output control signal FPOC exceeding the limit threshold 788, the conditioned first power supply output control signal CFPO is limited to the limit threshold 788. In one embodiment of the first switching power supply 450 (FIG. 115), the limit threshold 788 is programmable via the first power supply control signal FPCS (FIG. 115).

In an alternate embodiment of the first switching power supply 450 (FIG. 115), as illustrated in the soft limited embodiment 790, the signal conditioning circuitry 782 (FIG. 115) applies a soft limit to the first power supply output control signal FPOC to provide the conditioned first power supply output control signal CFPO. In the soft limited embodiment 790, as values of the first power supply output control signal FPOC approach or exceed the limit threshold 788, the conditioned first power supply output control signal CFPO is limited based on the limit threshold 788. In general, in the soft limited embodiment 790, when the first power supply output control signal FPOC is in proximity to or exceeds the limit threshold 788, the conditioned first power supply output control signal CFPO is limited based on the limit threshold 788.

Returning to FIG. 115, in general, as previously presented, the DC-DC control circuitry 90 (FIG. 74) provides the first power supply output control signal FPOC, which is representative of the setpoint of the first switching power supply output signal FPSO. The first switching power supply 450 applies a limit to the first power supply output control signal FPOC based on the limit threshold 788 (FIG. 116) to provide the conditioned first power supply output control signal CFPO. The first switching power supply 450 provides the first switching power supply output signal FPSO based on the conditioned first power supply output control signal CFPO, such that the setpoint of the first switching power supply output signal FPSO is limited based on the limit threshold 788 (FIG. 116).

In an additional embodiment of the first switching power supply 450, the first switching power supply 450 may be capable of providing slew rates of the first switching power supply output signal FPSO that are high enough to create surge currents that may disrupt the RF communications system 26 (FIG. 6). As such, the first switching power supply 450 may slew rate limit the setpoint of the first switching power supply output signal FPSO to prevent system disruption. In this regard, the first switching power supply 450 may provide the conditioned first power supply output control signal CFPO based on applying a slew rate limit to the first power supply output control signal FPOC.

FIG. 117A and FIG. 117B are graphs illustrating the first power supply output control signal FPOC and the conditioned first power supply output control signal CFPO, respectively, illustrated in FIG. 115, according to one embodiment of the first switching power supply 450 (FIG. 115). The first power supply output control signal FPOC illustrated in FIG. 117A has a slew rate 792 that exceeds a slew rate threshold 794. As such, If no slew rate limits are applied to the first power supply output control signal FPOC, the first switching power supply 450 (FIG. 115) may have disruptive surge currents, as previously mentioned. In one embodiment of the first switching power supply 450 (FIG. 115), the signal conditioning circuitry 782 (FIG. 115) applies a slew rate limit 796 to the first power supply output control signal FPOC to provide the conditioned first power supply output control signal CFPO, such that when the slew rate 792 of the first power supply output control signal FPOC exceeds the slew rate threshold 794, the conditioned first power supply output control signal CFPO is limited to the slew rate limit 796. In one embodiment of the first switching power supply 450 (FIG. 115), the slew rate threshold 794 is programmable via the first power supply control signal FPCS (FIG. 115). Further, in one embodiment of the first switching power supply 450 (FIG. 115), the slew rate limit 796 is about equal to the slew rate threshold 794.

Returning to FIG. 115, in general, as previously presented, the DC-DC control circuitry 90 (FIG. 74) provides the first power supply output control signal FPOC, which is representative of the setpoint of the first switching power supply output signal FPSO. The first switching power supply 450 applies the slew rate limit 796 (FIG. 117B) to the first power supply output control signal FPOC based on the slew rate threshold 794 (FIG. 117A) to provide the conditioned first power supply output control signal CFPO. The first switching power supply 450 provides the first switching power supply output signal FPSO based on the conditioned first power supply output control signal CFPO, such that the setpoint of the first switching power supply output signal FPSO is slew rate limited based on the slew rate threshold 794 (FIG. 117A). In another embodiment of the first switching power supply 450, the first switching power supply 450 applies both the slew rate limit 796 (FIG. 117B) and the limit to the first power supply output control signal FPOC based on the limit threshold 788 (FIG. 116) to provide the conditioned first power supply output control signal CFPO.

FIG. 118 shows details of the PWM circuitry 534 illustrated in FIG. 112 according to another embodiment of the PWM circuitry 534. The PWM circuitry 534 illustrated in FIG. 118 is similar to the PWM circuitry 534 illustrated in FIG. 115, except the PWM circuitry 534 illustrated in FIG. 118 further includes error signal correction circuitry 798. The error signal correction circuitry 798 receives and corrects the filtered error signal FERS to provide a corrected error signal CERS to the non-inverting input to the PWM comparator 774 instead of providing the filtered error signal FERS to the non-inverting input to the PWM comparator 774. As such, the first switching power supply output signal FPSO is further based on the corrected error signal CERS. In an alternate embodiment of the PWM circuitry 534, the signal conditioning circuitry 782 is omitted.

In one embodiment of the first switching power supply 450, the loop filter 772 may be capable of providing amplitudes of the filtered error signal FERS that are below a minimum operating input amplitude of the PWM comparator 774. When the non-inverting input to the PWM comparator 774 is driven below its minimum operating input amplitude, such as right after power-up, the PWM signal PWMS may be driven low until the loop filter 772 has an opportunity to catch-up. As such, to keep the non-inverting input to the PWM comparator 774 within its normal operating range, when the filtered error signal FERS is below a minimum limit threshold, the error signal correction circuitry 798 applies the minimum limit to the filtered error signal FERS to provide the corrected error signal CERS. The minimum limit threshold is based on the minimum operating input amplitude of the PWM comparator 774. In this regard, when the error signal correction circuitry 798 is operating, the corrected error signal CERS does not drop below the minimum limit. The minimum limit may be about equal to the minimum limit threshold.

In general, the PWM comparator 774 has the minimum operating input amplitude. The PWM comparator 774 receives the corrected error signal CERS and provides the PWM signal PWMS based on the corrected error signal CERS. The error signal correction circuitry 798 applies the minimum limit to the filtered error signal FERS based on the minimum limit threshold to provide the corrected error signal CERS. The minimum limit threshold is based on the minimum operating input amplitude. The first switching power supply 450 provides the first switching power supply output signal FPSO based on the PWM signal PWMS.

FIG. 119A and FIG. 119B are graphs showing the second buck output signal SBO and the first buck output signal FBO, respectively, illustrated in FIG. 89 according to one embodiment of the first switching power supply 450. The first switching power supply 450 (FIG. 89) includes the charge pump buck power supply 526 (FIG. 89) and the buck power supply 528 (FIG. 89). The charge pump buck power supply 526 (FIG. 89) includes the PWM circuitry 534 (FIG. 89), the charge pump buck switching circuitry 536 (FIG. 89), the first inductive element L1 (FIG. 89), and the first power filtering circuitry 82 (FIG. 89). As such, during the first converter operating mode, the PWM circuitry 534 (FIG. 89), the charge pump buck switching circuitry 536 (FIG. 89), the first inductive element L1 (FIG. 89), and the first power filtering circuitry 82 (FIG. 89) combine to form a first feedback loop, which has a first loop gain. The buck power supply 528 (FIG. 89) includes the PWM circuitry 534 (FIG. 89), the buck switching circuitry 538 (FIG. 89), the first inductive element L1 (FIG. 89), and the first power filtering circuitry 82 (FIG. 89). As such, during the second converter operating mode, the PWM circuitry 534 (FIG. 89), the buck switching circuitry 538 (FIG. 89), the first inductive element L1 (FIG. 89), and the first power filtering circuitry 82 (FIG. 89) combine to form a second feedback loop, which has a second loop gain.

During the first converter operating mode, the charge pump buck switching circuitry 536 (FIG. 89) provides the first buck output signal FBO. During the second converter operating mode, the buck switching circuitry 538 (FIG. 89) provides the second buck output signal SBO. FIG. 119A shows the second buck output signal SBO during the second converter operating mode. The second buck output signal SBO has the switching period 776, the pulse width 780, and a second amplitude 800. FIG. 119B shows the first buck output signal FBO just after the first switching power supply 450 (FIG. 89) transitions from the second converter operating mode to the first converter operating mode. As such, the first buck output signal FBO has the switching period 776, the pulse width 780, and a first amplitude 802. The switching period 776 illustrated in FIG. 119A is about equal to the switching period 776 illustrated in FIG. 119B. The pulse width 780 illustrated in FIG. 119A is temporarily about equal to the pulse width 780 illustrated in FIG. 119B.

However, since the charge pump buck switching circuitry 536 (FIG. 89) may be capable of providing of providing an output voltage on the order of two times the DC power supply voltage DCPV (FIG. 57), and since the buck switching circuitry 538 (FIG. 89) may be capable of providing an output voltage on the order of the DC power supply voltage DCPV (FIG. 57), the first amplitude 802 may be on the order of about two times the second amplitude 800. As a result, the first loop gain may be equal to about two times the second loop gain. This shift in loop gain will cause a shift in the first switching power supply output signal FPSO (FIG. 89), which will cause a shift in the filtered error signal FERS (FIG. 113), thereby causing a shift in the duty-cycle of the PWM signal PWMS (FIG. 113) to compensate for the amplitude shift from the second amplitude 800 to the first amplitude 802. However, delays introduced by the first power filtering circuitry 82 (FIG. 89) and the loop filter 772 (FIG. 113) will cause an error in the first switching power supply output signal FPSO (FIG. 89). Thus, there is a need to switch between the first converter operating mode and the second converter operating mode without causing an error in the first switching power supply output signal FPSO (FIG. 89).

As such, during the first converter operating mode, the charge pump buck power supply 526 (FIG. 89) provides the first switching power supply output signal FPSO (FIG. 89) to a load, such as the RF PA circuitry 30 (FIG. 6), based on the setpoint, such that the charge pump buck power supply 526 (FIG. 89) has the first loop gain and the PWM circuitry 534 (FIG. 89) operates with a first PWM duty-cycle. During the second converter operating mode, the buck power supply 528 (FIG. 89) provides the first switching power supply output signal FPSO (FIG. 89) to the load based on the setpoint, such that the buck power supply 528 (FIG. 89) has the second loop gain and the PWM circuitry 534 (FIG. 89) operates with a second PWM duty-cycle. When transitioning between the first converter operating mode and the second converter operating mode, the PWM circuitry 534 (FIG. 89) switches between the first PWM duty-cycle and the second PWM duty-cycle to compensate for a difference between the first loop gain and the second loop gain. In one embodiment of the first switching power supply 450 (FIG. 89), the switch between the first PWM duty-cycle and the second PWM duty-cycle is not based on a change in the first switching power supply output signal FPSO (FIG. 89).

Returning to FIG. 118, the PWM comparator 774 receives the corrected error signal CERS, such that when transitioning between the first converter operating mode and the second converter operating mode, the PWM circuitry 534 switches between the first PWM duty-cycle and the second PWM duty-cycle by shifting the corrected error signal CERS. Specifically, the error signal correction circuitry 798 shifts the corrected error signal CERS in response to the transition between the first converter operating mode and the second converter operating mode. In an alternate embodiment of the PWM circuitry 534, the error signal correction circuitry 798 both applies the minimum limit to the filtered error signal FERS to provide the corrected error signal CERS and shifts the corrected error signal CERS in response to the transition between the first converter operating mode and the second converter operating mode.

FIG. 120 shows details of the PWM circuitry 534 illustrated in FIG. 112 according to one embodiment of the PWM circuitry 534. The PWM circuitry 534 illustrated in FIG. 120 is similar to the PWM circuitry 534 illustrated in FIG. 118, except the PWM circuitry 534 illustrated in FIG. 120 further includes ramping signal correction circuitry 804. The ramping signal correction circuitry 804 receives and corrects the ramping signal RMPS to provide a corrected ramping signal CRMP to the inverting input to the PWM comparator 774 instead of providing the ramping signal RMPS to the inverting input to the PWM comparator 774. As such, the first switching power supply output signal FPSO is further based on the corrected ramping signal CRMP. In alternate embodiments of the PWM circuitry 534, the signal conditioning circuitry 782, the error signal correction circuitry 798, or both may be omitted.

The PWM comparator 774 receives the corrected ramping signal CRMP, such that when transitioning between the first converter operating mode and the second converter operating mode, the PWM circuitry 534 switches between the first PWM duty-cycle and the second PWM duty-cycle by adjusting the corrected ramping signal CRMP. Specifically, the ramping signal correction circuitry 804 adjusts the corrected ramping signal CRMP in response to the transition between the first converter operating mode and the second converter operating mode.

FIG. 121 shows details of the PWM circuitry 534 illustrated in FIG. 112 according to one embodiment of the PWM circuitry 534. The PWM circuitry 534 illustrated in FIG. 121 is similar to the PWM circuitry 534 illustrated in FIG. 120, except the PWM circuitry 534 illustrated in FIG. 121 further includes PWM signal correction circuitry 806. The PWM comparator 774 provides an uncorrected PWM signal UPWM instead of providing the PWM signal PWMS to the converter switching circuitry 766. The PWM signal correction circuitry 806 receives and corrects the uncorrected PWM signal UPWM to provide the PWM signal PWMS to the converter switching circuitry 766. As such, the first switching power supply output signal FPSO is further based on the uncorrected PWM signal UPWM. In alternate embodiments of the PWM circuitry 534, the signal conditioning circuitry 782, the error signal correction circuitry 798, the ramping signal correction circuitry 804, or any combination thereof may be omitted.

The converter switching circuitry 766 receives the PWM signal PWMS, such that when transitioning between the first converter operating mode and the second converter operating mode, the PWM circuitry 534 switches between the first PWM duty-cycle and the second PWM duty-cycle by adjusting the PWM signal PWMS. Specifically, the PWM signal correction circuitry 806 adjusts the PWM signal PWMS in response to the transition between the first converter operating mode and the second converter operating mode. In a further embodiment of the PWM circuitry 534, the PWM circuitry 534 switches between the first PWM duty-cycle and the second PWM duty-cycle based on at least two of the error signal correction circuitry 798, the ramping signal correction circuitry 804, and the PWM signal correction circuitry 806.

FIG. 122A and FIG. 122B are graphs showing the uncorrected PWM signal UPWM and the PWM signal PWMS, respectively, of the PWM circuitry 534 illustrated in FIG. 121 according to one embodiment of the PWM circuitry 534. The uncorrected PWM signal UPWM and the PWM signal PWMS each have the switching period 776 and multiples of the negative pulse 778, such that each negative pulse 778 has the pulse width 780. The pulse width 780 of the uncorrected PWM signal UPWM is increasing with time until the pulse width 780 is stretched out indefinitely. If such a condition occurs during the first converter operating mode, the first PWM duty-cycle is equal to 100 percent. Such a condition may exist when the first switching power supply 450 (FIG. 121) provides the first switching power supply output signal FPSO (FIG. 121) with insufficient magnitude as specified by the setpoint, which is represented by the first power supply output control signal FPOC (FIG. 121). During the first converter operating mode, the first switching power supply 450 (FIG. 121) may function improperly when the first PWM duty-cycle is equal to 100 percent. During the first converter operating mode, the charge pump buck converter 84 (FIG. 74) is active. As such, the charge pump buck converter 84 (FIG. 74) may require transitions of the PWM signal PWMS (FIG. 121) to function properly. Such transitions may provide charge pumping action that does not occur when the first PWM duty-cycle is equal to 100 percent.

In this regard, when a duty-cycle of the uncorrected PWM signal UPWM exceeds a maximum duty-cycle threshold, the PWM signal correction circuitry 806 receives and corrects the uncorrected PWM signal UPWM to provide the PWM signal PWMS having a duty-cycle that is about equal to the maximum duty-cycle threshold, as shown in FIG. 122B. Under such conditions, the PWM signal PWMS has a maximum pulse width 808 for each negative pulse 778. In general, the PWM comparator 774 (FIG. 121) provides the uncorrected PWM signal UPWM based on a comparison between the ramping signal RMPS (FIG. 121) and the filtered error signal FERS (FIG. 121). When the duty-cycle of the uncorrected PWM signal UPWM exceeds the maximum duty-cycle threshold, the duty-cycle of the PWM signal PWMS is about equal to the maximum duty-cycle threshold. When the duty-cycle of the uncorrected PWM signal UPWM is less than or equal to the maximum duty-cycle threshold, the duty-cycle of the PWM signal PWMS is about equal to the duty-cycle of the uncorrected PWM signal UPWM. The first switching power supply 450 (FIG. 121) provides the first switching power supply output signal FPSO (FIG. 121) based on the PWM signal PWMS.

In one embodiment of the first switching power supply 450 (FIG. 121), when the duty-cycle of the uncorrected PWM signal UPWM exceeds the maximum duty-cycle threshold, the duty-cycle of the PWM signal PWMS is about equal to the maximum duty-cycle threshold during both the first converter operating mode and the second converter operating mode. In an alternate embodiment of the first switching power supply 450 (FIG. 121), when the duty-cycle of the uncorrected PWM signal UPWM exceeds the maximum duty-cycle threshold, the duty-cycle of the PWM signal PWMS is about equal to the maximum duty-cycle threshold only during the first converter operating mode. During the second converter operating mode, the duty-cycle of the PWM signal PWMS is about equal to the duty-cycle of the uncorrected PWM signal UPWM.

Returning to FIG. 121, in one embodiment of the first switching power supply 450, the PWM signal correction circuitry 806 corrects for both when the duty-cycle of the uncorrected PWM signal UPWM exceeds the maximum duty-cycle threshold and switches between the first PWM duty-cycle and the second PWM duty-cycle in response to the transition between the first converter operating mode and the second converter operating mode.

In one embodiment of the first switching power supply 450, the PWM comparator 774 provides the uncorrected PWM signal UPWM based on a direct comparison between the corrected ramping signal CRMP and the corrected error signal CERS as shown in FIG. 121. In an alternate embodiment of the first switching power supply 450, the error signal correction circuitry 798 is omitted, such that the PWM comparator 774 provides the uncorrected PWM signal UPWM based on a direct comparison between the corrected ramping signal CRMP and the filtered error signal FERS. In an additional embodiment of the first switching power supply 450, the ramping signal correction circuitry 804 is omitted, such that the PWM comparator 774 provides the uncorrected PWM signal UPWM based on a direct comparison between the ramping signal RMPS and the corrected error signal CERS. In another embodiment of the first switching power supply 450, both the error signal correction circuitry 798 and the ramping signal correction circuitry 804 are omitted, such that the PWM comparator 774 provides the uncorrected PWM signal UPWM based on a direct comparison between the ramping signal RMPS and the filtered error signal FERS.

Feedback Based Buck Timing of a DC-DC Converter

A summary of feedback based buck timing of a DC-DC converter is presented followed by a detailed description of the feedback based buck timing of the DC-DC converter. Embodiments of the present disclosure relate to at least a first shunt switching element and switching control circuitry of a first switching power supply. At least the first shunt switching element is coupled between a ground and an output inductance node of the first switching power supply. The first switching power supply provides a buck output signal from the output inductance node. The switching control circuitry selects one of an ON state and an OFF state of the first shunt switching element. When the buck output signal is above a first threshold, the switching control circuitry is inhibited from selecting the ON state of the first shunt switching element. The first switching power supply provides a first switching power supply output signal based on the buck output signal. By using feedback based on the buck output signal, the switching control circuitry may refine the timing of switching between series switching elements and shunt switching elements to increase efficiency.

FIG. 123 shows the DC power supply 80 illustrated in FIG. 74 and details of the converter switching circuitry 766 illustrated in FIG. 112 according to one embodiment of the converter switching circuitry 766. The converter switching circuitry 766 includes switching circuitry 810, which includes switching control circuitry 812, series switching circuitry 814, and a first shunt switching element 816. Additionally, the switching circuitry 810 has an output inductance node 818. The series switching circuitry 814 is coupled between the DC power supply 80 and the output inductance node 818. The first shunt switching element 816 is coupled between the output inductance node 818 and a ground.

The DC power supply 80 provides the DC power supply signal DCPS to the series switching circuitry 814. The switching control circuitry 812 receives the PWM signal PWMS and provides a first shunt control signal SCS1 to the first shunt switching element 816 and a first series control signal RCS1 to the series switching circuitry 814. The switching circuitry 810 provides a buck output signal BOS from the output inductance node 818. The buck output signal BOS is fed back to the switching control circuitry 812. As such, the switching control circuitry 812 provides the first series control signal RCS1 and the first shunt control signal SCS1 based on the PWM signal PWMS and the buck output signal BOS. The first shunt switching element 816 operates in one of an ON state and an OFF state based on the first shunt control signal SCS1. As such, the switching control circuitry 812 selects the one of the ON state and the OFF state of the first shunt switching element 816 via the first shunt control signal SCS1.

The series switching circuitry 814 includes at least one series switching element (not shown) coupled in series between the DC power supply 80 and the output inductance node 818. A first series switching element (not shown) operates in one of an ON state and an OFF state based on the first series control signal RCS1. For proper operation, only one of the first shunt switching element 816 and the first series switching element (not shown) is allowed to be in the ON state at any time. Otherwise, a high current path between the DC power supply 80 and the ground may be present, thereby reducing efficiency. As a result, the switching control circuitry 812 provides the first series control signal RCS1 and the first shunt control signal SCS1, such that only one of the first shunt switching element 816 and the first series switching element (not shown) is allowed to be in the ON state at any time.

When the switching control circuitry 812 selects the OFF state of the first series switching element (not shown), an inductive element current (not shown), such as the first inductive element current ID (FIG. 87), may drive the buck output signal BOS toward ground. As a result, a parasitic diode across the first shunt switching element 816 may come into conduction to provide the inductive element current (not shown). When the buck output signal BOS drops below a first threshold, the switching control circuitry 812 uses the buck output signal BOS, which is a feedback signal, as verification that the first series switching element (not shown) is in the OFF state. As such, the switching control circuitry 812 selects the ON state of the first shunt switching element 816 via the first shunt control signal SCS1. By using the buck output signal BOS as a feedback signal, the switching control circuitry 812 may be able to select the ON state of the first shunt switching element 816 more quickly. Since a voltage drop across the first shunt switching element 816 in the ON state may be less than a voltage drop across the parasitic diode when the first shunt switching element 816 is in the OFF state, rapid selection of the ON state of the first shunt switching element 816 may increase efficiency. In this regard, when the buck output signal BOS is above the first threshold, the switching control circuitry 812 is inhibited from selecting the ON state of the first shunt switching element 816.

In one embodiment of the switching circuitry 810, the buck output signal BOS is the first buck output signal FBO (FIG. 92), the first shunt control signal SCS1 is the first shunt pump buck control signal PBN1 (FIG. 94), the switching control circuitry 812 is the charge pump buck switching control circuitry 540 (FIG. 92), the first shunt switching element 816 is the first shunt pump buck switching element 582 (FIG. 94), and the output inductance node 818 is the first output inductance node 460 (FIG. 94).

In an alternate embodiment of the switching circuitry 810, the buck output signal BOS is the second buck output signal SBO (FIG. 92), the first shunt control signal SCS1 is the first shunt buck control signal BN1 (FIG. 92), the first series control signal RCS1 is the first series buck control signal BS1 (FIG. 92), the switching control circuitry 812 is the buck switching control circuitry 544 (FIG. 92), the first shunt switching element 816 is the first shunt buck switching element 554 (FIG. 92), and the output inductance node 818 is the second output inductance node 462 (FIG. 92).

FIG. 124 shows the DC power supply 80 illustrated in FIG. 74 and details of the converter switching circuitry 766 illustrated in FIG. 112 according to an alternate embodiment of the converter switching circuitry 766. The converter switching circuitry 766 illustrated in FIG. 124 is similar to the converter switching circuitry 766 illustrated in FIG. 123, except the switching circuitry 810 illustrated in FIG. 124 further includes a second shunt switching element 820 coupled in series with the first shunt switching element 816 between the output inductance node 818 and the ground. The switching control circuitry 812 provides a second shunt control signal SCS2 to the second shunt switching element 820. Instead of the buck output signal BOS being fed back to the switching control circuitry 812, a sub-buck output signal SBOS is fed back to the switching control circuitry 812. As such, a series coupling of the first shunt switching element 816 and the second shunt switching element 820 provides the sub-buck output signal SBOS. Specifically, a connection node between the first shunt switching element 816 and the second shunt switching element 820 provides the sub-buck output signal SBOS. For purposes of providing feedback, the sub-buck output signal SBOS is representative of the buck output signal BOS.

In one embodiment of the first shunt switching element 816, the first shunt switching element 816 is an NMOS transistor element. In one embodiment of the second shunt switching element 820, the second shunt switching element 820 is an NMOS transistor element. In one embodiment of the switching circuitry 810, the buck output signal BOS is the first buck output signal FBO (FIG. 92), the first shunt control signal SCS1 is the first shunt pump buck control signal PBN1 (FIG. 94), the second shunt control signal SCS2 is the second shunt pump buck control signal PBN2 (FIG. 94), the switching control circuitry 812 is the charge pump buck switching control circuitry 540 (FIG. 92), the first shunt switching element 816 is the first shunt pump buck switching element 582 (FIG. 94), the second shunt switching element 820 is the second shunt pump buck switching element 584 (FIG. 94), and the output inductance node 818 is the first output inductance node 460 (FIG. 94).

In an alternate embodiment of the switching circuitry 810, the buck output signal BOS is the second buck output signal SBO (FIG. 92), the first shunt control signal SCS1 is the first shunt buck control signal BN1 (FIG. 92), the second shunt control signal SCS2 is the second shunt buck control signal BN2 (FIG. 92), the first series control signal RCS1 is the first series buck control signal BS1 (FIG. 92), the switching control circuitry 812 is the buck switching control circuitry 544 (FIG. 92), the first shunt switching element 816 is the first shunt buck switching element 554 (FIG. 92), the second shunt switching element 820 is the second shunt buck switching element 556 (FIG. 92), and the output inductance node 818 is the second output inductance node 462 (FIG. 92).

In general, at least the first shunt switching element 816 is coupled between the ground and the output inductance node 818 of the first switching power supply 450 (FIG. 112). The first switching power supply 450 (FIG. 112) provides the buck output signal BOS from the output inductance node 818. The switching control circuitry 812 selects one of the ON state and the OFF state of the first shunt switching element 816. When the buck output signal BOS is above the first threshold, the switching control circuitry 812 is inhibited from selecting the ON state of the first shunt switching element 816. The first switching power supply 450 (FIG. 112) provides the first switching power supply output signal FPSO based on the buck output signal BOS. By using feedback based on the buck output signal BOS, the switching control circuitry 812 may refine the timing of switching between series switching elements and shunt switching elements to increase efficiency.

Two-State Power Supply Based Level Shifter

A summary of a two-state power supply based level shifter is followed by a detailed description of the two-state power supply based level shifter. The present disclosure relates to a first switching power supply and a two-state level shifter. The first switching power supply provides a two-state DC output signal from a two-state output. During a first converter operating mode of the first switching power supply, the two-state DC output signal has a first voltage magnitude and during a second converter operating mode of the first switching power supply, the two-state DC output signal has a second voltage magnitude, which is on the order of about one-half of the first voltage magnitude. The two-state level shifter includes a first group of switching elements coupled in series between the two-state output and a ground. The first group of switching elements provides a level shifter output signal based on a level shifter input signal. During the first converter operating mode, a voltage swing of the level shifter output signal is equal to about the first voltage magnitude. During the second converter operating mode, the voltage swing of the level shifter output signal is equal to about the second voltage magnitude. A maximum voltage magnitude across any of the first group of switching elements is about equal to the second voltage magnitude.

FIG. 125 shows details of the first switching power supply 450 illustrated in FIG. 91, the DC power supply 80 illustrated in FIG. 94, and a two-state level shifter 822 according to one embodiment of the first switching power supply 450, the DC power supply 80, and the two-state level shifter 822. The first switching power supply 450 includes a two-state power supply 824, which is coupled between the CMOS well CWELL illustrated in FIG. 94 and a two-state output 826 of the first switching power supply 450. The two-state power supply 824 includes a two-state capacitive element CTS coupled between the two-state output 826 and a ground. The CMOS well CWELL is coupled to the first output inductance node 460 (FIG. 94) through a diode drop in the second series alpha switching element 598 (FIG. 94) and a diode drop in the second series beta switching element 600 (FIG. 94). The diode drop and the two-state capacitive element CTS form the two-state power supply 824, which peak picks and filters the first buck output signal FBO (FIG. 92) to provide a two-state DC output signal DCTS from the two-state output 826.

In this regard, during the first converter operating mode, since the first output inductance node 460 (FIG. 94) has a peak voltage on the order of about two times the DC power supply voltage DCPV (FIG. 57), the two-state DC output signal DOTS has a first voltage magnitude on the order of about two times the DC power supply voltage DCPV (FIG. 57). During the second converter operating mode, since the first output inductance node 460 (FIG. 94) has a peak voltage on the order of about the DC power supply voltage DCPV (FIG. 57), the two-state DC output signal DOTS has a second voltage magnitude on the order of about the DC power supply voltage DCPV (FIG. 57). As such, the second voltage magnitude is on the order of about one-half of the first voltage magnitude.

The two-state level shifter 822 receives the DC power supply signal DCPS and the two-state DC output signal DOTS. Further, the two-state level shifter 822 receives and level shifts a level shifter input signal LSIS to provide a level shifter output signal LSOS based on the DC power supply signal DCPS and the two-state DC output signal DOTS. During the first converter operating mode, a voltage swing of the level shifter output signal LSOS is equal to about the first voltage magnitude. During the second converter operating mode, the voltage swing of the level shifter output signal LSOS is equal to about the second voltage magnitude. In one embodiment of the two-state level shifter 822, a voltage swing of the level shifter input signal LSIS is equal to about the second voltage magnitude. In an alternate embodiment of the two-state level shifter 822, the voltage swing of the level shifter input signal LSIS is equal to any voltage magnitude.

FIG. 126 shows details of the first switching power supply 450 illustrated in FIG. 91 and the DC power supply 80 illustrated in FIG. 94 according to an alternate embodiment of the first switching power supply 450. The first switching power supply 450 illustrated in FIG. 126 is similar to the first switching power supply 450 illustrated in FIG. 125, except the first switching power supply 450 illustrated in FIG. 126 further includes the two-state level shifter 822. Specifically, the first switching power supply 450 includes the buck switching circuitry 538 illustrated in FIG. 92. The buck switching circuitry 538 includes the buck switching control circuitry 544 illustrated in FIG. 92. The buck switching control circuitry 544 includes the two-state level shifter 822. The buck switching control circuitry 544 provides the level shifter input signal LSIS to the two-state level shifter 822, which provides the level shifter output signal LSOS, which is the first series buck control signal BS1 as illustrated in FIG. 92.

The first series buck control signal BS1 controls the first series buck switching element 558 (FIG. 92). As such, during the first converter operating mode, since the first series buck switching element 558 is part of the buck switching circuitry 538, the first series buck switching element 558 (FIG. 92) is OFF. Therefore, the first series buck control signal BS1 must have the first voltage magnitude to select the first series buck switching element 558 (FIG. 92) to be OFF. However, during the second converter operating mode, the first series buck switching element 558 (FIG. 92) is selected to be ON or OFF, as needed. Therefore, the first series buck control signal BS1 must have a voltage swing about equal to the second voltage magnitude. In this regard, the two-state level shifter 822 provides appropriate level shifting for both the first converter operating mode and the second converter operating mode.

FIG. 127 shows details of the two-state level shifter 822 illustrated in FIG. 125 according to one embodiment of the two-state level shifter 822. The two-state level shifter 822 includes a first group 828 of switching elements, a second group 830 of switching elements, cascode bias circuitry 832, a level shifter inverter 834, a level shifter resistive element RLS, and a level shifter diode element CRL. The first group 828 of switching elements includes a first level shifter switching element 836, a second level shifter switching element 838, a third level shifter switching element 840, and a fourth level shifter switching element 842. The second group 830 of switching elements includes a fifth level shifter switching element 844, a sixth level shifter switching element 846, a seventh level shifter switching element 848, and an eighth level shifter switching element 850.

The first group 828 of switching elements is coupled in series between the two-state output 826 and the ground. Specifically, the first level shifter switching element 836, the second level shifter switching element 838, the third level shifter switching element 840, and the fourth level shifter switching element 842 are coupled in series between the two-state output 826 and the ground. The second group 830 of switching elements is coupled in series between the two-state output 826 and the ground. Specifically, the fifth level shifter switching element 844, the sixth level shifter switching element 846, the seventh level shifter switching element 848, and the eighth level shifter switching element 850 are coupled in series between the two-state output 826 and the ground. The cascode bias circuitry 832 is coupled between the DC power supply 80 and the two-state output 826. The level shifter resistive element RLS and the level shifter diode element CRL are coupled in series across the DC power supply 80. Specifically, a cathode of the level shifter diode element CRL is coupled to the DC power supply 80 and the level shifter resistive element RLS is coupled between an anode of the level shifter diode element CRL and the ground.

Each of the first level shifter switching element 836, the second level shifter switching element 838, the fifth level shifter switching element 844, and the sixth level shifter switching element 846 may be an NMOS transistor element. Each of the third level shifter switching element 840, the fourth level shifter switching element 842, the seventh level shifter switching element 848, and the eighth level shifter switching element 850 may be a PMOS transistor element. Bodies of the first level shifter switching element 836, the second level shifter switching element 838, the fifth level shifter switching element 844, and the sixth level shifter switching element 846 are coupled to the anode of the level shifter diode element CRL, which provides an NMOS body bias signal NBS to the first level shifter switching element 836, the second level shifter switching element 838, the fifth level shifter switching element 844, and the sixth level shifter switching element 846. As such, the first level shifter switching element 836, the second level shifter switching element 838, the fifth level shifter switching element 844, and the sixth level shifter switching element 846 may pull the NMOS body bias signal NBS to be between ground and slightly above the DC power supply voltage DCPV (FIG. 57), as needed. During the first converter operating mode, the NMOS body bias signal NBS may be about ground and during the second converter operating mode, the NMOS body bias signal NBS may be slightly above the DC power supply voltage DCPV (FIG. 57).

Sources of the fourth level shifter switching element 842 and the eighth level shifter switching element 850 are coupled to the two-state output 826. A drain of the eighth level shifter switching element 850 is coupled to a gate of the fourth level shifter switching element 842 and to a source of the seventh level shifter switching element 848. A drain of the fourth level shifter switching element 842 is coupled to a gate of the eighth level shifter switching element 850 and to a source of the third level shifter switching element 840. A drain of the seventh level shifter switching element 848 is coupled to a drain of the sixth level shifter switching element 846. A drain of the third level shifter switching element 840 is coupled to a drain of the second level shifter switching element 838. As such, the drains of the third level shifter switching element 840 and the second level shifter switching element 838 provide the level shifter output signal LSOS. A source of the sixth level shifter switching element 846 is coupled to a drain of the fifth level shifter switching element 844. A source of the second level shifter switching element 838 is coupled to a drain of the first level shifter switching element 836. Sources of the fifth level shifter switching element 844 and the first level shifter switching element 836 are coupled to the ground.

The DC power supply signal DCPS is fed to gates of the second level shifter switching element 838 and the sixth level shifter switching element 846. The cascode bias circuitry 832 provides a cascode bias signal CBS to gates of the third level shifter switching element 840 and the seventh level shifter switching element 848. The cascode bias circuitry 832 provides the cascode bias signal CBS, such that a voltage difference between the two-state output 826 and the gates of the third level shifter switching element 840 and the seventh level shifter switching element 848 is on the order of about the second voltage magnitude. As such, during the first converter operating mode, a voltage of the cascode bias signal CBS is about equal to the second voltage magnitude. During the second converter operating mode, the voltage of the cascode bias signal CBS is about equal to ground. The level shifter input signal LSIS is fed to a gate of the fifth level shifter switching element 844 and to the level shifter inverter 834. The level shifter inverter 834 feeds a gate of the first level shifter switching element 836.

From a logic perspective, the level shifter output signal LSOS follows the level shifter input signal LSIS. As such, when the level shifter input signal LSIS is LOW, the level shifter output signal LSOS is LOW. When the level shifter input signal LSIS is HIGH, the level shifter output signal LSOS is HIGH. Therefore, when the level shifter input signal LSIS is LOW, the fifth level shifter switching element 844 is OFF and the inverter output is HIGH, which causes the first level shifter switching element 836 to be ON. The first level shifter switching element 836 being ON causes the second level shifter switching element 838 to be ON, thereby pulling the level shifter output signal LSOS to LOW, which logically matches the level shifter input signal LSIS. When the first level shifter switching element 836 and the second level shifter switching element 838 are both ON, the third level shifter switching element 840 and the fourth level shifter switching element 842 are both OFF. As such, the two-state DC output signal DOTS is divided between the third level shifter switching element 840 and the fourth level shifter switching element 842, which causes the eighth level shifter switching element 850 to be ON. The eighth level shifter switching element 850 being ON holds the fourth level shifter switching element 842 OFF. The eighth level shifter switching element 850 being ON causes the seventh level shifter switching element 848 to be ON. The fifth level shifter switching element 844 being OFF and the seventh level shifter switching element 848 being ON causes the sixth level shifter switching element 846 to be OFF.

When the level shifter input signal LSIS transitions from LOW to HIGH, the level shifter output signal LSOS must transition from LOW to HIGH. When the level shifter input signal LSIS transitions to HIGH, the fifth level shifter switching element 844 transitions from OFF to ON and the inverter output transitions from HIGH to LOW, which causes the first level shifter switching element 836 to transition from ON to OFF. The fifth level shifter switching element 844 being ON causes the sixth level shifter switching element 846 to transition from OFF to ON. The fifth level shifter switching element 844 and the sixth level shifter switching element 846 being ON divides the remaining voltage between the seventh level shifter switching element 848 and the eighth level shifter switching element 850, which transitions the third level shifter switching element 840 and the fourth level shifter switching element 842 from being OFF to ON, thereby transitioning the seventh level shifter switching element 848 and the eighth level shifter switching element 850 from ON to OFF. The third level shifter switching element 840 and the fourth level shifter switching element 842 being ON, and the first level shifter switching element 836 being OFF causes the second level shifter switching element 838 to transition from ON to OFF. The third level shifter switching element 840 and the fourth level shifter switching element 842 being ON pulls the level shifter output signal LSOS to HIGH, which logically matches the level shifter input signal LSIS.

The second level shifter switching element 838, the third level shifter switching element 840, the sixth level shifter switching element 846, and the seventh level shifter switching element 848 may operate as cascode transistor elements. As such, when the third level shifter switching element 840 and the fourth level shifter switching element 842 are both ON, the first level shifter switching element 836 and the second level shifter switching element 838 are both OFF. During the first converter operating mode, the two-state DC output signal DOTS has the first voltage magnitude, which is divided across the first level shifter switching element 836 and the second level shifter switching element 838. In this regard, a maximum voltage magnitude across either the first level shifter switching element 836 or the second level shifter switching element 838 is about equal to the second voltage magnitude.

When the first level shifter switching element 836 and the second level shifter switching element 838 are both ON, the third level shifter switching element 840 and the fourth level shifter switching element 842 are both OFF. During the first converter operating mode, the two-state DC output signal DOTS has the first voltage magnitude, which is divided across the third level shifter switching element 840 and the fourth level shifter switching element 842. In this regard, a maximum voltage magnitude across either the third level shifter switching element 840 or the fourth level shifter switching element 842 is about equal to the second voltage magnitude.

When the seventh level shifter switching element 848 and the eighth level shifter switching element 850 are both ON, the fifth level shifter switching element 844 and the sixth level shifter switching element 846 are both OFF. During the first converter operating mode, the two-state DC output signal DOTS has the first voltage magnitude, which is divided across the fifth level shifter switching element 844 and the sixth level shifter switching element 846. In this regard, a maximum voltage magnitude across either the fifth level shifter switching element 844 or the sixth level shifter switching element 846 is about equal to the second voltage magnitude.

When the seventh level shifter switching element 848 and the eighth level shifter switching element 850 are both OFF, the fifth level shifter switching element 844 and the sixth level shifter switching element 846 are both ON. During the first converter operating mode, the two-state DC output signal DOTS has the first voltage magnitude, which is divided across the seventh level shifter switching element 848 and the eighth level shifter switching element 850. In this regard, a maximum voltage magnitude across either the seventh level shifter switching element 848 or the eighth level shifter switching element 850 is about equal to the second voltage magnitude.

In general, the first group 828 of switching elements provides the level shifter output signal LSOS based on the level shifter input signal LSIS. A maximum voltage magnitude across any of the first group 828 of switching elements is about equal to the second voltage magnitude. Further, a maximum voltage magnitude across any of the second group 830 of switching elements is about equal to the second voltage magnitude.

FIG. 128 shows details of the cascode bias circuitry 832 illustrated in FIG. 127 according to one embodiment of the cascode bias circuitry 832. The cascode bias circuitry 832 includes a ninth level shifter switching element 852, a tenth level shifter switching element 854, a first cascode resistive element RC1, a second cascode resistive element RC2, and a cascode diode element CRC. The ninth level shifter switching element 852 may be a PMOS transistor element and the tenth level shifter switching element 854 may be an NMOS transistor element. A cathode of the cascode diode element CRC, a drain of the tenth level shifter switching element 854, and a gate of the ninth level shifter switching element 852 are coupled to the DC power supply 80. A source of the ninth level shifter switching element 852 is coupled to the two-state output 826. A drain of the ninth level shifter switching element 852 is coupled to a gate of the tenth level shifter switching element 854 and to one end of the first cascode resistive element RC1. An opposite end of the first cascode resistive element RC1 is coupled to the anode of the level shifter diode element CRL. An anode of the cascode diode element CRC is coupled to a source of the tenth level shifter switching element 854 and to one end of the second cascode resistive element RC2 to provide the cascode bias signal CBS. An opposite end of the second cascode resistive element RC2 is coupled to the anode of the level shifter diode element CRL.

During the first converter operating mode, the two-state DC output signal DCTS has the first voltage magnitude. As such, the ninth level shifter switching element 852 is biased ON, which biases ON the tenth level shifter switching element 854. In this regard, the cascode bias signal CBS has a voltage magnitude about equal to the second voltage magnitude. During the second converter operating mode, the two-state DC output signal DCTS has the second magnitude. As such, the ninth level shifter switching element 852 is biased OFF, which biases OFF the tenth level shifter switching element 854 since the N MOS body bias signal NBS has a voltage magnitude about equal to ground. As such, during the second converter operating mode, the cascode bias signal CBS has a voltage magnitude about equal to ground.

Multiband RF Switch Ground Isolation

A summary of multiband RF switch ground isolation is presented followed by a detailed description of the multiband RF switch ground isolation. The present disclosure relates to an RF switch semiconductor die and an RF supporting structure, such as a laminate. The RF switch semiconductor die is attached to the RF supporting structure. The RF switch semiconductor die has a first edge and a second edge, which may be opposite from the first edge. The RF supporting structure has a group of alpha supporting structure connection nodes, which is adjacent to the first edge; a group of beta supporting structure connection nodes, which is adjacent to the second edge; an alpha AC grounding supporting structure connection node, which is adjacent to the second edge; and a beta AC grounding supporting structure connection node, which is adjacent to the first edge. When the group of alpha supporting structure connection nodes and the alpha AC grounding supporting structure connection node are active, the group of beta supporting structure connection nodes and the beta AC grounding supporting structure connection node are inactive, and vice versa. By locating the alpha AC grounding supporting structure connection node adjacent to the group of beta supporting structure connection nodes and locating the beta AC grounding supporting structure connection node adjacent to the group of alpha supporting structure connection nodes, interference of active AC grounding currents with active switch currents is reduced.

FIG. 129 is a schematic diagram showing details of the alpha switching circuitry 52 and the beta switching circuitry 56 illustrated in FIG. 39 according to one embodiment of the alpha switching circuitry 52 and the beta switching circuitry 56. The alpha switching circuitry 52 and the beta switching circuitry 56 illustrated in FIG. 129 is similar to the alpha switching circuitry 52 and the beta switching circuitry 56 illustrated in FIG. 39, except in FIG. 129, an RF supporting structure 856 includes the alpha switching circuitry 52, the beta switching circuitry 56, and an RF switch semiconductor die 858, which includes the alpha RF switch 68 and the beta RF switch 72. Additionally, the alpha RF switch 68 further includes a first alpha shunt switching device 860, a second alpha shunt switching device 862, and a third alpha shunt switching device 864. The beta RF switch 72 further includes a first beta shunt switching device 866, a second beta shunt switching device 868, and a third beta shunt switching device 870. The alpha switching circuitry 52 further includes an alpha AC grounding capacitive element CAG and the beta switching circuitry 56 further includes a beta AC grounding capacitive element CBG. In one embodiment of the RF supporting structure 856, the RF supporting structure 856 is a laminate.

The RF switch semiconductor die 858 further includes a first alpha switch die connection node 872, a second alpha switch die connection node 874, a third alpha switch die connection node 876, an alpha AC grounding switch die connection node 878, a first beta switch die connection node 880, a second beta switch die connection node 882, a third beta switch die connection node 884, and a beta AC grounding switch die connection node 886. The RF supporting structure 856 further includes a first alpha supporting structure connection node 888, a second alpha supporting structure connection node 890, a third alpha supporting structure connection node 892, an alpha AC grounding supporting structure connection node 894 a first beta supporting structure connection node 896, a second beta supporting structure connection node 898, a third beta supporting structure connection node 900, and a beta AC grounding supporting structure connection node 902.

As previously mentioned, in one embodiment of the alpha switching circuitry 52 and the beta switching circuitry 56, during the first PA operating mode, the alpha switching circuitry 52 is enabled and the beta switching circuitry 56 is disabled. During the second PA operating mode, the alpha switching circuitry 52 is disabled and the beta switching circuitry 56 is enabled. As such, during the first PA operating mode, the alpha switching circuitry 52 is active and the beta switching circuitry 56 is inactive. During the second PA operating mode, the alpha switching circuitry 52 is inactive and the beta switching circuitry 56 is active. In this regard, when the alpha supporting structure connection nodes 888, 890, 892 and the alpha AC grounding supporting structure connection node 894 are active, such as during the first PA operating mode, the beta supporting structure connection nodes 896, 898, 900 and the beta AC grounding supporting structure connection node 902 are inactive. Conversely, when the beta supporting structure connection nodes 896, 898, 900 and the beta AC grounding supporting structure connection node 902 are active, such as during the second PA operating mode, the alpha supporting structure connection nodes 888, 890, 892 and the alpha AC grounding supporting structure connection node 894 are inactive.

The first alpha shunt switching device 860 is coupled between the first alpha switching device 240 and the alpha AC grounding switch die connection node 878. The second alpha shunt switching device 862 is coupled between the second alpha switching device 242 and the alpha AC grounding switch die connection node 878. The third alpha shunt switching device 864 is coupled between the third alpha switching device 244 and the alpha AC grounding switch die connection node 878. The first alpha harmonic filter 70 is coupled to the first alpha supporting structure connection node 888. The first alpha linear mode output FALO is coupled to the second alpha supporting structure connection node 890. The $R^{TH}$ alpha linear mode output RALO is coupled to the third alpha supporting structure connection node 892. The alpha AC grounding capacitive element CAG is coupled between the alpha AC grounding supporting structure connection node 894 and the ground. The first alpha switch die connection node 872 is coupled to the first alpha supporting structure connection node 888. The second alpha switch die connection node 874 is coupled to the second alpha supporting structure connection node 890. The third alpha switch die connection node 876 is coupled to the third alpha supporting structure connection node 892. The alpha AC grounding switch die connection node 878 is coupled to the alpha AC grounding supporting structure connection node 894.

The first alpha switching device 240 is coupled to the first alpha switch die connection node 872. The second alpha switching device 242 is coupled to the second alpha switch die connection node 874. The third alpha switching device 244 is coupled to the third alpha switch die connection node 876. As previously mentioned, alternate embodiments of the alpha RF switch 68 may include any number of alpha switching devices. Further, alternate embodiments of the alpha RF switch 68 may include any number of alpha shunt switching devices. In this regard, alternate embodiments of the RF switch semiconductor die 858 may include any number of alpha switch die connection nodes. Alternate embodiments of the RF supporting structure 856 may include any number of alpha supporting structure connection nodes.

In one embodiment of the alpha switching circuitry 52, during the first PA operating mode, a selected one of the alpha switching devices 240, 242, 244 is ON and the unselected alpha switching devices are OFF to provide proper mode selection, band selection, or both. As such, during the first PA operating mode, a selected one of the alpha shunt switching devices 860, 862, 864 corresponds to the selected one of the alpha switching devices 240, 242, 244 that is ON. The selected one of the alpha shunt switching devices 860, 862, 864 is OFF and the unselected alpha shunt switching devices are ON to reduce RF noise by presenting a low RF impedance to the remainder of the alpha switching devices.

The first beta shunt switching device 866 is coupled between the first beta switching device 246 and the beta AC grounding switch die connection node 886. The second beta shunt switching device 868 is coupled between the second beta switching device 248 and the beta AC grounding switch die connection node 886. The third beta shunt switching device 870 is coupled between the third beta switching device 250 and the beta AC grounding switch die connection node 886. The first beta harmonic filter 74 is coupled to the first beta supporting structure connection node 896. The first beta linear mode output FBLO is coupled to the second beta supporting structure connection node 898. The $S^{TH}$ beta linear mode output SBLO is coupled to the third beta supporting structure connection node 900. The beta AC grounding capacitive element CBG is coupled between the beta AC grounding supporting structure connection node 902 and the ground. The first beta switch die connection node 880 is coupled to the first beta supporting structure connection node 896. The second beta switch die connection node 882 is coupled to the second beta supporting structure connection node 898. The third beta switch die connection node 884 is coupled to the third beta supporting structure connection node 900. The beta AC grounding switch die connection node 886 is coupled to the beta AC grounding supporting structure connection node 902.

The first beta switching device 246 is coupled to the first beta switch die connection node 880. The second beta switching device 248 is coupled to the second beta switch die connection node 882. The third beta switching device 250 is coupled to the third beta switch die connection node 884. As previously mentioned, alternate embodiments of the beta RF switch 72 may include any number of beta switching devices. Further, alternate embodiments of the beta RF switch 72 may include any number of beta shunt switching devices. In this regard, alternate embodiments of the RF switch semiconductor die 858 may include any number of beta switch die connection nodes. Alternate embodiments of the RF supporting structure 856 may include any number of beta supporting structure connection nodes.

In one embodiment of the beta switching circuitry 56, during the second PA operating mode, a selected one of the beta switching devices 246, 248, 250 is ON and the unselected beta switching devices are OFF to provide proper mode selection, band selection, or both. As such, during the second PA operating mode, a selected one of the beta shunt switching devices 866, 868, 870 corresponds to the selected one of the beta switching devices 246, 248, 250 that is ON. The selected one of the beta shunt switching devices 866, 868, 870 is OFF and the unselected beta shunt switching devices are ON to reduce RF noise by presenting a low RF impedance to the remainder of the beta switching devices.

FIG. 130 shows a top view of the RF supporting structure 856 illustrated in FIG. 129 according to one embodiment of the RF supporting structure 856. The RF switch semiconductor die 858 is attached to the RF supporting structure 856, as shown. The RF switch semiconductor die 858 has a first edge 904 and a second edge 906. In one embodiment of the RF switch semiconductor die 858, the second edge 906 is opposite from the first edge 904, as shown. In an alternate embodiment of the RF switch semiconductor die 858, the second edge 906 is disposed about 90 degrees from the first edge 904. In another embodiment of the RF switch semiconductor die 858, the RF switch semiconductor die 858 has more than four edges, such that the second edge 906 is any edge other than the first edge 904.

A group 908 of alpha supporting structure connection nodes includes the first alpha supporting structure connection node 888, the second alpha supporting structure connection node 890, and the third alpha supporting structure connection node 892. A group 910 of beta supporting structure connection nodes includes the first beta supporting structure connection node 896, the second beta supporting structure connection node 898, and the third beta supporting structure connection node 900. Alternate embodiments of the group 908 of alpha supporting structure connection nodes may include any number of alpha supporting structure connection nodes 888, 890, 892. Alternate embodiments of the group 910 of beta supporting structure connection nodes may include any number of beta supporting structure connection nodes 896, 898, 900.

The RF switch semiconductor die 858 includes the first alpha switch die connection node 872, the second alpha switch die connection node 874, the third alpha switch die connection node 876, the alpha AC grounding switch die connection node 878, the first beta switch die connection node 880, the second beta switch die connection node 882, the third beta switch die connection node 884, and the beta AC grounding switch die connection node 886. The first alpha switch die connection node 872, the second alpha switch die connection node 874, the third alpha switch die connection node 876, the alpha AC grounding switch die connection node 878, the first beta switch die connection node 880, the second beta switch die connection node 882, the third beta switch die connection node 884, and the beta AC grounding switch die connection node 886 may include pads, solder pads, wirebond pads, solder bumps, pins, sockets, solder holes, the like, or any combination thereof.

The RF supporting structure 856 includes the group 908 of alpha supporting structure connection nodes, the group 910 of beta supporting structure connection nodes, the alpha AC grounding supporting structure connection node 894, and the beta AC grounding supporting structure connection node 902 on the RF supporting structure 856. The group 908 of alpha supporting structure connection nodes, the group 910 of beta supporting structure connection nodes, the alpha AC grounding supporting structure connection node 894, and the beta AC grounding supporting structure connection node 902 on the RF supporting structure 856 may include pads, solder pads, wirebond pads, solder bumps, pins, sockets, solder holes, the like, or any combination thereof.

The group 908 of alpha supporting structure connection nodes is located adjacent to the first edge 904 and the group 910 of beta supporting structure connection nodes is located adjacent to the second edge 906, as shown. Further, the beta AC grounding supporting structure connection node 902 is located adjacent to the first edge 904 and the alpha AC grounding supporting structure connection node 894 is located adjacent to the second edge 906.

The first alpha switch die connection node 872 is coupled to the first alpha supporting structure connection node 888 via one of multiple interconnects 912. The second alpha switch die connection node 874 is coupled to the second alpha supporting structure connection node 890 via one of the multiple interconnects 912. The third alpha switch die connection node 876 is coupled to the third alpha supporting structure connection node 892 via one of the multiple interconnects 912. The beta AC grounding switch die connection node 886 is coupled to the beta AC grounding supporting structure connection node 902 via one of the multiple interconnects 912. The first beta switch die connection node 880 is coupled to the first beta supporting structure connection node 896 via one of the multiple interconnects 912. The second beta switch die connection node 882 is coupled to the second beta supporting structure connection node 898 via one of the multiple interconnects 912. The third beta switch die connection node 884 is coupled to the third beta supporting structure connection node 900 via one of the multiple interconnects 912. The alpha AC grounding switch die connection node 878 is coupled to the alpha AC grounding supporting structure connection node 894 via one of the multiple interconnects 912.

The interconnects 912 may be bonding wires, solder balls, solder columns, laminate traces, printed wiring board (PWB) traces, the like, or any combination thereof. In one embodiment of the RF supporting structure 856, the RF switch semiconductor die 858 is attached to the RF supporting structure 856 using a flip-chip arrangement. As such, the first alpha switch die connection node 872 is located over the first alpha supporting structure connection node 888, the second alpha switch die connection node 874 is located over the second alpha supporting structure connection node 890, the third alpha switch die connection node 876 is located over the third alpha supporting structure connection node 892, the beta AC grounding switch die connection node 886 is located over the beta AC grounding supporting structure connection node 902, the first beta switch die connection node 880 is located over the first beta supporting structure connection node 896, the second beta switch die connection node 882 is located over the second beta supporting structure connection node 898. The third beta switch die connection node 884 is located over the third beta supporting structure connection node 900, and the alpha AC grounding switch die connection node 878 is located over the alpha AC grounding supporting structure connection node 894. As such, in the flip-chip arrangement, the group 908 of alpha supporting structure connection nodes is located adjacent to the first edge 904 and the group 910 of beta supporting structure connection nodes is located adjacent to the second edge 906. Further, the beta AC grounding supporting structure connection node 902 is located adjacent to the first edge 904 and the alpha AC grounding supporting structure connection node 894 is located adjacent to the second edge 906.

In one embodiment of the RF supporting structure 856, when the group 908 of alpha supporting structure connection nodes and the alpha AC grounding supporting structure connection node 894 are active, the group 910 of beta supporting structure connection nodes and the beta AC grounding switch die connection node 886 are inactive. Conversely, when the group 908 of alpha supporting structure connection nodes and the alpha AC grounding supporting structure connection node 894 are inactive, the group 910 of beta supporting structure connection nodes and the beta AC grounding switch die connection node 886 are active.

By locating the alpha AC grounding supporting structure connection node 894 away from the group 908 of alpha supporting structure connection nodes, active AC grounding currents associated with the alpha AC grounding supporting structure connection node 894 in the RF supporting structure 856 may not have adverse effects on signals associated with the group 908 of alpha supporting structure connection nodes. Similarly, by locating the beta AC grounding supporting structure connection node 902 away from the group 910 of beta supporting structure connection nodes, active AC grounding currents associated with the beta AC grounding supporting structure connection node 902 in the RF supporting structure 856 may not have adverse effects on signals associated with the group 910 of beta supporting structure connection nodes.

Since the group 908 of alpha supporting structure connection nodes and the beta AC grounding supporting structure connection node 902 are not both active simultaneously, the group 908 of alpha supporting structure connection nodes and the beta AC grounding supporting structure connection node 902 may be located close to one another without significant interference. Similarly, since the group 910 of beta supporting structure connection nodes and the alpha AC grounding supporting structure connection node 894 are not both active simultaneously, the group 910 of beta supporting structure connection nodes and the alpha AC grounding supporting structure connection node 894 may be located close to one another without significant interference.

DC-DC Converter Current Sensing

A summary of DC-DC converter current sensing is presented followed by a detailed description of the DC-DC converter current sensing. Embodiments of the present disclosure relate to a sample-and-hold (SAH) current estimating circuit and a first switching power supply. The first switching power supply provides a first switching power supply output signal based on a series switching element and a setpoint. The SAH current estimating circuit samples a voltage across the series switching element of the first switching power supply during an ON state of the series switching element and during a ramping signal peak to provide an SAH output signal based on an estimate of an output current of the first switching power supply output signal. The first switching power supply selects the ON state of the series switching element, such that during the ramping signal peak, the series switching element has a series current having a magnitude, which is about equal to a magnitude of the output current of the first switching power supply output signal.

FIG. 131A shows an SAH current estimating circuit 914 and a series switching element 916 according to one embodiment of the SAH current estimating circuit 914 and the series switching element 916. The SAH current estimating circuit 914 is coupled across the series switching element 916. As such, one end of the series switching element 916 and the SAH current estimating circuit 914 receive a first sample signal SS1, and an opposite end of the series switching element 916 and the SAH current estimating circuit 914 receive a second sample signal SS2. When in an ON state, the series switching element 916 has a series current ISR.

In one embodiment of the series switching element 916, the series switching element 916 is a MOS device, which has an ON resistance when in the ON state. In this regard, a voltage across the series switching element 916 may follow the series current ISR in about a proportional manner. A proportionality constant may be about equal to the ON resistance of the series switching element 916. The voltage across the series switching element 916 may be determined by measuring a voltage between the first sample signal SS1 and the second sample signal SS2. As such, the SAH current estimating circuit 914 may sample the voltage across the series switching element 916 to estimate the series current ISR.

An output current, such as the envelope power supply current EPSI (FIG. 57), of the first switching power supply output signal FPSO (FIG. 74) may be about equal to an average first inductive element current ID (FIG. 111) of the first inductive element L1 (FIG. 111). The average first inductive element current ID (FIG. 111) may be about equal to the instantaneous first inductive element current ID (FIG. 111) during the ramping signal peak 517 (FIG. 84) of the ramping signal RMPS (FIG. 84), which is used to create the PWM signal PWMS (FIG. 111).

When the series switching element 916 is a series switching element in the first switching power supply 450 (FIG. 74), when the series switching element 916 is in the ON state, the series switching element 916 may provide the first inductive element current ID (FIG. 111). As such, the output current of the first switching power supply output signal FPSO (FIG. 74) may be about equal to the series current ISR during the ramping signal peak 517 (FIG. 84) of the ramping signal RMPS (FIG. 84). Therefore, the output current of the first switching power supply output signal FPSO (FIG. 74) may be estimated based on estimating the series current ISR during the ON state of the series switching element 916 and during the ramping signal peak 517 (FIG. 84).

In general, the first switching power supply 450 (FIG. 74) provides the first switching power supply output signal FPSO (FIG. 74) based on the series switching element 916 and the setpoint. The SAH current estimating circuit 914 samples a voltage across the series switching element 916 of the first switching power supply 450 (FIG. 74) during the ON state of the series switching element 916 and during the ramping signal peak 517 (FIG. 84) to provide an SAH output signal SHOS based on an estimate of the output current of the first switching power supply output signal FPSO (FIG. 74). The first switching power supply 450 (FIG. 74) selects the ON state of the series switching element 916, such that during the ramping signal peak 517 (FIG. 84), the series switching element 916 has the series current ISR having a magnitude, which is about equal to a magnitude of the output current of the first switching power supply output signal FPSO (FIG. 74).

FIG. 131B shows the SAH current estimating circuit 914 and the series switching element 916 according to a first embodiment of the SAH current estimating circuit 914 and the series switching element 916. The SAH current estimating circuit 914 and the series switching element 916 illustrated in FIG. 131B is similar to the SAH current estimating circuit 914 and the series switching element 916 illustrated in FIG. 131A, except in the SAH current estimating circuit 914 and the series switching element 916 illustrated in FIG. 131B, the first buck sample signal SSK1 (FIG. 92) is the first sample signal SS1, the second buck sample signal SSK2 (FIG. 92) is the second sample signal SS2, the second series buck switching element 560 (FIG. 92) is the series switching element 916, and the series buck current ISK (FIG. 92) is the series current ISR.

As such, the SAH output signal SHOS is based on the first buck sample signal SSK1 and the second buck sample signal SSK2. In this regard, when the second series buck switching element 560 (FIG. 92) is in the ON state and during the ramping signal peak 517 (FIG. 84), the first buck sample signal SSK1 and the second buck sample signal SSK2 are sampled and used to estimate the series buck current ISK (FIG. 92), which is used to estimate the output current of the first switching power supply output signal FPSO (FIG. 74). In one embodiment of the first switching power supply 450 (FIG. 74), during the second converter operating mode and during the series phase 602 (FIG. 95A), the first switching power supply 450 (FIG. 74) selects the ON state of the second series buck switching element 560 (FIG. 92).

FIG. 131C shows the SAH current estimating circuit 914 and the series switching element 916 according to a second embodiment of the SAH current estimating circuit 914 and the series switching element 916. The SAH current estimating circuit 914 and the series switching element 916 illustrated in FIG. 131C is similar to the SAH current estimating circuit 914 and the series switching element 916 illustrated in FIG. 131A, except in the SAH current estimating circuit 914 and the series switching element 916 illustrated in FIG. 131C, the first alpha sample signal SSA1 (FIG. 94) is the first sample signal SS1, the second alpha sample signal SSA2 (FIG. 94) is the second sample signal SS2, the second series alpha switching element 598 (FIG. 94) is the series switching element 916, and the series alpha current ISA (FIG. 94) is the series current ISR.

As such, the SAH output signal SHOS is based on the first alpha sample signal SSA1 and the second alpha sample signal SSA2. In this regard, when the second series alpha switching element 598 (FIG. 94) is in the ON state and during the ramping signal peak 517 (FIG. 84), the first alpha sample signal SSA1 and the second alpha sample signal SSA2 are sampled and used to estimate the series alpha current ISA (FIG. 94), which is used to estimate the output current of the first switching power supply output signal FPSO (FIG. 74). In one embodiment of the first switching power supply 450 (FIG. 74), during the first converter operating mode and during the alpha series phase 606 (FIG. 95B), the first switching power supply 450 (FIG. 74) selects the ON state of the second series alpha switching element 598 (FIG. 94).

FIG. 131D shows the SAH current estimating circuit 914 and the series switching element 916 according to a third embodiment of the SAH current estimating circuit 914 and the series switching element 916. The SAH current estimating circuit 914 and the series switching element 916 illustrated in FIG. 131D is similar to the SAH current estimating circuit 914 and the series switching element 916 illustrated in FIG. 131A, except in the SAH current estimating circuit 914 and the series switching element 916 illustrated in FIG. 131D, the first beta sample signal SSB1 (FIG. 94) is the first sample signal SS1, the second beta sample signal SSB2 (FIG. 94) is the second sample signal SS2, the second series beta switching element 600 (FIG. 94) is the series switching element 916, and the series beta current ISB (FIG. 94) is the series current ISR.

As such, the SAH output signal SHOS is based on the first beta sample signal SSB1 and the second beta sample signal SSB2. In this regard, when the second series beta switching element 600 (FIG. 94) is in the ON state and during the ramping signal peak 517 (FIG. 84), the first beta sample signal SSB1 and the second beta sample signal SSB2 are sampled and used to estimate the series beta current ISB (FIG. 94), which is used to estimate the output current of the first switching power supply output signal FPSO (FIG. 74). In one embodiment of the first switching power supply 450 (FIG. 74), during the first converter operating mode and during the beta series phase 610 (FIG. 95B), the first switching power supply 450 (FIG. 74) selects the ON state of the second series beta switching element 600 (FIG. 94).

FIG. 132 shows details of the SAH current estimating circuit 914 illustrated in FIG. 131A according to one embodiment of the SAH current estimating circuit 914. The SAH current estimating circuit 914 includes a mirror differential amplifier 918, a mirror switching element 920, a mirror buffer transistor element 922, an SAH switching element 924, an SAH capacitive element CSH, a first mirror resistive element RM1, and a second mirror resistive element RM2. An inverting input to the mirror differential amplifier 918 is coupled to one end of the SAH capacitive element CSH and to one end of the SAH switching element 924. An opposite end of the SAH switching element 924 receives the second sample signal SS2. An opposite end of the SAH capacitive element CSH is coupled to one end of the mirror switching element 920 and receives the first sample signal SS1. An opposite end of the mirror switching element 920 is coupled to one end of the first mirror resistive element RM1. An opposite end of the first mirror resistive element RM1 is coupled to one end of the mirror buffer transistor element 922 and to a non-inverting input to the mirror differential amplifier 918. An opposite end of the mirror buffer transistor element 922 is coupled to one end of the second mirror resistive element RM2 and provides the SAH output signal SHOS. An opposite end of the second mirror resistive element RM2 is coupled to a ground. An output from the mirror differential amplifier 918 is coupled to a gate of the mirror buffer transistor element 922. A gate of the mirror switching element 920 is coupled to a ground.

Typically, at or before the ramping signal peak 517 (FIG. 84), the SAH switching element 924 is ON, such that the SAH capacitive element CSH obtains the voltage between the first sample signal SS1 and the second sample signal SS2. Typically, at or slightly after the ramping signal peak 517 (FIG. 84), the SAH switching element 924 transitions from ON to OFF to sample the voltage across the series switching element 916 (FIG. 131A) of the first switching power supply 450 (FIG. 74) during the ON state of the series switching element 916 (FIG. 131A). In this regard, the SAH capacitive element CSH holds the voltage that was between the first sample signal SS1 and the second sample signal SS2 when the SAH switching element 924 transitioned from ON to OFF.

The mirror differential amplifier 918, the mirror switching element 920, the mirror buffer transistor element 922, and the first mirror resistive element RM1 establish a mirror current IM through the mirror switching element 920, the first mirror resistive element RM1, and the mirror buffer transistor element 922 based on the held voltage across the SAH capacitive element CSH. The mirror current IM is a mirror of the series current ISR (FIG. 131A) during the ON state of the series switching element 916 (FIG. 131A) and during the ramping signal peak 517 (FIG. 84). The mirror switching element 920 is used to mirror the series switching element 916 (FIG. 131A) and the first mirror resistive element RM1 is used to mirror metal interconnect resistance in series with the series current ISR (FIG. 131A). In this regard, the mirror current IM is representative of the series current ISR (FIG. 131A). The mirror current IM creates a voltage drop across the second mirror resistive element RM2 to provide the SAH output signal SHOS.

PA Bias Power Supply Undershoot Compensation

A summary of PA bias power supply undershoot compensation is presented followed by a detailed description of the PA bias power supply undershoot compensation. Embodiments of the present disclosure relate to a charge pump of a PA bias power supply and a process to prevent undershoot disruption of a bias power supply signal of the PA bias power supply. The charge pump operates in one of multiple bias supply pump operating modes, which include at least a bias supply pump-up operating mode and a bias supply bypass operating mode. The process prevents selection of the bias supply pump-up operating mode from the bias supply bypass operating mode before charge pump circuitry in the charge pump is capable of providing adequate voltage to prevent undershoot disruption of the bias power supply signal.

As previously presented, the PA bias power supply 282 (FIG. 44) includes the charge pump 92 (FIG. 44), which operates in one of multiple bias supply pump operating modes. The bias supply pump operating modes include at least the bias supply pump-up operating mode and the bias supply bypass operating mode. If the charge pump 92 (FIG. 44) were to transition from the bias supply bypass operating mode to the bias supply pump-up operating mode before charge pump circuitry (not shown) is capable of providing adequate voltage, then undershoot disruption of the bias power supply signal BPS (FIG. 44) may occur. A process for preventing the undershoot disruption is presented.

FIG. 133 shows the process for preventing undershoot disruption of the bias power supply signal BPS illustrated in FIG. 44 according to one embodiment of the present disclosure. Either the DC-DC control circuitry 90 (FIG. 44) or the control circuitry 42 (FIG. 6) selects the bias supply bypass operating mode of the charge pump 92 (FIG. 44) of the PA bias power supply 282 (FIG. 44) (Step B10). Either the DC-DC control circuitry 90 (FIG. 44) or the control circuitry 42 (FIG. 6) enables charge pump circuitry (not shown) of the charge pump 92 (FIG. 44) (Step B12). By enabling the charge pump circuitry (not shown), the charge pump circuitry (not shown) begins charge pumping to provide adequate voltage. Either the DC-DC control circuitry 90 (FIG. 44) or the control circuitry 42 (FIG. 6) makes sure that the charge pump circuitry (not shown) is capable of providing a voltage greater than or equal to about the DC power supply voltage DCPV (FIG. 57) (Step B14). Either the DC-DC control circuitry 90 (FIG. 44) or the control circuitry 42 (FIG. 6) selects the bias supply pump-up operating mode of the charge pump 92 (FIG. 44) (Step B16). Either the DC-DC control circuitry 90 (FIG. 44) or the control circuitry 42 (FIG. 6) may make sure the charge pump circuitry (not shown) is ready by allowing sufficient time between steps B12 and B16, by obtaining some positive indication from the charge pump circuitry (not shown), or both.

PA Bias Power Supply Efficiency Optimization

A summary of PA bias power supply efficiency optimization is presented followed by a detailed description of the PA bias power supply efficiency optimization. Embodiments of the present disclosure relate to a charge pump of a PA bias power supply, PA bias circuitry, and a process to optimize efficiency of the PA bias power supply. The charge pump operates in one of multiple bias supply pump operating modes, which include at least a bias supply pump-up operating mode and a bias supply bypass operating mode. The process prevents selection of the bias supply bypass operating mode unless a DC power supply voltage is adequate to allow the PA bias circuitry to provide minimum output regulation voltage at a specified current. Otherwise, the bias supply pump-up operating mode is selected. The charge pump operates more efficiently in the bias supply bypass operating mode than in the bias supply pump-up operating mode; therefore, selection of the bias supply bypass operating mode, when possible, increases efficiency.

As previously presented, the PA bias power supply 282 (FIG. 44) includes the charge pump 92 (FIG. 44), which operates in one of multiple bias supply pump operating modes. The bias supply pump operating modes include at least the bias supply pump-up operating mode and the bias supply bypass operating mode. The charge pump 92 (FIG. 44) operates more efficiently in the bias supply bypass operating mode than in the bias supply pump-up operating mode. However, if the DC power supply voltage DCPV (FIG. 57) is not adequate to allow the PA bias circuitry 96 (FIG. 13) to provide minimum output regulation voltage at a specified current, then the bias supply bypass operating mode may not be used. Otherwise, if the DC power supply voltage DCPV (FIG. 57) is adequate to allow the PA bias circuitry 96 (FIG. 13) to provide the minimum output regulation voltage at the specified current, then the bias supply bypass operating mode may be used. A process for optimizing efficiency of the charge pump 92 (FIG. 44) is presented.

FIG. 134 shows the process for optimizing efficiency of the charge pump 92 illustrated in FIG. 44 according to one embodiment of the present disclosure. Either the DC-DC control circuitry 90 (FIG. 44) or the control circuitry 42 (FIG. 6) determines if the DC power supply voltage DCPV (FIG. 57) is adequate to allow the PA bias circuitry 96 (FIG. 13) to provide the minimum output regulation voltage (Step 010). If the DC power supply voltage DCPV (FIG. 57) is adequate, either the DC-DC control circuitry 90 (FIG. 44) or the control circuitry 42 (FIG. 6) selects the bias supply bypass operating mode of the charge pump 92 (FIG. 44) of the PA bias power supply 282 (FIG. 44) (Step C12). If the DC power supply voltage DCPV (FIG. 57) is not adequate, either the DC-DC control circuitry 90 (FIG. 44) or the control circuitry 42 (FIG. 6) selects the bias supply pump-up operating mode of the charge pump 92 (FIG. 44) (Step C14). In alternate embodiments of the efficiency optimization process of the charge pump 92 (FIG. 44), the process further prevents selection of the bias supply bypass operating mode unless the DC power supply voltage DCPV (FIG. 57) is adequate to keep DAC noise levels in the driver stage IDAC circuitry 260 (FIG. 40) and the final stage IDAC circuitry 262 (FIG. 40) sufficiently low. The process may further prevent selection of the bias supply bypass operating mode unless the DC power supply voltage DCPV (FIG. 57) is high enough to provide adequately high switch linearity of the alpha switching circuitry 52 (FIG. 6) and the beta switching circuitry 56 (FIG. 6).

PA Envelope Power Supply Undershoot Compensation

A summary of PA envelope power supply undershoot compensation is presented followed by a detailed description of the PA envelope power supply undershoot compensation.

Embodiments of the present disclosure relate to a PA envelope power supply, RF PA circuitry, and a process to prevent undershoot of the PA envelope power supply, which may cause improper operation of the RF PA circuitry. When an envelope control signal to the PA envelope power supply has a step change from a high magnitude to a low magnitude, an envelope power supply signal from the PA envelope power supply to the RF PA circuitry has a change in response to the step change. However, if the step change exceeds a step change limit, the change of the envelope power supply signal may cause improper operation of the RF PA circuitry. Such a change of the envelope power supply signal is the undershoot of the PA envelope power supply. The process prevents the undershoot by modifying the envelope control signal by using an intermediate magnitude for a period of time when the step change limit is exceeded.

As previously presented, the PA envelope power supply 280 (FIG. 43) provides the envelope power supply signal EPS (FIG. 43) to the RF PA circuitry 30 (FIG. 43) based on the envelope control signal ECS (FIG. 43). When the envelope control signal ECS (FIG. 43) has a step change from a high magnitude to a low magnitude, the PA envelope power supply 280 (FIG. 43) reduces a magnitude of the envelope power supply signal EPS (FIG. 43) in response to the step change. However, when the step change exceeds the step change limit, the undershoot of the PA envelope power supply 280 (FIG. 43) may occur, thereby causing improper operation of the RF PA circuitry 30 (FIG. 43). A process for preventing the undershoot is presented.

FIG. 135 shows the process for preventing the undershoot of the PA envelope power supply 280 illustrated in FIG. 43 according to one embodiment of the present disclosure. Either the DC-DC control circuitry 90 (FIG. 43) or the control circuitry 42 (FIG. 6) determines if a step change of the envelope control signal ECS (FIG. 43) from a high magnitude to a low magnitude exceeds a step change limit (Step D10). If the step change exceeds the step change limit, either the DC-DC control circuitry 90 (FIG. 43) or the control circuitry 42 (FIG. 6) modifies the envelope control signal ECS (FIG. 43) by using an intermediate magnitude for a period of time (Step D12), thereby preventing the undershoot. If the step change does not exceed the step change limit, both the DC-DC control circuitry 90 (FIG. 43) and the control circuitry 42 (FIG. 6) do not modify the envelope control signal ECS (FIG. 43) (Step D14).

Selecting a Converter Operating Mode of a PA Envelope Power Supply

A summary of selecting a converter operating mode of a PA envelope power supply is presented followed by a detailed description of selecting the converter operating mode of the PA envelope power supply. Embodiments of the present disclosure relate to a PA envelope power supply and a process to select a converter operating mode of the PA envelope power supply. The PA envelope power supply operates in one of a first converter operating mode and a second converter operating mode. The process for selecting the converter operating mode is based on a selected communications mode of an RF communications system, a target output power from RF PA circuitry of the RF communications system, and a DC power supply voltage, which is used by the PA envelope power supply to provide an envelope power supply signal to the RF PA circuitry. Selection of the converter operating mode may provide efficient operation of the PA envelope power supply and the envelope power supply signal needed for proper operation of the RF PA circuitry.

As previously presented, the PA envelope power supply 280 (FIG. 43) provides the envelope power supply signal EPS (FIG. 43) to the RF PA circuitry 30 (FIG. 43), which uses the envelope power supply signal EPS (FIG. 43) to provide RF transmit signals. As such, the PA envelope power supply 280 (FIG. 43) operates in one of the first converter operating mode and the second converter operating mode. The PA envelope power supply 280 (FIG. 43) may have a higher efficiency during the second converter operating mode than during the first converter operating mode. However, the envelope power supply voltage EPSV (FIG. 57) of the envelope power supply signal EPS (FIG. 43) may be higher during the first converter operating mode than during the second converter operating mode.

In this regard, during certain communications modes of the RF communications system 26 (FIG. 43), with certain targeted output powers from the RF PA circuitry 30 (FIG. 43), and with certain values of the DC power supply voltage DCPV (FIG. 57), the first converter operating mode may be needed to provide the envelope power supply voltage EPSV (FIG. 57) necessary for proper operation of the RF PA circuitry 30 (FIG. 43). Therefore, selection of either the first converter operating mode or the second converter operating mode may be based on the selected communications mode, the target output power, and the DC power supply voltage DCPV (FIG. 57). In an alternate embodiment of the present disclosure, selection of either the first converter operating mode or the second converter operating mode may be further based on the envelope control signal ECS (FIG. 43).

Further, as previously presented, the PA envelope power supply 280 (FIG. 43) may operate in either the CCM or the DCM. The PA envelope power supply 280 (FIG. 43) may have a higher efficiency during the CCM than during the DCM. However, during the DCM, the PA envelope power supply 280 (FIG. 43) may not be as responsive to certain rapid changes in the envelope control signal ECS (FIG. 43). Therefore, selection of either the CCM or the DCM may be based on the selected communications mode, the target output power, and the DC power supply voltage DCPV (FIG. 57).

Additionally, as previously presented, the PA bias power supply 282 (FIG. 43) provides the bias power supply signal BPS (FIG. 43) to the RF PA circuitry 30 (FIG. 43), which further uses the bias power supply signal BPS (FIG. 43) to provide the RF transmit signals. The PA bias power supply 282 (FIG. 43) includes the charge pump 92 (FIG. 44), which operates in one of the multiple bias supply pump operating modes. The bias supply pump operating modes include at least the bias supply pump-up operating mode and the bias supply bypass operating mode. The PA bias power supply 282 (FIG. 43) may operate with higher efficiency during the bias supply bypass operating mode than during the bias supply pump-up operating mode. However, the bias power supply voltage BPSV (FIG. 57) of the bias power supply signal BPS (FIG. 43) may be higher during the bias supply pump-up operating mode than during the bias supply bypass operating mode.

In this regard, during certain communications modes of the RF communications system 26 (FIG. 43), with certain targeted output powers from the RF PA circuitry 30 (FIG. 43), and with certain values of the DC power supply voltage DCPV (FIG. 57), the bias supply pump-up operating mode may be needed to provide the bias power supply voltage BPSV (FIG. 57) necessary for proper operation of the RF PA circuitry 30 (FIG. 43). Therefore, selection of either the bias supply bypass operating mode or the bias supply pump-up operating mode may be based on the selected communications mode, the target output power, and the DC power supply voltage DCPV (FIG. 57). In an alternate embodiment of the present disclosure, selection of either the bias supply bypass operating mode or the bias supply pump-up operating mode may be further based on the envelope control signal ECS (FIG. 43).

FIG. 136 shows the process for selecting the converter operating mode of the PA envelope power supply 280 (FIG. 43) according to one embodiment of the present disclosure. The DC-DC control circuitry 90 (FIG. 43) identifies the selected communications mode of the RF communications system 26 (FIG. 43), the target output power from the RF PA circuitry 30 (FIG. 43), and the DC power supply voltage DCPV (FIG. 57) (Step E10). The DC-DC control circuitry 90 (FIG. 43) selects one of the first converter operating mode and the second converter operating mode of the PA envelope power supply 280 (FIG. 43) based on the selected communications mode, the target output power, and the DC power supply voltage DCPV (FIG. 57) (Step E12).

In an alternate embodiment of the process, the process further includes an additional process step. The DC-DC control circuitry 90 (FIG. 43) selects one of the bias supply pump-up operating mode and the bias supply bypass operating mode of the charge pump 92 (FIG. 44) of the PA bias power supply 282 (FIG. 43) based on the selected communications mode, the target output power, and the DC power supply voltage DCPV (FIG. 57) (Step E14). In an additional embodiment of the process, the process further includes an additional process step. The DC-DC control circuitry 90 (FIG. 43) selects one of the DCM and the CCM of the PA envelope power supply 280 (FIG. 43) based on the selected communications mode, the target output power, and the DC power supply voltage DCPV (FIG. 57) (Step E16).

Selecting PA Bias Levels of RF PA Circuitry During a Multislot Burst

A summary of selecting PA bias levels of RF PA circuitry during a multislot burst is presented followed by a detailed description of selecting the PA bias levels of the RF PA circuitry during the multislot burst. Embodiments of the present disclosure relate to PA control circuitry and PA bias circuitry of RF PA circuitry. During a multislot burst from the RF PA circuitry, the RF PA circuitry may have different output power levels for slots of the multislot burst. When the output power level drops significantly between one slot and a next adjacent slot, the output power level during the next adjacent slot may drift due to self heating of a PA core in the RF PA circuitry during the one slot. Normally, a PA bias level of the RF PA circuitry drops, to increase efficiency, when the output power level drops significantly. However, to reduce the drift, when the power level drop exceeds a power drop limit, the PA bias level during the one slot is maintained during the next adjacent slot. If the output power level drops significantly, but by less than the power drop limit, the PA bias level also drops.

During the multislot burst from the RF PA circuitry 30 (FIG. 13), the RF PA circuitry 30 (FIG. 13) may have different output power levels for slots of the multislot burst. When the output power level of the RF PA circuitry 30 (FIG. 13) drops significantly between one slot and the next adjacent slot of the multislot burst, the output power level during the next adjacent slot may drift. To reduce the drift, when the power level drop exceeds the power drop limit, the PA bias level during the one slot is maintained during the next adjacent slot. If the output power level drops significantly, but by less than the power drop limit, the PA bias level also drops. The PA control circuitry 94 (FIG. 13) selects the PA bias level of the RF PA circuitry 30 (FIG. 13) using the PA bias circuitry 96 (FIG. 13). A process for reducing the drift is presented.

FIG. 137 shows the process for reducing the output power drift that may result from significant output power drops from the RF PA circuitry 30 (FIG. 13) during the multislot burst from the RF PA circuitry 30 (FIG. 13) according to one embodiment of the present disclosure. The PA control circuitry 94 (FIG. 13) selects one PA bias level of the RF PA circuitry 30 (FIG. 13) during one slot of a multislot transmit burst from the RF PA circuitry 30 (FIG. 13), such that the RF PA circuitry 30 (FIG. 13) has one output power level during the one slot and has a next output power level during an adjacent next slot of the multislot transmit burst (Step F10). If the one output power level exceeds the next output power level by more than a power drop limit, then the PA control circuitry 94 (FIG. 13) maintains about the one PA bias level of the RF PA circuitry 30 (FIG. 13) during the adjacent next slot (Step F12). If the one output power level significantly exceeds the next output power level, but by less than the power drop limit, then the PA control circuitry 94 (FIG. 13) selects a next PA bias level, which is less than the one PA bias level, of the RF PA circuitry 30 (FIG. 13) during the adjacent next slot (Step F16).

Independent PA Biasing of a Driver Stage and a Final Stage

A summary of independent PA biasing of a driver stage and a final stage is presented followed by a detailed description of the independent PA biasing of a driver stage and a final stage. In traditional RF PA circuitry, a ratio of a PA bias level of the driver stage to a PA bias level of the final stage is fixed. Embodiments of the present disclosure relate to PA control circuitry, PA bias circuitry, a driver stage, and a final stage of RF PA circuitry. The PA control circuitry identifies a selected communications mode of an RF communications system and a target output power from the RF PA circuitry. The PA control circuitry selects a PA bias level of the driver stage and a PA bias level of the final stage based on the selected communications mode and the target output power. The PA bias circuitry establishes a PA bias level for the driver stage and a PA bias level for the final stage based on the selected PA bias levels of the driver stage and the final stage. The RF PA circuitry provides RF transmit signals using the driver stage and the final stage.

The RF PA circuitry 30 (FIG. 13) includes the PA control circuitry 94 (FIG. 13), the PA bias circuitry 96 (FIG. 13), a driver stage, such as the first driver stage 252 (FIG. 40) or the second driver stage 256 (FIG. 40), and a final stage, such as the first final stage 254 (FIG. 40) or the second final stage 258 (FIG. 40). The PA control circuitry 94 (FIG. 13) identifies the selected communications mode of the RF communications system 26 (FIG. 13) and the target output power from the RF PA circuitry 30 (FIG. 13). The PA control circuitry 94 (FIG. 13) selects the PA bias level of the driver stage and the PA bias level of the final stage based on the selected communications mode and the target output power. The PA bias circuitry 96 (FIG. 13) establishes the PA bias level for the driver stage and the PA bias level for the final stage based on the selected PA bias levels of the driver stage and the final stage. The RF PA circuitry 30 (FIG. 13) provides RF transmit signals using the driver stage and the final stage. A process for independently biasing the driver stage and the final stage is presented.

FIG. 138 shows the process for independently biasing the driver stage and the final stage according to one embodiment of the present disclosure. The PA control circuitry 94 (FIG. 13) identifies a selected communications mode of the RF communications system 26 (FIG. 13) and a target output power from the RF PA circuitry 30 (FIG. 13) (Step G10). The PA control circuitry 94 (FIG. 13) selects a PA bias level of the driver stage and a PA bias level of the final stage of the RF PA circuitry 30 (FIG. 13) based on the selected communications mode and the target output power (Step G12).

Temperature Correcting an Envelope Power Supply Signal for RF PA Circuitry

A summary of temperature correcting an envelope power supply signal for RF PA circuitry is presented followed by a detailed description of the temperature correcting the envelope power supply signal for the RF PA circuitry. Embodiments of the present disclosure relate to a DC-DC converter and RF PA circuitry. The DC-DC converter provides the envelope power supply signal to the RF PA circuitry based on a first power supply output control signal. The RF PA circuitry uses the envelope power supply signal to provide RF transmit signals. As a temperature of the RF PA circuitry changes, the envelope power supply signal may need to be adjusted to meet temperature compensation requirements of the RF PA circuitry. If there is adequate thermal coupling between the DC-DC converter and the RF PA circuitry, adjustments to the envelope power supply signal may be based on temperature measurements of the DC-DC converter. In this regard, the temperature of the DC-DC converter is measured to obtain a measured temperature. A desired correction of the first power supply output control signal is determined. The desired correction is based on the measured temperature and the temperature compensation requirements of the RF PA circuitry. The first power supply output control signal is adjusted based on the desired correction.

FIG. 139 shows the RF communications system 26 according to one embodiment of the RF communications system 26. The RF communications system 26 illustrated in FIG. 139 is similar to the RF communications system 26 illustrated in FIG. 43, except in the RF communications system 26 illustrated in FIG. 139, the DC-DC converter 32 further includes DC-DC converter temperature measurement circuitry 926 and the DC-DC control circuitry 90 provides the first power supply output control signal FPOC to the PA envelope power supply 280. The RF PA circuitry 30 uses the envelope power supply signal EPS to provide RF transmit signals. As the temperature of the RF PA circuitry 30 changes, the envelope power supply signal EPS may need to be adjusted to meet the temperature compensation requirements of the RF PA circuitry 30. If there is adequate thermal coupling between the DC-DC converter 32 and the RF PA circuitry 30, adjustments to the envelope power supply signal EPS may be based on the temperature measurements of the DC-DC converter 32. The DC-DC converter temperature measurement circuitry 926 measures the temperature of the DC-DC converter 32 to obtain a measured temperature. The DC-DC converter temperature measurement circuitry 926 provides a DC-DC converter temperature signal DCTM, which is representative of the measured temperature, to the DC-DC control circuitry 90.

In general, the PA envelope power supply 280 provides the envelope power supply signal EPS based on the first power supply output control signal FPOC. Specifically, the PA envelope power supply 280 provides the envelope power supply signal EPS based on the first power supply output control signal FPOC. A desired correction of the first power supply output control signal FPOC is determined by the DC-DC control circuitry 90. The desired correction is based on the measured temperature and the temperature compensation requirements of the RF PA circuitry 30. The first power supply output control signal FPOC is adjusted by the DC-DC control circuitry 90 based on the desired correction. In one embodiment of the DC-DC converter 32, the DC-DC control circuitry 90 uses the signal conditioning circuitry 782 (FIG. 115) to adjust the first power supply output control signal FPOC.

FIG. 140 shows a process for temperature correcting the envelope power supply signal EPS (FIG. 139) to meet RF PA circuitry 30 (FIG. 139) temperature compensation requirements according to one embodiment of the present disclosure. The DC-DC converter 32 (FIG. 139) is used to provide the envelope power supply signal EPS (FIG. 139) to the RF PA circuitry 30 (FIG. 139) based on the first power supply output control signal FPOC (FIG. 139) (Step H10). The DC-DC converter temperature measurement circuitry 926 (FIG. 139) measures the temperature of the DC-DC converter 32 (FIG. 139) to obtain a measured temperature (Step H12). The DC-DC control circuitry 90 (FIG. 139) determines a desired correction of the first power supply output control signal FPOC (FIG. 139) based on the measured temperature and temperature compensation requirements of the RF PA circuitry 30 (FIG. 139) (Step H14). The DC-DC control circuitry 90 (FIG. 139) adjusts the first power supply output control signal FPOC (FIG. 139) based on the desired correction (Step H16).

Selectable PA Bias Temperature Compensation Circuitry

A summary of selectable PA bias temperature compensation circuitry is presented followed by a detailed description of the selectable PA bias temperature compensation circuitry. Embodiments of the present disclosure relate to RF PA circuitry, which transmits RF signals. The RF PA circuitry includes a final stage, a final stage IDAC, a final stage current reference circuit, and a final stage temperature compensation circuit. The final stage current reference circuit provides an uncompensated final stage reference current to the final stage temperature compensation circuit, which receives and temperature compensates the uncompensated final stage reference current to provide a final stage reference current. The final stage IDAC uses the final stage reference current in a digital-to-analog conversion to provide a final stage bias signal to bias the final stage. The temperature compensation provided by the final stage temperature compensation circuit is selectable.

FIG. 141 shows details of the final stage current reference circuitry 274 and the final stage temperature compensation circuit 278 illustrated in FIG. 42 according to one embodiment of the final stage current reference circuitry 274 and the final stage temperature compensation circuit 278. The final stage current reference circuitry 274 includes the final stage temperature compensation circuit 278 and a final stage current reference circuit 928. The final stage temperature compensation circuit 278 includes a final stage selectable threshold comparator circuit 930, a final stage variable gain amplifier 932, and a final stage combining circuit 934. The final stage current reference circuit 928 provides an uncompensated final stage reference current IFUR to the final stage combining circuit 934, a supplemental uncompensated final stage reference current ISFU to the final stage selectable threshold comparator circuit 930, and a temperature proportional final stage reference current IFPT to the final stage selectable threshold comparator circuit 930.

The final stage selectable threshold comparator circuit 930 provides a final stage comparison output reference current IFCO to the final stage variable gain amplifier 932 based on the supplemental uncompensated final stage reference current ISFU and the temperature proportional final stage reference current IFPT. The final stage variable gain amplifier 932 receives and amplifies the final stage comparison output reference current IFCO to provide a final stage amplified comparison reference current IFAO to the final stage combining circuit 934. The final stage combining circuit 934 combines the uncompensated final stage reference current IFUR and the final stage amplified comparison reference current IFAO to provide the final stage reference current IFSR.

In one embodiment of the final stage current reference circuit 928, the temperature proportional final stage reference current IFPT is a current that is about proportional to absolute temperature. The final stage selectable threshold comparator circuit 930 compares the temperature proportional final stage reference current IFPT against a programmable threshold, such that if the temperature proportional final stage reference current IFPT is above the programmable threshold, the final stage comparison output reference current IFCO is based on the temperature proportional final stage reference current IFPT, which provides temperature compensation. If the temperature proportional final stage reference current IFPT is less than the programmable threshold, the final stage comparison output reference current IFCO is based on the supplemental uncompensated final stage reference current ISFU, which provides no temperature compensation. The programmable threshold may be selected via the bias configuration control signal BCC (FIG. 40).

In general, the RF PA circuitry 30 (FIG. 40) transmits RF signals. The RF PA circuitry 30 (FIG. 40) includes a final stage, which may be the first final stage 254 (FIG. 40) or the second driver stage 256 (FIG. 40), the final stage IDAC 270 (FIG. 42); the final stage current reference circuit 928; and the final stage temperature compensation circuit 278. The final stage current reference circuit 928 provides the uncompensated final stage reference current IFUR to the final stage temperature compensation circuit 278, which receives and temperature compensates the uncompensated final stage reference current IFUR to provide the final stage reference current IFSR. The final stage IDAC 270 (FIG. 42) uses the final stage reference current IFSR in a digital-to-analog conversion to provide the final stage bias signal FSBS (FIG. 40) to bias the final stage. The temperature compensation provided by the final stage temperature compensation circuit 278 is selectable via the bias configuration control signal BCC (FIG. 40).

FIG. 142 shows details of the driver stage current reference circuitry 268 and the driver stage temperature compensation circuit 276 illustrated in FIG. 42 according to one embodiment of the driver stage current reference circuitry 268 and the driver stage temperature compensation circuit 276. The driver stage current reference circuitry 268 includes the driver stage temperature compensation circuit 276 and a driver stage current reference circuit 936. The driver stage temperature compensation circuit 276 includes a driver stage selectable threshold comparator circuit 938, a driver stage variable gain amplifier 940, and a driver stage combining circuit 942. The driver stage current reference circuit 936 provides an uncompensated driver stage reference current IDUR to the driver stage combining circuit 942, a supplemental uncompensated driver stage reference current ISDU to the driver stage selectable threshold comparator circuit 938, and a temperature proportional driver stage reference current IDPT to the driver stage selectable threshold comparator circuit 938.

The driver stage selectable threshold comparator circuit 938 provides a driver stage comparison output reference current IDCO to the driver stage variable gain amplifier 940 based on the supplemental uncompensated driver stage reference current ISDU and the temperature proportional driver stage reference current IDPT. The driver stage variable gain amplifier 940 receives and amplifies the driver stage comparison output reference current IDCO to provide a driver stage amplified comparison reference current IDAO to the driver stage combining circuit 942. The driver stage combining circuit 942 combines the uncompensated driver stage reference current IDUR and the driver stage amplified comparison reference current IDAO to provide the driver stage reference current IDSR.

In one embodiment of the driver stage current reference circuit 936, the temperature proportional driver stage reference current IDPT is a current that is about proportional to absolute temperature. The driver stage selectable threshold comparator circuit 938 compares the temperature proportional driver stage reference current IDPT against a programmable threshold, such that if the temperature proportional driver stage reference current IDPT is above the programmable threshold, the driver stage comparison output reference current IDCO is based on the temperature proportional driver stage reference current IDPT, which provides temperature compensation. If the temperature proportional driver stage reference current IDPT is less than the programmable threshold, the driver stage comparison output reference current IDCO is based on the supplemental uncompensated driver stage reference current ISDU, which provides no temperature compensation. The programmable threshold may be selected via the bias configuration control signal BCC (FIG. 40).

In general, the RF PA circuitry 30 (FIG. 40) transmits RF signals. The RF PA circuitry 30 (FIG. 40) includes a driver stage, which may be the first driver stage 252 (FIG. 40) or the second driver stage 256 (FIG. 40), the driver stage IDAC 264 (FIG. 42); the driver stage current reference circuit 936; and the driver stage temperature compensation circuit 276. The driver stage current reference circuit 936 provides the uncompensated driver stage reference current IDUR to the driver stage temperature compensation circuit 276, which receives and temperature compensates the uncompensated driver stage reference current IDUR to provide the driver stage reference current IDSR. The driver stage IDAC 264 (FIG. 42) uses the driver stage reference current IDSR in a digital-to-analog conversion to provide the driver stage bias signal DSBS (FIG. 42) to bias the driver stage. The temperature compensation provided by the driver stage temperature compensation circuit 276 is selectable via the bias configuration control signal BCC (FIG. 40).

RF PA Linearity Requirements Based Converter Operating Mode Selection

A summary of RF PA linearity requirements based converter operating mode selection is presented followed by a detailed description of the RF PA linearity requirements based converter operating mode selection. Embodiments of the present disclosure relate to a PA envelope power supply, RF PA circuitry, and a process to select a converter operating mode of the PA envelope power supply based on linearity requirements of the RF PA circuitry. The PA envelope power supply operates in one of a first converter operating mode and a second converter operating mode. The process for selecting the converter operating mode is based on a required degree of linearity of the RF PA circuitry. The PA envelope power supply provides an envelope power supply signal to the RF PA circuitry. Selection of the converter operating mode may provide efficient operation of the PA envelope power supply and the envelope power supply signal needed for proper operation of the RF PA circuitry.

As previously presented, the PA envelope power supply 280 (FIG. 43) provides the envelope power supply signal EPS (FIG. 43) to the RF PA circuitry 30 (FIG. 43), which uses the envelope power supply signal EPS (FIG. 43) to provide RF transmit signals. As such, the PA envelope power supply 280 (FIG. 43) operates in one of the first converter operating mode and the second converter operating mode. The PA envelope power supply 280 (FIG. 43) may have a higher efficiency during the second converter operating mode than during the first converter operating mode. However, the envelope power supply voltage EPSV (FIG. 57) of the envelope power supply signal EPS (FIG. 43) may be higher during the first converter operating mode than during the second converter operating mode. The RF PA circuitry 30 (FIG. 43) may provide higher degrees of linearity with higher magnitudes of the envelope power supply voltage EPSV (FIG. 57).

In this regard, for certain degrees of linearity of the RF PA circuitry 30 (FIG. 43), the first converter operating mode may be needed to provide the envelope power supply voltage EPSV (FIG. 57) necessary for proper operation of the RF PA circuitry 30 (FIG. 43). Therefore, selection of either the first converter operating mode or the second converter operating mode may be based on a required degree of linearity of the RF PA circuitry 30 (FIG. 43).

FIG. 143 shows the process for selecting the converter operating mode of the PA envelope power supply 280 (FIG. 43) according to one embodiment of the present disclosure. The DC-DC control circuitry 90 (FIG. 43) identifies the required degree of linearity of the RF PA circuitry 30 (FIG. 43) (Step I10). The DC-DC control circuitry 90 (FIG. 43) selects one of the first converter operating mode and the second converter operating mode of the PA envelope power supply 280 (FIG. 43) based on the required degree of linearity (Step I12).

Embedded RF PA Temperature Compensating Bias Transistor

A summary of an embedded RF PA temperature compensating bias transistor is presented followed by a detailed description of the embedded RF PA temperature compensating bias transistor. Embodiments of the present disclosure relate to an RF PA amplifying transistor of an RF PA stage and an RF PA temperature compensating bias transistor of the RF PA stage. The RF PA amplifying transistor includes a first array of amplifying transistor elements and a second array of amplifying transistor elements. The RF PA temperature compensating bias transistor provides temperature compensation of bias of the RF PA amplifying transistor. Further, the RF PA temperature compensating bias transistor is located between the first array and the second array. As such, the RF PA temperature compensating bias transistor is thermally coupled to the first array and the second array. The RF PA stage receives and amplifies an RF stage input signal to provide an RF stage output signal using the RF PA amplifying transistor.

In one embodiment of the RF PA stage, each of the RF PA amplifying transistor and the RF PA temperature compensating bias transistor is a heterojunction bipolar transistor (HBT). In one embodiment of the RF PA temperature compensating bias transistor, the RF PA temperature compensating bias transistor is a single element transistor. In one embodiment of the RF PA temperature compensating bias transistor, the RF PA temperature compensating bias transistor is a linear HBT to improve thermal coupling to the first array and the second array. In one embodiment of the RF PA temperature compensating bias transistor, the RF PA temperature compensating bias transistor is hard wired as a diode.

FIG. 144 shows an RF PA stage 944 according to one embodiment of the RF PA stage 944. The RF PA stage 944 includes an RF PA amplifying transistor 946, an RF PA temperature compensating bias transistor 948, a first RF PA stage bias transistor 950, a second RF PA stage bias transistor 952, a first bias resistive element RS1, and a second bias resistive element RS2. The RF PA temperature compensating bias transistor 948 and the first RF PA stage bias transistor 950 are configured as diodes, such that a base of the RF PA temperature compensating bias transistor 948 is coupled to a collector of the RF PA temperature compensating bias transistor 948. A base of the first RF PA stage bias transistor 950 is coupled to a collector of the first RF PA stage bias transistor 950. An emitter of the RF PA temperature compensating bias transistor 948 is coupled to a ground. An emitter of the first RF PA stage bias transistor 950 is coupled to the base and the collector of the RF PA temperature compensating bias transistor 948.

A base of the second RF PA stage bias transistor 952 is coupled to the first bias resistive element RS1 and to the collector and the base of the first RF PA stage bias transistor 950. The second bias resistive element RS2 is coupled between an emitter of the second RF PA stage bias transistor 952 and a base of the RF PA amplifying transistor 946. An emitter of the RF PA amplifying transistor 946 is coupled to the ground. A collector of the RF PA amplifying transistor 946 provides an RF stage output signal RFSO. The RF PA stage 944 receives and amplifies an RF stage input signal RFSI to provide the RF stage output signal RFSO using the RF PA amplifying transistor 946. Specifically, RF PA amplifying transistor 946 uses amplification to provide the RF stage output signal RFSO based on the RF stage input signal RFSI.

The RF PA temperature compensating bias transistor 948, the first RF PA stage bias transistor 950, the second RF PA stage bias transistor 952, the first bias resistive element RS1 and the second bias resistive element RS2 form bias circuitry, which is used to provide bias of the RF PA amplifying transistor 946. The second RF PA stage bias transistor 952 operates as an emitter follower buffer. The RF PA temperature compensating bias transistor 948 provides temperature compensation of bias of the RF PA amplifying transistor 946. When ambient temperature changes, a voltage across the RF PA temperature compensating bias transistor 948 changes, which causes a voltage across RF PA amplifying transistor 946 to change in harmony. However, when the RF PA amplifying transistor 946 is amplifying, it may dissipate more power than the RF PA temperature compensating bias transistor 948, thereby potentially creating a temperature difference between the RF PA amplifying transistor 946 and the RF PA temperature compensating bias transistor 948. Such a temperature difference would degrade the temperature compensation of the bias of the RF PA amplifying transistor 946. As such, to minimize the temperature difference, the RF PA temperature compensating bias transistor 948 is thermally coupled to the RF PA amplifying transistor 946.

In one embodiment of the RF PA temperature compensating bias transistor 948, the RF PA temperature compensating bias transistor 948 is an HBT. In one embodiment of the RF PA amplifying transistor 946, the RF PA amplifying transistor 946 is an HBT. In one embodiment of the RF PA temperature compensating bias transistor 948, the RF PA temperature compensating bias transistor 948 is a single element transistor. In one embodiment of the RF PA temperature compensating bias transistor 948, the RF PA temperature compensating bias transistor 948 is hard wired as a diode In general, the RF PA circuitry 30 (FIG. 6) includes the RF PA stage 944, such that either the first RF PA 50 (FIG. 6) or the second RF PA 54 (FIG. 6) includes the RF PA stage 944. In one embodiment of the first RF PA 50 (FIG. 37), the first RF PA 50 (FIG. 37) is the first multi-mode multi-band quadrature RF PA, which includes the RF PA stage 944. In one embodiment of the second RF PA 54 (FIG. 37), the second RF PA 54 (FIG. 37) is the second multi-mode multi-band quadrature RF PA, which includes the RF PA stage 944. In one embodiment of the multi-mode multi-band RF power amplification circuitry 328 (FIG. 54), the multi-mode multi-band RF power amplification circuitry 328 (FIG. 54) includes the RF PA stage 944.

In a first embodiment of the RF PA stage 944, the RF PA stage 944 is the first input PA stage 110 (FIG. 16). In a second embodiment of the RF PA stage 944, the RF PA stage 944 is the first feeder PA stage 114 (FIG. 16). In a third embodiment of the RF PA stage 944, the RF PA stage 944 is the second input PA stage 118 (FIG. 16). In a fourth embodiment of the RF PA stage 944, the RF PA stage 944 is the second feeder PA stage 122 (FIG. 16). In a fifth embodiment of the RF PA stage 944, the RF PA stage 944 is the first in-phase driver PA stage 142 (FIG. 18). In a sixth embodiment of the RF PA stage 944, the RF PA stage 944 is the first in-phase final PA stage 146 (FIG. 18). In a seventh embodiment of the RF PA stage 944, the RF PA stage 944 is the first quadrature-phase driver PA stage 152 (FIG. 18). In an eighth embodiment of the RF PA stage 944, the RF PA stage 944 is the first quadrature-phase final PA stage 156 (FIG. 18).

In a ninth embodiment of the RF PA stage 944, the RF PA stage 944 is the second in-phase driver PA stage 162 (FIG. 18). In a tenth embodiment of the RF PA stage 944, the RF PA stage 944 is the second in-phase final PA stage 166 (FIG. 18). In an eleventh embodiment of the RF PA stage 944, the RF PA stage 944 is the second quadrature-phase driver PA stage 172 (FIG. 18). In a twelfth embodiment of the RF PA stage 944, the RF PA stage 944 is the second quadrature-phase final PA stage 176 (FIG. 18). In a thirteenth embodiment of the RF PA stage 944, the RF PA stage 944 is the first driver stage 252 (FIG. 40). In a fourteenth embodiment of the RF PA stage 944, the RF PA stage 944 is the first final stage 254 (FIG. 40). In a fifteenth embodiment of the RF PA stage 944, the RF PA stage 944 is the second driver stage 256 (FIG. 40). In a sixteenth embodiment of the RF PA stage 944, the RF PA stage 944 is the second final stage 258 (FIG. 40).

FIG. 145 shows details of the RF PA stage 944 illustrated in FIG. 144 according to one embodiment of the RF PA stage 944. The RF PA amplifying transistor 946 includes a first array 954 of amplifying transistor elements and a second array 956 of amplifying transistor elements. Specifically, the first array 954 of amplifying transistor elements includes a first alpha amplifying transistor element 958, a second alpha amplifying transistor element 960, and up to and including an $N^{TH}$ alpha amplifying transistor element 962. The second array 956 of amplifying transistor elements includes a first beta amplifying transistor element 964, a second beta amplifying transistor element 966, and up to and including an $M^{TH}$ beta amplifying transistor element 968. N may be any positive integer and M may be any positive integer. The first array 954 of amplifying transistor elements and the second array 956 of amplifying transistor elements are all coupled in parallel with one another, as shown.

FIG. 146A shows a physical layout of a normal HBT 970 according to the prior art. The normal HBT 970 includes an emitter 972, a base 974, and a collector 976. The base 974 is located adjacent to an end of the collector 976. A combination of the base 974 and the collector 976 is located adjacent to the emitter 972 in a side-by-side manner.

FIG. 146B shows a physical layout of a linear HBT 978 according to one embodiment of the linear HBT 978. The linear HBT 978 includes the emitter 972, the base 974, and the collector 976 arranged in a linear manner with the base 974 between the emitter 972 and the collector 976, as shown. As such, the linear HBT 978 is a single element transistor. A width of the linear HBT 978 is less than a width of the normal HBT 970. In one embodiment of the RF PA temperature compensating bias transistor 948 (FIG. 144), the RF PA temperature compensating bias transistor 948 (FIG. 144) is the linear HBT 978.

FIG. 146C shows a physical layout of the first array 954 and the second array 956 illustrated in FIG. 145 and a physical layout of the RF PA temperature compensating bias transistor 948 illustrated in FIG. 144 according to one embodiment of the present disclosure. The RF PA temperature compensating bias transistor 948 is located between the first array 954 of amplifying transistor elements and the second array 956 of amplifying transistor elements, as shown, By embedding the RF PA temperature compensating bias transistor 948 inside of the RF PA amplifying transistor 946 (FIG. 145), the RF PA temperature compensating bias transistor 948 is thermally coupled to the first array 954 of amplifying transistor elements and to the second array 956 of amplifying transistor elements. Specifically, the RF PA temperature compensating bias transistor 948 has thermal coupling 980 to the first array 954 of amplifying transistor elements and has thermal coupling 980 to the second array 956 of amplifying transistor elements.

The RF PA temperature compensating bias transistor 948 shown in FIG. 146C may be the linear HBT 978. As such, the first array 954 of amplifying transistor elements, the second array 956 of amplifying transistor elements, and the RF PA temperature compensating bias transistor 948 may be located closer to one another, thereby improving the thermal coupling 980 of the RF PA temperature compensating bias transistor 948 to the first array 954 of amplifying transistor elements and to the second array 956 of amplifying transistor elements.

Summaries of a split current IDAC for dynamic device switching (DDS) of an RF PA stage and DDS of an in-phase RF PA stage and a quadrature-phase RF PA stage are presented followed a detailed descriptions of the split current IDAC for the DDS of the RF PA stage and the DDS of the in-phase RF PA stage and the quadrature-phase RF PA stage.

Split Current IDAC for DDS of an RF PA Stage

Embodiments of the present disclosure relate to a split current IDAC and an RF PA stage. The split current IDAC operates in a selected one of a group of DDS operating modes and provides a group of array bias signals based on the selected one of the group of DDS operating modes. Each of the group of array bias signals is a current signal. The RF PA stage includes a group of arrays of amplifying transistor elements. The RF PA stage biases at least one of the group of arrays of amplifying transistor elements based on the group of array bias signals. Further, the RF PA stage receives and amplifies an RF stage input signal to provide an RF stage output signal using at least one of the group of arrays of amplifying transistor elements that is biased.

DDS of an In-Phase RF PA Stage and a Quadrature-Phase RF PA Stage

Embodiments of the present disclosure relate to an in-phase RF PA stage and a quadrature-phase RF PA stage. The in-phase RF PA stage includes a first group of arrays of amplifying transistor elements and the quadrature-phase RF PA stage includes a second group of arrays of amplifying transistor elements. A group of array bias signals is based on a selected one of a group of DDS operating modes. Each of the group of array bias signals is a current signal. The in-phase RF PA stage biases at least one of the first group of arrays of amplifying transistor elements based on the group of array bias signals. The in-phase RF PA stage receives and amplifies an in-phase RF stage input signal to provide an in-phase RF stage output signal using at least one of the first group of arrays of amplifying transistor elements that is biased. Similarly, the quadrature-phase RF PA stage biases at least one of the second group of arrays of amplifying transistor elements based on the group of array bias signals. The quadrature-phase RF PA stage receives and amplifies a quadrature-phase RF stage input signal to provide a quadrature-phase RF stage output signal using at least one of the second group of arrays of amplifying transistor elements that is biased.

FIG. 147 shows details of the RF PA circuitry 30 illustrated in FIG. 40 according to one embodiment of the RF PA circuitry 30. The RF PA circuitry 30 includes the PA bias circuitry 96 and the RF PA stage 944. The PA bias circuitry 96 includes a split current IDAC 982, which provides a stage bias signal SBS. The stage bias signal SBS provides a first array bias signal FABS and a second array bias signal SABS. In general, the split current IDAC 982 provides a group 984 of array bias signals FABS, SABS. Each of the group 984 of array bias signals FABS, SABS is a current signal. In alternate embodiments of the split current IDAC 982, the group 984 of array bias signals FABS, SABS may include any number of array bias signals FABS, SABS.

The split current IDAC 982 operates in a selected one of a group of DDS operating modes. The split current IDAC 982 provides the group 984 of array bias signals FABS, SABS based on the selected one of the group of DDS operating modes. The bias configuration control signal BCC may indicate the selected one of the group of DDS operating modes to the split current IDAC 982. As previously presented, the RF PA stage 944 includes the first array 954 (FIG. 145) of amplifying transistor elements and the second array 956 (FIG. 145) of amplifying transistor elements. In general, the RF PA stage 944 includes a group of arrays 954, 956 (FIG. 145) of amplifying transistor elements. In alternate embodiments of the RF PA stage 944, the RF PA stage 944 includes any number of arrays 954, 956 (FIG. 145) of amplifying transistor elements greater than two. The RF PA stage 944 biases at least one of the group of arrays 954, 956 (FIG. 145) of amplifying transistor elements based on the group 984 of array bias signals FABS, SABS. The RF PA stage 944 receives and amplifies the RF stage input signal RFSI to provide the RF stage output signal RFSO using at least one of the group of arrays 954, 956 (FIG. 145) of amplifying transistor elements that are biased.

By only biasing specific arrays of the group of arrays 954, 956 (FIG. 145) of amplifying transistor elements that are needed by the RF PA stage 944 to provide the RF stage output signal RFSO, the split current IDAC 982 saves power, thereby increasing efficiency. Further, by only biasing the specific arrays of the group of arrays 954, 956 (FIG. 145) of amplifying transistor elements that are needed by the RF PA stage 944 to provide the RF stage output signal RFSO, the RF PA stage 944 may operate more efficiently. In one embodiment of the present disclosure, the PA control circuitry 94 (FIG. 40) selects the one of the group of DDS operating modes and provides indication of the selection to the split current IDAC 982 via the bias configuration control signal BCC. In an alternate embodiment of the present disclosure, the control circuitry 42 (FIG. 6) selects the one of the group of DDS operating modes and provides indication of the selection to the split current IDAC 982 via the bias configuration control signal BCC.

FIG. 148 shows details of the PA bias circuitry 96 illustrated in FIG. 40 according to one embodiment of the PA bias circuitry 96. The PA bias circuitry 96 illustrated in FIG. 148 is similar to the PA bias circuitry 96 illustrated in FIG. 41, except in the PA bias circuitry 96 illustrated in FIG. 148, the driver stage bias signal DSBS provides a first array driver bias signal FADB and a second array driver bias signal SADB, the final stage bias signal FSBS provides a first array final bias signal FAFB and a second array final bias signal SAFB, the first driver bias signal FDB provides a first array first driver bias signal FAFD and a second array first driver bias signal SAFD, the second driver bias signal SDB provides a first array second driver bias signal FASD and a second array second driver bias signal SASD, the first final bias signal FFB provides a first array first final bias signal FAFF and a second array first final bias signal SAFF, and the second final bias signal SFB provides a first array second final bias signal FASF and a second array second final bias signal SASF.

In one embodiment of the PA bias circuitry 96 (FIG. 147), the split current IDAC 982 is the driver stage IDAC 264, the stage bias signal SBS is the driver stage bias signal DSBS, the first array bias signal FABS is the first array driver bias signal FADB, and the second array bias signal SABS is the second array driver bias signal SADB. In an alternate embodiment of the PA bias circuitry 96 (FIG. 147), the split current IDAC 982 is the final stage IDAC 270, the stage bias signal SBS is the final stage bias signal FSBS, the first array bias signal FABS is the first array final bias signal FAFB, and the second array bias signal SABS is the second array final bias signal SAFB.

FIG. 149 shows details of the RF PA circuitry 30 illustrated in FIG. 40 according to an alternate embodiment of the RF PA circuitry 30. The RF PA circuitry 30 illustrated in FIG. 149 is similar to the RF PA circuitry 30 illustrated in FIG. 147 except the RF PA circuitry 30 illustrated in FIG. 149 further includes an in-phase RF PA stage 986 and a quadrature-phase RF PA stage 988 instead of the RF PA stage 944.

FIG. 150 shows details of the in-phase RF PA stage 986 illustrated in FIG. 149 according to one embodiment of the in-phase RF PA stage 986. The in-phase RF PA stage 986 includes a first group 990 of arrays of amplifying transistor elements. The first group 990 of arrays of amplifying transistor elements includes the first array 954 (FIG. 145) of amplifying transistor elements and the second array 956 (FIG. 145) of amplifying transistor elements. Alternate embodiments of the first group 990 of arrays of amplifying transistor elements may include any number of arrays of amplifying transistor elements greater than two.

FIG. 151 shows details of the quadrature-phase RF PA stage 988 illustrated in FIG. 149 according to one embodiment of the quadrature-phase RF PA stage 988. The quadrature-phase RF PA stage 988 includes a second group 992 of arrays of amplifying transistor elements. The second group 992 of arrays of amplifying transistor elements includes a third array 994 of amplifying transistor elements and a fourth array 996 of amplifying transistor elements. The third array 994 of amplifying transistor elements includes a first gamma amplifying transistor element 998, a second gamma amplifying transistor element 1000, and up to and including a $P^{TH}$ gamma amplifying transistor element 1002. The third array 994 of amplifying transistor elements are coupled to one another. The fourth array 996 of amplifying transistor elements includes a first delta amplifying transistor element 1004, a second delta amplifying transistor element 1006, and up to and including a $Q^{TH}$ delta amplifying transistor element 1008. The fourth array 996 of amplifying transistor elements are coupled to one another. Alternate embodiments of the second group 992 of arrays of amplifying transistor elements may include any number of arrays of amplifying transistor elements greater than two.

Returning to FIG. 149, the in-phase RF PA stage 986 includes the first group 990 (FIG. 150) of arrays of amplifying transistor elements. The quadrature-phase RF PA stage 988 includes the second group 992 (FIG. 151) of arrays of amplifying transistor elements. The in-phase RF PA stage 986 biases at least one of the first group 990 (FIG. 150) of arrays of amplifying transistor elements based on the group 984 of array bias signals FABS, SABS. The quadrature-phase RF PA stage 988 biases at least one of the second group 992 (FIG. 151) of arrays of amplifying transistor elements based on the group 984 of array bias signals FABS, SABS. The in-phase RF PA stage 986 receives and amplifies an in-phase RF stage input signal RSII to provide an in-phase RF stage output signal RSIO using at least one of the first group 990 (FIG. 150) of arrays of amplifying transistor elements that is biased. The quadrature-phase RF PA stage 988 receives and amplifies a quadrature-phase RF stage input signal RSQI to provide a quadrature-phase RF stage output signal RSQO using at least one of the second group 992 (FIG. 151) of arrays of amplifying transistor elements that is biased.

The quadrature-phase RF stage input signal RSQI may be phase-shifted from the in-phase RF stage input signal RSI1 by about 90 degrees. In one embodiment of the in-phase RF PA stage 986 and the quadrature-phase RF PA stage 988, both the in-phase RF PA stage 986 and the quadrature-phase RF PA stage 988 function with a same number of arrays of amplifying transistor elements that are biased to preserve quadrature behavior while utilizing DDS options. By only biasing specific arrays of the first group 990 (FIG. 150) of arrays of amplifying transistor elements that are needed by the in-phase RF PA stage 986 to provide the in-phase RF stage output signal RSIO, the split current IDAC 982 saves power, thereby increasing efficiency. Further, by only biasing specific arrays of the first group 990 (FIG. 150) of arrays of amplifying transistor elements that are needed by the in-phase RF PA stage 986 to provide the in-phase RF stage output signal RSIO, the in-phase RF PA stage 986 may operate more efficiently. By only biasing specific arrays of the second group 992 (FIG. 151) of arrays of amplifying transistor elements that are needed by the quadrature-phase RF PA stage 988 to provide the quadrature-phase RF stage output signal RSQO, the split current IDAC 982 saves power, thereby increasing efficiency. Further, by only biasing specific arrays of the second group 992 (FIG. 151) of arrays of amplifying transistor elements that are needed by the quadrature-phase RF PA stage 988 to provide the quadrature-phase RF stage output signal RSQO, the quadrature-phase RF PA stage 988 may operate more efficiently.

In a first embodiment of the in-phase RF PA stage 986, the in-phase RF PA stage 986 is the first in-phase driver PA stage 142 (FIG. 18). In a second embodiment of the in-phase RF PA stage 986, the in-phase RF PA stage 986 is the first in-phase final PA stage 146 (FIG. 18). In a third embodiment of the in-phase RF PA stage 986, the in-phase RF PA stage 986 is the second in-phase driver PA stage 162 (FIG. 18). In a fourth embodiment of the in-phase RF PA stage 986, the in-phase RF PA stage 986 is the second in-phase final PA stage 166 (FIG. 18).

In a first embodiment of the quadrature-phase RF PA stage 988, the quadrature-phase RF PA stage 988 is the first quadrature-phase driver PA stage 152 (FIG. 18). In a second embodiment of the quadrature-phase RF PA stage 988, quadrature-phase RF PA stage 988 is the first quadrature-phase final PA stage 156 (FIG. 18). In a third embodiment of the quadrature-phase RF PA stage 988, the quadrature-phase RF PA stage 988 is the second quadrature-phase driver PA stage 172 (FIG. 18). In a fourth embodiment of the quadrature-phase RF PA stage 988, the quadrature-phase RF PA stage 988 is the second quadrature-phase final PA stage 176 (FIG. 18).

Overlay Class F Choke

A summary of an overlay class F choke is presented followed by a detailed description of the overlay class F choke. Embodiments of the present disclosure relate to an overlay class F choke of an RF PA stage and an RF PA amplifying transistor of the RF PA stage. The overlay class F choke includes a pair of mutually coupled class F inductive elements, which are coupled in series between a PA envelope power supply and a collector of the RF PA amplifying transistor. In one embodiment of the RF PA stage, the RF PA stage receives and amplifies an RF stage input signal to provide an RF stage output signal using the RF PA amplifying transistor. The collector of the RF PA amplifying transistor provides the RF stage output signal. The PA envelope power supply provides an envelope power supply signal to the overlay class F choke. The envelope power supply signal provides power for amplification. The overlay class F choke provides DC to the RF PA amplifying transistor and presents prescribed impedances to the RF PA amplifying transistor at certain frequencies, such as fundamental and harmonics, to provide high efficiency for the RF PA stage.

In one embodiment of the RF PA stage, the RF PA stage operates as a class F amplifier, such that tuning provided by the overlay class F choke increases gain of the RF PA stage at certain desired frequencies and decreases gain at certain undesired frequencies. In one embodiment of the overlay class F choke, the pair of mutually coupled class F inductive elements are overlaid, such that one of the pair of mutually coupled class F inductive elements is overlaid over another of the pair of mutually coupled class F inductive elements to provide the mutual coupling. By using the overlay arrangement, the size of the overlay class F choke may be significantly smaller than if the pair of mutually coupled class F inductive elements did not use mutual coupling.

In one embodiment of the overlay class F choke, the overlay class F choke further includes a class F tank capacitive element. The pair of mutually coupled class F inductive elements includes a class F series inductive element and a class F tank inductive element. The class F tank capacitive element is coupled across the class F tank inductive element to form a parallel resonant tank circuit having a tank resonant frequency. In one embodiment of the RF PA stage and the overlay class F choke, the RF PA amplifying transistor and the class F tank capacitive element are provided by an RF PA semiconductor die, which is attached to a supporting structure, such as a laminate. The supporting structure provides the pair of mutually coupled class F inductive elements. In one embodiment of the overlay class F choke, the overlay class F choke further includes a class F bypass capacitive element coupled between the PA envelope power supply and a ground. The class F tank capacitive element is coupled to the class F tank inductive element, such that a series combination of the class F tank capacitive element and the class F bypass capacitive element are coupled across the class F tank inductive element. A collector capacitance of the RF PA amplifying transistor may affect operating characteristics of the overlay class F choke.

In a first embodiment of the pair of mutually coupled class F inductive elements, at least a portion of one of the pair of mutually coupled class F inductive elements is provided by a first printed wiring trace using one conductive layer of the laminate. At least a portion of another of the pair of mutually coupled class F inductive elements is provided by a second printed wiring trace using another conductive layer of the laminate, such that the first printed wiring trace is overlaid over the second printed wiring trace. In a second embodiment of the pair of mutually coupled class F inductive elements, at least a portion of one of the pair of mutually coupled class F inductive elements is provided by a first printed wiring trace using a conductive layer of the laminate. At least a portion of another of the pair of mutually coupled class F inductive elements is provided by a second printed wiring trace using the conductive layer of the laminate, such that the first printed wiring trace and the second printed wiring trace are side-by-side using the same conductive layer. A third embodiment of the pair of mutually coupled class F inductive elements combines the first embodiment of the pair of mutually coupled class F inductive elements and the second embodiment of the pair of mutually coupled class F inductive elements.

FIG. 152 shows details of the RF PA circuitry 30 according to one embodiment of the RF PA circuitry 30. The RF PA circuitry 30 illustrated in FIG. 152 is similar to the RF PA circuitry 30 illustrated in FIG. 144, except in the RF PA circuitry 30 illustrated in FIG. 152, the RF PA stage 944 further includes an overlay class F choke 1010 coupled between the PA envelope power supply 280 (FIG. 43) and a collector of the RF PA amplifying transistor 946. The overlay class F choke 1010 includes a pair 1012 of mutually coupled class F inductive elements, which are coupled in series between the PA envelope power supply 280 (FIG. 43) and the collector of the RF PA amplifying transistor 946. In one embodiment of the RF PA stage 944, the RF PA stage 944 receives and amplifies the RF stage input signal RFSI to provide the RF stage output signal RFSO using the RF PA amplifying transistor 946. The collector of the RF PA amplifying transistor 946 provides the RF stage output signal RFSO. The PA envelope power supply 280 (FIG. 43) provides the envelope power supply signal EPS to the overlay class F choke 1010. The envelope power supply signal EPS provides power for amplification. The overlay class F choke 1010 provides DC to the RF PA amplifying transistor 946 and presents prescribed impedances to the RF PA amplifying transistor 946 at certain frequencies, such as fundamental and harmonics, to provide high efficiency for the RF PA stage 944.

In one embodiment of the RF PA stage 944, the RF PA stage 944 operates as a class F amplifier, such that tuning provided by the overlay class F choke 1010 increases gain of the RF PA stage 944 at certain desired frequencies and decreases gain at certain undesired frequencies. In one embodiment of the overlay class F choke 1010, the pair 1012 of mutually coupled class F inductive elements are overlaid, such that one of the pair 1012 of mutually coupled class F inductive elements is overlaid over another of the pair 1012 of mutually coupled class F inductive elements to provide the mutual coupling. By using the overlay arrangement, the size of the overlay class F choke 1010 may be significantly smaller than if the pair 1012 of mutually coupled class F inductive elements did not use mutual coupling. In an alternate embodiment of the overlay class F choke 1010, the pair 1012 of mutually coupled class F inductive elements are constructed side-by-side to provide the mutual coupling. By using the side-by-side arrangement, the size of the overlay class F choke 1010 may be significantly smaller than if the pair 1012 of mutually coupled class F inductive elements did not use mutual coupling. A collector capacitance CCL of the RF PA amplifying transistor 946 may affect operating characteristics of the overlay class F choke 1010.

FIG. 153 shows details of the overlay class F choke 1010 illustrated in FIG. 152 according to one embodiment of the overlay class F choke 1010. The overlay class F choke 1010 further includes a class F tank capacitive element CFT. The pair 1012 of mutually coupled class F inductive elements includes a class F series inductive element LFS and a class F tank inductive element LFT. The class F series inductive element LFS and the class F tank inductive element LFT are coupled in series between the PA envelope power supply 280 (FIG. 43) and the collector of the RF PA stage 944 (FIG. 152). The class F tank capacitive element CFT is coupled across the class F tank inductive element LFT to form a parallel resonant tank circuit having a tank resonant frequency. The pair 1012 of mutually coupled class F inductive elements is constructed, such that there is mutual coupling 1014 between the pair 1012 of mutually coupled class F inductive elements. Specifically, there is mutual coupling 1014 between the class F series inductive element LFS and the class F tank inductive element LFT. The mutual coupling 1014 may include electrostatic coupling, magnetic coupling, or both.

FIG. 154 shows details of the overlay class F choke 1010 illustrated in FIG. 152 according an alternate embodiment of the overlay class F choke 1010. The overlay class F choke 1010 illustrated in FIG. 154 is similar to the overlay class F choke 1010 illustrated in FIG. 153, except the overlay class F choke 1010 illustrated in FIG. 154 further includes a class F bypass capacitive element CFB coupled between the PA envelope power supply 280 (FIG. 43) and a ground. The class F tank capacitive element CFT is coupled between the pair 1012 of mutually coupled class F inductive elements and the ground. As such, a series combination of the class F tank capacitive element CFT and the class F bypass capacitive element CFB are coupled across the class F tank inductive element to form a parallel resonant tank circuit. Additionally, an RF PA semiconductor die 1016 provides the class F tank capacitive element CFT and the RF PA amplifying transistor 946 (FIG. 152). The RF PA semiconductor die 1016 is attached to a supporting structure 1018, such as a laminate. The supporting structure 1018 provides the pair 1012 of mutually coupled class F inductive elements and the class F bypass capacitive element CFB.

FIG. 155 shows details of the supporting structure 1018 illustrated in FIG. 154 according to one embodiment of the supporting structure 1018. The supporting structure 1018 includes a first insulating layer 1020, a first conducting layer 1022 over the first insulating layer 1020, a second insulating layer 1024 over the first conducting layer 1022, a second conducting layer 1026 over the second insulating layer 1024, a third insulating layer 1028 over the second conducting layer 1026, and a ground plane 1030 over the third insulating layer 1028. In one embodiment of the supporting structure 1018, the supporting structure 1018 includes the first insulating layer 1020, the first conducting layer 1022 directly over the first insulating layer 1020, the second insulating layer 1024 directly over the first conducting layer 1022, the second conducting layer 1026 directly over the second insulating layer 1024, the third insulating layer 1028 directly over the second conducting layer 1026, and the ground plane 1030 directly over the third insulating layer 1028.

Alternate embodiments of the supporting structure 1018 may exclude any or all of the layers 1020, 1022, 1024, 1026, 1028, 1030. Further, alternate embodiments of the supporting structure 1018 may include intervening layers between any or all of pairs of the layers 1020, 1022, 1024, 1026, 1028, 1030. A first cross-section 1032 is representative of a top-wise view of the supporting structure 1018 taken between the second conducting layer 1026 and the third insulating layer 1028. A second cross-section 1033 is representative of a top-wise view of the supporting structure 1018 taken between the first conducting layer 1022 and the second insulating layer 1024.

FIG. 156 shows details of the first cross-section 1032 illustrated in FIG. 155 according to one embodiment of the supporting structure 1018. The second conducting layer 1026 provides a first printed wiring trace 1034 and connecting pads 1036. The first printed wiring trace 1034 and the connecting pads 1036 are over the second insulating layer 1024, such that the first printed wiring trace 1034 is routed over the second insulating layer 1024 and is coupled between two of the connecting pads 1036. The connecting pads 1036 may be vias, pads, solder pads, wirebond pads, solder bumps, pins, sockets, solder holes, the like, or any combination thereof.

FIG. 157 shows details of the second cross-section 1033 illustrated in FIG. 155 according to one embodiment of the supporting structure 1018. The first conducting layer 1022 provides a second printed wiring trace 1038 and connecting pads 1036. The second printed wiring trace 1038 and the connecting pads 1036 are over the first insulating layer 1020, such that the second printed wiring trace 1038 is routed over the first insulating layer 1020 and is coupled between two of the connecting pads 1036. The connecting pads 1036 may be vias, pads, solder pads, wirebond pads, solder bumps, pins, sockets, solder holes, the like, or any combination thereof. At least a portion of the second printed wiring trace 1038 is overlaid over at least a portion of the first printed wiring trace 1034 (FIG. 156). In a first embodiment of the pair 1012 (FIG. 154) of mutually coupled class F inductive elements, in general, at least a portion of one of the pair 1012 (FIG. 154) of mutually coupled class F inductive elements is provided by the first printed wiring trace 1034 (FIG. 156) using one conductive layer, such as the second conducting layer 1026 (FIG. 156), of the supporting structure 1018 (FIG. 155). At least a portion of another of the pair 1012 (FIG. 154) of mutually coupled class F inductive elements is provided by the second printed wiring trace 1038 using another conductive layer, such as the first conducting layer 1022, of the supporting structure 1018 (FIG. 155), such that at least a portion of the first printed wiring trace 1034 (FIG. 156) is overlaid over at least a portion of the second printed wiring trace 1038.

FIG. 158 shows details of the second cross-section 1033 illustrated in FIG. 155 according to an alternate embodiment of the supporting structure 1018. The first conducting layer 1022 provides the first printed wiring trace 1034, the second printed wiring trace 1038, and connecting pads 1036. The first printed wiring trace 1034, the second printed wiring trace 1038, and the connecting pads 1036 are over the first insulating layer 1020. The first printed wiring trace 1034 is routed over the first insulating layer 1020 and is coupled between two of the connecting pads 1036. The second printed wiring trace 1038 is routed over the first insulating layer 1020 and is coupled between another two of the connecting pads 1036. The connecting pads 1036 may be vias, pads, solder pads, wirebond pads, solder bumps, pins, sockets, solder holes, the like, or any combination thereof. At least a portion of the first printed wiring trace 1034 and at least a portion of the second printed wiring trace 1038 are side-by-side.

In a second embodiment of the pair 1012 (FIG. 154) of mutually coupled class F inductive elements, at least a portion of one of the pair 1012 (FIG. 154) of mutually coupled class F inductive elements is provided by the first printed wiring trace 1034 using a conductive layer, such as the first conducting layer 1022 of the supporting structure 1018 (FIG. 155). At least a portion of another of the pair 1012 (FIG. 154) of mutually coupled class F inductive elements is provided by the second printed wiring trace 1038 using the conductive layer of the supporting structure 1018 (FIG. 155), such that at least a portion of the first printed wiring trace 1034 and at least a portion of the second printed wiring trace 1038 are side-by-side using the same conductive layer. A third embodiment of the pair 1012 (FIG. 154) of mutually coupled class F inductive elements combines the first embodiment of the pair 1012 (FIG. 154) of mutually coupled class F inductive elements and the second embodiment of the pair 1012 (FIG. 154) of mutually coupled class F inductive elements.

ESD Protection of an RF PA Semiconductor Die Using a PA Controller Semiconductor Die A summary of ESD protection of an RF PA semiconductor die using a PA controller semiconductor die is presented followed by a detailed description of the ESD protection of the RF PA semiconductor die using the PA controller semiconductor die. Embodiments of the present disclosure relate to a PA controller semiconductor die and a first RF PA semiconductor die. The PA controller semiconductor die includes a first ESD protection circuit, which ESD protects and provides a first ESD protected signal. The RF PA semiconductor die receives the first ESD protected signal. In one embodiment of the PA controller semiconductor die, the first ESD protected signal is an envelope power supply signal. The PA controller semiconductor die may be a Silicon CMOS semiconductor die and the RF PA semiconductor die may be a Gallium Arsenide semiconductor die. Using CMOS instead of Gallium Arsenide for ESD protection provides several advantages. For equivalent die areas, CMOS dies are less expensive than Gallium Arsenide dies. CMOS ESD protection may take up less die area, may have lower leakage currents, may provide higher rated protection, and may provide no degradation in PA performance or efficiency.

In one embodiment of the PA controller semiconductor die, the PA controller semiconductor die includes multiple ESD protection circuits, which provide multiple ESD protected signals. Any or all of the ESD protected signals may be DC power signals, data signals, RF signals, the like, or any combination thereof. One embodiment of the present disclosure includes any or all of a first RF PA semiconductor die, a second RF PA semiconductor die, and an RF switch semiconductor die. Each of the first RF PA semiconductor die, the second RF PA semiconductor die, and the RF switch semiconductor die may receive any or all of the ESD protected signals. In one embodiment of the PA controller semiconductor die, one of the protected ESD signals is the envelope power supply signal. In one embodiment of the PA controller semiconductor die, one of the protected ESD signals is a bias power supply signal. In one embodiment of the PA controller semiconductor die, one of the protected ESD signals is a DC power supply signal.

FIG. 159A shows the RF PA circuitry 30 according to one embodiment of the RF PA circuitry 30. The RF PA circuitry 30 includes the RF PA semiconductor die 1016 and a PA controller semiconductor die 1050. The PA controller semiconductor die 1050 includes a first ESD protection circuit 1052, which ESD protects and provides a first ESD protected signal FESD. The RF PA semiconductor die 1016 receives the first ESD protected signal FESD. The PA controller semiconductor die 1050 may be a Silicon CMOS semiconductor die and the RF PA semiconductor die 1016 may be a Gallium Arsenide semiconductor die. Using CMOS instead of Gallium Arsenide for ESD protection provides several advantages. For equivalent die areas, CMOS dies are less expensive than Gallium Arsenide dies. CMOS ESD protection may take up less die area, may have lower leakage currents, may provide higher rated protection, and may provide no degradation in PA performance or efficiency.

FIG. 159B shows the RF PA circuitry 30 according to an alternate embodiment of the RF PA circuitry 30. The RF PA circuitry 30 illustrated in FIG. 159B is similar to the RF PA circuitry 30 illustrated in FIG. 159A, except in the RF PA circuitry 30 illustrated in FIG. 159B, the first ESD protected signal FESD is the envelope power supply signal EPS.

FIG. 160 shows the RF PA circuitry 30 according to an additional embodiment of the RF PA circuitry 30. The RF PA circuitry 30 illustrated in FIG. 160 is similar to the RF PA circuitry 30 illustrated in FIG. 159B, except the RF PA circuitry 30 illustrated in FIG. 160 omits the RF PA semiconductor die 1016 and further includes a first RF PA semiconductor die 1054, a second RF PA semiconductor die 1056, and an RF switch semiconductor die 1058. Additionally, the PA controller semiconductor die 1050 further includes a second ESD protection circuit 1060 and up to and including an $N^{TH}$ ESD protection circuit 1062. The second ESD protection circuit 1060 ESD protects and provides a second ESD protected signal SESD. The $N^{TH}$ ESD protection circuit 1062 ESD protects and provides an $N^{TH}$ ESD protected signal NESD. In general, in one embodiment of the RF PA circuitry 30, the PA controller semiconductor die 1050 includes multiple ESD protection circuits 1052, 1060, 1062, which ESD protect and provide multiple ESD protected signals FESD, SESD, NESD. Any or all of the multiple ESD protected signals FESD, SESD, NESD may be DC power signals, data signals, RF signals, the like, or any combination thereof. In alternate embodiments of the PA controller semiconductor die 1050, any or all of the multiple ESD protection circuits 1052, 1060, 1062 may be omitted.

The first ESD protection circuit 1052 provides the first ESD protected signal FESD to the first RF PA semiconductor die 1054 and the second RF PA semiconductor die 1056. The $N^{TH}$ ESD protection circuit 1062 provides the $N^{TH}$ ESD protected signal NESD to the RF switch semiconductor die 1058. In one embodiment of the first ESD protection circuit 1052, the first ESD protected signal FESD is the envelope power supply signal EPS, as shown. In one embodiment of the second ESD protection circuit 1060, the second ESD protected signal SESD is the DC power supply signal DCPS, as shown. In one embodiment of the $N^{TH}$ ESD protection circuit 1062, the $N^{TH}$ ESD protected signal NESD is the bias power supply signal BPS, as shown. In alternate embodiments of the RF PA circuitry 30, any or all of the first RF PA semiconductor die 1054, the second RF PA semiconductor die 1056, and the RF switch semiconductor die 1058 may be omitted. Additionally, in other embodiments of the RF PA circuitry 30, any or all of the first RF PA semiconductor die 1054, the second RF PA semiconductor die 1056, and the RF switch semiconductor die 1058 may receive any or all of the multiple ESD protected signals FESD, SESD, NESD.

FIG. 161 shows the RF PA circuitry 30 according to another embodiment of the RF PA circuitry 30. The RF PA circuitry 30 illustrated in FIG. 161 is similar to the RF PA circuitry 30 illustrated in FIG. 14, except the RF PA circuitry 30 illustrated in FIG. 161 further includes the PA controller semiconductor die 1050, the first RF PA semiconductor die 1054, the second RF PA semiconductor die 1056, and the RF switch semiconductor die 1058. The PA controller semiconductor die 1050 includes the PA-DCI 60, the PA control circuitry 94, and the PA bias circuitry 96. The first RF PA semiconductor die 1054 includes the first RF PA 50. The second RF PA semiconductor die 1056 includes the second RF PA 54. The RF switch semiconductor die 1058 includes the alpha switching circuitry 52, the beta switching circuitry 56, and the switch driver circuitry 98. In one embodiment of the RF PA semiconductor die 1016 (FIG. 159A), the RF PA semiconductor die 1016 (FIG. 159A) is the first RF PA semiconductor die 1054. In an alternate embodiment of the RF PA semiconductor die 1016 (FIG. 159A), the RF PA semiconductor die 1016 (FIG. 159A) is the second RF PA semiconductor die 1056.

DC-DC Converter Having a Multi-Stage Output Filter

A summary of a DC-DC converter having a multi-stage output filter is presented followed by a detailed description of the DC-DC converter having the multi-stage output filter. The present disclosure relates to a direct current (DC)-DC converter that includes a first switching converter and a multi-stage filter. The multi-stage filter includes at least a first inductance (L) capacitance (C) filter and a second LC filter coupled in series between the first switching converter and a DC-DC converter output. The first LC filter has a first LC time constant and the second LC filter has a second LC time constant, which is less than the first LC time constant. The DC-DC converter receives and converts a DC power supply signal from a DC power supply, such as a battery, to provide a first switching power supply output signal via the DC-DC converter output. A setpoint of the DC-DC converter is based on a desired voltage of the first switching power supply output signal. The first switching converter and the multi-stage filter form a feedback loop, which is used to regulate the first switching power supply output signal based on the setpoint. Loop behavior and stability of the feedback loop are substantially based on the first LC time constant. The first LC filter includes a first capacitive element having a first self-resonant frequency, which is about equal to a first notch frequency of the multi-stage filter.

In one embodiment of the DC-DC converter, an output signal from the first switching converter has sharp transitions provided by switching elements. Such transitions are filtered by the multi-stage filter to provide the first switching power supply output signal. In one embodiment of the DC-DC converter, the first switching power supply output signal is an envelope power supply signal for a first RF power amplifier (PA). The envelope power supply signal may need to respond quickly to changes in the setpoint while meeting spectral requirements, such as those specified by the European Telecommunications Standards Institute (ETSI) standards, by Third Generation Partnership Project (3GPP) standards, the like, or any combination thereof. As such, the multi-stage filter provides a lowpass filter response necessary to meet requirements. In one embodiment of the first RF PA, during saturated operation of the first RF PA, an output profile of the first RF PA is based on a profile of the envelope power supply signal. The profile of the envelope power supply signal is based on the lowpass filter response.

Since the loop behavior of the feedback loop is substantially based on the first LC time constant, the first LC time constant must be relatively small, such that the envelope power supply signal responds quickly to changes in the setpoint. However, the first time constant must be large enough to provide adequate filtering. Further, if discrete ceramic capacitive elements are used in the multi-stage filter, such capacitive elements tend to have self-resonant frequencies that are inversely related to capacitance values. In this regard, larger capacitance values are associated with smaller self-resonant frequencies and capacitive elements tend to lose their effectiveness at frequencies above the self-resonant frequency. As such, the first capacitive element may have a capacitance value larger than any other capacitive element in the multi-stage filter and the first LC filter may not provide sufficient filtering to meet the spectral response requirements, particularly at higher frequencies. Therefore, one or more additional LC filter stages may be required. Each successive LC filter stage has a smaller time constant than its predecessor to preserve loop behavior and stability of the feedback loop. Further, each successive LC filter stage is targeted to a specific portion of a spectral response profile, such that the filter response of the multi-stage filter meets or exceeds loop behavior requirements, stability requirements, and spectral response requirements.

In one embodiment of the multi-stage filter, the first LC filter further includes a first inductive element, which is coupled between the first switching converter and the first capacitive element. The second LC filter includes a second inductive element and a second capacitive element. The second inductive element is coupled between the first inductive element and the DC-DC converter output. The second capacitive element is coupled to the DC-DC converter output. The multi-stage filter has a lowpass filter response, which includes a first notch filter response having a first notch at the first notch frequency, such that the first notch is based on the first capacitive element.

In an alternate embodiment of the multi-stage filter, the second capacitive element has a second self-resonant frequency, which is about equal to a second notch frequency of the multi-stage filter. The lowpass filter response includes the first notch filter response and a second notch filter response. The first notch filter response has the first notch at the first notch frequency and the second notch filter response has the second notch at the second notch frequency. The first notch is based on the first capacitive element and the second notch is based on the second capacitive element. In an additional embodiment of the multi-stage filter, the multi-stage filter includes the first LC filter, the second LC filter, and a third LC filter. The first LC filter includes the first inductive element and the first capacitive element. The second LC filter includes the second inductive element and the second capacitive element. The third LC filter includes a third inductive element and a third capacitive element. The first inductive element is coupled between the first switching converter and the first capacitive element. The second inductive element is coupled between the first inductive element and the second capacitive element. The third inductive element is coupled between the second inductive element and the DC-DC converter output. The third capacitive element is coupled to the DC-DC converter output. The multi-stage filter has a lowpass filter response, which includes the first notch filter response having the first notch at the first notch frequency, the second notch filter response having the second notch at the second notch frequency, and a third notch filter response having a third notch at a third notch frequency. The third capacitive element has a third self-resonant frequency, which is about equal to the third notch frequency of the multi-stage filter. The first notch is based on the first capacitive element, the second notch is based on the second capacitive element, and the third notch is based on the third capacitive element.

In one embodiment of the DC-DC converter, the DC-DC converter receives and converts the DC power supply signal from the DC power supply to provide a second switching power supply output signal. In one embodiment of the second switching power supply output signal, the second switching power supply output signal is a bias power supply signal used for biasing the first RF PA. In an alternate embodiment of the multi-stage filter, the multi-stage filter includes at least four LC filters coupled in series between the first switching converter and the DC-DC converter output.

One embodiment of the present disclosure relates to a process for selecting components for the multi-stage filter. The process includes the following process steps. A desired switching frequency of the first switching converter is determined. A first desired notch frequency of the multi-stage filter is determined based on the desired switching frequency and a desired lowpass filter response of the multi-stage filter. The first capacitive element is selected, such that the first self-resonant frequency is about equal to the first desired notch frequency. Desired loop behavior and stability of the feedback loop is determined. A desired first LC time constant of the first LC filter is determined based on the desired loop behavior and stability. The first inductive element is selected, such that the first capacitive element and the first inductive element have an LC time constant that is about equal to the desired first LC time constant.

In one embodiment of the process for selecting the components for the multi-stage filter, the process further includes the following process steps. A second desired notch frequency of the multi-stage filter is determined based on the desired switching frequency and the desired lowpass filter response of the multi-stage filter. The second capacitive element is selected, such that the second self-resonant frequency is about equal to the second desired notch frequency. The second inductive element is selected based on the desired lowpass filter response of the multi-stage filter.

In an alternate embodiment of the process for selecting the components for the multi-stage filter, the process further includes the following process steps. A third desired notch frequency of the multi-stage filter is determined based on the desired switching frequency and the desired lowpass filter response of the multi-stage filter. The third capacitive element is selected, such that the third self-resonant frequency is about equal to the third desired notch frequency. The third inductive element is selected based on the desired lowpass filter response of the multi-stage filter.

FIG. 162 shows details of the first switching power supply 450 illustrated in FIG. 74 according to another embodiment of the first switching power supply 450. The first switching power supply 450 illustrated in FIG. 162 is similar to the first switching power supply 450 illustrated in FIG. 111, except in the first switching power supply 450 illustrated in FIG. 162, the first power filtering circuitry 82 and the first inductive element L1 are replaced with a multi-stage filter 1064. The multi-stage filter 1064 is coupled to the first output inductance node 460 and the second output inductance node 462. As such, the multi-stage filter 1064 is coupled to the first switching converter 456 and the second switching converter 458.

The multi-stage filter 1064 has a DC-DC converter output 1066. As such, the multi-stage filter 1064 provides the first switching power supply output signal FPSO via the DC-DC converter output 1066. Additionally, the multi-stage filter 1064 feeds back a multi-stage filter feedback signal MSFF to the PWM circuitry 534 instead of the first switching power supply output signal FPSO. In this regard, during the first converter operating mode, a feedback loop is formed using the first switching converter 456 and the multi-stage filter 1064. Similarly, during the second converter operating mode, a feedback loop is formed using the second switching converter 458 and the multi-stage filter 1064. The first buck output signal FBO and the second buck output signal SBO typically have sharp transitions. Such transitions are filtered by the multi-stage filter 1064 to provide the first switching power supply output signal FPSO.

FIG. 163 shows details of the multi-stage filter 1064 illustrated in FIG. 162 according to one embodiment of the multi-stage filter 1064. The multi-stage filter 1064 includes a first LC filter 1068 and at least a second LC filter 1070 coupled in series between the first switching converter 456 (FIG. 162) and the DC-DC converter output 1066. The first LC filter 1068 has a first LC time constant and the second LC filter 1070 has a second LC time constant. The second LC time constant is less than the first LC time constant. The first LC filter 1068 provides the multi-stage filter feedback signal MSFF. As such, loop behavior and stability of the feedback loop are substantially based on the first LC time constant. The first switching power supply 450 (FIG. 162) receives and converts the DC power supply signal DCPS (FIG. 162) to provide the first switching power supply output signal FPSO (FIG. 162) via the DC-DC converter output 1066. A setpoint of the first switching power supply 450 (FIG. 162) is based on a desired voltage of the first switching power supply output signal FPSO (FIG. 162). The first switching converter 456 (FIG. 162) and the multi-stage filter 1064 form the feedback loop, which is used to regulate the first switching power supply output signal FPSO (FIG. 162) based on the setpoint. Loop behavior and stability of the feedback loop are substantially based on the first LC time constant.

FIG. 164 shows details of the multi-stage filter 1064 illustrated in FIG. 163 according to an alternate embodiment of the multi-stage filter 1064. The first LC filter 1068 includes the first inductive element L1 and the first capacitive element C1. The first inductive element L1 is coupled between the first switching converter 456 (FIG. 162) and the first capacitive element C1. The second LC filter 1070 includes the second inductive element L2 and the second capacitive element C2. The second inductive element L2 is coupled between the first inductive element L1 and the DC-DC converter output 1066. The second capacitive element C2 is coupled to the DC-DC converter output 1066.

FIG. 165 is a graph showing a frequency response of the multi-stage filter 1064 illustrated in FIG. 164 according to one embodiment of the multi-stage filter 1064. The multi-stage filter 1064 (FIG. 164) has a lowpass filter response 1072. The lowpass filter response 1072 has a first notch filter response 1074 having a first notch 1076 at a first notch frequency and has a second notch filter response 1078 having a second notch 1080 at a second notch frequency. The first capacitive element C1 (FIG. 164) has a first self-resonant frequency, which is about equal to the first notch frequency of the multi-stage filter 1064 (FIG. 164). As such, the first notch 1076 is based on the first capacitive element C1 (FIG. 164). Similarly, the second capacitive element C2 (FIG. 164) has a second self-resonant frequency, which is about equal to the second notch frequency of the multi-stage filter 1064 (FIG. 164). As such, the second notch 1080 is based on the second capacitive element C2 (FIG. 164).

FIG. 166 shows details of the multi-stage filter 1064 illustrated in FIG. 162 according to an additional embodiment of the multi-stage filter 1064. The multi-stage filter 1064 illustrated in FIG. 166 is similar to the multi-stage filter 1064 illustrated in FIG. 163, except the multi-stage filter 1064 illustrated in FIG. 166 further includes a third LC filter 1082 coupled between the second LC filter 1070 and the DC-DC converter output 1066, and the second LC filter 1070 provides the multi-stage filter feedback signal MSFF. As such, loop behavior and stability of the feedback loop are substantially based on the first LC time constant and the second LC time constant. In alternate embodiments of the multi-stage filter 1064, any of the LC filters 1068, 1070, 1082 may provide the multi-stage filter feedback signal MSFF. The multi-stage filter 1064 includes the first LC filter 1068, the second LC filter 1070, and the third LC filter 1082 coupled in series between the first switching converter 456 (FIG. 162) and the DC-DC converter output 1066. The first LC filter 1068 has the first LC time constant, the second LC filter 1070 has the second LC time constant, and the third LC filter 1082 has a third LC time constant. The third LC time constant is less than the second LC time constant.

FIG. 167 shows details of the multi-stage filter 1064 illustrated in FIG. 166 according to another embodiment of the multi-stage filter 1064. The first LC filter 1068 includes the first inductive element L1 and the first capacitive element C1. The second LC filter 1070 includes the second inductive element L2 and the second capacitive element C2. The third LC filter 1082 includes the third inductive element L3 and the third capacitive element C3. The first inductive element L1 is coupled between the first switching converter 456 (FIG. 162) and the first capacitive element C1. The second inductive element L2 is coupled between the first inductive element L1 and the second capacitive element C2. The third inductive element L3 is coupled between the second inductive element L2 and the DC-DC converter output 1066. The third capacitive element C3 is coupled to the DC-DC converter output 1066.

FIG. 168 is a graph showing a frequency response of the multi-stage filter 1064 illustrated in FIG. 167 according to one embodiment of the multi-stage filter 1064. The multi-stage filter 1064 (FIG. 167) has the lowpass filter response 1072. The lowpass filter response 1072 has the first notch filter response 1074 having the first notch 1076 at the first notch frequency, has the second notch filter response 1078 having the second notch 1080 at the second notch frequency, and has a third notch filter response 1084 having a third notch 1086 at a third notch frequency.

The first capacitive element C1 (FIG. 167) has the first self-resonant frequency, which is about equal to the first notch frequency of the multi-stage filter 1064 (FIG. 167). As such, the first notch 1076 is based on the first capacitive element C1 (FIG. 167). Similarly, the second capacitive element C2 (FIG. 167) has the second self-resonant frequency, which is about equal to the second notch frequency of the multi-stage filter 1064 (FIG. 167). As such, the second notch 1080 is based on the second capacitive element C2 (FIG. 167). In addition, the third capacitive element C3 (FIG. 167) has a third self-resonant frequency, which is about equal to the third notch frequency of the multi-stage filter 1064 (FIG. 167). As such, the third notch 1086 is based on the third capacitive element C3 (FIG. 167).

FIG. 169 shows details of the multi-stage filter 1064 illustrated in FIG. 162 according to a further embodiment of the multi-stage filter 1064. The multi-stage filter 1064 includes the first LC filter 1068, the second LC filter 1070, and up to and including an $N^{TH}$ LC filter 1088 coupled in series between the first switching converter 456 (FIG. 162) and the DC-DC converter output 1066. N may be equal to any positive integer greater than two. In one embodiment of the multi-stage filter 1064, N is equal to four, such that the multi-stage filter 1064 has four LC filters coupled in series between the first switching converter 456 (FIG. 162) and the DC-DC converter output 1066. In an alternate embodiment of the multi-stage filter 1064, N is equal to five, such that the multi-stage filter 1064 has five LC filters coupled in series between the first switching converter 456 (FIG. 162) and the DC-DC converter output 1066.

FIG. 170 illustrates a process for selecting components for the multi-stage filter 1064 (FIG. 162) used with a switching converter, such as the first switching converter 456 (FIG. 162), according to one embodiment of the present disclosure. The process begins by determining a desired switching frequency of the switching converter (Step J10). The process continues by determining a first notch frequency of the multi-stage filter 1064 (FIG. 167) based on the desired switching frequency and a desired lowpass filter response of the multi-stage filter 1064 (FIG. 167) (Step J12). The process continues by selecting the first capacitive element C1 (FIG. 167) of the first LC filter 1068 (FIG. 167), such that a self-resonant frequency of the first capacitive element C1 (FIG. 167) is about equal to the first notch frequency (Step J14).

FIG. 171 illustrates a continuation of the process for selecting components for the multi-stage filter 1064 (FIG. 162) illustrated in FIG. 170 according to one embodiment of the present disclosure. The continuation of the process begins by determining desired loop behavior and stability of a feedback loop of the switching converter and the multi-stage filter 1064 (FIG. 167) (Step J16). The process continues by determining a desired first LC time constant of the first LC filter 1068 (FIG. 167) based on the desired loop behavior and stability (Step J18). The process continues by selecting the first inductive element L1 (FIG. 167), such that the first capacitive element C1 (FIG. 167) and the first inductive element L1 (FIG. 167) have an LC time constant about equal to the desired first LC time constant (Step J20).

FIG. 172 illustrates a continuation of the process for selecting components for the multi-stage filter 1064 (FIG. 162) illustrated in FIG. 171 according to one embodiment of the present disclosure. The continuation of the process begins by determining a second notch frequency of the multi-stage filter 1064 (FIG. 167) based on the desired switching frequency and the desired lowpass filter response of the multi-stage filter 1064 (FIG. 167) (Step J22). The process continues by selecting the second capacitive element C2 (FIG. 167) of the second LC filter 1070 (FIG. 167) of the multi-stage filter 1064 (FIG. 167), such that a second self-resonant frequency of the second capacitive element C2 (FIG. 167) is about equal to the second notch frequency (Step J24). The process continues by selecting the second inductive element L2 (FIG. 167) of the second LC filter 1070 (FIG. 167) based on the desired lowpass filter response of the multi-stage filter 1064 (FIG. 167) (Step J26).

FIG. 173 illustrates a continuation of the process for selecting components for the multi-stage filter 1064 (FIG. 162) illustrated in FIG. 172 according to one embodiment of the present disclosure. The continuation of the process begins by determining a third notch frequency of the multi-stage filter 1064 (FIG. 167) based on the desired switching frequency and the desired lowpass filter response of the multi-stage filter 1064 (FIG. 167) (Step J28). The process continues by selecting the third capacitive element C3 (FIG. 167) of the third LC filter 1082 (FIG. 167) of the multi-stage filter 1064 (FIG. 167), such that a third self-resonant frequency of the third capacitive element C3 (FIG. 167) is about equal to the third notch frequency (Step J30). The process continues by selecting the third inductive element L3 (FIG. 167) of the third LC filter 1082 (FIG. 167) based on the desired lowpass filter response of the multi-stage filter 1064 (FIG. 167) (Step J32).

Summaries of a combined RF detector and RF attenuator with concurrent outputs, embedded RF couplers underneath an RF switch semiconductor die, and cascaded RF couplers feeding RF signal conditioning circuitry are presented followed by detailed descriptions of the combined RF detector and RF attenuator with concurrent outputs, the embedded RF couplers underneath the RF switch semiconductor die, and the cascaded RF couplers feeding the RF signal conditioning circuitry.

Combined RF Detector and RF Attenuator with Concurrent Outputs

Embodiments of the present disclosure relate to RF signal conditioning circuitry, which includes RF detection circuitry and RF attenuation circuitry. The RF detection circuitry receives and detects an RF sample signal to provide an RF detection signal. The RF attenuation circuitry has an attenuation circuitry input, and receives and attenuates the RF sample signal via the attenuation circuitry input to provide an attenuated RF signal. The RF attenuation circuitry presents an attenuation circuitry input impedance at the attenuation circuitry input. The attenuated RF signal and the RF detection signal are provided concurrently. Providing concurrent attenuated RF and RF detection signals provides user flexibility.

In one embodiment of the RF signal conditioning circuitry, the RF signal conditioning circuitry includes no switching devices. Further, the RF detection circuitry further includes a detection circuitry input and a detection circuitry output. Additionally, the RF attenuation circuitry further includes an attenuation circuitry output. The RF detection circuitry receives the RF sample signal via the detection circuitry input and provides the RF detection signal via the detection circuitry output. The RF attenuation circuitry provides the attenuated RF signal via the attenuation circuitry output. As such, the detection circuitry output and the attenuation circuitry output are concurrent outputs. Further, the attenuation circuitry input impedance may be substantially constant, thereby further providing user flexibility.

In one embodiment of the RF attenuation circuitry, a magnitude of the RF sample signal is significantly greater than a magnitude of the attenuated RF signal. In a first embodiment of the RF attenuation circuitry, the magnitude of the RF sample signal is greater than two times the magnitude of the attenuated RF signal. In a second embodiment of the RF attenuation circuitry, the magnitude of the RF sample signal is greater than five times the magnitude of the attenuated RF signal. In a third embodiment of the RF attenuation circuitry, the magnitude of the RF sample signal is greater than ten times the magnitude of the attenuated RF signal. Since the magnitude of the RF sample signal is significantly greater than the magnitude of the attenuated RF signal, loading at the attenuation circuitry output does not significantly affect the attenuation circuitry input impedance.

In one embodiment of the RF signal conditioning circuitry, the RF detection circuitry presents a detection circuitry input impedance at the detection circuitry input, such that the detection circuitry input impedance is significantly greater than the attenuation circuitry input impedance. In a first embodiment of the RF signal conditioning circuitry, a magnitude of the detection circuitry input impedance is at least two times greater than a magnitude of the attenuation circuitry input impedance. In a second embodiment of the RF signal conditioning circuitry, a magnitude of the detection circuitry input impedance is at least five times greater than a magnitude of the attenuation circuitry input impedance. In a third embodiment of the RF signal conditioning circuitry, a magnitude of the detection circuitry input impedance is at least ten times greater than a magnitude of the attenuation circuitry input impedance.

Embedded RF Couplers Underneath an RF Switch Semiconductor Die

The present disclosure relates to circuitry, which includes an RF switch semiconductor die and a laminate. The RF switch semiconductor die is attached to the laminate, such that the RF switch semiconductor die is over the laminate. The RF switch semiconductor die has an alpha switch input and a beta switch input. The laminate includes a first RF coupler and a second RF coupler. The first RF coupler is embedded in the laminate underneath the RF switch semiconductor die and the second RF coupler is embedded in the laminate underneath the RF switch semiconductor die. A first RF signal path is routed through the first RF coupler, such that one end of the first RF signal path is coupled to the alpha switch input. A second RF signal path is routed through the second RF coupler, such that one end of the second RF signal path is coupled to the beta switch input.

In one embodiment of the circuitry, a third RF signal path is routed through the first RF coupler and a fourth RF signal path is routed through the second RF coupler. A portion of RF power flowing through the first RF signal path in the first RF coupler is coupled to the third RF signal path to provide coupled RF power from the first RF signal path. A portion of RF power flowing through the second RF signal path in the second RF coupler is coupled to the fourth RF signal path to provide coupled RF power from the second RF signal path.

In one embodiment of the circuitry, only the first RF signal path or the second RF signal path, but not both simultaneously has RF power flowing. As a result, the first RF coupler and the second RF coupler may be cascaded to simplify circuitry. In this regard, one end of the third RF signal path is coupled to a termination resistive element and an opposite end of the third RF signal path is coupled to one end of the fourth RF signal path. An opposite end of the fourth RF signal path provides coupled RF power from either the first RF signal path or the second RF signal path. As such, the opposite end of the fourth RF signal path may be coupled to RF signal conditioning circuitry.

In one embodiment of the RF signal conditioning circuitry, the RF signal conditioning circuitry receives and detects a portion of coupled RF power from either the first RF signal path or the second RF signal path to provide an RF detection signal. Additionally, the RF signal conditioning circuitry provides an attenuated RF signal based on attenuating a portion of coupled RF power from either the first RF signal path or the second RF signal path. The RF signal conditioning circuitry may provide the RF detection signal and the attenuated RF signal to transceiver circuitry.

In one embodiment of the circuitry, an inductance of the third RF signal path in the first RF coupler may at least somewhat isolate the termination resistive element from the second RF coupler. Therefore, a coupler capacitive element may be coupled between the opposite end of the third RF signal path and the one end of the fourth RF signal path to compensate for the inductance of the third RF signal path in the first RF coupler.

Cascaded RF Couplers Feeding RF Signal Conditioning Circuitry

The present disclosure relates to circuitry, which includes a first transmit path, a second transmit path, and RF signal conditioning circuitry. The first transmit path includes a first RF coupler and the second transmit path includes a second RF coupler. The first RF coupler extracts a portion, called a first portion, of RF power flowing through the first transmit path from the first transmit path, and the second RF coupler extracts a portion, called a second portion, of RF power flowing through the second transmit path from the second transmit path. The first RF coupler and the second RF coupler are cascaded in series to feed the first and the second portions to the RF signal conditioning circuitry via the RF coupler signal input. The RF signal conditioning circuitry provides an RF detection signal based on detecting the first and the second portions and an attenuated RF signal based on attenuating the first and the second portions.

In one embodiment of the circuitry, only one transmit path is active at a time. Therefore, the first and the second RF couplers do not interfere with one another. As such, when the first transmit path is active, the second portion is equal to about zero, and the RF detection signal and the attenuated RF signal are essentially based on only the first portion. Conversely, when the second transmit path is active, the first portion is equal to about zero, and the RF detection signal and the attenuated RF signal are essentially based on only the second portion. In a first exemplary embodiment of the circuitry, the first RF coupler and the second RF coupler are cascaded in series, such that the first portion flows through the second RF coupler. In a second exemplary embodiment of the circuitry, the first RF coupler and the second RF coupler are cascaded in series, such that the second portion flows through the first RF coupler.

In one embodiment of the first transmit path and the second transmit path, the first transmit path includes a first RF PA and alpha switching circuitry, and the second transmit path includes a second RF PA and beta switching circuitry. The first RF PA feeds the alpha switching circuitry and the second RF PA feeds the beta switching circuitry. The first RF coupler is coupled between the first RF PA and the alpha switching circuitry, and the second RF coupler is coupled between the second RF PA and the beta switching circuitry. In one embodiment of the circuitry, the circuitry operates in either a first PA operating mode or a second PA operating mode. During the first PA operating mode, the first RF PA receives and amplifies a first RF input signal to provide a first RF output signal. As such, during the first PA operating mode, the first transmit path is active and the second RF PA is disabled, such that the second portion is equal to about zero. Conversely, during the second PA operating mode, the second RF PA receives and amplifies a second RF input signal to provide a second RF output signal. As such, during the second PA operating mode, the second transmit path is active and the first RF PA is disabled, such that the first portion is equal to about zero.

In one embodiment of the RF signal conditioning circuitry, the RF signal conditioning circuitry includes RF detection circuitry to detect the first and the second portions to provide the RF detection signal. Further, the RF signal conditioning circuitry includes RF attenuation circuitry to attenuate the first and the second portions to provide the attenuated RF signal. In one embodiment of the circuitry, the circuitry includes a termination resistive element coupled to the first RF coupler to terminate one end of the signal path through the first and the second RF couplers to the RF signal conditioning circuitry. However, inductance in the first RF coupler may at least somewhat isolate the termination resistive element from the second RF coupler. Therefore, the circuitry may include a coupler capacitive element coupled between the first and the second RF couplers to compensate for the inductance in the first RF coupler.

FIG. 174 shows RF signal conditioning circuitry 1090 according to one embodiment of the RF signal conditioning circuitry 1090. The PA controller semiconductor die 1050 (FIG. 159A) includes the RF signal conditioning circuitry 1090. The RF signal conditioning circuitry 1090 includes RF detection circuitry 1092 and RF attenuation circuitry 1094. The RF detection circuitry 1092 has a detection circuitry input IND and a detection circuitry output OTD. The RF detection circuitry 1092 and receives and detects an RF sample signal RFSS via the detection circuitry input IND to provide an RF detection signal RFDT via the detection circuitry output OTD. The RF attenuation circuitry 1094 has an attenuation circuitry input INA and an attenuation circuitry output OTA. The RF attenuation circuitry 1094 receives and attenuates the RF sample signal RFSS via the attenuation circuitry input INA to provide an attenuated RF signal RFAT via the attenuation circuitry output OTA. The RF attenuation circuitry 1094 presents an attenuation circuitry input impedance at the attenuation circuitry input INA. The attenuated RF signal RFAT and the RF detection signal RFDT are provided concurrently. Providing concurrent attenuated RF and RF detection signals provides user flexibility. In one embodiment of the RF signal conditioning circuitry 1090, the RF signal conditioning circuitry 1090 provides the attenuated RF signal RFAT to the control circuitry 42 (FIG. 6), which receives the attenuated RF signal RFAT. Further, the RF signal conditioning circuitry 1090 provides the RF detection signal RFDT to the control circuitry 42 (FIG. 6), which receives the RF detection signal RFDT.

In one embodiment of the RF signal conditioning circuitry 1090, the RF signal conditioning circuitry 1090 includes no switching devices. Since the RF detection circuitry 1092 provides the RF detection signal RFDT via the detection circuitry output OTD and the RF attenuation circuitry 1094 provides the attenuated RF signal RFAT via the attenuation circuitry output OTA the detection circuitry output OTD and the attenuation circuitry output OTA are concurrent outputs. Further, the attenuation circuitry input impedance may be substantially constant, thereby further providing user flexibility.

In one embodiment of the RF attenuation circuitry 1094, a magnitude of the RF sample signal RFSS is significantly greater than a magnitude of the attenuated RF signal RFAT. In a first embodiment of the RF attenuation circuitry 1094, the magnitude of the RF sample signal RFSS is greater than two times the magnitude of the attenuated RF signal RFAT. In a second embodiment of the RF attenuation circuitry 1094, the magnitude of the RF sample signal RFSS is greater than five times the magnitude of the attenuated RF signal RFAT. In a third embodiment of the RF attenuation circuitry 1094, the magnitude of the RF sample signal RFSS is greater than ten times the magnitude of the attenuated RF signal RFAT. Since the magnitude of the RF sample signal RFSS is significantly greater than the magnitude of the attenuated RF signal RFAT, loading at the attenuation circuitry output OTA does not significantly affect the attenuation circuitry input impedance.

In one embodiment of the RF signal conditioning circuitry 1090, the RF detection circuitry 1092 presents a detection circuitry input impedance at the detection circuitry input IND, such that the detection circuitry input impedance is significantly greater than the attenuation circuitry input impedance. In a first embodiment of the RF signal conditioning circuitry 1090, a magnitude of the detection circuitry input impedance is at least two times greater than a magnitude of the attenuation circuitry input impedance. In a second embodiment of the RF signal conditioning circuitry 1090, a magnitude of the detection circuitry input impedance is at least five times greater than a magnitude of the attenuation circuitry input impedance. In a third embodiment of the RF signal conditioning circuitry 1090, a magnitude of the detection circuitry input impedance is at least ten times greater than a magnitude of the attenuation circuitry input impedance.

FIG. 175 shows details of the RF attenuation circuitry 1094 according to one embodiment of the RF attenuation circuitry 1094. The RF attenuation circuitry 1094 includes a first series attenuation resistive element RR1 and a second series attenuation resistive element RR2 coupled in series between the attenuation circuitry input INA and the attenuation circuitry output OTA. The RF attenuation circuitry 1094 further includes a first shunt attenuation resistive element RN1 and a second shunt attenuation resistive element RN2. The first shunt attenuation resistive element RN1 is coupled between a ground and a junction of the first series attenuation resistive element RR1 and the second series attenuation resistive element RR2. The second shunt attenuation resistive element RN2 is coupled between the attenuation circuitry output OTA and the ground.

In an alternate embodiment of the RF attenuation circuitry 1094, the second series attenuation resistive element RR2 and the second shunt attenuation resistive element RN2 are omitted, such that the first series attenuation resistive element RR1 is coupled between the attenuation circuitry input INA and the attenuation circuitry output OTA, and the first shunt attenuation resistive element RN1 is coupled between the attenuation circuitry output OTA and the ground.

FIG. 176 is a schematic diagram showing details of the RF PA circuitry 30 according to one embodiment of the RF PA circuitry 30. The RF PA circuitry 30 illustrated in FIG. 176 is similar to the RF PA circuitry 30 illustrated in FIG. 7, except the RF PA circuitry 30 illustrated in FIG. 176 further includes a laminate 1096, which includes the first transmit path 46 and the second transmit path 48. The first transmit path 46 includes the alpha switching circuitry 52 and further includes the first RF PA semiconductor die 1054, which includes the first RF PA 50, and a first RF coupler 1098. The second transmit path 48 includes the beta switching circuitry 56 and further includes the second RF PA semiconductor die 1056, which includes the second RF PA 54, and a second RF coupler 1100. The laminate 1096 further includes the RF switch semiconductor die 1058, which includes the alpha switching circuitry 52 and the beta switching circuitry 56. Additionally, the RF switch semiconductor die 1058 has an alpha switch input ASI, which is coupled to the alpha switching circuitry 52, and a beta switch input BSI, which is coupled to the beta switching circuitry 56. The RF switch semiconductor die 1058 is attached to the laminate 1096, such that the RF switch semiconductor die 1058 is over the laminate 1096. In one embodiment of the first RF PA semiconductor die 1054, the first RF PA semiconductor die 1054 is a highband RF PA semiconductor die. In one embodiment of the second RF PA semiconductor die 1056, the second RF PA semiconductor die 1056 is a lowband RF PA semiconductor die.

The first RF coupler 1098 has a first RF signal path 1102 routed through the first RF coupler 1098. One end of the first RF signal path 1102 is coupled to the alpha switch input ASI and an opposite end of the first RF signal path 1102 is coupled to the single alpha PA output SAP of the first RF PA 50. As such, the first RF coupler 1098 is coupled between the first RF PA 50 and the alpha switching circuitry 52. The second RF coupler 1100 has a second RF signal path 1104 routed through the second RF coupler 1100. One end of the second RF signal path 1104 is coupled to the beta switch input BSI and an opposite end of the second RF signal path 1104 is coupled to the single beta PA output SBP of the second RF PA 54. As such, the second RF coupler 1100 is coupled between the second RF PA 54 and the beta switching circuitry 56.

FIG. 177 shows details of the RF PA circuitry 30 illustrated in FIG. 176 according to one embodiment of the RF PA circuitry 30. The RF PA circuitry 30 includes the laminate 1096, which includes the first RF coupler 1098 and the second RF coupler 1100, and further includes a termination resistive element RTE and a coupler capacitive element CCE. The first RF coupler 1098 further has a third RF signal path 1106 routed through the first RF coupler 1098. The second RF coupler 1100 further has a fourth RF signal path 1108 routed through the second RF coupler 1100.

During the first PA operating mode, the first RF coupler 1098 has a first RF power 1110 flowing through the first RF signal path 1102. As such, the first RF power 1110 flows through the first transmit path 46 (FIG. 176). A portion, called a first portion, of the first RF power 1110 is extracted from the first transmit path 46 (FIG. 176) and coupled to the third RF signal path 1106 to provide coupled RF power from the first RF signal path 1102. During the second PA operating mode, the second RF coupler 1100 has a second RF power 1112 flowing through the second RF signal path 1104. As such, the second RF power 1112 flows through the second transmit path 48 (FIG. 176). A portion, called a second portion, of the second RF power 1112 is extracted from the second transmit path 48 (FIG. 176) and coupled to the fourth RF signal path 1108 to provide coupled RF power from the second RF signal path 1104.

The second RF coupler 1100 is cascaded in series with the first RF coupler 1098 to feed the first portion and the second portion to the RF signal conditioning circuitry 1090 (FIG. 174). As such, the second RF coupler 1100 is coupled to the RF signal conditioning circuitry 1090 (FIG. 174). Further, the first portion flows through the second RF coupler 1100. In this regard, the RF signal conditioning circuitry 1090 (FIG. 174) receives and detects the first portion and the second portion to provide the RF detection signal RFDT (FIG. 174). Further, the RF signal conditioning circuitry 1090 (FIG. 174) receives and attenuates the first portion and the second portion to provide the attenuated RF signal RFAT (FIG. 174). Specifically, the RF signal conditioning circuitry 1090 (FIG. 174) includes the RF detection circuitry 1092 (FIG. 174), which detects the first portion and the second portion to provide the RF detection signal RFDT (FIG. 174). The RF signal conditioning circuitry 1090 (FIG. 174) includes the RF attenuation circuitry 1094 (FIG. 174), which attenuates the first portion and the second portion to provide the attenuated RF signal RFAT (FIG. 174).

In one embodiment of the RF PA circuitry 30, during the first PA operating mode, the second RF power 1112 is about equal to zero. As such, the second portion and the coupled RF power from the second RF signal path 1104 is about equal to zero. During the second PA operating mode, the first RF power 1110 is about equal to zero. As such, the first portion and the coupled RF power from the first RF signal path 1102 is about equal to zero.

The termination resistive element RTE is coupled to the first RF coupler 1098. Specifically, one end of the third RF signal path 1106 is coupled to one end of the termination resistive element RTE. An opposite end of the termination resistive element RTE is coupled to a ground. An opposite end of the third RF signal path 1106 is coupled to one end of the fourth RF signal path 1108. The coupler capacitive element CCE is coupled between the first RF coupler 1098 and the second RF coupler 1100 to compensate for inductance in the first RF coupler 1098. Specifically, the coupler capacitive element CCE is coupled between the one end of the third RF signal path 1106 and the one end of the fourth RF signal path 1108 to compensate for inductance in the third RF signal path

1106. An opposite end of the fourth RF signal path 1108 provides the RF sample signal RFSS (FIG. 174) to the RF signal conditioning circuitry 1090 (FIG. 174). As such, the opposite end of the fourth RF signal path 1108 is coupled to the RF signal conditioning circuitry 1090 (FIG. 174).

During the first PA operating mode, the RF signal conditioning circuitry 1090 (FIG. 174) receives and detects the coupled RF power from the first RF signal path 1102 to provide the RF detection signal RFDT (FIG. 174). Further, during the first PA operating mode, the RF signal conditioning circuitry 1090 (FIG. 174) provides the attenuated RF signal RFAT (FIG. 174) based on attenuating a portion of the coupled RF power from the first RF signal path 1102. During the second PA operating mode, the RF signal conditioning circuitry 1090 (FIG. 174) receives and detects the coupled RF power from the second RF signal path 1104 to provide the RF detection signal RFDT (FIG. 174). Further, during the second PA operating mode, the RF signal conditioning circuitry 1090 (FIG. 174) provides the attenuated RF signal RFAT (FIG. 174) based on attenuating a portion of the coupled RF power from the second RF signal path 1104. In one embodiment of the RF switch semiconductor die 1058 (FIG. 176), the RF switch semiconductor die 1058 (FIG. 176) includes the termination resistive element RTE.

FIG. 178 shows a physical layout of the RF PA circuitry 30 illustrated in FIG. 176 according to one embodiment of the RF PA circuitry 30. The RF PA circuitry 30 includes the laminate 1096. The laminate 1096 includes the RF switch semiconductor die 1058 and the first RF coupler 1098 and the second RF coupler 1100. The RF switch semiconductor die 1058 is attached to the laminate 1096, such that the RF switch semiconductor die 1058 is over the laminate 1096. The first RF coupler 1098 is embedded in the laminate 1096 underneath the RF switch semiconductor die 1058. The second RF coupler 1100 is embedded in the laminate 1096 underneath the RF switch semiconductor die 1058.

In one embodiment of the RF PA circuitry 30, the laminate 1096 is the supporting structure 1018 (FIG. 155). As such, the laminate 1096 includes the first insulating layer 1020 (FIG. 155), the first conducting layer 1022 (FIG. 155), the second insulating layer 1024 (FIG. 155), the second conducting layer 1026 (FIG. 155), the third insulating layer 1028 (FIG. 155), and the ground plane 1030 (FIG. 155). The ground plane 1030 (FIG. 155) is between the RF switch semiconductor die 1058 and the first RF coupler 1098. The ground plane 1030 (FIG. 155) is between the RF switch semiconductor die 1058 and the second RF coupler 1100. Alternate embodiments of the laminate 1096 may exclude any or all of the layers 1020 (FIG. 155), 1022 (FIG. 155), 1024 (FIG. 155), 1026 (FIG. 155), 1028 (FIG. 155), 1030 (FIG. 155). Further, alternate embodiments of the laminate 1096 may include intervening layers between any or all of pairs of the layers 1020 (FIG. 155), 1022 (FIG. 155), 1024 (FIG. 155), 1026 (FIG. 155), 1028 (FIG. 155), 1030 (FIG. 155).

Some of the circuitry previously described may use discrete circuitry, integrated circuitry, programmable circuitry, non-volatile circuitry, volatile circuitry, software executing instructions on computing hardware, firmware executing instructions on computing hardware, the like, or any combination thereof. The computing hardware may include mainframes, micro-processors, micro-controllers, DSPs, the like, or any combination thereof. The term "coupled," as used in this specification means electrically coupled. Other terms, such as "thermally coupled" or "mechanically coupled" may or may not also be electrically coupled. The term "coupled" refers to elements that may be electrically coupled together either with or without other interposing elements. The term "directly coupled" means directly electrically coupled, such that the elements have an electrical conduction path between them, such that the electrical conduction path has only electrically conductive material.

None of the embodiments of the present disclosure are intended to limit the scope of any other embodiment of the present disclosure. Any or all of any embodiment of the present disclosure may be combined with any or all of any other embodiment of the present disclosure to create new embodiments of the present disclosure.

LIST OF ELEMENTS traditional multi-mode multi-band communications device 10
traditional multi-mode multi-band transceiver 12
traditional multi-mode multi-band PA circuitry 14
traditional multi-mode multi-band front-end aggregation circuitry 16
antenna 18
first traditional PA 20
second traditional PA 22
$N^{TH}$ traditional PA 24
RF communications system 26
RF modulation and control circuitry 28
RF PA circuitry 30
DC-DC converter 32
transceiver circuitry 34
front-end aggregation circuitry 36
down-conversion circuitry 38
baseband processing circuitry 40
control circuitry 42
RF modulation circuitry 44
first transmit path 46
second transmit path 48
first RF PA 50
alpha switching circuitry 52
second RF PA 54
beta switching circuitry 56
control circuitry DCI 58
PA-DCI 60
DC-DC converter DCI 62
aggregation circuitry DCI 64
digital communications bus 66
alpha RF switch 68
first alpha harmonic filter 70
beta RF switch 72
first beta harmonic filter 74
second alpha harmonic filter 76
second beta harmonic filter 78
DC power supply 80
first power filtering circuitry 82
charge pump buck converter 84
buck converter 86
second power filtering circuitry 88
DC-DC control circuitry 90
charge pump 92
PA control circuitry 94
PA bias circuitry 96
switch driver circuitry 98
first non-quadrature PA path 100
first quadrature PA path 102
second non-quadrature PA path 104
second quadrature PA path 106
first input PA impedance matching circuit 108
first input PA stage 110
first feeder PA impedance matching circuit 112 first feeder PA stage 114
second input PA impedance matching circuit 116
second input PA stage 118
second feeder PA impedance matching circuit 120
second feeder PA stage 122
first quadrature RF splitter 124
first in-phase amplification path 126
first quadrature-phase amplification path 128
first quadrature RF combiner 130
second quadrature RF splitter 132
second in-phase amplification path 134
second quadrature-phase amplification path 136
second quadrature RF combiner 138
first in-phase driver PA impedance matching circuit 140
first in-phase driver PA stage 142
first in-phase final PA impedance matching circuit 144
first in-phase final PA stage 146
first in-phase combiner impedance matching circuit 148
first quadrature-phase driver PA impedance matching circuit 150
first quadrature-phase driver PA stage 152
first quadrature-phase final PA impedance matching circuit 154
first quadrature-phase final PA stage 156
first quadrature-phase combiner impedance matching circuit 158
second in-phase driver PA impedance matching circuit 160
second in-phase driver PA stage 162
second in-phase final PA impedance matching circuit 164
second in-phase final PA stage 166
second in-phase combiner impedance matching circuit 168
second quadrature-phase driver PA impedance matching circuit 170
second quadrature-phase driver PA stage 172
second quadrature-phase final PA impedance matching circuit 174
second quadrature-phase final PA stage 176
second quadrature-phase combiner impedance matching circuit 178
first output transistor element 180
characteristic curves 182
first output load line 184
first load line slope 186
first non-quadrature path power coupler 188
second non-quadrature path power coupler 190
first phase-shifting circuitry 192
first Wilkinson RF combiner 194
first in-phase final transistor element 196
first in-phase biasing circuitry 198
first quadrature-phase final transistor element 200
first quadrature-phase biasing circuitry 202
first pair 204 of tightly coupled inductors
first parasitic capacitance 206
first feeder biasing circuitry 208
first PA semiconductor die 210
second phase-shifting circuitry 212
second Wilkinson RF combiner 214
second in-phase final transistor element 216
second in-phase biasing circuitry 218
second quadrature-phase final transistor element 220
second quadrature-phase biasing circuitry 222
second pair 224 of tightly coupled inductors
second parasitic capacitance 226
second output transistor element 228
second feeder biasing circuitry 230
second PA semiconductor die 232
first substrate and functional layers 234
insulating layers 236
metallization layers 238
first alpha switching device 240
second alpha switching device 242
third alpha switching device 244
first beta switching device 246
second beta switching device 248
third beta switching device 250
first driver stage 252
first final stage 254
second driver stage 256
second final stage 258
driver stage IDAC circuitry 260
final stage IDAC circuitry 262
driver stage IDAC 264
driver stage multiplexer 266
driver stage current reference circuitry 268
final stage IDAC 270
final stage multiplexer 272
final stage current reference circuitry 274
driver stage temperature compensation circuit 276
final stage temperature compensation circuit 278
PA envelope power supply 280
PA bias power supply 282
first series coupling 284
second series coupling 286
first AC23SCI 300
SOS detection circuitry 302
sequence processing circuitry 304
3-wire serial communications bus 306
2-wire serial communications bus 308
sequence detection OR gate 310
CS detection circuitry 312
SSC detection circuitry 314
serial clock period 316
data bit period 318
received sequence 320
SOS 322
second AC23SCI 324
third AC23SCI 326
multi-mode multi-band RF power amplification circuitry 328
first LUT 330
configuration information 332
DC-DC LUT structure 334
DC-DC converter operating criteria 336
first DC-DC LUT 338
DC-DC LUT index information 340
DC-DC converter operational control parameters 342
DC-DC converter configuration information 344
operating status information 346
envelope power supply setpoint 348
selected converter operating mode 350
selected pump buck operating mode 352
selected charge pump buck base switching frequency 354
selected charge pump buck switching frequency dithering mode 356
selected charge pump buck dithering characteristics 358
selected charge pump buck dithering frequency 360
selected bias supply operating mode 362
selected bias supply base switching frequency 364
selected bias supply switching frequency dithering mode 366
selected bias supply dithering characteristics 368
selected bias supply dithering frequency 370
desired envelope power supply setpoint 372
DC-DC converter temperature 374

RF PA circuitry temperature 376
operating efficiencies 378
operating limits 380
operating headroom 382
electrical noise reduction 384
PA operating linearity 386
first efficiency curve 388
second efficiency curve 390
third efficiency curve 392
fourth efficiency curve 394
fifth efficiency curve 396
sixth efficiency curve 398
seventh efficiency curve 400
eighth efficiency curve 402
first C23SCI 404
sequence abort inverter 406
sequence abort AND gate 408
second C23SCI 410
third C23SCI 412
first switching power supply 450
second switching power supply 452
frequency synthesis circuitry 454
first switching converter 456
second switching converter 458
first output inductance node 460
second output inductance node 462
first frequency oscillator 464
second frequency oscillator 466
frequency synthesis control circuitry 468
first buffer 470
second buffer 472
first divider 474
second divider 476
clock signal comparator 478
first ramp comparator 480
programmable signal generation circuitry 482
first slope 484
second slope 486
first desired period 488
second desired period 490
first propagation delay 492
first actual period 494
second actual period 496
first overshoot 498
second overshoot 500
first example slope 502
second example slope 504
first phase 506
second phase 508
first ramp IDAC 510
capacitor discharge circuit 512
first reference DAC 514
second ramp comparator 516
ramping signal peak 517
second ramp IDAC 518
second reference DAC 520
first fixed supply 522
second fixed supply 524
charge pump buck power supply 526
buck power supply 528
energy storage element 530
third power filtering circuitry 532
PWM circuitry 534
charge pump buck switching circuitry 536
buck switching circuitry 538
charge pump buck switching control circuitry 540
charge pump buck switch circuit 542
buck switching control circuitry 544
buck switch circuit 546
first portion 548
DC-DC converter semiconductor die 550
beta inductive element connection node 552
first shunt buck switching element 554
second shunt buck switching element 556
first series buck switching element 558
second series buck switching element 560
second portion 562
alpha inductive element connection node 564
first alpha flying capacitor connection node 566
second alpha flying capacitor connection node 568
first beta flying capacitor connection node 570
second beta flying capacitor connection node 572
alpha decoupling connection node 574
beta decoupling connection node 576
alpha ground connection node 578
beta ground connection node 580
first shunt pump buck switching element 582
second shunt pump buck switching element 584
first alpha charging switching element 586
first beta charging switching element 588
second alpha charging switching element 590
second beta charging switching element 592
first series alpha switching element 594
first series beta switching element 596
second series alpha switching element 598
second series beta switching element 600
series phase 602
shunt phase 604
alpha series phase 606
alpha shunt phase 608
beta series phase 610
beta shunt phase 612
substrate 614
epitaxial structure 616
top metallization layer 618
topwise cross section 620
centerline axis 622
first end 624
first row 626
second row 628
third row 630
first alpha end 632
first beta end 634
second alpha end 636
second beta end 638
third alpha end 640
third beta end 642
first row centerline 644
second row centerline 646
third row centerline 648
centerline spacing 650
supporting structure 652
interconnects 654
first snubber circuit 656
second snubber circuit 658
first IDAC 700
second IDAC 702
DC reference supply 704
first alpha IDAC cell 706
second alpha IDAC cell 708
$N^{TH}$ alpha IDAC cell 710
first alpha series connection node 712
first alpha shunt connection node 714
second alpha series connection node 716 second alpha shunt connection node 718
$N^{TH}$ alpha series connection node 720
$N^{TH}$ alpha shunt connection node 722
first beta IDAC cell 724
second beta IDAC cell 726
$M^{TH}$ beta IDAC cell 728
first beta series connection node 730
first beta shunt connection node 732
second beta series connection node 734
second beta shunt connection node 736
$M^{TH}$ beta series connection node 738
$M^{TH}$ beta shunt connection node 740
alpha IDAC cell 742
alpha current source 744
alpha series circuit 746
alpha shunt circuit 748
alpha series connection node 750
alpha shunt connection node 752
beta IDAC cell 754
beta current source 756
beta series circuit 758
beta shunt circuit 760
beta series connection node 762
beta shunt connection node 764
converter switching circuitry 766
loop amplifier 768
loop differential amplifier 770
loop filter 772
PWM comparator 774
switching period 776
negative pulse 778
pulse width 780
signal conditioning circuitry 782
unlimited embodiment 784
hard limited embodiment 786
limit threshold 788
soft limited embodiment 790
slew rate 792
slew rate threshold 794
slew rate limit 796
error signal correction circuitry 798
second amplitude 800
first amplitude 802
ramping signal correction circuitry 804
PWM signal correction circuitry 806
maximum pulse width 808
switching circuitry 810
switching control circuitry 812
series switching circuitry 814
first shunt switching element 816
output inductance node 818
second shunt switching element 820
two-state level shifter 822
two-state power supply 824
two-state output 826
first group 828 of switching elements
second group 830 of switching elements
cascode bias circuitry 832
level shifter inverter 834
first level shifter switching element 836
second level shifter switching element 838
third level shifter switching element 840
fourth level shifter switching element 842
fifth level shifter switching element 844
sixth level shifter switching element 846
seventh level shifter switching element 848
eighth level shifter switching element 850
ninth level shifter switching element 852
tenth level shifter switching element 854
RF supporting structure 856
RF switch semiconductor die 858
first alpha shunt switching device 860
second alpha shunt switching device 862
third alpha shunt switching device 864
first beta shunt switching device 866
second beta shunt switching device 868
third beta shunt switching device 870
first alpha switch die connection node 872
second alpha switch die connection node 874
third alpha switch die connection node 876
alpha AC grounding switch die connection node 878
first beta switch die connection node 880
second beta switch die connection node 882
third beta switch die connection node 884
beta AC grounding switch die connection node 886
first alpha supporting structure connection node 888
second alpha supporting structure connection node 890
third alpha supporting structure connection node 892
alpha AC grounding supporting structure connection node 894
first beta supporting structure connection node 896
second beta supporting structure connection node 898
third beta supporting structure connection node 900
beta AC grounding supporting structure connection node 902
first edge 904
second edge 906
group 908 of alpha supporting structure connection nodes
group 910 of beta supporting structure connection nodes
interconnects 912
SAH current estimating circuit 914
series switching element 916
mirror differential amplifier 918
mirror switching element 920
mirror buffer transistor element 922
SAH switching element 924
DC-DC converter temperature measurement circuitry 926
final stage current reference circuit 928
final stage selectable threshold comparator circuit 930
final stage variable gain amplifier 932
final stage combining circuit 934
driver stage current reference circuit 936
driver stage selectable threshold comparator circuit 938
driver stage variable gain amplifier 940
driver stage combining circuit 942
RF PA stage 944
RF PA amplifying transistor 946
RF PA temperature compensating bias transistor 948
first RF PA stage bias transistor 950
second RF PA stage bias transistor 952
first array 954 of amplifying transistor elements
second array 956 of amplifying transistor elements
first alpha amplifying transistor element 958
second alpha amplifying transistor element 960
$N^{TH}$ alpha amplifying transistor element 962
first beta amplifying transistor element 964
second beta amplifying transistor element 966
$M^{TH}$ beta amplifying transistor element 968
normal HBT 970
emitter 972
base 974
collector 976
linear HBT 978
thermal coupling 980 split current IDAC 982
group 984 of array bias signals FABS, SABS
in-phase RF PA stage 986
quadrature-phase RF PA stage 988
first group 990 of arrays of amplifying transistor elements
second group 992 of arrays of amplifying transistor elements
third array 994 of amplifying transistor elements
fourth array 996 of amplifying transistor elements
first gamma amplifying transistor element 998
second gamma amplifying transistor element 1000
$P^{TH}$ gamma amplifying transistor element 1002
first delta amplifying transistor element 1004
second delta amplifying transistor element 1006
$Q^{TH}$ delta amplifying transistor element 1008
overlay class F choke 1010
pair 1012 of mutually coupled class F inductive elements
mutual coupling 1014
RF PA semiconductor die 1016
supporting structure 1018
first insulating layer 1020
first conducting layer 1022
second insulating layer 1024
second conducting layer 1026
third insulating layer 1028
ground plane 1030
first cross-section 1032
second cross-section 1033
first printed wiring trace 1034
connecting pads 1036
second printed wiring trace 1038
PA controller semiconductor die 1050
first ESD protection circuit 1052
first RF PA semiconductor die 1054
second RF PA semiconductor die 1056
RF switch semiconductor die 1058
second ESD protection circuit 1060
$N^{TH}$ ESD protection circuit 1062
multi-stage filter 1064
DC-DC converter output 1066
first LC filter 1068
second LC filter 1070
lowpass filter response 1072
first notch filter response 1074
first notch 1076
second notch filter response 1078
second notch 1080
third LC filter 1082
third notch filter response 1084
third notch 1086
$N^{TH}$ LC filter 1088
RF signal conditioning circuitry 1090
RF detection circuitry 1092
RF attenuation circuitry 1094
laminate 1096
first RF coupler 1098
second RF coupler 1100
first RF signal path 1102
second RF signal path 1104
third RF signal path 1106
fourth RF signal path 1108
first RF power 1110
second RF power 1112
first input resistive element RFI
first isolation port resistive element RI1
first base resistive element RB1
first Wilkinson resistive element RW1
second isolation port resistive element RI2
second base resistive element RB2
second Wilkinson resistive element RW2
CS resistive element RCS
level shifter resistive element RLS
first cascode resistive element RC1
second cascode resistive element RC2
first mirror resistive element RM1
second mirror resistive element RM2
first bias resistive element RS1
second bias resistive element RS2
first series attenuation resistive element RR1
second series attenuation resistive element RR2
first shunt attenuation resistive element RN1
second shunt attenuation resistive element RN2
termination resistive element RTE
first inductive element L1
second inductive element L2
third inductive element L3
inverting output inductive element LIO
first in-phase collector inductive element LCI
first quadrature-phase collector inductive element LCQ
first in-phase shunt inductive element LUI
first quadrature-phase shunt inductive element LUQ
first collector inductive element LC1
second collector inductive element LC2
first in-phase phase-shift inductive element LPI1
first quadrature-phase phase-shift inductive element LPQ1
first Wilkinson in-phase side inductive element LWI1
first Wilkinson quadrature-phase side inductive element LWQ1
second in-phase collector inductive element LLI
second quadrature-phase collector inductive element LLQ
second in-phase shunt inductive element LNI
second quadrature-phase shunt inductive element LNQ
second in-phase phase-shift inductive element LPI2
second quadrature-phase phase-shift inductive element LPQ2
second Wilkinson in-phase side inductive element LWI2
second Wilkinson quadrature-phase side inductive element LWQ2
class F series inductive element LFS
class F tank inductive element LFT
first capacitive element C1
second capacitive element C2
third capacitive element C3
first in-phase series capacitive element CSI1
second in-phase series capacitive element CSI2
first quadrature-phase series capacitive element CSQ1
second quadrature-phase series capacitive element CSQ2
first DC blocking capacitive element CD1
first coupler capacitive element CC1
second coupler capacitive element CC2
first in-phase phase-shift capacitive element CPI1
first quadrature-phase phase-shift capacitive element CPQ1
first Wilkinson capacitive element CW1
first Wilkinson in-phase side capacitive element CWI1
first Wilkinson quadrature-phase side capacitive element CWQ1
second DC blocking capacitive element CD2
third DC blocking capacitive element CD3
fourth DC blocking capacitive element CD4
third in-phase series capacitive element CSI3
fourth in-phase series capacitive element CSI4
third quadrature-phase series capacitive element CSQ3
fourth quadrature-phase series capacitive element CSQ4 fifth DC blocking capacitive element CD5
second in-phase phase-shift capacitive element CPI2
second quadrature-phase phase-shift capacitive element CPQ2
second Wilkinson capacitive element CW2
second Wilkinson in-phase side capacitive element CWI2
second Wilkinson quadrature-phase side capacitive element CWQ2
sixth DC blocking capacitive element CD6
seventh DC blocking capacitive element CD7
eighth DC blocking capacitive element CD8
ramp capacitive element CRM
alpha flying capacitive element CAF
beta flying capacitive element CBF
alpha decoupling capacitive element CAD
beta decoupling capacitive element CBD
two-state capacitive element CTS
alpha AC grounding capacitive element CAG
beta AC grounding capacitive element CBG SAH capacitive element CSH
class F tank capacitive element CFT
class F bypass capacitive element CFB
collector capacitance CCL
coupler capacitive element CCE
level shifter diode element CRL
cascode diode element CRC Those skilled in the art will recognize improvements and modifications to the preferred embodiments of the present disclosure. All such improvements and modifications are considered within the scope of the concepts disclosed herein and the claims that follow.

What is claimed is:

1. Circuitry comprising:
- a first switching converter of a first switching power supply and configured to receive a direct current (DC) power supply signal;
- an energy storage element of the first switching power supply;
- a first inductive element of the first switching power supply and coupled between the first switching converter and the energy storage element;
- a first snubber circuit of the first switching power supply and coupled across the first inductive element; and
- switching control circuitry of the first switching power supply and configured, to during a continuous conduction mode (CCM), allow energy to flow from the energy storage element to the first inductive element, and during a discontinuous conduction mode (DCM), not allow energy to flow from the energy storage element to the first inductive element,
  - wherein the first switching power supply is configured to receive and convert the DC power supply signal to provide a first switching power supply output signal based on a setpoint.

2. The circuitry of claim 1 further comprising DC-DC control circuitry configured to provide indication of a selection of one of the CCM and the DCM to the first switching power supply.

3. The circuitry of claim 2 wherein the selection of the one of the CCM and the DCM is based on a rate of change of the setpoint.

4. The circuitry of claim 2 wherein the first inductive element has an inductive element current, which is positive when energy flows from the first inductive element to the energy storage element, and is negative when energy flows from the energy storage element to the first inductive element.

5. The circuitry of claim 4 wherein the switching control circuitry is further adapted to control the first snubber circuit, such that during the CCM, the first snubber circuit is in an OPEN state, and during the DCM, when the inductive element current reaches about zero from previously being positive, the first snubber circuit transitions from the OPEN state to a CLOSED state.

6. The circuitry of claim 2 wherein the energy storage element is a first capacitive element.

7. The circuitry of claim 2 further comprising control circuitry adapted to provide the setpoint to the DC-DC control circuitry, which is further adapted to make the selection of the one of the CCM and the DCM.

8. The circuitry of claim 2 further comprising control circuitry adapted to make the selection of the one of the CCM and the DCM, and provide a DC configuration control signal to the DC-DC control circuitry, such that the DC configuration control signal is based on the selection of the one of the CCM and the DCM.

9. The circuitry of claim 8 further comprising transceiver circuitry comprising the control circuitry.

10. The circuitry of claim 2 wherein the first switching power supply further comprises a second switching converter adapted to receive the DC power supply signal, such that the second switching converter is coupled across the first switching converter.

11. The circuitry of claim 10 wherein the first switching converter is a charge pump buck converter and the second switching converter is a buck converter.

12. The circuitry of claim 2 wherein the first switching power supply further comprises:
- a second switching converter adapted to receive the DC power supply signal; and
- a second inductive element coupled between the second switching converter and the energy storage element, such that during the CCM, energy is allowed to flow from the energy storage element to the second inductive element, and during the DCM, energy is not allowed to flow from the energy storage element to the second inductive element.

13. The circuitry of claim 12 wherein the first switching power supply further comprises a second snubber circuit coupled across the second inductive element.

14. The circuitry of claim 12 wherein the first switching converter is a charge pump buck converter and the second switching converter is a buck converter.

15. The circuitry of claim 2 further comprising a second switching power supply adapted to receive and convert the DC power supply signal to provide a second switching power supply output signal.

16. The circuitry of claim 15 wherein the second switching power supply is a charge pump.

17. The circuitry of claim 15 wherein:
- the first switching power supply output signal is an envelope power supply signal for a radio frequency (RF) power amplifier (PA); and
- the second switching power supply output signal is a bias power supply signal used for biasing the RF PA.

18. The circuitry of claim 2 wherein the first switching power supply output signal is an envelope power supply signal for a first radio frequency (RF) power amplifier (PA).

19. The circuitry of claim 18 further comprising:
- the first RF PA comprising:
  - a first non-quadrature PA path having a first single-ended output; and
  - a first quadrature PA path coupled between the first non-quadrature PA path and an antenna port, such that the first quadrature PA path has a first single-ended input, which is coupled to the first single-ended output; and a second RF PA comprising a second quadrature PA path coupled to the antenna port, wherein the antenna port is configured to be coupled to an antenna.

20. The circuitry of claim 18 further comprising:

the first RF PA, which is a first multi-mode multi-band quadrature RF PA coupled to multi-mode multi-band alpha switching circuitry via a single alpha PA output; and the multi-mode multi-band alpha switching circuitry having:

a first alpha non-linear mode output associated with a first non-linear mode RF communications band; and a plurality of alpha linear mode outputs, such that each of the plurality of alpha linear mode outputs is associated with a corresponding one of a first plurality of linear mode RF communications bands.

21. The circuitry of claim 18 further comprising:

the first RF PA comprising a first final stage having a first final bias input, such that bias of the first final stage is via the first final bias input;

PA control circuitry;

a PA-digital communications interface (DCI) coupled between a digital communications bus and the PA control circuitry; and a final stage current digital-to-analog converter (IDAC) coupled between the PA control circuitry and the first final bias input.

22. The circuitry of claim 18 further comprising:

the first RF PA having a first final stage and adapted to:

receive and amplify a first RF input signal to provide a first RF output signal; and receive a first final bias signal to bias the first final stage;

PA bias circuitry adapted to receive a bias power supply signal and provide the first final bias signal based on the bias power supply signal; and a DC-DC converter adapted to receive the DC power supply signal from a DC power supply and provide the bias power supply signal based on the DC power supply signal, such that a voltage of the bias power supply signal is greater than a voltage of the DC power supply signal.

23. The circuitry of claim 18 further comprising:

multi-mode multi-band radio frequency (RF) power amplification circuitry having at least a first RF input and a plurality of RF outputs, such that:

the multi-mode multi-band RF power amplification circuitry comprises the first RF power amplifier (PA);

configuration of the multi-mode multi-band RF power amplification circuitry associates one of the at least the first RF input with one of the plurality of RF outputs; and the configuration is associated with at least a first look-up table (LUT);

PA control circuitry coupled between the multi-mode multi-band RF power amplification circuitry and a PA-digital communications interface (DCI), such that the PA control circuitry has at least the first LUT, which is associated with at least a first defined parameter set; and the PA-DCI, which is coupled to a digital communications bus.

24. A method comprising:

providing a first switching power supply comprising a first switching converter, a first inductive element, an energy storage element, a first snubber circuit, and switching control circuitry; such that the first inductive element is coupled between the first switching converter and the energy storage element, and the first snubber circuit is coupled across the first inductive element;

receiving and converting a DC power supply signal to provide a first switching power supply output signal based on a setpoint; and during a continuous conduction mode (CCM), allowing energy to flow from the energy storage element to the first inductive element, and during a discontinuous conduction mode (DCM), not allowing energy to flow from the energy storage element to the first inductive element.

* * * * *

UNITED STATES PATENT AND TRADEMARK OFFICE

CERTIFICATE OF CORRECTION

PATENT NO. : 9,184,701 B2
APPLICATION NO. : 13/937810
DATED : November 10, 2015
INVENTOR(S) : Jean-Christophe Berchtold et al.

It is certified that error appears in the above-identified patent and that said Letters Patent is hereby corrected as shown below:

In the Specification:

In column 41, line 57, replace “EQ. 1 B” with --EQ. 1B--.

In column 45, line 1, replace “F10” with --FIO--.

In column 69, line 11, replace “SD IN” with --SDIN--.

In column 72, line 62, replace “S-wire” with --3-wire--.

In column 83, line 34, replace “S-wire” with --3-wire--.

In column 87, line 41, replace “S-wire” with --3-wire--.

In column 146, line 46, replace “1148” with --114B--.

In column 154, line 23, replace “ID” with --IL1--.

In column 156, lines 49, 54, 61, and 64, replace “DOTS” with --DCTS--.

In column 159, line 27, replace “DOTS” with --DCTS--.

In column 160, lines 6, 18, 30, and 42, replace “DOTS” with --DCTS--.

In column 161, line 25, replace “N MOS” with --NMOS--.

In column 167, lines 27, 29, 30, and 38, replace “ID” with --IL1--.

In column 171, line 40, replace “(Step 010)” with --(Step C10)--.

In column 186, line 28, replace “RSI1” with --RSII--.

Signed and Sealed this
Fifth Day of July, 2016

Michelle K. Lee

Michelle K. Lee
*Director of the United States Patent and Trademark Office*